US009444673B2

(12) United States Patent
Sorrells et al.

(10) Patent No.: US 9,444,673 B2
(45) **Date of Patent: *Sep. 13, 2016**

(54) METHODS AND SYSTEMS FOR DOWN-CONVERTING A SIGNAL USING A COMPLEMENTARY TRANSISTOR STRUCTURE

(71) Applicant: PARKERVISION, INC., Jacksonville, FL (US)

(72) Inventors: David F. Sorrells, Jacksonville, FL (US); Michael J. Bultman, Jacksonville, FL (US); Robert W. Cook, Jacksonville, FL (US); Richard C. Looke, Jacksonville, FL (US); Charley D. Moses, Jr., Jacksonville, FL (US)

(73) Assignee: ParkerVision, Inc., Jacksonville, FL (US)

( * ) Notice: Subject to any disclaimer, the term of this patent is extended or adjusted under 35 U.S.C. 154(b) by 30 days.

This patent is subject to a terminal disclaimer.

(21) Appl. No.: 14/815,505

(22) Filed: Jul. 31, 2015

(65) Prior Publication Data

US 2016/0020938 A1 Jan. 21, 2016

Related U.S. Application Data

(60) Continuation of application No. 14/632,338, filed on Feb. 26, 2015, now Pat. No. 9,306,792, which is a continuation of application No. 14/085,008, filed on Nov. 20, 2013, now abandoned, which is a (Continued)

(51) Int. Cl.
*H03D 7/14* (2006.01)
*H04L 27/38* (2006.01)

(Continued)

(52) U.S. Cl.
CPC ............ *H04L 27/3881* (2013.01); *H03C 1/62* (2013.01); *H03D 7/00* (2013.01); *H03D 7/1441* (2013.01);

(Continued)

(58) Field of Classification Search
CPC .......... H03D 7/14; H04L 27/14; H04B 1/16
USPC ....... 455/307, 313, 323, 334, 316, 318, 319, 455/325, 333, 339, 340–341, 130, 197.2, 455/203, 262, 265, 284, 287, 326; 327/356–360; 323/205, 282, 284
See application file for complete search history.

(56) References Cited

U.S. PATENT DOCUMENTS 1,688,570 A 1/1929 Potter
4,547,746 A 10/1985 Erickson et al.

(Continued)

FOREIGN PATENT DOCUMENTS

EP 01926955.4 4/2001

OTHER PUBLICATIONS

U.S. Appl. No. 14/814,626, Dec. 22, 2015, Notice of Allowance.

(Continued)

*Primary Examiner* — Cong Tran
(74) *Attorney, Agent, or Firm* — Workman Nydegger

(57) ABSTRACT

Methods, systems, and apparatuses for down-converting a modulate carrier signal to a demodulated baseband signal by sampling the energy of the carrier signal are described herein. Briefly stated, such methods systems, and apparatuses operate by receiving a modulated carrier signal and using pulses with apertures to control a switch so as to (a) transfer energy from the modulated carrier signal and accumulate the transferred energy in a capacitor when the switch is closed during the apertures of the pulses and (b) discharge some of the previously accumulated energy from the capacitor into load circuitry at least when the switch is open. The demodulated baseband signal is generated from (i) accumulating energy transferred to the capacitor each time the switch is closed during the apertures of the pulses, and (ii) discharging some of the previously accumulated energy into the load circuitry each time the switch is opened.

28 Claims, 178 Drawing Sheets

Related U.S. Application Data continuation of application No. 13/428,816, filed on Mar. 23, 2012, now Pat. No. 8,594,607, which is a continuation of application No. 13/040,570, filed on Mar. 4, 2011, now Pat. No. 8,190,116, which is a continuation of application No. 12/059,333, filed on Mar. 31, 2008, now Pat. No. 7,937,059, which is a continuation of application No. 11/355,167, filed on Feb. 16, 2006, now Pat. No. 7,376,410, which is a division of application No. 11/020,547, filed on Dec. 27, 2004, now Pat. No. 7,194,246, which is a continuation of application No. 10/330,219, filed on Dec. 30, 2002, now Pat. No. 6,836,650, which is a continuation of application No. 09/293,095, filed on Apr. 16, 1999, now Pat. No. 6,580,902, which is a continuation-in-part of application No. 09/176,022, filed on Oct. 21, 1998, now Pat. No. 6,061,551.

(51) Int. Cl.

| | |
|---|---|
| ***H03C 1/62*** | (2006.01) |
| ***H03D 7/00*** | (2006.01) |
| ***H04B 1/00*** | (2006.01) |
| ***H04B 1/28*** | (2006.01) |
| ***H04B 7/12*** | (2006.01) |
| ***H04L 27/00*** | (2006.01) |
| ***H04L 27/12*** | (2006.01) |
| ***H04L 27/14*** | (2006.01) |
| ***H04L 27/148*** | (2006.01) |
| ***H04L 27/156*** | (2006.01) |
| ***H04B 1/16*** | (2006.01) |
| ***H04L 25/08*** | (2006.01) |
| ***H04L 27/06*** | (2006.01) |
| ***H04L 27/26*** | (2006.01) |

(52) U.S. Cl.

CPC .......... *H03D 7/1475* (2013.01); *H04B 1/0025* (2013.01); *H04B 1/16* (2013.01); *H04B 1/28* (2013.01); *H04B 7/12* (2013.01); *H04L 25/08* (2013.01); *H04L 27/00* (2013.01); *H04L 27/06* (2013.01); *H04L 27/12* (2013.01); *H04L 27/14* (2013.01); *H04L 27/148* (2013.01); *H04L 27/156* (2013.01); *H04L 27/2672* (2013.01)

(56) References Cited

U.S. PATENT DOCUMENTS

| | | | |
|---|---|---|---|
| 4,703,453 | A | 10/1987 | Shinoda et al. |
| 5,027,163 | A | 6/1991 | Dobrovolny |
| 5,136,264 | A | 8/1992 | Nardozza |
| 5,280,648 | A | 1/1994 | Dobrovolny |
| 5,644,260 | A | 7/1997 | Dasilva et al. |
| 5,648,736 | A | 7/1997 | Ishigaki |
| 5,680,078 | A | 10/1997 | Ariie |
| 6,091,940 | A | 7/2000 | Sorrells et al. |
| 6,122,287 | A | 9/2000 | Ohanian et al. |
| 6,157,682 | A | 12/2000 | Oberhammer |
| 6,343,211 | B1 | 1/2002 | Thodesen et al. |
| 6,687,493 | B1 | 2/2004 | Sorrells et al. |
| 7,039,372 | B1 | 5/2006 | Sorrells et al. |
| 7,050,508 | B2 | 5/2006 | Sorrells et al. |
| 7,319,661 | B1 | 1/2008 | Bohossian et al. |
| 7,376,091 | B1 | 5/2008 | Eccles et al. |
| 7,865,177 | B2 | 1/2011 | Sorrells et al. |
| 2003/0139180 | A1 | 7/2003 | McIntosh et al. |
| 2003/0158954 | A1 | 8/2003 | Williams |
| 2003/0167204 | A1 | 9/2003 | Makipaa |
| 2004/0114553 | A1 | 6/2004 | Jiang et al. |
| 2004/0184466 | A1 | 9/2004 | Chang et al. |
| 2006/0164888 | A1 | 7/2006 | Pisasale et al. |
| 2007/0120780 | A1 | 5/2007 | Park et al. |
| 2008/0003973 | A1 | 1/2008 | Vaisanen |
| 2011/0206272 | A1 | 8/2011 | Takaichi et al. |
| 2012/0019220 | A1 | 1/2012 | Grimm |
| 2012/0104228 | A1 | 5/2012 | Souchkov |
| 2012/0328284 | A1 | 12/2012 | Kawasaki |
| 2015/0295536 | A1 | 10/2015 | Sorrells et al. |

OTHER PUBLICATIONS

U.S. Appl. No. 14/639,296, Feb. 1, 2016, Office Action.
U.S. Appl. No. 14/632,338, Feb. 1, 2016, Notice of Allowance.
U.S. Appl. No. 14/751,425, Feb. 26, 2016, Notice of Allowance.
U.S. Appl. No. 14/815,133, Mar. 14, 2016, Notice of Allowance.
U.S. Appl. No. 14/814,626, filed Jul. 31, 2015, Sorrells et al.
U.S. Appl. No. 14/815,133, filed Jul. 31, 2015, Sorrells et al.
U.S. Appl. No. 14/849,383, filed Sep. 9, 2015, Sorrells et al.
U.S. Appl. No. 14/880,427, filed Oct. 12, 2015, Sorrells et al.
U.S. Appl. No. 14/881,242, filed Oct. 13, 2015, Sorrells et al.
U.S. Appl. No. 14/881,220, filed Oct. 13, 2015, Sorrells et al.
IPR2014-00946 Patent Owner's Response to Petition filed in IPR Proceedings Mar. 19, 2015.
IPR2014-00946 Petitioner's Reply to Patent Owner's Response filed in IPR Proceedings Jun. 26, 2015.
IPR 2014-00946 Patent Owner's Motion for Observation on Cross Examination of Petitioner's Reply Witness Dr. Asad Abidi filed in IPR Proceedings Jul. 27, 2015.
IPR2014-00946 Petitioners' Reply to Patent Owner's Motion for Observation on Cross Examination of Petitioner's Reply Witness Dr. Asad Abidi filed in IPR Proceedings Jul. 31, 2015.
IPR2014-00946 Parkervision, Inc.'s Motion for Adverse Judgment Under 37 C.F.R. § 42.73(b) filed in IPR Proceedings Oct. 22, 2015.
IPR2014-00946 Judgment Final Written Decision filed in IPR Proceedings Oct. 29, 2015.
IPR2014-00947 Patent Owner's Response to Petition filed in IPR Proceedings Mar. 19, 2015.
IPR2014-00947 Exhibit 2024 Declaration of Bruce A. Fette, Ph.D., In Support of Patent Owner's Response to Petition filed in IPR Proceedings Mar. 19, 2015.
IPR2014-00947 Exhibit 2025 Abidi Deposition Transcript with Errata dated Feb. 8, 2015, filed in IPR Proceedings Mar. 19, 2015.
Friist, "Noise Figures of Radio Receivers", In Proceedings of the I.R.E., Jul. 1994, 4 pages.
Pettai, "Noise in Receiving Systems:", Communication Systems Laboratory Raytheon Company, Chapter 7 & Chapter 9, Aug. 1984, 56 pages.
IPR2014-00947 Petitioner's Reply to Patent Owner's Response filed in IPR Proceedings Jun. 26, 2015.
IPR2014-00947 Exhibit 1066 Bruce A. Fette Deposition dated May 28, 2015.
IPR2014-00947 Exhibit 1066 Bruce A. Fette Deposition dated Jun. 4, 2015.
IPR2014-00947 Exhibit 1067 Bruce A. Fette Deposition dated Jun. 6, 2015.
Mikhemar, "A Multiband RF Antenna Duplexer on CMOS: Design and Performance", IEEE Journal of Solid-State Circuits, vol. 48, No. 9, Sep. 2013, 11 pages.
Gray, et al., "Analysis and Design of Analog Integrated Circuits", Jan. 2009, 7 pages.
"SpectreRF Theory", Cadence Design Systems, Inc., Published Jul. 2002, 70 pages.
IPR2014-00947 Parkervision's Response in Opposition to Qualcomm's Renewed Motion for Judgment as a Matter of Law and Motion for New Trial Regarding Non Infringement filed in IPR Proceedings Jun. 26, 2015.
Terman, "Radio Engineers' Handbook", Institute of Radio Engineers, 1943, 2 pages. (The month of Publication is irrelevant since the year of Publication is clearly prior to the filing of the Application).
"Agilent Fundamentals of RF and Microwave Noise Figure Measurements", Agilent Technologies, Aug. 2010, 31 pages.
IPR2014-00947 Patent owner's Motion for Observation on Cross Examination of Petitioner's Reply Witness Dr. Asad Abidi filed in IPR Proceedings Jul. 27, 2015.

(56) References Cited

OTHER PUBLICATIONS

IPR2014-00947 Asad Abidi Deposition Transcript dated Jul. 17, 2015 filed in IPR Proceedings Jul. 27, 2015.
Pettai, "Noise in Receiving Systems:", Communication Systems Laboratory Raytheon Company, Chapter 10, Aug. 1984, 52 pages.
"IRE Standards on Methods of Measuring Noise in Linear Twoports" In Proceedings of the IRE vol. 48, Iss. 1, Jan. 1960, 9 pages.
IPR2014-00947 Petitioners' Reply to Patent owner's Motion for Observation on Cross Examination of Petitioner's Reply Witness Dr. Asad Abidi filed in IPR Proceedings Jul. 31, 2015.
IPR2014-00947 Exhibit 2043 United States Court of Appeals for the Federal Circuit Decision dated Jul. 31, 2015 filed in IPR Proceedings Aug. 12, 2015.
IPR2014-00947 Exhibit 2044 United States Court of Appeals for the Federal Circuit Decision on Petition for Rehearing dated Oct. 2, 2015.
IPR2014-00947 Parkervision, Inc.'s Motion for Adverse Judgment Under 37 C.F.R. § 42.73(b) filed in IPR Proceedings Oct. 22, 2015.
IPR2014-00947 Judgment Final Written Decision filed in IPR Proceedings Oct. 29, 2015.
IPR2014-00948 Patent Owner's Response to Petition filed in IPR Proceedings Mar. 19, 2015.
IPR2014-00948 Petitioner's Reply to Patent Owner's Response filed in IPR Proceedings Jun. 26, 2015.
IPR2014-00948 Patent Owner's Motion for Observation on Cross Examination of Petitioner's Reply Witness Dr. Asad Abidi filed in IPR Proceedings Jul. 27, 2015.
IPR2014-00948 Petitioner's Reply to Patent Owner's Motion for Observation on Cross Examination of Petitioner's Reply Witness Dr. Asad Abidi filed in IPR Proceedings Jul. 31, 2015.
IPR2014-00948 Parkervision, Inc.'s Motion for Adverse Judgment Under 37 C.F.R. § 42.73(b) filed in IPR Proceedings Oct. 22, 2015.
IPR2014-00948 Judgment Final Written Decision filed in IPR Proceedings Oct. 29, 2015.
"The ARRL Handbook for Radio Amateurs", The American Radio Relay League, Newington, CT, 1994, 38 pages. (The month of Publication is irrelevant since the year of Publication is clearly prior to the filing of the Application).
Gibilisco, "The Illustrated Dictionary of Electronics", Seventh Edition, Illustrated Dictionary of Electronics, Jun. 1997, 9 pages.
Keys, Cynthia Diane, "Low-Distortion Mixers for RF Communications", University of California at Berkeley, 1994, 23 pages. (The month of Publication is irrelevant since the year of Publication is clearly prior to the filing of the Application).
Couch II, Leon W., "Modern Communication systems: Principles and Applications", Prentice Hall, Jan. 1995, 79 pages.
Couch II, Leon W., "Digital and Analog Communication Systems", Second Edition Macmillan Publishing Company, 1987, 5 pages. (The month of Publication is irrelevant since the year of Publication is clearly prior to the filing of the Application).
Maas S. A., "Microwave Mixers", Second Edition, Artech House, Inc. Dec. 1993, 29 pages.
Maemura, et al., "The 200MHz- and 1.5GHz-Band GaAs Monolithic Quadrature Modulator ICs", Published in Gallium Arsenide Integrated Circuit (GaAs IC) Symposium, Oct. 1990, 4 pages.
Krauss, et al., "Solid State Radio Engineering", Published Mar. 1980, 63 pages.
Oxner, "Commutation Mixer Achieves High Dynamic Range: Introducing the Siliconix Si8901 Quad FET", Siliconix Incorporated, 1986, 5 pages. (The month of Publication is irrelevant since the year of Publication is clearly prior to the filing of the Application).
Razavi, "RF Microelectronics", Published Nov. 1997, 12 pages.
"RCA Cos/MOS Integrated Circuits", Silverstar, LTD, SSD-203C, 1975 Databook Series, 1975, 21 pages. (The month of Publication is irrelevant since the year of Publication is clearly prior to the filing of the Application).
Smith, et al., "Microwave Engineering Handbook vol. 2", Springer US, 1994, 4 pages. (The month of Publication is irrelevant since the year of Publication is clearly prior to the filing of the Application).
Sullivan, et al., "Active doubly Balanced Mixers for CMDS RFIC's", Microwave Journal, Oct. 1997, 11 pages.
Tsividis, "A First Lab in Circuits and Electronics", Colombia University, May 2001, 6 pages.
Carlson, "Communication Systems: An Introduction to Signals and Noise in Electrical Communication", Third Edition, Jan. 1986, 12 pages.
Oppenheimer, "Fundamentals of Electric Circuits", Prentice Hall, Jun. 1984, 3 pages.
Teetzel, Andrew, "A Stable 250 to 4000MHz GaAs IQ Modulator IC", Solid-State Circuits Conference, Feb. 1997, 3 pages.
Floyd, "Electric Circuits Fundamentals", Third Edition, Prentice Hall, Jan. 1995, 6 pages.
Lee, Thomas, "The Design of CMOS Radio-Frequency Integrated Circuits", Cambridge University Press, Jan. 1998, 32 pages.
"Declaration of Yasuo Nozawa with Exhibits", dated Aug. 19, 2015, 14 pages.
"Dual 1-of-4 decoder/demultiplexer", IC15 Data Handbook, Philips, Feb. 1990, 8 pages.
"Phillips Semiconductors: Concise Catalogue 1996", Philips Electronics North America Corporation, 1996, 26 pages. (The month of Publication is irrelevant since the year of Publication is clearly prior to the filing of the Application).
"Dual 4-channel analogue multiplexer/demultiplexer", Philips, Jan. 1995, 9 pages.
"Toshiba CMOS Digital Integrated Circuit Silicon Monolithic", Toshiba, Aug. 1997, 9 pages.
Gibilisco, et al., "Encyclopedia of Electronics", Tab Professional & Reference, Jul. 1990, 7 pages.
Vizmuller, "RF Design Guide: Systems, Circuits, and Equations", Artech House Publishers, Mar. 1995, 5 pages.
"The Authoritative Dictionary of IEEE Standards Terms", Seventh Edition, IEEE Standards Information Network/IEEE Press, Institute of Electrical and Electronics Engineers, Dec. 2000, 5 pages.
"Declaration of Anthony Acampora with Exhibits", dated Aug. 24, 2015, 263 pages.
Larson, "RF and Microwave Circuit Design for Wireless Communications", Artech House Publishers, Jan. 1996, 38 pages.
Tanenbaum, "Computer Networks", Prentice Hall, Mar. 1996, 35 pages.
U.S. Appl. No. 14/639,310, Aug. 13, 2015, Office Action.
U.S. Appl. No. 14/639,366, Aug. 13, 2015, Office Action.
U.S. Appl. No. 14/814,626, Sep. 10, 2015, Office Action.
U.S. Appl. No. 14/639,296, Sep. 25, 2015, Office Action.
U.S. Appl. No. 14/751,425, Oct. 21, 2015, Notice of Allowance.

DIGITAL BASEBAND SIGNAL 310

CARRIER SIGNAL 410

FM CARRIER SIGNAL 816

GENERIC DOWN-CONVERTING FLOWCHART

DOWN-CONVERTING AN EM SIGNAL TO AN IF SIGNAL

DIRECTLY DOWN-CONVERTING AN EM SIGNAL TO A DEMODULATED BASEBAND SIGNAL

MODULATION CONVERSION

GENERIC DOWN-CONVERTING SYSTEM

A. RISING EDGE PULSE GENERATOR

B. FALLING-EDGE PULSE GENERATOR

STATE MACHINE FLOWCHART

ENERGY TRANSFER SIGNAL MODULE 3002

DIFFERENTIAL CONFIGURATION

DIFFERENTIAL INPUT TO DIFFERENTIAL OUTPUT

SINGLE INPUT TO DIFFERENTIAL OUTPUT

DIFFERENTIAL INPUT TO SINGLE OUTPUT

EXAMPLE INPUT/OUTPUT CIRCUITRY

816

5304

5208

5306
5307
APERTURES
5309

5312
5310A
5310B 5314
5316

A. RISING EDGE PULSE GENERATOR

B. FALLING-EDGE PULSE GENERATOR

IMPEDANCE MATCHED ALIASING MODULE

7106

7104

DIFFERENTIAL ENERGY TRANSFER CONFIGURATION

DIFFERENTIAL INPUT TO DIFFERENTIAL OUTPUT

SINGLE INPUT TO DIFFERENTIAL OUTPUT

DIFFERENTIAL INPUT TO SINGLE OUTPUT

EXAMPLE INPUT/OUTPUT CIRCUITRY 5.0mV
7804
-5.0mV
V (VOLTAGE-SRC)
t 8002
5.0mV
-5.0mV
V (INPUT)
t 8004
7810
V (UNDER-SAMPLING SIGNAL)
t 1.0mV
-1.0mV
200ns
220ns
240ns
260ns
280ns
300ns
V (OUTPUT)
TIME 1.0mV
-1.0mV
200ns
250ns
300ns
350ns
400ns
450ns
500ns
V (OUTPUT)

200uV
-200uV
200ns
250ns
300ns
350ns
400ns
450ns
500ns
V (FILTERED-OUT)
TIME 5.0mV
-5.0mV
7804
V (VOLTAGE-SRC)
V (INPUT)
8102
7810
8104
V (UNDER-SAMPLING SIGNAL)
200uV
-200uV
8106
V (OUTPUT)
-150uV
V (FILTERED-OUT)
200ns
220ns
240ns
260ns
280ns
300ns
250ns
350ns
400ns
450ns
500ns
TIME
t 5.0mV
8302
-5.0mV
V (VOLTAGE-SRC)

8308
5.0mV
-5.0mV
V (INPUT)

8304
8306
V (ENERGY TRANSFER SIGNAL)

4.0mV
8310
-4.0mV
200ns
220ns
240ns
260ns
280ns
300ns
TIME
V (OUTPUT)

4.0mV
-4.0mV
200ns
250ns
300ns
350ns
400ns
450ns
500ns
V (OUTPUT)

2.0mV
8312
-2.0mV
200ns
250ns
300ns
350ns
400ns
450ns
500ns
TIME
V (FILTERED-OUT)

STATE MACHINE FLOWCHART

ENERGY TRANSFER SIGNAL MODULE 6902

FIG. 109A

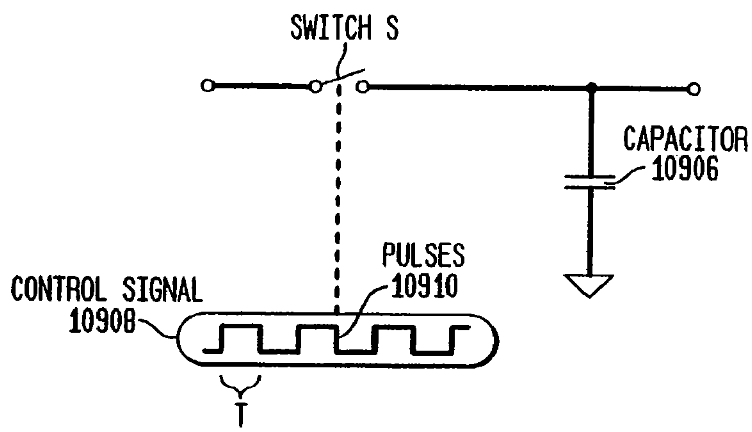

FIG. 109B $$q=C\cdot V \qquad \text{EQ. 10}$$

$$V=A\cdot \sin(t) \qquad \text{EQ. 11}$$

$$q(t)=C\cdot A\cdot \sin(t) \qquad \text{EQ. 12}$$

$$\Delta q(t)=C\cdot A\cdot \sin(t)-C\cdot A\cdot \sin(t-T) \qquad \text{EQ. 13}$$

$$\Delta q(t)=C\cdot A\cdot (\sin(t)-\sin(t-T)) \qquad \text{EQ. 14}$$

$$\sin(\alpha)-\sin(\beta)=2\cdot \sin\left(\frac{\alpha-\beta}{2}\right)\cdot \cos\left(\frac{\alpha+\beta}{2}\right) \qquad \text{EQ. 15}$$

$$\Delta q(t)=2\cdot C\cdot A\cdot \sin\left[\frac{t-(t-T)}{2}\right]\cdot \cos\left[\frac{t+(t-T)}{2}\right] \qquad \text{EQ. 16}$$

$$\Delta q(t)=2\cdot C\cdot A\cdot \sin\left(\frac{1}{2}\cdot T\right)\cdot \cos\left(t-\frac{1}{2}\cdot T\right) \qquad \text{EQ. 17}$$

$$q(t)=\int C\cdot A\cdot (\sin(t)-\sin(t-T))\,dt \qquad \text{EQ. 18}$$

$$q(t)=-\cos(t)\cdot C\cdot A+\cos(t-T)\cdot C\cdot A \qquad \text{EQ. 19}$$

$$q(t)=C\cdot A\cdot (\cos(t-T)-\cos(t)) \qquad \text{EQ. 20}$$

FIG. 109C
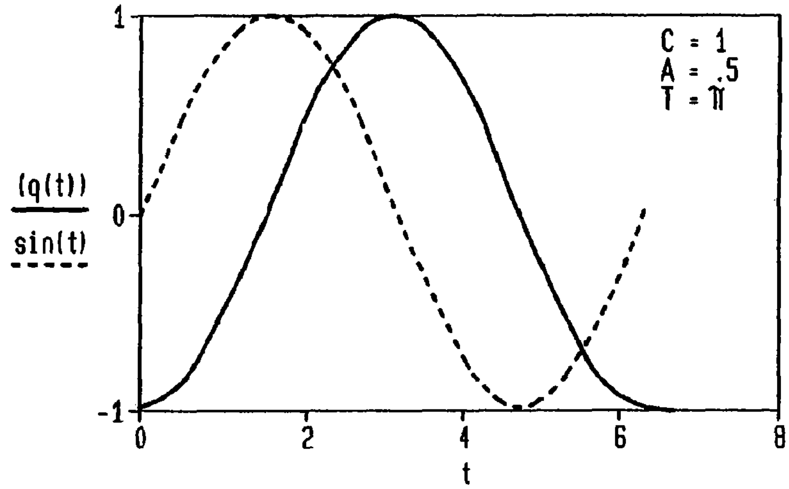
GRAPH 1
FIG. 109D
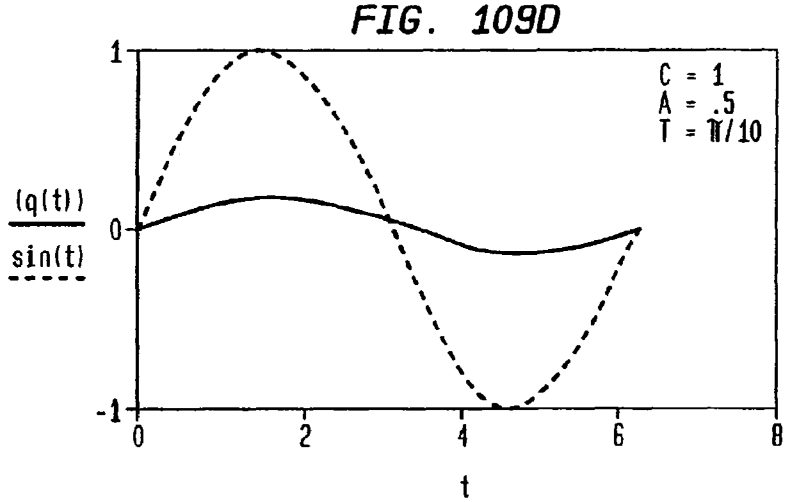
GRAPH 2
FIG. 109E
POWER-CHARGE RELATIONSHIP
| | |
|---|---|
| $q=C\cdot V$ | EQ. 21 |
| $V=q/C$ | EQ. 22 |
| $V=J/C$ | EQ. 23 |
| $J=q^2/C$ | EQ. 24 |
| $P=J/S$ | EQ. 25 |
| $P=\frac{q^2}{C\cdot S}$ | EQ. 26 |
FIG. 109F
INSERTION LOSS
INSERTION LOSS IN dB IS EXPRESSED BY:
$$ILdB=10\cdot\log\left(\frac{Pin}{Pout}\right) \text{ or}$$
$$ILdB=10\cdot\log\left[\frac{\left(\frac{Vin^2}{Rin}\right)}{\left(\frac{Vout^2}{Rout}\right)}\right]$$

RECEIVER TIMING OSCILLATOR OUTPUT

WAVEFORM GENERATOR OUTPUT

RF INPUT

RF SWITCH/INTEGRATOR OUTPUT

OPTIONAL AMPLIFIER/FILTER OUTPUT

RECTIFIER/FILTER OUTPUT
VARIABLE THRESHOLD GENERATOR OUTPUT (WAVEFORM GENERATOR OUTPUT)

(WAVEFORM GENERATOR OUTPUT)

(WAVEFORM GENERATOR OUTPUT)

(WAVEFORM GENERATOR OUTPUT)

RF DIFFERENTIAL RECEIVER

PSEUDO DIFFERENTIAL RECEIVER (WAVEFORM GENERATOR OUTPUT)

(WAVEFORM GENERATOR OUTPUT)

METHODS AND SYSTEMS FOR DOWN-CONVERTING A SIGNAL USING A COMPLEMENTARY TRANSISTOR STRUCTURE

CROSS-REFERENCE TO RELATED APPLICATIONS

This application is a continuation of U.S. patent application Ser. No. 14/632,338 filed Feb. 26, 2015 entitled "Methods and Systems for Down-Converting a Signal Using a Complementary Transistor Structure", which is a continuation of U.S. patents application Ser. No. 14/085,008 filed Nov. 20, 2013 entitled "Methods and Systems for Down-Converting A Signal Using a Complementary Transistor Structure", which is a continuation of U.S. patent application Ser. No. 13/428,816 filed Mar. 23, 2012, and entitled "Methods and Systems for Down-Converting a Signal Using a Complementary Transistor Structure", (U.S. Pat. No. 8,594,607), which is a continuation of U.S. patent application Ser. No. 13/040,570, filed Mar. 4, 2011, and entitled "Methods and Systems for Down-Converting a Signal Using a Complementary Transistor Structure" (U.S. Pat. No. 8,190,116,) which is herein incorporated by reference in its entirety, which is a continuation of U.S. patent application Ser. No. 12/059,333 filed Mar. 31, 2008 entitled "Converting an Electromagnetic Signal via Sub-Sampling" (U.S. Pat. No. 7,937,059), which is a continuation of U.S. patent application Ser. No. 11/355,167 filed Feb. 16, 2006 entitled "Methods and Systems for Down-Converting A Signal Using a Complementary Transistor Structure" (U.S. Pat. No. 7,376, 410), which is a divisional of U.S. patent application Ser. No. 11/020,547 filed Dec. 27, 2004 entitled "Methods and Systems for Down-Converting a Signal Using a Complementary Transistor Structure" (U.S. Pat. No. 7,194,246), which is a continuation of U.S. application "Methods and Systems for Down-Converting Electromagnetic Signals, and Applications Thereof," Ser. No. 10/330,219, filed Dec. 30, 2002 (U.S. Pat. No. 6,836,650), which is a continuation of U.S. application "Frequency Translation Using Optimized Switch Structures," Ser. No. 09/293,095, filed Apr. 16, 1999 (Pat. No. 6,580,902), which is a continuation-in-part application of U.S. application "Method and System for Down-Converting Electromagnetic Signals," Ser. No. 09/176,022, filed Oct. 21, 1998 (now U.S. Pat. No. 6,061,551), each of which is herein incorporated by reference in its entirety.

The following applications of common assignee are related to the present application, and are herein incorporated by reference in their entireties: "Method and System for Frequency Up-Conversion," Ser. No. 09/176,154, filed Oct. 21, 1998 (now U.S. Pat. No. 6,091,940). "Method and System for Ensuring Reception of a Communications Signal," Ser. No. 09/176,415, filed Oct. 21, 1998 (now U.S. Pat. No. 6,061,555). U.S. application "Integrated Frequency Translation and Selectivity," Ser. No. 09/175,966, filed Oct. 21, 1998 (now U.S. Pat. No. 6,049,706). "Universal Frequency Translation, and Applications of Same," Ser. No. 09/176,027, filed Oct. 21, 1998 (now abandoned). "Method and System for Down-Converting Electromagnetic Signals Including Resonant Structures for Enhanced Energy Transfer," Ser. No. 09/293,342, filed Apr. 16, 1999. "Method and System for Frequency Up-Conversion Having Optimized Switch Structures," Ser. No. 09/293,097, filed Apr. 16, 1999. "Method and System for Frequency Up-Conversion With a Variety of Transmitter Configurations," Ser. No. 09/293,580, filed Apr. 16, 1999. "Integrated Frequency Translation and Selectivity With a Variety of Filter Embodiments," Ser. No. 09/293,283, filed Apr. 16, 1999. "Frequency Translator Having a Controlled Aperture Sub-Harmonic Matched Filter," Ser. No. 60/129,839, filed Apr. 16, 1999.

BACKGROUND OF THE INVENTION

1. The Field of the Invention

The present invention relates to down-conversion of electromagnetic (EM) signals. More particularly, the present invention relates to down-conversion of EM signals to intermediate frequency signals, to direct down-conversion of EM modulated carrier signals to demodulated baseband signals, and to conversion of FM signals to non-FM signals. The present invention also relates to under-sampling and to transferring energy at aliasing rates.

2. The Relevant Technology

Electromagnetic (EM) information signals (baseband signals) include, but are not limited to, video baseband signals, voice baseband signals, computer baseband signals, etc. Baseband signals include analog baseband signals and digital baseband signals.

It is often beneficial to propagate EM signals at higher frequencies. This is generally true regardless of whether the propagation medium is wire, optic fiber, space, air, liquid, etc. To enhance efficiency and practicality, such as improved ability to radiate and added ability for multiple channels of baseband signals, up-conversion to a higher frequency is utilized. Conventional up-conversion processes modulate higher frequency carrier signals with baseband signals. Modulation refers to a variety of techniques for impressing information from the baseband signals onto the higher frequency carrier signals. The resultant signals are referred to herein as modulated carrier signals. For example, the amplitude of an AM carrier signal varies in relation to changes in the baseband signal, the frequency of an FM carrier signal varies in relation to changes in the baseband signal, and the phase of a PM carrier signal varies in relation to changes in the baseband signal.

In order to process the information that was in the baseband signal, the information must be extracted, or demodulated, from the modulated carrier signal. However, because conventional signal processing technology is limited in operational speed, conventional signal processing technology cannot easily demodulate a baseband signal from higher frequency modulated carrier signal directly. Instead, higher frequency modulated carrier signals must be down-converted to an intermediate frequency (IF), from where a conventional demodulator can demodulate the baseband signal.

Conventional down-converters include electrical components whose properties are frequency dependent. As a result, conventional down-converters are designed around specific frequencies or frequency ranges and do not work well outside their designed frequency range.

Conventional down-converters generate unwanted image signals and thus must include filters for filtering the unwanted image signals. However, such filters reduce the power level of the modulated carrier signals. As a result, conventional down-converters include power amplifiers, which require external energy sources.

When a received modulated carrier signal is relatively weak, as in, for example, a radio receiver, conventional down-converters include additional power amplifiers, which require additional external energy.

What is needed includes, without limitation:

an improved method and system for down-converting EM signals;

a method and system for directly down-converting modulated carrier signals to demodulated baseband signals;

a method and system for transferring energy and for augmenting such energy transfer when down-converting EM signals;

a controlled impedance method and system for down-converting an EM signal;

a controlled aperture under-sampling method and system for down-converting an EM signal;

a method and system for down-converting EM signals using a universal down-converter design that can be easily configured for different frequencies;

a method and system for down-converting EM signals using a local oscillator frequency that is substantially lower than the carrier frequency;

a method and system for down-converting EM signals using only one local oscillator;

a method and system for down-converting EM signals that uses fewer filters than conventional down-converters;

a method and system for down-converting EM signals using less power than conventional down-converters;

a method and system for down-converting EM signals that uses less space than conventional down-converters;

a method and system for down-converting EM signals that uses fewer components than conventional down-converters;

a method and system for down-converting EM signals that can be implemented on an integrated circuit (IC); and a method and system for down-converting EM signals that can also be used as a method and system for up-converting a baseband signal.

BRIEF SUMMARY OF THE INVENTION

Briefly stated, the present invention is directed to methods, systems, and apparatuses for down-converting an electromagnetic (EM) signal by aliasing the EM signal, and applications thereof. Generally, the invention operates by receiving an EM signal. The invention also receives an aliasing signal having an aliasing rate. The invention aliases the EM signal according to the aliasing signal to down-convert the EM signal. The term aliasing, as used herein and as covered by the invention, refers to both down-converting an EM signal by under-sampling the EM signal at an aliasing rate, and down-converting an EM signal by transferring energy from the EM signal at the aliasing rate.

In an embodiment, the invention down-converts the EM signal to an intermediate frequency (IF) signal.

In another embodiment, the invention down-converts the EM signal to a demodulated baseband information signal.

In another embodiment, the EM signal is a frequency modulated (FM) signal, which is down-converted to a non-FM signal, such as a phase modulated (PM) signal or an amplitude modulated (AM) signal.

The invention is applicable to any type of EM signal, including but not limited to, modulated carrier signals (the invention is applicable to any modulation scheme or combination thereof) and unmodulated carrier signals.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

The drawing in which an element first appears is typically indicated by the leftmost digit(s) in the corresponding reference number.

BRIEF DESCRIPTION OF THE DRAWINGS

The present invention will be described with reference to the accompanying drawings wherein:

FIG. 98A illustrates an example real time aperture control circuit according to an embodiment of the invention;

FIG. 98B illustrates a timing diagram of an example clock signal for real time aperture control, according to an embodiment of the invention;

FIG. 98C illustrates a timing diagram of an example optional enable signal for real time aperture control, according to an embodiment of the invention;

FIG. 98D illustrates a timing diagram of an inverted clock signal for real time aperture control, according to an embodiment of the invention;

FIG. 98E illustrates a timing diagram of an example delayed clock signal for real time aperture control, according to an embodiment of the invention;

FIG. 98F illustrates a timing diagram of an example energy transfer module including pulses having apertures that are controlled in real time, according to an embodiment of the invention;

FIG. 99 is a block diagram of a differential system that utilizes non-inverted gated transfer units, according to an embodiment of the invention;

FIG. 100 illustrates an example embodiment of the invention;

FIG. 101 illustrates an example embodiment of the invention;

FIG. 102 illustrates an example embodiment of the invention;

FIG. 103 illustrates an example embodiment of the invention;

FIG. 104 illustrates an example embodiment of the invention;

Figure 103:
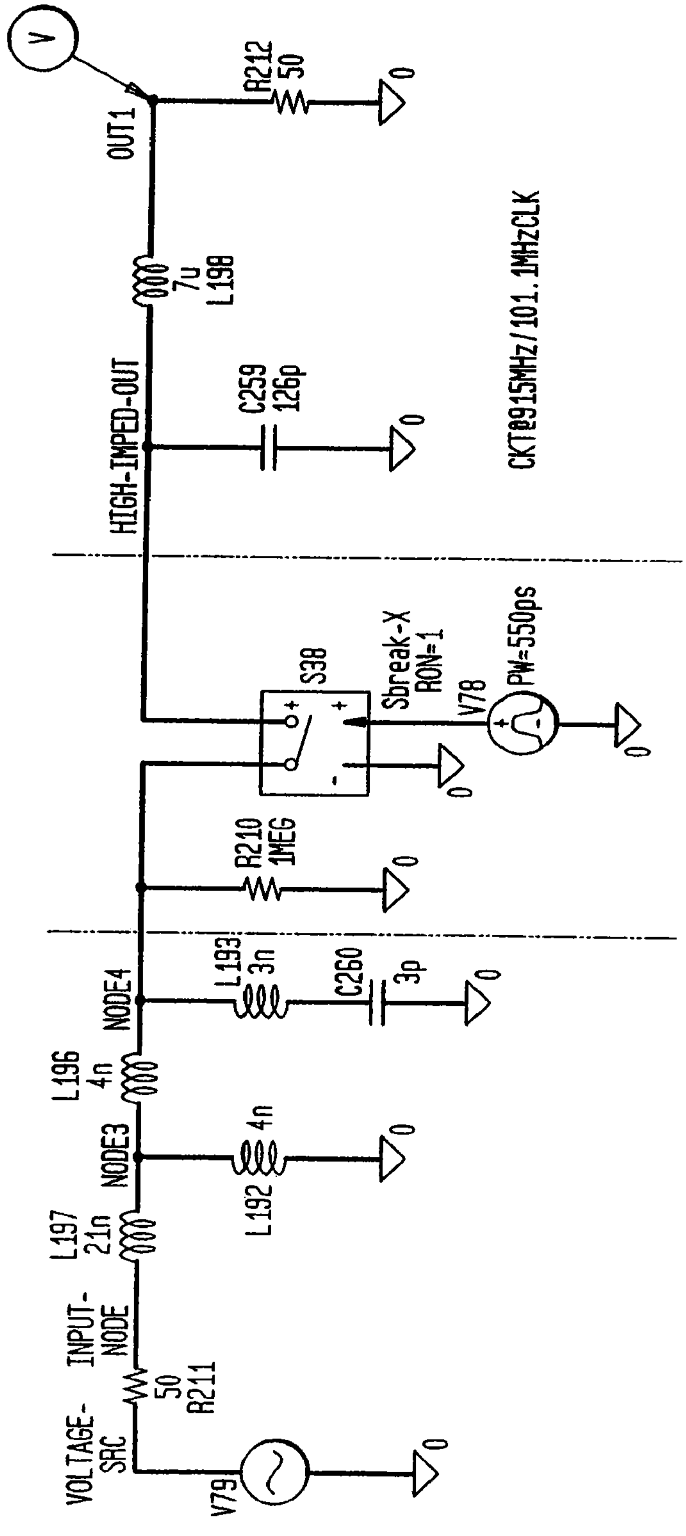
Figure 104:
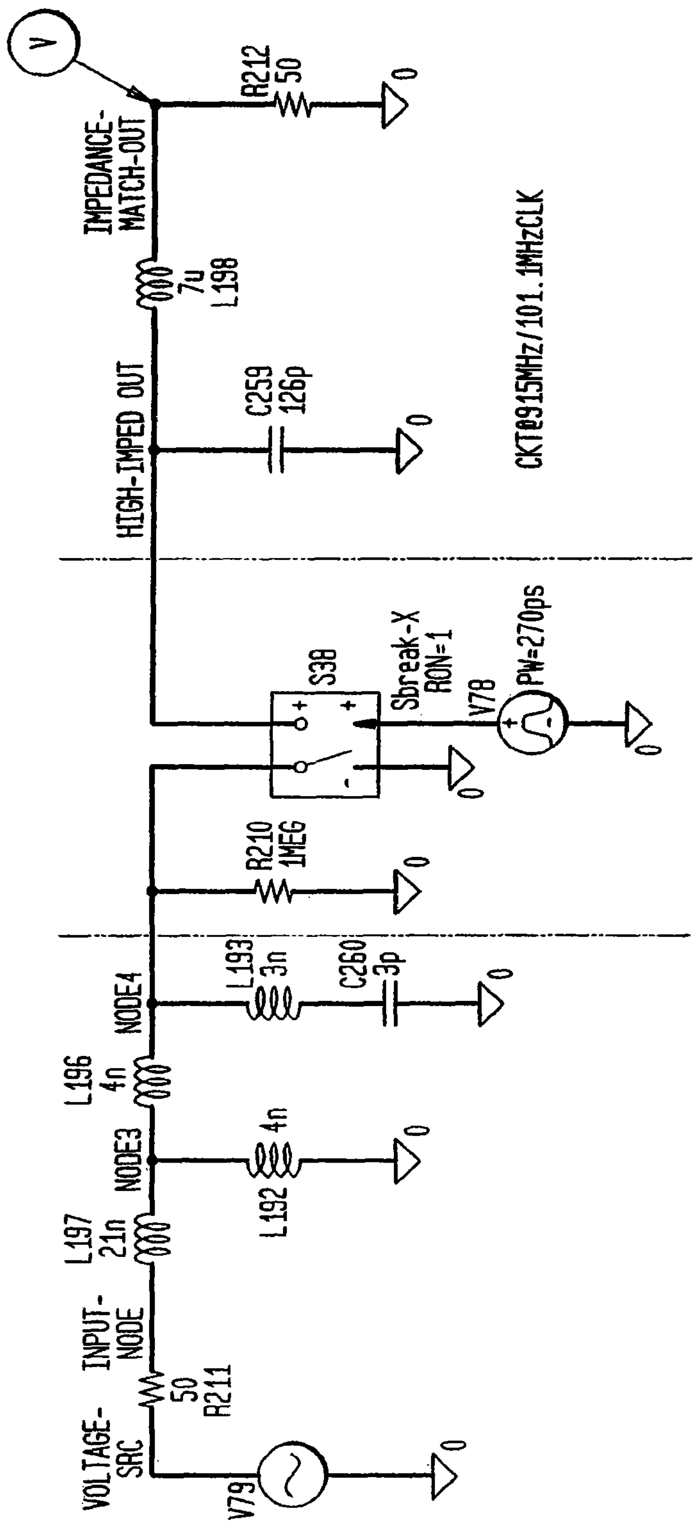
Figure 105:
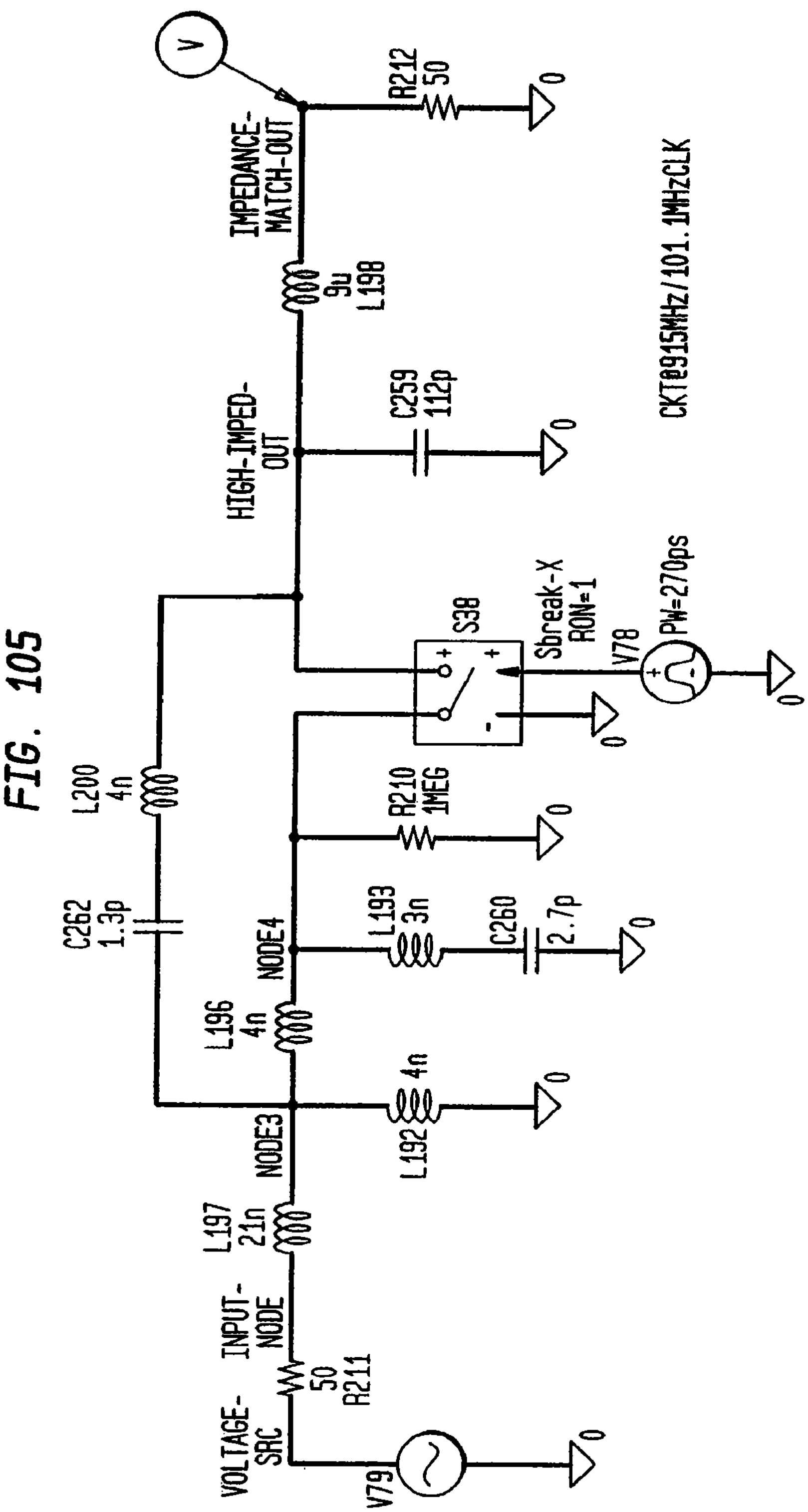
Figure 106:
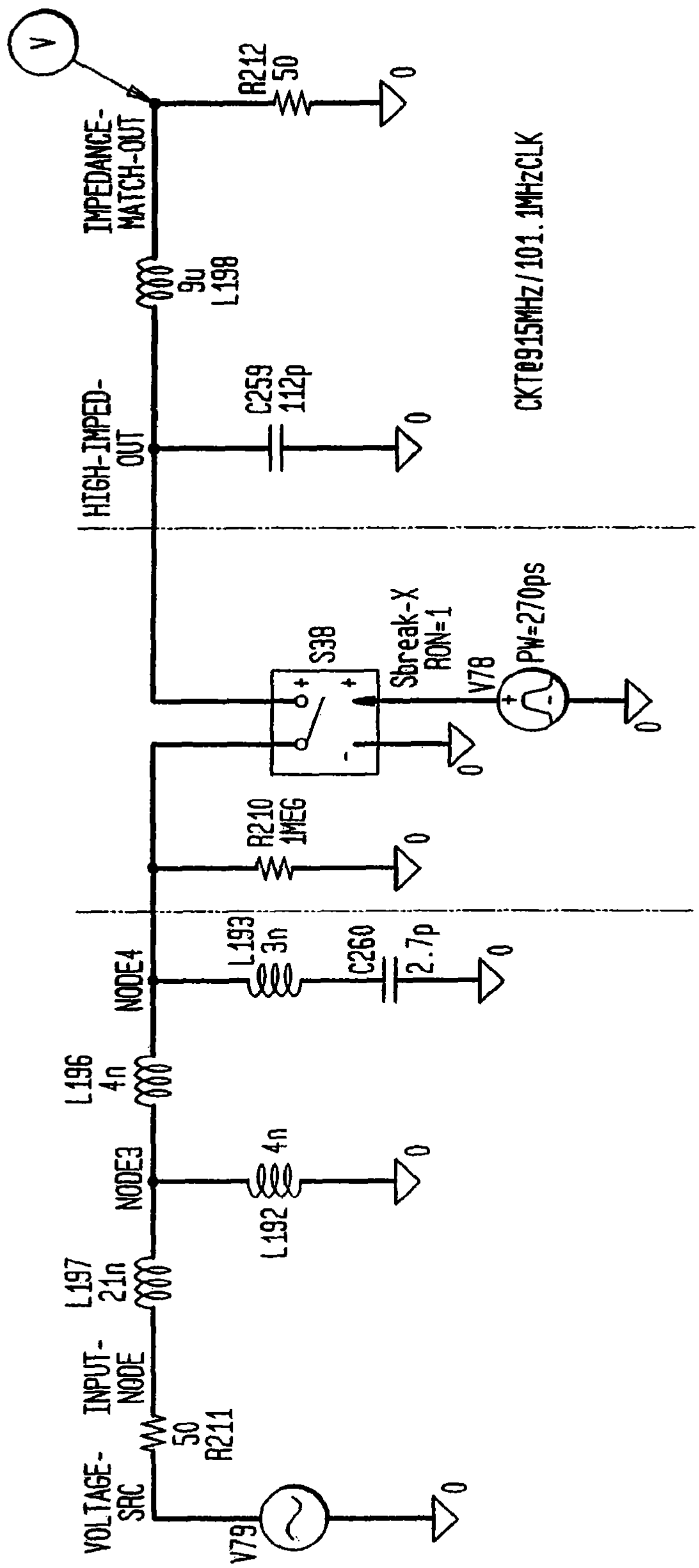
Figure 107A:
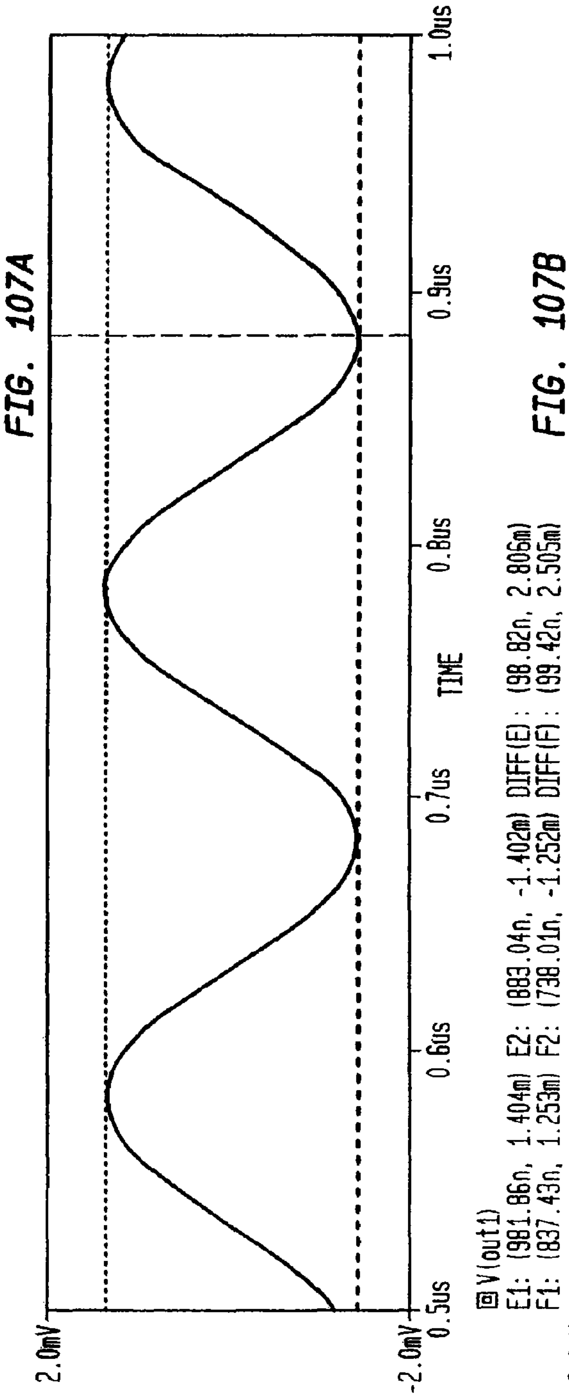
Figure 107B:
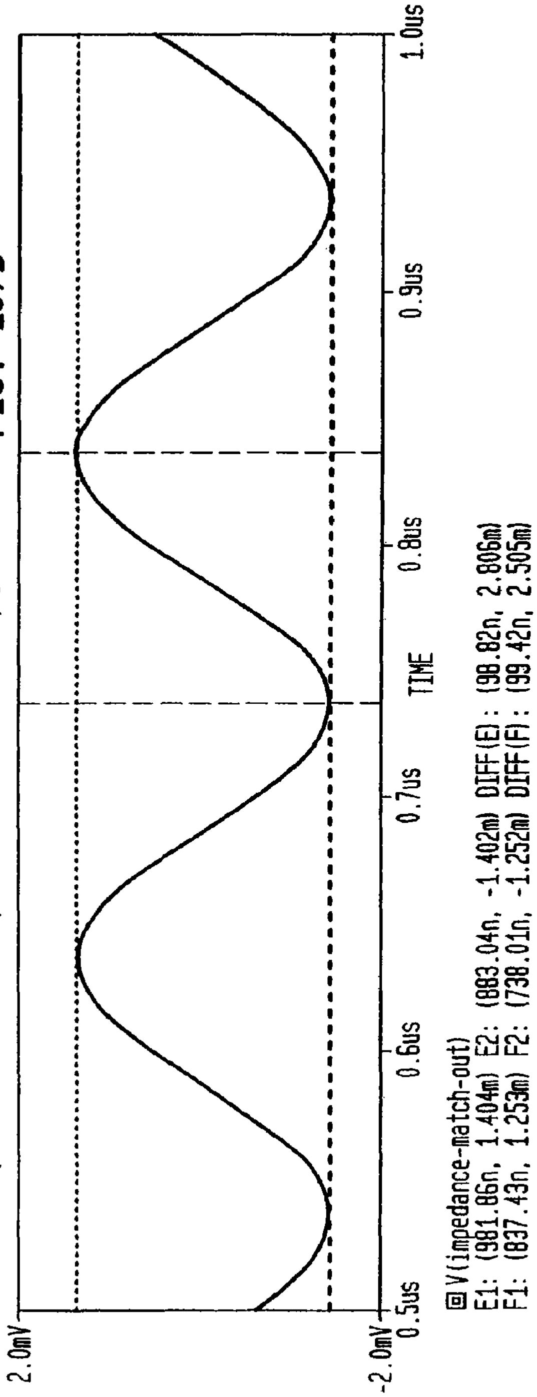
Figure 108A:
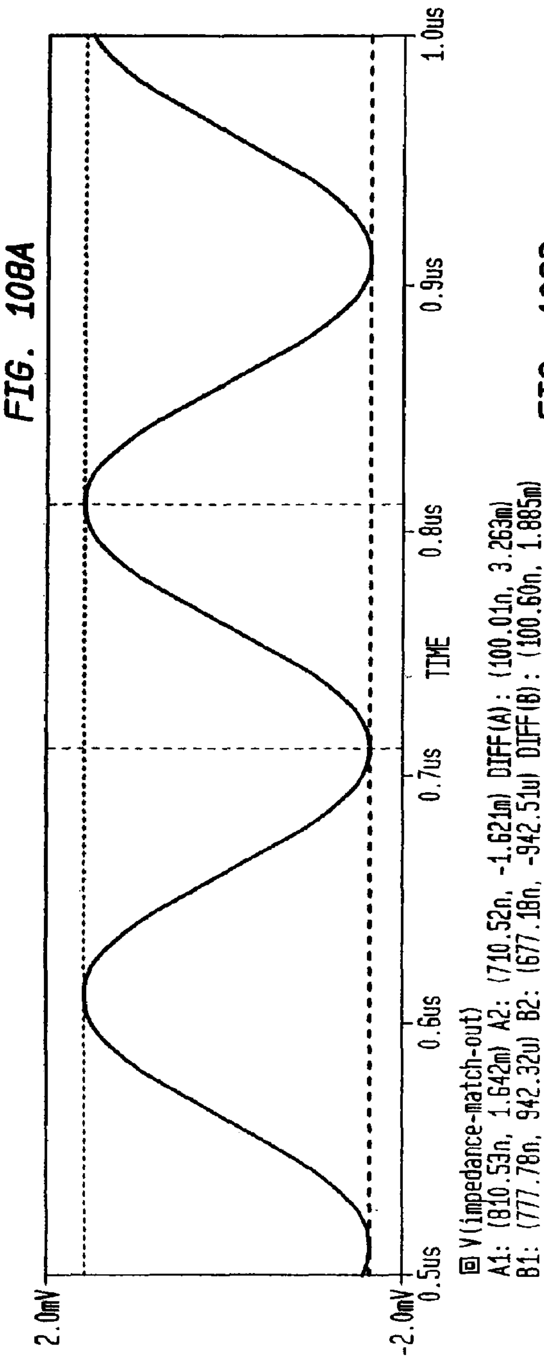
Figure 108B:
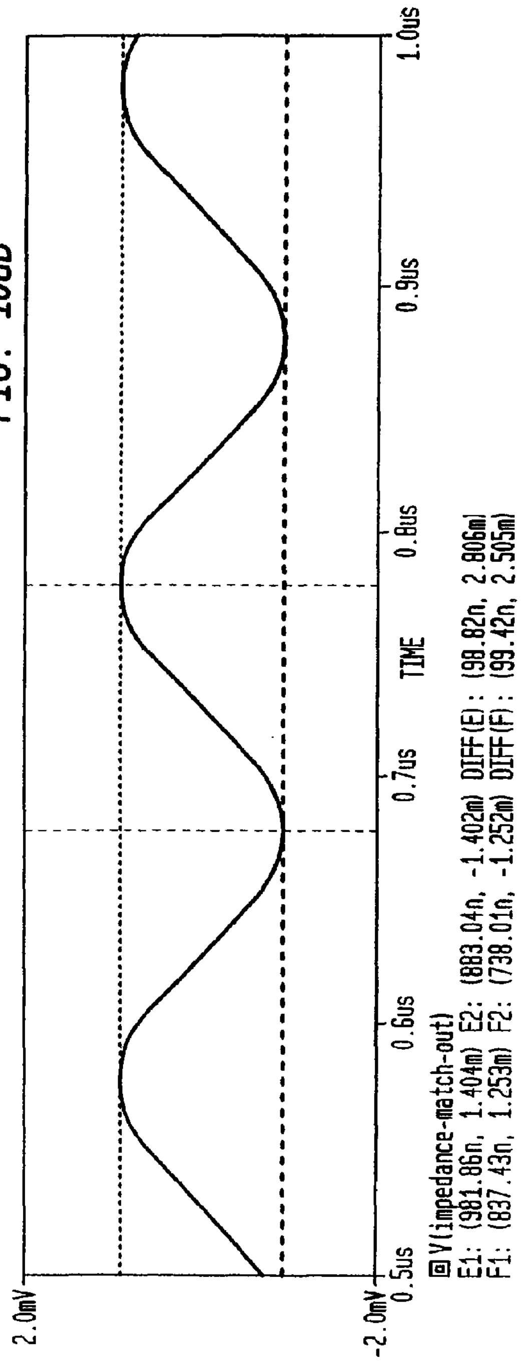
Figure 110A:
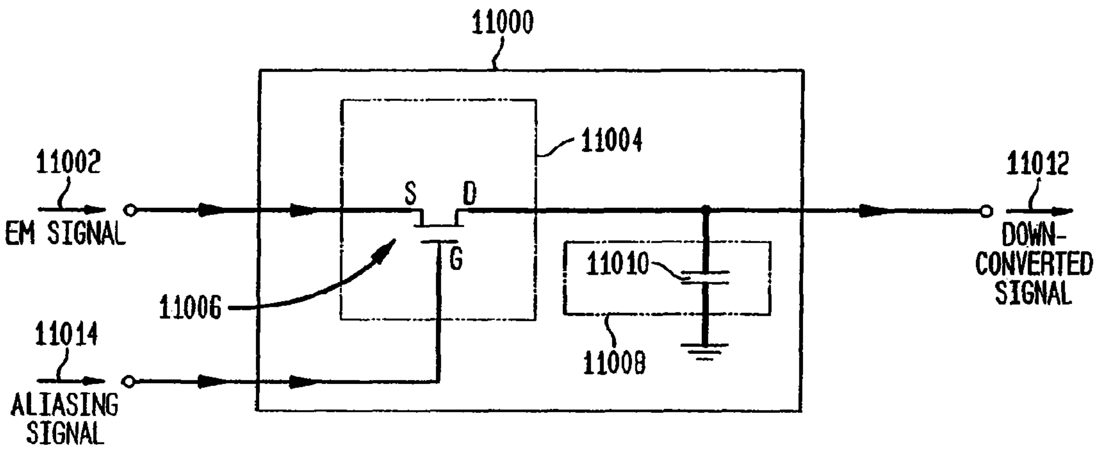
Figure 110B:
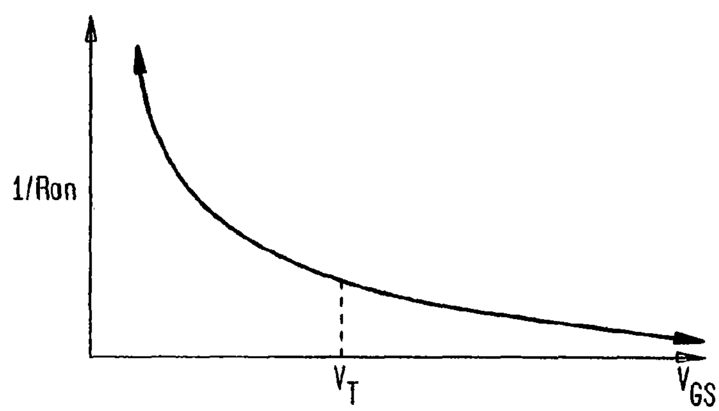
Figures 111A, 111B, 111C:
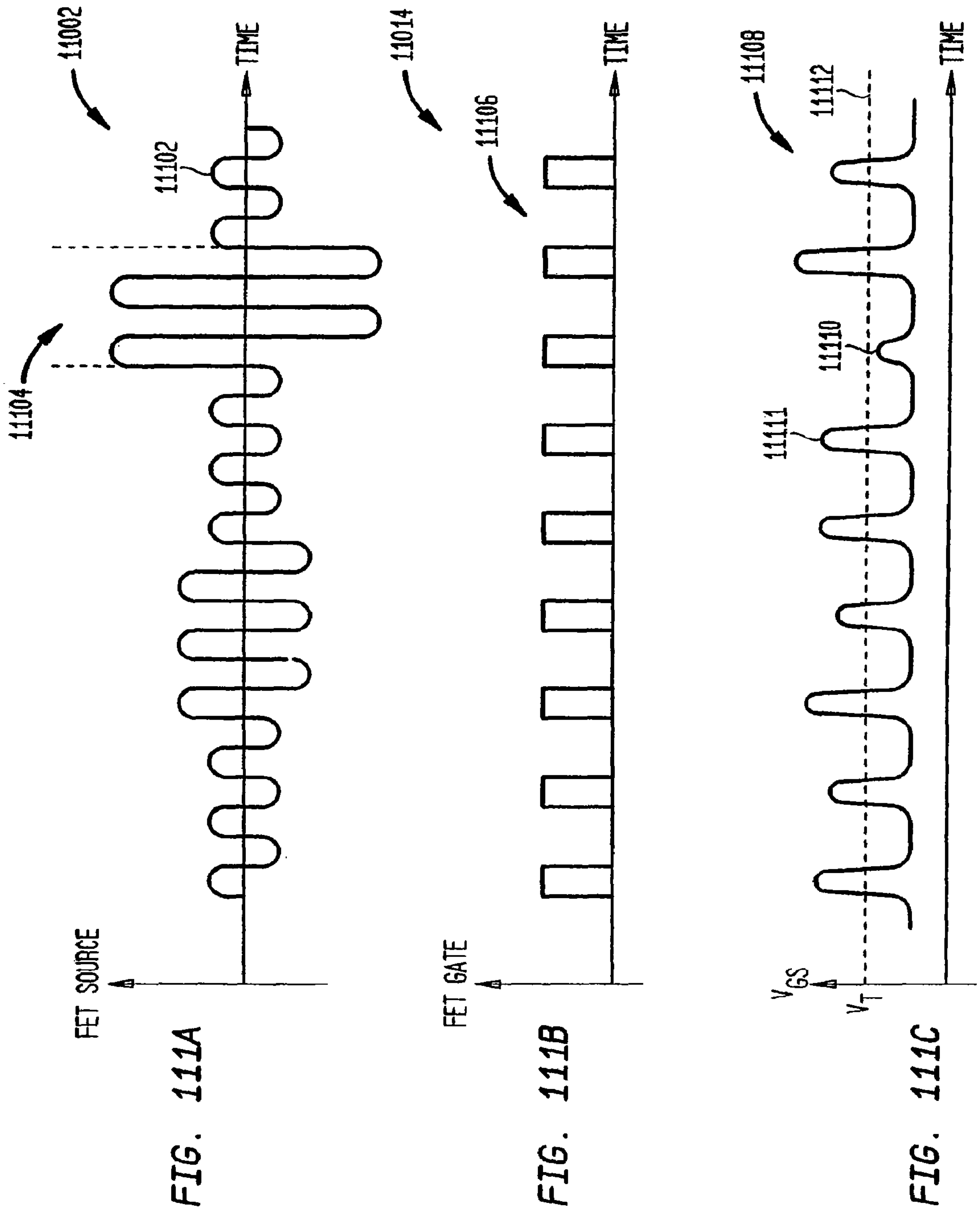
Figure 112:
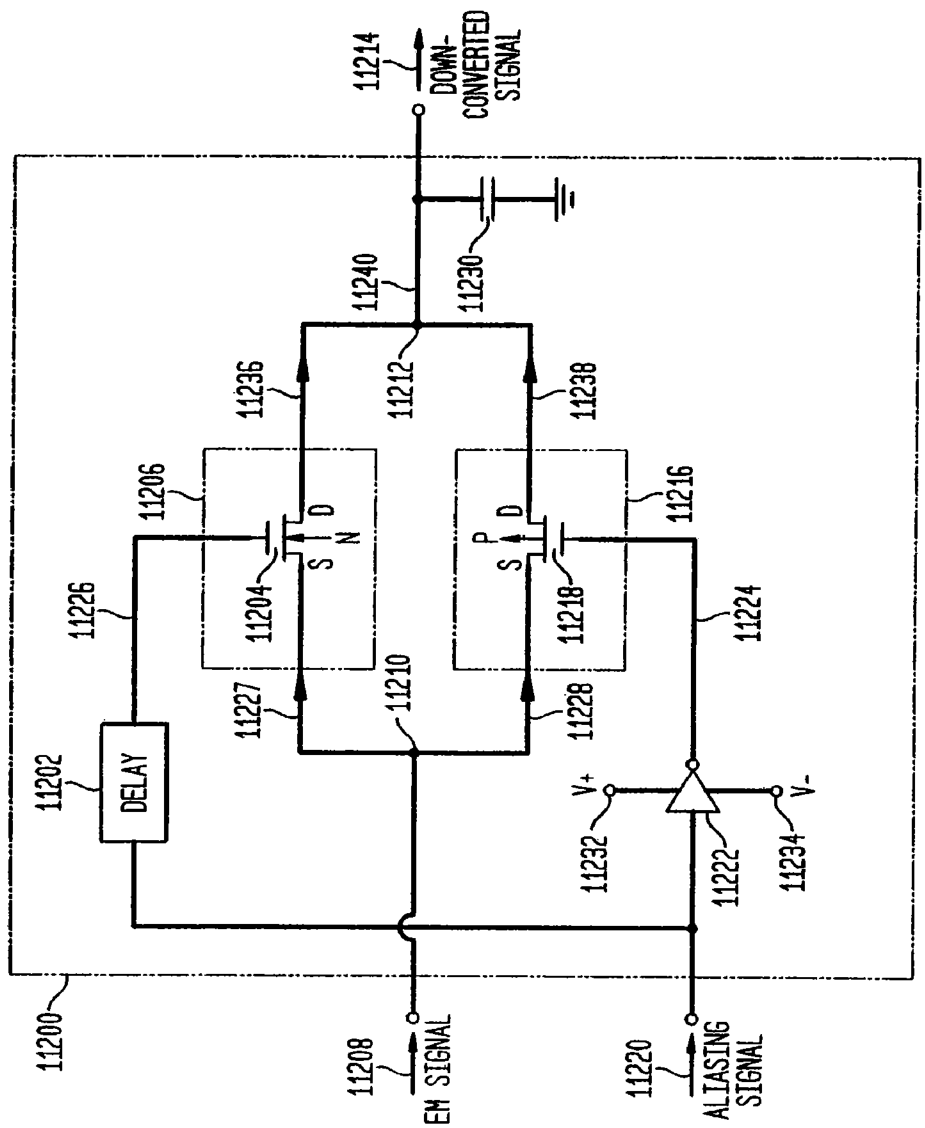
Figure 114:
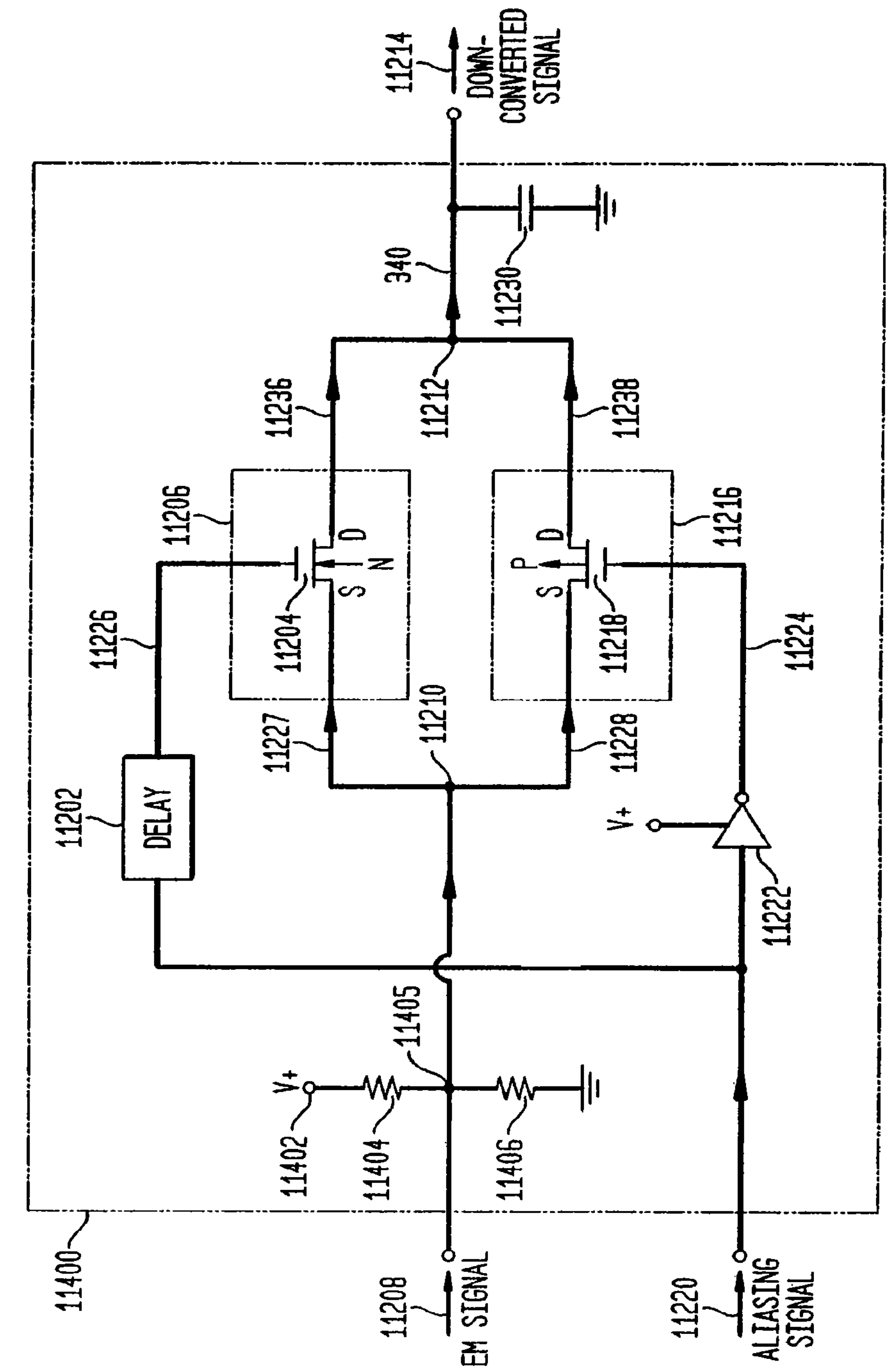
Figure 115:
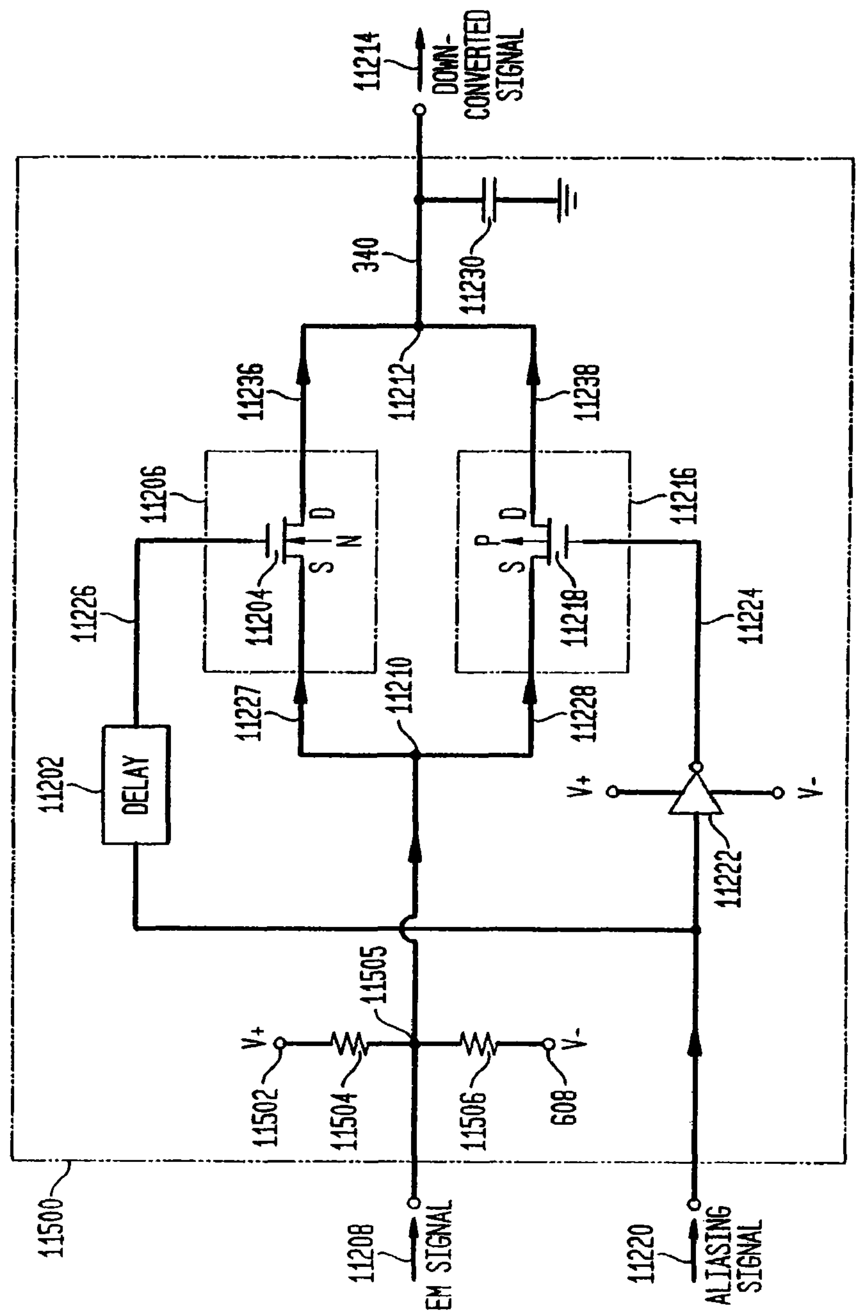
Figure 116:
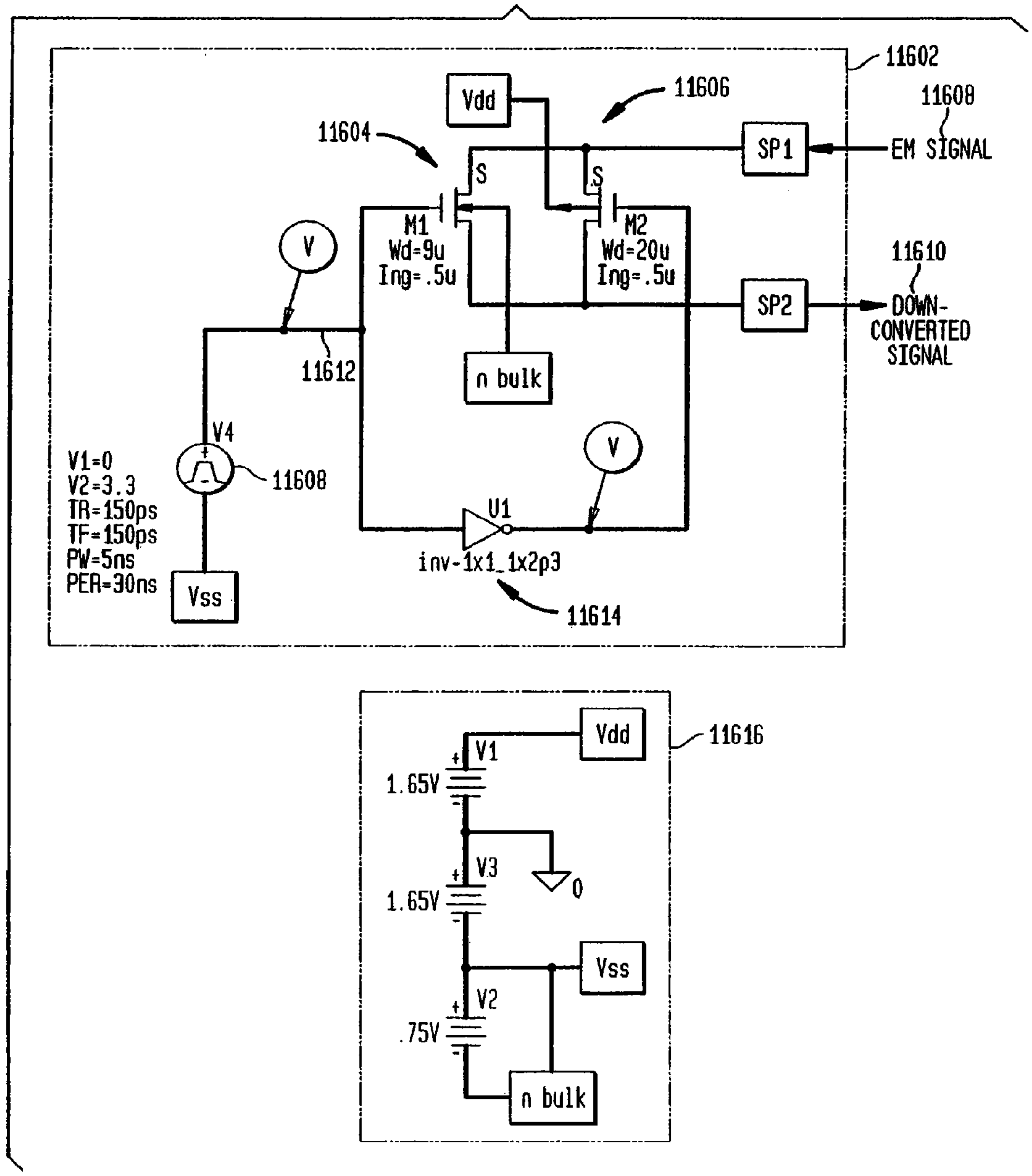
Figure 117:
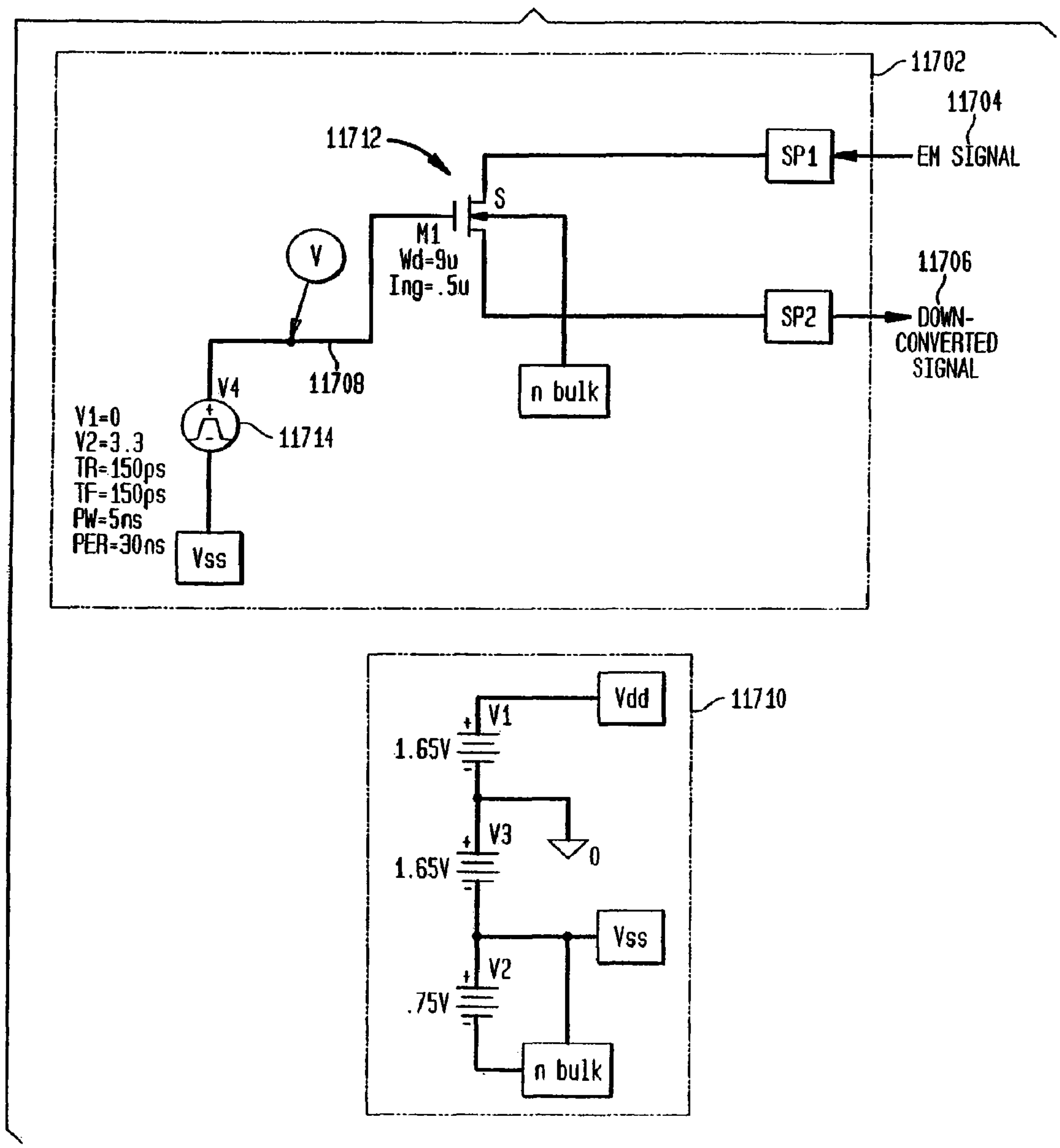
Figure 118:
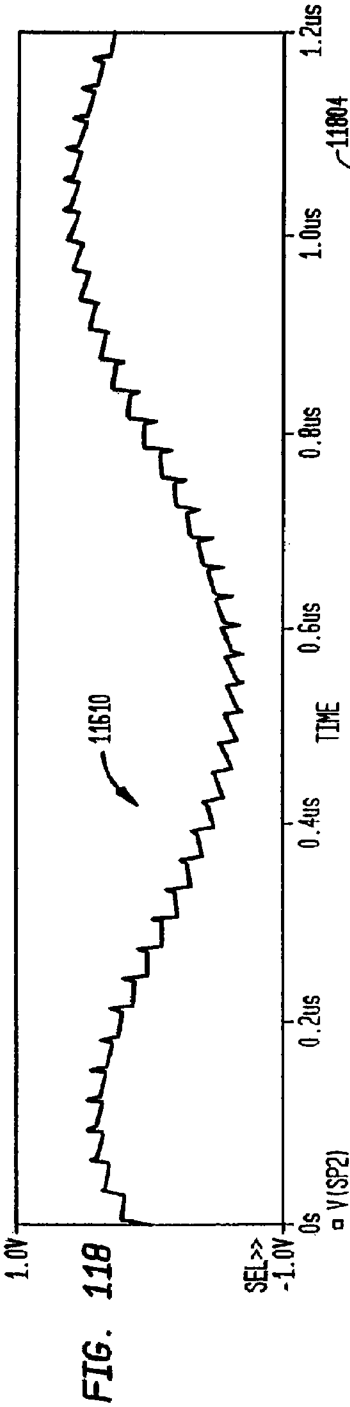
Figure 119:
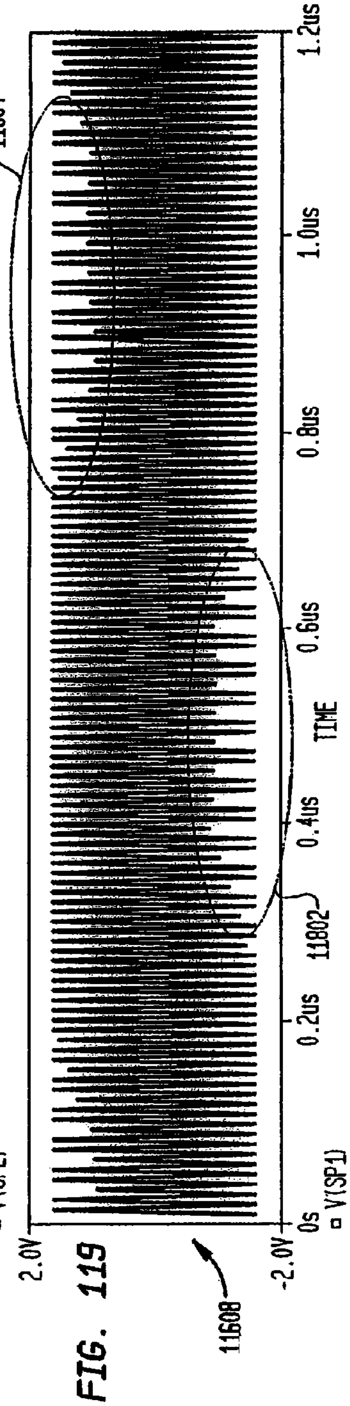
Figure 120:
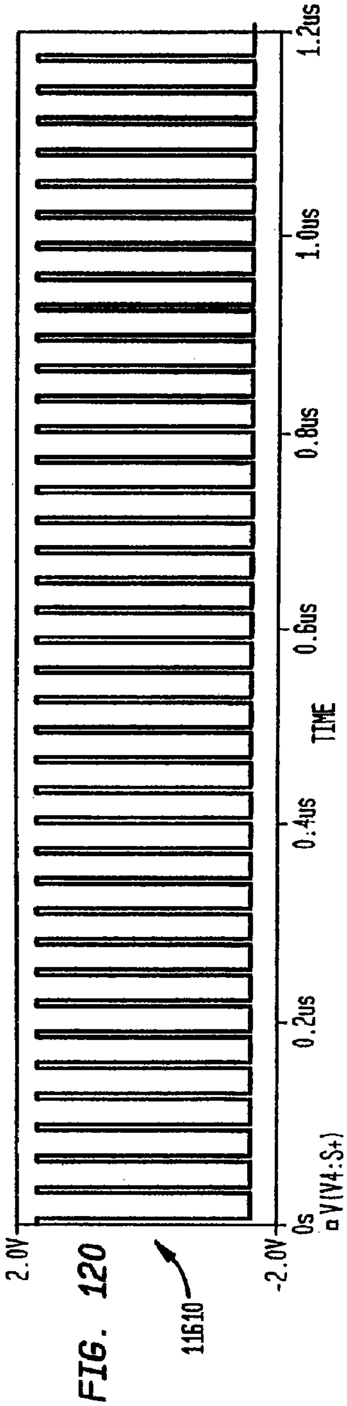
Figure 121:
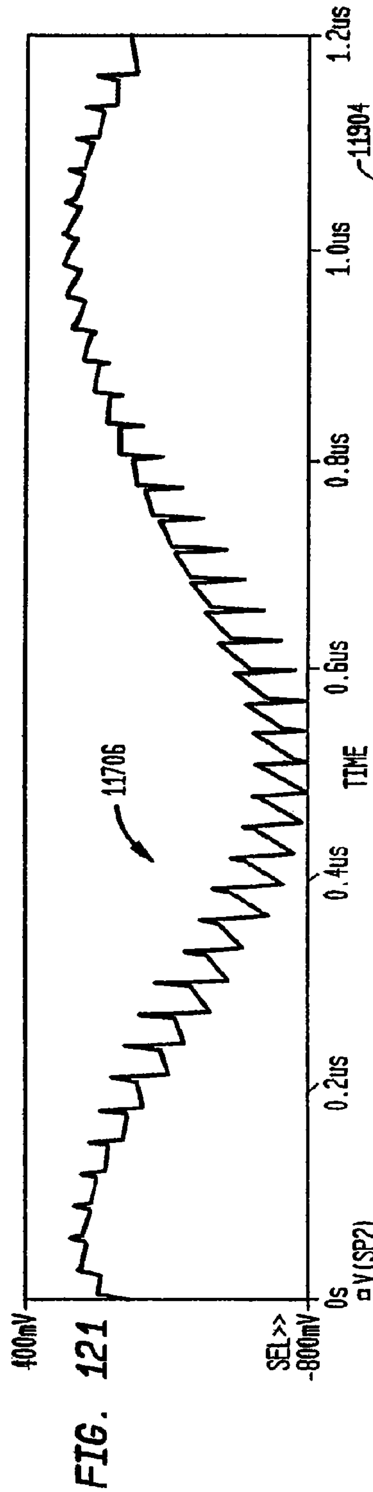
Figure 122:
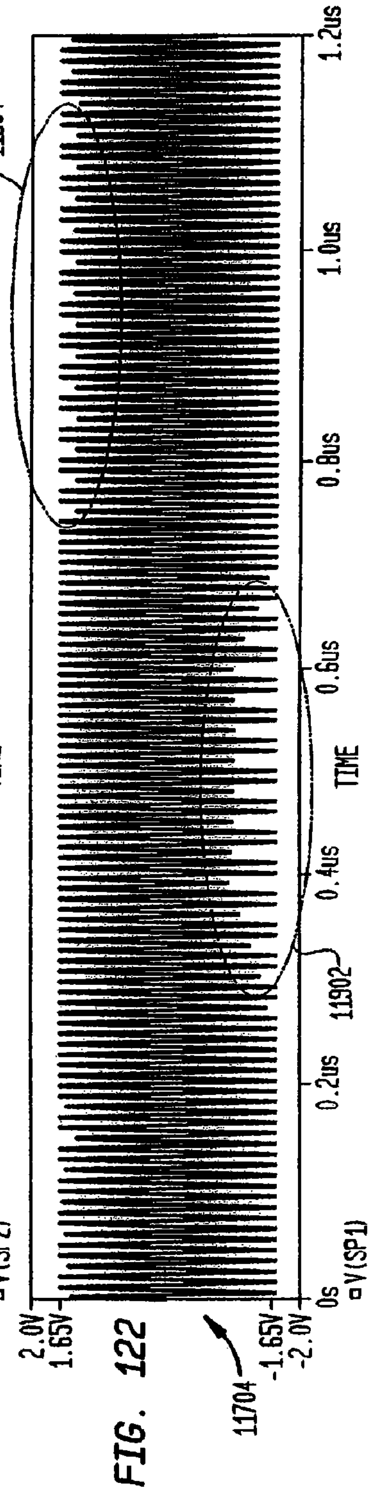
Figure 123:
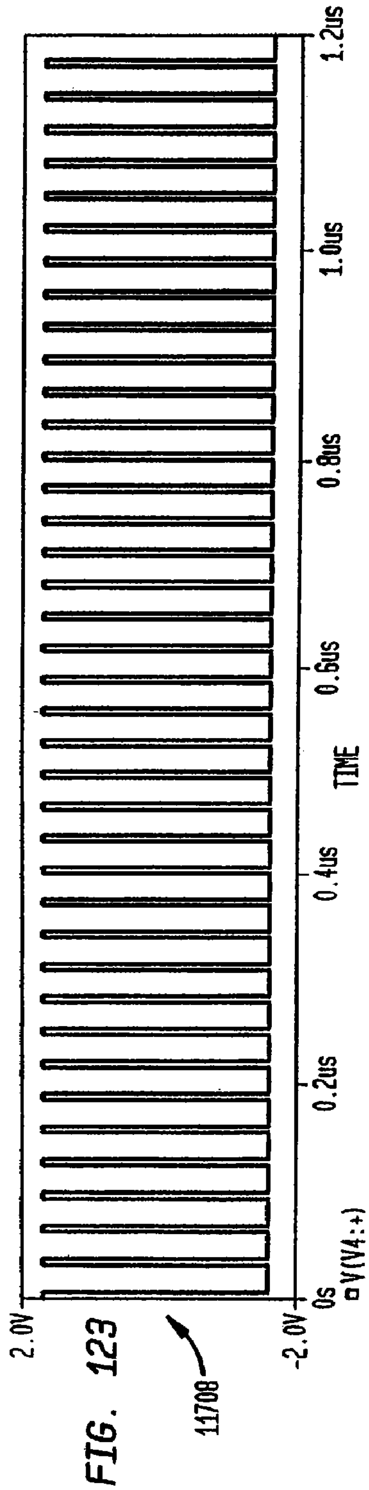

FIG. 105 illustrates an example embodiment of the invention;

FIG. 106 illustrates an example embodiment of the invention;

FIG. 107A is a timing diagram for the example embodiment of FIG. 103;

FIG. 107B is a timing diagram for the example embodiment of FIG. 104;

FIG. 108A is a timing diagram for the example embodiment of FIG. 105;

FIG. 108B is a timing diagram for the example embodiment of FIG. 106;

FIG. 109A illustrates and example embodiment of the invention;

FIG. 109B illustrates equations for determining charge transfer, in accordance with the present invention;

FIG. 109C illustrates relationships between capacitor charging and aperture, in accordance with the present invention;

FIG. 109D illustrates relationships between capacitor charging and aperture, in accordance with the present invention;

FIG. 109E illustrates power-charge relationship equations, in accordance with the present invention;

FIG. 109F illustrates insertion loss equations, in accordance with the present invention;

FIG. 110A illustrates aliasing module 11000 a single FET configuration;

FIG. 110B illustrates FET conductivity vs. $V_{GS}$;

FIGS. 111A-C illustrate signal waveforms associated with aliasing module 11000;

FIG. 112 illustrates aliasing module 11200 with a complementary FET configuration;

FIGS. 113A-E illustrate signal waveforms associated with aliasing module 11200;

FIG. 114 illustrates aliasing module 11400;

FIG. 115 illustrates aliasing module 11500;

FIG. 116 illustrates aliasing module 11602;

FIG. 117 illustrates aliasing module 11702;

FIGS. 118-120 illustrate signal waveforms associated with aliasing module 11602;

FIGS. 121-123 illustrate signal waveforms associated with aliasing module 11702.

Figure 124A:
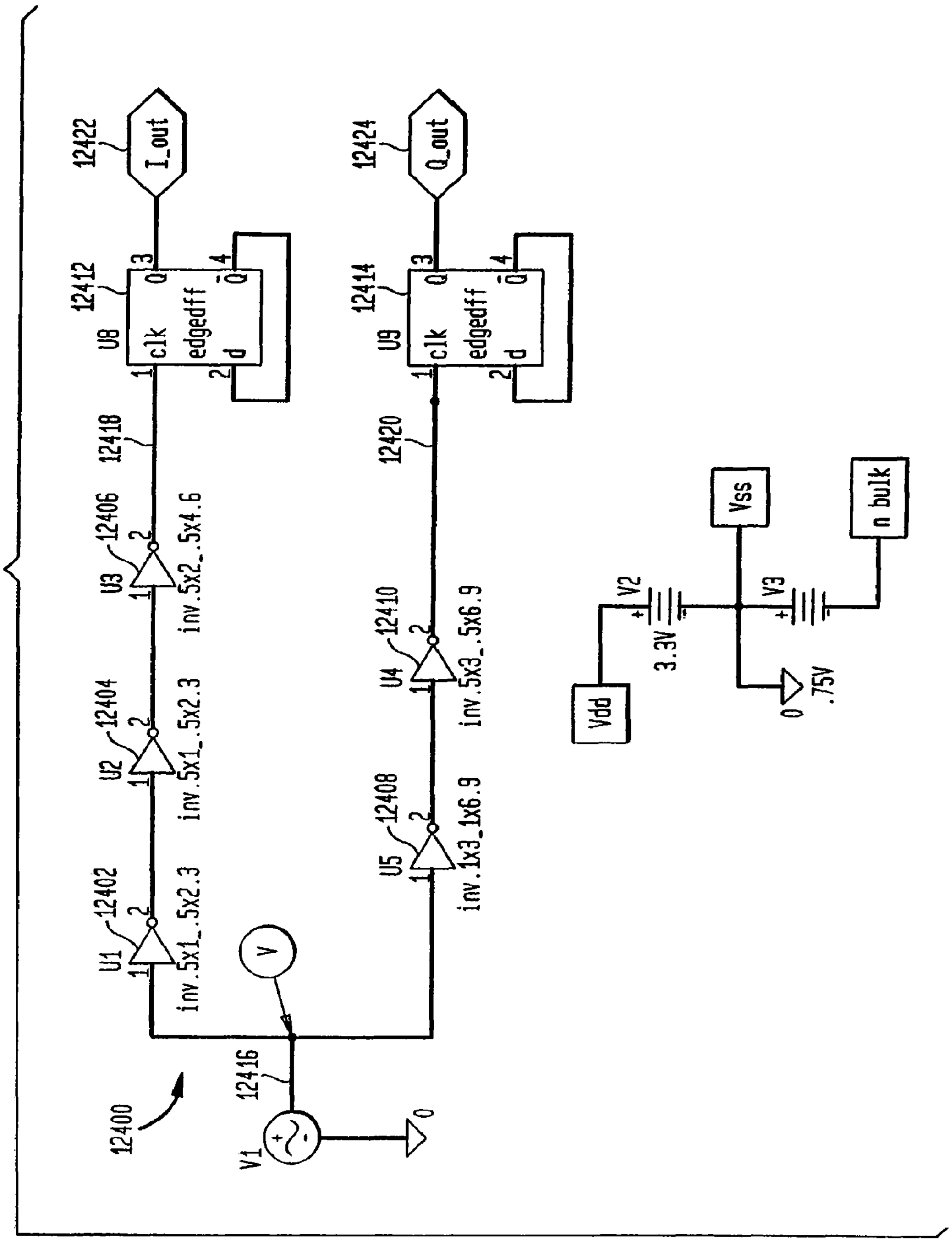
Figure 124B:
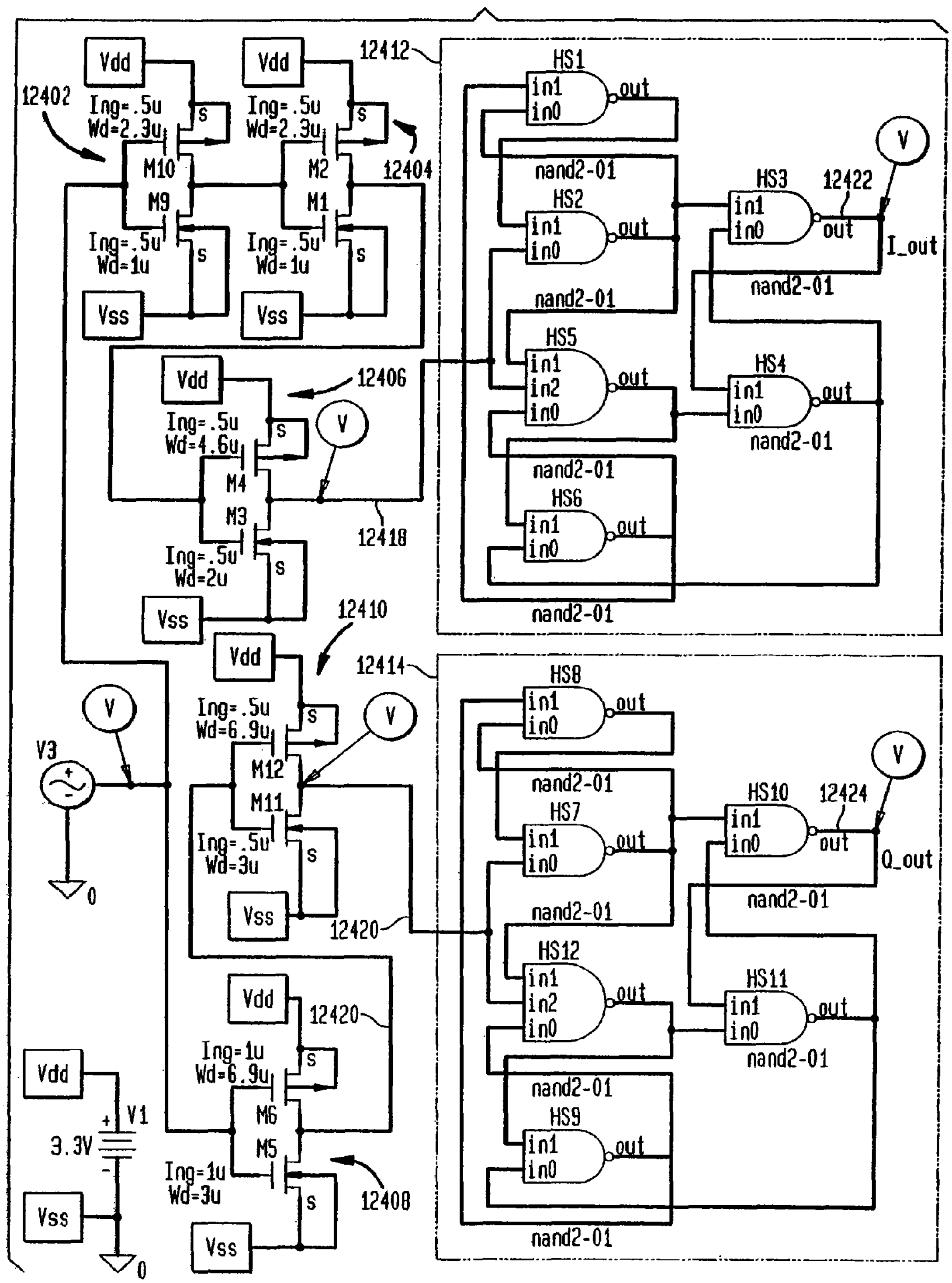
Figure 124C:
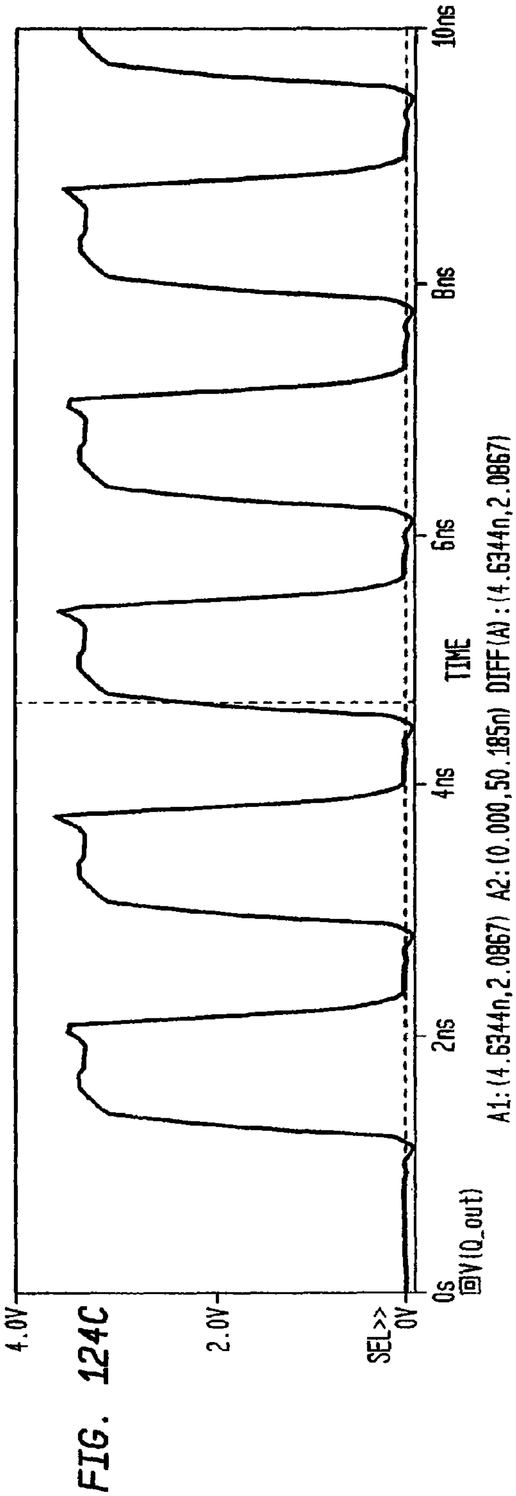
Figure 124D:
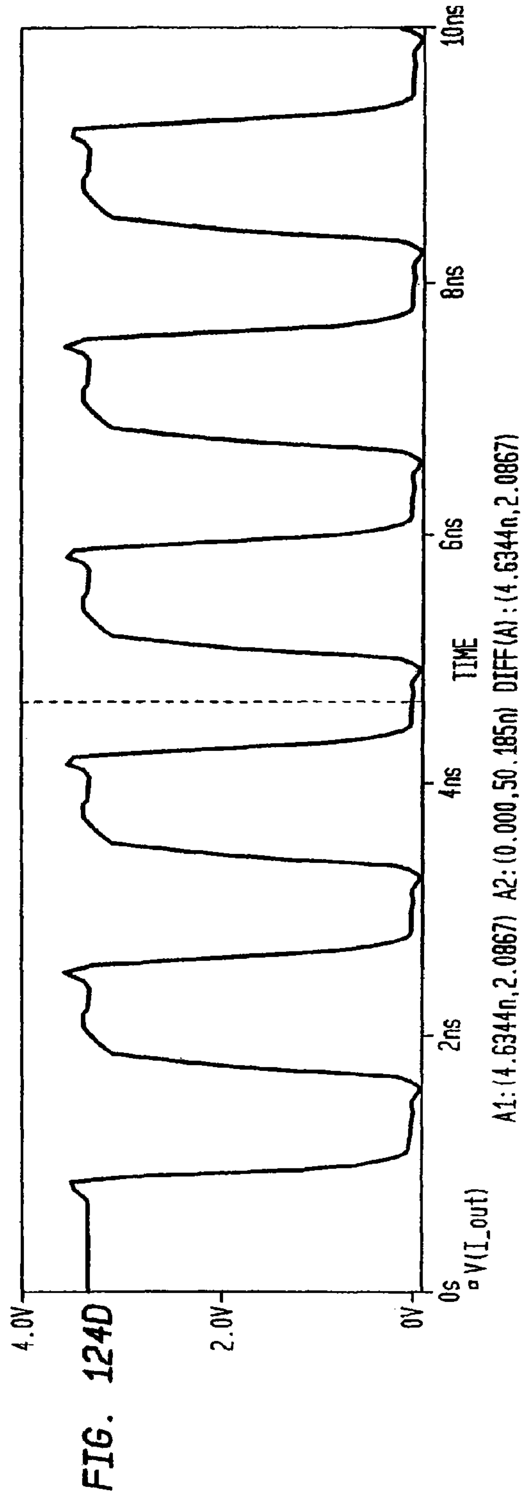
Figure 124E:
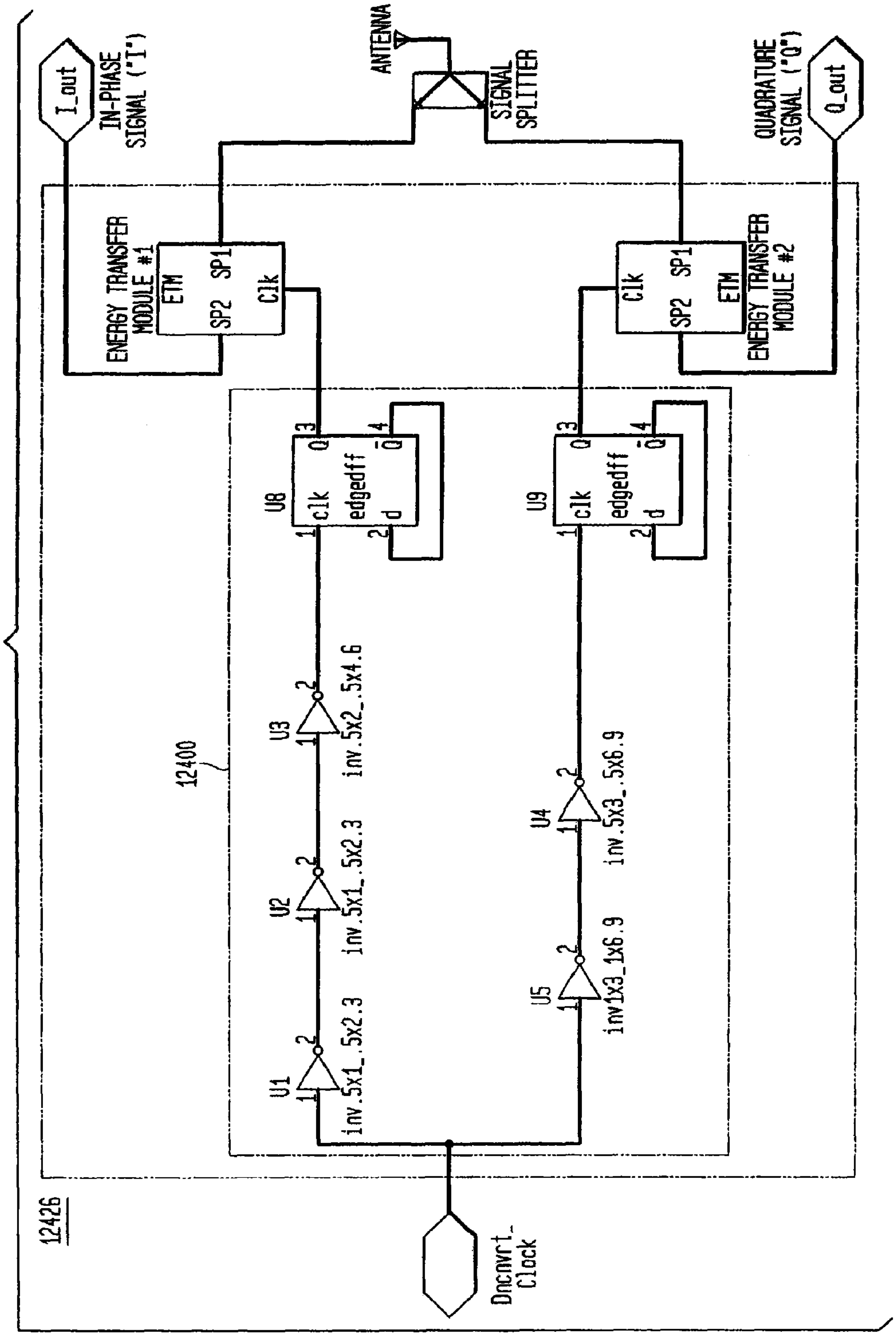
Figure 125:
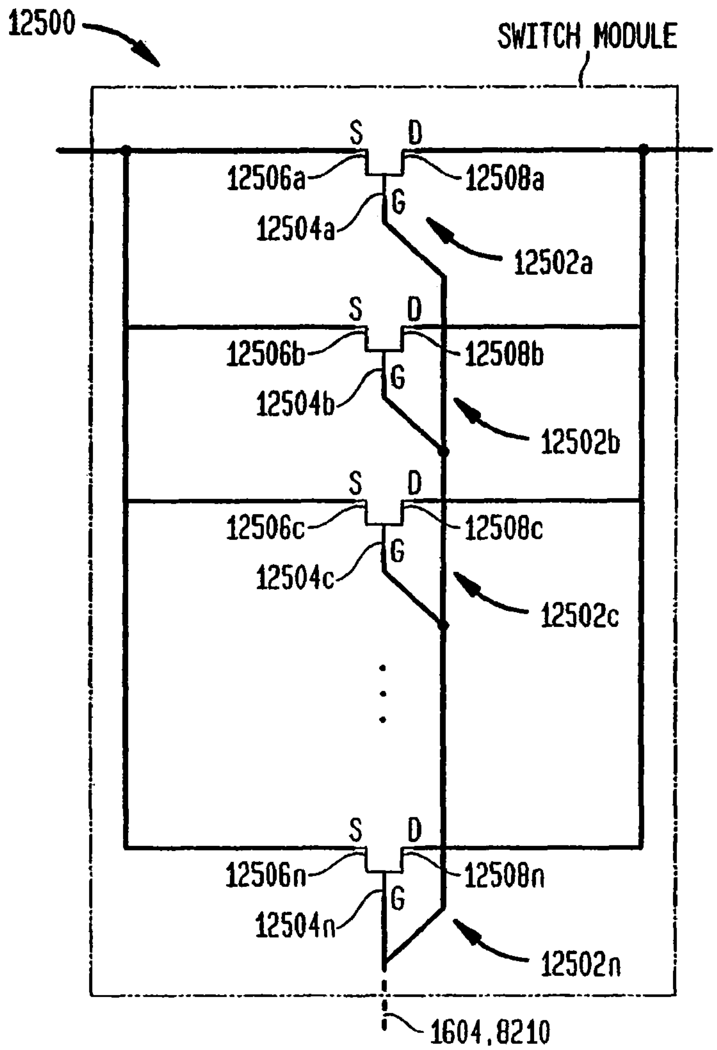
Figure 126A:
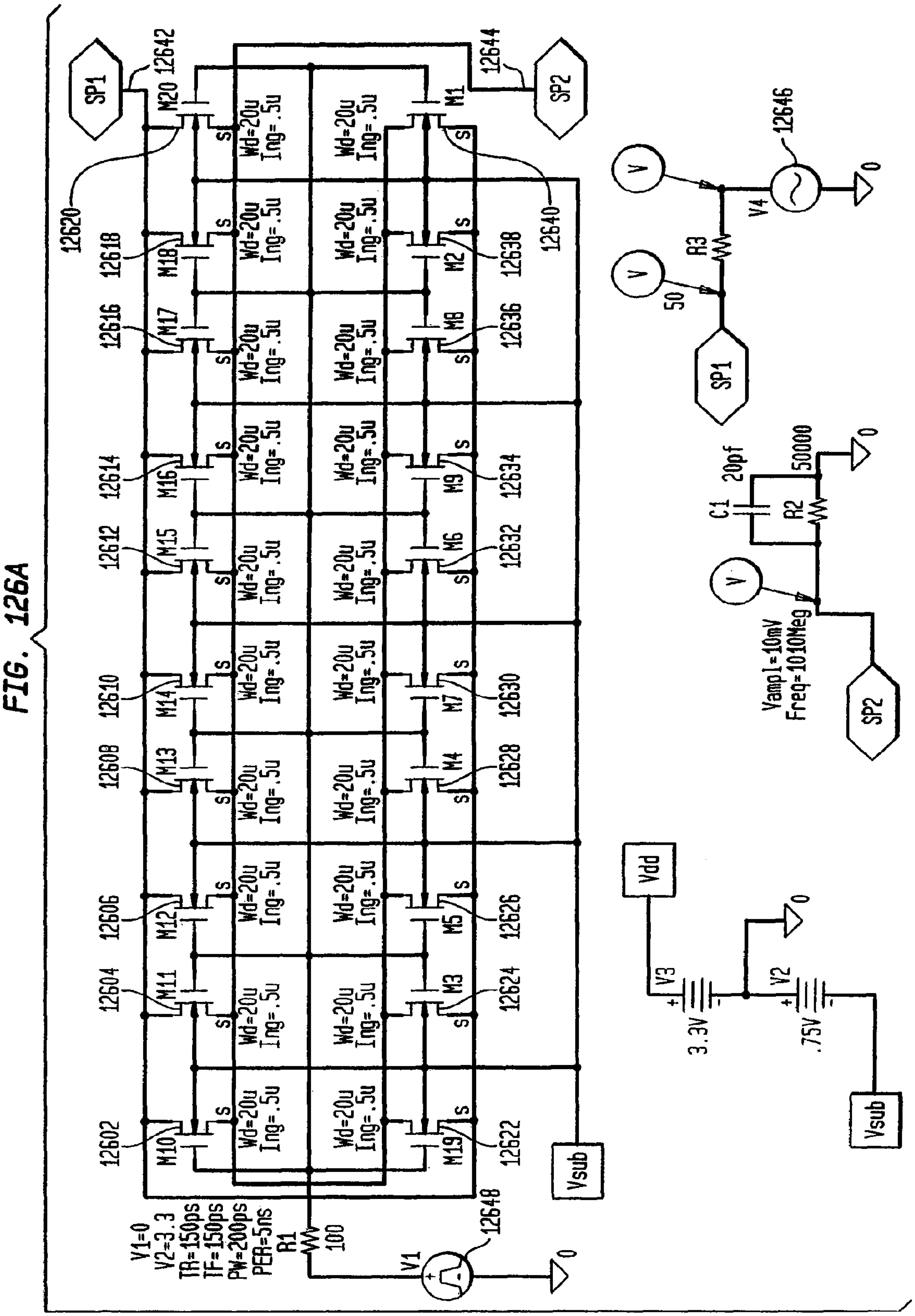
Figure 126B:
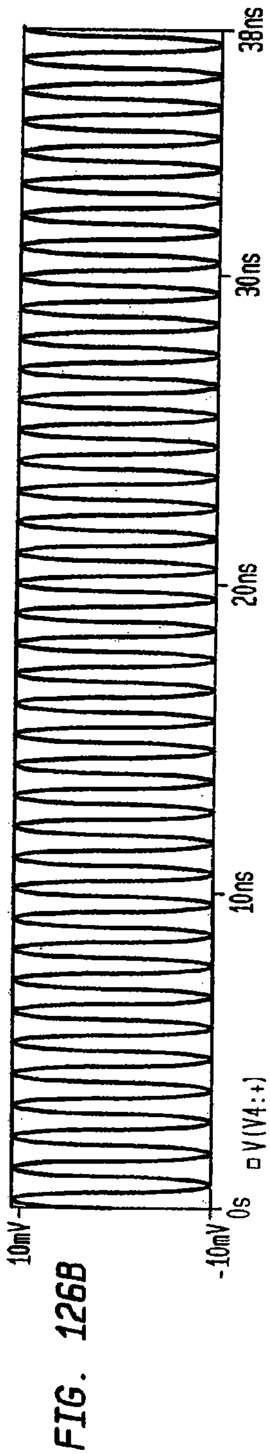
Figure 126C:
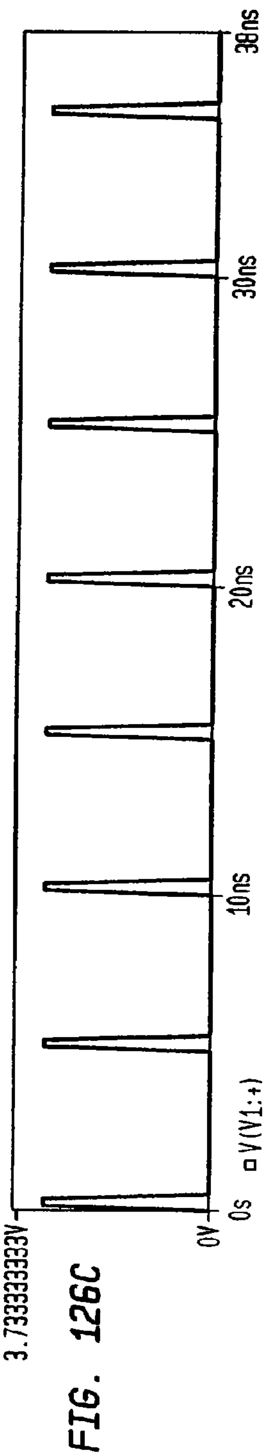
Figure 126D:
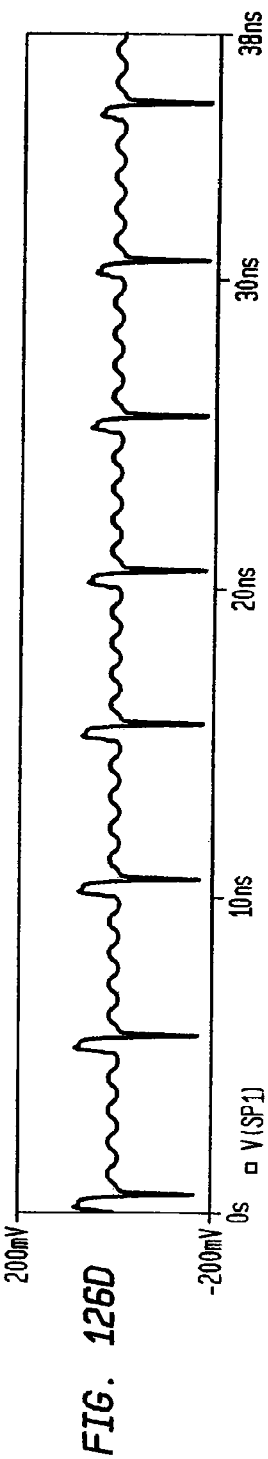
Figure 126E:
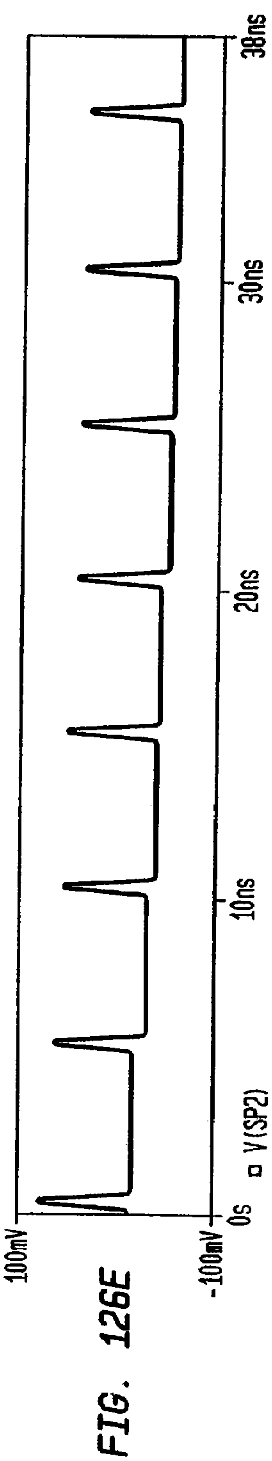
Figure 126F:
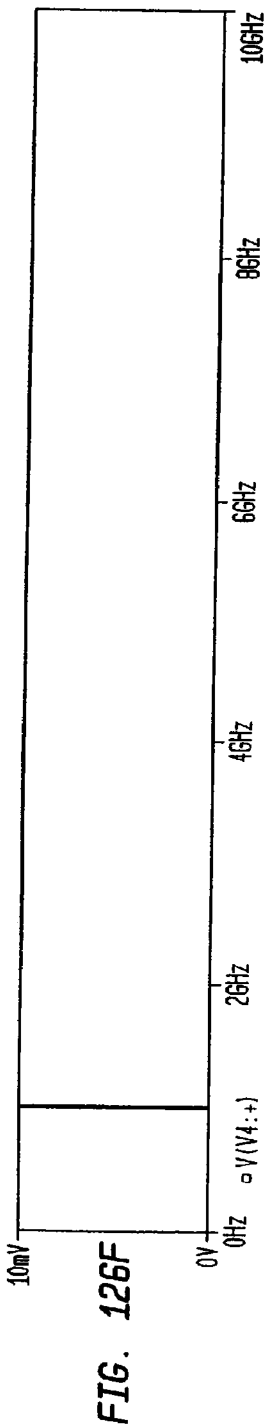
Figure 126G:
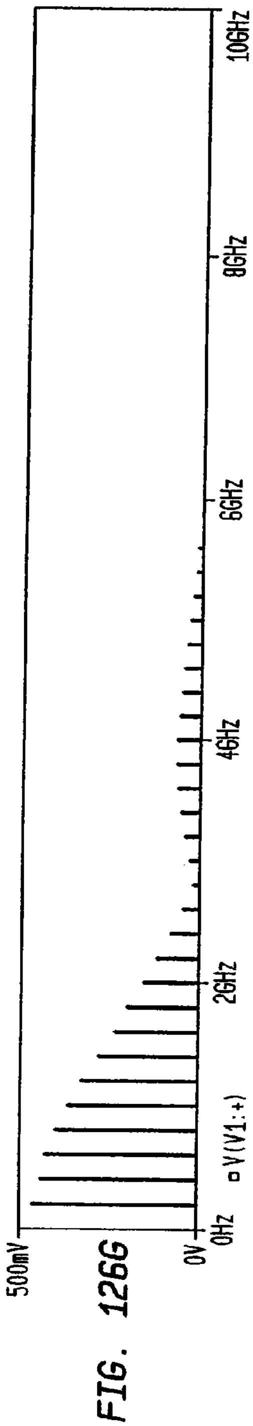
Figure 126H:
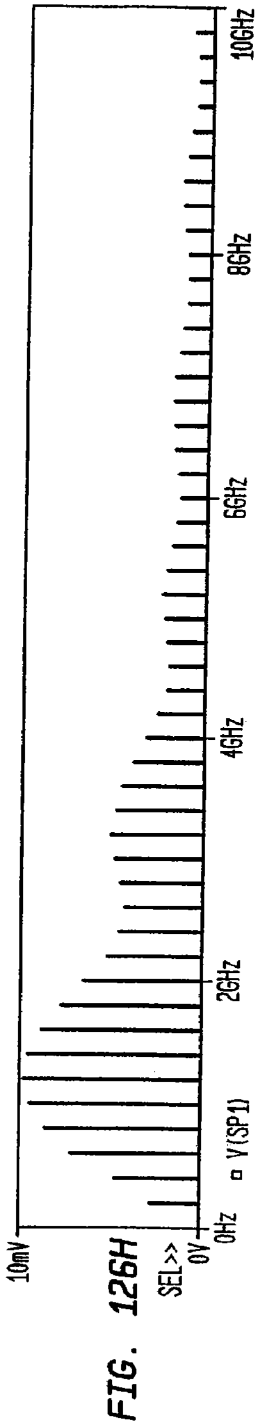
Figure 126I:
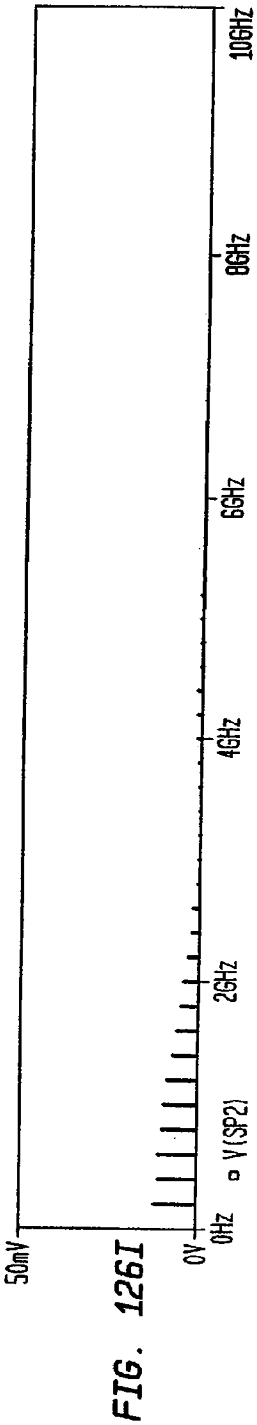
Figure 126J:
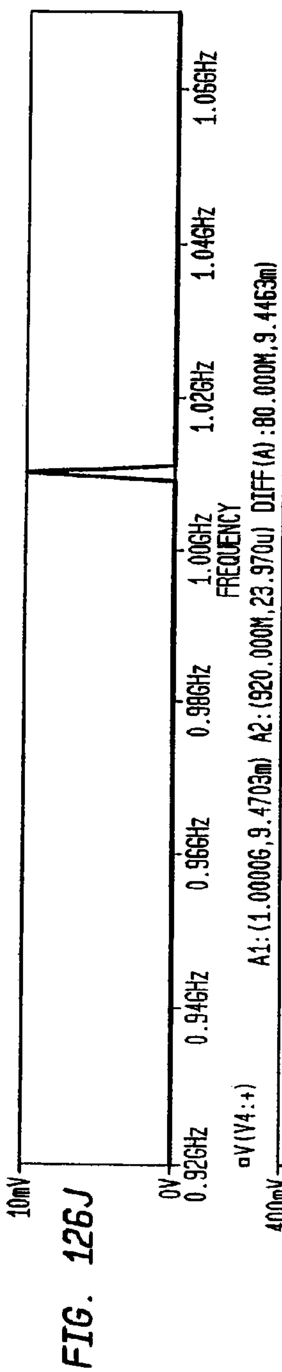
Figure 126K:
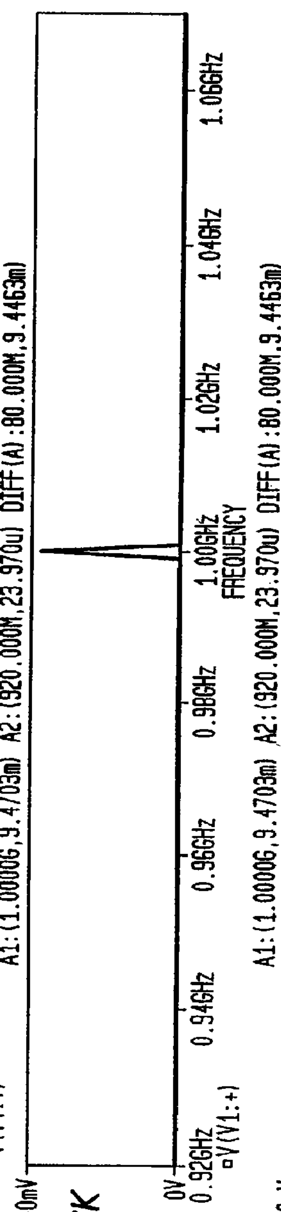
Figure 126L:
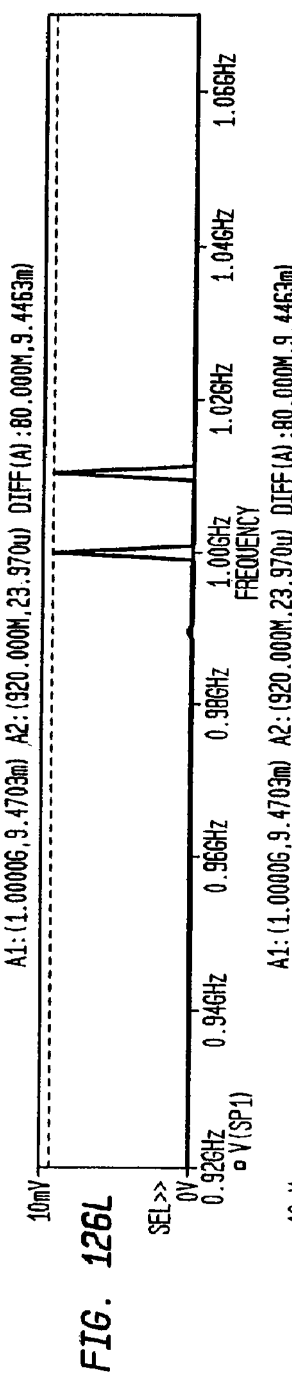
Figure 126M:
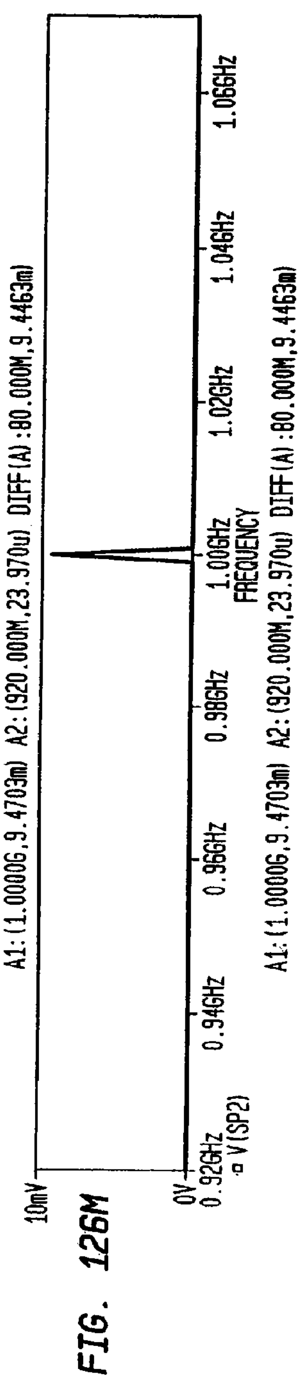
Figure 126N:
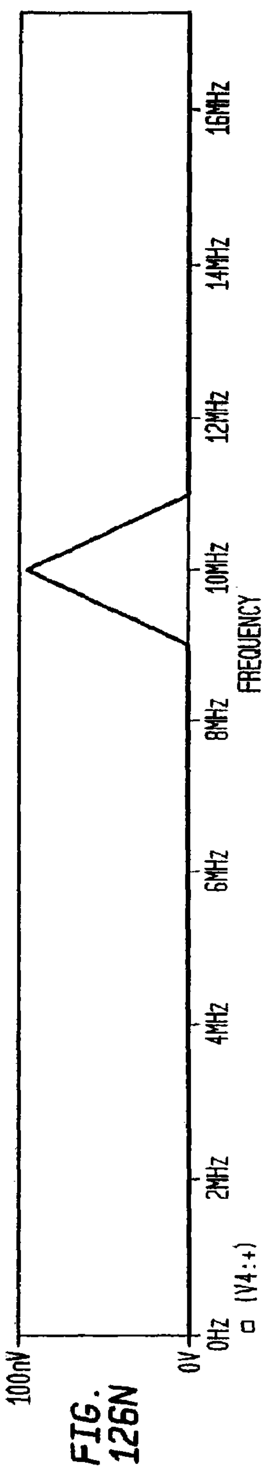
Figure 126O:
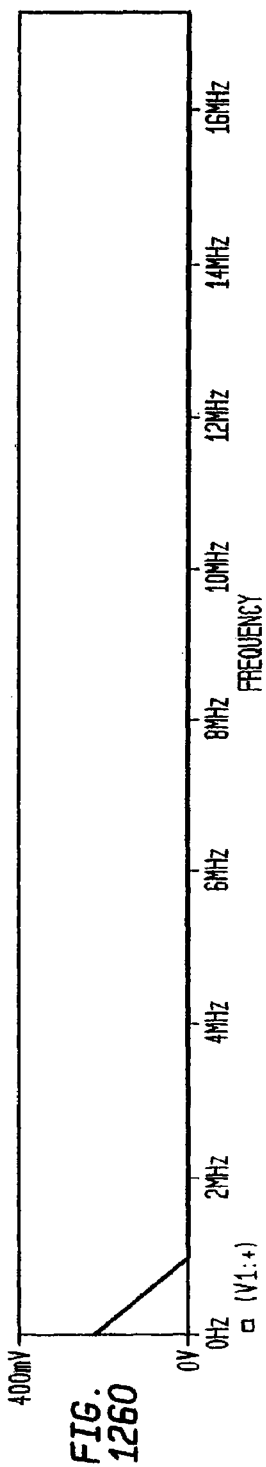
Figure 126P:
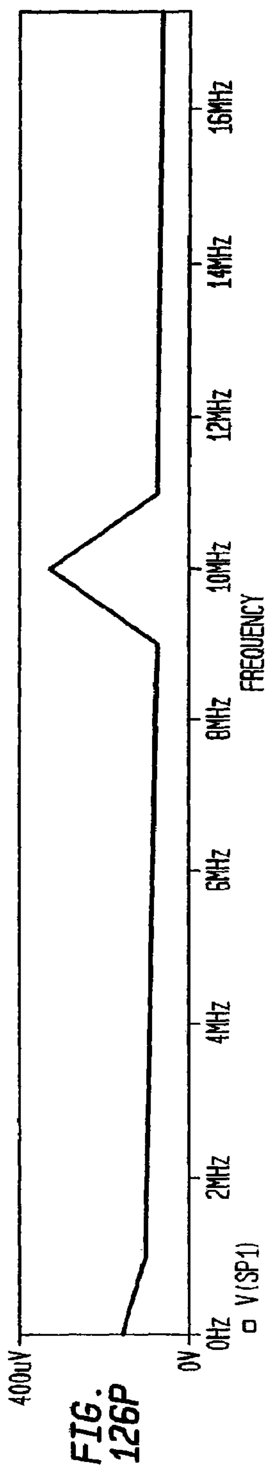
Figure 126Q:
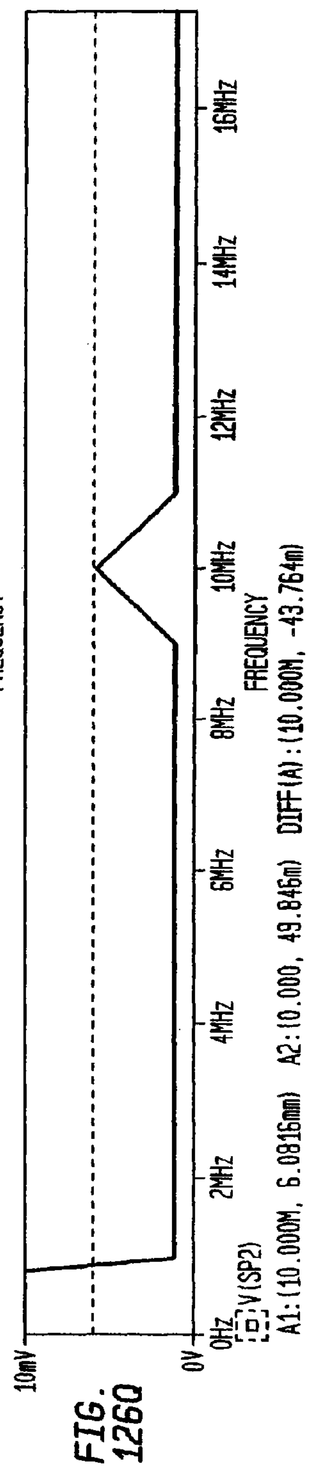
Figure 127A:
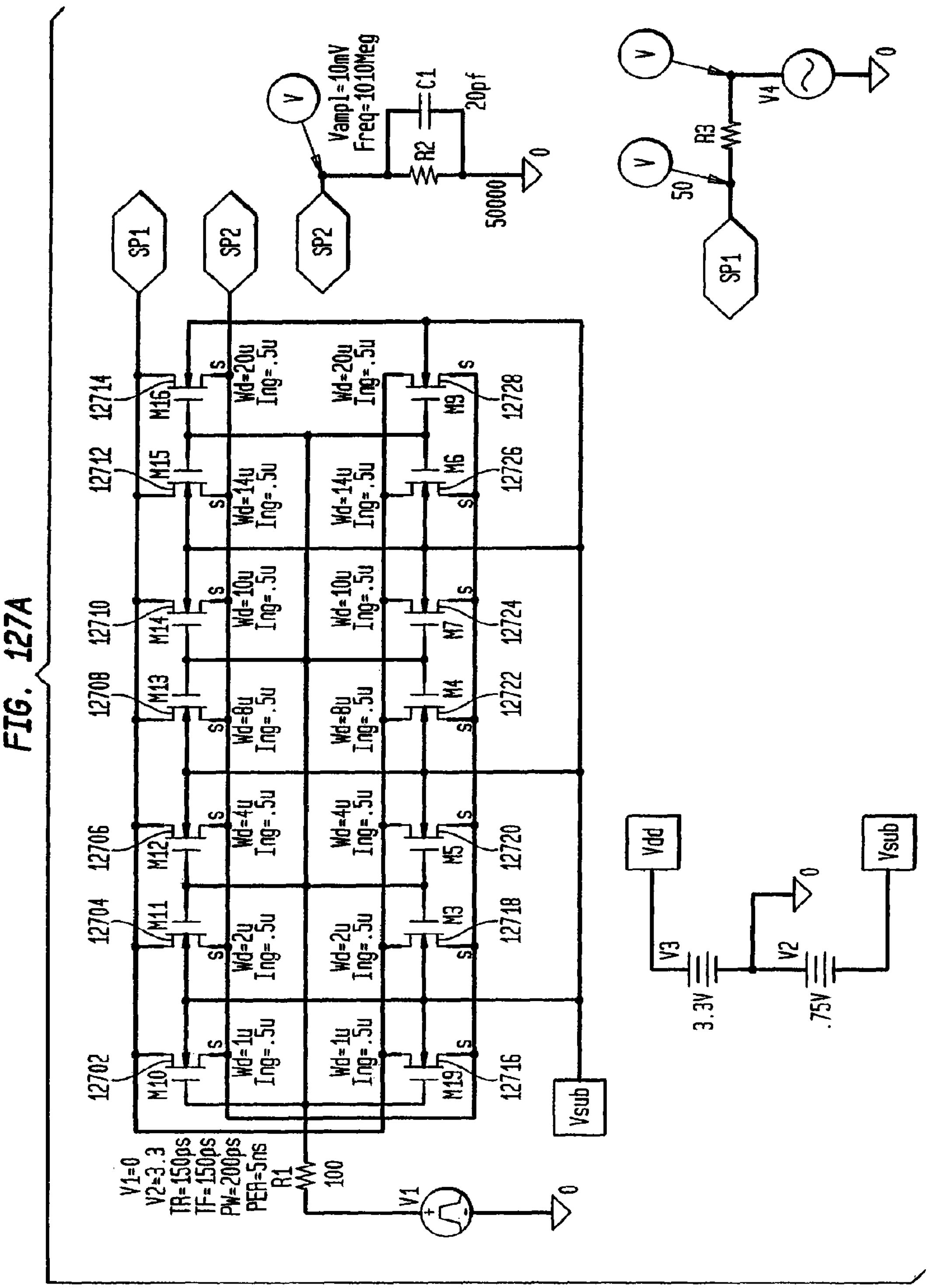
Figure 127B:
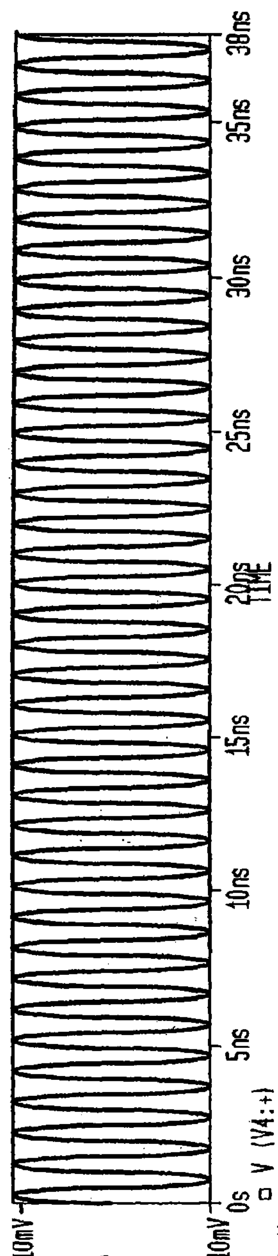
Figure 127C:
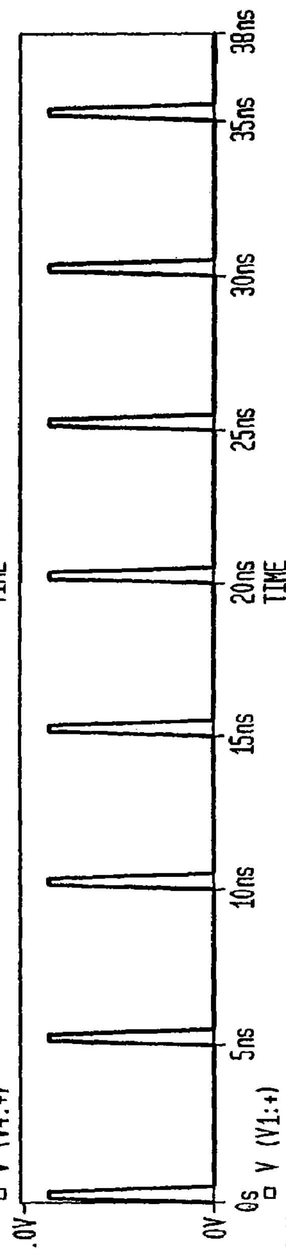
Figure 127D:
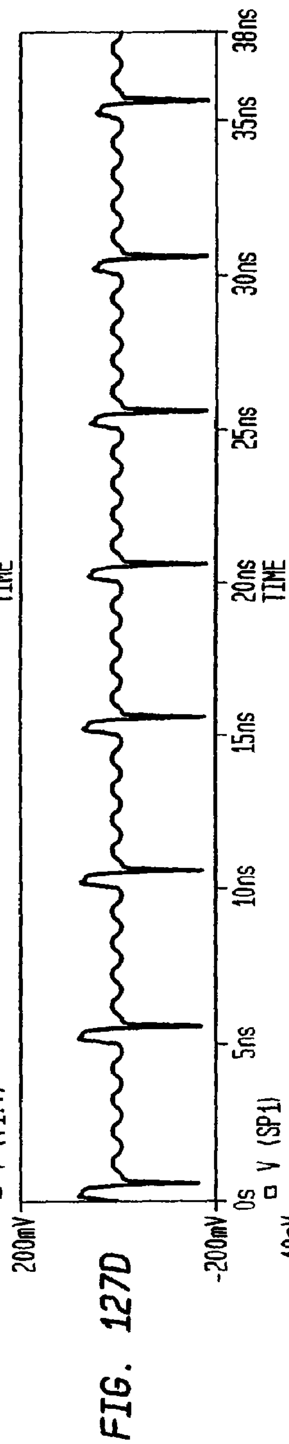
Figure 127E:
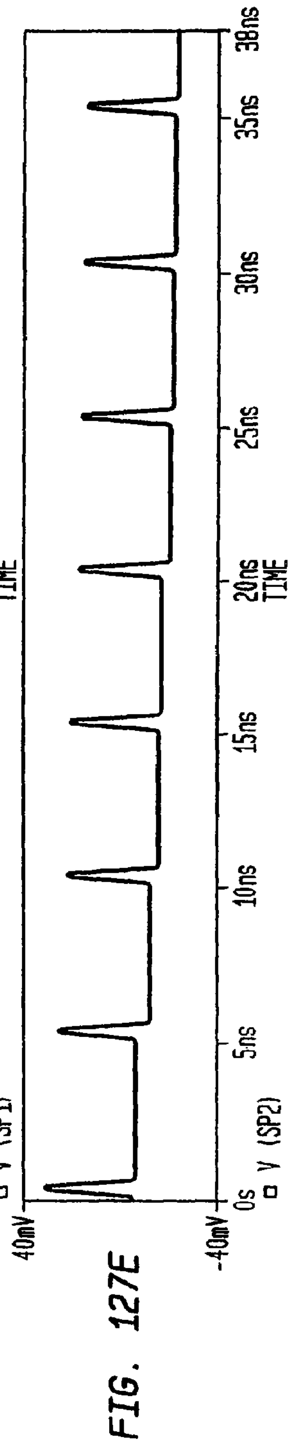
Figure 127F:
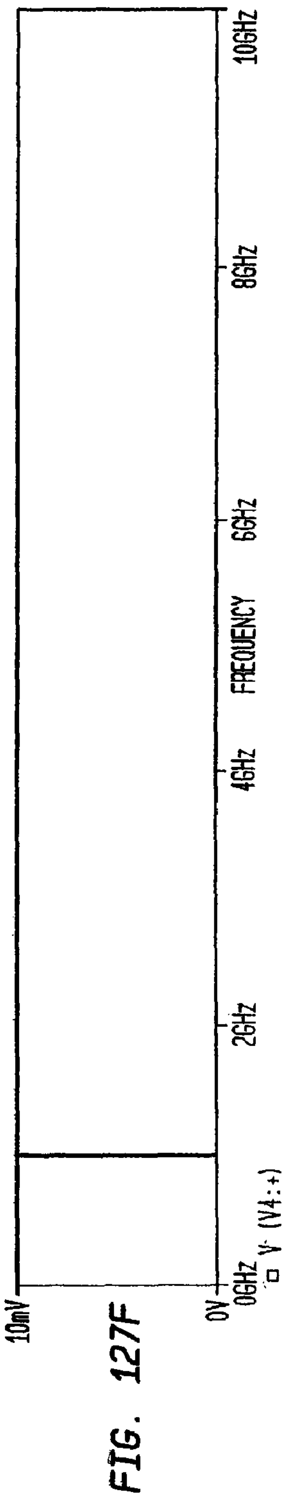
Figure 127G:
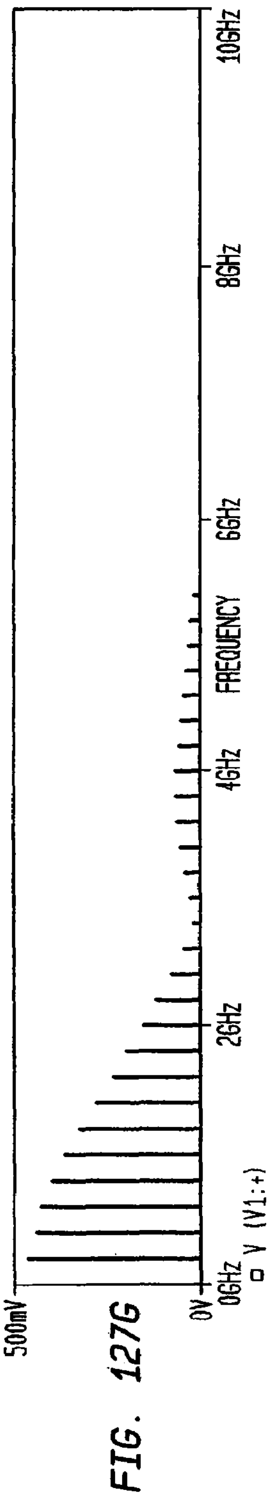
Figure 127H:
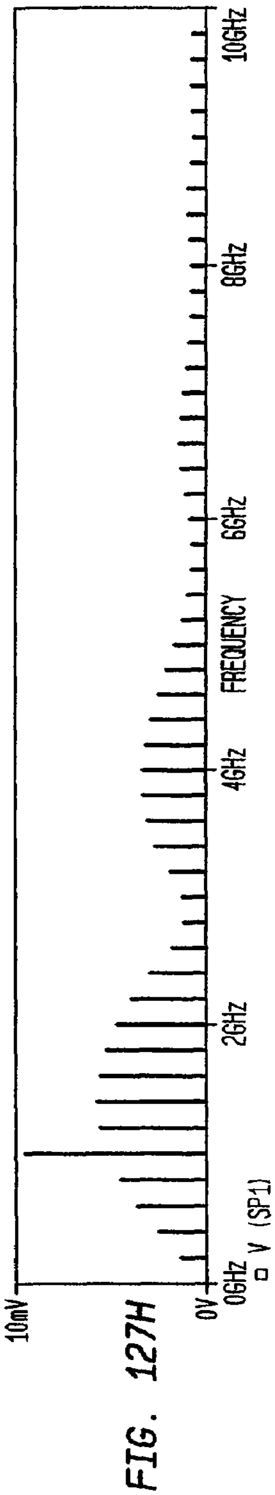
Figure 127I:
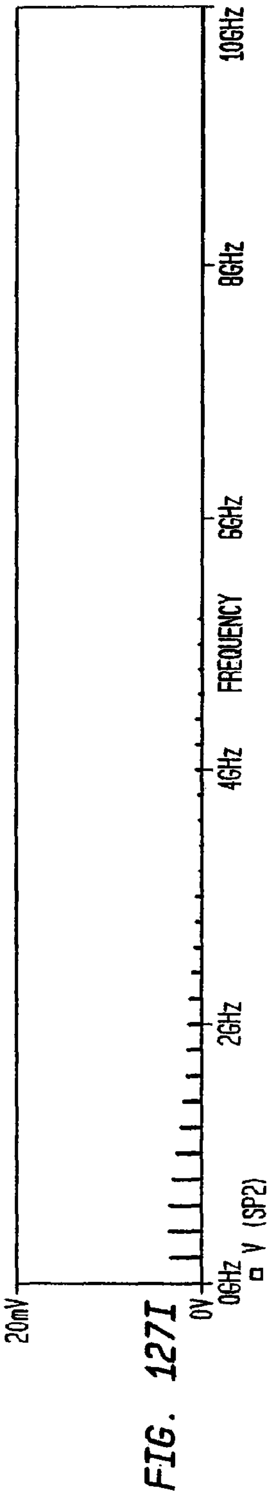
Figures 127J, 127K, 127L, 127M:
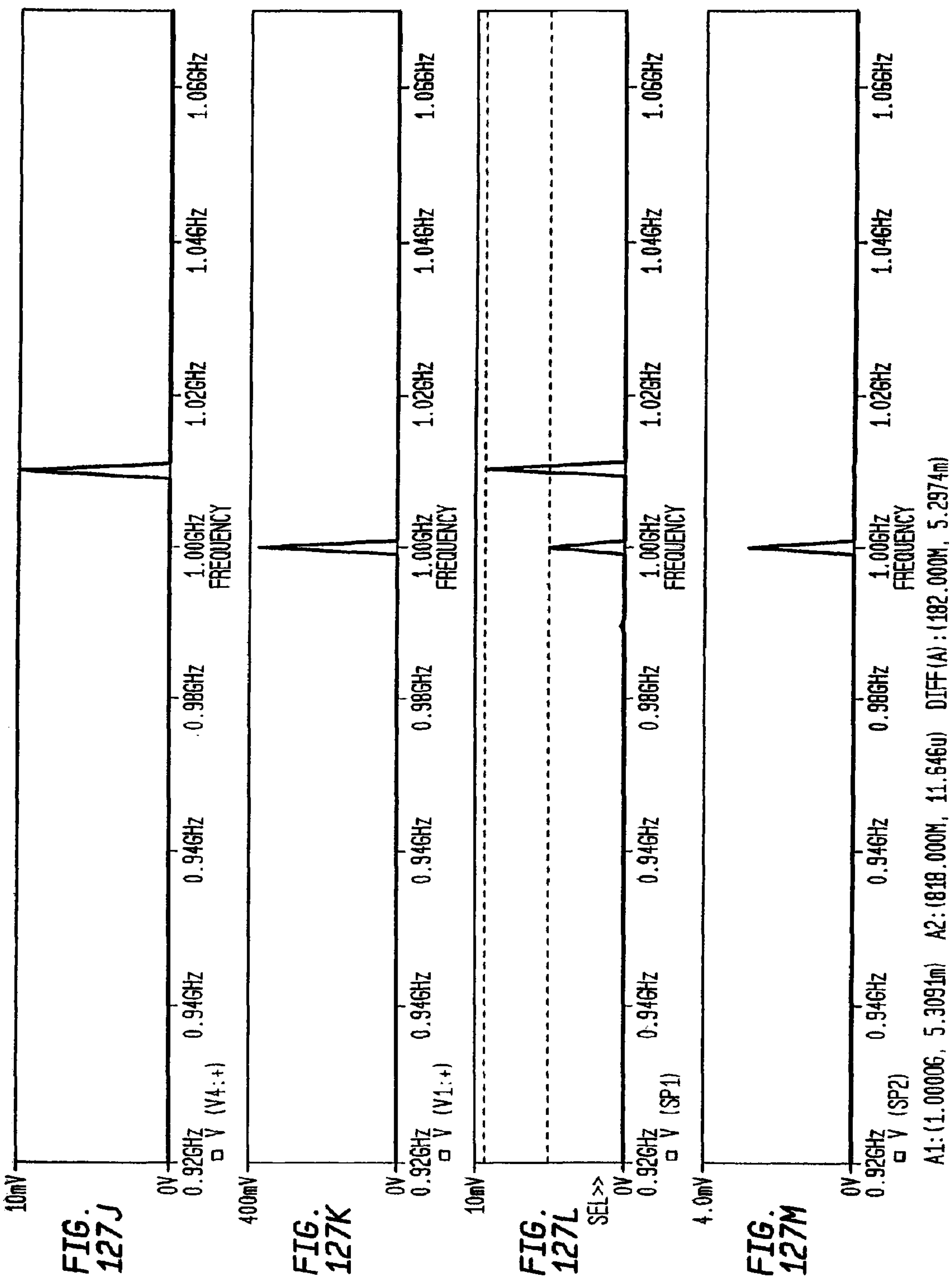
Figure 127N:
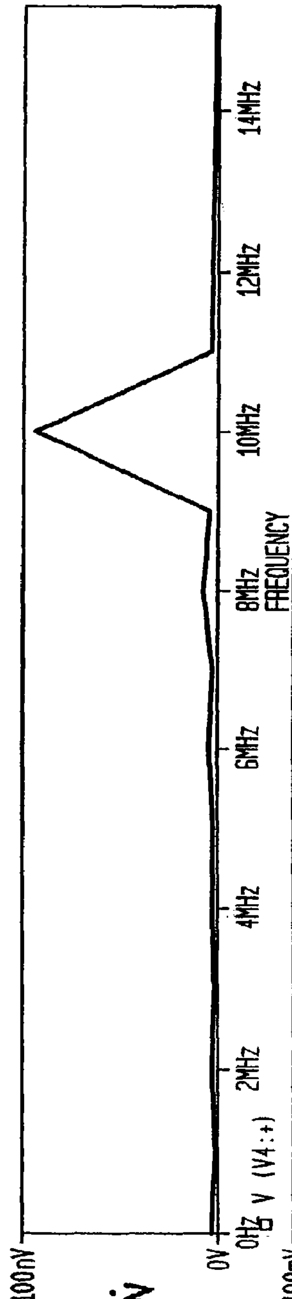
Figure 127O:
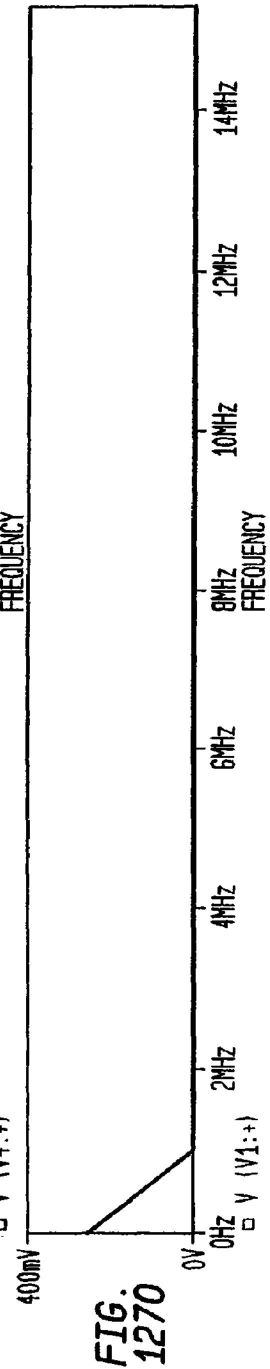
Figure 127P:
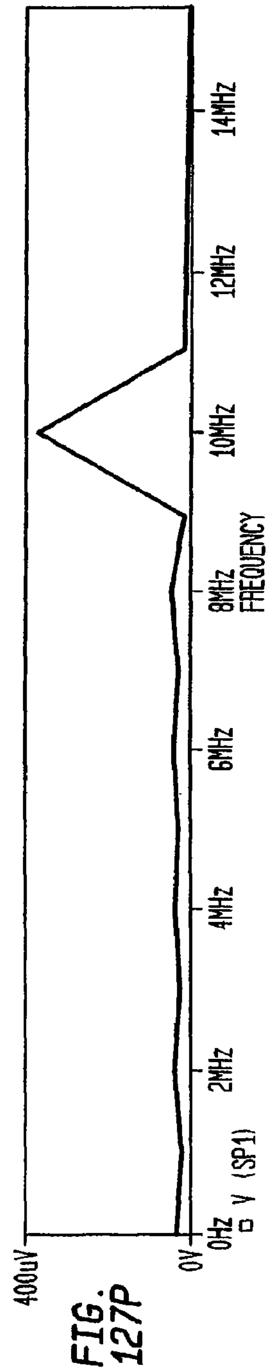
Figure 127Q:
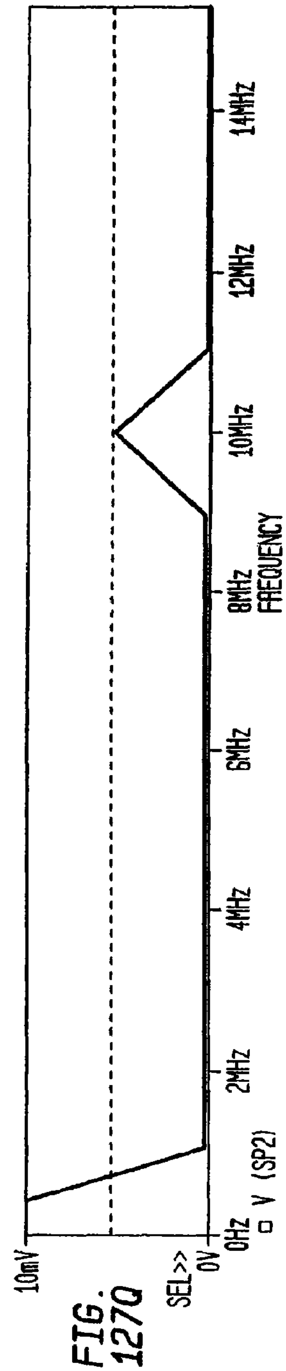
Figure 128A:
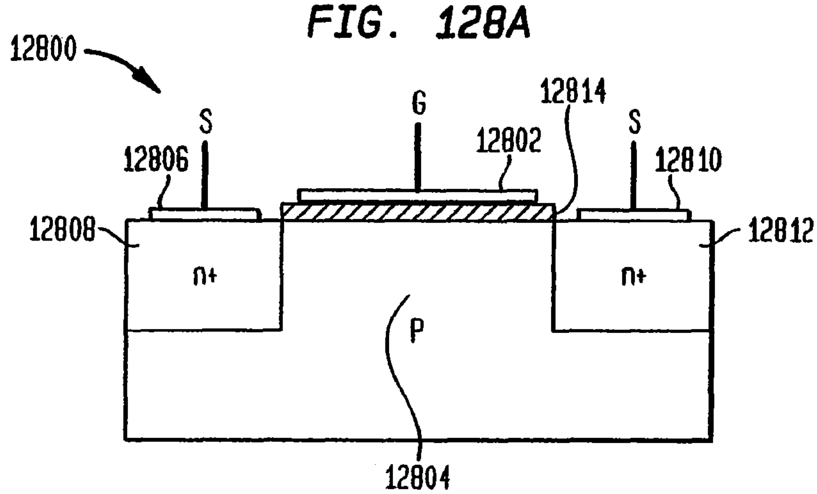
Figure 128B:
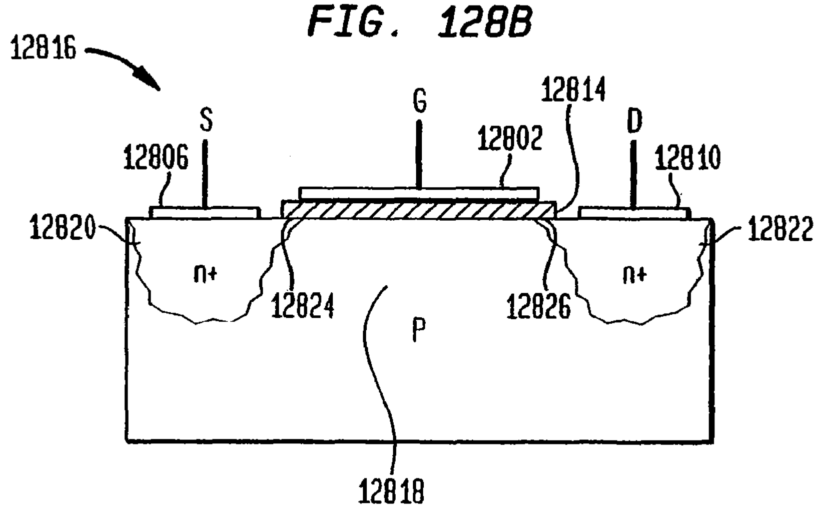
Figure 128C:
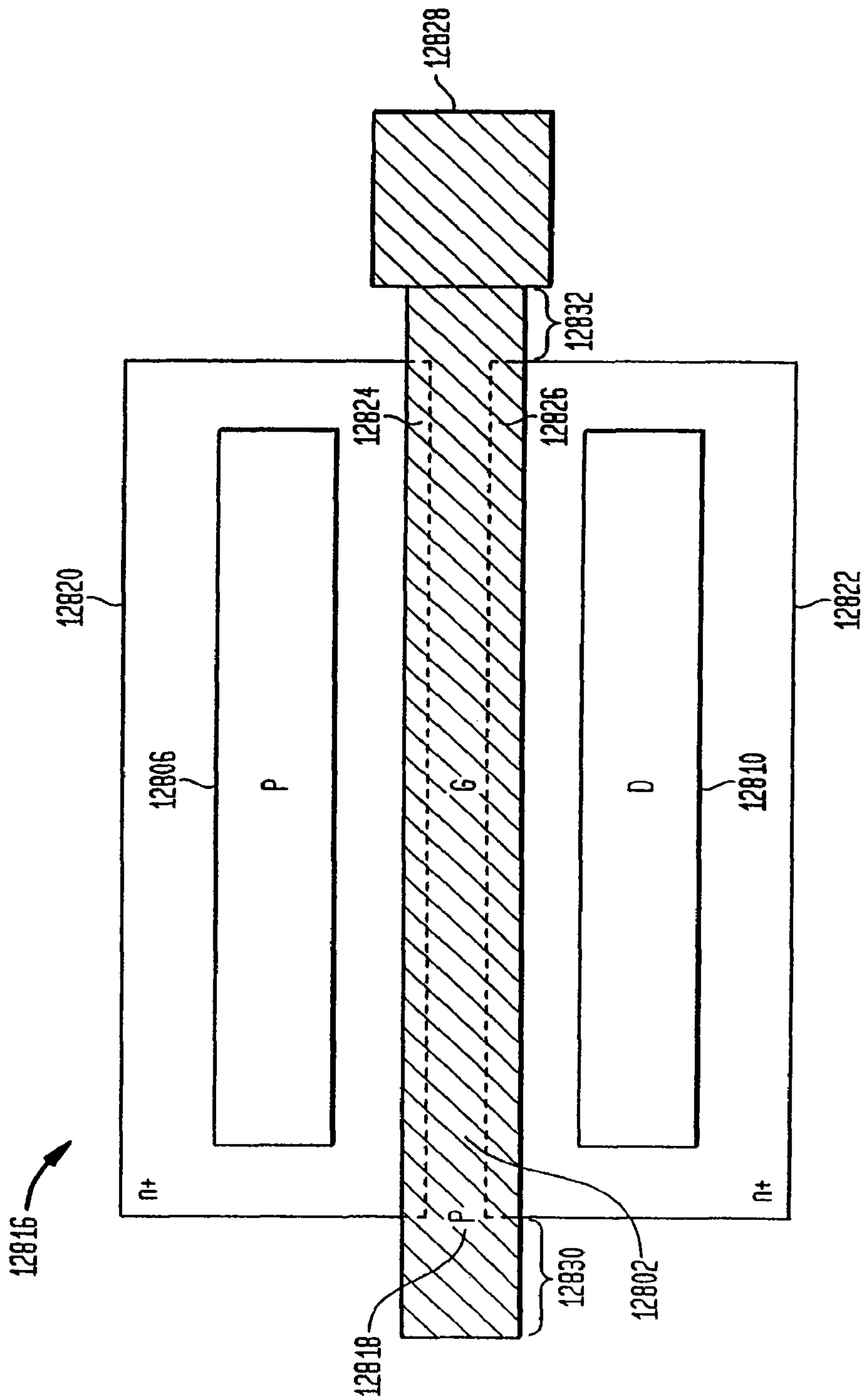
Figure 129A:
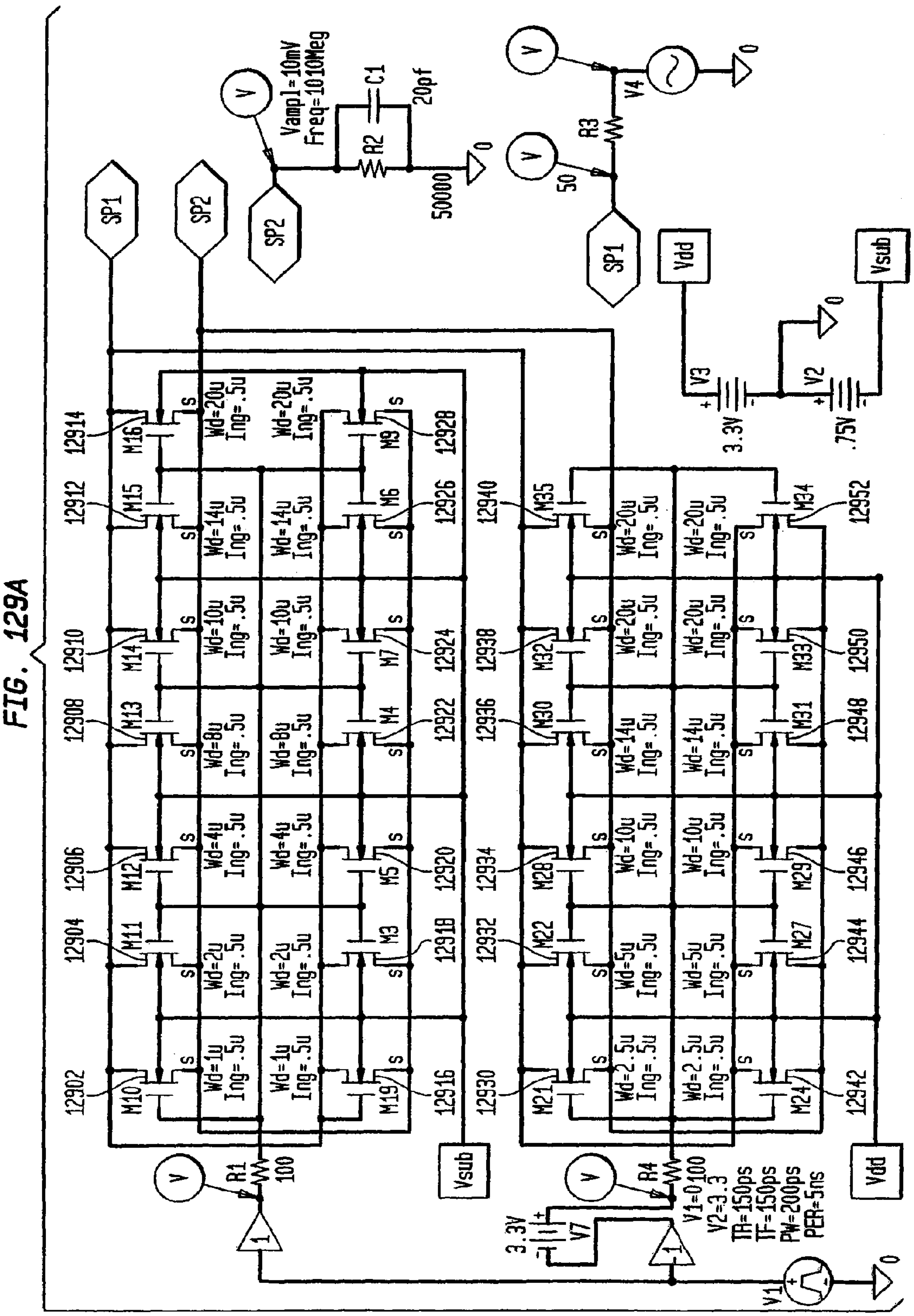
Figures 129B, 129C, 129D, 129E:
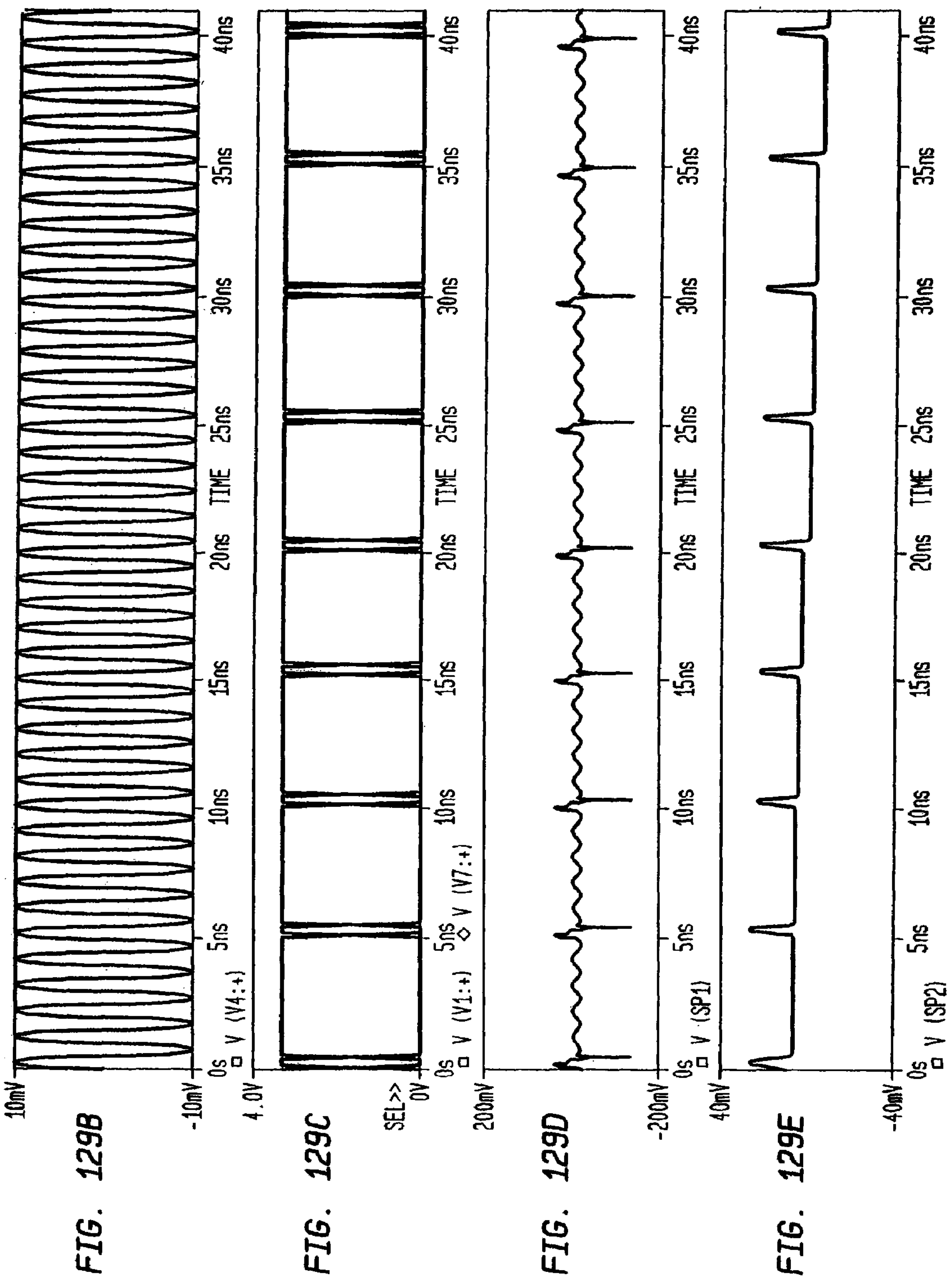
Figure 129F:
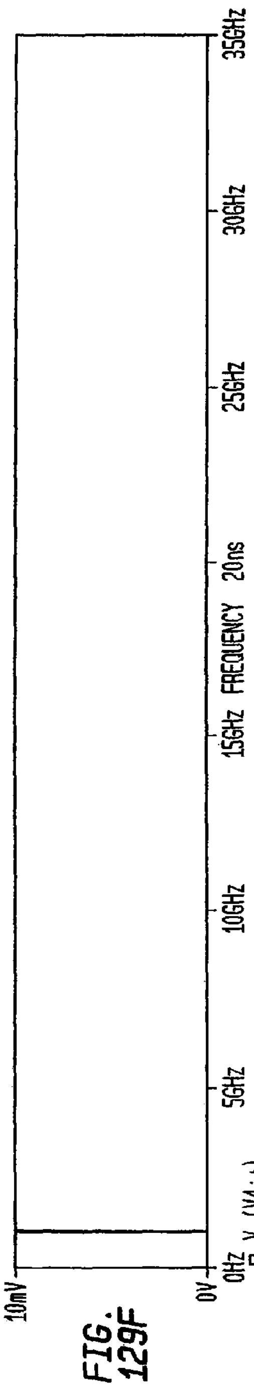
Figure 129G:
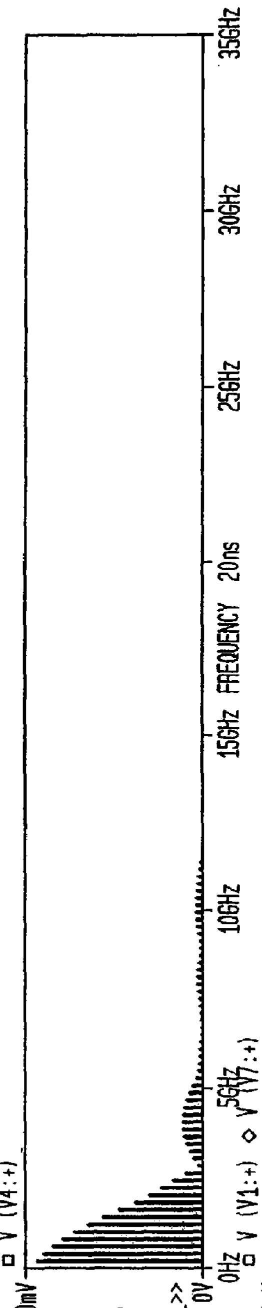
Figure 129H:
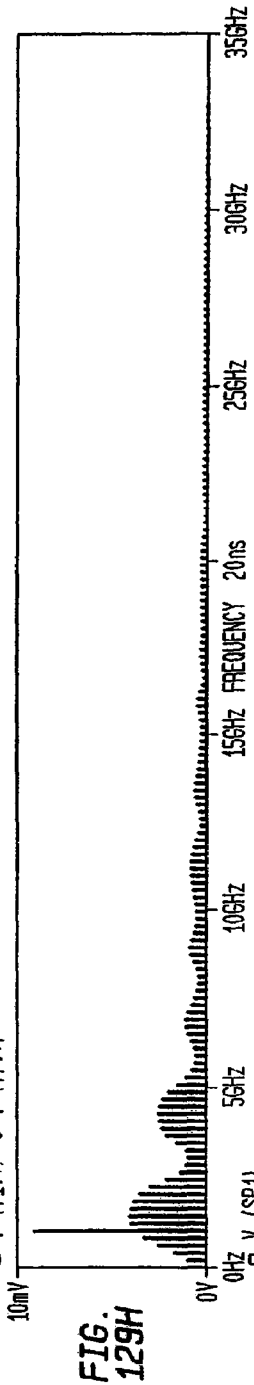
Figure 129I:
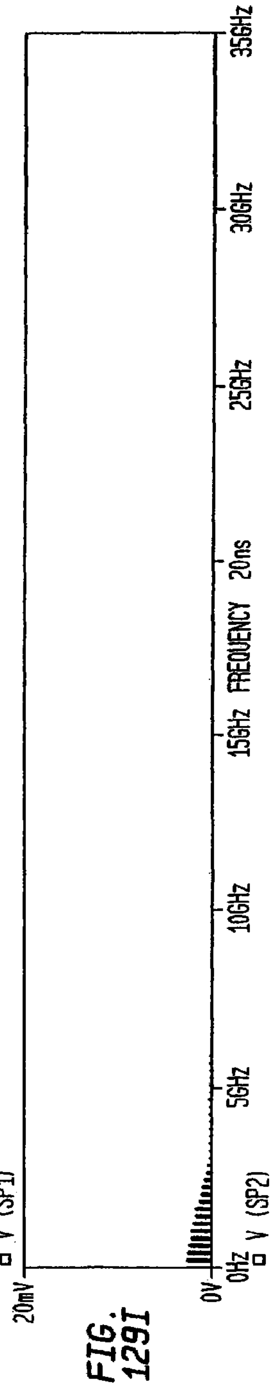
Figures 129J, 129K, 129L, 129M:
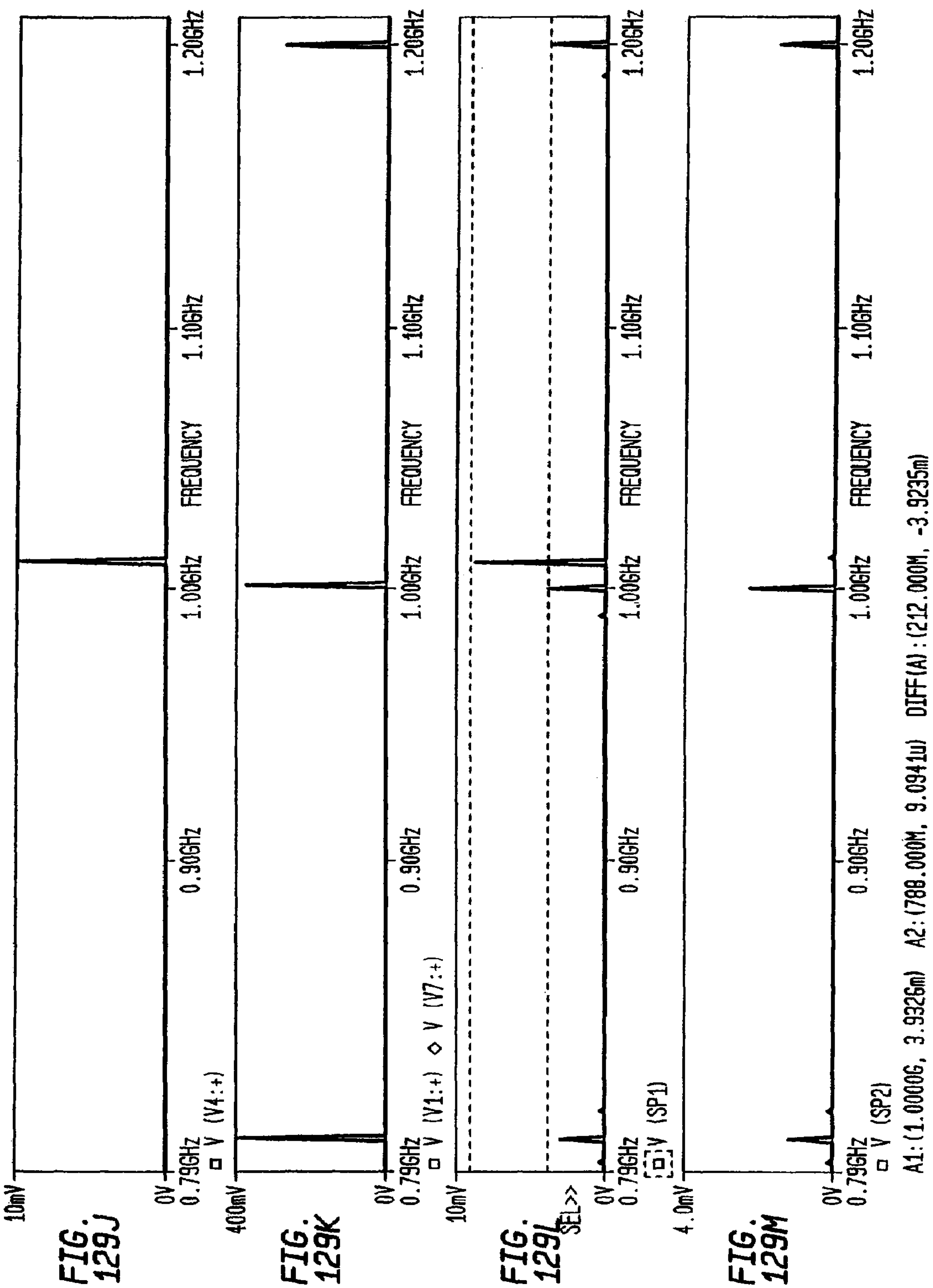
Figure 129N:
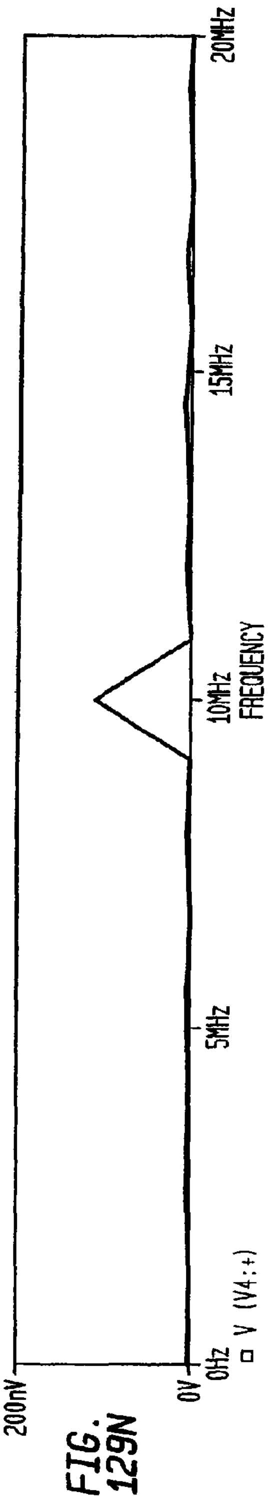
Figure 129O:
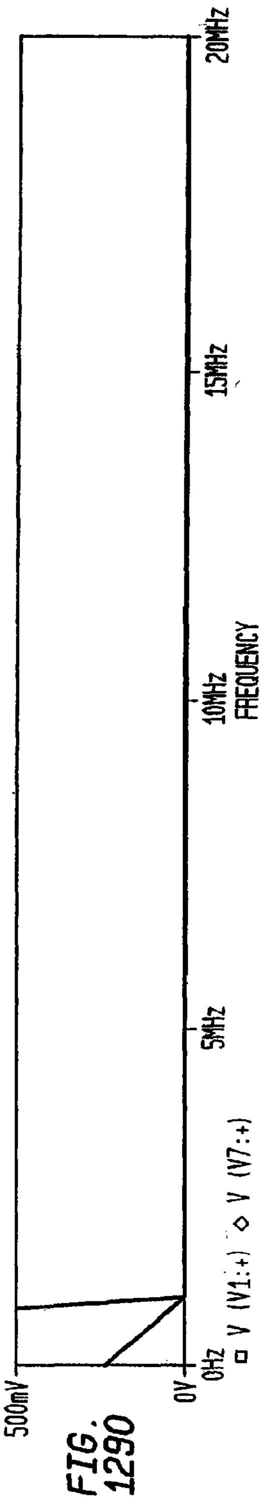
Figure 129P:
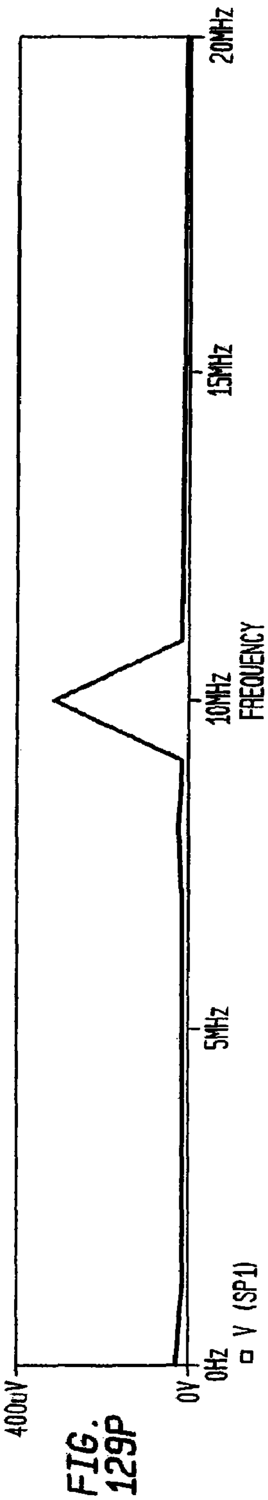
Figure 129Q:
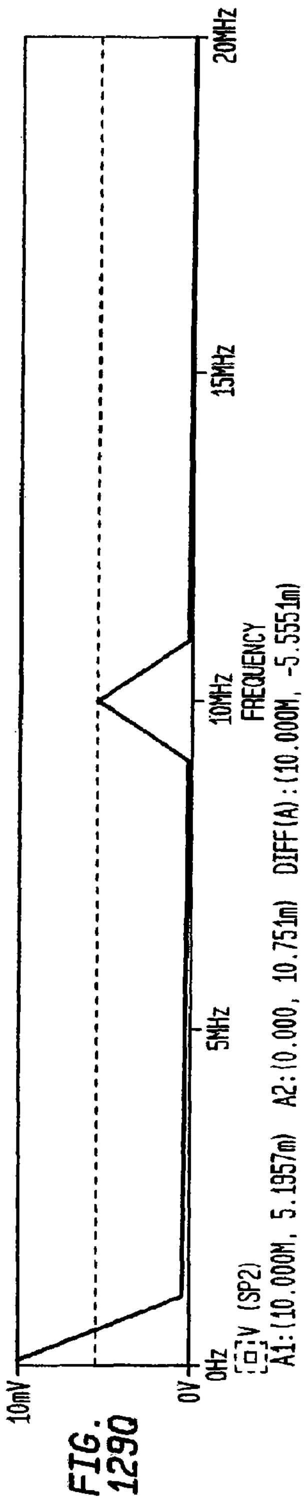
Figure 130:
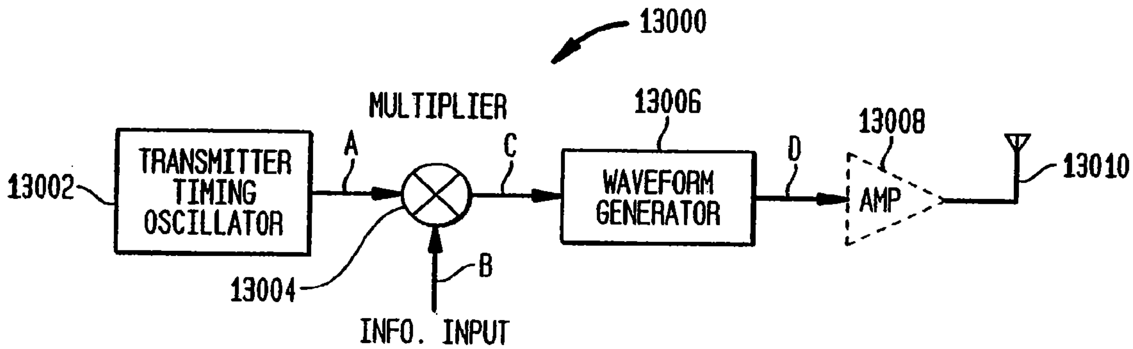
Figure 131:
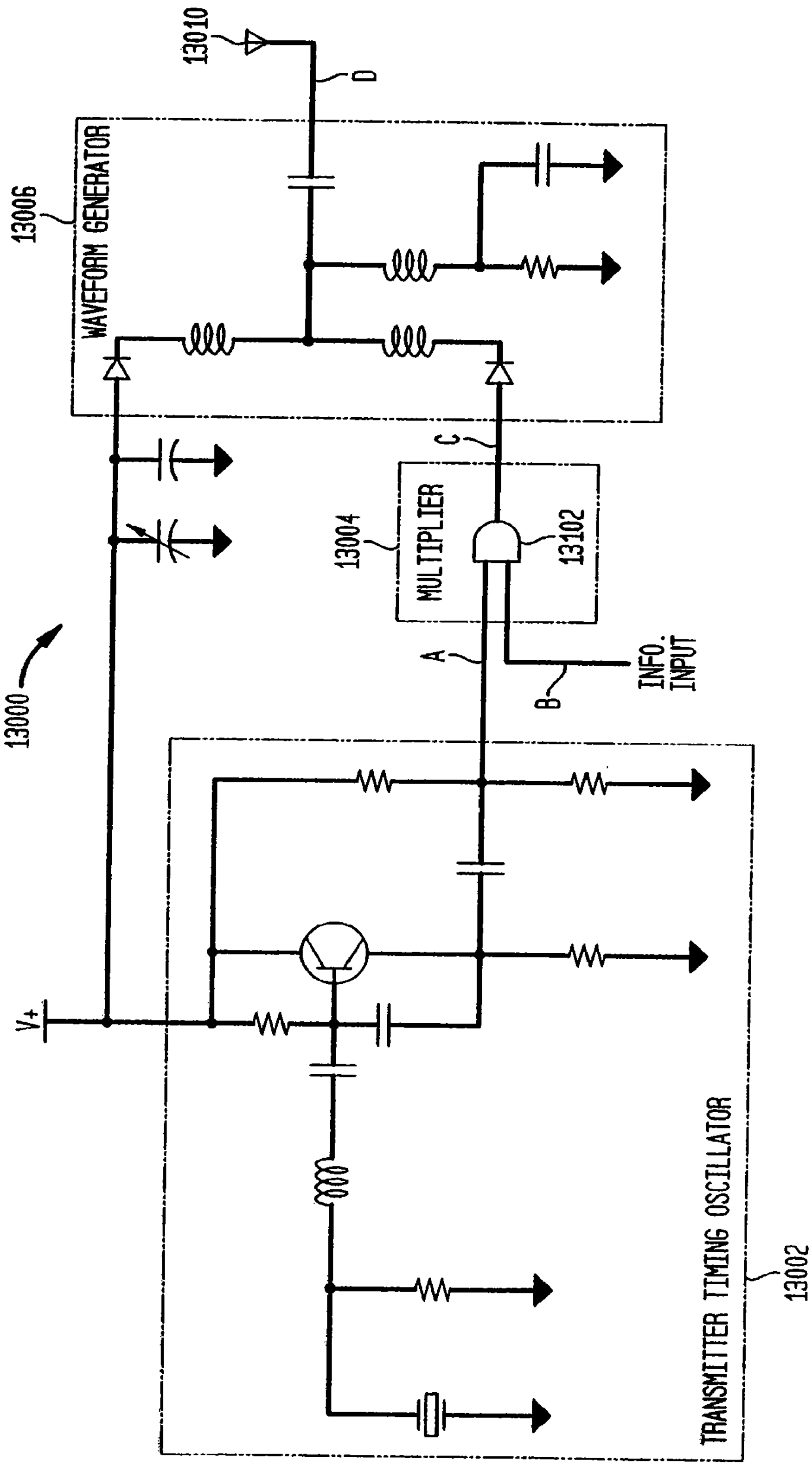
Figure 132A:
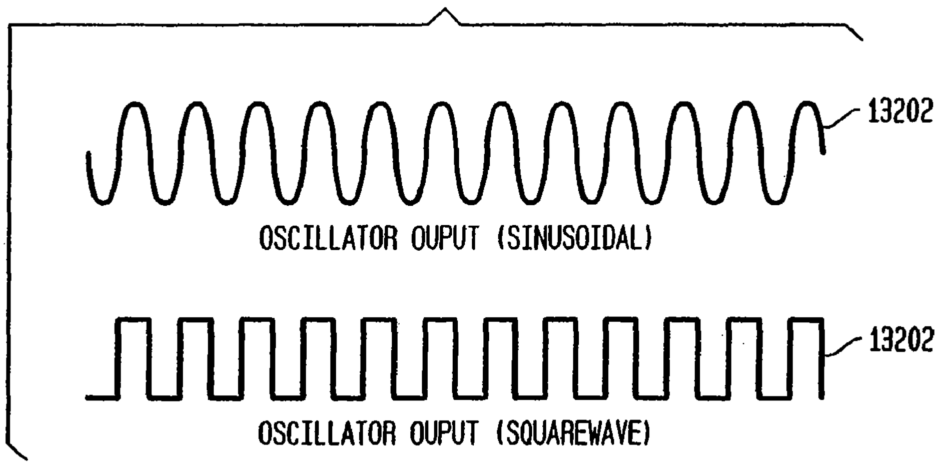
Figure 132B:
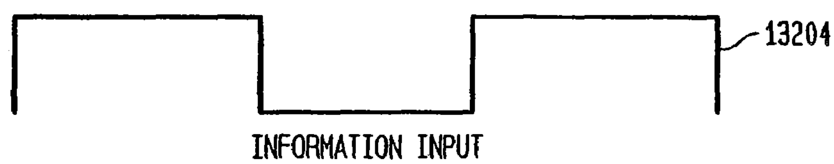
Figure 132C:
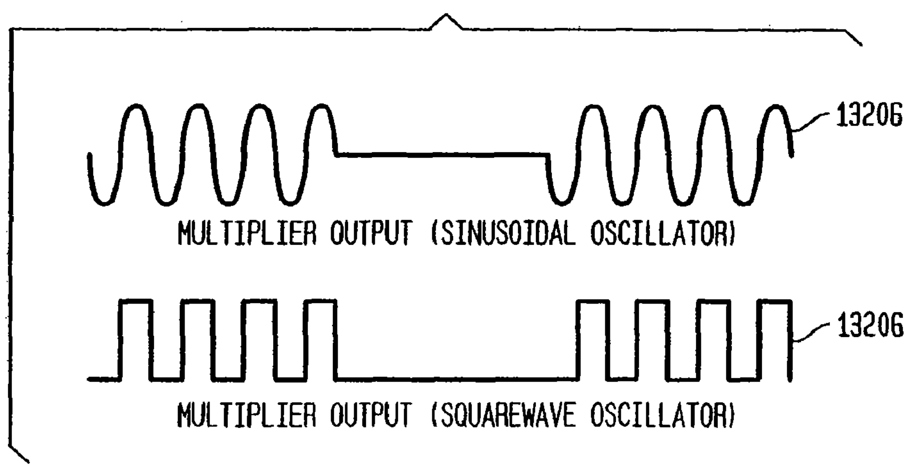
Figure 132D:
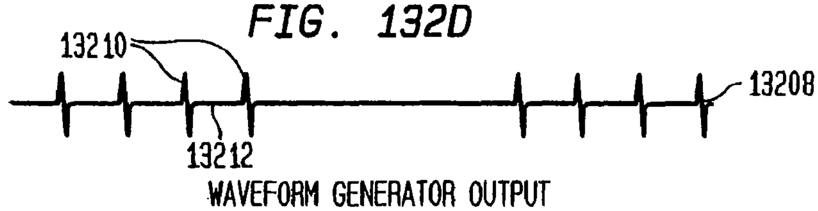
Figure 133:
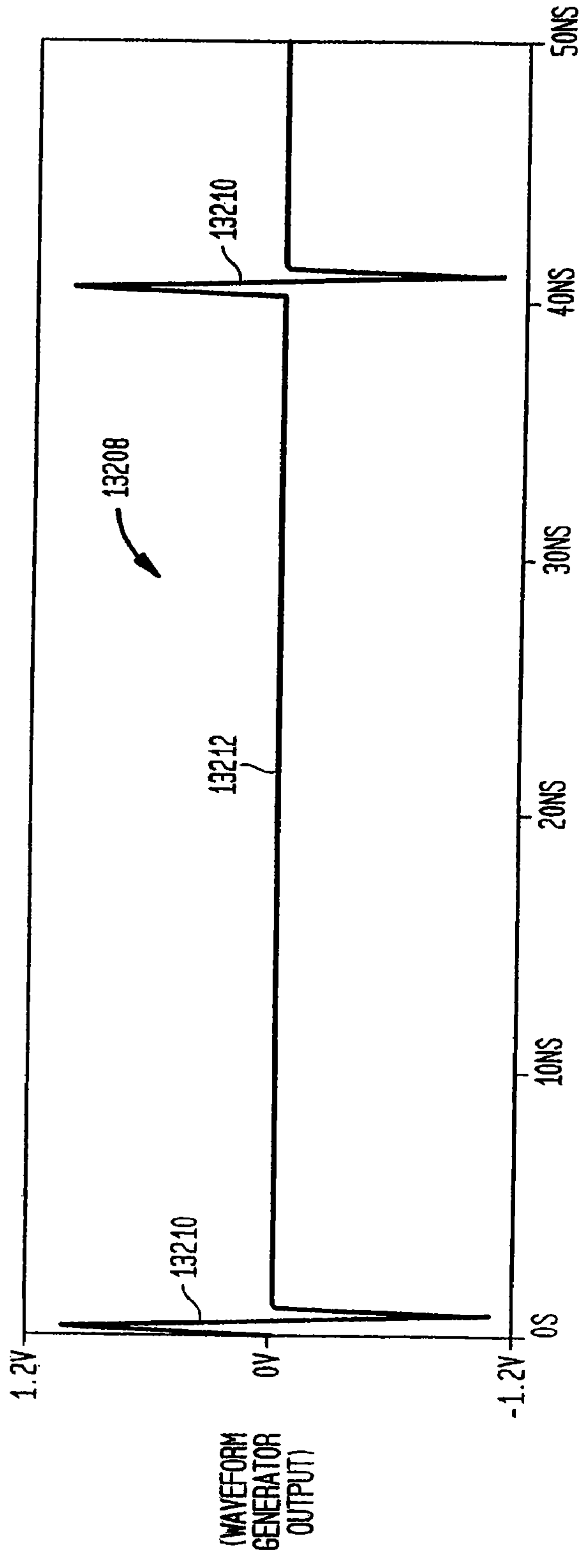
Figure 134:
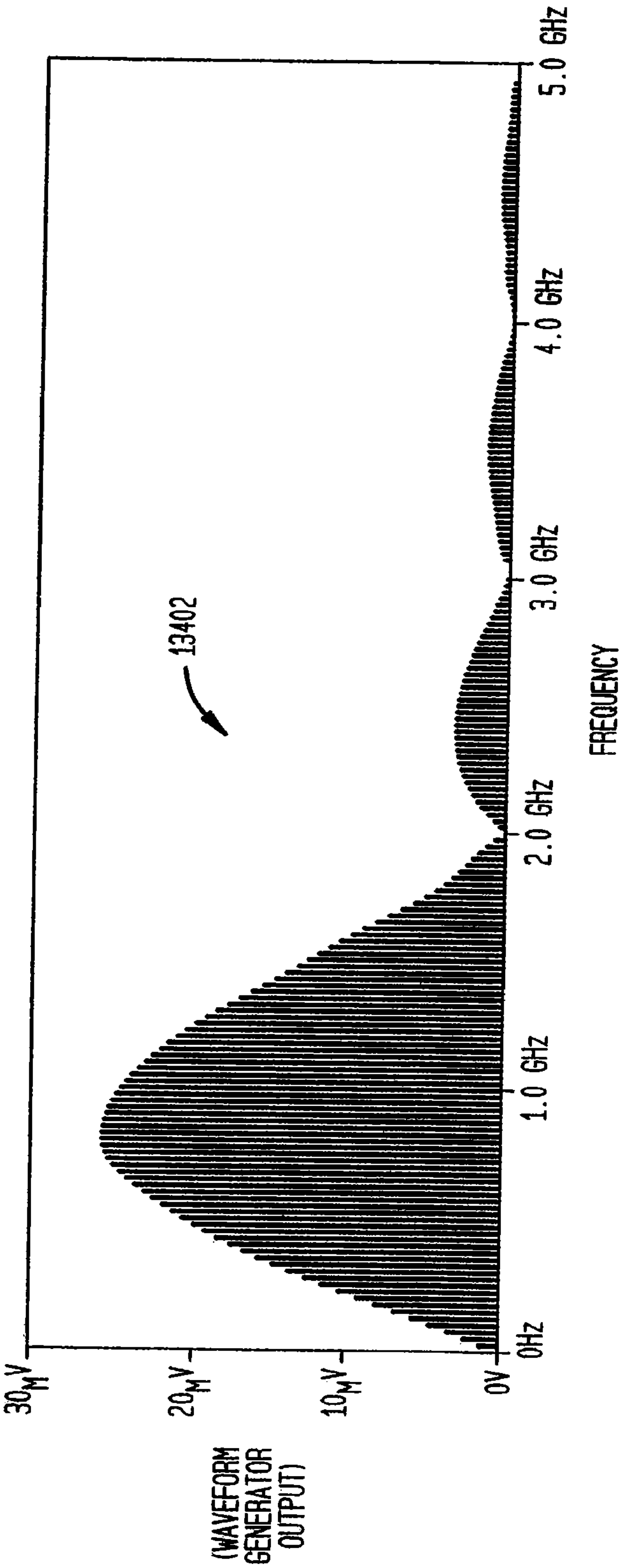
Figure 135:
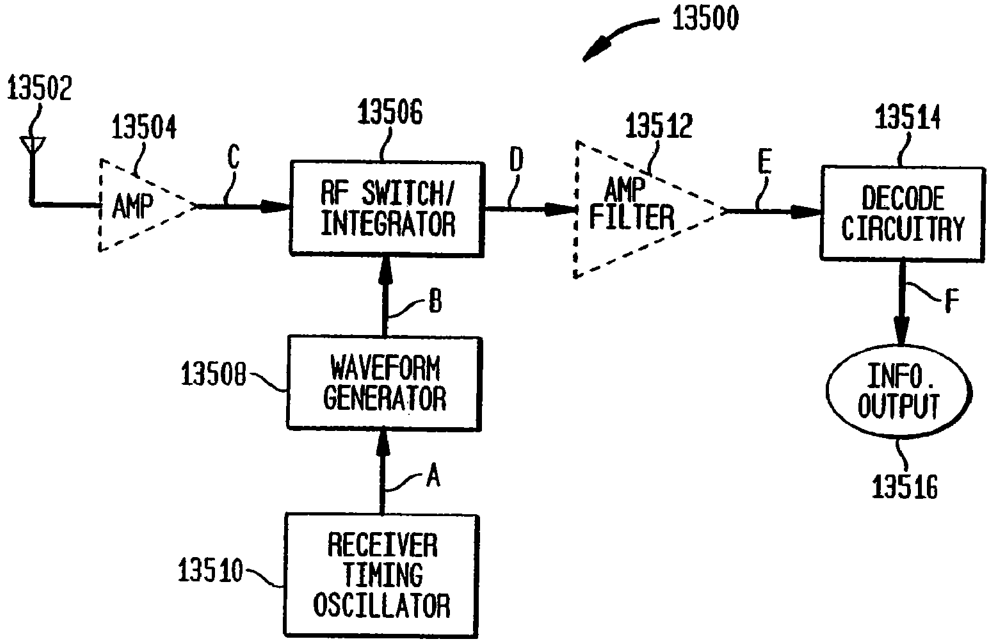
Figure 137:
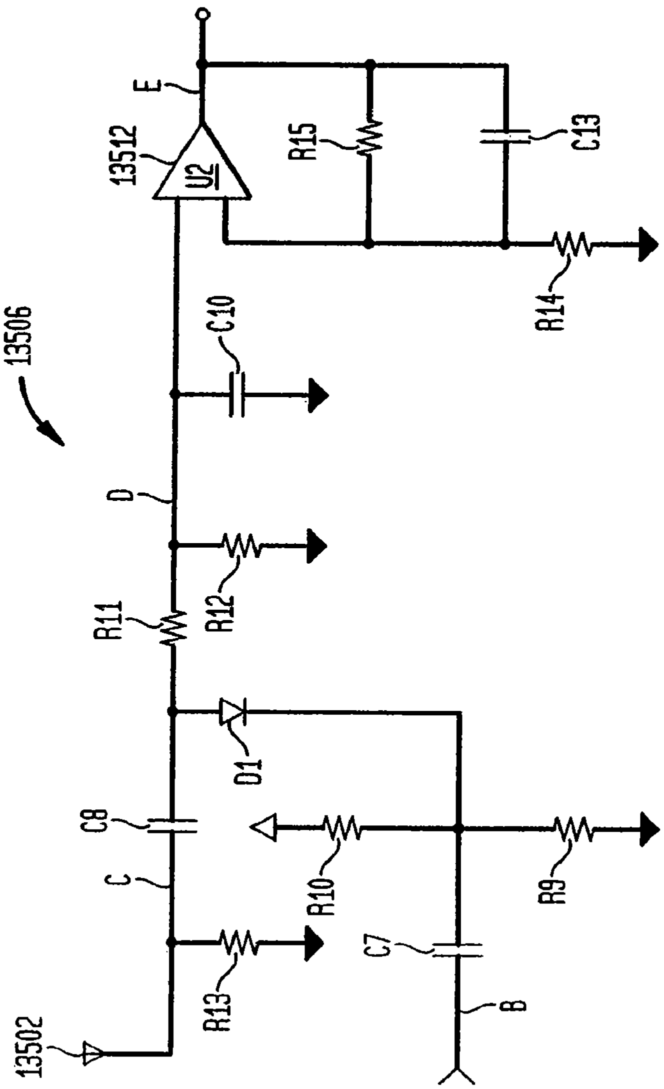
Figure 138:
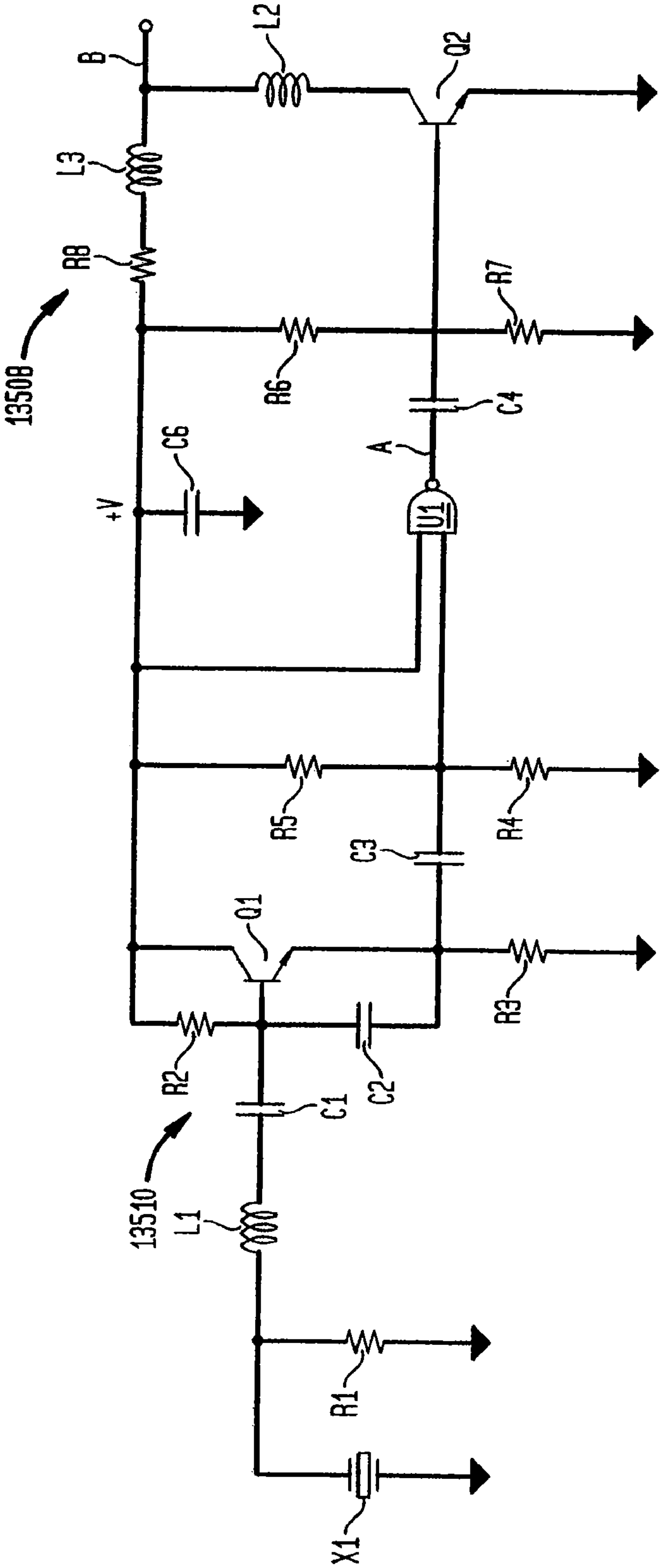
Figure 139:
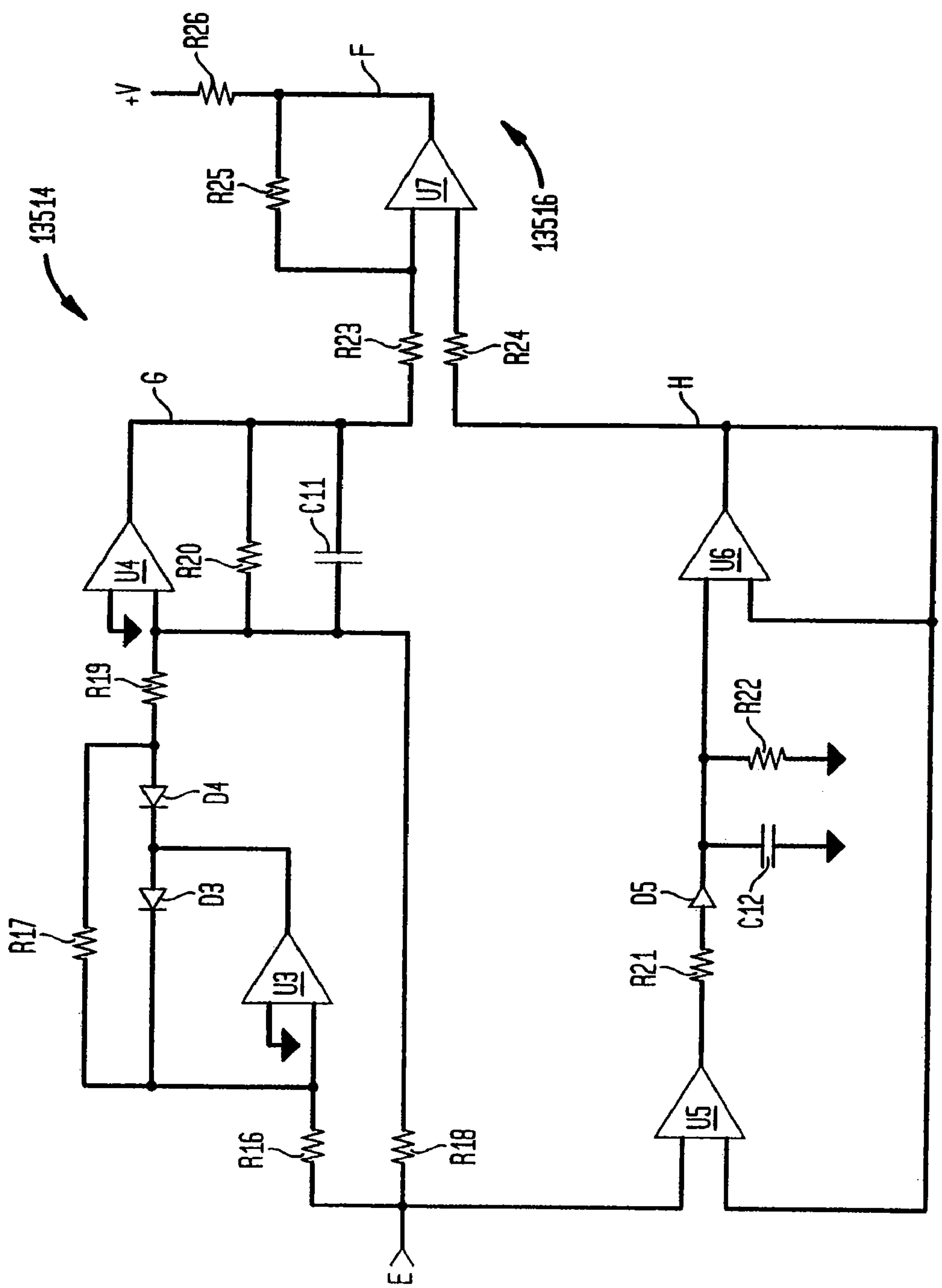
Figure 140:
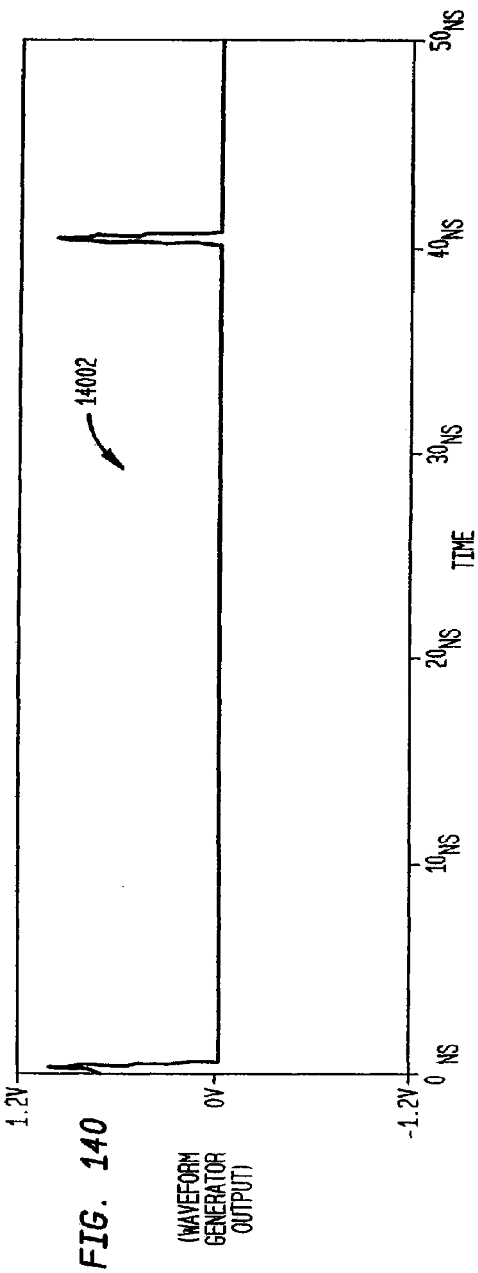
Figure 141:
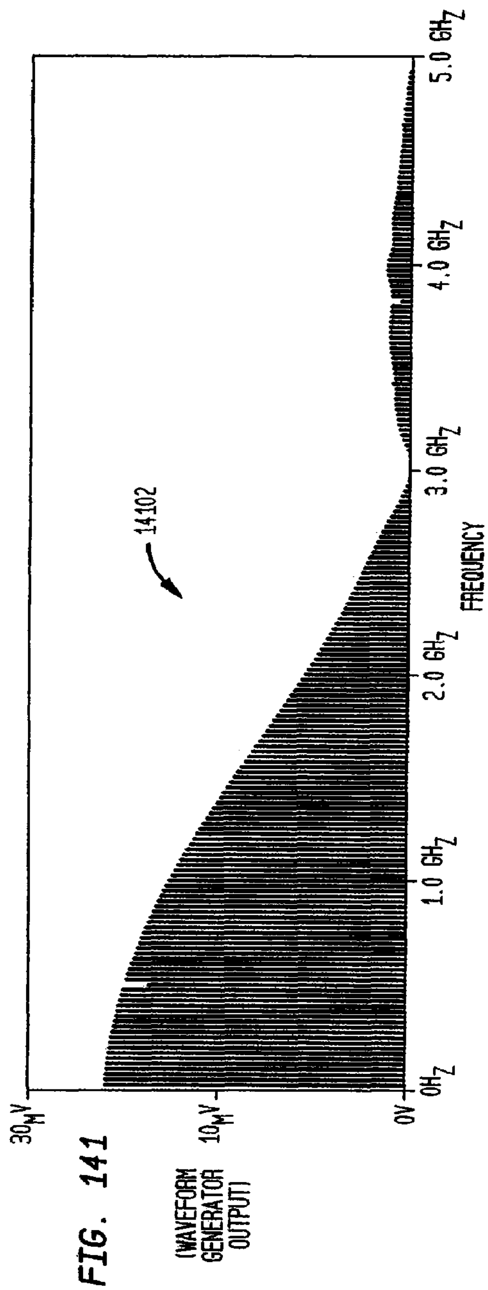
Figure 142:
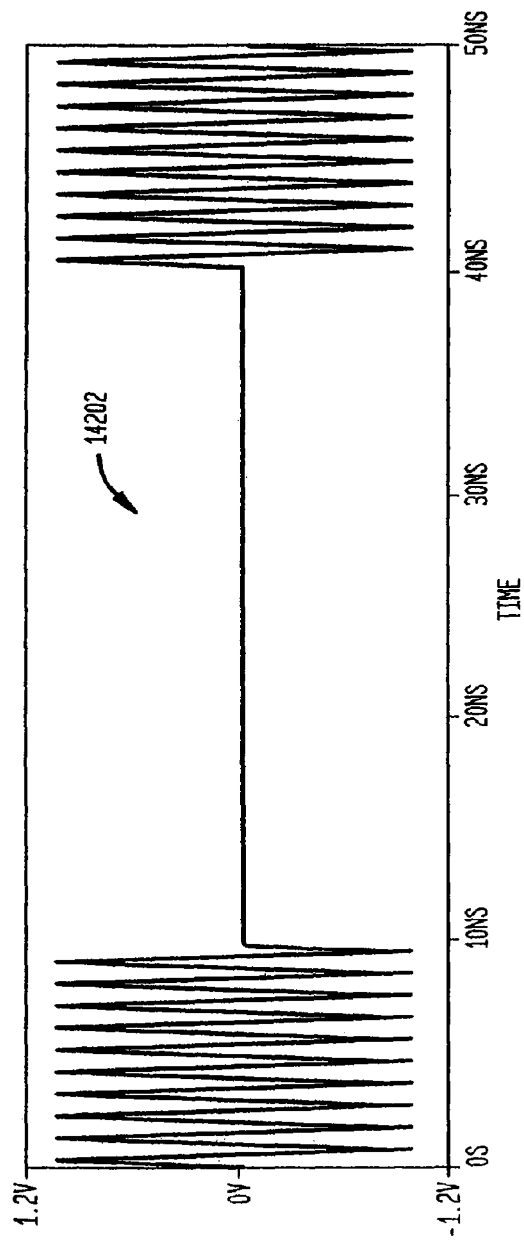
Figure 143:
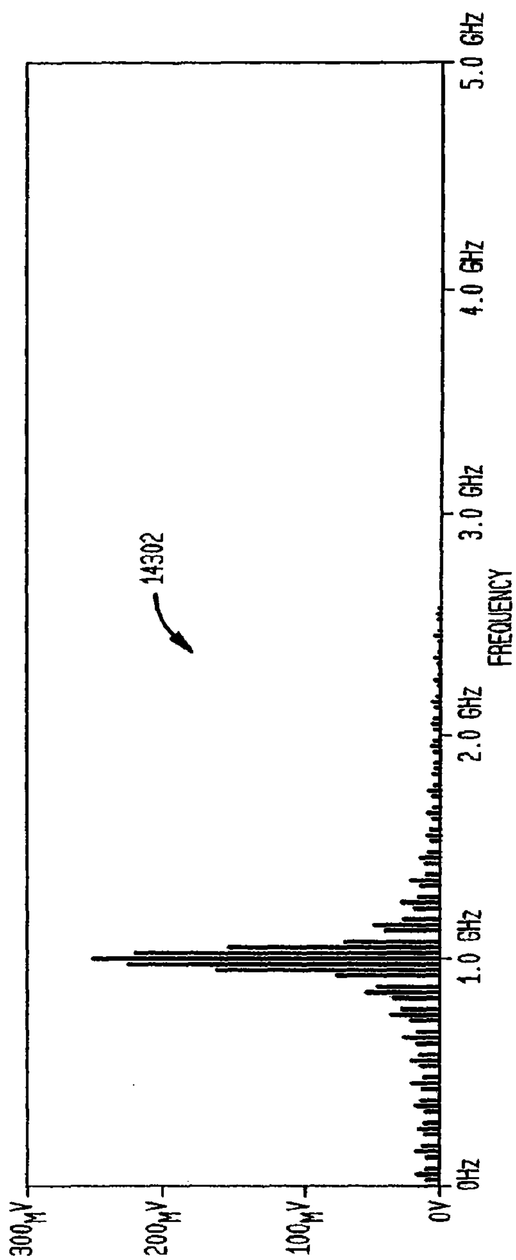
Figure 144:
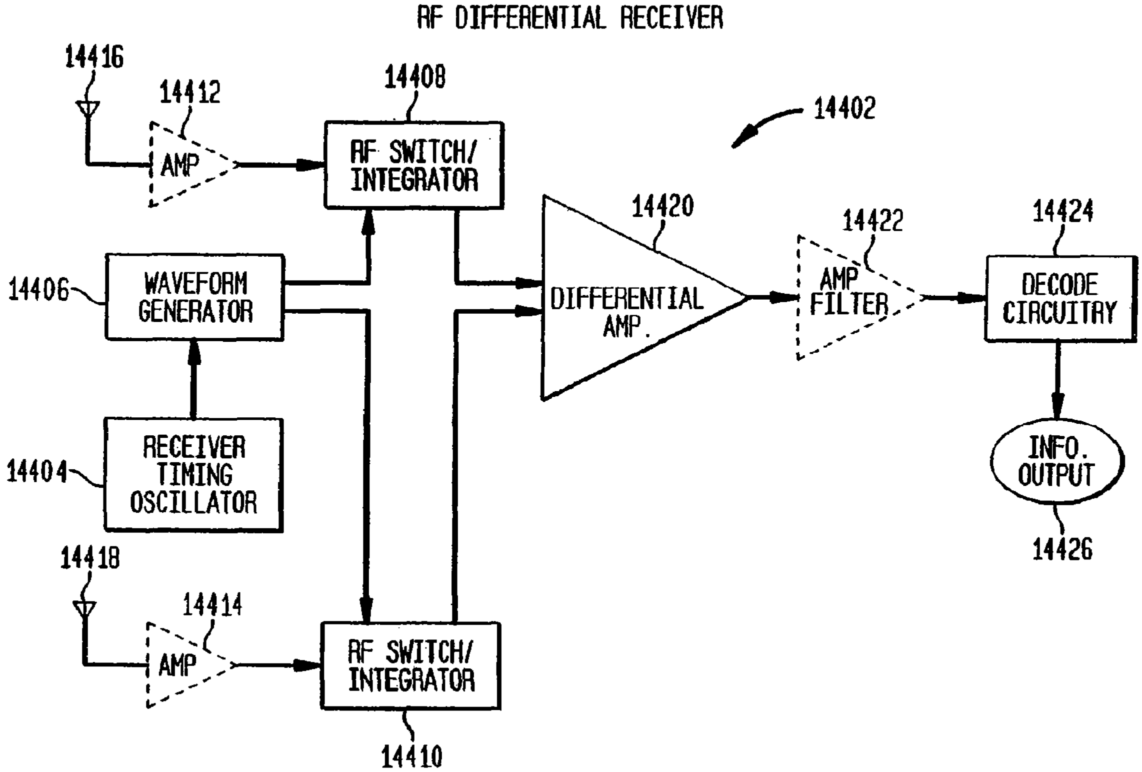
Figure 145:
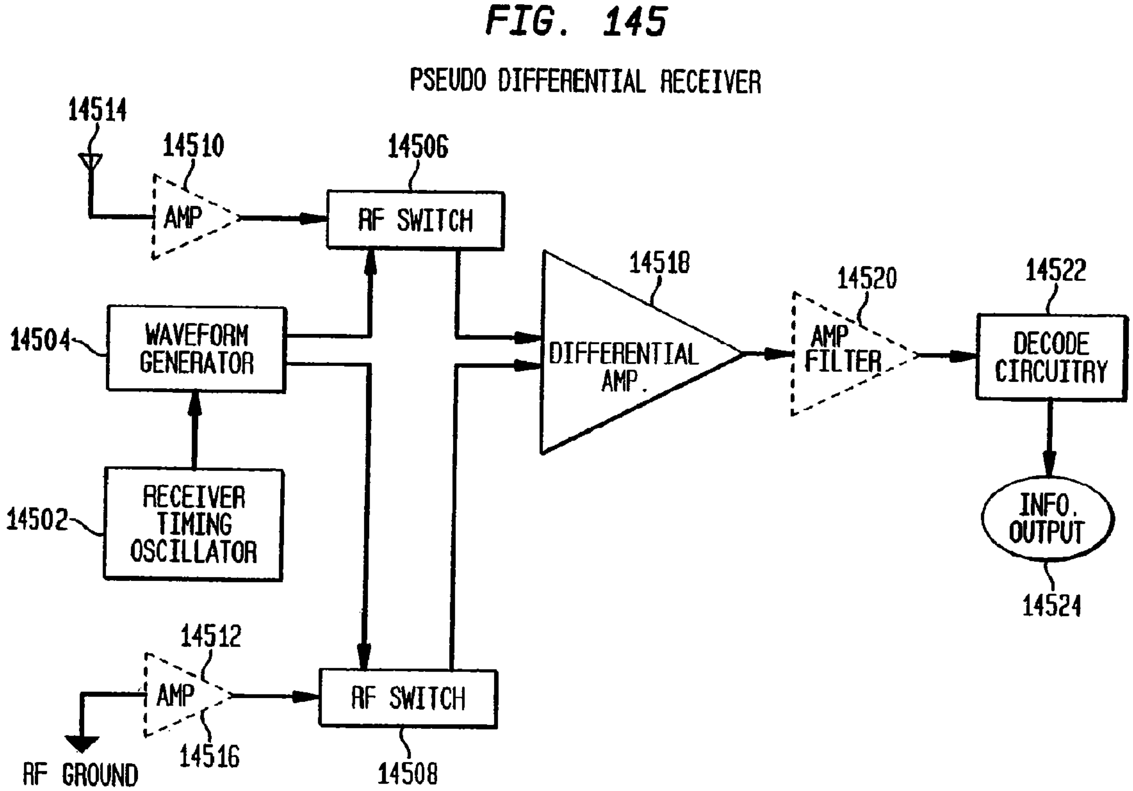
Figure 146:
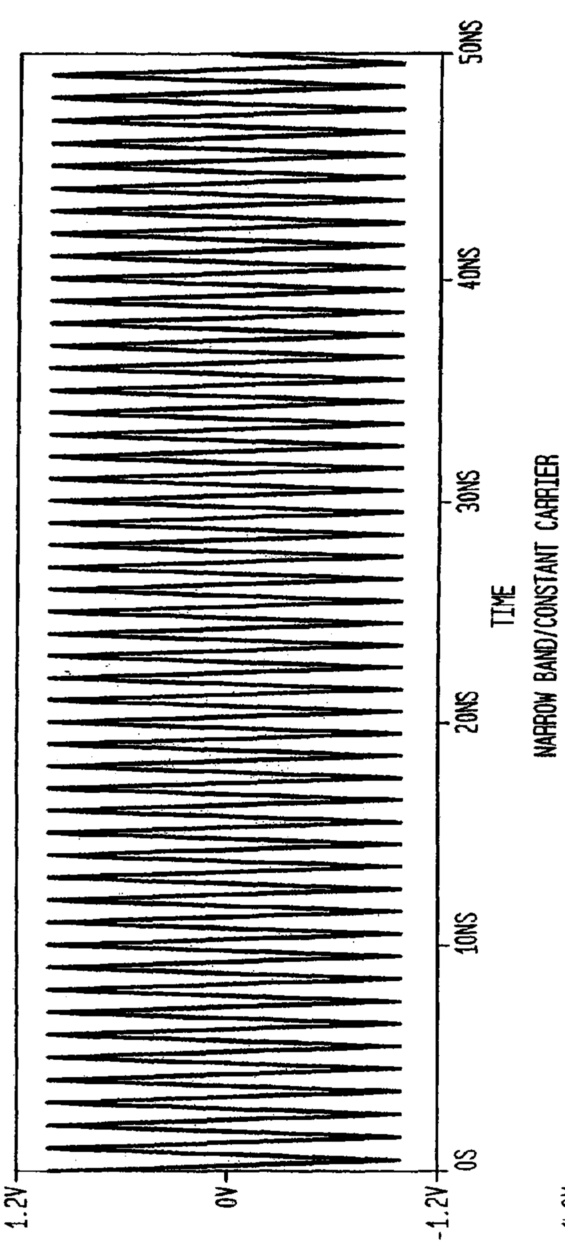
Figure 147:
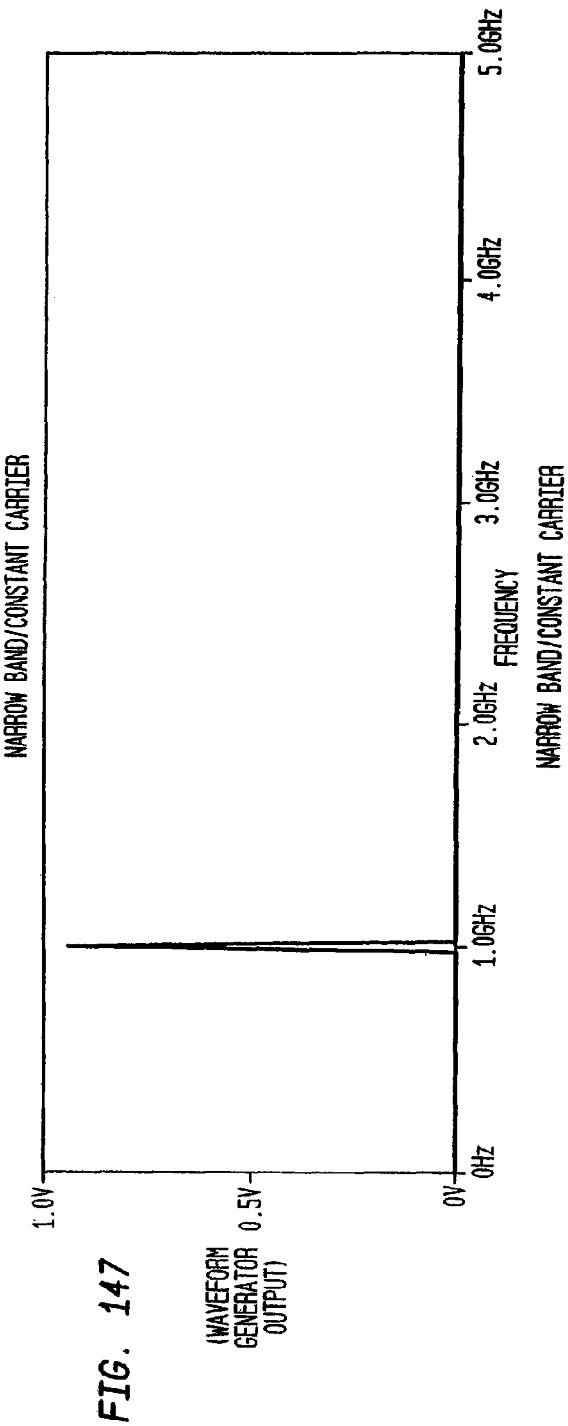

FIG. 124A is a block diagram of a splitter according to an embodiment of the invention;

FIG. 124B is a more detailed diagram of a splitter according to an embodiment of the invention;

FIGS. 124C and 124D are example waveforms related to the splitter of FIGS. 124A and 124B;

FIG. 124E is a block diagram of an I/Q circuit with a splitter according to an embodiment of the invention;

FIGS. 124F-124J are example waveforms related to the diagram of FIG. 124A;

FIG. 125 is a block diagram of a switch module according to an embodiment of the invention;

FIG. 126A is an implementation example of the block diagram of FIG. 125;

FIGS. 126B-126Q are example waveforms related to FIG. 126A;

FIG. 127A is another implementation example of the block diagram of FIG. 125;

FIGS. 127B-127Q are example waveforms related to FIG. 127A;

FIG. 128A is an example MOSFET embodiment of the invention;

FIG. 128B is an example MOSFET embodiment of the invention;

FIG. 128C is an example MOSFET embodiment of the invention;

FIG. 129A is another implementation example of the block diagram of FIG. 125;

FIGS. 129B-129Q are example waveforms related to FIG. 127A;

FIGS. 130 and 131 illustrate the amplitude and pulse width modulated transmitter according to embodiments of the present invention;

FIGS. 132A-132D illustrate example signal diagrams associated with the amplitude and pulse width modulated transmitter according to embodiments of the present invention;

FIG. 133 illustrates an example diagram associated with the amplitude and pulse width modulated transmitter according to embodiments of the present invention;

FIG. 134 illustrates and example diagram associated with the amplitude and pulse width modulated transmitter according to embodiments of the present invention;

FIG. 135 shows an embodiment of a receiver block diagram to recover the amplitude or pulse width modulated information;

FIGS. 136A-136G illustrate example signal diagrams associated with a waveform generator according to embodiments of the present invention;

FIGS. 137-139 are example schematic diagrams illustrating various circuits employed in the receiver of FIG. 135;

FIGS. 140-143 illustrate time and frequency domain diagrams of alternative transmitter output waveforms;

FIGS. 144 and 145 illustrate differential receivers in accord with embodiments of the present invention; and FIGS. 146 and 147 illustrate time and frequency domains for a narrow bandwidth/constant carrier signal in accord with an embodiment of the present invention.

DETAILED DESCRIPTION OF THE PREFERRED EMBODIMENTS

Table of Contents

I. Introduction
1. General Terminology
1.1 Modulation
1.1.1 Amplitude Modulation
1.1.2 Frequency Modulation
1.1.3 Phase Modulation
1.2 Demodulation
2. Overview of the Invention
2.1 Aspects of the Invention
2.2 Down-Converting by Under-Sampling
2.2.1 Down-Converting to an Intermediate Frequency (IF) Signal
2.2.2 Direct-to-Data Down-Converting
2.2.3 Modulation Conversion
2.3 Down-Converting by Transferring Energy
2.3.1 Down-Converting to an Intermediate Frequency (IF) Signal
2.3.2 Direct-to-Data Down-Converting
2.3.3 Modulation Conversion
2.4 Determining the Aliasing Rate
3. Benefits of the Invention Using an Example Conventional Receiver for Comparison
II. Under-Sampling
1. Down-Converting an EM Carrier Signal to an EM Intermediate Signal by Under-Sampling the EM Carrier Signal at the Aliasing Rate
1.1 High Level Description
1.1.1 Operational Description
1.1.2 Structural Description
1.2 Example Embodiments
1.2.1 First Example Embodiment: Amplitude Modulation
1.2.1.1 Operational Description
1.2.1.1.1 Analog AM Carrier Signal
1.2.1.1.2 Digital AM Carrier Signal
1.2.1.2 Structural Description
1.2.2 Second Example Embodiment: Frequency Modulation
1.2.2.1 Operational Description
1.2.2.1.1 Analog FM Carrier Signal
1.2.2.1.2 Digital FM Carrier Signal
1.2.2.2 Structural Description
1.2.3 Third Example Embodiment: Phase Modulation
1.2.3.1 Operational Description
1.2.3.1.1 Analog PM Carrier Signal
1.2.3.1.2 Digital PM Carrier Signal
1.2.3.2 Structural Description
1.2.4 Other Embodiments
1.3 Implementation Examples
2. Directly Down-Converting an EM Signal to a Baseband Signal (Direct-to Data)
2.1 High Level Description
2.1.1 Operational Description
2.1.2 Structural Description
2.2 Example Embodiments
2.2.1 First Example Embodiment: Amplitude Modulation
2.2.1.1 Operational Description
2.2.1.1.1 Analog AM Carrier Signal
2.2.1.1.2 Digital AM Carrier Signal
2.2.1.2 Structural Description
2.2.2 Second Example Embodiment: Phase Modulation
2.2.2.1 Operational Description
2.2.2.1.1 Analog PM Carrier Signal
2.2.2.1.2 Digital PM Carrier Signal
2.2.2.2 Structural Description
2.2.3 Other Embodiments
2.3 Implementation Examples
3. Modulation Conversion
3.1 High Level Description
3.1.1 Operational Description
3.1.2 Structural Description
3.2 Example Embodiments
3.2.1 First Example Embodiment: Down-Converting an FM Signal to a PM Signal
3.2.1.1 Operational Description
3.2.1.2 Structural Description -continued Table of Contents 3.2.2 Second Example Embodiment: Down-Converting an FM Signal to an AM Signal
3.2.2.1 Operational Description
3.2.2.2 Structural Description
3.2.3 Other Example Embodiments
3.3 Implementation Examples
4. Implementation Examples
4.1 The Under-Sampling System as a Sample and Hold System
4.1.1 The Sample and Hold System as a Switch Module and a Holding Module
4.1.2 The Sample and Hold System as Break-Before- Make Module 4.1.3 Example Implementations of the Switch Module
4.1.4 Example Implementations of the Holding Module
4.1.5 Optional Under-Sampling Signal Module
4.2 The Under-Sampling System as an Inverted Sample and Hold
4.3 Other Implementations
5. Optional Optimizations of Under-Sampling at an Aliasing Rate
5.1 Doubling the Aliasing Rate ($F_{AR}$) of the Under-Sampling Signal
5.2 Differential Implementations
5.2.1 Differential Input-to-Differential Output
5.2.2 Single Input-to-Differential Output
5.2.3 Differential Input-to-Single Output
5.3 Smoothing the Down-Converted Signal
5.4 Load Impedance and Input/Output Buffering
5.5 Modifying the Under-Sampling Signal Utilizing Feedback
III. Down-Converting by Transferring Energy
1. Energy Transfer Compared to Under-Sampling
1.1 Review of Under-Sampling
1.1.1 Effects of Lowering the Impedance of the Load
1.1.2 Effects of Increasing the Value of the Holding Capacitance
1.2 Introduction to Energy Transfer
2. Down-Converting an EM Signal to an IF EM Signal by Transferring Energy from the EM Signal at an Aliasing Rate
2.1 High Level Description
2.1.1 Operational Description
2.1.2 Structural Description
2.2 Example Embodiments
2.2.1 First Example Embodiment: Amplitude Modulation
2.2.1.1 Operational Description
2.2.1.1.1 Analog AM Carrier Signal
2.2.1.1.2 Digital AM Carrier Signal
2.2.1.2 Structural Description
2.2.2 Second Example Embodiment: Frequency Modulation
2.2.2.1 Operational Description
2.2.2.1.1 Analog FM Carrier Signal
2.2.2.1.2 Digital FM Carrier Signal
2.2.2.2 Structural Description
2.2.3 Third Example Embodiment: Phase Modulation
2.2.3.1 Operational Description
2.2.3.1.1 Analog PM Carrier Signal
2.2.3.1.2 Digital PM Carrier Signal
2.2.3.2 Structural Description
2.2.4 Other Embodiments
2.3 Implementation Examples
3. Directly Down-Converting an EM Signal to an Demodulated Baseband Signal by Transferring Energy from the EM Signal
3.1 High Level Description
3.1.1 Operational Description
3.1.2 Structural Description
3.2 Example Embodiments
3.2.1 First Example Embodiment: Amplitude Modulation
3.2.1.1 Operational Description
3.2.1.1.1 Analog AM Carrier Signal
3.2.1.1.2 Digital AM Carrier Signal
3.2.1.2 Structural Description
3.2.2 Second Example Embodiment: Phase Modulation
3.2.2.1 Operational Description
3.2.2.1.1 Analog PM Carrier Signal
3.2.2.1.2 Digital PM Carrier Signal
3.2.2.2 Structural Description
3.2.3 Other Embodiments
3.3 Implementation Examples -continued Table of Contents 4. Modulation Conversion
4.1 High Level Description
4.1.1 Operational Description
4.1.2 Structural Description
4.2 Example Embodiments
4.2.1 First Example Embodiment: Down-Converting an FM Signal to a PM Signal
4.2.1.1 Operational Description
4.2.1.2 Structural Description
4.2.2 Second Example Embodiment: Down-Converting an FM Signal to an AM Signal
4.2.2.1 Operational Description
4.2.2.2 Structural Description
4.2.3 Other Example Embodiments
4.3 Implementation Examples
5. Implementation Examples
5.1 The Energy Transfer System as a Gated Transfer System
5.1.1 The Gated Transfer System as a Switch Module and a Storage Module
5.1.2 The Gated Transfer System as Break-Before-Make Module
5.1.3 Example Implementations of the Switch Module
5.1.4 Example Implementations of the Storage Module
5.1.5 Optional Energy Transfer Signal Module
5.2 The Energy Transfer System as an Inverted Gated Transfer System
5.2.1 The Inverted Gated Transfer System as a Switch Module and a Storage Module
5.3 Rail to Rail Operation for Improved Dynamic Range
5.3.1 Introduction
5.3.2 Complementary UFT Structure for Improved Dynamic Range
5.3.3 Biased Configurations
5.3.4 Simulation Examples
5.4 Optimized Switch Structures
5.4.1 Splitter in CMOS
5.4.2 I/Q Circuit
5.5 Example I and Q Implementations
5.5.1 Switches of Different Sizes
5.5.2 Reducing Overall Switch Area
5.5.3 Charge Injection Cancellation
5.5.4 Overlapped Capacitance
5.6 Other Implementations
6. Optional Optimizations of Energy Transfer at an Aliasing Rate
6.1 Doubling the Aliasing Rate ($F_{AR}$) of the Energy Transfer Signal
6.2 Differential Implementations
6.2.1 An Example Illustrating Energy Transfer Differentially
6.2.1.1 Differential Input-to-Differential Output
6.2.1.2 Single Input-to-Differential Output
6.2.1.3 Differential Input-to-Single Output
6.2.2 Specific Alternative Embodiments
6.2.3 Specific Examples of Optimizations and Configurations for Inverted and Non-Inverted Differential Designs
6.3 Smoothing the Down-Converted Signal
6.4 Impedance Matching
6.5 Tanks and Resonant Structures
6.6 Charge and Power Transfer Concepts
6.7 Optimizing and Adjusting the Non-Negligible Aperture Width/Duration 6.7.1 Varying Input and Output Impedances
6.7.2 Real Time Aperture Control
6.8 Adding a Bypass Network
6.9 Modifying the Energy Transfer Signal Utilizing Feedback
6.10 Other Implementations
7. Example Energy Transfer Downconverters
IV. Additional Embodiments
V. Conclusions 1. Introduction 1. General Terminology For illustrative purposes, the operation of the invention is often represented by flowcharts, such as flowchart 1201 in FIG. 12A. It should be understood, however, that the use of flowcharts is for illustrative purposes only, and is not limiting. For example, the invention is not limited to the operational embodiment(s) represented by the flowcharts. Instead, alternative operational embodiments will be apparent to persons skilled in the relevant art(s) based on the discussion contained herein. Also, the use of flowcharts should not be interpreted as limiting the invention to discrete or digital operation. In practice, as will be appreciated by persons skilled in the relevant art(s) based on the herein discussion, the invention can be achieved via discrete or continuous operation, or a combination thereof. Further, the flow of control represented by the flowcharts is provided for illustrative purposes only. As will be appreciated by persons skilled in the relevant art(s), other operational control flows are within the scope and spirit of the present invention. Also, the ordering of steps may differ in various embodiments.

Various terms used in this application are generally described in this section. The description in this section is provided for illustrative and convenience purposes only, and is not limiting. The meaning of these terms will be apparent to persons skilled in the relevant art(s) based on the entirety of the teachings provided herein. These terms may be discussed throughout the specification with additional detail.

The term modulated carrier signal, when used herein, refers to a carrier signal that is modulated by a baseband signal.

The term unmodulated carrier signal, when used herein, refers to a signal having an amplitude that oscillates at a substantially uniform frequency and phase.

The term baseband signal, when used herein, refers to an information signal including, but not limited to, analog information signals, digital information signals and direct current (DC) information signals.

The term carrier signal, when used herein, and unless otherwise specified when used herein, refers to modulated carrier signals and unmodulated carrier signals.

The term electromagnetic (EM) signal, when used herein, refers to a signal in the EM spectrum. EM spectrum includes all frequencies greater than zero hertz. EM signals generally include waves characterized by variations in electric and magnetic fields. Such waves may be propagated in any medium, both natural and manmade, including but not limited to air, space, wire, cable, liquid, waveguide, microstrip, strip-line, optical fiber, etc. Unless stated otherwise, all signals discussed herein are EM signals, even when not explicitly designated as such.

The term intermediate frequency (IF) signal, when used herein, refers to an EM signal that is substantially similar to another EM signal except that the IF signal has a lower frequency than the other signal. An IF signal frequency can be any frequency above zero HZ. Unless otherwise stated, the terms lower frequency, intermediate frequency, intermediate and IF are used interchangeably herein.

The term analog signal, when used herein, refers to a signal that is constant or continuously variable, as contrasted to a signal that changes between discrete states.

The term baseband, when used herein, refers to a frequency band occupied by any generic information signal desired for transmission and/or reception.

The term baseband signal, when used herein, refers to any generic information signal desired for transmission and/or reception.

The term carrier frequency, when used herein, refers to the frequency of a carrier signal. Typically, it is the center frequency of a transmission signal that is generally modulated.

The term carrier signal, when used herein, refers to an EM wave having at least one characteristic that may be varied by modulation, that is capable of carrying information via modulation.

The term demodulated baseband signal, when used herein, refers to a signal that results from processing a modulated signal. In some cases, for example, the demodulated baseband signal results from demodulating an intermediate frequency (IF) modulated signal, which results from down converting a modulated carrier signal. In another case, a signal that results from a combined downconversion and demodulation step.

The term digital signal, when used herein, refers to a signal that changes between discrete states, as contrasted to a signal that is continuous. For example, the voltage of a digital signal may shift between discrete levels.

The term electromagnetic (EM) spectrum, when used herein, refers to a spectrum comprising waves characterized by variations in electric and magnetic fields. Such waves may be propagated in any communication medium, both natural and manmade, including but not limited to air, space, wire, cable, liquid, waveguide, microstrip, stripline, optical fiber, etc. The EM spectrum includes all frequencies greater than zero hertz.

The term electromagnetic (EM) signal, when used herein, refers to a signal in the EM spectrum. Also generally called an EM wave. Unless stated otherwise, all signals discussed herein are EM signals, even when not explicitly designated as such.

The term modulating baseband signal, when used herein, refers to any generic information signal that is used to modulate an oscillating signal, or carrier signal.

1.1 Modulation

It is often beneficial to propagate electromagnetic (EM) signals at higher frequencies. This includes baseband signals, such as digital data information signals and analog information signals. A baseband signal can be up-converted to a higher frequency EM signal by using the baseband signal to modulate a higher frequency carrier signal, $F_C$. When used in this manner, such a baseband signal is herein called a modulating baseband signal $F_{MB}$.

Modulation imparts changes to the carrier signal $F_C$ that represent information in the modulating baseband signal $F_{MB}$. The changes can be in the form of amplitude changes, frequency changes, phase changes, etc., or any combination thereof. The resultant signal is referred to herein as a modulated carrier signal $F_{MC}$. The modulated carrier signal $F_{MC}$ includes the carrier signal $F_C$ modulated by the modulating baseline signal, $F_{MB}$, as in:

$$F_{MB} \text{ combined with } F_C \rightarrow F_{MC}$$

The modulated carrier signal $F_{MC}$ oscillates at, or near the frequency of the carrier signal $F_C$ and can thus be efficiently propagated.

Figure 1:
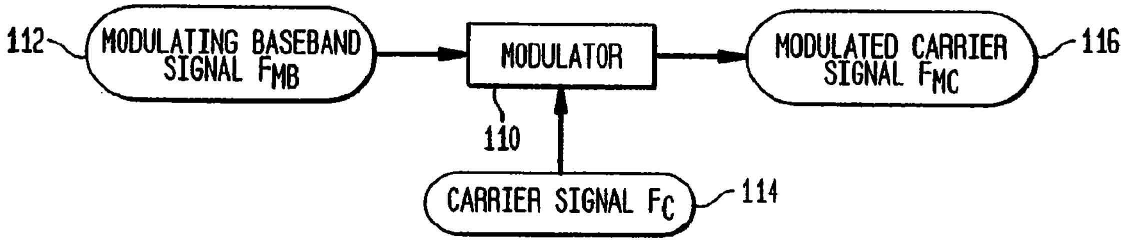
FIG. 1 illustrates a structural block diagram of an example modulator.

FIG. 1 illustrates an example modulator 110, wherein the carrier signal $F_C$ is modulated by the modulating baseband signal $F_{MB}$, thereby generating the modulated carrier signal $F_{MC}$.

Modulating baseband signal $F_{MC}$ can be an analog baseband signal, a digital baseband signal, or a combination thereof.

Figure 2:
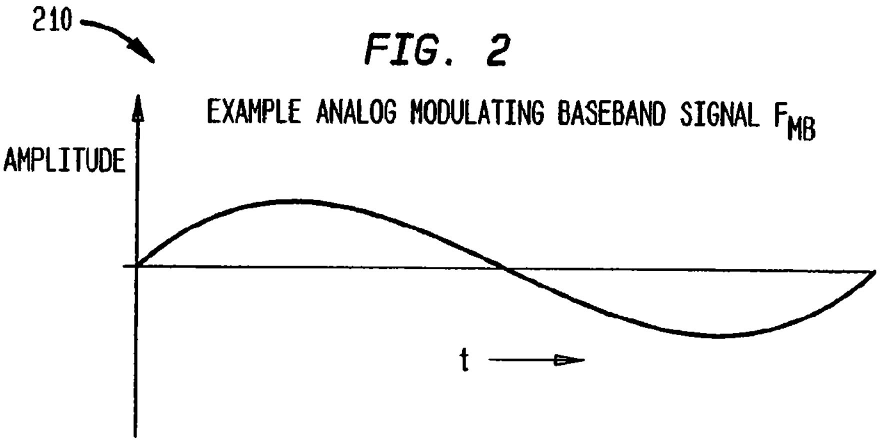
FIG. 2 illustrates an example analog modulating baseband signal.

FIG. 2 illustrates the modulating baseband signal $F_{MB}$ as an exemplary analog modulating baseband signal 210. The exemplary analog modulating baseband signal 210 can represent any type of analog information including, but not limited to, voice/speech data, music data, video data, etc. The amplitude of analog modulating baseband signal 210 varies in time.

Digital information includes a plurality of discrete states. For ease of explanation, digital information signals are discussed below as having two discrete states. But the invention is not limited to this embodiment.

Figure 3:
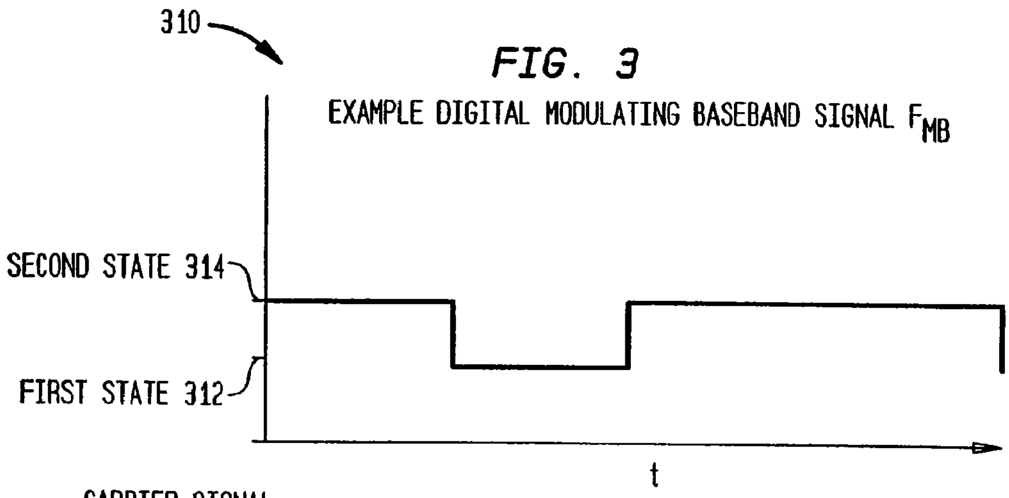
FIG. 3 illustrates an example digital modulating baseband signal.

FIG. 3 illustrates the modulating baseband signal $F_{MB}$ as an exemplary digital modulating baseband signal 310. The digital modulating baseband signal 310 can represent any type of digital data including, but not limited to, digital computer information and digitized analog information. The digital modulating baseband signal 310 includes a first state 312 and a second state 314. In an embodiment, first state 312 represents binary state 0 and second state 314 represents binary state 1. Alternatively, first state 312 represents binary state 1 and second state 314 represents binary state 0. Throughout the remainder of this disclosure, the former convention is followed, whereby first state 312 represents binary state zero and second state 314 represents binary state one. But the invention is not limited to this embodiment. First state 312 is thus referred to herein as a low state and second state 314 is referred to herein as a high state.

Digital modulating baseband signal 310 can change between first state 312 and second state 314 at a data rate, or baud rate, measured as bits per second.

Carrier signal $F_C$ is modulated by the modulating baseband signal $F_{MB}$ by any modulation technique, including, but not limited to, amplitude modulation (AM), frequency modulation (FM), phase modulation (PM), etc., or any combination thereof. Examples are provided below for amplitude modulating, frequency modulating, and phase modulating the analog modulating baseband signal 210 and the digital modulating baseband signal 310, on the carrier signal $F_C$. The examples are used to assist in the description of the invention. The invention is not limited to, or by, the examples.

Figure 4:
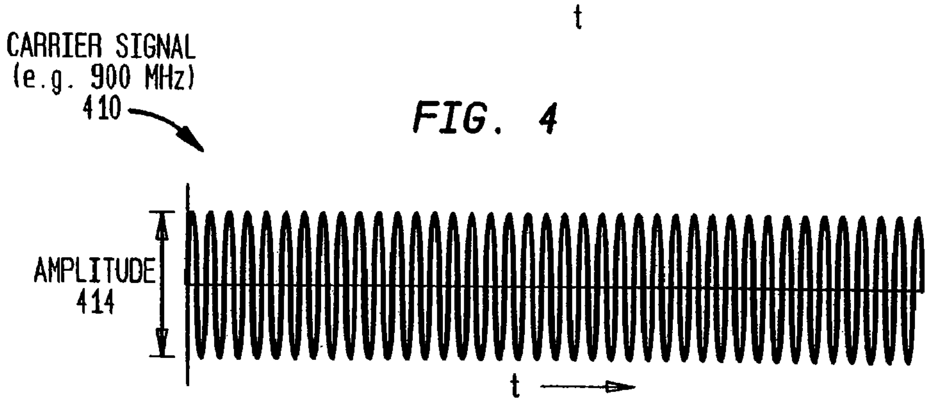
FIG. 4 illustrates an example carrier signal.

FIG. 4 illustrates the carrier signal $F_C$ as a carrier signal 410. In the example of FIG. 4, the carrier signal 410 is illustrated as a 900 MHZ carrier signal. Alternatively, the carrier signal 410 can be any other frequency. Example modulation schemes are provided below, using the examples signals from FIGS. 2, 3 and 4.

1.1.1 Amplitude Modulation

Figure 5A:
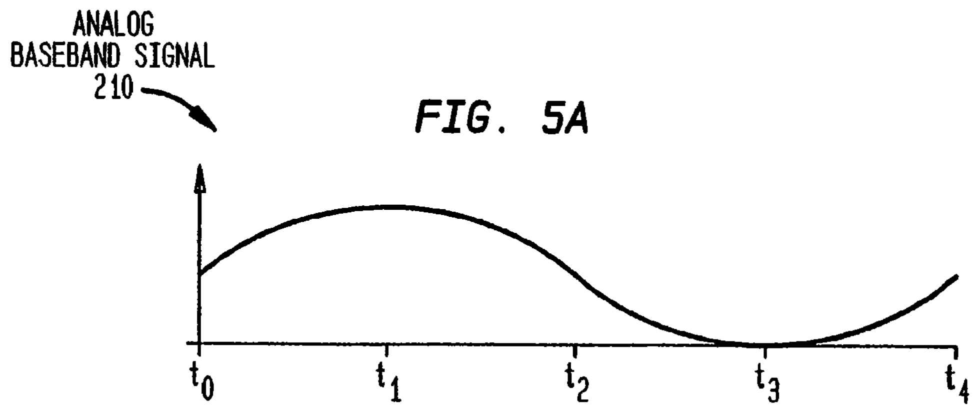
FIGS. 5A-5C illustrate example signal diagrams related to amplitude modulation.
Figure 5B:
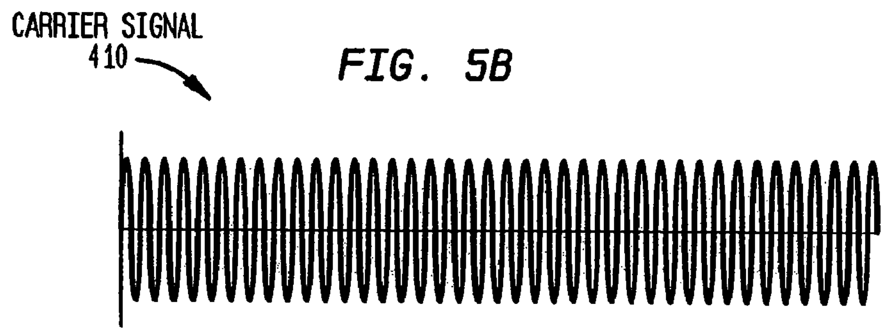
Figure 5C:
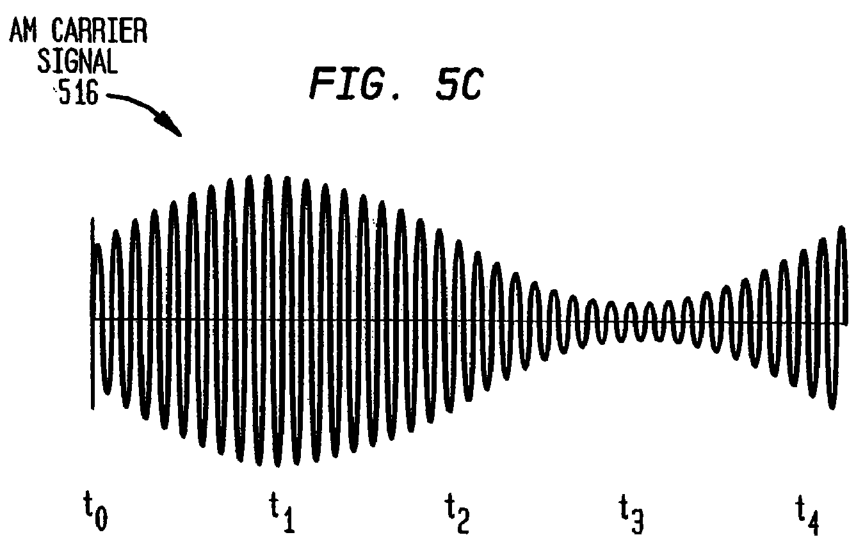
Figure 6A:
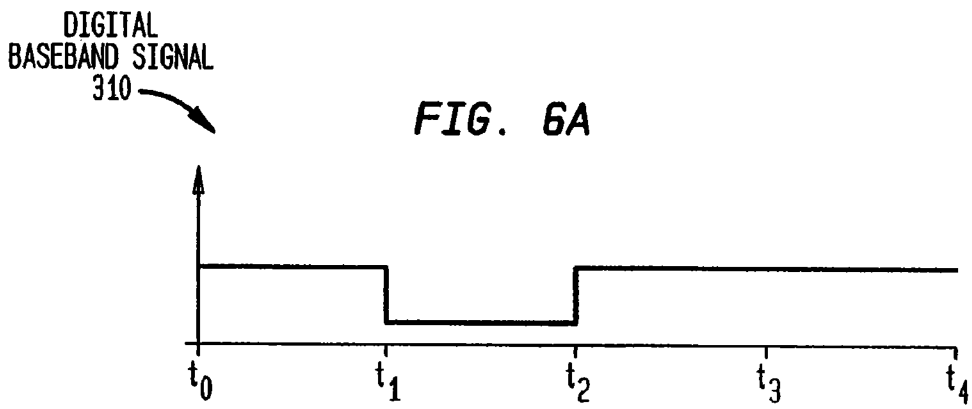
FIGS. 6A-6C illustrate example signal diagrams related to amplitude shift keying modulation.
Figure 6B:
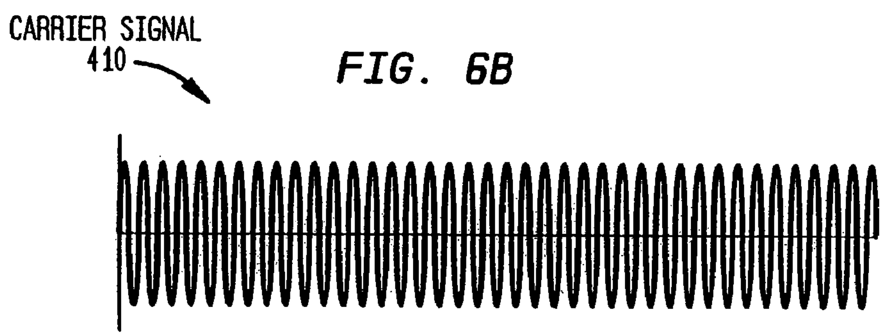
Figure 6C:
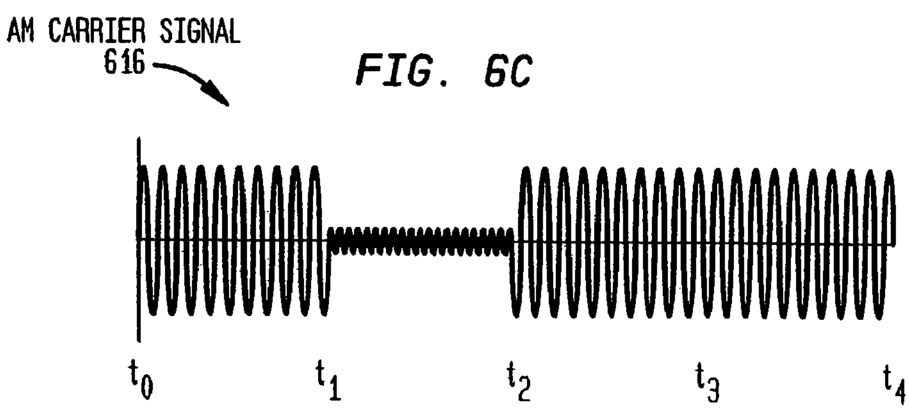

In amplitude modulation (AM), the amplitude of the modulated carrier signal $F_{MC}$ is a function of the amplitude of the modulating baseband signal $F_{MB}$. FIGS. 5A-5C illustrate example timing diagrams for amplitude modulating the carrier signal 410 with the analog modulating baseband signal 210. FIGS. 6A-6C illustrate example timing diagrams for amplitude modulating the carrier signal 410 with the digital modulating baseband signal 310.

FIG. 5A illustrates the analog modulating baseband signal 210. FIG. 5B illustrates the carrier signal 410. FIG. 5C illustrates an analog AM carrier signal 516, which is generated when the carrier signal 410 is amplitude modulated using the analog modulating baseband signal 210. As used herein, the term "analog AM carrier signal" is used to indicate that the modulating baseband signal is an analog signal.

The analog AM carrier signal 516 oscillates at the frequency of carrier signal 410. The amplitude of the analog AM carrier signal 516 tracks the amplitude of analog modulating baseband signal 210, illustrating that the information contained in the analog modulating baseband signal 210 is retained in the analog AM carrier signal 516.

FIG. 6A illustrates the digital modulating baseband signal 310. FIG. 6B illustrates the carrier signal 410. FIG. 6C illustrates a digital AM carrier signal 616, which is generated when the carrier signal 410 is amplitude modulated using the digital modulating baseband signal 310. As used herein, the term "digital AM carrier signal" is used to indicate that the modulating baseband signal is a digital signal.

The digital AM carrier signal 616 oscillates at the frequency of carrier signal 410. The amplitude of the digital AM carrier signal 616 tracks the amplitude of digital modulating baseband signal 310, illustrating that the information contained in the digital modulating baseband signal 310 is retained in the digital AM signal 616. As the digital modulating baseband signal 310 changes states, the digital AM signal 616 shifts amplitudes. Digital amplitude modulation is often referred to as amplitude shift keying (ASK), and the two terms are used interchangeably throughout the specification.

1.1.2 Frequency Modulation

Figure 7A:
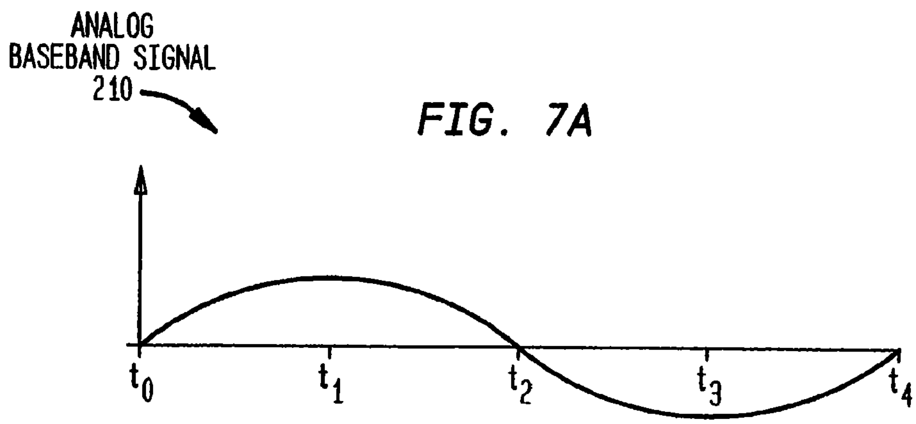
FIGS. 7A-7C illustrate example signal diagrams related to frequency modulation.
Figure 7B:
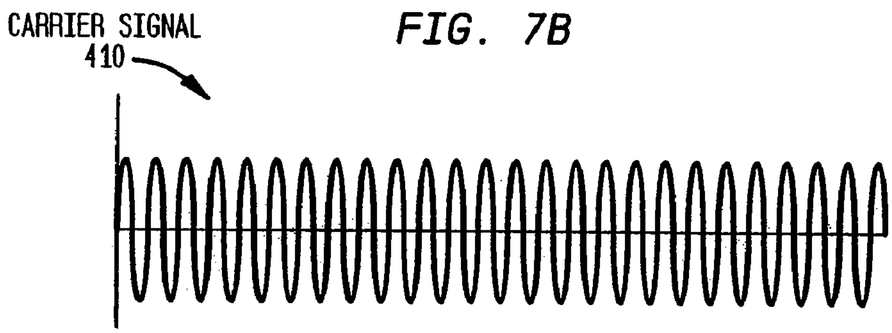
Figure 7C:
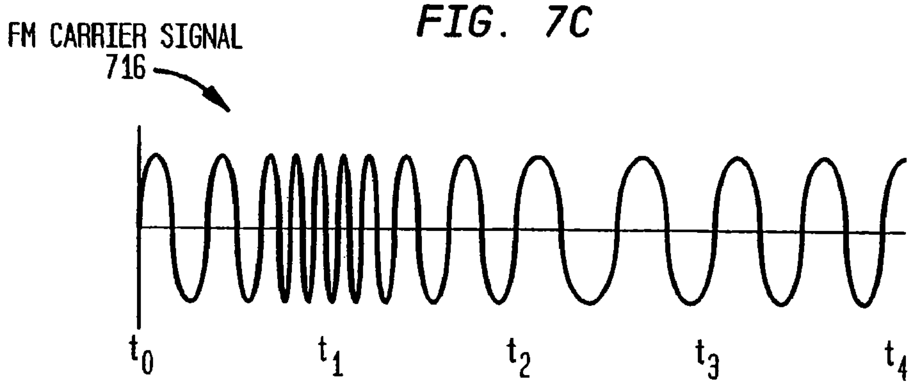
Figure 8A:
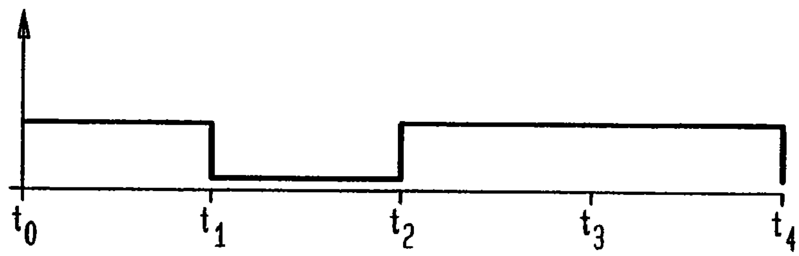
FIGS. 8A-8C illustrate example signal diagrams related to frequency shift keying modulation.
Figure 8B:
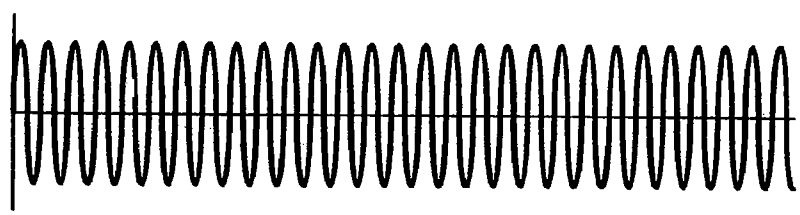
Figure 8C:
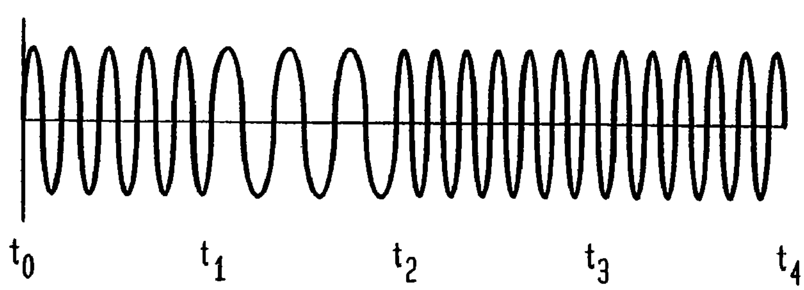

In frequency modulation (FM), the frequency of the modulated carrier signal $F_{MC}$ varies as a function of the amplitude of the modulating baseband signal $F_{MB}$. FIGS. 7A-7C illustrate example timing diagrams for frequency modulating the carrier signal 410 with the analog modulating baseband signal 210. FIGS. 8A-8C illustrate example timing diagrams for frequency modulating the carrier signal 410 with the digital modulating baseband signal 310.

FIG. 7A illustrates the analog modulating baseband signal 210. FIG. 7B illustrates the carrier signal 410. FIG. 7C illustrates an analog FM carrier signal 716, which is generated when the carrier signal 410 is frequency modulated using the analog modulating baseband signal 210. As used herein, the term "analog FM carrier signal" is used to indicate that the modulating baseband signal is an analog signal.

The frequency of the analog FM carrier signal 716 varies as a function of amplitude changes on the analog baseband signal 210. In the illustrated example, the frequency of the analog FM carrier signal 716 varies in proportion to the amplitude of the analog modulating baseband signal 210. Thus, at time t1, the amplitude of the analog baseband signal 210 and the frequency of the analog FM carrier signal 716 are at maximums. At time t3, the amplitude of the analog baseband signal 210 and the frequency of the analog FM carrier signal 716 are at minimums.

The frequency of the analog FM carrier signal 716 is typically centered around the frequency of the carrier signal 410. Thus, at time t2, for example, when the amplitude of the analog baseband signal 210 is at a mid-point, illustrated here as zero volts, the frequency of the analog FM carrier signal 716 is substantially the same as the frequency of the carrier signal 410.

FIG. 8A illustrates the digital modulating baseband signal 310. FIG. 8B illustrates the carrier signal 410. FIG. 8C illustrates a digital FM carrier signal 816, which is generated when the carrier signal 410 is frequency modulated using the digital baseband signal 310. As used herein, the term "digital FM carrier signal" is used to indicate that the modulating baseband signal is a digital signal.

The frequency of the digital FM carrier signal 816 varies as a function of amplitude changes on the digital modulating baseband signal 310. In the illustrated example, the frequency of the digital FM carrier signal 816 varies in proportion to the amplitude of the digital modulating baseband signal 310. Thus, between times t0 and t1, and between times t2 and t4, when the amplitude of the digital baseband signal 310 is at the higher amplitude second state, the frequency of the digital FM carrier signal 816 is at a maximum. Between times t1 and t2, when the amplitude of the digital baseband signal 310 is at the lower amplitude first state, the frequency of the digital FM carrier signal 816 is at a minimum. Digital frequency modulation is often referred to as frequency shift keying (FSK), and the terms are used interchangeably throughout the specification.

Typically, the frequency of the digital FM carrier signal 816 is centered about the frequency of the carrier signal 410, and the maximum and minimum frequencies are equally offset from the center frequency. Other variations can be employed but, for ease of illustration, this convention will be followed herein.

1.1.3 Phase Modulation

Figure 9A:
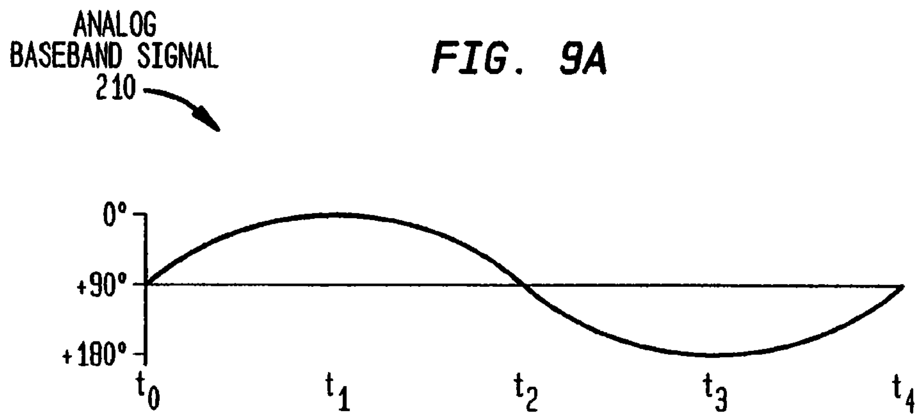
FIGS. 9A-9C illustrate example signal diagrams related to phase modulation.
Figure 9B:
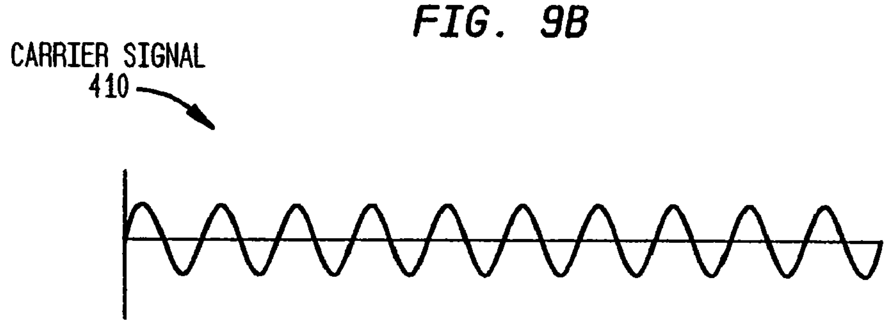
Figure 9C:
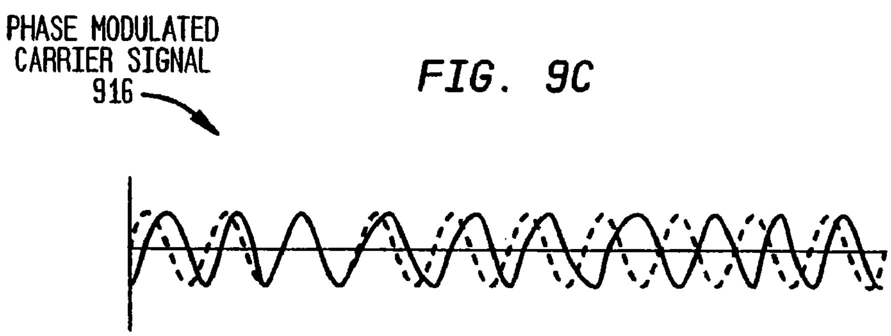
Figure 10A:
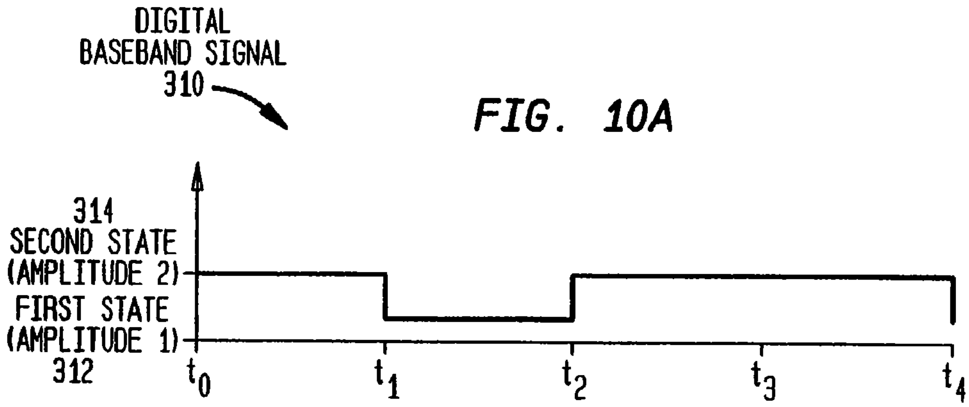
FIGS. 10A-10C illustrate example signal diagrams related to phase shift keying modulation.
Figure 10B:
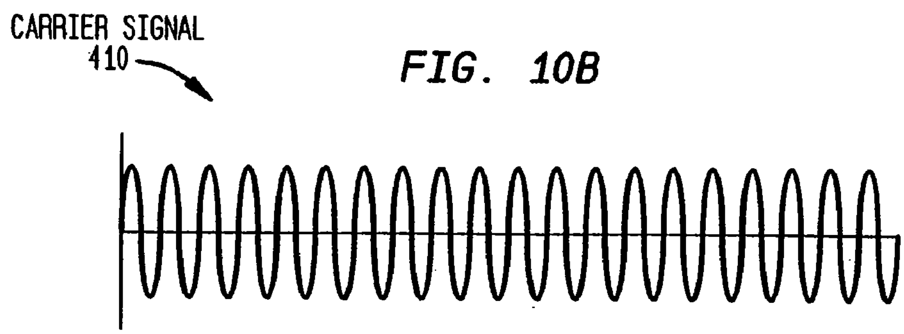
Figure 10C:
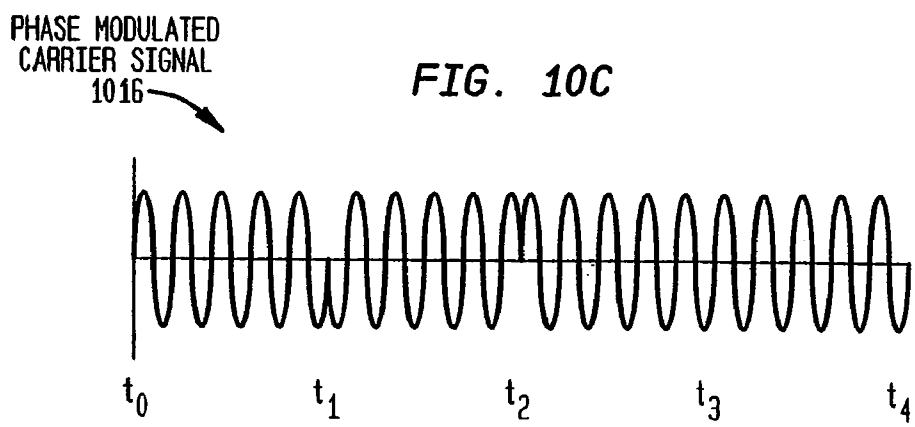

In phase modulation (PM), the phase of the modulated carrier signal $F_{MC}$ varies as a function of the amplitude of the modulating baseband signal $F_{MB}$. FIGS. 9A-9C illustrate example timing diagrams for phase modulating the carrier signal 410 with the analog modulating baseband signal 210. FIGS. 10A-10C illustrate example timing diagrams for phase modulating the carrier signal 410 with the digital modulating baseband signal 310.

FIG. 9A illustrates the analog modulating baseband signal 210. FIG. 9B illustrates the carrier signal 410. FIG. 9C illustrates an analog PM carrier signal 916, which is generated by phase modulating the carrier signal 410 with the analog baseband signal 210. As used herein, the term "analog PM carrier signal" is used to indicate that the modulating baseband signal is an analog signal.

Generally, the frequency of the analog PM carrier signal 916 is substantially the same as the frequency of carrier signal 410. But the phase of the analog PM carrier signal 916 varies with amplitude changes on the analog modulating baseband signal 210. For relative comparison, the carrier signal 410 is illustrated in FIG. 9C by a dashed line.

The phase of the analog PM carrier signal 916 varies as a function of amplitude changes of the analog baseband signal 210. In the illustrated example, the phase of the analog PM signal 916 lags by a varying amount as determined by the amplitude of the baseband signal 210. For example, at time t1, when the amplitude of the analog baseband signal 210 is at a maximum, the analog PM carrier signal 916 is in phase with the carrier signal 410. Between times t1 and t3, when the amplitude of the analog baseband signal 210 decreases to a minimum amplitude, the phase of the analog PM carrier signal 916 lags the phase of the carrier signal 410, until it reaches a maximum out of phase value at time t3. In the illustrated example, the phase change is illustrated as approximately 180 degrees. Any suitable amount of phase change, varied in any manner that is a function of the baseband signal, can be utilized.

FIG. 10A illustrates the digital modulating baseband signal 310. FIG. 10B illustrates the carrier signal 410. FIG. 10C illustrates a digital PM carrier signal 1016, which is generated by phase modulating the carrier signal 410 with the digital baseband signal 310. As used herein, the term "digital PM carrier signal" is used to indicate that the modulating baseband signal is a digital signal.

The frequency of the digital PM carrier signal 1016 is substantially the same as the frequency of carrier signal 410. The phase of the digital PM carrier signal 1016 varies as a function of amplitude changes on the digital baseband signal 310. In the illustrated example, when the digital baseband signal 310 is at the first state 312, the digital PM carrier signal 1016 is out of phase with the carrier signal 410. When the digital baseband signal 310 is at the second state 314, the digital PM carrier signal 1016 is in-phase with the carrier signal 410. Thus, between times t1 and t2, when the amplitude of the digital baseband signal 310 is at the first state 312, the digital PM carrier signal 1016 is out of phase with the carrier signal 410. Between times t0 and t1, and between times t2 and t4, when the amplitude of the digital baseband signal 310 is at the second state 314, the digital PM carrier signal 1016 is in phase with the carrier signal 410.

In the illustrated example, the out of phase value between times t1 and t3 is illustrated as approximately 180 degrees out of phase. Any suitable amount of phase change, varied in any manner that is a function of the baseband signal, can be utilized. Digital phase modulation is often referred to as phase shift keying (PSK), and the terms are used interchangeably throughout the specification.

1.2 Demodulation

When the modulated carrier signal $F_{MC}$ is received, it can be demodulated to extract the modulating baseband signal $F_{MB}$. Because of the typically high frequency of modulated carrier signal $F_{MC}$, however, it is generally impractical to demodulate the baseband signal FM directly from the modulated carrier signal $F_{MC}$. Instead, the modulated carrier signal $F_{MC}$ must be down-converted to a lower frequency signal that contains the original modulating baseband signal.

When a modulated carrier signal is down-converted to a lower frequency signal, the lower frequency signal is referred to herein as an intermediate frequency (IF) signal $F_{IF}$. The IF signal $F_{IF}$ oscillates at any frequency, or frequency band, below the frequency of the modulated carrier frequency $F_{MC}$. Down-conversion of $F_{MC}$ to $F_{IF}$ is illustrated as:

$$F_{MC} \rightarrow F_{IF}$$

After $F_{MC}$ is down-converted to the IF modulated carrier signal $F_{IF}$. $F_{IF}$ can be demodulated to a baseband signal $F_{DMB}$, as illustrated by:

$$F_{IF} \rightarrow F_{DMB}$$

$F_{DMB}$ is intended to be substantially similar to the modulating baseband signal $F_{MB}$, illustrating that the modulating baseband signal $F_{MB}$ can be substantially recovered.

It will be emphasized throughout the disclosure that the present invention can be implemented with any type of EM signal, including, but not limited to, modulated carrier signals and unmodulated carrier signals. The above examples of modulated carrier signals are provided for illustrative purposes only. Many variations to the examples are possible. For example, a carrier signal can be modulated with a plurality of the modulation types described above. A carrier signal can also be modulated with a plurality of baseband signals, including analog baseband signals, digital baseband signals, and combinations of both analog and digital baseband signals.

2. Overview of the Invention

Conventional signal processing techniques follow the Nyquist sampling theorem, which states that, in order to faithfully reproduce a sampled signal, the signal must be sampled at a rate that is greater than twice the frequency of the signal being sampled. When a signal is sampled at less than or equal to twice the frequency of the signal, the signal is said to be under-sampled, or aliased. Conventional signal processing thus teaches away from under-sampling and aliasing, in order to faithfully reproduce a sampled signal.

2.1 Aspects of the Invention

Contrary to conventional wisdom, the present invention is a method and system for down-converting an electromagnetic (EM) signal by aliasing the EM signal. Aliasing is represented generally in FIG. 45A as 4502.

By taking a carrier and aliasing it at an aliasing rate, the invention can down-convert that carrier to lower frequencies. One aspect that can be exploited by this invention is realizing that the carrier is not the item of interest, the lower baseband signal is of interest to reproduce sufficiently. This baseband signal's frequency content, even though its carrier may be aliased, does satisfy the Nyquist criteria and as a result, the baseband information can be sufficiently reproduced.

Figure 12A:
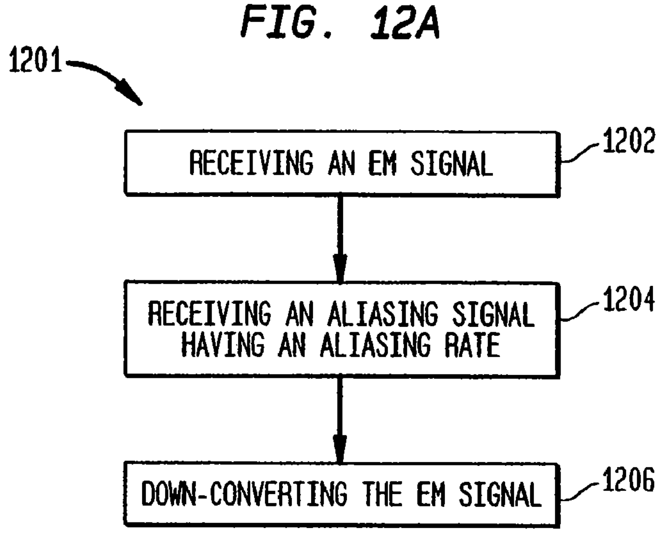
FIG. 12A-D illustrate various flowcharts for down-converting an EM-signal according to embodiments of the invention.

FIG. 12A depicts a flowchart 1201 that illustrates a method for aliasing an EM signal to generate a down-converted signal. The process begins at step 1202, which includes receiving the EM signal. Step 1204 includes receiving an aliasing signal having an aliasing rate. Step 1206 includes aliasing the EM signal to down-convert the EM signal. The term aliasing, as used herein, refers to both down-converting an EM signal by under-sampling the EM signal at an aliasing rate and to down-converting an EM signal by transferring energy from the EM signal at the aliasing rate. These concepts are described below.

Figure 13:
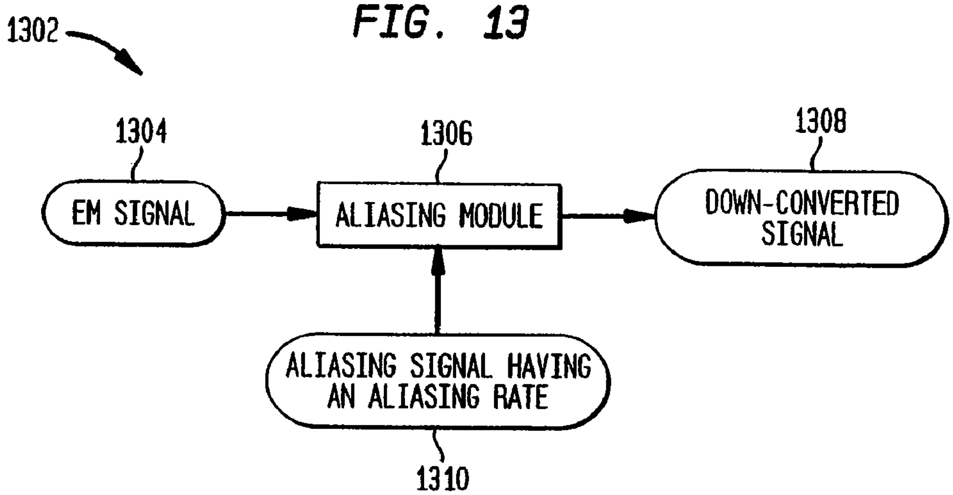
FIG. 13 illustrates a structural block diagram of an aliasing system according to an embodiment of the invention.

FIG. 13 illustrates a block diagram of a generic aliasing system 1302, which includes an aliasing module 1306. In an embodiment, the aliasing system 1302 operates in accordance with the flowchart 1201. For example, in step 1202, the aliasing module 1306 receives an EM signal 1304. In step 1204, the aliasing module 1306 receives an aliasing signal 1310. In step 1206, the aliasing module 1306 down-converts the EM signal 1304 to a down-converted signal 1308. The generic aliasing system 1302 can also be used to implement any of the flowcharts 1207, 1213 and 1219.

Figure 12B:
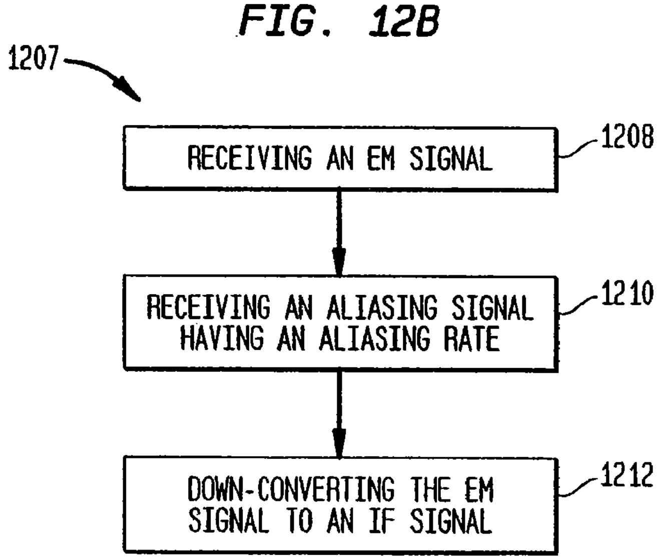

In an embodiment, the invention down-converts the EM signal to an intermediate frequency (IF) signal. FIG. 12B depicts a flowchart 1207 that illustrates a method for under-sampling the EM signal at an aliasing rate to down-convert the EM signal to an IF signal. The process begins at step 1208, which includes receiving an EM signal. Step 1210 includes receiving an aliasing signal having an aliasing rate $F_{AR}$. Step 1212 includes under-sampling the EM signal at the aliasing rate to down-convert the EM signal to an IF signal.

Figure 12C:
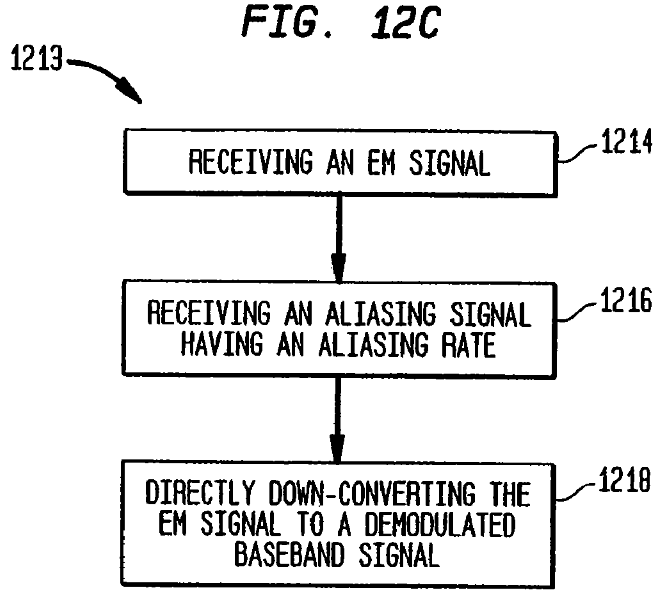

In another embodiment, the invention down-converts the EM signal to a demodulated baseband information signal. FIG. 12C depicts a flowchart 1213 that illustrates a method for down-converting the EM signal to a demodulated baseband signal. The process begins at step 1214, which includes receiving an EM signal. Step 1216 includes receiving an aliasing signal having an aliasing rate $F_{AR}$. Step 1218 includes down-converting the EM signal to a demodulated baseband signal. The demodulated baseband signal can be processed without further down-conversion or demodulation.

Figure 12D:
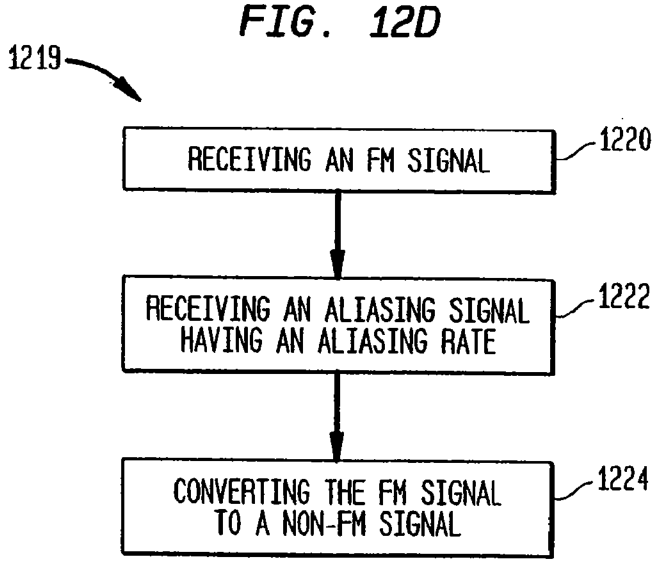

In another embodiment, the EM signal is a frequency modulated (FM) signal, which is down-converted to a non-FM signal, such as a phase modulated (PM) signal or an amplitude modulated (AM) signal. FIG. 12D depicts a flowchart 1219 that illustrates a method for down-converting the FM signal to a non-FM signal. The process begins at step 1220, which includes receiving an EM signal. Step 1222 includes receiving an aliasing signal having an aliasing rate. Step 1224 includes down-converting the FM signal to a non-FM signal.

The invention down-converts any type of EM signal, including, but not limited to, modulated carrier signals and unmodulated carrier signals. For ease of discussion, the invention is further described herein using modulated carrier signals for examples. Upon reading the disclosure and examples therein, one skilled in the relevant art(s) will understand that the invention can be implemented to down-convert signals other than carrier signals as well. The invention is not limited to the example embodiments described above.

In an embodiment, down-conversion is accomplished by under-sampling an EM signal. This is described generally in Section I.2.2. below and in detail in Section II and its sub-sections. In another embodiment, down-conversion is achieved by transferring non-negligible amounts of energy from an EM signal. This is described generally in Section I.2.3. below and in detail in Section III.

2.2 Down-Converting by Under-Sampling

Figure 14A:
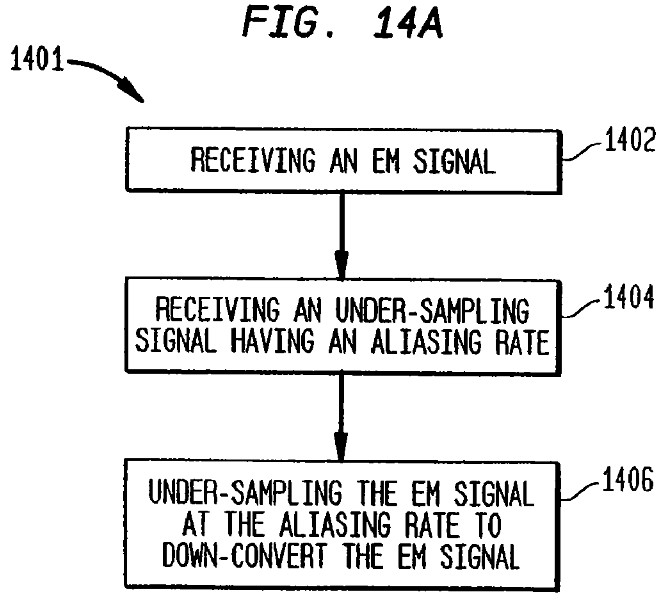
FIGS. 14A-D illustrate various flowcharts for down-converting an EM signal by under-sampling the EM signal according to embodiments of the invention.

The term aliasing, as used herein, refers both to down-converting an EM signal by under-sampling the EM signal at an aliasing rate and to down-converting an EM signal by transferring energy from the EM signal at the aliasing rate. Methods for under-sampling an EM signal to down-convert the EM signal are now described at an overview level. FIG. 14A depicts a flowchart 1401 that illustrates a method for under-sampling the EM signal at an aliasing rate to down-convert the EM signal. The process begins at step 1402, which includes receiving an EM signal. Step 1404 includes receiving an under-sampling signal having an aliasing rate. Step 1406 includes under-sampling the EM signal at the aliasing rate to down-convert the EM signal.

Figure 45A:
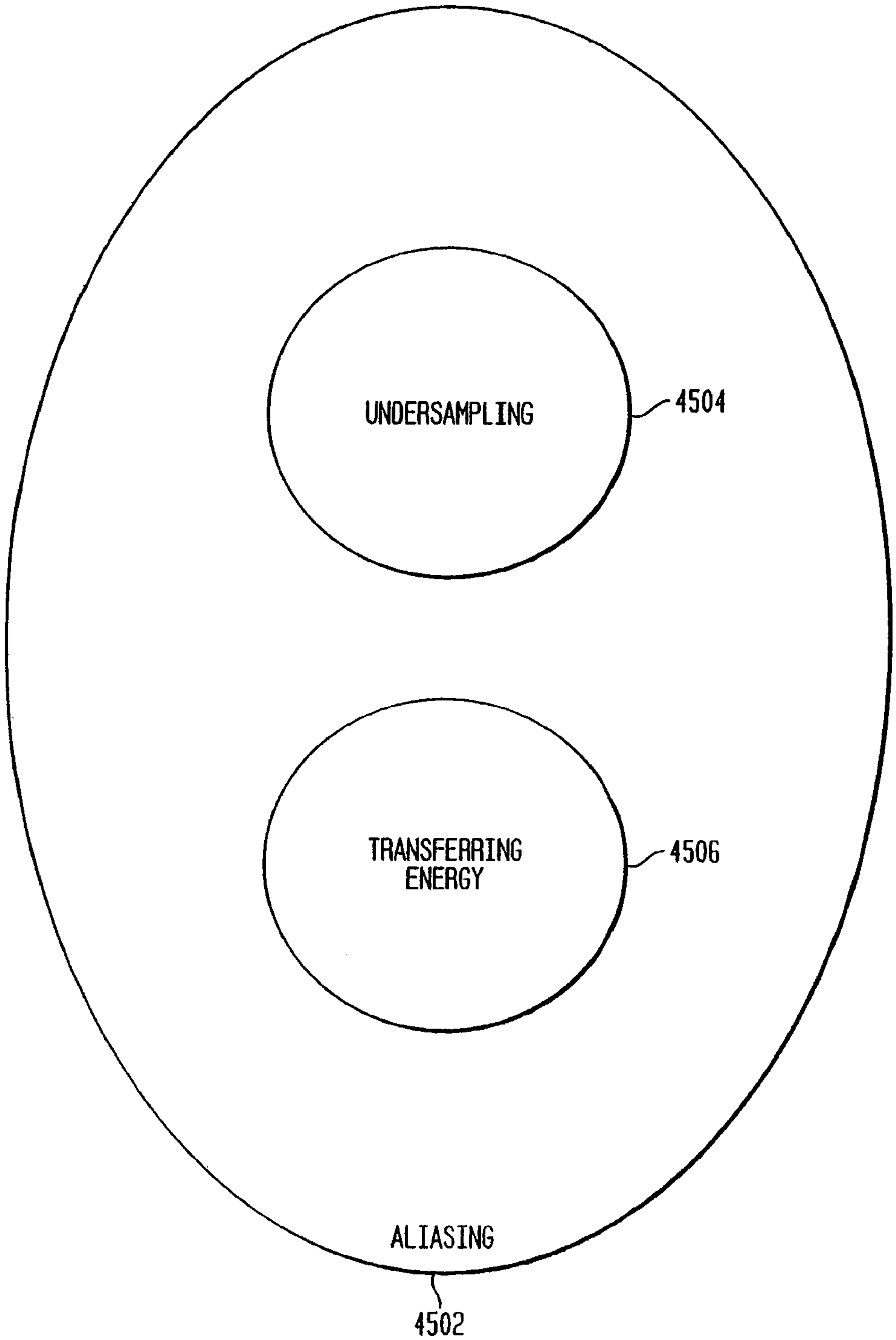
FIGS. 45A-B illustrate a conceptual illustration of aliasing including under-sampling and energy transfer according to embodiments of the invention.

Down-converting by under-sampling is illustrated by 4504 in FIG. 45A and is described in greater detail in Section II.

2.2.1 Down-Converting to an Intermediate Frequency (IF) Signal

In an embodiment, an EM signal is under-sampled at an aliasing rate to down-convert the EM signal to a lower, or intermediate frequency (IP) signal. The EM signal can be a modulated carrier signal or an unmodulated carrier signal. In an exemplary example, a modulated carrier signal $F_{MC}$ is down-converted to an IF signal $F_{IF}$.

$$F_{MC} \rightarrow F_{IF}$$

Figure 14B:
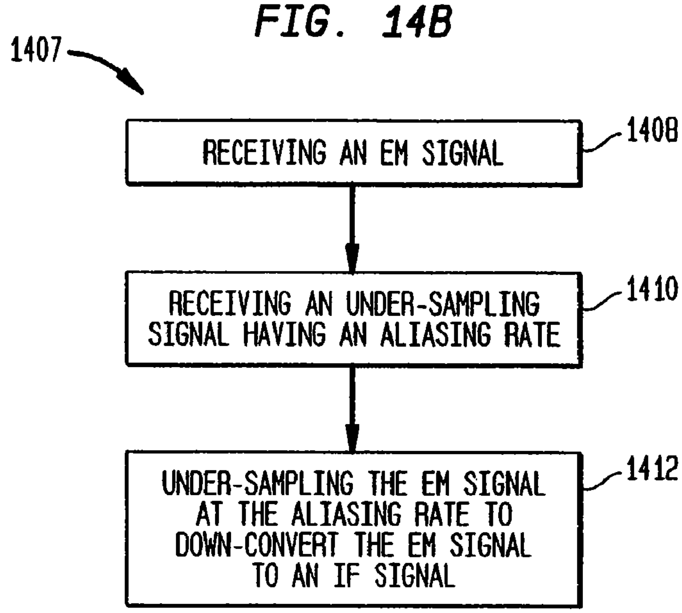

FIG. 14B depicts a flowchart 1407 that illustrates a method for under-sampling the EM signal at an aliasing rate to down-convert the EM signal to an IF signal. The process begins at step 1408, which includes receiving an EM signal. Step 1410 includes receiving an under-sampling signal having an aliasing rate. Step 1412 includes under-sampling the EM signal at the aliasing rate to down-convert the EM signal to an IF signal.

Figure 45B:
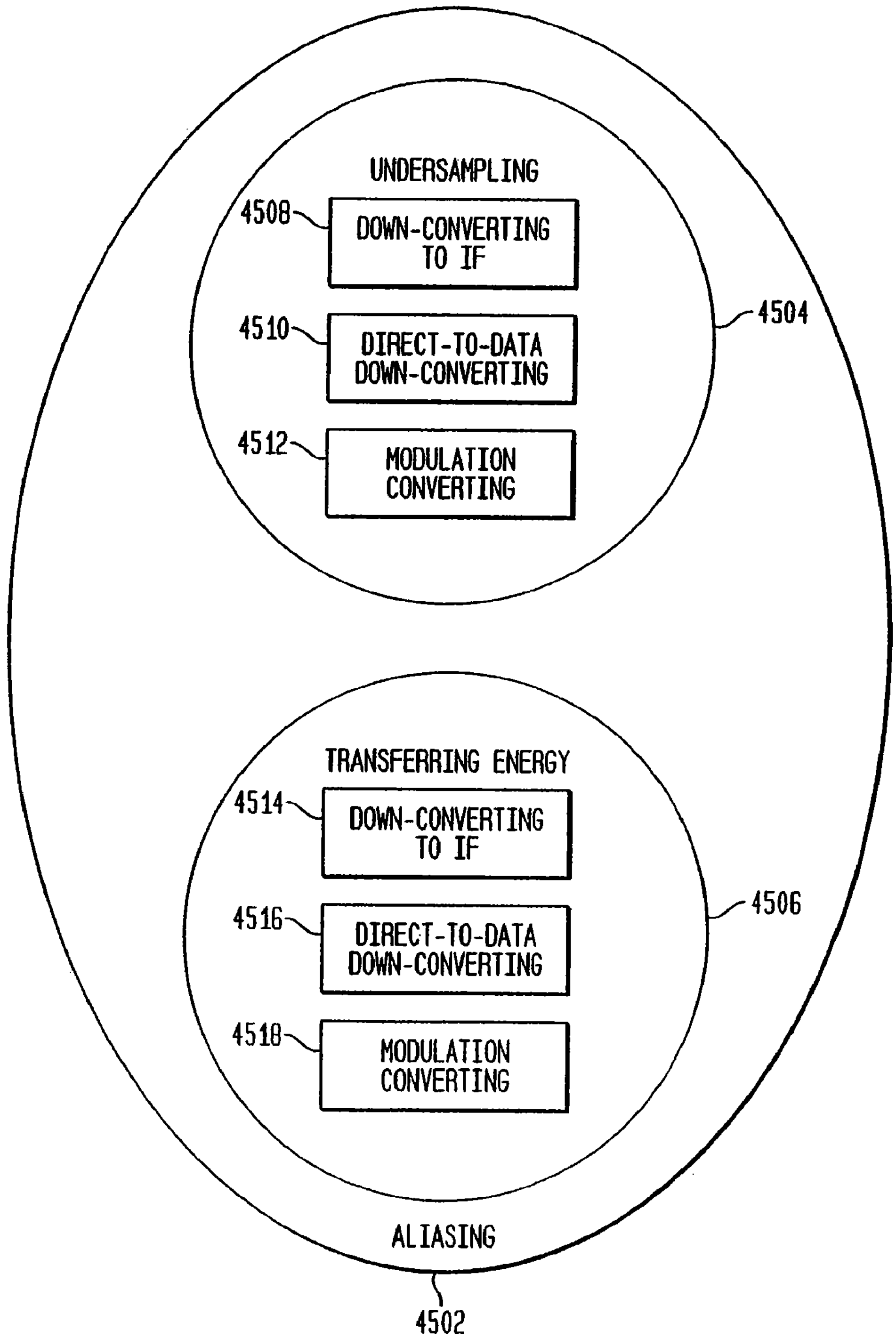

This embodiment is illustrated generally by 4508 in FIG. 45B and is described in Section II.1.

2.2.2 Direct-to-Data Down-Converting

In another embodiment, an EM signal is directly down-converted to a demodulated baseband signal (direct-to-data down-conversion), by under-sampling the EM signal at an aliasing rate. The EM signal can be a modulated EM signal or an unmodulated EM signal. In an exemplary embodiment, the EM signal is the modulated carrier signal $F_{MC}$, and is directly down-converted to a demodulated baseband signal $F_{DMB}$.

$$F_{MC} \rightarrow F_{DMB}$$

Figure 14C:
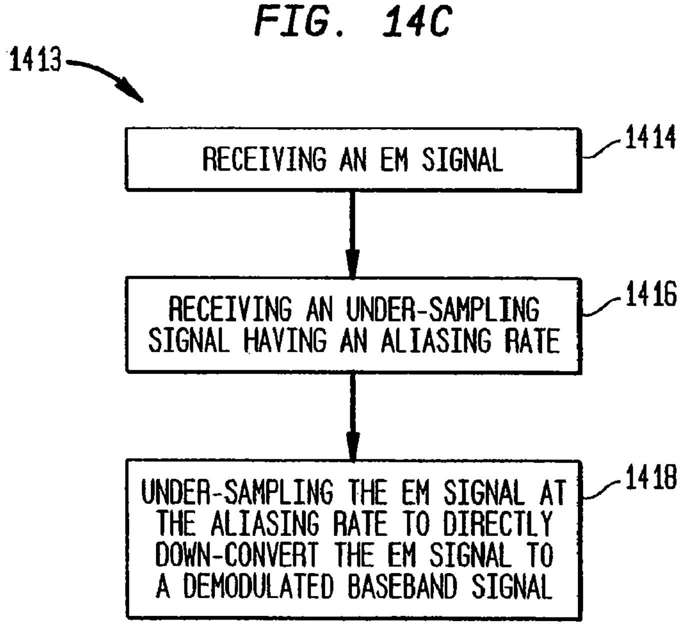

FIG. 14C depicts a flowchart 1413 that illustrates a method for under-sampling the EM signal at an aliasing rate to directly down-convert the EM signal to a demodulated baseband signal. The process begins at step 1414, which includes receiving an EM signal. Step 1416 includes receiving an under-sampling signal having an aliasing rate. Step 1418 includes under-sampling the EM signal at the aliasing rate to directly down-convert the EM signal to a baseband information signal.

This embodiment is illustrated generally by 4510 in FIG. 45B and is described in Section II.2

2.2.3 Modulation Conversion

In another embodiment, a frequency modulated (FM) carrier signal $F_{MC}$ is converted to a non-FM signal $F_{(NON\text{-}FM)}$, by under-sampling the FM carrier signal $F_{FMC}$.

$$F_{FMC} \rightarrow F_{(NON\text{-}FM)}$$

Figure 14D:
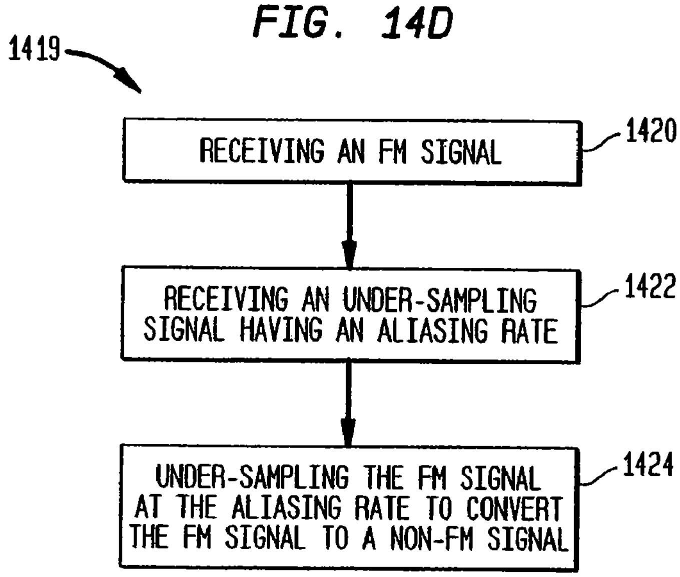

FIG. 14D depicts a flowchart 1419 that illustrates a method for under-sampling an FM signal to convert it to a non-FM signal. The process begins at step 1420, which includes receiving the FM signal. Step 1422 includes receiving an under-sampling signal having an aliasing rate. Step 1424 includes under-sampling the FM signal at the aliasing rate to convert the FM signal to a non-FM signal. For example, the FM signal can be under-sampled to convert it to a PM signal or an AM signal.

This embodiment is illustrated generally by 4512 in FIG. 45B, and described in Section II. 3

2.3 Down-Converting by Transferring Energy

The term aliasing, as used herein, refers both to down-converting an EM signal by under-sampling the EM signal at an aliasing rate and to down-converting an EM signal by transferring non-negligible amounts energy from the EM signal at the aliasing rate. Methods for transferring energy from an EM signal to down-convert the EM signal are now described at an overview level. More detailed descriptions are provided in Section III.

Figure 46A:
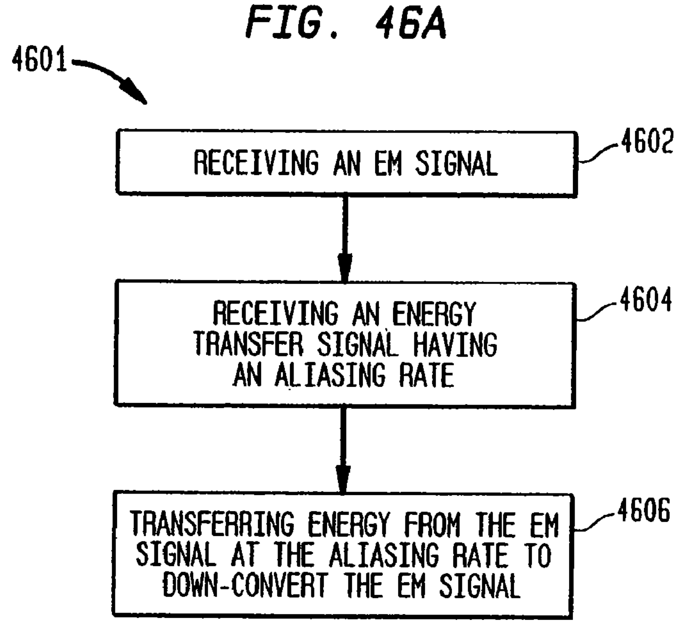
FIGS. 46A-D illustrate various flowchart for down-converting an EM signal by transferring energy from the EM signal at an aliasing rate according to embodiments of the invention.

FIG. 46A depicts a flowchart 4601 that illustrates a method for transferring energy from the EM signal at an aliasing rate to down-convert the EM signal. The process begins at step 4602, which includes receiving an EM signal. Step 4604 includes receiving an energy transfer signal having an aliasing rate. Step 4606 includes transferring energy from the EM signal at the aliasing rate to down-convert the EM signal.

Down-converting by transferring energy is illustrated by 4506 in FIG. 45A and is described in greater detail in Section III.

2.3.1 Down-Converting to an Intermediate Frequency (IF) Signal

In an embodiment, EM signal is down-converted to a lower, or intermediate frequency (IF) signal, by transferring energy from the EM signal at an aliasing rate. The EM signal can be a modulated carrier signal or an unmodulated carrier signal. In an exemplary example, a modulated carrier signal $F_{MC}$ is down-converted to an IF signal $F_{IF}$.

$$F_{MC} \rightarrow F_{IF}$$

Figure 46B:
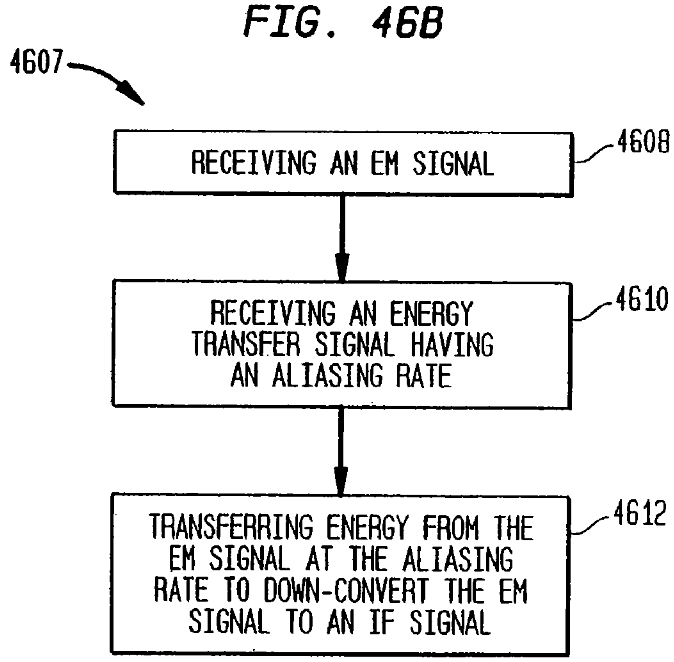

FIG. 46B depicts a flowchart 4607 that illustrates a method for transferring energy from the EM signal at an aliasing rate to down-convert the EM signal to an IF signal. The process begins at step 4608, which includes receiving an EM signal. Step 4610 includes receiving an energy transfer signal having an aliasing rate. Step 4612 includes transferring energy from the EM signal at the aliasing rate to down-convert the EM signal to an IF signal.

This embodiment is illustrated generally by 4514 in FIG. 45B and is described in Section III.1.

2.3.2 Direct-to-Data Down-Converting

In another embodiment, an EM signal is down-converted to a demodulated baseband signal by transferring energy from the EM signal at an aliasing rate. This embodiment is referred to herein as direct-to-data down-conversion. The EM signal can be a modulated EM signal or an unmodulated EM signal. In an exemplary embodiment, the EM signal is the modulated carrier signal $F_{MC}$, and is directly down-converted to a demodulated baseband signal $F_{DMB}$.

$$F_{MC} \rightarrow F_{DMB}$$

Figure 46C:
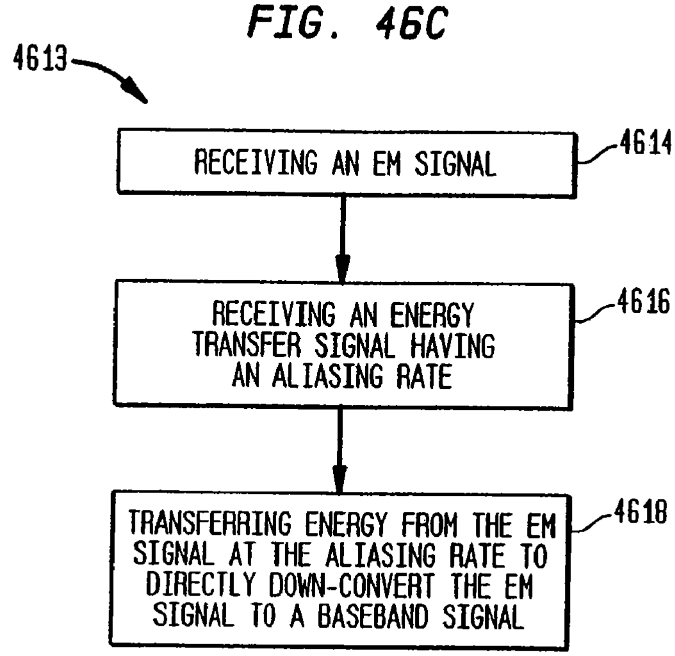

FIG. 46C depicts a flowchart 4613 that illustrates a method for transferring energy from the EM signal at an aliasing rate to directly down-convert the EM signal to a demodulated baseband signal. The process begins at step 4614, which includes receiving an EM signal. Step 4616 includes receiving an energy transfer signal having an aliasing rate. Step 4618 includes transferring energy from the EM signal at the aliasing rate to directly down-convert the EM signal to a baseband signal.

This embodiment is illustrated generally by 4516 in FIG. 45B and is described in Section III.2

2.3.3 Modulation Conversion

In another embodiment, a frequency modulated (FM) carrier signal $F_{MC}$ is converted to a non-FM signal $F_{(NON-FM)}$, by transferring energy from the FM carrier signal $F_{MC}$ at an aliasing rate.

$$F_{FMC} \rightarrow F_{(NON-FM)}$$

Figure 46D:
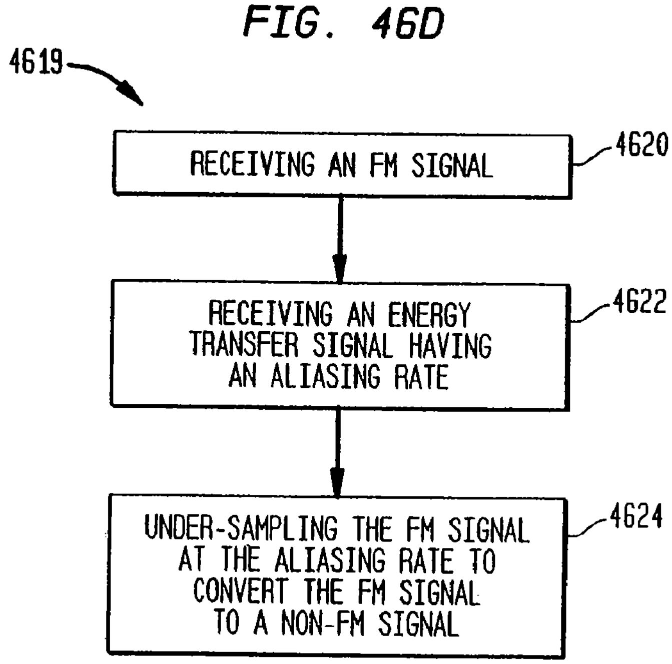

The FM carrier signal $F_{FMC}$ can be converted to, for example, a phase modulated (PM) signal or an amplitude modulated (AM) signal. FIG. 46D depicts a flowchart 4619 that illustrates a method for transferring energy from an FM signal to convert it to a non-FM signal. Step 4620 includes receiving the FM signal. Step 4622 includes receiving an energy transfer signal having an aliasing rate. In FIG. 46D, step 4612 includes transferring energy from the FM signal to convert it to a non-FM signal. For example, energy can be transferred from an FSK signal to convert it to a PSK signal or an ASK signal.

This embodiment is illustrated generally by 4518 in FIG. 45B, and described in Section III.3

2.4 Determining the Aliasing Rate

In accordance with the definition of aliasing, the aliasing rate is equal to, or less than, twice the frequency of the EM carrier signal. Preferably, the aliasing rate is much less than the frequency of the carrier signal. The aliasing rate is preferably more than twice the highest frequency component of the modulating baseband signal $F_{MB}$ that is to be reproduced. The above requirements are illustrated in EQ. (1).

$$2{*}F_{MC} \geq F_{AR} > 2{*}(\text{Highest Freq. Component of } F_{MB}) \quad \text{EQ. (1)}$$

In other words, by taking a carrier and aliasing it at an aliasing rate, the invention can down-convert that carrier to lower frequencies. One aspect that can be exploited by this invention is that the carrier is not the item of interest; instead the lower baseband signal is of interest to be reproduced sufficiently. The baseband signal's frequency content, even though its carrier may be aliased, satisfies the Nyquist criteria and as a result, the baseband information can be sufficiently reproduced, either as the intermediate modulating carrier signal $F_{IF}$ or as the demodulated direct-to-data baseband signal $F_{DMB}$.

In accordance with the invention, relationships between the frequency of an EM carrier signal, the aliasing rate, and the intermediate frequency of the down-converted signal, are illustrated in EQ. (2).

$$F_C = n{*}F_{AR} \pm F_{IF} \quad \text{EQ. (2)}$$

Where:

$F_C$ is the frequency of the EM carrier signal that is to be aliased;

$F_{AR}$ is the aliasing rate;

n identifies a harmonic or sub-harmonic of the aliasing rate (generally, n=0.5, 1, 2, 3, 4, . . . ); and $F_{IF}$ is the intermediate frequency of the down-converted signal.

Note that as ($n{*}F_{AR}$) approaches $F_C$, $F_{IF}$ approaches zero. This is a special case where an EM signal is directly down-converted to a demodulated baseband signal. This special case is referred to herein as Direct-to-Data down-conversion. Direct-to-Data down-conversion is described in later sections.

High level descriptions, exemplary embodiments and exemplary implementations of the above and other embodiments of the invention are provided in sections below.

Figure 11:
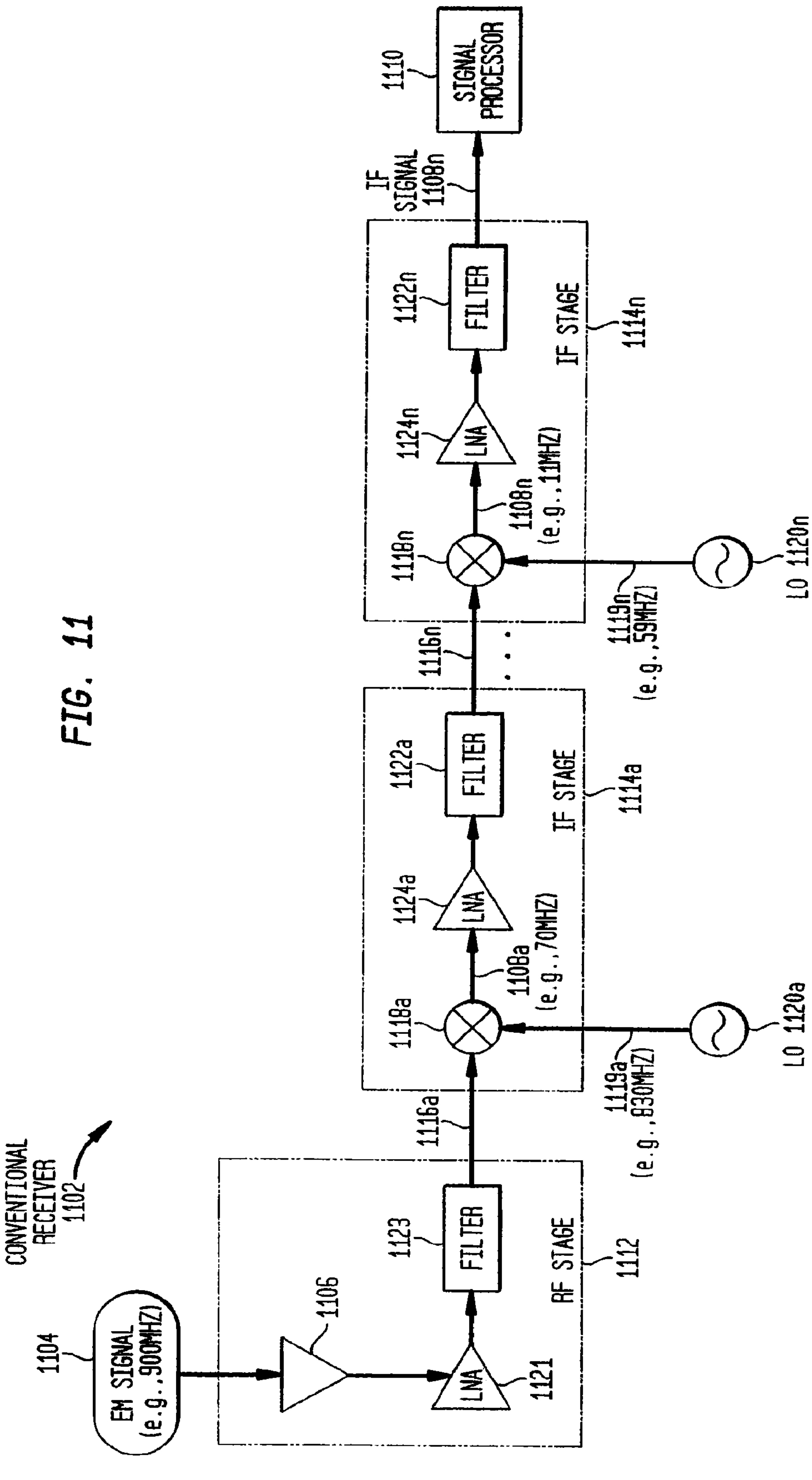
FIG. 11 illustrates a structural block diagram of a conventional receiver.

3. Benefits of the Invention Using an Example Conventional Receiver for Comparison FIG. 11 illustrates an example conventional receiver system 1102. The conventional system 1102 is provided both to help the reader to understand the functional differences between conventional systems and the present invention, and to help the reader to understand the benefits of the present invention.

The example conventional receiver system 1102 receives an electromagnetic (EM) signal 1104 via an antenna 1106. The EM signal 1104 can include a plurality of EM signals such as modulated carrier signals. For example, the EM signal 1104 includes one or more radio frequency (RF) EM signals, such as a 900 MHZ modulated carrier signal. Higher frequency RF signals, such as 900 MHZ signals, generally cannot be directly processed by conventional signal processors. Instead, higher frequency RF signals are typically down-converted to lower intermediate frequencies (IF) for processing. The receiver system 1102 down-converts the EM signal 1104 to an intermediate frequency (IF) signal 1108*n*, which can be provided to a signal processor 1110. When the EM signal 1104 includes a modulated carrier signal, the signal processor 1110 usually includes a demodulator that demodulates the IF signal 1108*n* to a baseband information signal (demodulated baseband signal).

Receiver system 1102 includes an RF stage 1112 and one or more IF stages 1114. The RF stage 1112 receives the EM signal 1104. The RF stage 1112 includes the antenna 1106 that receives the EM signal 1104.

The one or more IF stages 1114*a*-1114*n* down-convert the EM signal 1104 to consecutively lower intermediate frequencies. Each of the one or more IF sections 1114*a*-1114*n* includes a mixer 1118*a*-1118*n* that down-converts an input EM signal 1116 to a lower frequency IF signal 1108. By cascading the one or more mixers 1118*a*-1118*n*, the EM signal 1104 is incrementally down-converted to a desired IF signal 1108*n*.

In operation, each of the one or more mixers 1118 mixes an input EM signal 1116 with a local oscillator (LO) signal 1119, which is generated by a local oscillator (LO) 1120. Mixing generates sum and difference signals from the input EM signal 1116 and the LO signal 1119. For example, mixing an input EM signal 1116*a*, having a frequency of 900 MHZ, with a LO signal 1119*a*, having a frequency of 830 MHZ, results in a sum signal, having a frequency of 900 MHZ+830 MHZ=1.73 GHZ, and a difference signal, having a frequency of 900 MHZ−830 MHZ=70 MHZ.

Specifically, in the example of FIG. 11, the one or more mixers 1118 generate a sum and difference signals for all signal components in the input EM signal 1116. For example, when the EM signal 1116*a* includes a second EM signal, having a frequency of 760 MHZ, the mixer 1118*a* generates a second sum signal, having a frequency of 760 MHZ+830 MHZ=1.59 GHZ, and a second difference signal, having a frequency of 830 MHZ−760 MHZ=70 MHZ. In this example, therefore, mixing two input EM signals, having frequencies of 900 MHZ and 760 MHZ, respectively, with an LO signal having a frequency of 830 MHZ, results in two IF signals at 70 MHZ.

Generally, it is very difficult, if not impossible, to separate the two 70 MHZ signals. Instead, one or more filters 1122 and 1123 are provided upstream from each mixer 1118 to filter the unwanted frequencies, also known as image frequencies. The filters 1122 and 1123 can include various filter topologies and arrangements such as bandpass filters, one or more high pass filters, one or more low pass filters, combinations thereof, etc.

Typically, the one or more mixers 1118 and the one or more filters 1122 and 1123 attenuate or reduce the strength of the EM signal 1104. For example, a typical mixer reduces the EM signal strength by 8 to 12 dB. A typical filter reduces the EM signal strength by 3 to 6 dB.

As a result, one or more low noise amplifiers (LNAs) 1121 and 1124*a*-1124*n* are provided upstream of the one or more filters 1123 and 1122*a*-1122*n*. The LNAs and filters can be in reversed order. The LNAs compensate for losses in the mixers 1118, the filters 1122 and 1123, and other components by increasing the EM signal strength prior to filtering and mixing. Typically, for example, each LNA contributes 15 to 20 dB of amplification.

However, LNAs require substantial power to operate. Higher frequency LNAs require more power than lower frequency LNAs. When the receiver system 1102 is intended to be portable, such as a cellular telephone receiver, for example, the LNAs require a substantial portion of the total power.

At higher frequencies, impedance mismatches between the various stages further reduce the strength of the EM signal 1104. In order to optimize power transferred through the receiver system 1102, each component should be impedance matched with adjacent components. Since no two components have the exact same impedance characteristics, even for components that were manufactured with high tolerances, impedance matching must often be individually fine tuned for each receiver system 1102. As a result, impedance matching in conventional receivers tends to be labor intensive and more art than science. Impedance matching requires a significant amount of added time and expense to both the design and manufacture of conventional receivers. Since many of the components, such as LNA, filters, and impedance matching circuits, are highly frequency dependent, a receiver designed for one application is generally not suitable for other applications. Instead, a new receiver must be designed, which requires new impedance matching circuits between many of the components.

Conventional receiver components are typically positioned over multiple IC substrates instead of on a single IC substrate. This is partly because there is no single substrate that is optimal for both RF, IF, and baseband frequencies. Other factors may include the sheer number of components, their various sizes and different inherent impedance characteristics, etc. Additional signal amplification is often required when going from chip to chip. Implementation over multiple substrates thus involves many costs in addition to the cost of the ICs themselves.

Conventional receivers thus require many components, are difficult and time consuming to design and manufacture, and require substantial external power to maintain sufficient signal levels. Conventional receivers are thus expensive to design, build, and use.

In an embodiment, the present invention is implemented to replace many, if not all, of the components between the antenna 1106 and the signal processor 1110, with an aliasing module that includes a universal frequency translator (UFT) module. The UFT is able to down-convert a wide range of EM signal frequencies using very few components. The UFT is easy to design and build, and requires very little external power. The UFT design can be easily tailored for different frequencies or frequency ranges. For example, UFT design can be easily impedance matched with relatively little tuning. In a direct-to-data embodiment of the invention, where an EM signal is directly down-converted to a demodulated baseband signal, the invention also eliminates the need for a demodulator in the signal processor 1110.

When the invention is implemented in a receiver system, such as the receiver system 1102, power consumption is significantly reduced and signal to noise ratio is significantly increased.

In an embodiment, the invention can be implemented and tailored for specific applications with easy to calculate and easy to implement impedance matching circuits. As a result, when the invention is implemented as a receiver, such as the receiver 1102, specialized impedance matching experience is not required.

In conventional receivers, components in the IF sections comprise roughly eighty to ninety percent of the total components of the receivers. The UFT design eliminates the IF section(s) and thus eliminates the roughly eighty to ninety percent of the total components of conventional receivers.

Other advantages of the invention include, but are not limited to:

The invention can be implemented as a receiver with only a single local oscillator;

The invention can be implemented as a receiver with only a single, lower frequency, local oscillator;

The invention can be implemented as a receiver using few filters;

The invention can be implemented as a receiver using unit delay filters;

The invention can be implemented as a receiver that can change frequencies and receive different modulation formats with no hardware changes;

The invention can be also be implemented as frequency up-converter in an EM signal transmitter;

The invention can be also be implemented as a combination up-converter (transmitter) and down-converter (receiver), referred to herein as a transceiver;

The invention can be implemented as a method and system for ensuring reception of a communications signal, as disclosed in U.S. patent application Ser. No. 09/176,415, filed Oct. 21, 1998, incorporated herein by reference in its entirety;

The invention can be implemented in a differential configuration, whereby signal to noise ratios are increased;

A receiver designed in accordance with the invention can be implemented on a single IC substrate, such as a silicon-based IC substrate;

A receiver designed in accordance with the invention and implemented on a single IC substrate, such as a silicon-based IC substrate, can down-convert EM signals from frequencies in the giga Hertz range;

A receiver built in accordance with the invention has a relatively flat response over a wide range of frequencies. For example, in an embodiment, a receiver built in accordance with the invention to operate around 800 MHZ has a substantially flat response (i.e., plus or minus a few dB of power) from 100 MHZ to 1 GHZ. This is referred to herein as a wide-band receiver; and A receiver built in accordance with the invention can include multiple, user-selectable, Impedance match modules, each designed for a different wide-band of frequencies, which can be used to scan an ultra-wide-band of frequencies.

II. Down-Converting by Under-Sampling

1. Down-Converting an EM Carrier Signal to an EM Intermediate Signal by Under-Sampling the EM Carrier Signal at the Aliasing Rate In an embodiment, the invention down-converts an EM signal to an IF signal by under-sampling the EM signal. This embodiment is illustrated by 4508 in FIG. 45B.

This embodiment can be implemented with modulated and unmodulated EM signals. This embodiment is described herein using the modulated carrier signal $F_{MC}$ in FIG. 1, as an example. In the example, the modulated carrier signal $F_{MC}$ is down-converted to an IF signal $F_{IF}$. The IF signal $F_{IF}$ can then be demodulated, with any conventional demodulation technique to obtain a demodulated baseband signal $F_{DMB}$. Upon reading the disclosure and examples therein, one skilled in the relevant art(s) will understand that the invention can be implemented to down-convert any EM signal, including but not limited to, modulated carrier signals and unmodulated carrier signals.

The following sections describe example methods for down-converting the modulated carrier signal $F_{MC}$ to the IF signal $F_{IF}$, according to embodiments of the invention. Exemplary structural embodiments for implementing the methods are also described. It should be understood that the invention is not limited to the particular embodiments described below. Equivalents, extensions, variations, deviations, etc., of the following will be apparent to persons skilled in the relevant art(s) based on the teachings contained herein. Such equivalents, extensions, variations, deviations, etc., are within the scope and spirit of the present invention.

The following sections include a high level discussion, example embodiments, and implementation examples.

1.1 High Level Description

This section (including its subsections) provides a high-level description of down-converting an EM signal to an IF signal $F_{IF}$ according to the invention. In particular, an operational process of under-sampling a modulated carrier signal $F_{MC}$ to down-convert it to the IF signal $F_{IF}$, is described at a high-level. Also, a structural implementation for implementing this process is described at a high-level. This structural implementation is described herein for illustrative purposes, and is not limiting. In particular, the process described in this section can be achieved using any number of structural implementations, one of which is described in this section. The details of such structural implementations will be apparent to persons skilled in the relevant art(s) based on the teachings contained herein.

1.1.1 Operational Description

FIG. 14B depicts a flowchart 1407 that illustrates an exemplary method for under-sampling an EM signal to down-convert the EM signal to an intermediate signal $F_{IF}$. The exemplary method illustrated in the flowchart 1407 is an embodiment of the flowchart 1401 in FIG. 14A.

Any and all combinations of modulation techniques are valid for this invention. For ease of discussion, the digital AM carrier signal 616 is used to illustrate a high level operational description of the invention. Subsequent sections provide detailed flowcharts and descriptions for AM, FM and PM example embodiments. Upon reading the disclosure and examples therein, one skilled in the relevant art(s) will understand that the invention can be implemented to down-convert any type of EM signal, including any form of modulated carrier signal and unmodulated carrier signals.

Figure 15E:
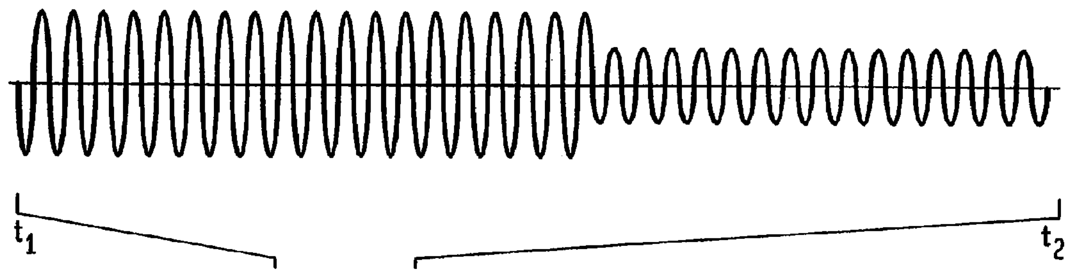
FIGS. 15A-E illustrate example signal diagrams associated with flowcharts in FIGS. 14A-D according to embodiments of the invention.

The method illustrated in the flowchart 1407 is now described at a high level using the digital AM carrier signal 616 of FIG. 6C. The digital AM carrier signal 616 is re-illustrated in FIG. 15A for convenience. FIG. 15E illustrates a portion 1510 of the AM carrier signal 616, between time t1 and t2, on an expanded time scale.

The process begins at step 1408, which includes receiving an EM signal. Step 1408 is represented by the digital AM carrier signal 616.

Figure 15A:
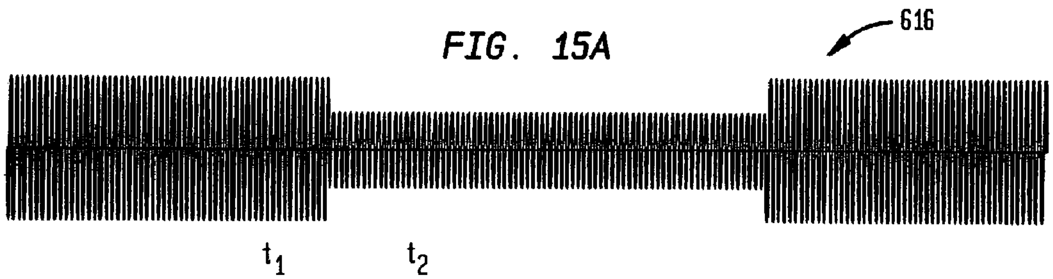
Figure 15B:
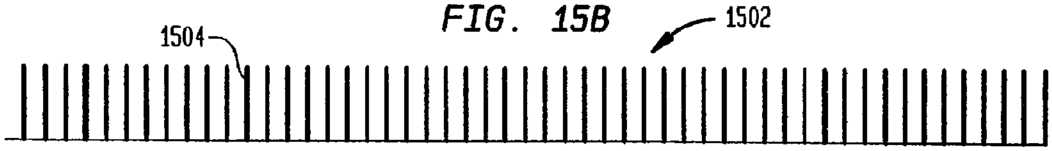

Step 1410 includes receiving an under-sampling signal having an aliasing rate $F_{AR}$. FIG. 15B illustrates an example under-sampling signal 1502, which includes a train of pulses 1504 having negligible apertures that tend toward zero time in duration. The pulses 1504 repeat at the aliasing rate, OF pulse repetition rate. Aliasing rates are discussed below.

Step 1412 includes under-sampling the EM signal at the aliasing rate to down-convert the EM signal to the intermediate signal $F_{IF}$. When down-converting an EM signal to an IF signal, the frequency or aliasing rate of the pulses 1504 sets the IF.

Figure 15C:
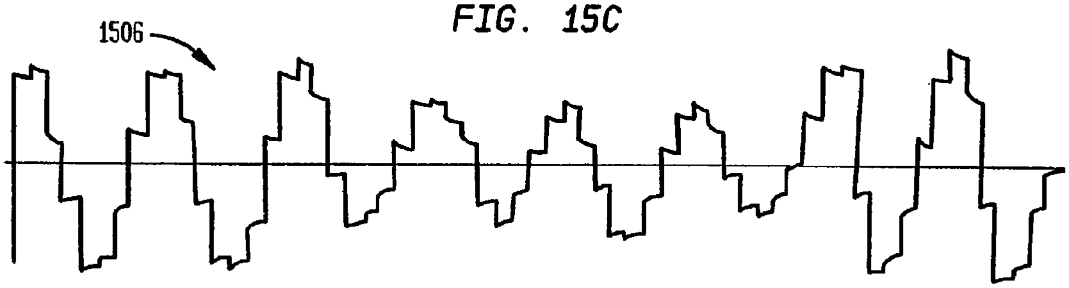

FIG. 15C illustrates a stair step AM intermediate signal 1506, which is generated by the down-conversion process. The AM intermediate signal 1506 is similar to the AM carrier signal 616 except that the AM intermediate signal 1506 has a lower frequency than the AM carrier signal 616. The AM carrier signal 616 has thus been down-converted to the AM intermediate signal 1506. The AM intermediate signal 1506 can be generated at any frequency below the frequency of the AM carrier signal 616 by adjusting the aliasing rate.

Figure 15D:
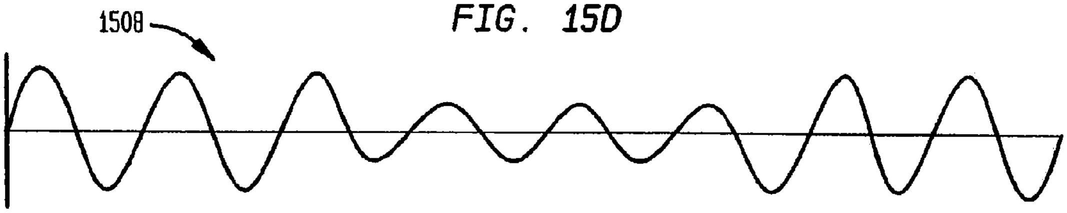

FIG. 15D depicts the AM intermediate signal 1506 as a filtered output signal 1508. In an alternative embodiment, the invention outputs a stair step, non-filtered or partially filtered output signal. The choice between filtered, partially filtered and non-filtered output signals is generally a design choice that depends upon the application of the invention.

The intermediate frequency of the down-converted signal $F_{IF}$, which in this example is the AM intermediate signal 1506, can be determined from EQ. (2), which is reproduced below for convenience.

$$F_C = n*F_{AR} \pm F_{IF} \qquad \text{EQ. (2)}$$

A suitable aliasing rate $F_{AR}$ can be determined in a variety of ways. An example method for determining the aliasing rate $F_{AR}$, is provided below. After reading the description herein, one skilled in the relevant art(s) will understand how to determine appropriate aliasing rates for EM signals, including ones in addition to the modulated carrier signals specifically illustrated herein.

Figure 17:
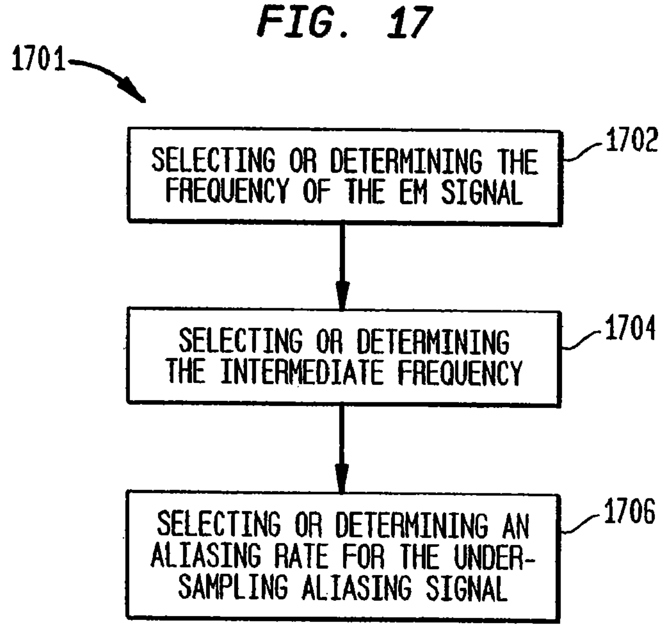
FIG. 17 illustrates a flowchart of an example process for determining an aliasing rate according to an embodiment of the invention.

In FIG. 17, a flowchart 1701 illustrates an example process for determining an aliasing rate $F_{AR}$. But a designer may choose, or an application may dictate, that the values be determined in an order that is different than the illustrated order. The process begins at step 1702, which includes determining, or selecting, the frequency of the EM signal. The frequency of the FM carrier signal 616 can be, for example, 901 MHZ.

Step 1704 includes determining, or selecting, the intermediate frequency. This is the frequency to which the EM signal will be down-converted. The intermediate frequency can be determined, or selected, to match a frequency requirement of a down-stream demodulator. The intermediate frequency can be, for example, 1 MHZ.

Step 1706 includes determining the aliasing rate or rates that will down-convert the EM signal to the IF specified in step 1704.

EQ. (2) can be rewritten as EQ. (3):

$$n*F_{AR} = F_C \pm F_{IF} \qquad \text{EQ. (3)}$$

Which can be rewritten as EQ. (4):

$$n = (F_C \pm F_R)/F_{AR} \qquad \text{EQ. (4)}$$

or as EQ. (5):

$$F_{AR} = (F_C \pm F_{IF})/n \qquad \text{EQ. (5)}$$

$(F_C \pm F_{IF})$ can be defined as a difference value $F_{DIFF}$, as illustrated in EQ. (6):

$$(F_C \pm F_{IF}) = F_{DIFF} \qquad \text{EQ. (6)}$$

EQ. (4) can be rewritten as EQ. (7):

$$n = F_{DIFF}/F_{AR} \qquad \text{EQ. (7)}$$

From EQ. (7), it can be seen that, for a given n and a constant $F_{AR}$, $F_{DIFF}$ is constant. For the case of $F_{DIFF}=F_C-F_{IF}$, and for a constant $F_{DIFF}$, as $F_C$ increases, $F_{IF}$ necessarily increases. For the case of $F_{DIFF}=F_C \pm F_{IF}$, and for a constant $F_{DIFF}$, as $F_C$ increases, $F_{IF}$ necessarily decreases. In the latter case of $F_{DIFF}=F_C \pm F_{IF}$, any phase or frequency changes on $F_C$ correspond to reversed or inverted phase or frequency changes on $F_{DIFF}$. This is mentioned to teach the reader that if $F_{DIFF}=F_C+F_{IF}$ is used, the above effect will affect the phase and frequency response of the modulated intermediate signal $F_{IF}$.

EQs. (2) through (7) can be solved for any valid n. A suitable n can be determined for any given difference frequency $F_{DIFF}$ and for any desired aliasing rate $F_{AR(Desired)}$. EQs. (2) through (7) can be utilized to identify a specific harmonic closest to a desired aliasing rate $F_{AR(Desired)}$ that will generate the desired intermediate signal $F_{IF}$.

An example is now provided for determining a suitable n for a given difference frequency $F_{DIFF}$ and for a desired aliasing rate $F_{AR(Desired)}$. For ease of illustration, only the case of $(F_C-F_{IF})$ is illustrated in the example below.

$$n = (F_C - F_{IF})/F_{AR(Desired)} = F_{DIFF}/F_{AR(Desired)}$$

The desired aliasing rate $F_{AR(Desired)}$ can be, for example, 140 MHZ. Using the previous examples, where the carrier frequency is 901 MHZ and the IF is 1 MHZ, an initial value of n is determined as:

$$n = (901\text{ MHZ} - 1\text{ MHZ})/140\text{ MHZ} = 900/140 = 6.4$$

The initial value 6.4 can be rounded up or down to the valid nearest n, which was defined above as including (0.5, 1, 2, 3, . . . ). In this example, 6.4 is rounded down to 6.0, which is inserted into EQ. (5) for the case of $(F_C-F_{IF})=F_{DIFF}$:

$$F_{AR} = (F_C - F_{IF})/n$$

$$F_{AR} = ((901\text{ MHZ} - 1\text{ MHZ})/6) - (900\text{ MHZ}/6) = 150\text{ MHZ}$$

In other words, under-sampling a 901 MHZ EM carrier signal at 150 MHZ generates an intermediate signal at 1 MHZ. When the under-sampled EM carrier signal is a modulated carrier signal, the intermediate signal will also substantially include the modulation. The modulated intermediate signal can be demodulated through any conventional demodulation technique.

Alternatively, instead of starting from a desired aliasing rate, a list of suitable aliasing rates can be determined from the modified form of EQ. (5), by solving for various values of n. Example solutions are listed below.

$$F_{AR} = ((F_C - F_{IF}) = (F_{DIFF} = ((901\text{ MHZ} - 1\text{ MHZ})/n) = (900\text{ MHZ}/n)$$

Figure 25A:
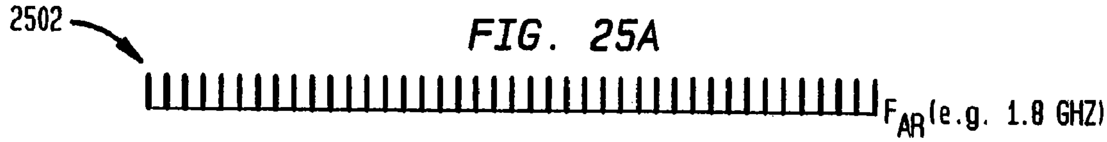
FIGS. 25A-H illustrate example aliasing signals at various aliasing rates according to embodiments of the invention.
Figure 25B:
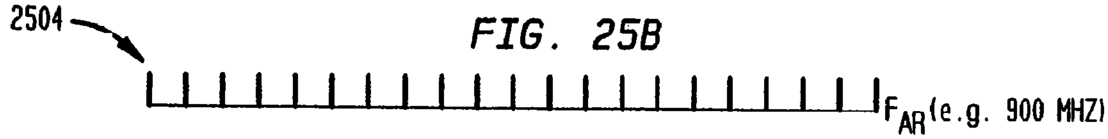
Figure 25C:
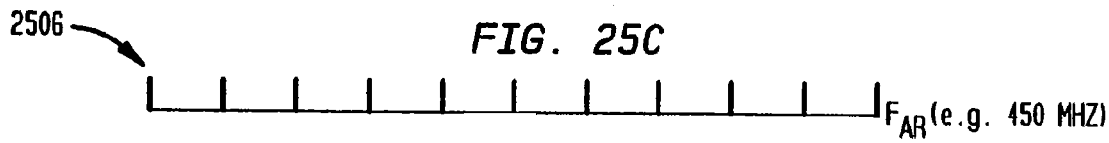
Figure 25D:
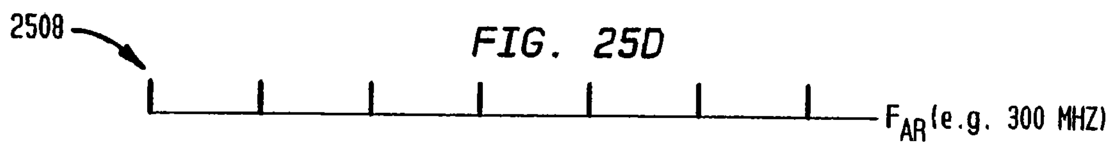
Figure 25E:
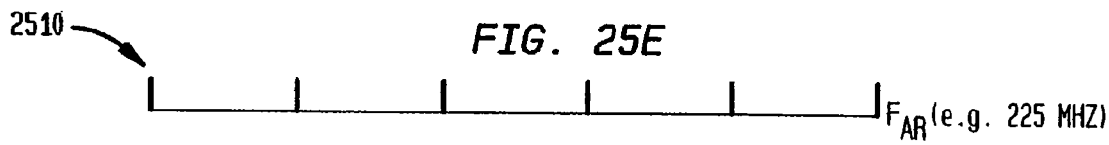
Figure 25F:
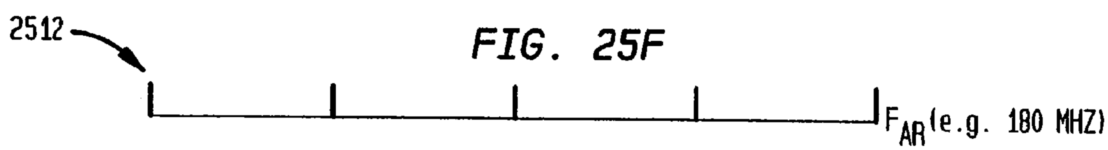
Figure 25G:
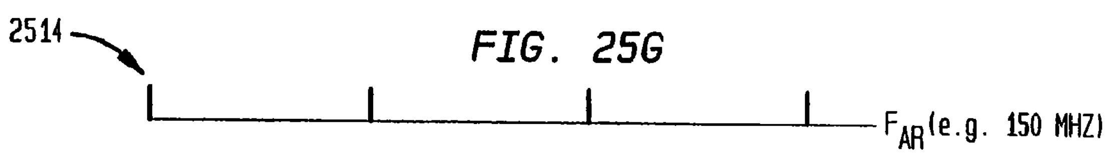
Figure 25H:
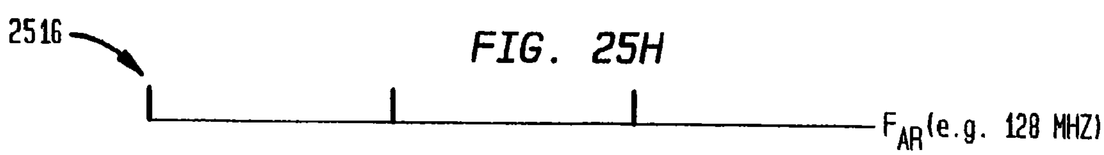

Solving for n=0.5, 1, 2, 3, 4, 5 and 6:

900 MHZ/0.5=1.8 GHZ (i.e., second harmonic, illustrated in FIG. 25A as 2502);

900 MHZ/1=900 MHZ (i.e., fundamental frequency, illustrated in FIG. 25B as 2504);

900 MHZ/2=450 MHZ (i.e., second sub-harmonic, illustrated in FIG. 25C as 2506);

900 MHZ/3=300 MHZ (i.e., third sub-harmonic, illustrated in FIG. 25D as 2508);

900 MHZ/4=225 MHZ (i.e., fourth sub-harmonic, illustrated in FIG. 25E as 2510);

900 MHZ/15=180 MHZ (i.e., fifth sub-harmonic, illustrated in FIG. 25F as 2512); and 900 MHZ/6=150 MHZ (i.e., sixth sub-harmonic, illustrated in FIG. 25G as 2514).

The steps described above can be performed for the case of ($F_C+F_{IF}$) in a similar fashion. The results can be compared to the results obtained from the case of ($F_C-F_{IF}$) to determine which provides better result for an application.

In an embodiment, the invention down-converts an EM signal to a relatively standard IF in the range of, for example, 100 KHZ to 200 MHZ. In another embodiment, referred to herein as a small off-set implementation, the invention down-converts an EM signal to a relatively low frequency of, for example, less than 100 KHZ. In another embodiment, referred to herein as a large off-set implementation, the invention down-converts an EM signal to a relatively higher IF signal, such as, for example, above 200 MHZ.

The various off-set implementations provide selectivity for different applications. Generally, lower data rate applications can operate at lower intermediate frequencies. But higher intermediate frequencies can allow more information to be supported for a given modulation technique.

In accordance with the invention, a designer picks an optimum information bandwidth for an application and an optimum intermediate frequency to support the baseband signal. The intermediate frequency should be high enough to support the bandwidth of the modulating baseband signal $F_{MB}$.

Generally, as the aliasing rate approaches a harmonic or sub-harmonic frequency of the EM signal, the frequency of the down-converted IF signal decreases. Similarly, as the aliasing rate moves away from a harmonic or sub-harmonic frequency of the EM signal, the IF increases.

Aliased frequencies occur above and below every harmonic of the aliasing frequency. In order to avoid mapping other aliasing frequencies in the band of the aliasing frequency (IF) of interest, the IF of interest is preferably not near one half the aliasing rate.

As described in example implementations below, an aliasing module, including a universal frequency translator (UFT) module built in accordance with the invention, provides a wide range of flexibility in frequency selection and can thus be implemented in a wide range of applications. Conventional systems cannot easily offer, or do not allow, this level of flexibility in frequency selection.

1.1.2 Structural Description

Figure 16:
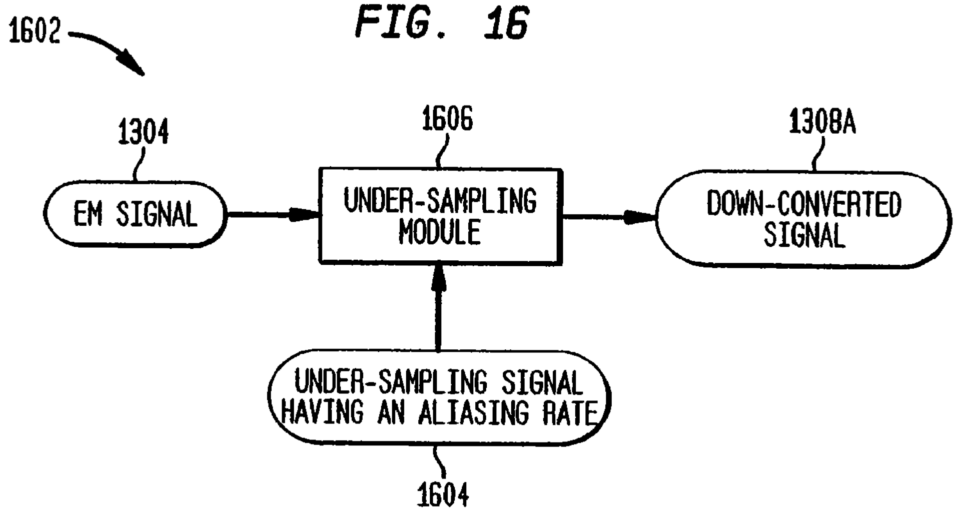
FIG. 16 illustrates a structural block diagram of an under-sampling system according to an embodiment of the invention.

FIG. 16 illustrates a block diagram of an under-sampling system 1602 according to an embodiment of the invention. The under-sampling system 1602 is an example embodiment of the generic aliasing system 1302 in FIG. 13. The under-sampling system 1602 includes an under-sampling module 1606. The under-sampling module 1606 receives the EM signal 1304 and an under-sampling signal 1604, which includes under-sampling pulses having negligible apertures that tend towards zero time, occurring at a frequency equal to the aliasing rate $F_{AR}$. The under-sampling signal 1604 is an example embodiment of the aliasing signal 1310. The under-sampling module 1606 under-samples the EM signal 1304 at the aliasing rate $F_{AR}$ Of the under-sampling signal 1604. The under-sampling system 1602 outputs a down-converted signal 1308A.

Preferably, the under-sampling module 1606 under-samples the EM signal 1304 to down-convert it to the intermediate signal $F_{IF}$ in the manner shown in the operational flowchart 1407 of FIG. 14B. But it should be understood that the scope and spirit of the invention includes other structural embodiments for performing the steps of the flowchart 1407. The specifics of the other structural embodiments will be apparent to persons skilled in the relevant art(s) based on the discussion contained herein. In an embodiment, the aliasing rate $F_{AR}$ of the under-sampling signal 1604 is chosen in the manner discussed in Section II.1.1.1 so that the under-sampling module 1606 under-samples the EM carrier signal 1304 generating the intermediate frequency $F_{IF}$.

The operation of the under-sampling system 1602 is now described with reference to the flowchart 1407 and to the timing diagrams in FIGS. 15A-D. In step 1408, the under-sampling module 1606 receives the AM signal 616 (FIG. 15A). In step 1410, the under-sampling module 1606 receives the under-sampling signal 1502 (FIG. 15B). In step 1412, the under-sampling module 1606 under-samples the AM carrier signal 616 at the aliasing rate of the under-sampling signal 1502, or a multiple thereof, to down-convert the AM carrier signal 616 to the intermediate signal 1506 (FIG. 15D).

Example implementations of the under-sampling module 1606 are provided in Sections 4 and 5 below.

1.1 Example Embodiments

Various embodiments related to the method(s) and structure(s) described above are presented in this section (and its subsections). These embodiments are described herein for purposes of illustration, and not limitation. The invention is not limited to these embodiments. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

The method for down-converting the EM signal 1304 to the intermediate signal $F_{IF}$, illustrated in the flowchart 1407 of FIG. 14B, can be implemented with any type of EM signal, including unmodulated EM carrier signals and modulated carrier signals including, but not limited to, AM, FM, PM, etc., or any combination thereof. Operation of the flowchart 1407 of FIG. 14B is described below for AM, FM and PM carrier signals. The exemplary descriptions below are intended to facilitate an understanding of the present invention. The present invention is not limited to or by the exemplary embodiments below.

1.2.1 First Example Embodiment Amplitude Modulation 1.2.1.1 Operational Description Operation of the exemplary process of the flowchart 1407 in FIG. 14B is described below for the analog AM carrier signal 516, illustrated in FIG. 5C, and for the digital AM carrier signal 616, illustrated in FIG. 6C.

1.2.1.1.1 Analog AM Carrier Signal

A process for down-converting the analog AM carrier signal 516 in FIG. 5C to an analog AM intermediate signal is now described with reference to the flowchart 1407 in FIG. 14B. The analog AM carrier signal 516 is re-illustrated in FIG. 19A for convenience. For this example, the analog AM carrier signal 516 oscillates at approximately 901 MHZ. In FIG. 19B, an analog AM carrier signal 1904 illustrates a portion of the analog AM carrier signal 516 on an expanded time scale.

The process begins at step 1408, which includes receiving the EM signal. This is represented by the analog AM carrier signal 516 in FIG. 19A.

Step 1410 includes receiving an under-sampling signal having an aliasing rate $F_{AR}$. FIG. 19C illustrates an example under-sampling signal 1906 on approximately the same time scale as FIG. 19B. The under-sampling signal 1906 includes a train of pulses 1907 having negligible apertures that tend towards zero time in duration. The pulses 1907 repeat at the aliasing rate, or pulse repetition rate, which is determined or selected as previously described. Generally, when down-converting to an intermediate signal, the aliasing rate $F_{AR}$ is substantially equal to a harmonic or, more typically, a sub-harmonic of the difference frequency $F_{DIFF}$. For this example, the aliasing rate is approximately 450 MHZ.

Step 1412 includes under-sampling the EM signal at the aliasing rate to down-convert the EM signal to the intermediate signal $F_{IF}$. Step 1412 is illustrated in FIG. 19B by under-sample points 1905.

Because a harmonic of the aliasing rate is off-set from the AM carrier signal 516, the under-sample points 1905 "walk through" the analog AM carrier signal 516. In this example, the under-sample points 1905 "walk through" the analog AM carrier signal 516 at approximately a one megahertz rate. In other words, the under-sample points 1905 occur at different locations on subsequent cycles of the AM carrier signal 516. As a result, the under-sample points 1905 capture varying amplitudes of the analog AM signal 516. For example, under-sample point 1905A has a larger amplitude than under-sample point 1905B.

Figure 19A:
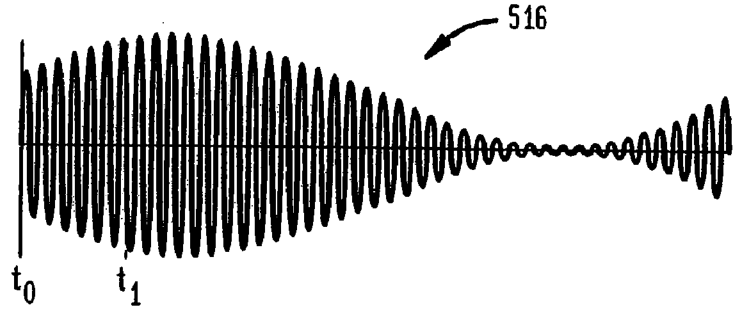
FIGS. 19A-E illustrate example signal diagrams associated with down-converting an analog AM signal to an intermediate frequency signal by under-sampling according to embodiments of the invention.
Figure 19B:
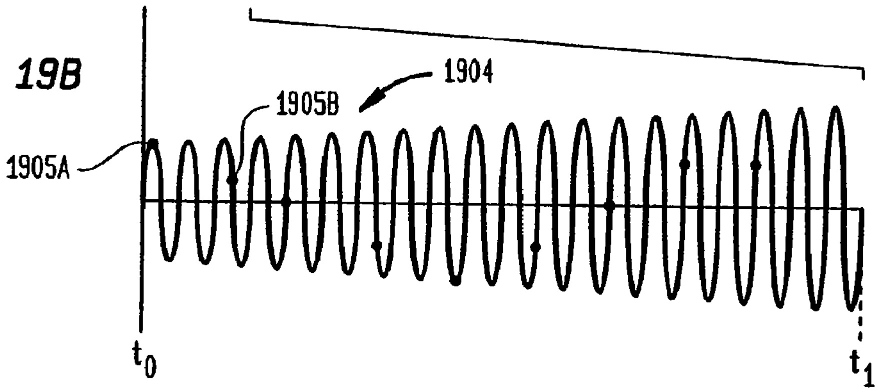
Figure 19C:
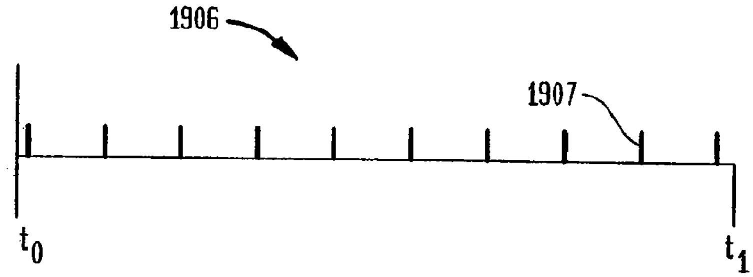
Figure 19D:
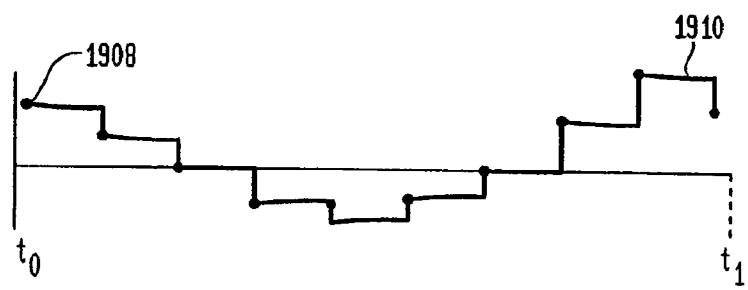

In FIG. 19D, the under-sample points 1905 correlate to voltage points 1908. In an embodiment, the voltage points 1908 form an analog AM intermediate signal 1910. This can be accomplished in many ways. For example, each voltage point 1908 can be held at a relatively constant level until the next voltage point is received. This results in a stair-step output which can be smoothed or filtered if desired, as discussed below.

Figure 19E:
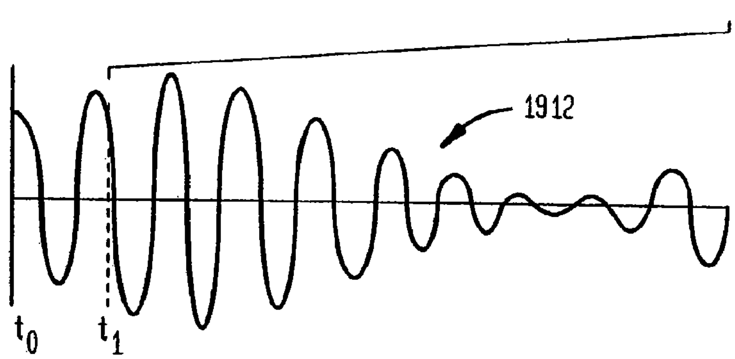

In FIG. 19E, an AM intermediate signal 1912 represents the AM intermediate signal 1910, after filtering, on a compressed time scale. Although FIG. 19E illustrates the AM intermediate signal 1912 as a filtered output signal, the output signal does not need to be filtered or smoothed to be within the scope of the invention. Instead, the output signal can be tailored for different applications.

The AM intermediate signal 1912 is substantially similar to the AM carrier signal 516, except that the AM intermediate signal 1912 is at the 1 MHZ intermediate frequency. The AM intermediate signal 1912 can be demodulated through any conventional AM demodulation technique.

The drawings referred to herein illustrate frequency down-conversion in accordance with the invention. For example, the AM intermediate signal 1910 in FIG. 19D and the AM intermediate signal 1912 in FIG. 19E illustrate that the AM carrier signal 516 was successfully down-converted to an intermediate signal by retaining enough baseband information for sufficient reconstruction.

1.2.1.1.2 Digital AM Carrier Signal

Figures 18A, 18B, 18C, 18D, 18E:
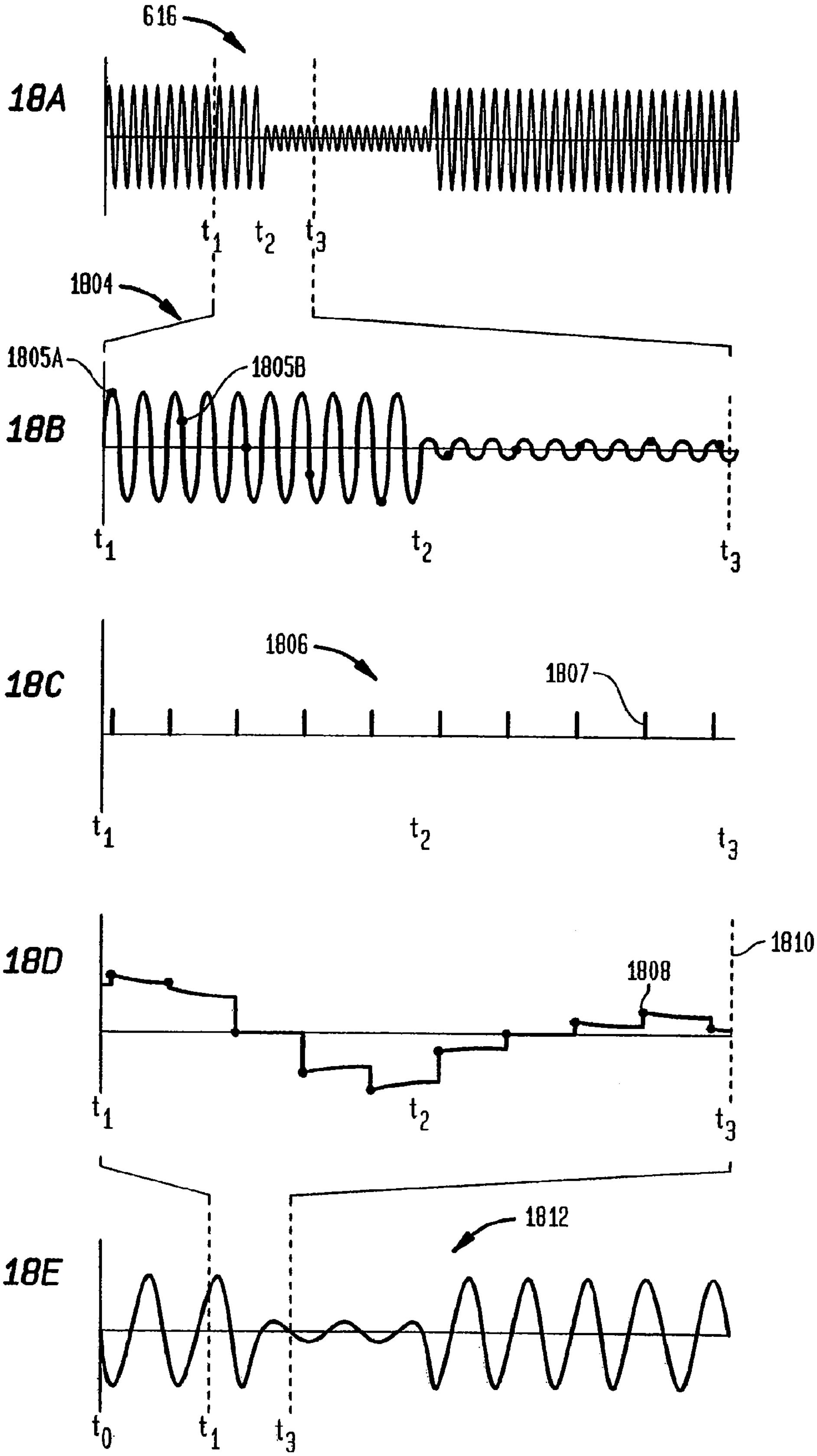
FIGS. 18A-E illustrate example signal diagrams associated with down-converting a digital AM signal to an intermediate frequency signal by under-sampling according to embodiments of the invention.

A process for down-converting the digital AM carrier signal 616 in FIG. 6C to a digital AM intermediate signal is now described with reference to the flowchart 1407 in FIG. 14B. The digital AM carrier signal 616 is re-illustrated in FIG. 18A for convenience. For this example, the digital AM carrier signal 616 oscillates at approximately 901 MHZ. In FIG. 18B, an AM carrier signal 1804 illustrates a portion of the AM signal 616, from time t0 to t1, on an expanded time scale.

The process begins at step 1408, which includes receiving an EM signal. This is represented by the AM signal 616 in FIG. 18A.

Step 1410 includes receiving an under-sampling signal having an aliasing rate $F_{AR}$. FIG. 18C illustrates an example under-sampling signal 1806 on approximately the same time scale as FIG. 18B. The under-sampling signal 1806 includes a train of pulses 1807 having negligible apertures that tend towards zero time in duration. The pulses 1807 repeat at the aliasing rate, or pulse repetition rate, which is determined or selected as previously described. Generally, when down-converting to an intermediate signal, the aliasing rate $F_{AR}$ is substantially equal to a harmonic or, more typically, a sub-harmonic of the difference frequency $F_{DIFF}$. For this example, the aliasing rate is approximately 450 MHZ.

Step 1412 includes under-sampling the EM signal at the aliasing rate to down-convert the EM signal to the intermediate signal $F_{IF}$. Step 1412 is illustrated in FIG. 18B by under-sample points 1805.

Because a harmonic of the aliasing rate is off-set from the AM carrier signal 616, the under-sample points 1805 walk through the AM carrier signal 616. In other words, the under-sample points 1805 occur at different locations of subsequent cycles of the AM signal 616. As a result, the under-sample points 1805 capture various amplitudes of the AM signal 616. In this example, the under-sample points 1805 walk through the AM carrier signal 616 at approximately a 1 MHZ rate. For example, under-sample point 1805A has a larger amplitude than under-sample point 1805B.

In FIG. 18D, the under-sample points 1805 correlate to voltage points 1808. In an embodiment, the voltage points 1805 form an AM intermediate signal 1810. This can be accomplished in many ways. For example, each voltage point 1808 can be held at a relatively constant level until the next voltage point is received. This results in a stair-step output which can be smoothed or filtered if desired, as discussed below.

In FIG. 18E, an AM intermediate signal 1812 represents the AM intermediate signal 1810, after filtering, on a compressed time scale. Although FIG. 18E illustrates the AM intermediate signal 1812 as a filtered output signal, the output signal does not need to be filtered or smoothed to be within the scope of the invention. Instead, the output signal can be tailored for different applications.

The AM intermediate signal 1812 is substantially similar to the AM carrier signal 616, except that the AM intermediate signal 1812 is at the 1 MHZ intermediate frequency. The AM intermediate signal 1812 can be demodulated through any conventional AM demodulation technique.

The drawings referred to herein illustrate frequency down-conversion in accordance with the invention. For example, the AM intermediate signal 1810 in FIG. 18D and the AM intermediate signal 1812 in FIG. 18E illustrate that the AM carrier signal 616 was successfully down-converted to an intermediate signal by retaining enough baseband information for sufficient reconstruction.

1.2.1.2 Structural Description

The operation of the under-sampling system 1602 is now described for the analog AM carrier signal 516, with reference to the flowchart 1407 and to the timing diagrams of FIGS. 19A-E. In step 1408, the under-sampling module 1606 receives the AM carrier signal 516 (FIG. 19A). In step 1410, the under-sampling module 1606 receives the under-sampling signal 1906 (FIG. 19C). In step 1412, the under-sampling module 1606 under-samples the AM carrier signal 516 at the aliasing rate of the under-sampling signal 1906 to down-convert it to the AM intermediate signal 1912 (FIG. 19E).

The operation of the under-sampling system 1602 is now described for the digital AM carrier signal 616, with reference to the flowchart 1407 and to the timing diagrams of FIGS. 18A-E. In step 1408, the under-sampling module 1606 receives the AM carrier signal 616 (FIG. 18A). In step 1410, the under-sampling module 1606 receives the under-sampling signal 1806 (FIG. 18C). In step 1412, the under-sampling module 1606 under-samples the AM carrier signal 616 at the aliasing rate of the under-sampling signal 1806 to down-convert it to the AM intermediate signal 1812 (FIG. 18E).

Example implementations of the under-sampling module 1606 are provided in Sections 4 and 5 below.

1.2.2 Second Example Embodiment Frequency Modulation 1.2.2.1 Operational Description Operation of the exemplary process of the flowchart 1407 in FIG. 14B is described below for the analog FM carrier signal 716, illustrated in FIG. 7C, and for the digital FM carrier signal 816, illustrated in FIG. 8C.

1.2.2.1.1 Analog FM Carrier Signal

Figure 20A:
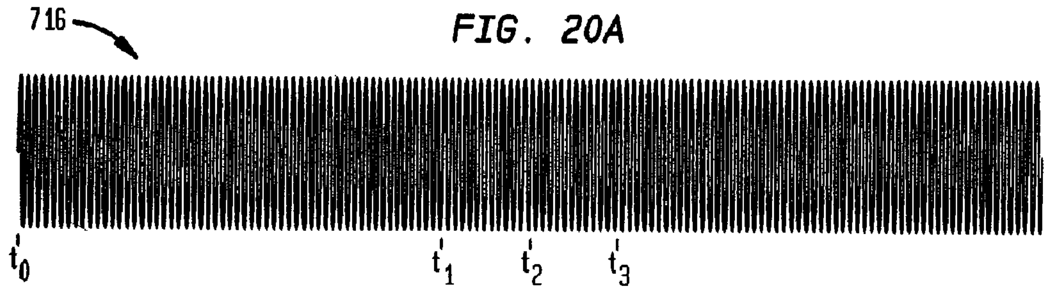
FIGS. 20A-E illustrate example signal diagrams associated with down-converting an analog FM signal to an intermediate frequency signal by under-sampling according to embodiments of the invention.
Figure 20B:
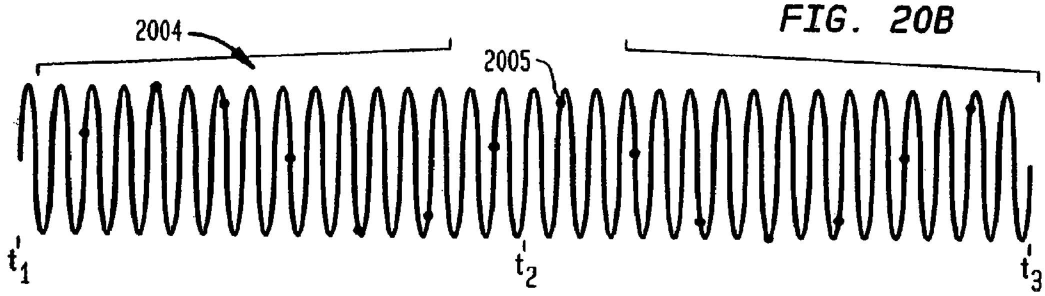

A process for down-converting the analog FM carrier signal 716 to an analog FM intermediate signal is now described with reference to the flowchart 1407 in FIG. 14B. The analog FM carrier signal 716 is re-illustrated in FIG. 20A for convenience. For this example, the analog FM carrier signal 716 oscillates at approximately 901 MHZ. In FIG. 20B, an FM carrier signal 2004 illustrates a portion of the analog FM carrier signal 716, from time t1 to t3, on an expanded time scale.

The process begins at step 1408, which includes receiving an EM signal. This is represented in FIG. 20A by the FM carrier signal 716.

Figure 20C:
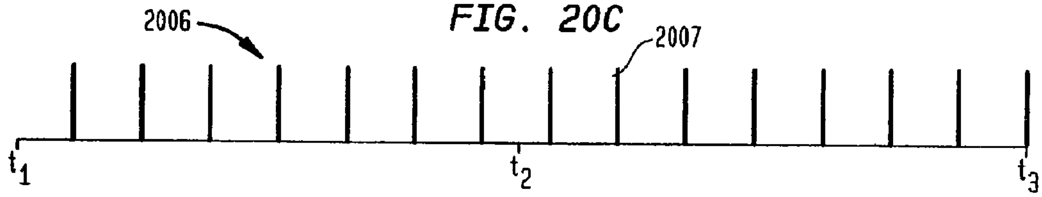

Step 1410 includes receiving an under-sampling signal having an aliasing rate $F_{AR}$. FIG. 20C illustrates an example under-sampling signal 2006 on approximately the same time scale as FIG. 20B. The under-sampling signal 2006 includes a train of pulses 2007 having negligible apertures that tend towards zero time in duration. The pulses 2007 repeat at the aliasing-rate or pulse repetition rate, which is determined or selected as previously described. Generally, when down-converting to an intermediate signal, the aliasing rate $F_{AR}$ is substantially equal to a harmonic or, more typically, a sub-harmonic of the difference frequency $F_{DIFF}$. For this example, where the FM carrier signal 716 is centered around 901 MHZ, the aliasing rate is approximately 450 MHZ.

Step 1412 includes under-sampling the EM signal at the aliasing rate to down-convert the EM signal to the intermediate signal $F_{IF}$. Step 1412 is illustrated in FIG. 20B by under-sample points 2005.

Because a harmonic of the aliasing rate is off-set from the FM carrier signal 716, the under-sample points 2005 occur at different locations of subsequent cycles of the under-sampled signal 716. In other words, the under-sample points 2005 walk through the signal 716. As a result, the under-sample points 2005 capture various amplitudes of the FM carrier signal 716.

Figure 20D:
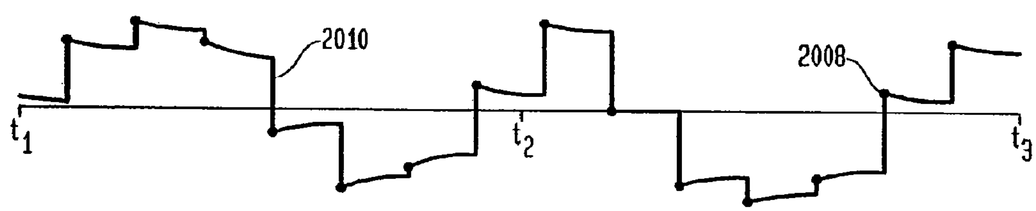

In FIG. 20D, the under-sample points 2005 correlate to voltage points 2008. In an embodiment, the voltage points 2005 form an analog FM intermediate signal 2010. This can be accomplished in many ways. For example, each voltage point 2008 can be held at a relatively constant level until the next voltage point is received. This results in a stair-step output which can be smoothed or filtered if desired, as discussed below.

Figure 20E:
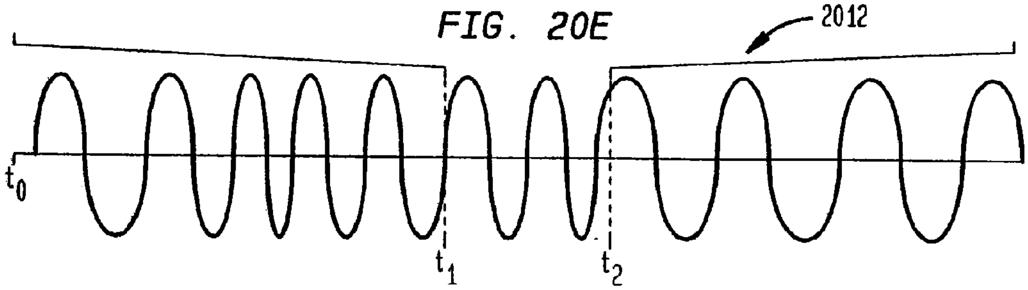

In FIG. 20E, an FM intermediate signal 2012 illustrates the FM intermediate signal 2010, after filtering, on a compressed time scale. Although FIG. 20E illustrates the FM intermediate signal 2012 as a filtered output signal, the output signal does not need to be filtered or smoothed to be within the scope of the invention. Instead, the output signal can be tailored for different applications.

The FM intermediate signal 2012 is substantially similar to the FM carrier signal 716, except that the FM intermediate signal 2012 is at the 1 MHZ intermediate frequency. The FM intermediate signal 2012 can be demodulated through any conventional FM demodulation technique.

The drawings referred to herein illustrate frequency down-conversion in accordance with the invention. For example, the FM intermediate signal 2010 in FIG. 20D and the FM intermediate signal 2012 in FIG. 20E illustrate that the FM carrier signal 716 was successfully down-converted to an intermediate signal by retaining enough baseband information for sufficient reconstruction.

1.2.2.1.2 Digital FM Carrier Signal

Figure 21A:
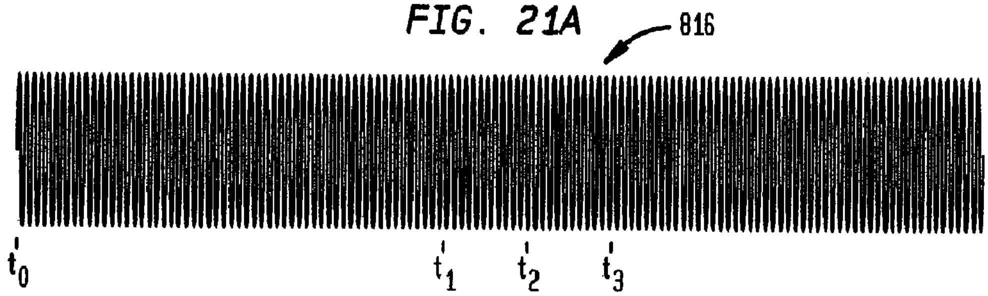
FIGS. 21A-E illustrate example signal diagrams associated with down-converting a digital FM signal to an intermediate frequency signal by under-sampling according to embodiments of the invention.
Figure 21B:
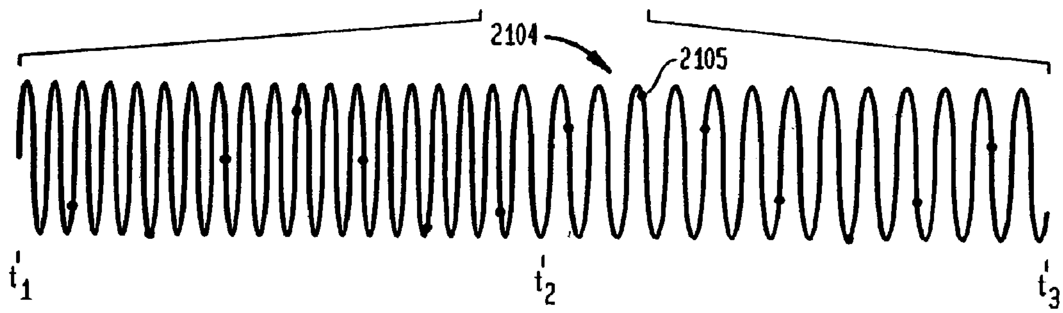

A process for down-converting the digital FM carrier signal 816 to a digital FM intermediate signal is now described with reference to the flowchart 1407 in FIG. 14B. The digital FM carrier signal 816 is re-illustrated in FIG. 21A for convenience. For this example, the digital FM carrier signal 816 oscillates at approximately 901 MHZ. In FIG. 21B, an FM carrier signal 2104 illustrates a portion of the FM carrier signal 816, from time t1 to t3, on an expanded time scale.

The process begins at step 1408, which includes receiving an EM signal. This is represented in FIG. 21A, by the FM carrier signal 816.

Figure 21C:
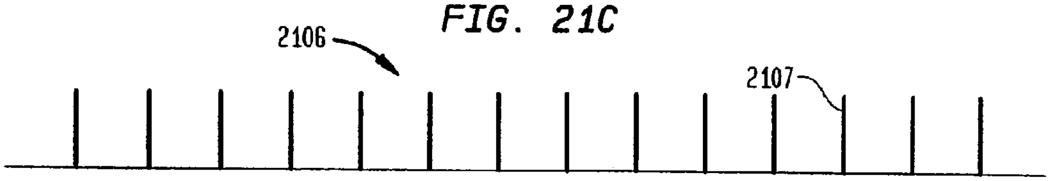

Step 1410 includes receiving an under-sampling signal having an aliasing rate $F_{AR}$. FIG. 21C illustrates an example under-sampling signal 2106 on approximately the same time scale as FIG. 21B. The under-sampling signal 2106 includes a train of pulses 2107 having negligible apertures that tend toward zero time in duration. The pulses 2107 repeat at the aliasing rate, or pulse repetition rate, which is determined or selected as previously described. Generally, when down-converting to an intermediate signal, the aliasing rate $F_{AR}$ is substantially equal to a harmonic or, more typically, a sub-harmonic of the difference frequency $F_{DIFF}$. In this example, where the FM carrier signal 816 is centered around 901 MHZ, the aliasing rate is selected as approximately 450 MHZ, which is a sub-harmonic of 900 MHZ, which is off-set by 1 MHZ from the center frequency of the FM carrier signal 816.

Step 1412 includes under-sampling the EM signal at the aliasing rate to down-convert the EM signal to an intermediate signal $F_{IF}$. Step 1412 is illustrated in FIG. 21B by under-sample points 2105.

Because a harmonic of the aliasing rate is off-set from the FM carrier signal 816, the under-sample points 2105 occur at different locations of subsequent cycles of the FM carrier signal 816. In other words, the under-sample points 2105 walk through the signal 816. As a result, the under-sample points 2105 capture various amplitudes of the signal 816.

Figure 21D:
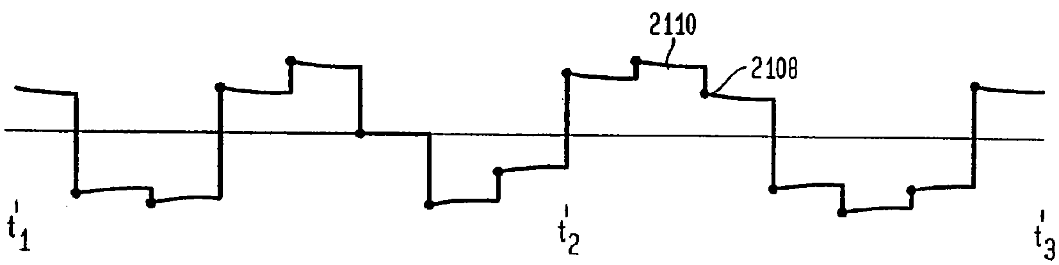

In FIG. 21D, the under-sample points 2105 correlate to voltage points 2108. In an embodiment, the voltage points 2108 form a digital FM intermediate signal 2110. This can be accomplished in many ways. For example, each voltage point 2108 can be held at a relatively constant level until the next voltage point is received. This results in a stair-step output which can be smoothed or filtered if desired, as described below.

Figure 21E:
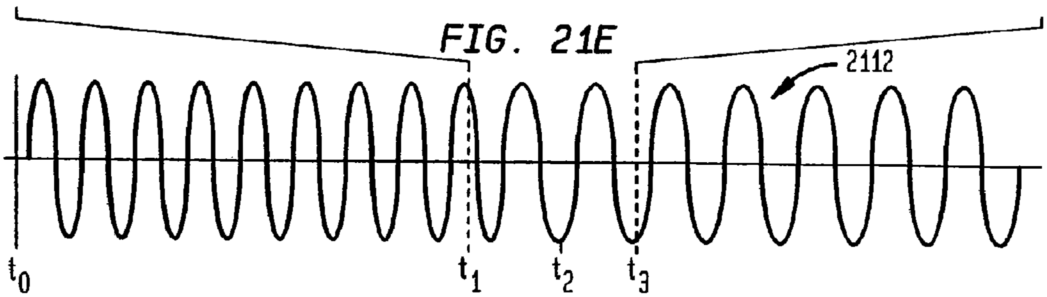

In FIG. 21E, an FM intermediate signal 2112 represents the FM intermediate signal 2110, after filtering, on a compressed time scale. Although FIG. 21E illustrates the FM intermediate signal 2112 as a filtered output signal, the output signal does not need to be filtered or smoothed to be within the scope of the invention. Instead, the output signal can be tailored for different applications.

The FM intermediate signal 2112 is substantially similar to the FM carrier signal 816, except that the FM intermediate signal 2112 is at the 1 MHZ intermediate frequency. The FM intermediate signal 2112 can be demodulated through any conventional FM demodulation technique.

The drawings referred to herein illustrate frequency down-conversion in accordance with the invention. For example, the FM intermediate signal 2110 in FIG. 21D and the FM intermediate signal 2112 in FIG. 21E illustrate that the FM carrier signal 816 was successfully down-converted to an intermediate signal by retaining enough baseband information for sufficient reconstruction.

1.2.2.2 Structural Description

The operation of the under-sampling system 1602 is now described for the analog FM carrier signal 716, with reference to the flowchart 1407 and the timing diagrams of FIGS. 20A-E. In step 1408, the under-sampling module 1606 receives the FM carrier signal 716 (FIG. 20A). In step 1410, the under-sampling module 1606 receives the under-sampling signal 2006 (FIG. 20C). In step 1412, the under-sampling module 1606 under-samples the FM carrier signal 716 at the aliasing rate of the under-sampling signal 2006 to down-convert the FM carrier signal 716 to the FM intermediate signal 2012 (FIG. 20E).

The operation of the under-sampling system 1602 is now described for the digital FM carrier signal 816, with reference to the flowchart 1407 and the timing diagrams of FIGS. 21A-E. In step 1408, the under-sampling module 1606 receives the FM carrier signal 816 (FIG. 21A). In step 1410, the under-sampling module 1606 receives the under-sampling signal 2106 (FIG. 21C). In step 1412, the under-sampling module 1606 under-samples the FM carrier signal 816 at the aliasing rate of the under-sampling signal 2106 to down-convert the FM carrier signal 816 to the FM intermediate signal 2112 (FIG. 21E).

Example implementations of the under-sampling module 1606 are provided in Sections 4 and 5 below.

1.2.3 Third Example Embodiment Phase Modulation 1.2.3.1 Operational Description

Operation of the exemplary process of the flowchart 1407 in FIG. 14B is described below for the analog PM carrier signal 916, illustrated in FIG. 9C, and for the digital PM carrier signal 1016, illustrated in FIG. 10C.

1.2.3.1.1 Analog PM Carrier Signal

Figure 23A:
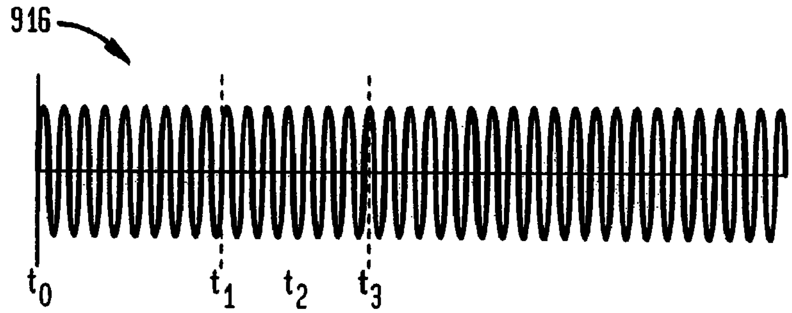
FIGS. 23A-E illustrate example signal diagrams associated with down-converting an analog PM signal to an intermediate frequency signal by under-sampling according to embodiments of the invention.
Figure 23B:
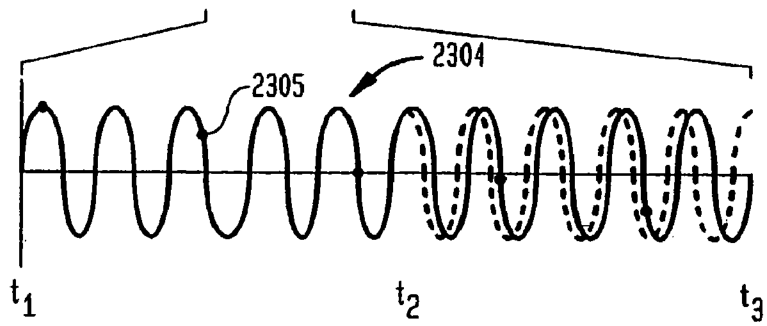

A process for down-converting the analog PM carrier signal 916 to an analog PM intermediate signal is now described with reference to the flowchart 1407 in FIG. 14B. The analog PM carrier signal 916 is re-illustrated in FIG. 23A for convenience. For this example, the analog PM carrier signal 916 oscillates at approximately 901 MHZ. In FIG. 23B, a PM carrier signal 2304 illustrates a portion of the analog PM carrier signal 916, from time t1 to t3, on an expanded time scale.

The process of down-converting the PM carrier signal 916 to a PM intermediate signal begins at step 1408, which includes receiving an EM signal. This is represented in FIG. 23A, by the analog PM carrier signal 916.

Figure 23C:
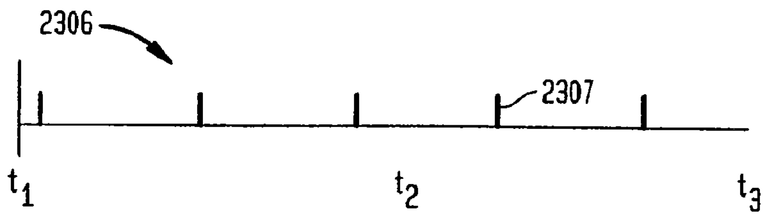

Step 1410 includes receiving an under-sampling signal having an aliasing rate $F_{AR}$. FIG. 23C illustrates an example under-sampling signal 2306 on approximately the same time scale as FIG. 23B. The under-sampling signal 2306 includes a train of pulses 2307 having negligible apertures that tend towards zero time in duration. The pulses 2307 repeat at the aliasing rate, or pulse repetition rate, which is determined or selected as previously described. Generally, when down-converting to an intermediate signal, the aliasing rate $F_{AR}$ is substantially equal to a harmonic or, more typically, a sub-harmonic of the difference frequency $F_{DIFF}$. In this example, the aliasing rate is approximately 450 MHZ.

Step 1412 includes under-sampling the EM signal at the aliasing rate to down-convert the EM signal to the intermediate signal $F_{IF}$. Step 1412 is illustrated in FIG. 23B by under-sample points 2305.

Because a harmonic of the aliasing rate is off-set from the PM carrier signal 916, the under-sample points 2305 occur at different locations of subsequent cycles of the PM carrier signal 916. As a result, the under-sample points capture various amplitudes of the PM carrier signal 916.

Figure 23D:
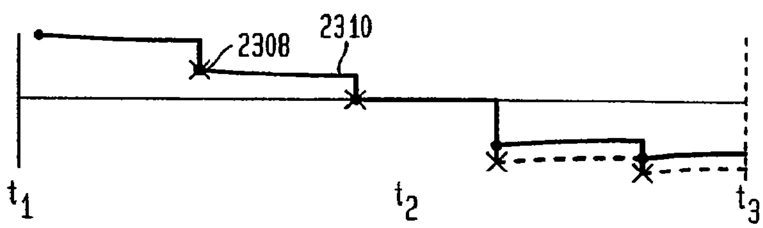

In FIG. 23D, voltage points 2308 correlate to the under-sample points 2305. In an embodiment, the voltage points 2308 form an analog PM intermediate signal 2310. This can be accomplished in many ways. For example, each voltage point 2308 can be held at a relatively constant level until the next voltage point is received. This results in a stair-step output which can be smoothed or filtered if desired, as described below.

Figure 23E:
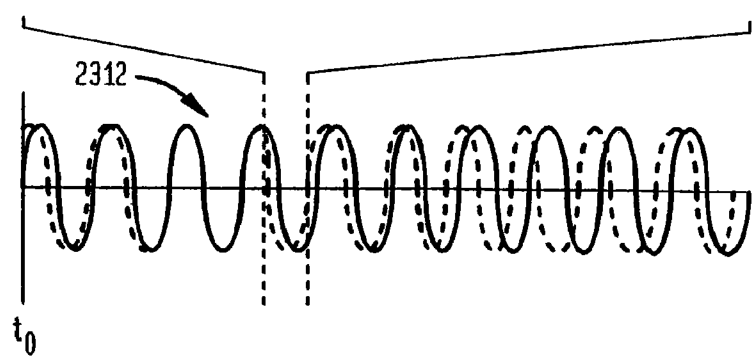

In FIG. 23E, an analog PM intermediate signal 2312 illustrates the analog PM intermediate signal 2310, after filtering, on a compressed time scale. Although FIG. 23E illustrates the PM intermediate signal 2312 as a filtered output signal, the output signal does not need to be filtered or smoothed to be within the scope of the invention. Instead, the output signal can be tailored for different applications.

The analog PM intermediate signal 2312 is substantially similar to the analog PM carrier signal 916, except that the analog PM intermediate signal 2312 is at the 1 MHZ intermediate frequency. The analog PM intermediate signal 2312 can be demodulated through any conventional PM demodulation technique.

The drawings referred to herein illustrate frequency down-conversion in accordance with the invention. For example, the analog PM intermediate signal 2310 in FIG. 23D and the analog PM intermediate signal 2312 in FIG. 23E illustrate that the analog PM carrier signal 2316 was successfully down-converted to an intermediate signal by retaining enough baseband information for sufficient reconstruction.

1.2.3.1.2 Digital PM Carrier Signal

Figure 22A:
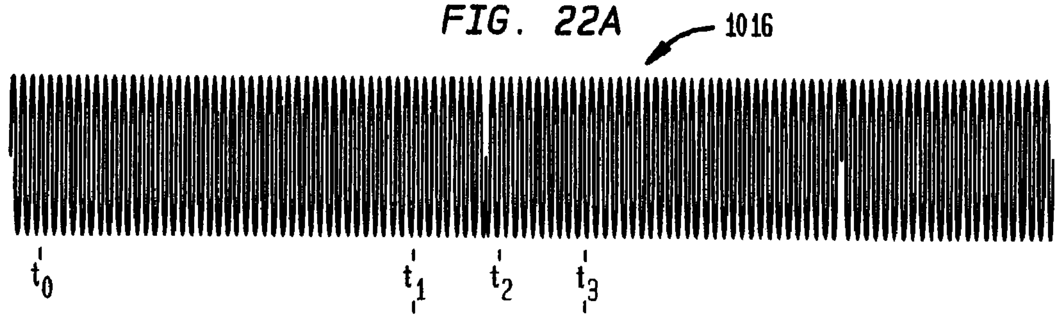
FIGS. 22A-E illustrate example signal diagrams associated with down-converting a digital PM signal to an intermediate frequency signal by under-sampling according to embodiments of the invention.
Figure 22B:
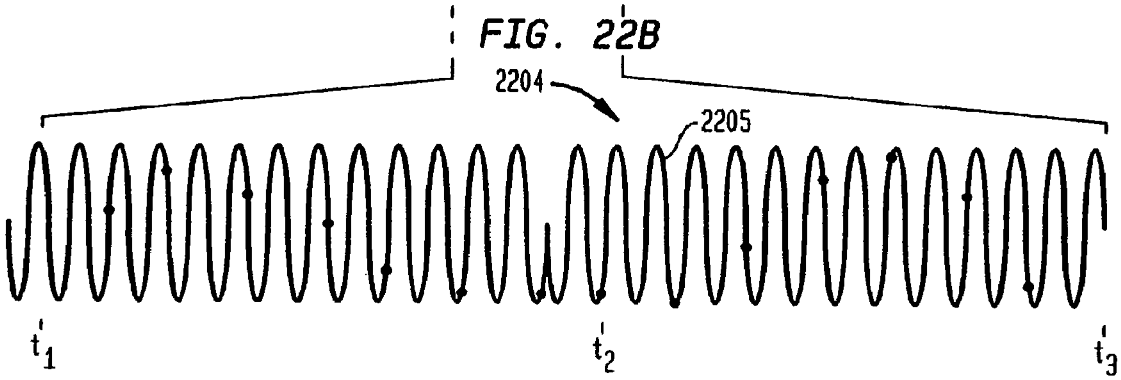

A process for down-converting the digital PM carrier signal 1016 to a digital PM intermediate signal is now described with reference to the flowchart 1407 in FIG. 14B. The digital PM carrier signal 1016 is re-illustrated in FIG. 22A for convenience. For this example, the digital PM carrier signal 1016 oscillates at approximately 901 MHZ. In FIG. 22B, a PM carrier signal 2204 illustrates a portion of the digital PM carrier signal 1016, from time t1 to t3, on an expanded time scale.

The process begins at step 1408, which includes receiving an EM signal. This is represented in FIG. 22A by the digital PM carrier signal 1016.

Figure 22C:
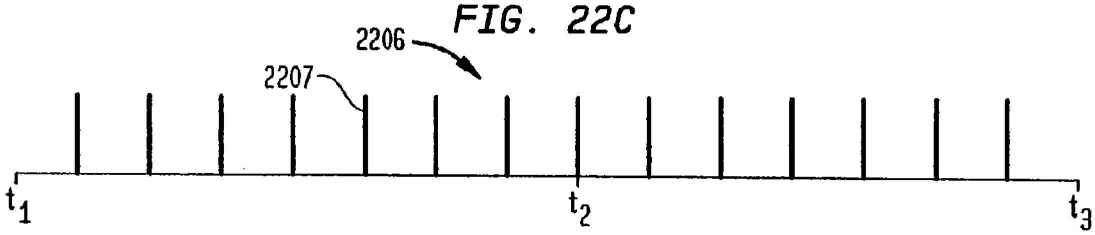

Step 1408 includes receiving an under-sampling signal having an aliasing rate $F_{AR}$. FIG. 22C illustrates example under-sampling signal 2206 on approximately the same time scale as FIG. 22B. The under-sampling signal 2206 includes a train of pulses 2207 having negligible apertures that tend towards zero time in duration. The pulses 2207 repeat at the aliasing rate, or a pulse repetition rate, which is determined or selected as previously described. Generally, when down-converting to an intermediate signal, the aliasing rate $F_{AR}$ is substantially equal to a harmonic or, more typically, a sub-harmonic of the difference frequency $F_{DIFF}$. In this example, the aliasing rate is approximately 450 MHZ.

Step 1412 includes under-sampling the EM signal at the aliasing rate to down-convert the EM signal to an intermediate signal $F_{IF}$. Step 1412 is illustrated in FIG. 22B by under-sample points 2205.

Because a harmonic of the aliasing rate is off-set from the PM carrier signal 1016, the under-sample points 2205 occur at different locations of subsequent cycles of the PM carrier signal 1016.

Figure 22D:
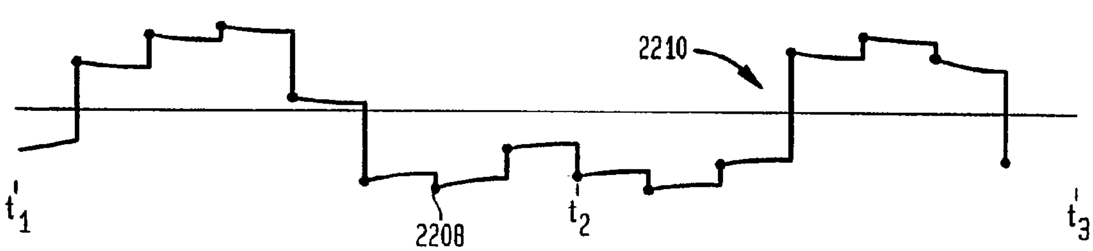

In FIG. 22D, voltage points 2208 correlate to the under-sample points 2205. In an embodiment, the voltage points 2208 form a digital PM intermediate signal 2210. This can be accomplished in many ways. For example, each voltage point 2208 can be held at a relatively constant level until the next voltage point is received. This results in a stair-step output which can be smoothed or filtered if desired, as described below.

Figure 22E:
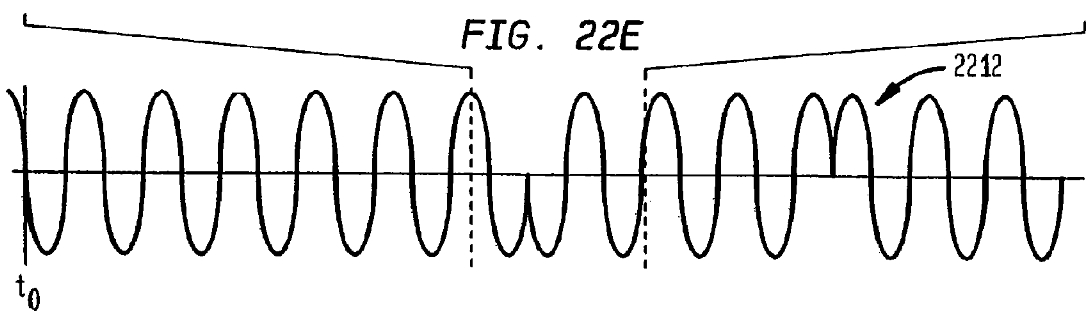

In FIG. 22E, a digital PM intermediate signal 2212 represents the digital PM intermediate signal 2210 on a compressed time scale. Although FIG. 22E illustrates the PM intermediate signal 2212 as a filtered output signal, the output signal does not need to be filtered or smoothed to be within the scope of the invention. Instead, the output signal can be tailored for different applications.

The digital PM intermediate signal 2212 is substantially similar to the digital PM carrier signal 1016, except that the digital PM intermediate signal 2212 is at the 1 MHZ intermediate frequency. The digital PM carrier signal 2212 can be demodulated through any conventional PM demodulation technique.

The drawings referred to herein illustrate frequency down-conversion in accordance with the invention. For example, the digital PM intermediate signal 2210 in FIG. 22D and the digital PM intermediate signal 2212 in FIG. 22E illustrate that the digital PM carrier signal 1016 was successfully down-converted to an intermediate signal by retaining enough baseband information for sufficient reconstruction.

1.2.3.2 Structural Description

The operation of the under-sampling system 1602 is now described for the analog PM carrier signal 916, with reference to the flowchart 1407 and the timing diagrams of FIGS. 23A-E. In step 1408, the under-sampling module 1606 receives the PM carrier signal 916 (FIG. 23A). In step 1410, the under-sampling module 1606 receives the under-sampling signal 2306 (FIG. 23C). In step 1412, the under-sampling module 1606 under-samples the PM carrier signal 916 at the aliasing rate of the under-sampling signal 2306 to down-convert the PM carrier signal 916 to the PM intermediate signal 2312 (FIG. 23E).

The operation of the under-sampling system 1602 is now described for the digital PM carrier signal 1016, with reference to the flowchart 1407 and the timing diagrams of FIGS. 22A-E. In step 1408, the under-sampling module 1606 receives the PM carrier signal 1016 (FIG. 22A). In step 1410, the under-sampling module 1606 receives the under-sampling signal 2206 (FIG. 22C). In step 1412, the under-sampling module 1606 under-samples the PM carrier signal 1016 at the aliasing rate of the under-sampling signal 2206 to down-convert the PM carrier signal 1016 to the PM intermediate signal 2212 (FIG. 22E).

Example implementations of the under-sampling module 1606 are provided in Sections 4 and 5 below.

1.2.4 Other Embodiments

The embodiments described above are provided for purposes of illustration. These embodiments are not intended to limit the invention. Alternate embodiments, differing slightly or substantially from those described herein, will be apparent to persons skilled in the relevant art(s) based on the teachings contained herein. Such alternate embodiments fall within the scope and spirit of the present invention. Example implementations of the under-sampling module 1606 are provided in Sections 4 and 5 below.

1.3 Implementation Examples

Exemplary operational and/or structural implementations related to the method(s), structure(s), and/or embodiments described above are presented in Sections 4 and 5 below. The implementations are presented for purposes of illustration, and not limitation. The invention is not limited to the particular implementation examples described therein. Alternate implementations (including equivalents, extensions, variations, deviations, etc., of those described herein) will be apparent to persons skilled in the relevant art(s) based on the teachings contained herein. Such alternate implementations fall within the scope and spirit of the present invention.

2. Directly Down-Converting an EM Signal to a Baseband Signal (Direct-to-Data)

In an embodiment, the invention directly down-converts an EM signal to a baseband signal, by under-sampling the EM signal. This embodiment is referred to herein as direct-to-data down-conversion and is illustrated in FIG. 45B as 4510.

This embodiment can be implemented with modulated and unmodulated EM signals. This embodiment is described herein using the modulated carrier signal $F_{MC}$ in FIG. 1, as an example. In the example, the modulated carrier signal $F_{MC}$ is directly down-converted to the demodulated baseband signal $F_{DMB}$. Upon reading the disclosure and examples therein, one skilled in the relevant art(s) will understand that the invention is applicable to down-convert any EM signal, including but not limited to, modulated carrier signals and unmodulated carrier signals.

The following sections describe example methods for directly down-converting the modulated carrier signal $F_{MC}$ to the demodulated baseband signal $F_{DMB}$. Exemplary structural embodiments for implementing the methods are also described. It should be understood that the invention is not limited to the particular embodiments described below. Equivalents, extensions, variations, deviations, etc., of the following will be apparent to persons skilled in the relevant art(s) based on the teachings contained herein. Such equivalents, extensions, variations, deviations, etc., are within the scope and spirit of the present invention.

The following sections include a high level discussion, example embodiments, and implementation examples.

2.1 High Level Description

This section (including its subsections) provides a high-level description of directly down-converting the modulated carrier signal $F_{MC}$ to the demodulated baseband signal $F_{DMB}$, according to the invention. In particular, an operational process of directly down-converting the modulated carrier signal $F_{MC}$ to the demodulated baseband signal $F_{DMB}$ is described at a high-level. Also, a structural implementation for implementing this process is described at a high-level. The structural implementation is described herein for illustrative purposes, and is not limiting. In particular, the process described in this section can be achieved using any number of structural implementations, one of which is described in this section. The details of such structural implementations will be apparent to persons skilled in the relevant art(s) based on the teachings contained herein.

2.1.1 Operational Description

FIG. 14C depicts a flowchart 1413 that illustrates an exemplary method for directly down-converting an EM signal to a demodulated baseband signal $F_{DMB}$. The exemplary method illustrated in the flowchart 1413 is an embodiment of the flowchart 1401 in FIG. 14A.

Any and all combinations of modulation techniques are valid for this invention. For ease of discussion, the digital AM carrier signal 616 is used to illustrate a high level operational description of the invention. Subsequent sections provide detailed descriptions for AM and PM example embodiments. FM presents special considerations that are dealt with separately in Section II.3, below. Upon reading the disclosure and examples therein, one skilled in the relevant art(s) will understand that the invention can be implemented to down-convert any type of EM signal, including any form of modulated carrier signal and unmodulated carrier signals.

The method illustrated in the flowchart 1413 is now described at a high level using the digital AM carrier signal 616, from FIG. 6C. The digital AM carrier signal 616 is re-illustrated in FIG. 33A for convenience.

The process of the flowchart 1413 begins at step 1414, which includes receiving an EM signal. Step 1414 is represented by the digital AM carrier signal 616 in FIG. 33A.

Step 1416 includes receiving an under-sampling signal having an aliasing rate $F_{AR}$. FIG. 33B illustrates an example under-sampling signal 3302 which includes a train of pulses 3303 having negligible apertures that tend towards zero time in duration. The pulses 3303 repeat at the aliasing rate or pulse repetition rate. The aliasing rate is determined in accordance with EQ. (2), reproduced below for convenience.

$$F_C=n*F_{AR}\pm F_{IF} \quad \text{EQ. (2)}$$

When directly down-converting an EM signal to baseband (i.e., zero IF), EQ. (2) becomes:

$$F_C=n*F_{AR} \quad \text{EQ. (8)}$$

Thus, to directly down-convert the AM signal 616 to a demodulated baseband signal, the aliasing rate is substantially equal to the frequency of the AM signal 616 or to a harmonic or sub-harmonic thereof. Although the aliasing rate is too low to permit reconstruction of higher frequency components of the AM signal 616 (i.e., the carrier frequency), it is high enough to permit substantial reconstruction of the lower frequency modulating baseband signal 310.

Step 1418 includes under-sampling the EM signal at the aliasing rate to directly down-convert it to the demodulated baseband signal $F_{DMB}$. FIG. 33C illustrates a stair step demodulated baseband signal 3304, which is generated by the direct down-conversion process. The demodulated baseband signal 3304 is similar to the digital modulating baseband signal 310 in FIG. 3.

Figure 33A:
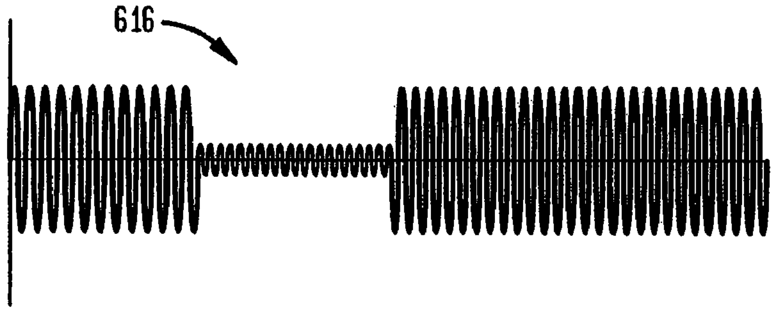
FIGS. 33A-D illustrate example signal diagrams associated with direct down-conversion of an EM signal to a baseband signal by under-sampling according to embodiments of the present invention.
Figure 33B:
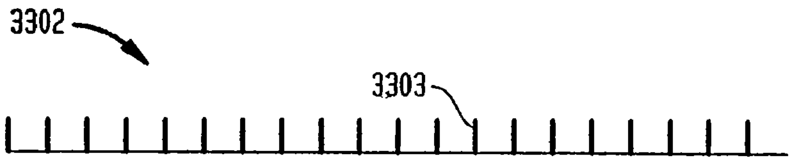
Figure 33C:
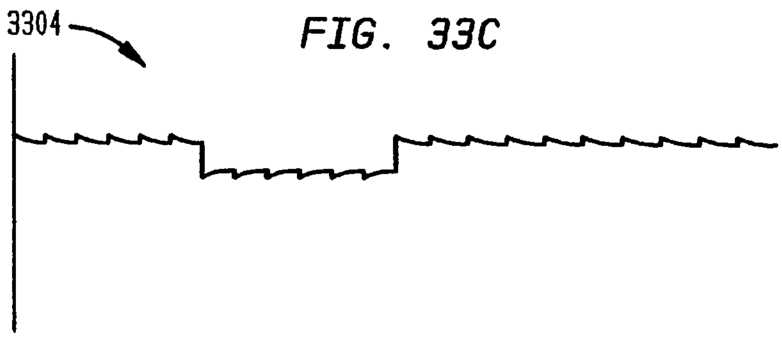
Figure 33D:
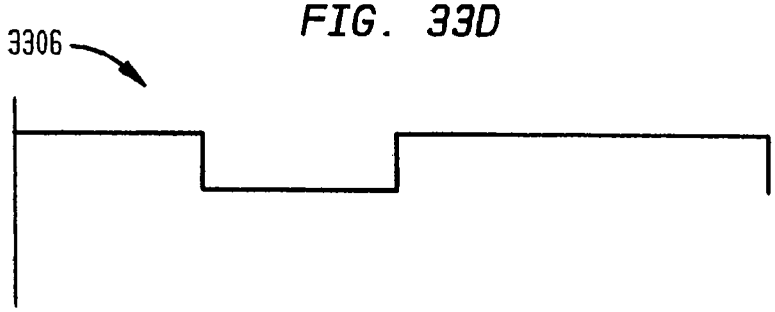

FIG. 33D depicts a filtered demodulated baseband signal 3306, which can be generated from the stair step demodulated baseband signal 3304. The invention can thus generate a filtered output signal, a partially filtered output signal, or a relatively unfiltered stair step output signal. The choice between filtered, partially filtered and non-filtered output signals is generally a design choice that depends upon the application of the invention.

2.1.2 Structural Description

FIG. 16 illustrates the block diagram of the under-sampling system 1602 according to an embodiment of the invention. The under-sampling system 1602 is an example embodiment of the generic aliasing system 1302 in FIG. 13.

In a direct to data embodiment, the frequency of the under-sampling signal 1604 is substantially equal to a harmonic of the EM signal 1304 or, more typically, a sub-harmonic thereof. Preferably, the under-sampling module 1606 under-samples the EM signal 1304 to directly down-convert it to the demodulated baseband signal $F_{DMB}$, in the manner shown in the operational flowchart 1413. But it should be understood that the scope and spirit of the invention includes other structural embodiments for performing the steps of the flowchart 1413. The specifics of the other structural embodiments will be apparent to persons skilled in the relevant art(s) based on the discussion contained herein.

The operation of the aliasing system 1602 is now described for the digital AM carrier signal 616, with reference to the flowchart 1413 and to the timing diagrams in FIGS. 33A-D. In step 1414, the under-sampling module 1606 receives the AM carrier signal 616 (FIG. 33A). In step 1416, the under-sampling module 1606 receives the under-sampling signal 3302 (FIG. 33B). In step 1418, the under-sampling module 1606 under-samples the AM carrier signal 616 at the aliasing rate of the under-sampling signal 3302 to directly down-convert the AM carrier signal 616 to the demodulated baseband signal 3304 in FIG. 33C or the filtered demodulated baseband signal 3306 in FIG. 33D.

Example implementations of the under-sampling module 1606 are provided in Sections 4 and 5 below.

2.2 Example Embodiments

Various embodiments related to the method(s) and structure(s) described above are presented in this section (and its subsections). These embodiments are described herein for purposes of illustration, and not limitation. The invention is not limited to these embodiments. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

The method for down-converting the EM signal 1304 to the demodulated baseband signal $F_{DMB}$, illustrated in the flowchart 1413 of FIG. 14C, can be implemented with any type EM signal, including modulated carrier signals, including but not limited to, AM, PM, etc., or any combination thereof. Operation of the flowchart 1413 of FIG. 14C is described below for AM and PM carrier signals. The exemplary descriptions below are intended to facilitate an understanding of the present invention. The present invention is not limited to or by the exemplary embodiments below.

2.2.1 First Example Embodiment Amplitude Modulation 2.2.1.1 Operational Description Operation of the exemplary process of the flowchart 1413 in FIG. 14C is described below for the analog AM carrier signal 516, illustrated in FIG. 5C and for the digital AM carrier signal 616, illustrated in FIG. 6C.

2.2.1.1.1 Analog AM Carrier Signal

A process for directly down-converting the analog AM carrier signal 516 to a demodulated baseband signal is now described with reference to the flowchart 1413 in FIG. 14C. The analog AM carrier signal 516 is re-illustrated in 35A for convenience. For this example, the analog AM carrier signal 516 oscillates at approximately 900 MHZ. In FIG. 35B, an analog AM carrier signal 3504 illustrates a portion of the analog AM carrier signal 516 on an expanded time scale.

The process begins at step 1414, which includes receiving an EM signal. This is represented by the analog AM carrier signal 516.

Step 1416 includes receiving an under-sampling signal having an aliasing rate $F_{AR}$. FIG. 35C illustrates an example under-sampling signal 3506 on approximately the same time scale as FIG. 35B. The under-sampling signal 3506 includes a train of pulses 3507 having negligible apertures that tend towards zero time in duration. The pulses 3507 repeat at the aliasing rate or pulse repetition rate, which is determined or selected as previously described. Generally, when directly down-converting to a demodulated baseband signal, the aliasing rate $F_{AR}$ is substantially equal to a harmonic or, more typically, a sub-harmonic of the under-sampled signal. In this example, the aliasing rate is approximately 450 MHZ.

Step 1418 includes under-sampling the EM signal at the aliasing rate to directly down-convert it to the demodulated baseband signal $F_{DMB}$. Step 1418 is illustrated in FIG. 35B by under-sample points 3505. Because a harmonic of the aliasing rate is substantially equal to the frequency of the signal 516, essentially no IF is produced. The only substantial aliased component is the baseband signal.

Figure 35A:
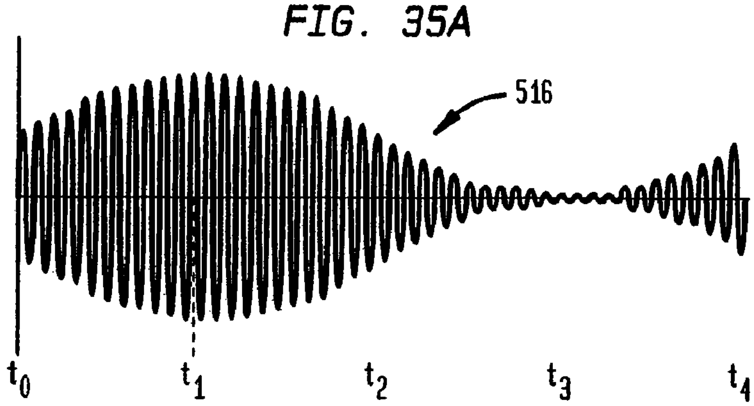
FIGS. 35A-E illustrate example signal diagrams associated with directly down-converting an analog AM signal to a demodulated baseband signal by under-sampling according to embodiments of the invention.
Figure 35B:
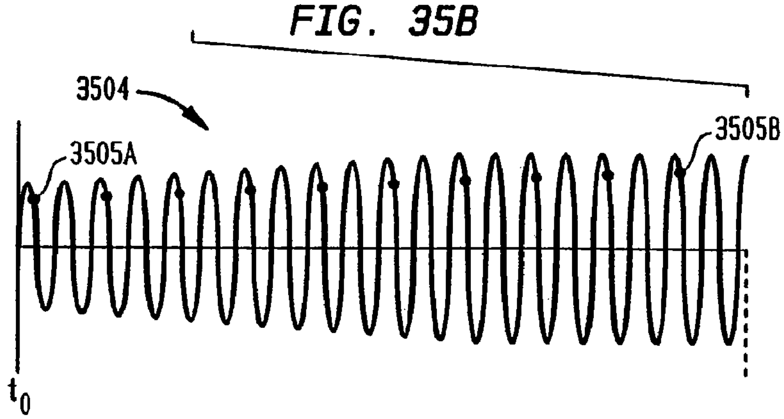
Figure 35C:
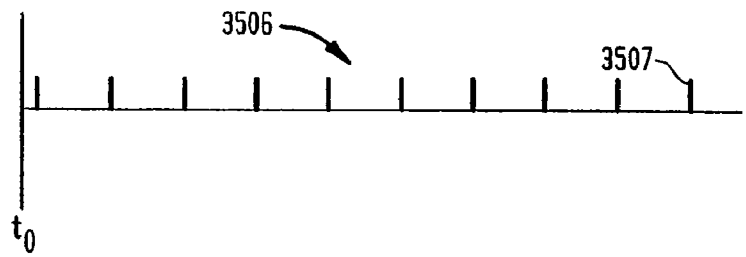
Figure 35D:
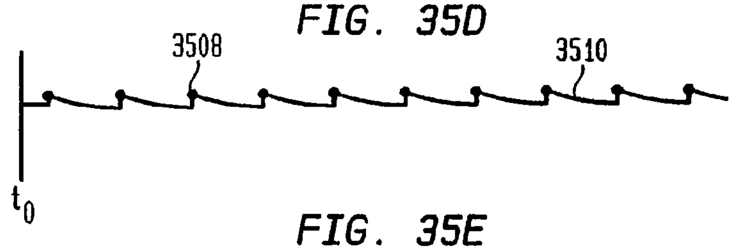

In FIG. 35D, voltage points 3508 correlate to the under-sample points 3505. In an embodiment, the voltage points 3508 form a demodulated baseband signal 3510. This can be accomplished in many ways. For example, each voltage point 3508 can be held at a relatively constant level until the next voltage point is received. This results in a stair-step output which can be smoothed or filtered if desired, as described below.

Figure 35E:
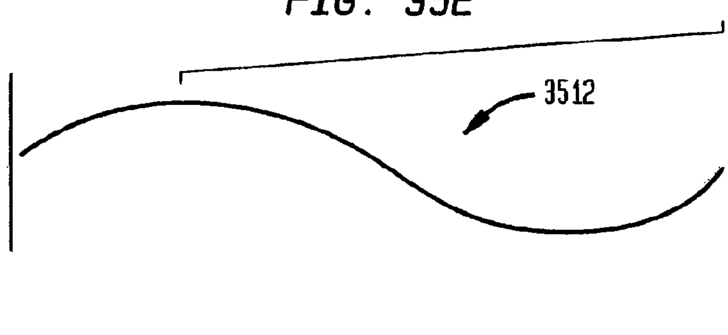

In FIG. 35E, a demodulated baseband signal 3512 represents the demodulated baseband signal 3510, after filtering, on a compressed time scale. Although FIG. 35E illustrates the demodulated baseband signal 3512 as a filtered output signal, the output signal does not need to be filtered or smoothed to be within the scope of the invention. Instead, the output signal can be tailored for different applications.

The demodulated baseband signal 3512 is substantially similar to the modulating baseband signal 210. The demodulated baseband signal 3512 can be processed using any signal processing technique(s) without further down-conversion or demodulation.

The aliasing rate of the under-sampling signal is preferably controlled to optimize the demodulated baseband signal for amplitude output and polarity, as desired.

In the example above, the under-sample points 3505 occur at positive locations of the AM carrier signal 516. Alternatively, the under-sample points 3505 can occur at other locations including negative points of the analog AM carrier signal 516. When the under-sample points 3505 occur at negative locations of the AM carrier signal 516, the resultant demodulated baseband signal is inverted relative to the modulating baseband signal 210.

The drawings referred to herein illustrate direct to data down-conversion in accordance with the invention. For example, the demodulated baseband signal 3510 in FIG. 35D and the demodulated baseband signal 3512 in FIG. 35E illustrate that the AM carrier signal 516 was successfully down-converted to the demodulated baseband signal 3510 by retaining enough baseband information for sufficient reconstruction.

2.2.1.1.2 Digital AM Carrier Signal

A process for directly down-converting the digital AM carrier signal 616 to a demodulated baseband signal is now described with reference to the flowchart 1413 in FIG. 14C. The digital AM carrier signal 616 is re-illustrated in FIG. 36A for convenience. For this example, the digital AM carrier signal 616 oscillates at approximately 901 MHZ. In FIG. 36B, a digital AM carrier signal 3604 illustrates a portion of the digital AM carrier signal 616 on an expanded time scale.

The process begins at step 1414, which includes receiving an EM signal. This is represented by the digital AM carrier signal 616.

Step 1416 includes receiving an under-sampling signal having an aliasing rate $F_{AR}$. FIG. 36C illustrates an example under-sampling signal 3606 on approximately the same time scale as FIG. 36B. The under-sampling signal 3606 includes a train of pulses 3607 having negligible apertures that tend towards zero time in duration. The pulses 3607 repeat at the aliasing rate or pulse repetition rate, which is determined or selected as previously described. Generally, when directly down-converting to a demodulated baseband signal, the aliasing rate $F_{AR}$ is substantially equal to a harmonic or, more typically, a sub-harmonic of the under-sampled signal. In this example, the aliasing rate is approximately 450 MHZ.

Step 1418 includes under-sampling the EM signal at the aliasing rate to directly down-convert it to the demodulated baseband signal $F_{DMB}$. Step 1418 is illustrated in FIG. 36B by under-sample points 3605. Because the aliasing rate is substantially equal to the AM carrier signal 616, or to a harmonic or sub-harmonic thereof, essentially no IF is produced. The only substantial aliased component is the baseband signal.

Figure 36A:
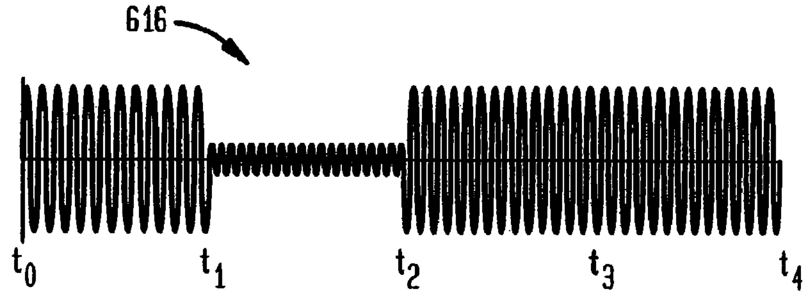
FIGS. 36A-E illustrate example signal diagrams associated with down-converting a digital AM signal to a demodulated baseband signal by under-sampling according to embodiments of the invention.
Figure 36B:
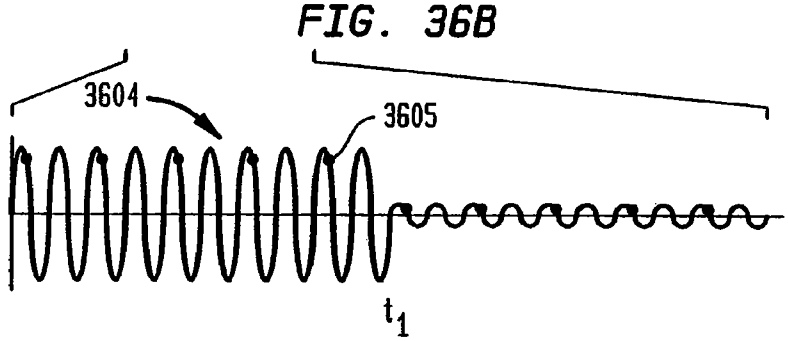
Figure 36C:
Figure 36D:
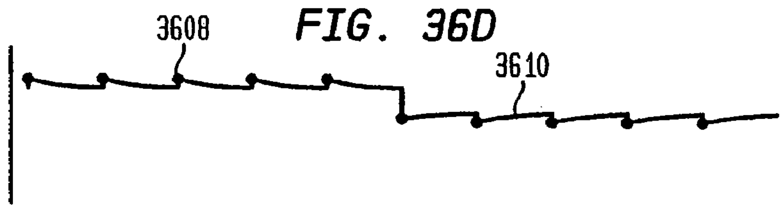

In FIG. 36D, voltage points 3608 correlate to the under-sample points 3605. In an embodiment, the voltage points 3608 form a demodulated baseband signal 3610. This can be accomplished in many ways. For example, each voltage point 3608 can be held at a relatively constant level until the next voltage point is received. This results in a stair-step output which can be smoothed or filtered if desired, as described below.

Figure 36E:
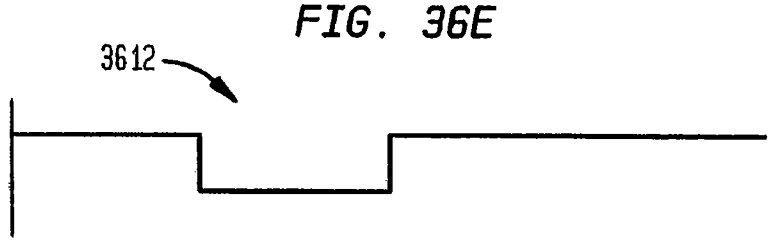

In FIG. 36E, a demodulated baseband signal 3612 represents the demodulated baseband signal 3610, after filtering, on a compressed time scale. Although FIG. 36E illustrates the demodulated baseband signal 3612 as a filtered output signal, the output signal does not need to be filtered or smoothed to be within the scope of the invention. Instead, the output signal can be tailored for different applications.

The demodulated baseband signal 3612 is substantially similar to the digital modulating baseband signal 310. The demodulated analog baseband signal 3612 can be processed using any signal processing technique(s) without further down-conversion or demodulation.

The aliasing rate of the under-sampling signal is preferably controlled to optimize the demodulated baseband signal for amplitude output and polarity, as desired.

In the example above, the under-sample points 3605 occur at positive locations of signal portion 3604. Alternatively, the under-sample points 3605 can occur at other locations including negative locations of the signal portion 3604. When the under-sample points 3605 occur at negative points, the resultant demodulated baseband signal is inverted with respect to the modulating baseband signal 310.

The drawings referred to herein illustrate frequency down-conversion in accordance with the invention. For example, the demodulated baseband signal 3610 in FIG. 36D and the demodulated baseband signal 3612 in FIG. 36E illustrate that the digital AM carrier signal 616 was successfully down-converted to the demodulated baseband signal 3610 by retaining enough baseband information for sufficient reconstruction.

2.2.1.2 Structural Description

The operation of the under-sampling module 1606 is now described for the analog AM carrier signal 516, with reference to the flowchart 1413 and the timing diagrams of FIGS. 35A-E. In step 1414, the under-sampling module 1606 receives the analog AM carrier signal 516 (FIG. 35A). In step 1416, the under-sampling module 1606 receives the under-sampling signal 3506 (FIG. 35C). In step 1418, the under-sampling module 1606 under-samples the analog AM carrier signal 516 at the aliasing rate of the under-sampling signal 3506 to directly to down-convert the AM carrier signal 516 to the demodulated analog baseband signal 3510 in FIG. 35D or to the filtered demodulated analog baseband signal 3512 in FIG. 35E.

The operation of the under-sampling system 1602 is now described for the digital AM carrier signal 616, with reference to the flowchart 1413 and the timing diagrams of FIGS. 36A-E. In step 1414, the under-sampling module 1606 receives the digital AM carrier signal 616 (FIG. 36A). In step 1416, the under-sampling module 1606 receives the under-sampling signal 3606 (FIG. 36C). In step 1418, the under-sampling module 1606 under-samples the digital AM carrier signal 616 at the aliasing rate of the under-sampling signal 3606 to down-convert the digital AM carrier signal 616 to the demodulated digital baseband signal 3610 in FIG. 36D or to the filtered demodulated digital baseband signal 3612 in FIG. 36E.

Example implementations of the under-sampling module 1606 are provided in Sections 4 and 5 below.

2.2.2 Second Example Embodiment Phase Modulation 2.2.2.1 Operational Description Operation of the exemplary process of the flowchart 1413 in FIG. 14C is described below for the analog PM carrier signal 916, illustrated in FIG. 9C, and for the digital PM carrier signal 1016, illustrated in FIG. 10C.

2.2.2.1.1 Analog PM Carrier Signal

A process for directly down-converting the analog PM carrier signal 916 to a demodulated baseband signal is now described with reference to the flowchart 1413 in FIG. 14C. The analog PM carrier signal 916 is re-illustrated in 37A for convenience. For this example, the analog PM carrier signal 916 oscillates at approximately 900 MHZ. In FIG. 37B, an analog PM carrier signal 3704 illustrates a portion of the analog PM carrier signal 916 on an expanded time scale.

The process begins at step 1414, which includes receiving an EM signal. This is represented by the analog PM signal 916.

Step 1416 includes receiving an under-sampling signal having an aliasing rate $F_{AR}$. FIG. 37C illustrates an example under-sampling signal 3706 on approximately the same time scale as FIG. 37B. The under-sampling signal 3706 includes a train of pulses 3707 having negligible apertures that tend towards zero time in duration. The pulses 3707 repeat at the aliasing rate or pulse repetition rate, which is determined or selected as previously described. Generally, when directly down-converting to a demodulated baseband signal, the aliasing rate $F_{AR}$ is substantially equal to a harmonic or, more typically, a sub-harmonic of the under-sampled signal. In this example, the aliasing rate is approximately 450 MHZ.

Step 1418 includes under-sampling the analog PM carrier signal 916 at the aliasing rate to directly down-convert it to a demodulated baseband signal. Step 1418 is illustrated in FIG. 37B by under-sample points 3705.

Because a harmonic of the aliasing rate is substantially equal to the frequency of the signal 916, or substantially equal to a harmonic or sub-harmonic thereof, essentially no IF is produced. The only substantial aliased component is the baseband signal.

Figure 37A:
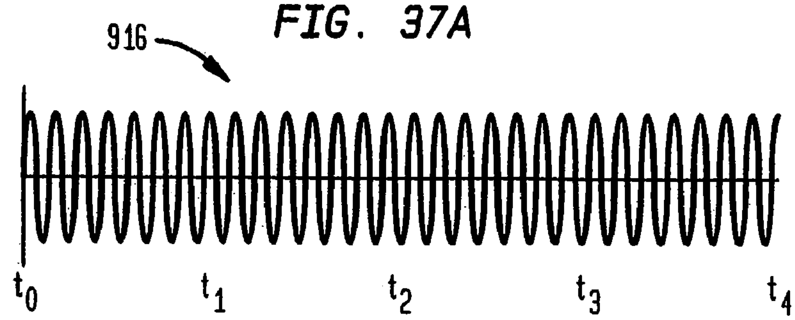
FIGS. 37A-E illustrate example signal diagrams associated with directly down-converting an analog PM signal to a demodulated baseband signal by under-sampling according to embodiments of the invention.
Figure 37B:
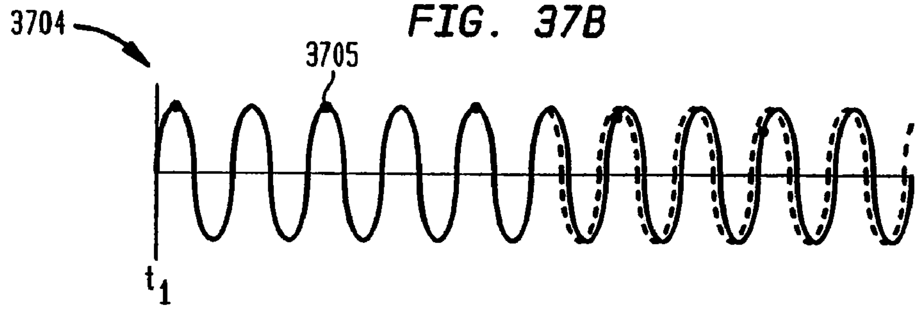
Figure 37C:
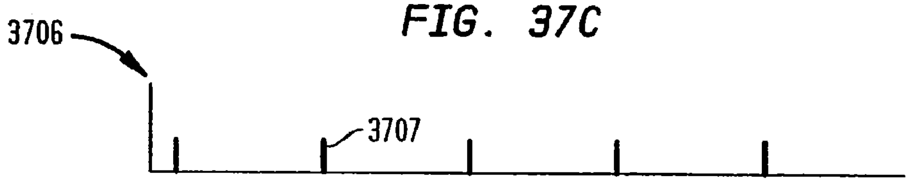
Figure 37D:
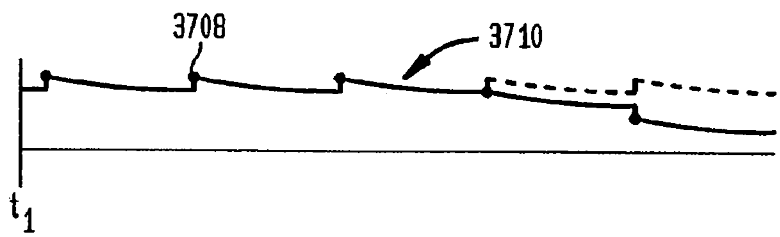

In FIG. 37D, voltage points 3708 correlate to the under-sample points 3705. In an embodiment, the voltage points 3708 form a demodulated baseband signal 3710. This can be accomplished in many ways. For example, each voltage point 3708 can be held at a relatively constant level until the next voltage point is received. This results in a stair-step output which can be smoothed or filtered if desired, as described below.

Figure 37E:
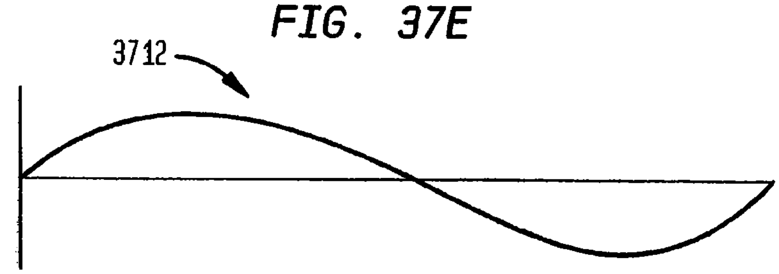

In FIG. 37E, a demodulated baseband signal 3712 represents the demodulated baseband signal 3710, after filtering, on a compressed time scale. Although FIG. 37E illustrates the demodulated baseband signal 3712 as a filtered output signal, the output signal does not need to be filtered or smoothed to be within the scope of the invention. Instead, the output signal can be tailored for different applications.

The demodulated baseband signal 3712 is substantially similar to the analog modulating baseband signal 210. The demodulated baseband signal 3712 can be processed without further down-conversion or demodulation.

The aliasing rate of the under-sampling signal is preferably controlled to optimize the demodulated baseband signal for amplitude output and polarity, as desired.

In the example above, the under-sample points 3705 occur at positive locations of the analog PM carrier signal 916. Alternatively, the under-sample points 3705 can occur at other locations include negative points of the analog PM carrier signal 916. When the under-sample points 3705 occur at negative locations of the analog PM carrier signal 916, the resultant demodulated baseband signal is inverted relative to the modulating baseband signal 210.

The drawings referred to herein illustrate direct to data down-conversion in accordance with the invention. For example, the demodulated baseband signal 3710 in FIG. 37D and the demodulated baseband signal 3712 in FIG. 37E illustrate that the analog PM carrier signal 916 was successfully down-converted to the demodulated baseband signal 3710 by retaining enough baseband information for sufficient reconstruction.

2.2.2.1.2 Digital PM Carrier Signal

A process for directly down-converting the digital PM carrier signal 1016 to a demodulated baseband signal is now described with reference to the flowchart 1413 in FIG. 14C. The digital PM carrier signal 1016 is re-illustrated in 38A for convenience. For this example, the digital PM carrier signal 1016 oscillates at approximately 900 MHZ. In FIG. 38B, a digital PM carrier signal 3804 illustrates a portion of the digital PM carrier signal 1016 on an expanded time scale.

The process begins at step 1414, which includes receiving an EM signal. This is represented by the digital PM signal 1016.

Step 1416 includes receiving an under-sampling signal having an aliasing rate $F_{AR}$. FIG. 38C illustrates an example under-sampling signal 3806 on approximately the same time scale as FIG. 38B. The under-sampling signal 3806 includes a train of pulses 3807 having negligible apertures that tend towards zero time in duration. The pulses 3807 repeat at the aliasing rate or pulse repetition rate, which is determined or selected as described above. Generally, when directly down-converting to a demodulated baseband signal, the aliasing rate $F_{AR}$ is substantially equal to a harmonic or, more typically, a sub-harmonic of the under-sampled signal. In this example, the aliasing rate is approximately 450 MHZ.

Step 1418 includes under-sampling the digital PM carrier signal 1016 at the aliasing rate to directly down-convert it to a demodulated baseband signal. This is illustrated in FIG. 38B by under-sample points 3705.

Because a harmonic of the aliasing rate is substantially equal to the frequency of the signal 1016, essentially no IF is produced. The only substantial aliased component is the baseband signal.

Figure 38A:
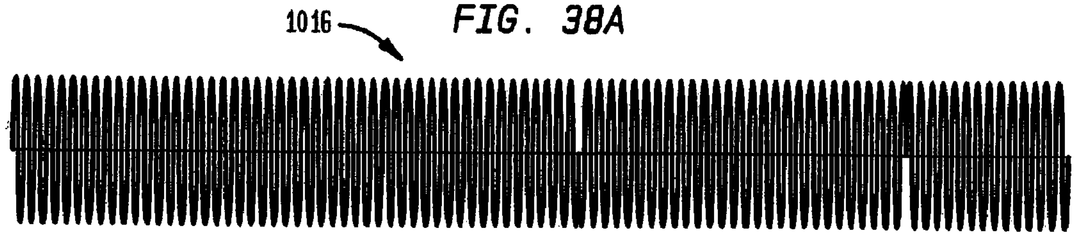
FIGS. 38A-E illustrate example signal diagrams associated with down-converting a digital PM signal to a demodulated baseband signal by under-sampling according to embodiments of the invention.
Figure 38B:
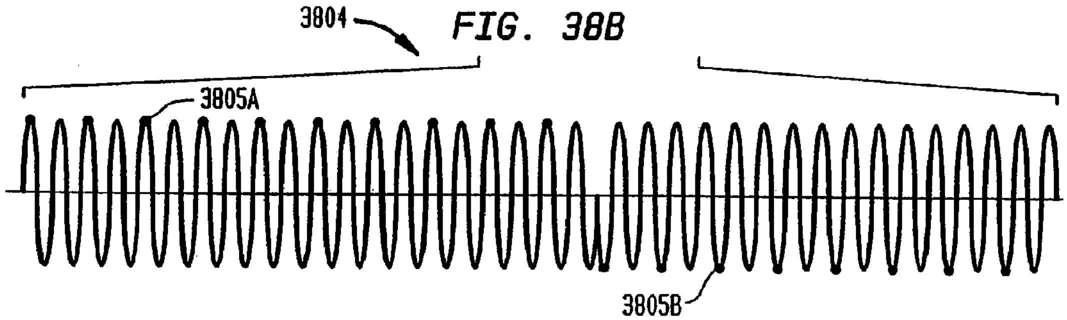
Figure 38C:
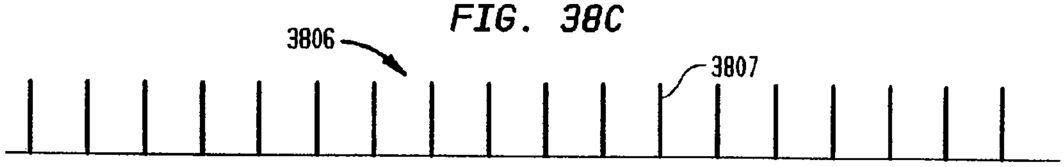
Figure 38D:
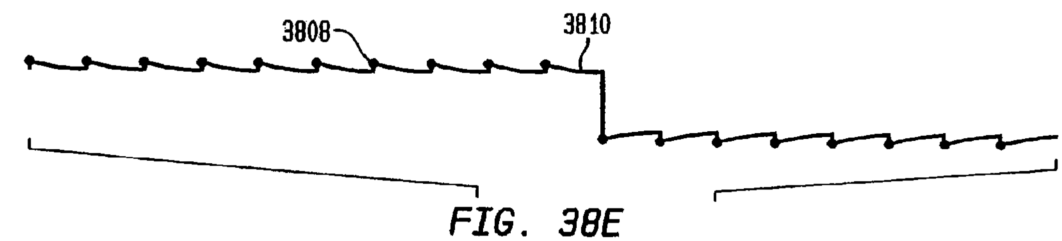

In FIG. 38D, voltage points 3808 correlate to the under-sample points 3805. In an embodiment, the voltage points 3808 form a demodulated baseband signal 3810. This can be accomplished in many ways. For example, each voltage point 3808 can be held at a relatively constant level until the next voltage point is received. This results in a stair-step output which can be smoothed or filtered if desired, as described below.

Figure 38E:
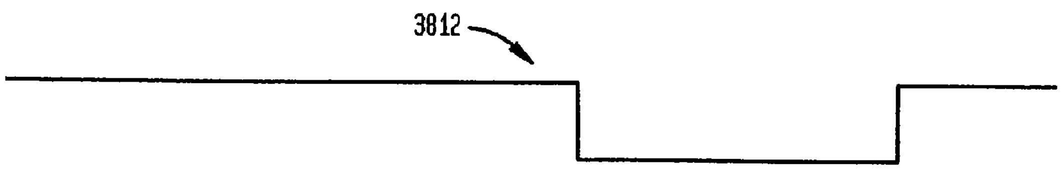

In FIG. 38E, a demodulated baseband signal 3812 represents the demodulated baseband signal 3810, after filtering, on a compressed time scale. Although FIG. 38E illustrates the demodulated baseband signal 3812 as a filtered output signal, the output signal does not need to be filtered or smoothed to be within the scope of the invention. Instead, the output signal can be tailored for different applications.

The demodulated baseband signal 3812 is substantially similar to the digital modulating baseband signal 310. The demodulated baseband signal 3812 can be processed without further down-conversion or demodulation.

The aliasing rate of the under-sampling signal is preferably controlled to optimize the demodulated baseband signal for amplitude output and polarity, as desired.

In the example above, the under-sample points 3805 occur at positive locations of the digital PM carrier signal 1016. Alternatively, the under-sample points 3805 can occur at other locations include negative points of the digital PM carrier signal 1016. When the under-sample points 3805 occur at negative locations of the digital PM carrier signal 1016, the resultant demodulated baseband signal is inverted relative to the modulating baseband signal 310.

The drawings referred to herein illustrate frequency down-conversion in accordance with the invention. For example, the demodulated baseband signal 3810 in FIG. 38D and the demodulated baseband signal 3812 in FIG. 38E illustrate that the digital PM carrier signal 1016 was successfully down-converted to the demodulated baseband signal 3810 by retaining enough baseband information for sufficient reconstruction.

2.2.1.2 Structural Description

The operation of the under-sampling system 1602 is now described for the analog PM carrier signal 916, with reference to the flowchart 1413 and the timing diagrams of FIGS. 37A-E. In step 1414, the under-sampling module 1606 receives the analog PM carrier signal 916 (FIG. 37A). In step 1416, the under-sampling module 1606 receives the under-sampling signal 3706 (FIG. 37C). In step 1418, the under-sampling module 1606 under-samples the analog PM carrier signal 916 at the aliasing rate of the under-sampling signal 3706 to down-convert the PM carrier signal 916 to the demodulated analog baseband signal 3710 in FIG. 37D or to the filtered demodulated analog baseband signal 3712 in FIG. 37E.

The operation of the under-sampling system 1602 is now described for the digital PM carrier signal 1016, with reference to the flowchart 1413 and the timing diagrams of FIGS. 38A-E. In step 1414, the under-sampling module 1606 receives the digital PM carrier signal 1016 (FIG. 38A). In step 1416, the under-sampling module 1606 receives the under-sampling signal 3806 (FIG. 38C). In step 1418, the under-sampling module 1606 under-samples the digital PM carrier signal 1016 at the aliasing rate of the under-sampling signal 3806 to down-convert the digital PM carrier signal 1016 to the demodulated digital baseband signal 3810 in FIG. 38D or to the filtered demodulated digital baseband signal 3812 in FIG. 38E.

2.2.3 Other Embodiments

The embodiments described above are provided for purposes of illustration. These embodiments are not intended to limit the invention. Alternate embodiments, differing slightly or substantially from those described herein, will be apparent to persons skilled in the relevant art(s) based on the teachings contained herein. Such alternate embodiments fall within the scope and spirit of the present invention.

2.3 Implementation Examples

Exemplary operational and/or structural implementations related to the method(s), structure(s), and/or embodiments described above are presented in Sections 4 and 5 below. These implementations are presented for purposes of illustration, and not limitation. The invention is not limited to the particular implementation examples described therein. Alternate implementations (including equivalents, extensions, variations, deviations, etc., of those described herein) will be apparent to persons skilled in the relevant art(s) based on the teachings contained herein. Such alternate implementations fall within the scope and spirit of the present invention.

3. Modulation Conversion

In an embodiment, the invention down-converts an FM carrier signal $F_{FMC}$ to a non-FM signal $F_{(NON\text{-}FM)}$, by under-sampling the FM carrier signal $F_{FMC}$. This embodiment is illustrated in FIG. 45B as 4512.

In an example embodiment, the FM carrier signal $F_{MC}$ is down-converted to a phase modulated (PM) signal $F_{PM}$. In another example embodiment, the FM carrier signal $F_{FMC}$ is down-converted to an amplitude modulated (AM) signal $F_{AM}$. The invention is not limited to these embodiments. The down-converted signal can be demodulated with any conventional demodulation technique to obtain a demodulated baseband signal $F_{DMB}$.

The invention can be implemented with any type of FM signal. Exemplary embodiments are provided below for down-converting a frequency shift keying (FSK) signal to a non-FSK signal. FSK is a sub-set of FM, wherein an FM signal shifts or switches between two or more frequencies. FSK is typically used for digital modulating baseband signals, such as the digital modulating baseband signal 310 in FIG. 3. For example, in FIG. 8, the digital FM signal 816 is an FSK signal that shifts between an upper frequency and a lower frequency, corresponding to amplitude shifts in the digital modulating baseband signal 310. The FSK signal 816 is used in example embodiments below.

In a first example embodiment, the FSK signal 816 is under-sampled at an aliasing rate that is based on a mid-point between the upper and lower frequencies of the FSK signal 816. When the aliasing rate is based on the mid-point, the FSK signal 816 is down-converted to a phase shift keying (PSK) signal. PSK is a sub-set of phase modulation, wherein a PM signal shifts or switches between two or more phases. PSK is typically used for digital modulating baseband signals. For example, in FIG. 10, the digital PM signal 1016 is a PSK signal that shifts between two phases. The PSK signal 1016 can be demodulated by any conventional PSK demodulation technique(s).

In a second example embodiment, the FSK signal 816 is under-sampled at an aliasing rate that is based upon either the upper frequency or the lower frequency of the FSK signal 816. When the aliasing rate is based upon the upper frequency or the lower frequency of the FSK signal 816, the FSK signal 816 is down-converted to an amplitude shift keying (ASK) signal. ASK is a sub-set of amplitude modulation, wherein an AM signal shifts or switches between two or more amplitudes. ASK is typically used for digital modulating baseband signals. For example, in FIG. 6, the digital AM signal 616 is an ASK signal that shifts between the first amplitude and the second amplitude. The ASK signal 616 can be demodulated by any conventional ASK demodulation technique(s).

The following sections describe methods for under-sampling an FM carrier signal $F_{FMC}$ to down-convert it to the non-FM signal $F_{(NON-FM)}$. Exemplary structural embodiments for implementing the methods are also described. It should be understood that the invention is not limited to the particular embodiments described below. Equivalents, extensions, variations, deviations, etc., of the following will be apparent to persons skilled in the relevant art(s) based on the teachings contained herein. Such equivalents, extensions, variations, deviations, etc., are within the scope and spirit of the present invention.

The following sections include a high level discussion, example embodiments, and implementation examples.

3.1 High Level Description

This section (including its subsections) provides a high-level description of under-sampling the FM carrier signal $F_{FM}$ to down-convert it to the non-FM signal $F_{(NON-FM)}$, according to the invention. In particular, an operational process for down-converting the FM carrier signal $F_{FM}$ to the non-FM signal $F_{(NON-FM)}$ is described at a high-level. Also, a structural implementation for implementing this process is described at a high-level. The structural implementation is described herein for illustrative purposes, and is not limiting. In particular, the process described in this section can be achieved using any number of structural implementations, one of which is described in this section. The details of such structural implementations will be apparent to persons skilled in the relevant art(s) based on the teachings contained herein.

3.1.1 Operational Description

FIG. 14D depicts a flowchart 1419 that illustrates an exemplary method for down-converting the FM carrier signal $F_{FMC}$ to the non-FM signal $F_{(NON-FM)}$. The exemplary method illustrated in the flowchart 1419 is an embodiment of the flowchart 1401 in FIG. 14A.

Any and all forms of frequency modulation techniques are valid for this invention. For ease of discussion, the digital FM carrier (FSK) signal 816 is used to illustrate a high level operational description of the invention. Subsequent sections provide detailed flowcharts and descriptions for the FSK signal 816. Upon reading the disclosure and examples therein, one skilled in the relevant art(s) will understand that the invention can be implemented to down-convert any type of FM signal.

Figure 39A:
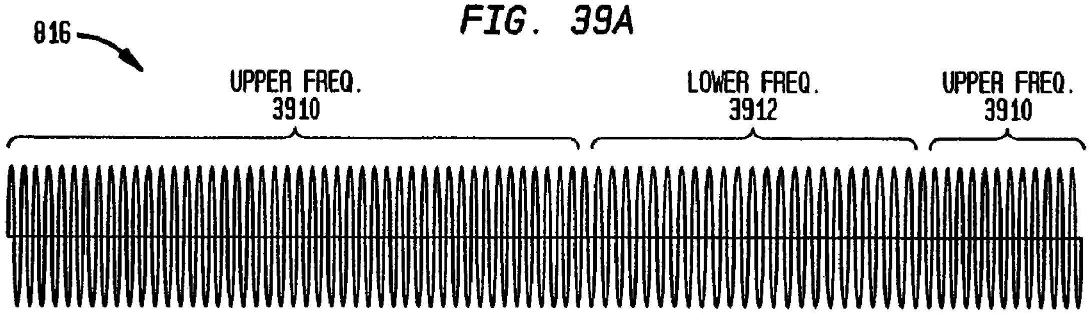
FIGS. 39A-D illustrate down-converting a FM signal to a non-FM signal by under-sampling according to embodiments of the invention.

The method illustrated in the flowchart 1419 is described below at a high level for down-converting the FSK signal 816 in FIG. 8C to a PSK signal. The FSK signal 816 is re-illustrated in FIG. 39A for convenience.

The process of the flowchart 1419 begins at step 1420, which includes receiving an FM signal. This is represented by the FSK signal 816. The FSK signal 816 shifts between an upper frequency 3910 and a lower frequency 3912. In an exemplary embodiment, the upper frequency 3910 is approximately 901 MHZ and the lower frequency 3912 is approximately 899 MHZ.

Figure 39B:
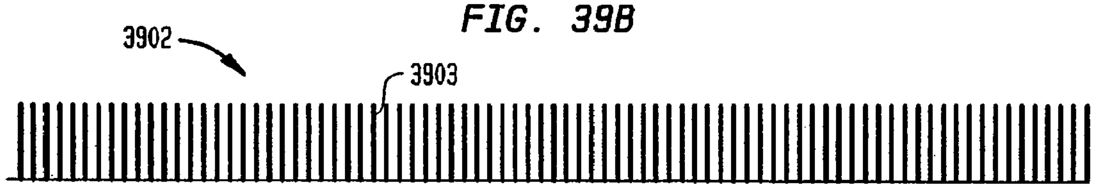

Step 1422 includes receiving an under-sampling signal having an aliasing rate $F_{AR}$. FIG. 39B illustrates an example under-sampling signal 3902 which includes a train of pulses 3903 having negligible apertures that tend towards zero time in duration. The pulses 3903 repeat at the aliasing rate or pulse repetition rate.

When down-converting an FM carrier signal $F_{FMC}$ to a non-FM signal $F_{(NON-FM)}$, the aliasing rate is substantially equal to a frequency contained within the FM signal, or substantially equal to a harmonic or sub-harmonic thereof. In this example overview embodiment, where the FSK signal 816 is to be down-converted to a PSK signal, the aliasing rate is based on a mid-point between the upper frequency 3910 and the lower frequency 3912. For this example, the mid-point is approximately 900 MHZ. In another embodiment described below, where the FSK signal 816 is to be down-converted to an ASK signal, the aliasing rate is based on either the upper frequency 3910 or the lower frequency 3912, not the mid-point.

Figure 39C:
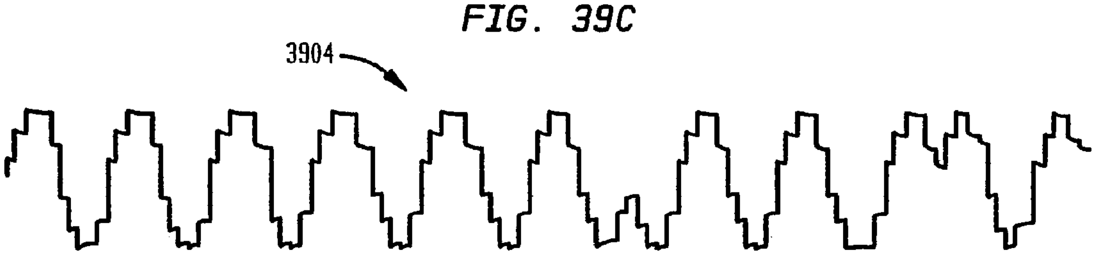

Step 1424 includes under-sampling the FM signal $F_{MC}$ at the aliasing rate to down-convert the FM carrier signal $F_{FMC}$ to the non-FM signal $F_{(NON-FM)}$ Step 1424 is illustrated in FIG. 39C, which illustrates a stair step PSK signal 3904, which is generated by the modulation conversion process.

When the upper frequency 3910 is under-sampled, the PSK signal 3904 has a frequency of approximately 1 MHZ and is used as a phase reference. When the lower frequency 3912 is under-sampled, the PSK signal 3904 has a frequency of 1 MHZ and is phase shifted 180 degrees from the phase reference.

Figure 39D:
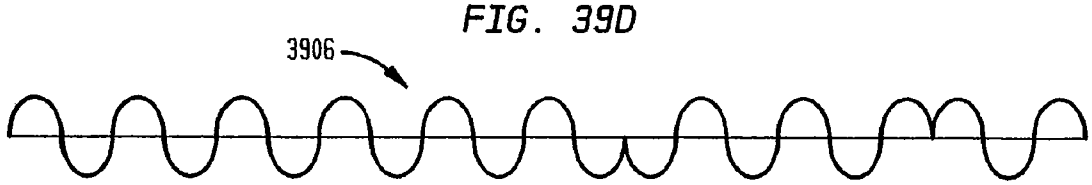

FIG. 39D depicts a PSK signal 3906, which is a filtered version of the PSK signal 3904. The invention can thus generate a filtered output signal, a partially filtered output signal, or a relatively unfiltered stair step output signal. The choice between filtered, partially filtered and non-filtered output signals is generally a design choice that depends upon the application of the invention.

The aliasing rate of the under-sampling signal is preferably controlled to optimize the down-converted signal for amplitude output and polarity, as desired.

Detailed exemplary embodiments for down-converting an FSK signal to a PSK signal and for down-converting an FSK signal to an ASK signal are provided below.

3.1.2 Structural Description

FIG. 16 illustrates the block diagram of the under-sampling system 1602 according to an embodiment of the invention. The under-sampling system 1602 includes the under-sampling module 1606. The under-sampling system 1602 is an example embodiment of the generic aliasing system 1302 in FIG. 13.

In a modulation conversion embodiment, the EM signal 1304 is an FM carrier signal and the under-sampling module 1606 under-samples the FM carrier signal at a frequency that is substantially equal to a harmonic of a frequency within the FM signal or, more typically, substantially equal to a sub-harmonic of a frequency within the FM signal. Preferably, the under-sampling module 1606 under-samples the FM carrier signal $F_{FMC}$ to down-convert it to a non-FM signal $F_{(NON-FM)}$ in the manner shown in the operational flowchart 1419. But it should be understood that the scope and spirit of the invention includes other structural embodiments for performing the steps of the flowchart 1419. The specifics of the other structural embodiments will be apparent to persons skilled in the relevant art(s) based on the discussion contained herein.

The operation of the under-sampling system 1602 shall now be described with reference to the flowchart 1419 and the timing diagrams of FIGS. 39A-39D. In step 1420, the under-sampling module 1606 receives the FSK signal 816. In step 1422, the under-sampling module 1606 receives the under-sampling signal 3902. In step 1424, the under-sampling module 1606 under-samples the FSK signal 816 at the aliasing rate of the under-sampling signal 3902 to down-convert the FSK signal 816 to the PSK signal 3904 or 3906.

Example implementations of the under-sampling module 1606 are provided in Section 4 below.

3.2 Example Embodiments

Various embodiments related to the method(s) and structure(s) described above are presented in this section (and its subsections). These embodiments are described herein for purposes of illustration, and not limitation. The invention is not limited to these embodiments. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

The method for down-converting an FM carrier signal $F_{FMC}$ to a non-FM signal, $F_{(NON\text{-}FM)}$, illustrated in the flowchart 1419 of FIG. 14D, can be implemented with any type of FM carrier signal including, but not limited to, FSK signals. The flowchart 1419 is described in detail below for down-converting an FSK signal to a PSK signal and for down-converting a FSK signal to an ASK signal. The exemplary descriptions below are intended to facilitate an understanding of the present invention. The present invention is not limited to or by the exemplary embodiments below.

3.2.1 First Example Embodiment Down-Converting an FM Signal to a PM Signal 3.2.1.1 Operational Description Operation of the exemplary process of the flowchart 1419 in FIG. 14D is now described for down-converting the FSK signal 816 illustrated in FIG. 8C to a PSK signal. The FSK signal 816 is re-illustrated in FIG. 40A for convenience.

The FSK signal 816 shifts between a first frequency 4006 and a second frequency 4008. In the exemplary embodiment, the first frequency 4006 is lower than the second frequency 4008. In an alternative embodiment, the first frequency 4006 is higher than the second frequency 4008. For this example, the first frequency 4006 is approximately 899 MHZ and the second frequency 4008 is approximately 901 MHZ.

Figure 40A:
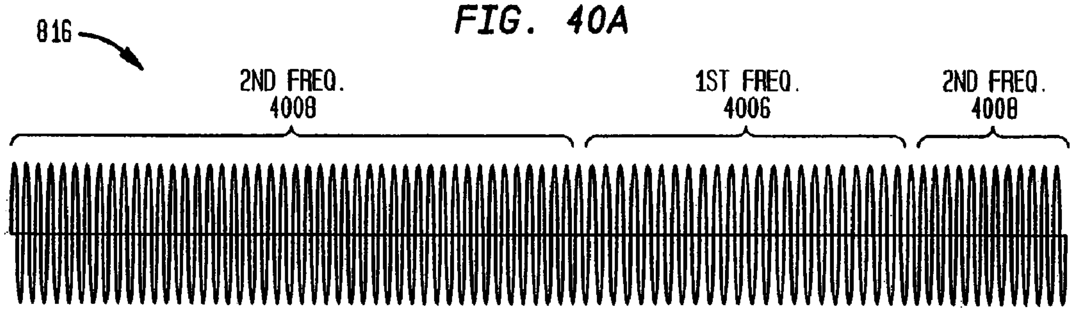
FIGS. 40A-E illustrate down-converting a FSK signal to a PSK signal by under-sampling according to embodiments of the invention.
Figure 40B:
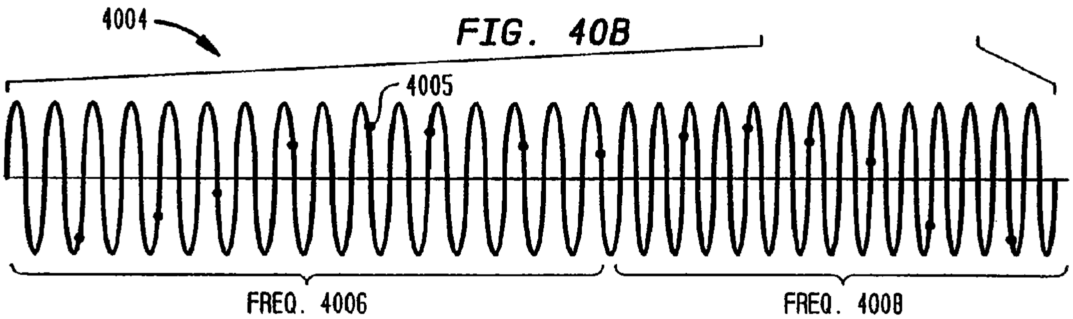

FIG. 40B illustrates an FSK signal portion 4004 that represents a portion of the FSK signal 816 on an expanded time scale.

The process of down-converting the FSK signal 816 to a PSK signal begins at step 1420, which includes receiving an FM signal. This is represented by the FSK signal 816.

Figure 40C:
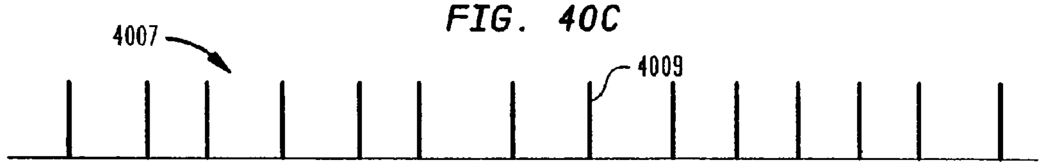

Step 1422 includes receiving an under-sampling signal having an aliasing rate $F_{AR}$. FIG. 40C illustrates an example under-sampling signal 4007 on approximately the same time scale as FIG. 40B. The under-sampling signal 4007 includes a train of pulses 4009 having negligible apertures that tend towards zero time in duration. The pulses 4009 repeat at the aliasing rate, which is determined or selected as described above. Generally, when down-converting an FM signal to a non-FM signal, the aliasing rate is substantially equal to a harmonic or, more typically, a sub-harmonic of a frequency contained within the FM signal.

In this example, where an FSK signal is being down-converted to a PSK signal, the aliasing rate is substantially equal to a harmonic of the mid-point between the frequencies 4006 and 4008 or, more typically, substantially equal to a sub-harmonic of the mid-point between the frequencies 4006 and 4008. In this example, where the first frequency 4006 is 899 MHZ and second frequency 4008 is 901 MHZ, the mid-point is approximately 900 MHZ. Suitable aliasing rates include 1.8 GHZ, 900 MHZ, 450 MHZ, etc. In this example, the aliasing rate of the under-sampling signal 4008 is approximately 450 MHZ.

Step 1424 includes under-sampling the FM signal at the aliasing rate to down-convert it to the non-FM signal $F_{(NON\text{-}FM)}$ Step 1424 is illustrated in FIG. 40B by under-sample points 4005. The under-sample points 4005 occur at the aliasing rate of the pulses 4009.

Figure 40D:
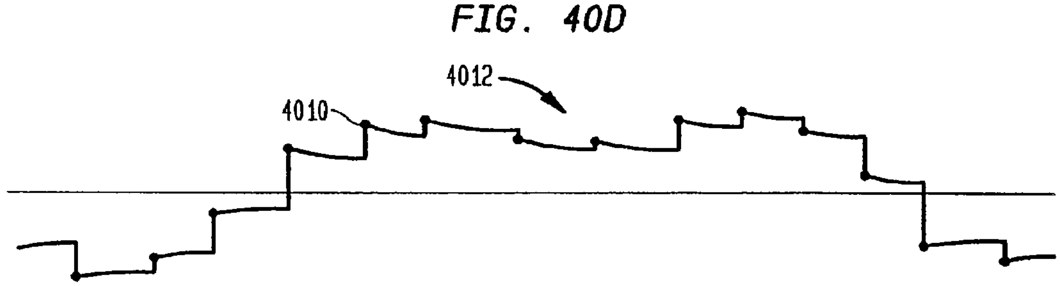

In FIG. 40D, voltage points 4010 correlate to the under-sample points 4005. In an embodiment, the voltage points 4010 form a PSK signal 4012. This can be accomplished in many ways. For example, each voltage point 4010 can be held at a relatively constant level until the next voltage point is received. This results in a stair-step output which can be smoothed or filtered if desired, as described below.

When the first frequency 4006 is under-sampled, the PSK signal 4012 has a frequency of approximately 1 MHZ and is used as a phase reference. When the second frequency 4008 is under-sampled, the PSK signal 4012 has a frequency of 1 MHZ and is phase shifted 180 degrees from the phase reference.

Figure 40E:
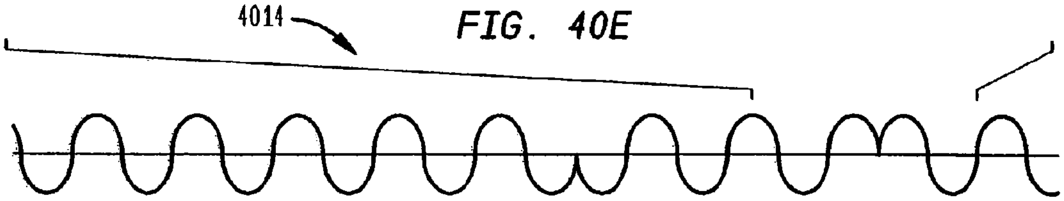

In FIG. 40E, a PSK signal 4014 illustrates the PSK signal 4012, after filtering, on a compressed time scale. Although FIG. 40E illustrates the PSK signal 4012 as a filtered output signal 4014, the output signal does not need to be filtered or smoothed to be within the scope of the invention. Instead, the output signal can be tailored for different applications. The PSK signal 4014 can be demodulated through any conventional phase demodulation technique.

The aliasing rate of the under-sampling signal is preferably controlled to optimize the down-converted signal for amplitude output and polarity, as desired.

In the example above, the under-sample points 4005 occur at positive locations of the FSK signal 816. Alternatively, the under-sample points 4005 can occur at other locations including negative points of the FSK signal 816. When the under-sample points 4005 occur at negative locations of the FSK signal 816, the resultant PSK signal is inverted relative to the PSK signal 4014.

The drawings referred to herein illustrate modulation conversion in accordance with the invention. For example, the PSK signal 4014 in FIG. 40E illustrates that the FSK signal 816 was successfully down-converted to the PSK signal 4012 and 4014 by retaining enough baseband information for sufficient reconstruction.

3.2.1.2 Structural Description

The operation of the under-sampling system 1602 is now described for down-converting the FSK signal 816 to a PSK signal, with reference to the flowchart 1419 and to the timing diagrams of FIGS. 40A-E. In step 1420, the under-sampling module 1606 receives the FSK signal 816 (FIG. 40A). In step 1422, the under-sampling module 1606 receives the under-sampling signal 4007 (FIG. 40C). In step 1424, the under-sampling module 1606 under-samples the FSK signal 816 at the aliasing rate of the under-sampling signal 4007 to down-convert the FSK signal 816 to the PSK signal 4012 in FIG. 40D or the PSK signal 4014 in FIG. 40E.

3.2.2 Second Example Embodiment Down-Converting an FM Signal to an AM Signal 3.2.2.1 Operational Description Operation of the exemplary process of FIG. 14D is now described for down-converting the FSK signal 816, illustrated in FIG. 8C, to an ASK signal. The FSK signal 816 is re-illustrated in FIG. 41A for convenience.

The FSK signal 816 shifts between a first frequency 4106 and a second frequency 4108. In the exemplary embodiment, the first frequency 4106 is lower than the second frequency 4108. In an alternative embodiment, the first frequency 4106 is higher than the second frequency 4108. For this example, the first frequency 4106 is approximately 899 MHZ and the second frequency 4108 is approximately 901 MHZ.

Figure 41A:
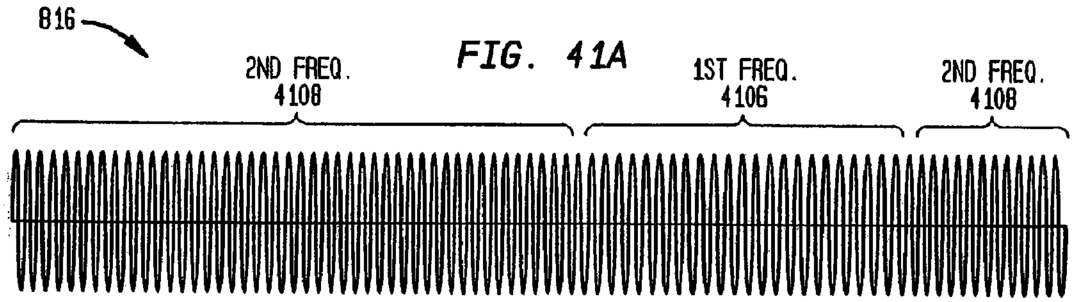
FIGS. 41A-E illustrate down-converting a FSK signal to an ASK signal by under-sampling according to embodiments of the invention.
Figure 41B:
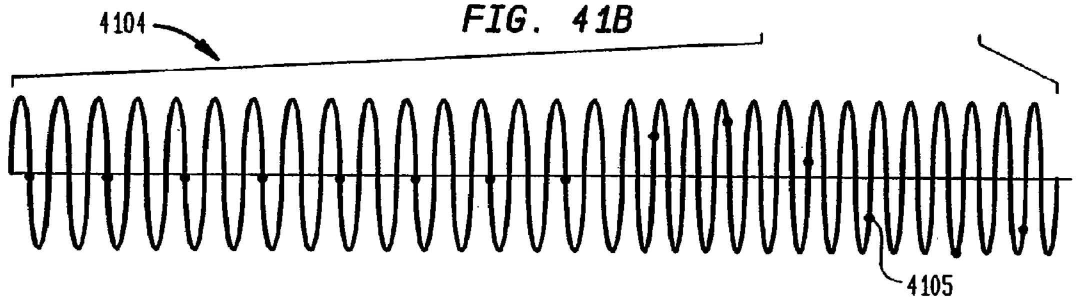

FIG. 41B illustrates an FSK signal portion 4104 that represents a portion of the FSK signal 816 on an expanded time scale.

The process of down-converting the FSK signal 816 to an ASK signal begins at step 1420, which includes receiving an FM signal. This is represented by the FSK signal 816.

Figure 41C:
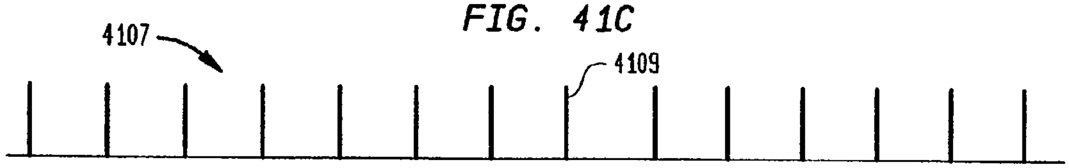

Step 1422 includes receiving an under-sampling signal having an aliasing rate $F_{AR}$. FIG. 41C illustrates an example under-sampling signal 4107 illustrated on approximately the same time scale as FIG. 42B. The under-sampling signal 4107 includes a train of pulses 4109 having negligible apertures that tend towards zero time in duration. The pulses 4109 repeat at the aliasing rate, or pulse repetition rate. The aliasing rate is determined or selected as described above.

Generally, when down-converting an FM signal to a non-FM signal, the aliasing rate is substantially equal to a harmonic of a frequency within the FM signal or, more typically, to a sub-harmonic of a frequency within the FM signal. When an FSK signal 816 is being down-converted to an ASK signal, the aliasing rate is substantially equal to a harmonic of the first frequency 4106 or the second frequency 4108 or, more typically, substantially equal to a sub-harmonic of the first frequency 4106 or the second frequency 4108. In this example, where the first frequency 4106 is 899 MHZ and the second frequency 4108 is 901 MHZ, the aliasing rate can be substantially equal to a harmonic or sub-harmonic of 899 MHZ or 901 MHZ. In this example the aliasing rate is approximately 449.5 MHZ, which is a sub-harmonic of the first frequency 4106.

Step 1424 includes under-sampling the FM signal at the aliasing rate to down-convert it to a non-FM signal $F_{(NON\text{-}FM)}$. Step 1424 is illustrated in FIG. 41B by under-sample points 4105. The under-sample points 4105 occur at the aliasing rate of the pulses 4109. When the first frequency 4106 is under-sampled, the aliasing pulses 4109 and the under-sample points 4105 occur at the same location of subsequent cycles of the FSK signal 816. This generates a relatively constant output level. But when the second frequency 4108 is under-sampled, the aliasing pulses 4109 and the under-sample points 4005 occur at different locations of subsequent cycles of the FSK signal 816. This generates an oscillating pattern at approximately (901 MHZ-899 MHZ)=2 MHZ.

Figure 41D:
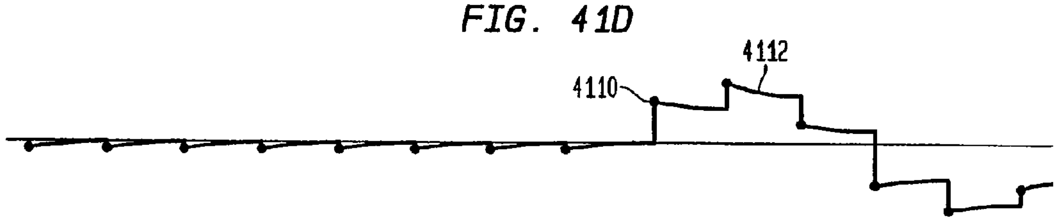

In FIG. 41D, voltage points 4110 correlate to the under-sample points 4105. In an embodiment, the voltage points 4110 form an ASK signal 4112. This can be accomplished in many ways. For example, each voltage point 4110 can be held at a relatively constant level until the next voltage point is received. This results in a stair-step output which can be smoothed or filtered if desired, as described below.

Figure 41E:
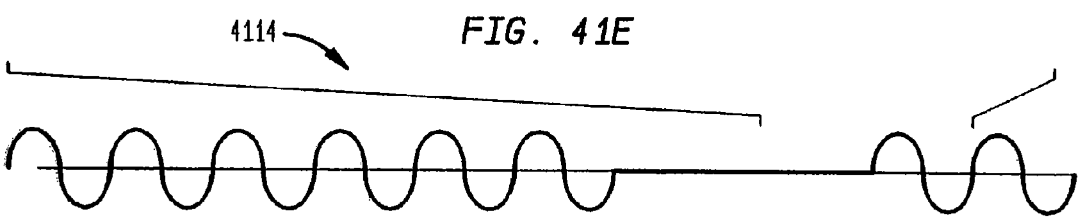

In FIG. 41E, an ASK signal 4114 illustrates the ASK signal 4112, after filtering, on a compressed time scale. Although FIG. 41E illustrates the ASK signal 4114 as a filtered output signal, the output signal does not need to be filtered or smoothed to be within the scope of the invention. Instead, the output signal can be tailored for different applications. The ASK signal 4114 can be demodulated through any conventional amplitude demodulation technique.

When down-converting from FM to AM, the aliasing rate of the under-sampling signal is preferably controlled to optimize the demodulated baseband signal for amplitude output and/or polarity, as desired.

In an alternative embodiment, the aliasing rate is based on the second frequency and the resultant ASK signal is reversed relative to the ASK signal 4114.

The drawings referred to herein illustrate modulation conversion in accordance with the invention. For example, the ASK signal 4114 in FIG. 41E illustrates that the FSK carrier signal 816 was successfully down-converted to the ASK signal 4114 by retaining enough baseband information for sufficient reconstruction.

3.2.2.2 Structural Description

The operation of the under-sampling system 1602 is now described for down-converting the FSK signal 816 to an ASK signal, with reference to the flowchart 1419 and to the timing diagrams of FIGS. 41A-E. In step 1420, the under-sampling module 1606 receives the FSK signal 816 (FIG. 41A). In step 1422, the under-sampling module 1606 receives the under-sampling signal 4107 (FIG. 41C). In step 1424, the under-sampling module 1606 under-samples the FSK signal 816 at the aliasing of the under-sampling signal 4107 to down-convert the FSK signal 816 to the ASK signal 4112 of FIG. 41D or the ASK signal 4114 in FIG. 41E.

3.2.3 Other Example Embodiments

The embodiments described above are provided for purposes of illustration. These embodiments are not intended to limit the invention. Alternate embodiments, differing slightly or substantially from those described herein, will be apparent to persons skilled in the relevant art(s) based on the teachings contained herein. Such alternate embodiments fall within the scope and spirit of the present invention.

3.3 Implementation Examples

Exemplary operational and/or structural implementations related to the method(s), structure(s), and/or embodiments described above are presented in Sections 4 and 5 below. These implementations are presented for purposes of illustration, and not limitation. The invention is not limited to the particular implementation examples described therein. Alternate implementations (including equivalents, extensions, variations, deviations, etc., of those described herein) will be apparent to persons skilled in the relevant art(s) based on the teachings contained herein. Such alternate implementations fall within the scope and spirit of the present invention.

4. Implementation Examples

Exemplary operational and/or structural implementations related to the method(s), structure(s), and/or embodiments described in the Sub-Sections above are presented in this section (and its subsections). These implementations are presented herein for purposes of illustration, and not limitation. The invention is not limited to the particular implementation examples described herein. Alternate implementations (including equivalents, extensions, variations, deviations, etc., of those described herein) will be apparent to persons skilled in the relevant art(s) based on the teachings contained herein. Such alternate implementations fall within the scope and spirit of the present invention.

FIG. 13 illustrates a generic aliasing system 1302, including an aliasing module 1306. FIG. 16 illustrates an under-sampling system 1602, which includes an under-sampling module 1606. The under-sampling module 1606 receives an under-sampling signal 1604 having an aliasing rate $F_{AR}$. The under-sampling signal 1604 includes a train of pulses having negligible apertures that tend towards zero time in duration. The pulses repeat at the aliasing rate $F_{AR}$. The under-sampling system 1602 is an example implementation of the generic aliasing system 1303. The under-sampling system 1602 outputs a down-converted signal 1308A.

Figure 26A:
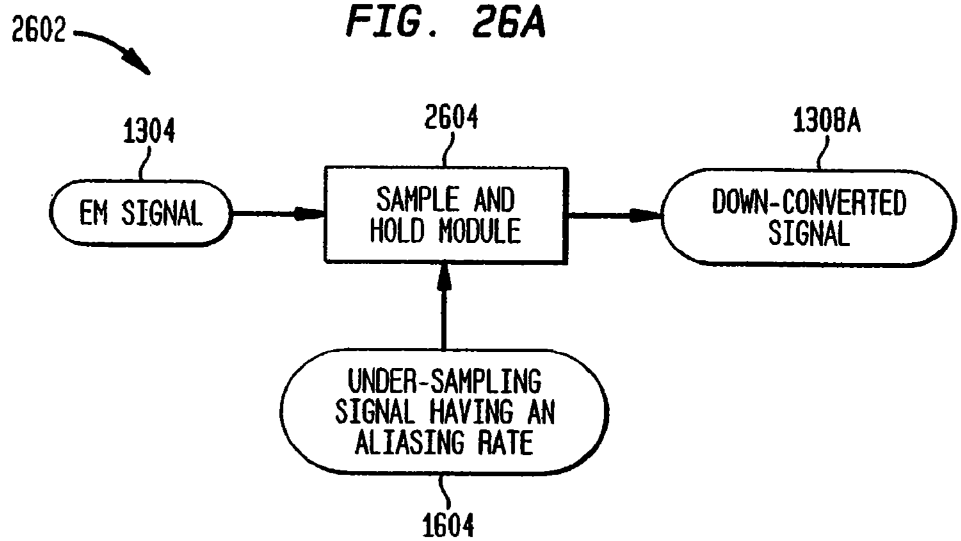
FIG. 26A illustrates a structural block diagram of an exemplary sample and hold system according to an embodiment of the invention.

FIG. 26A illustrates an exemplary sample and hold system 2602, which is an exemplary implementation of the under-sampling system 1602. The sample and hold system 2602 is described below.

Figure 26B:
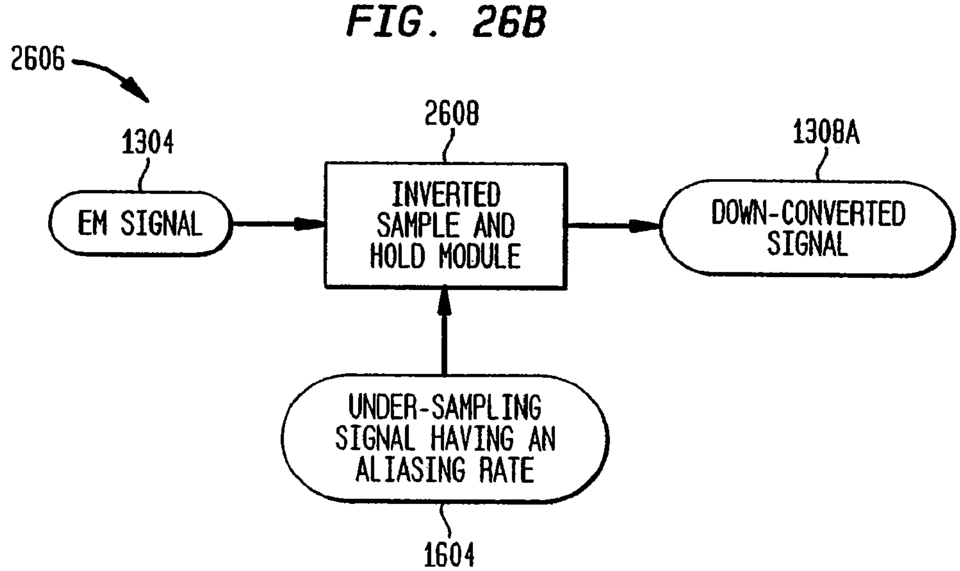
FIG. 26B illustrates a structural block diagram of an exemplary inverted sample and hold system according to an embodiment of the invention.

FIG. 26B illustrates an exemplary inverted sample and hold system 2606, which is an alternative example implementation of the under-sampling system 1602. The inverted sample and hold system 2606 is described below.

4.1 The Under-Sampling System as a Sample and Hold System

FIG. 26A is a block diagram of a the sample and hold system 2602, which is an example embodiment of the under-sampling module 1606 in FIG. 16, which is an example embodiment of the generic aliasing module 1306 in FIG. 13.

The sample and hold system 2602 includes a sample and hold module 2604, which receives the EM signal 1304 and the under-sampling signal 1604. The sample and hold module 2604 under-samples the EM signal at the aliasing rate of the under-sampling signal 1604, as described in the sections above with respect to the flowcharts 1401 in FIG. 14A, 1407 in FIG. 14B, 1413 in FIGS. 14C and 1419 in FIG. 14D. The under-sampling system 1602 outputs a down-converted signal 1308A.

Figure 27:
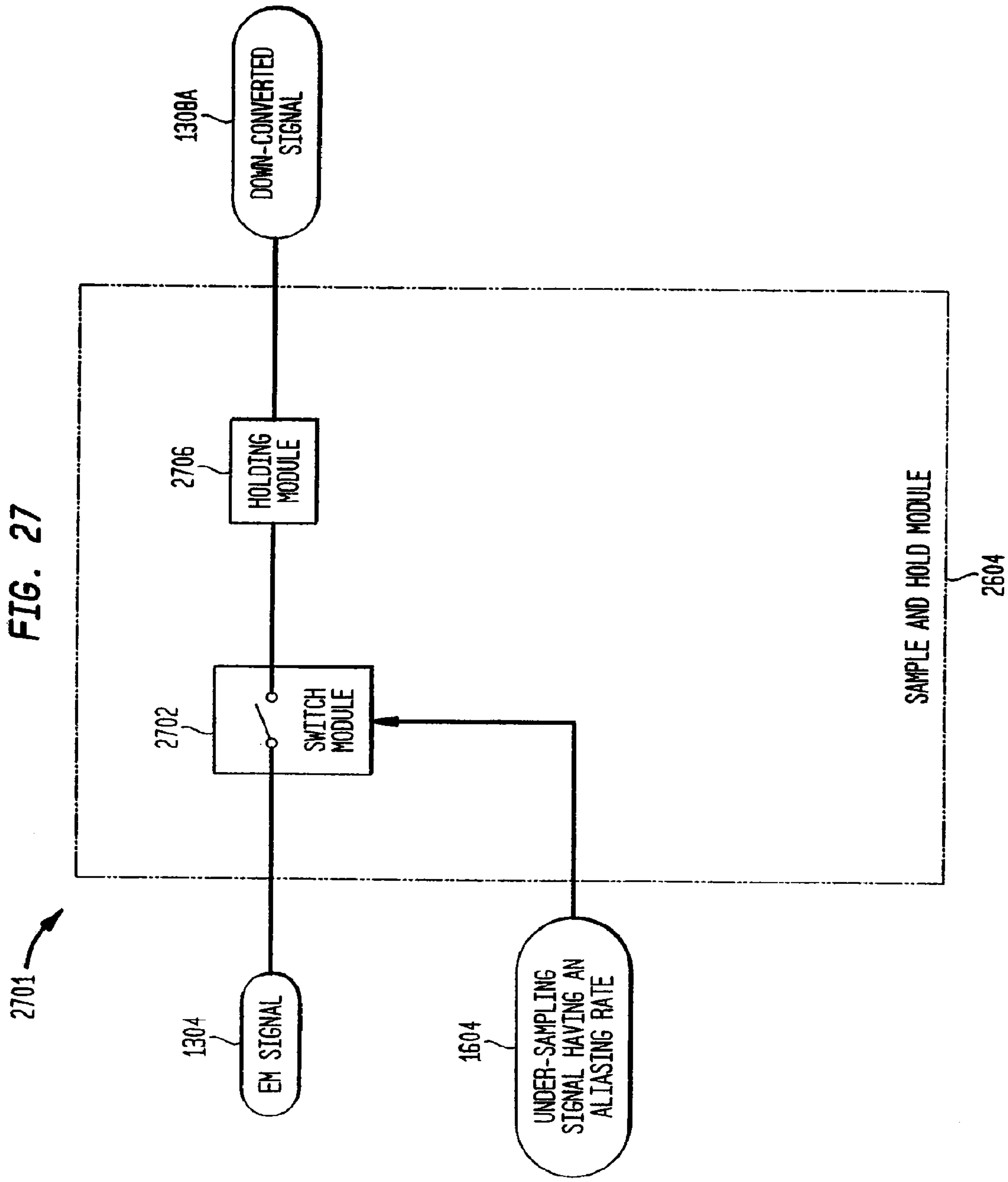
FIG. 27 illustrates a structural block diagram of sample and hold module according to an embodiment of the invention.

FIG. 27 illustrates an under-sampling system 2701 as a sample and hold system, which is an example implementation of the under-sampling system 2602. The under-sampling system 2701 includes a switch module 2702 and a holding module 2706. The under-sampling system 2701 is described below.

Figure 24A:
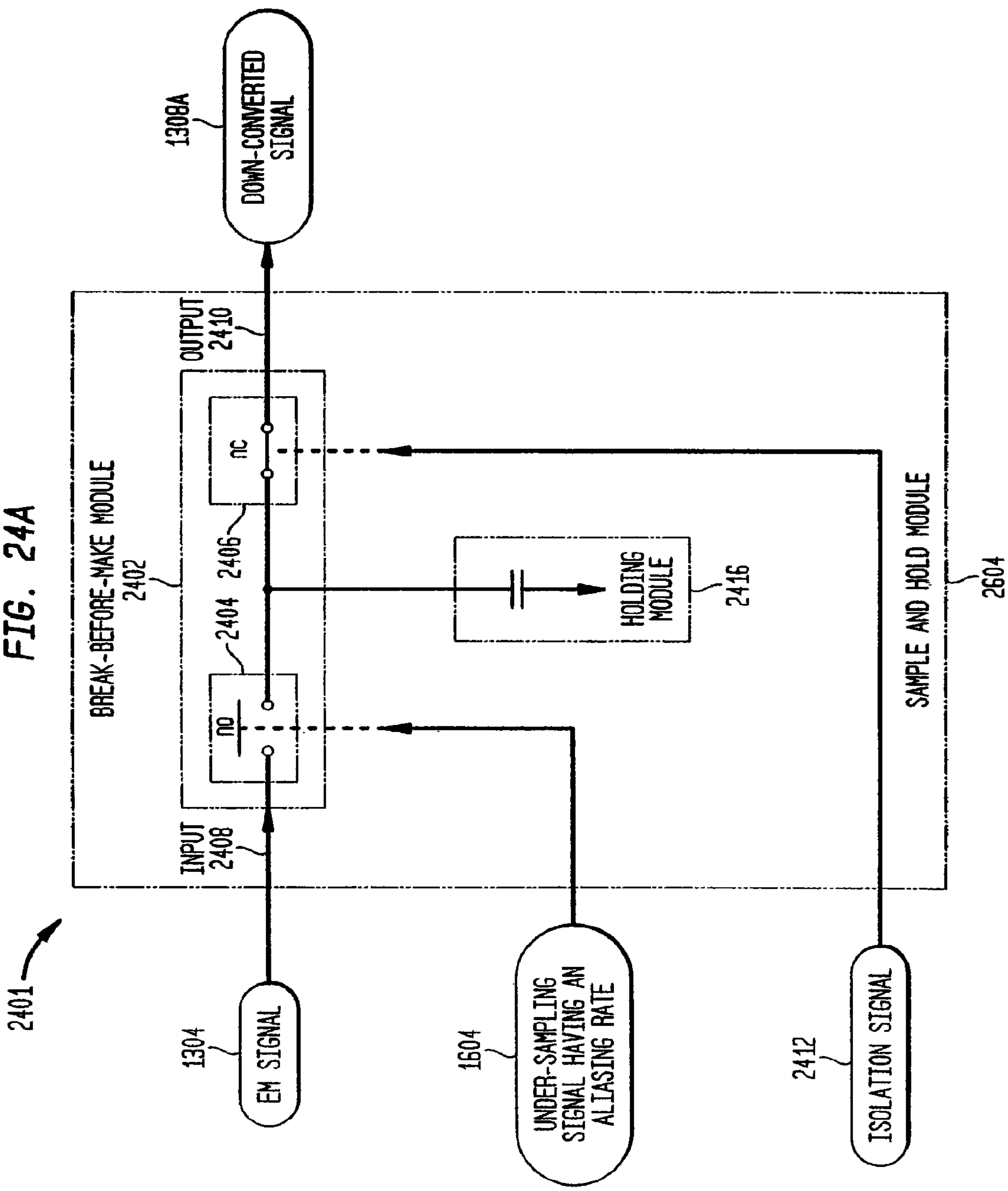
FIG. 24A illustrates a structural block diagram of a make before break under-sampling system according to an embodiment of the invention.

FIG. 24A illustrates an under-sampling system 2401 as a break before make under-sampling system, which is an alternative implementation of the under-sampling system 2602. The break before make under-sampling system 2401 is described below.

4.1.1 The Sample and Hold System as a Switch Module and a Holding Module

FIG. 27 illustrates an exemplary embodiment of the sample and hold module 2604 from FIG. 26A. In the exemplary embodiment, the sample and hold module 2604 includes a switch module 2702, and a holding module 2706.

Preferably, the switch module 2702 and the holding module 2706 under-sample the EM signal 1304 to down-convert it in any of the manners shown in the operation flowcharts 1401, 1407, 1413 and 1419. For example, the sample and hold module 2604 can receive and under-sample any of the modulated carrier signal signals described above, including, but not limited to, the analog AM signal 516, the digital AM signal 616, the analog FM signal 716, the digital FM signal 816, the analog PM signal 916, the digital PM signal 1016, etc., and any combinations thereof.

The switch module 2702 and the holding module 2706 down-convert the EM signal 1304 to an intermediate signal, to a demodulated baseband or to a different modulation scheme, depending upon the aliasing rate.

For example, operation of the switch module 2702 and the holding module 2706 are now described for down-converting the EM signal 1304 to an intermediate signal, with reference to the flowchart 1407 and the example timing diagrams in FIG. 79A-F.

Figures 79A, 79B, 79C, 79D, 79E, 79F:
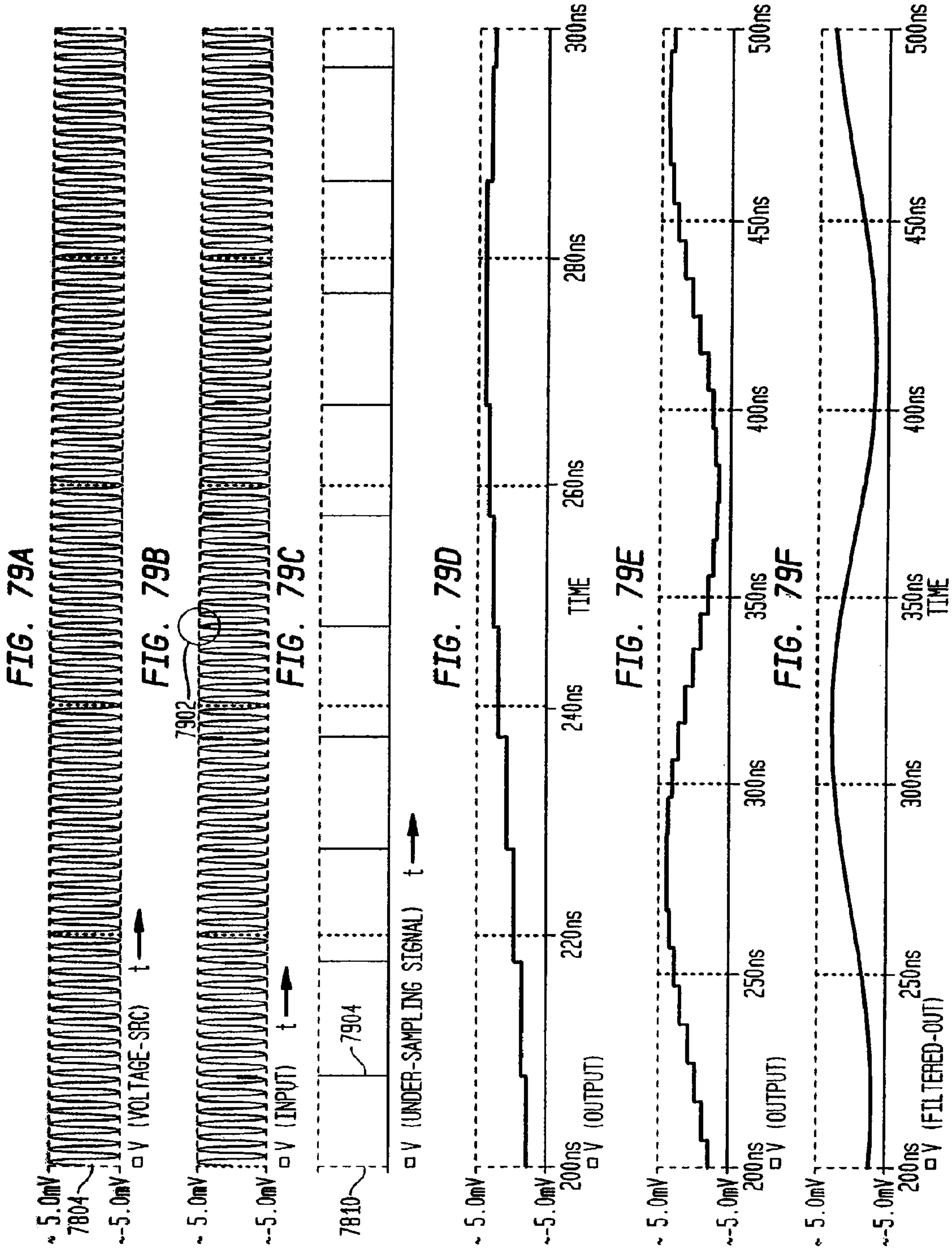
FIGS. 79A-F illustrate example timing diagrams for under-sampling systems according to embodiments of the invention.

In step 1408, the switch module 2702 receives the EM signal 1304 (FIG. 79A). In step 1410, the switch module 2702 receives the under-sampling signal 1604 (FIG. 79C). In step 1412, the switch module 2702 and the holding module 2706 cooperate to under-sample the EM signal 1304 and down-convert it to an intermediate signal. More specifically, during step 1412, the switch module 2702 closes during each under-sampling pulse to couple the EM signal 1304 to the holding module 2706. In an embodiment, the switch module 2702 closes on rising edges of the pulses. In an alternative embodiment, the switch module 2702 closes on falling edges of the pulses. When the EM signal 1304 is coupled to the holding module 2706, the amplitude of the EM signal 1304 is captured by the holding module 2706. The holding module 2706 is designed to capture and hold the amplitude of the EM signal 1304 within the short time frame of each negligible aperture pulse. FIG. 79B illustrates the EM signal 1304 after under-sampling.

The holding module 2706 substantially holds or maintains each under-sampled amplitude until a subsequent under-sample. (FIG. 79D). The holding module 2706 outputs the under-sampled amplitudes as the down-converted signal 1308A. The holding module 2706 can output the down-converted signal 1308A as an unfiltered signal, such as a stair step signal (FIG. 79E), as a filtered down-converted signal (FIG. 79F) or as a partially filtered down-converted signal.

4.1.2 The Sample and Hold System as Break-Before-Make Module

FIG. 24A illustrates a break-before-make under-sampling system 2401, which is an alternative implementation of the under-sampling system 2602.

Preferably, the break-before-make under-sampling system 2401 under-samples the EM signal 1304 to down-convert it in any of the manners shown in the operation flowcharts 1401, 1407, 1413 and 1419. For example, the sample and hold module 2604 can receive and under-sample any of the unmodulated or modulated carrier signal signals described above, including, but not limited to, the analog AM signal 516, the digital AM signal 616, the analog FM signal 716, the digital FM signal 816, the analog PM signal 916, the digital PM signal 1016, etc., and combinations thereof.

The break-before-make under-sampling system 2401 down-converts the EM signal 1304 to an intermediate signal, to a demodulated baseband or to a different modulation scheme, depending upon the aliasing rate.

FIG. 24A includes a break-before-make switch 2402. The break-before-make switch 2402 includes a normally open switch 2404 and a normally closed switch 2406. The normally open switch 2404 is controlled by the under-sampling signal 1604, as previously described. The normally closed switch 2406 is controlled by an isolation signal 2412. In an embodiment, the isolation signal 2412 is generated from the under-sampling signal 1604. Alternatively, the under-sampling signal 1604 is generated from the isolation signal 2412. Alternatively, the isolation signal 2412 is generated independently from the under-sampling signal 1604. The break-before-make module 2402 substantially isolates a sample and hold input 2408 from a sample and hold output 2410.

Figure 24B:
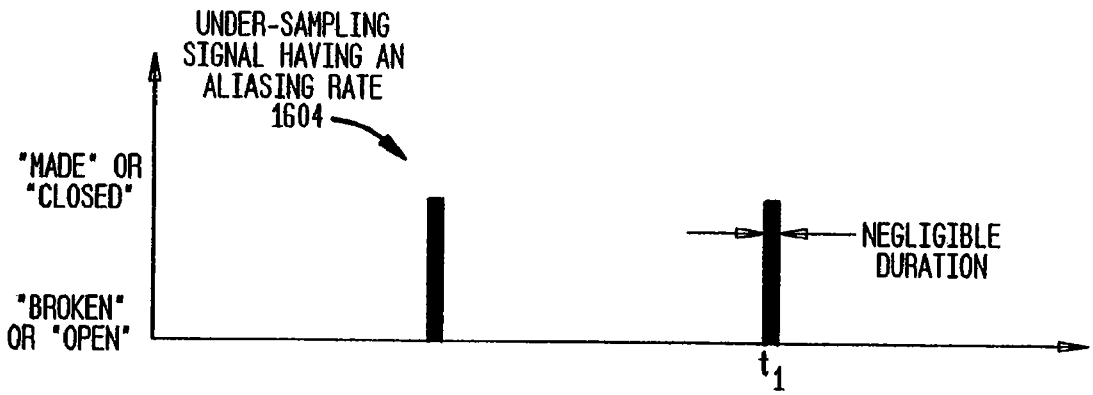
FIG. 24B illustrates an example timing diagram of an under sampling signal according to an embodiment of the invention.
Figure 24C:
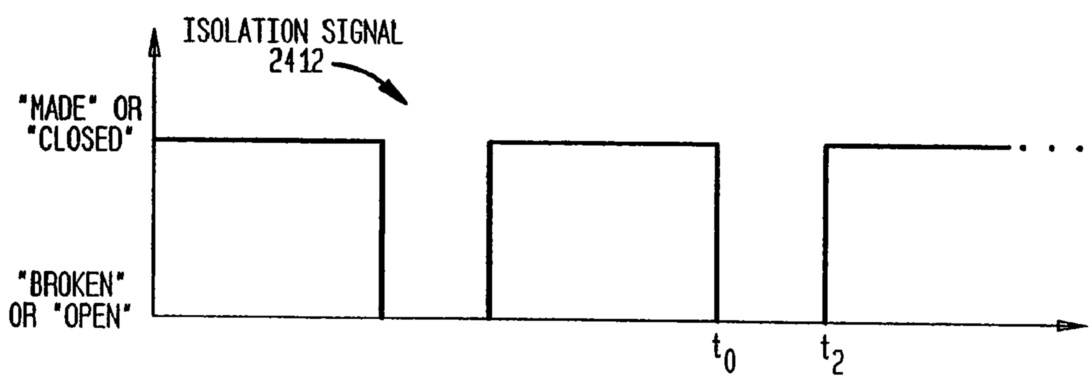
FIG. 24C illustrates an example timing diagram of an isolation signal according to an embodiment of the invention.

FIG. 24B illustrates an example timing diagram of the under-sampling signal 1604 that controls the normally open switch 2404. FIG. 24C illustrates an example timing diagram of the isolation signal 2412 that controls the normally closed switch 2406. Operation of the break-before-make module 2402 is described with reference to the example timing diagrams in FIGS. 24B and 24C.

Prior to time t0, the normally open switch 2404 and the normally closed switch 2406 are at their normal states.

At time t0, the isolation signal 2412 in FIG. 24C opens the normally closed switch 2406. Then, just after time t0, the normally open switch 2404 and the normally closed switch 2406 are open and the input 2408 is isolated from the output 2410.

At time t1, the under-sampling signal 1604 in FIG. 24B briefly closes the normally open switch 2404. This couples the EM signal 1304 to the holding module 2416.

Prior to t2, the under-sampling signal 1604 in FIG. 24B opens the normally open switch 2404. This de-couples the EM signal 1304 from the holding module 2416.

At time t2, the isolation signal 2412 in FIG. 24C closes the normally closed switch 2406. This couples the holding module 2416 to the output 2410.

The break-before-make under-sampling system 2401 includes a holding module 2416, which can be similar to the holding module 2706 in FIG. 27. The break-before-make under-sampling system 2401 down-converts the EM signal 1304 in a manner similar to that described with reference to the under-sampling system 2702 in FIG. 27.

4.1.3 Example Implementations of the Switch Module

The switch module 2702 in FIG. 27 and the switch modules 2404 and 2406 in FIG. 24A can be any type of switch device that preferably has a relatively low impedance when closed and a relatively high impedance when open. The switch modules 2702, 2404 and 2406 can be implemented with normally open or normally closed switches. The switch device need not be an ideal switch device. FIG. 28B illustrates the switch modules 2702, 2404 and 2406 as, for example, a switch module 2810.

The switch device 2810 (e.g., switch modules 2702, 2404 and 2406) can be implemented with any type of suitable switch device, including, but not limited to mechanical switch devices and electrical switch devices, optical switch devices, etc., and combinations thereof. Such devices include, but are not limited to transistor switch devices, diode switch devices, relay switch devices, optical switch devices, micro-machine switch devices, etc.

In an embodiment, the switch module 2810 can be implemented as a transistor, such as, for example, a field effect transistor (FET), a bi-polar transistor, or any other suitable circuit switching device.

Figure 28A:
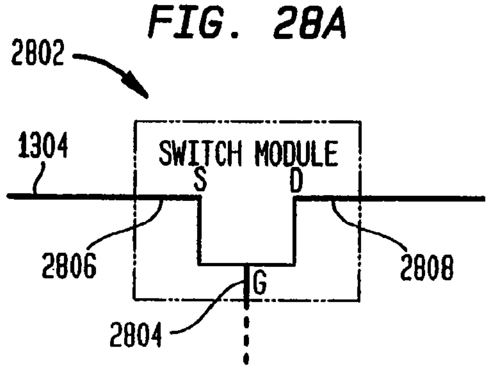
FIGS. 28A-D illustrate example implementations of a switch module according to embodiments of the invention.
Figure 28B:
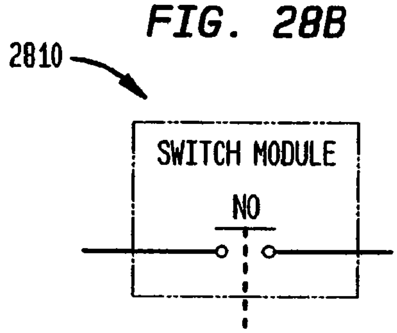

In FIG. 28A, the switch module 2810 is illustrated as a FET 2802. The FET 2802 can be any type of FET, including, but not limited to, a MOSFET, a JFET, a GaAsFET, etc. The FET 2802 includes a gate 2804, a source 2806 and a drain 2808. The gate 2804 receives the under-sampling signal 1604 to control the switching action between the source 2806 and the drain 2808. Generally, the source 2806 and the drain 2808 are interchangeable.

It should be understood that the illustration of the switch module 2810 as a FET 2802 in FIG. 28A is for example purposes only. Any device having switching capabilities could be used to implement the switch module 2810 (e.g., switch modules 2702, 2404 and 2406), as will be apparent to persons skilled in the relevant art(s) based on the discussion contained herein.

Figure 28C:
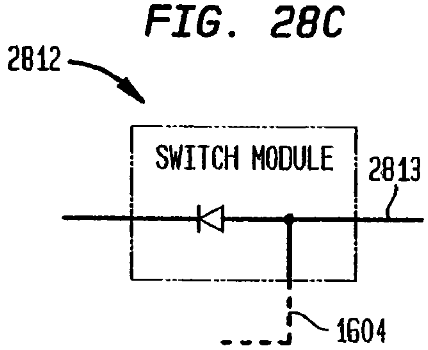

In FIG. 28C, the switch module 2810 is illustrated as a diode switch 2812, which operates as a two lead device when the under-sampling signal 1604 is coupled to the output 2813.

Figure 28D:
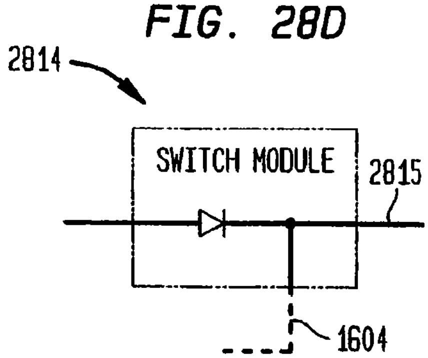

In FIG. 28D, the switch module 2810 is illustrated as a diode switch 2814, which operates as a two lead device when the under-sampling signal 1604 is coupled to the output 2815.

4.1.4 Example Implementations of the Holding Module

The holding modules 2706 and 2416 preferably captures and holds the amplitude of the original, unaffected, EM signal 1304 within the short time frame of each negligible aperture under-sampling signal pulse.

Figure 29A:
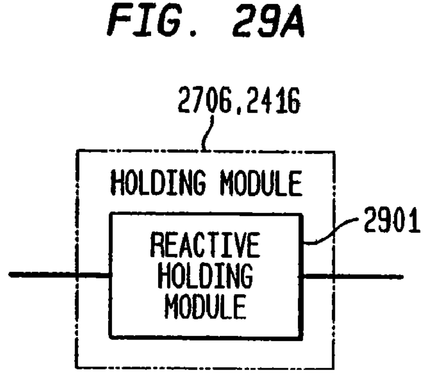
FIGS. 29A-F illustrate example implementations of a holding module according to embodiments of the present invention.

In an exemplary embodiment, holding modules 2706 and 2416 are implemented as a reactive holding module 2901 in FIG. 29A, although the invention is not limited to this embodiment. A reactive holding module is a holding module that employs one or more reactive electrical components to preferably quickly charge to the amplitude of the EM signal 1304. Reactive electrical components include, but are not limited to, capacitors and inductors.

Figure 29B:
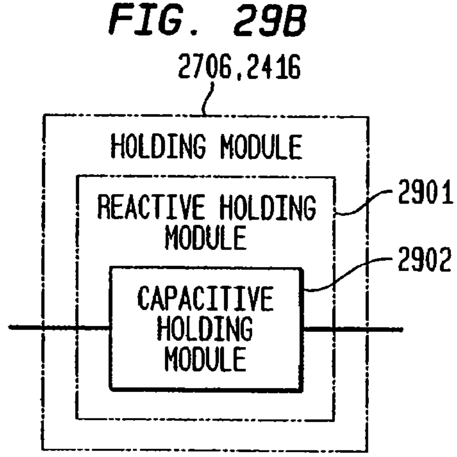
Figure 29C:
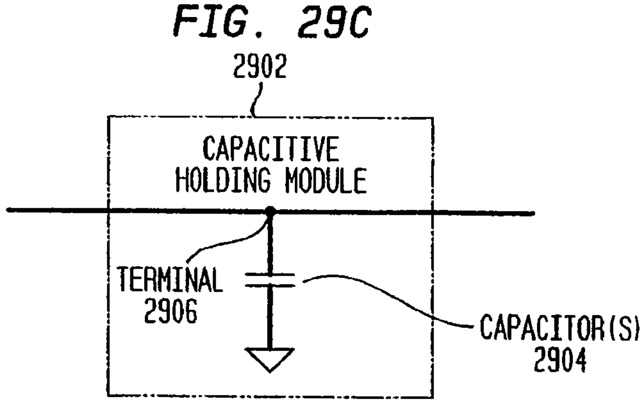

In an embodiment, the holding modules 2706 and 2416 include one or more capacitive holding elements, illustrated in FIG. 29B as a capacitive holding module 2902. In FIG. 29C, the capacitive holding module 2902 is illustrated as one or more capacitors illustrated generally as capacitor(s) 2904. Recall that the preferred goal of the holding modules 2706 and 2416 is to quickly charge to the amplitude of the EM signal 1304. In accordance with principles of capacitors, as the negligible aperture of the under-sampling pulses tends to zero time in duration, the capacitive value of the capacitor 2904 can tend towards zero Farads. Example values for the capacitor 2904 can range from tens of pico Farads to fractions of pico'Farads. A terminal 2906 serves as an output of the sample and hold module 2604. The capacitive holding module 2902 provides the under-samples at the terminal 2906, where they can be measured as a voltage. FIG. 29F illustrates the capacitive holding module 2902 as including a series capacitor 2912, which can be utilized in an inverted sample and hold system as described below.

Figure 29D:
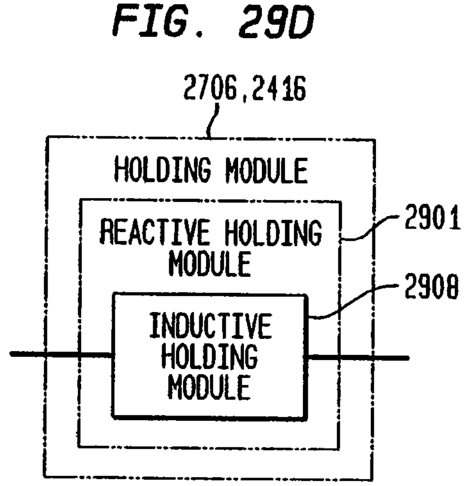

In an alternative embodiment, the holding modules 2706 and 2416 include one or more inductive holding elements, illustrated in FIG. 29D as an inductive holding module 2908.

Figure 29E:
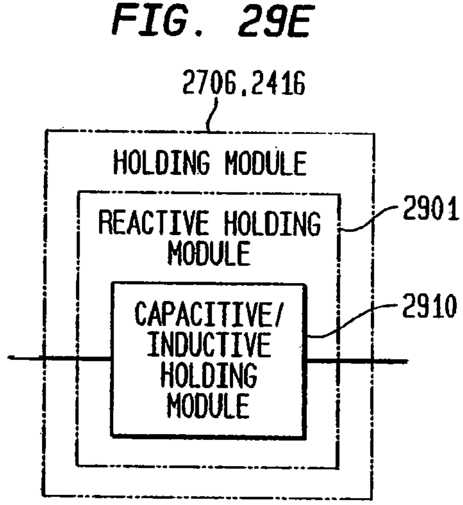
Figure 29F:
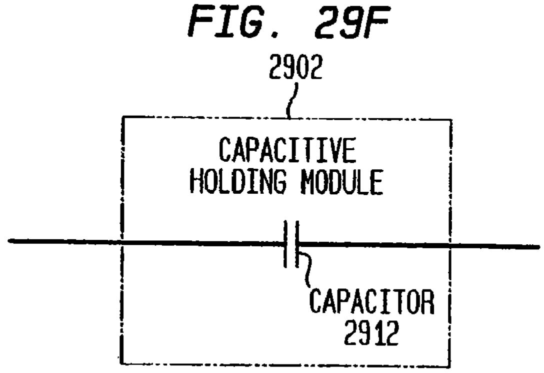

In an alternative embodiment, the holding modules 2706 and 2416 include a combination of one or more capacitive holding elements and one or more inductive holding elements, illustrated in FIG. 29E as a capacitive/inductive holding module 2910.

Figure 29G:
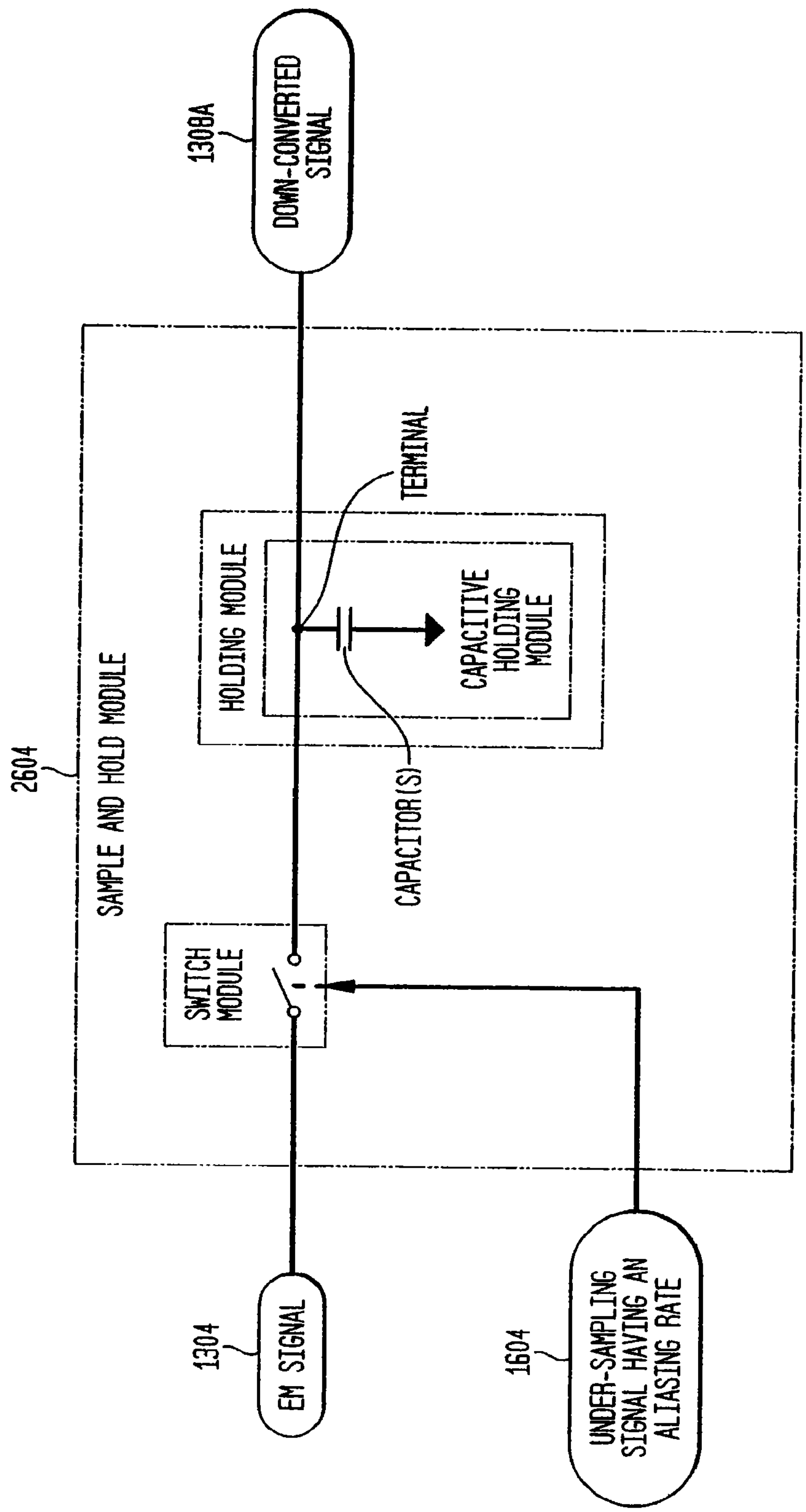
FIG. 29G illustrates an integrated under-sampling system according to embodiments of the invention.

FIG. 29G illustrates an integrated under-sampling system that can be implemented to down-convert the EM signal 1304 as illustrated in, and described with reference to, FIGS. 79A-F.

4.1.5 Optional Under-Sampling Signal Module

Figure 30:
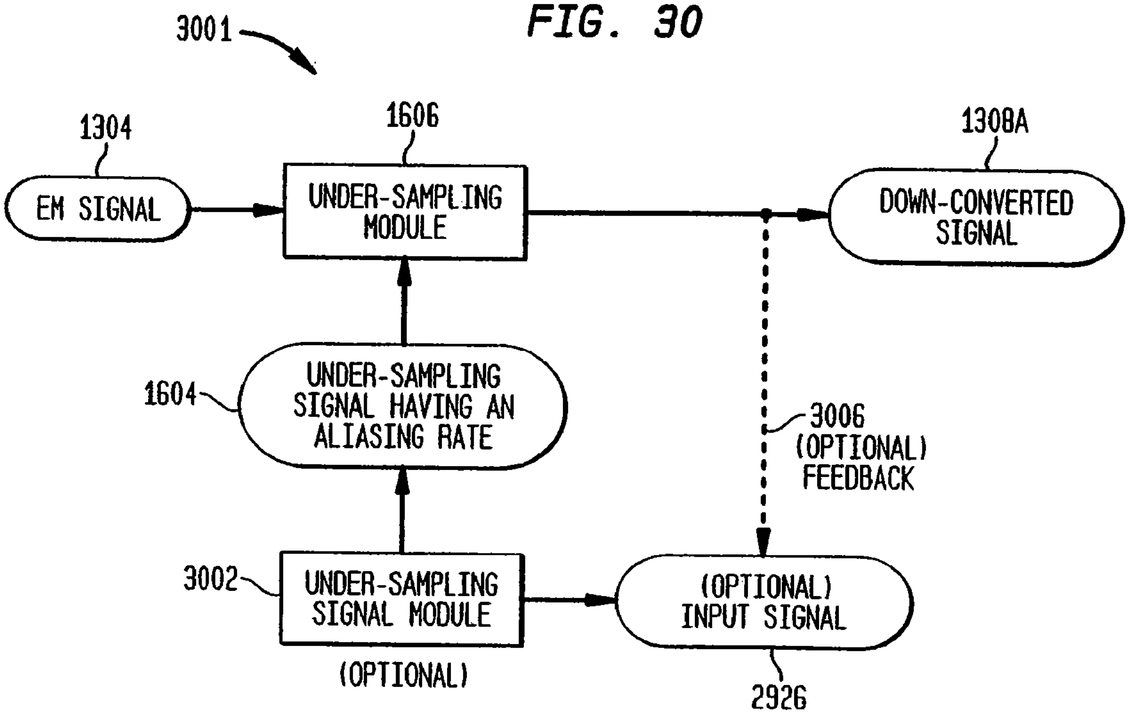
FIG. 30 illustrates a structural block diagram of an under-sampling system with an under-sampling signal optimizer according to embodiments of the invention.

FIG. 30 illustrates an under-sampling system 3001, which is an example embodiment of the under-sampling system 1602. The under-sampling system 3001 includes an optional under-sampling signal module 3002 that can perform any of a variety of functions or combinations of functions, including, but not limited to, generating the under-sampling signal 1604.

Figure 29H:
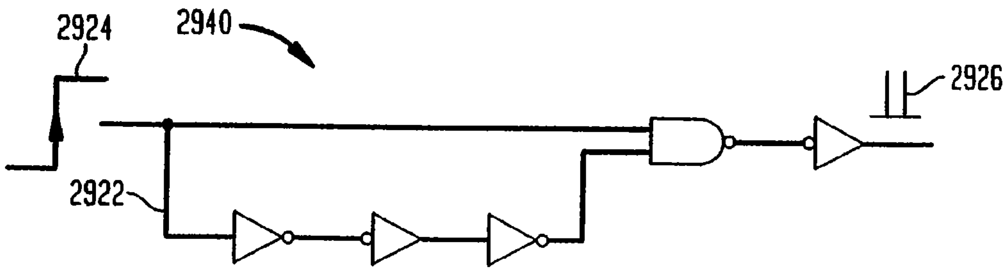
FIGS. 29H-K illustrate example implementations of pulse generators according to embodiments of the invention.
Figure 29I:
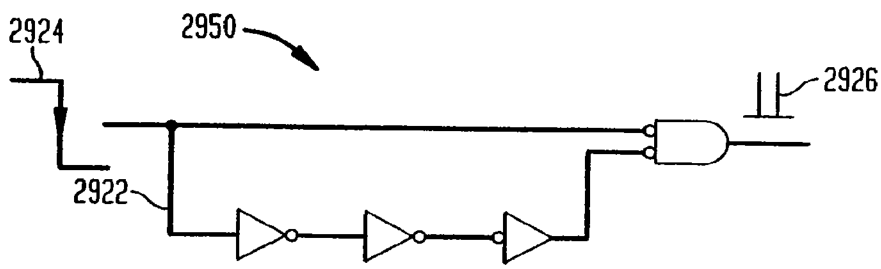
Figure 29J:
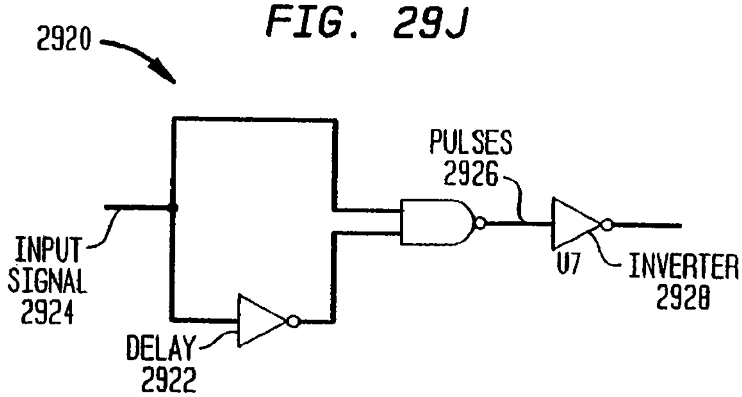

In an embodiment, the optional under-sampling signal module 3002 includes an aperture generator, an example of which is illustrated in FIG. 29J as an aperture generator 2920. The aperture generator 2920 generates negligible aperture pulses 2926 from an input signal 2924. The input signal 2924 can be any type of periodic signal, including, but not limited to, a sinusoid, a square wave, a saw-tooth wave, etc. Systems for generating the input signal 2924 are described below.

The width or aperture of the pulses 2926 is determined by delay through the branch 2922 of the aperture generator 2920. Generally, as the desired pulse width decreases, the tolerance requirements of the aperture generator 2920 increase. In other words, to generate negligible aperture pulses for a given input EM frequency, the components utilized in the example aperture generator 2920 require greater reaction times, which are typically obtained with more expensive elements, such as gallium arsenide (GaAs), etc.

Figure 29K:
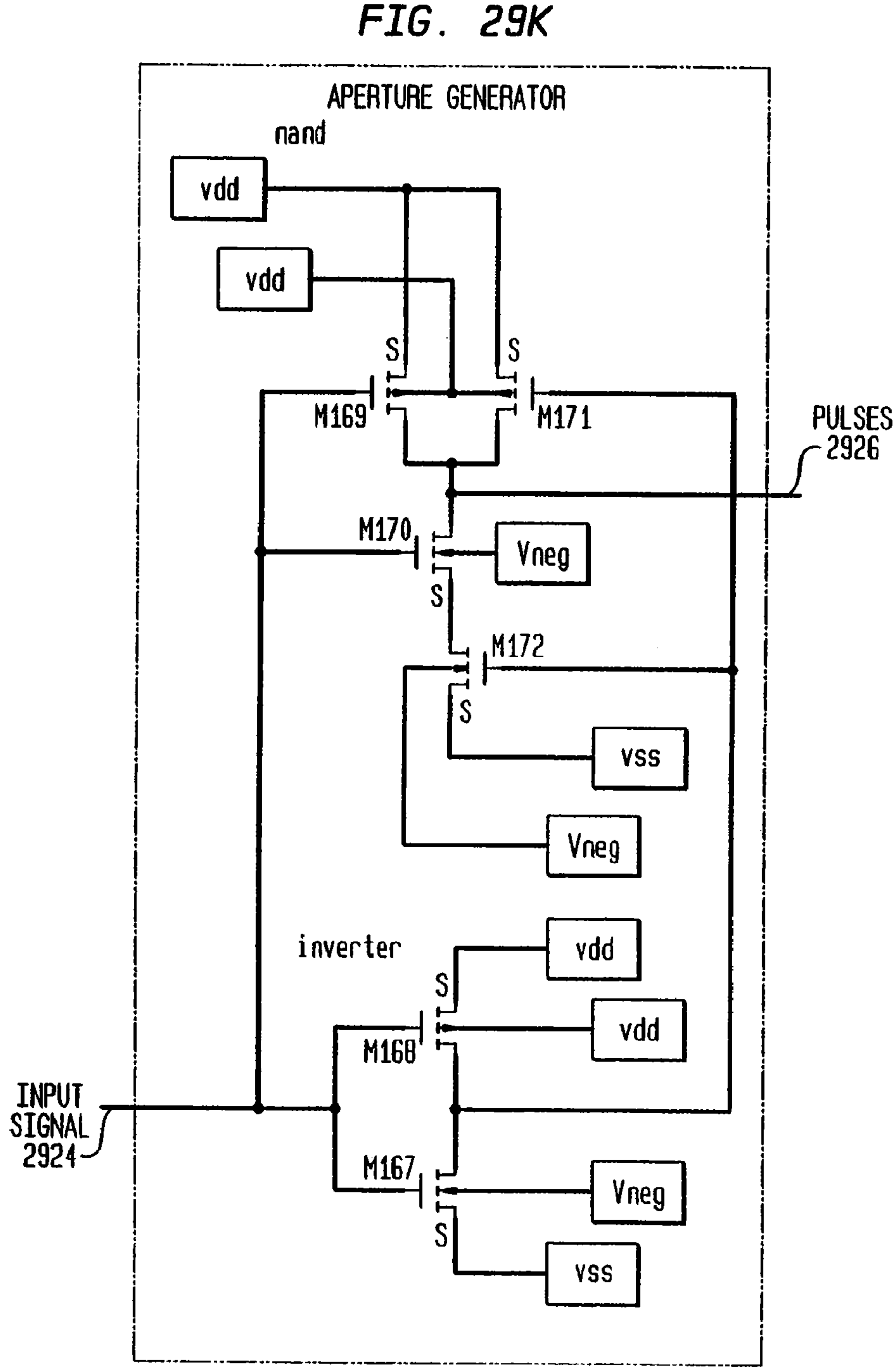

The example logic and implementation shown in the aperture generator 2920 are provided for illustrative purposes only, and are not limiting. The actual logic employed can take many forms. The example aperture generator 2920 includes an optional inverter 2928, which is shown for polarity consistency with other examples provided herein. An example implementation of the aperture generator 2920 is illustrated in FIG. 29K.

Additional examples of aperture generation logic is provided in FIGS. 29H and 291. FIG. 29H illustrates a rising edge pulse generator 2940, which generates pulses 2926 on rising edges of the input signal 2924. FIG. 29I illustrates a falling edge pulse generator 2950, which generates pulses 2926 on falling edges of the input signal 2924.

Figure 29L:
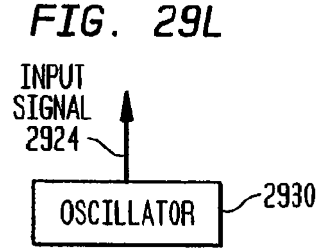
FIG. 29L illustrates an example oscillator.

In an embodiment, the input signal 2924 is generated externally of the under-sampling signal module 3002, as illustrated in FIG. 30. Alternatively, the input signal 2924 is generated internally by the under-sampling signal module 3002. The input signal 2924 can be generated by an oscillator, as illustrated in FIG. 29L by an oscillator 2930. The oscillator 2930 can be internal to the under-sampling signal module 3002 or external to the under-sampling signal module 3002. The oscillator 2930 can be external to the under-sampling system 3001.

The type of down-conversion performed by the under-sampling system 3001 depends upon the aliasing rate of the under-sampling signal 1604, which is determined by the frequency of the pulses 2926. The frequency of the pulses 2926 is determined by the frequency of the input signal 2924. For example, when the frequency of the input signal 2924 is substantially equal to a harmonic or a sub-harmonic of the EM signal 1304, the EM signal 1304 is directly down-converted to baseband (e.g. when the EM signal is an AM signal or a PM signal), or converted from FM to a non-FM signal. When the frequency of the input signal 2924 is substantially equal to a harmonic or a sub-harmonic of a difference frequency, the EM signal 1304 is down-converted to an intermediate signal.

The optional under-sampling signal module 3002 can be implemented in hardware, software, firmware, or any combination thereof.

4.2 The Under-Sampling System as an Inverted Sample and Hold

FIG. 26B illustrates an exemplary inverted sample and hold system 2606, which is an alternative example implementation of the under-sampling system 1602.

Figure 42:
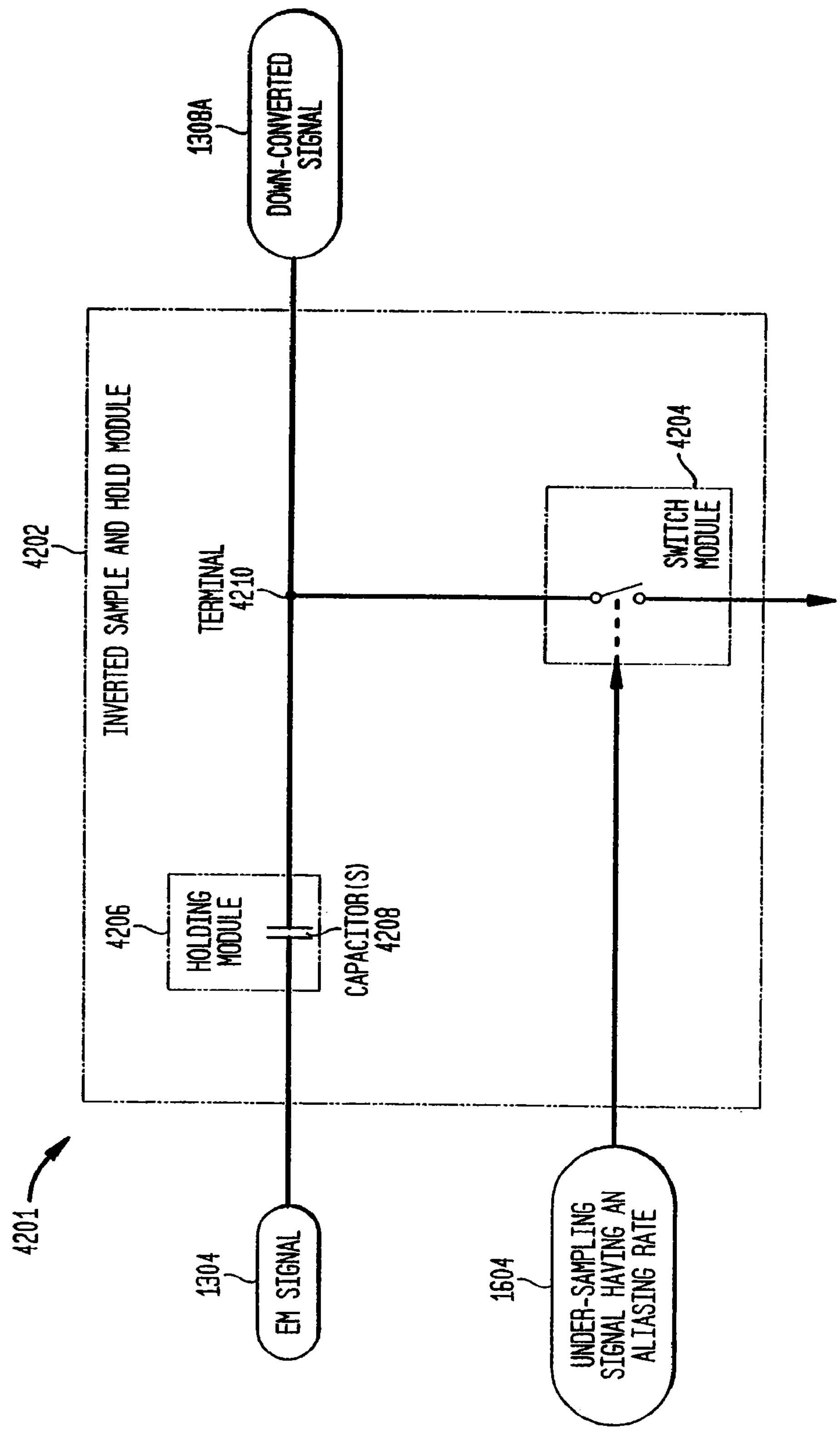
FIG. 42 illustrates a structural block diagram of an inverted sample and hold module according to an embodiment of the present invention.

FIG. 42 illustrates a inverted sample and hold system 4201, which is an example implementation of the inverted sample and hold system 2606 in FIG. 26B. The sample and hold system 4201 includes a sample and hold module 4202, which includes a switch module 4204 and a holding module 4206. The switch module 4204 can be implemented as described above with reference to FIGS. 28A-D.

The holding module 4206 can be implemented as described above with reference to FIGS. 29A-F, for the holding modules 2706 and 2416. In the illustrated embodiment, the holding module 4206 includes one or more capacitors 4208. The capacitor(s) 4208 are selected to pass higher frequency components of the EM signal 1304 through to a terminal 4210, regardless of the state of the switch module 4204. The capacitor 4208 stores charge from the EM signal 1304 during aliasing pulses of the under-sampling signal 1604 and the signal at the terminal 4210 is thereafter off-set by an amount related to the charge stored in the capacitor 4208.

Figures 34A, 34B, 34C, 34D, 34E, 34F:
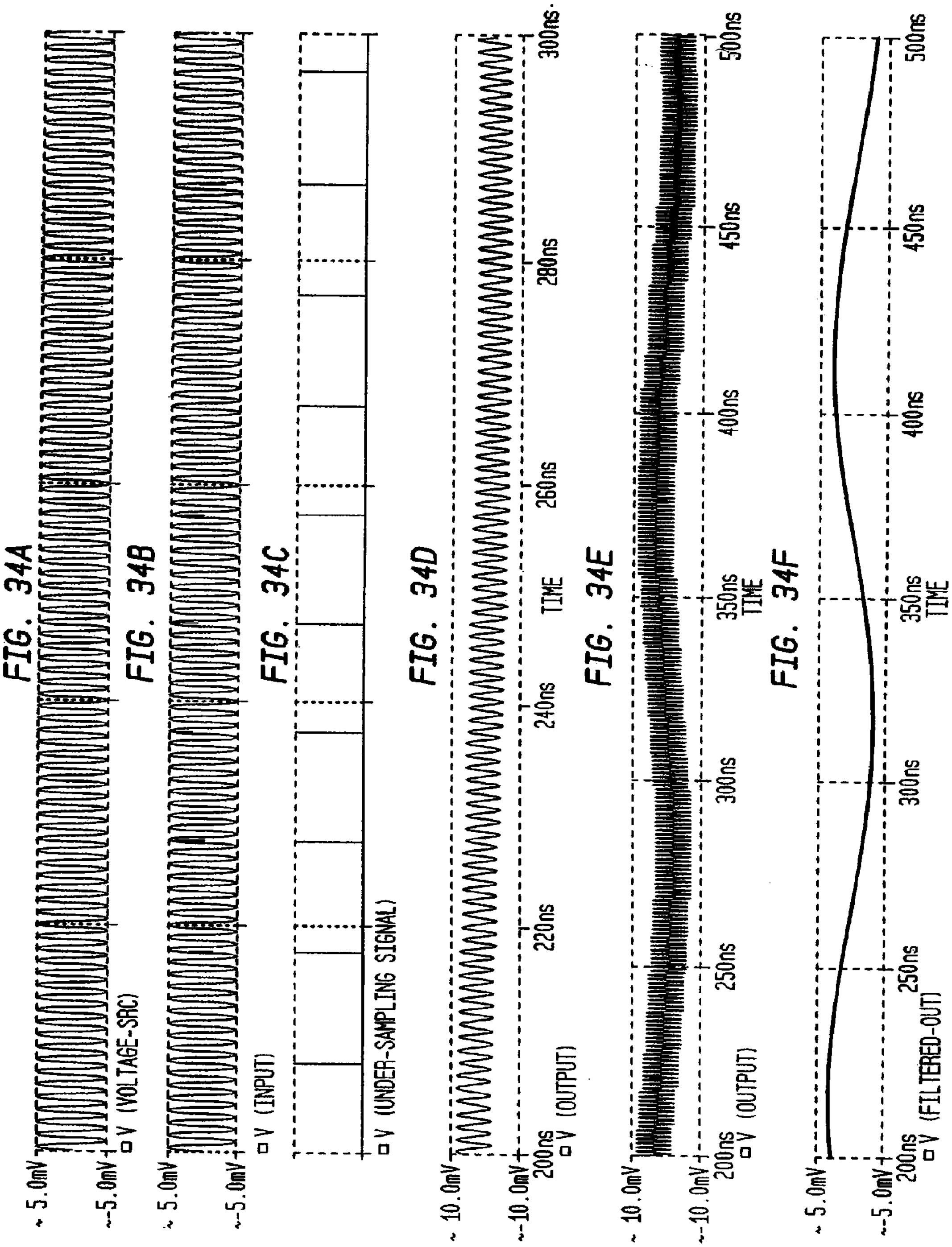
FIGS. 34A-F illustrate example signal diagrams associated with an inverted sample and hold module according to embodiments of the invention.

Operation of the inverted sample and hold system 4201 is illustrated in FIGS. 34A-F. FIG. 34A illustrates an example EM signal 1304. FIG. 34B illustrates the EM signal 1304 after under-sampling. FIG. 34C illustrates the under-sampling signal 1606, which includes a train of aliasing pulses having negligible apertures.

FIG. 34D illustrates an example down-converted signal 1308A. FIG. 34E illustrates the down-converted signal 1308A on a compressed time scale. Since the holding module 4206 is series element, the higher frequencies (e.g., RF) of the EM signal 1304 can be seen on the down-converted signal. This can be filtered as illustrated in FIG. 34F.

The inverted sample and hold system 4201 can be used to down-convert any type of EM signal, including modulated carrier signals and unmodulated carrier signals, to IF signals and to demodulated baseband signals.

4.3 Other Implementations

The implementations described above are provided for purposes of illustration. These implementations are not intended to limit the invention. Alternate implementations, differing slightly or substantially from those described herein, will be apparent to persons skilled in the relevant art(s) based on the teachings contained herein. Such alternate implementations fall within the scope and spirit of the present invention.

5. Optional Optimizations of Under-Sampling at an Aliasing Rate

The methods and systems described in sections above can be optionally optimized with one or more of the optimization methods or systems described below.

5.1 Doubling the Aliasing Rate ($F_{AR}$) of the Under-Sampling Signal

In an embodiment, the optional under-sampling signal module 3002 in FIG. 30 includes a pulse generator module that generates aliasing pulses at a multiple of the frequency of the oscillating source, such as twice the frequency of the oscillating source. The input signal 2926 may be any suitable oscillating source.

Figure 31:
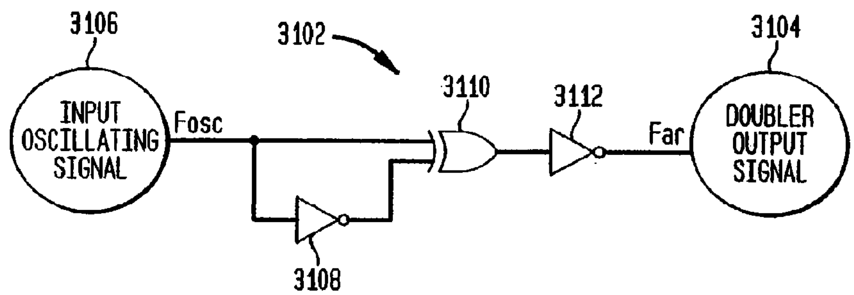
FIG. 31 illustrates a structural block diagram of an under-sampling signal optimizer according to embodiments of the present invention.
Figure 43A:
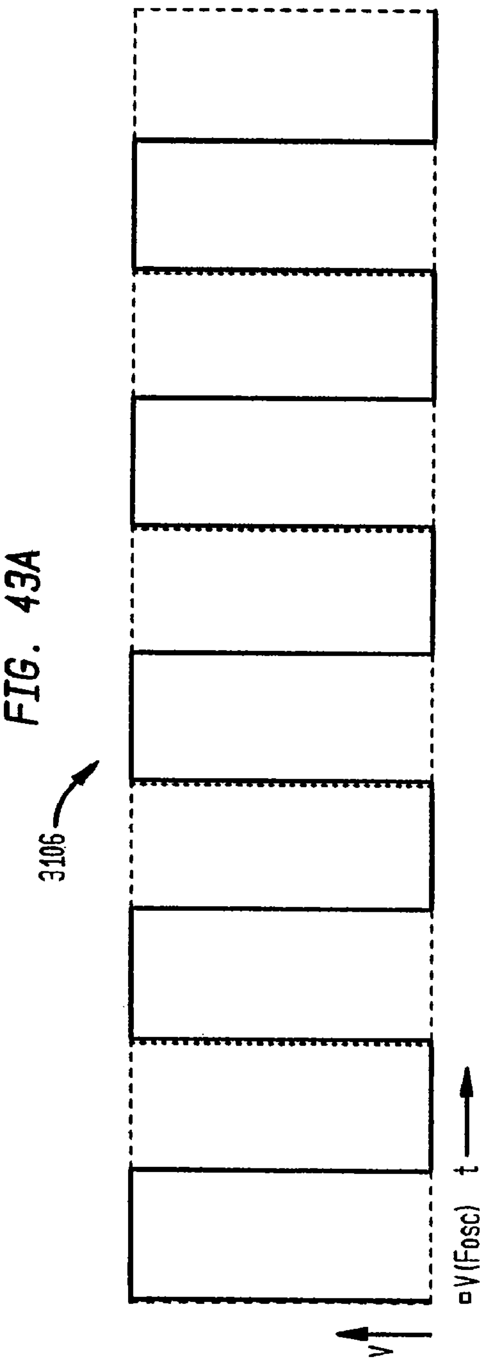
FIGS. 43A and 43B illustrate example waveforms present in the circuit of FIG. 31.
Figure 43B:
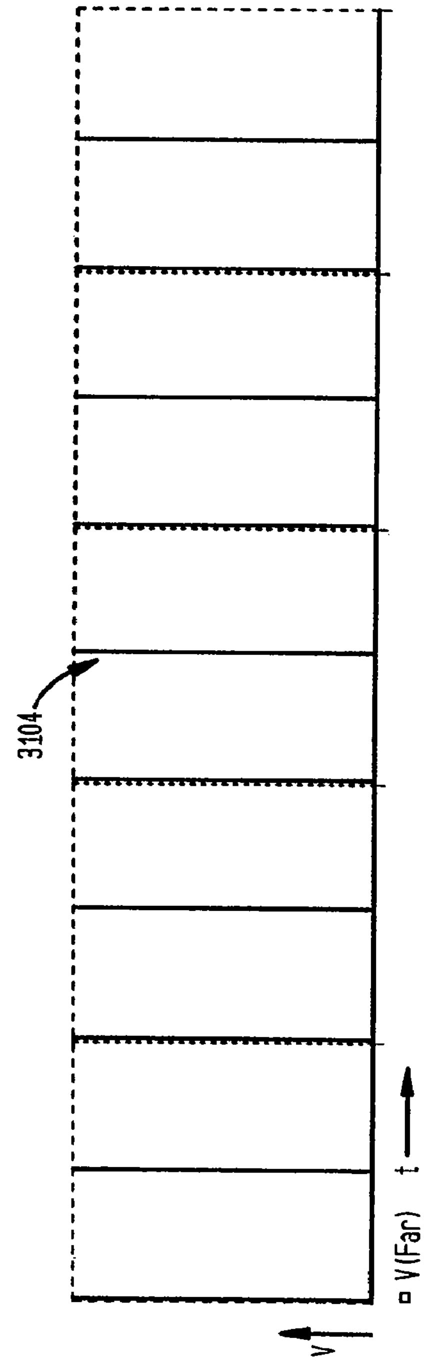

FIG. 31 illustrates an example circuit 3102 that generates a doubler output signal 3104 (FIGS. 31 and 43B) that may be used as an under-sampling signal 1604. The example circuit 3102 generates pulses on rising and falling edges of the input oscillating signal 3106 of FIG. 43A. Input oscillating signal 3106 is one embodiment of optional input signal 2926. The circuit 3102 can be implemented as a pulse generator and aliasing rate ($F_{AR}$) doubler, providing the under-sampling signal 1604 to under-sampling module 1606 in FIG. 30.

The aliasing rate is twice the frequency of the input oscillating signal $F_{OSC}$ 3106, as shown by EQ. (9) below.

$$F_{AR}=2*F_{OSC} \qquad \text{EQ. (9)}$$

The aperture width of the aliasing pulses is determined by the delay through a first inverter 3108 of FIG. 31. As the delay is increased, the aperture is increased. A second inverter 3112 is shown to maintain polarity consistency with examples described elsewhere. In an alternate embodiment inverter 3112 is omitted. Preferably, the pulses have negligible aperture widths that tend toward zero time. The doubler output signal 3104 may be further conditioned as appropriate to drive a switch module with negligible aperture pulses. The circuit 3102 may be implemented with integrated circuitry, discretely, with equivalent logic circuitry, or with any valid fabrication technology.

5.2 Differential Implementations

The invention can be implemented in a variety of differential configurations. Differential configurations are useful for reducing common mode noise. This can be very useful in receiver systems where common mode interference can be caused by intentional or unintentional radiators such as cellular phones, CB radios, electrical appliances etc. Differential configurations are also useful in reducing any common mode noise due to charge injection of the switch in the switch module or due to the design and layout of the system in which the invention is used. Any spurious signal that is induced in equal magnitude and equal phase in both input leads of the invention will be substantially reduced or eliminated. Some differential configurations, including some of the configurations below, are also useful for increasing the voltage and/or for increasing the power of the down-converted signal 1308A. While an example of a differential under-sampling module is shown below, the example is shown for the purpose of illustration, not limitation. Alternate embodiments (including equivalents, extensions, variations, deviations, etc.) of the embodiment described herein will be apparent to those skilled in the relevant art based on the teachings contained herein. The invention is intended and adapted to include such alternate embodiments.

Figure 44A:
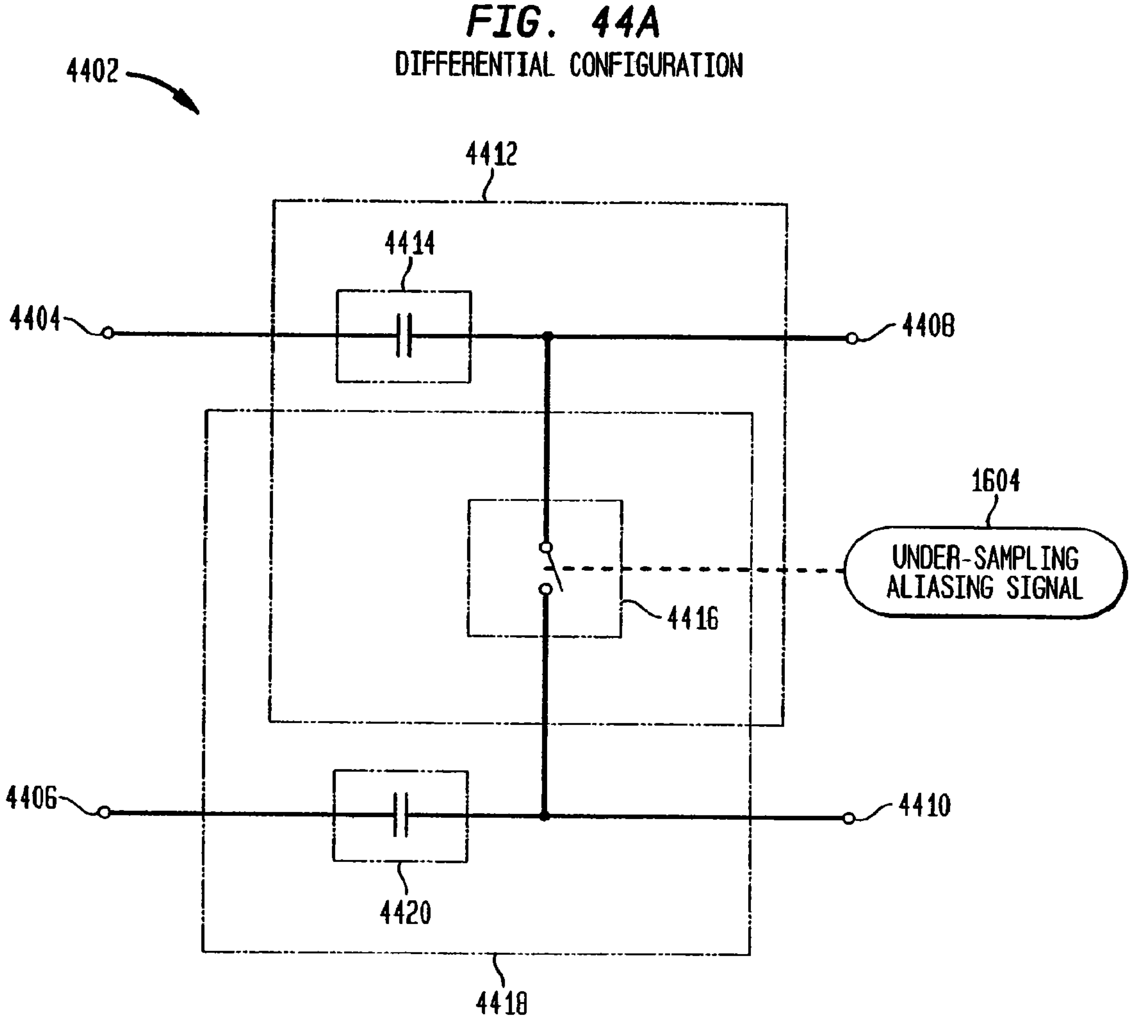
FIG. 44A illustrates a structural block diagram of a differential system according to embodiments of the invention.

FIG. 44A illustrates an example differential system 4402 that can be included in the under-sampling module 1606. The differential system 4202 includes an inverted under-sampling design similar to that described with reference to FIG. 42. The differential system 4402 includes inputs 4404 and 4406 and outputs 4408 and 4410. The differential system 4402 includes a first inverted sample and hold module 4412, which includes a holding module 4414 and a switch module 4416. The differential system 4402 also includes a second inverted sample and hold module 4418, which includes a holding module 4420 and the switch module 4416, which it shares in common with sample and hold module 4412.

One or both of the inputs 4404 and 4406 are coupled to an EM signal source. For example, the inputs can be coupled to an EM signal source, wherein the input voltages at the inputs 4404 and 4406 are substantially equal in amplitude but 180 degrees out of phase with one another. Alternatively, where dual inputs are unavailable, one of the inputs 4404 and 4406 can be coupled to ground.

In operation, when the switch module 4416 is closed, the holding modules 4414 and 4420 are in series and, provided they have similar capacitive values, they charge to equal amplitudes but opposite polarities. When the switch module 4416 is open, the voltage at the output 4408 is relative to the input 4404, and the voltage at the output 4410 is relative to the voltage at the input 4406.

Portions of the voltages at the outputs 4408 and 4410 include voltage resulting from charge stored in the holding modules 4414 and 4420, respectively, when the switch module 4416 was closed. The portions of the voltages at the outputs 4408 and 4410 resulting from the stored charge are generally equal in amplitude to one another but 180 degrees out of phase.

Portions of the voltages at the outputs 4408 and 4410 also include ripple voltage or noise resulting from the switching action of the switch module 4416. But because the switch module is positioned between the two outputs, the noise introduced by the switch module appears at the outputs 4408 and 4410 as substantially equal and in-phase with one another. As a result, the ripple voltage can be substantially filtered out by inverting the voltage at one of the outputs 4408 or 4410 and adding it to the other remaining output. Additionally, any noise that is impressed with substantially equal amplitude and equal phase onto the input terminals 4404 and 4406 by any other noise sources will tend to be canceled in the same way.

The differential system 4402 is effective when used with a differential front end (inputs) and a differential back end (outputs). It can also be utilized in the following configurations, for example:

a) A single-input front end and a differential back end; and b) A differential front end and single-output back end.

Examples of these system are provided below.

5.2.1 Differential Input-to-Differential Output

Figure 44B:
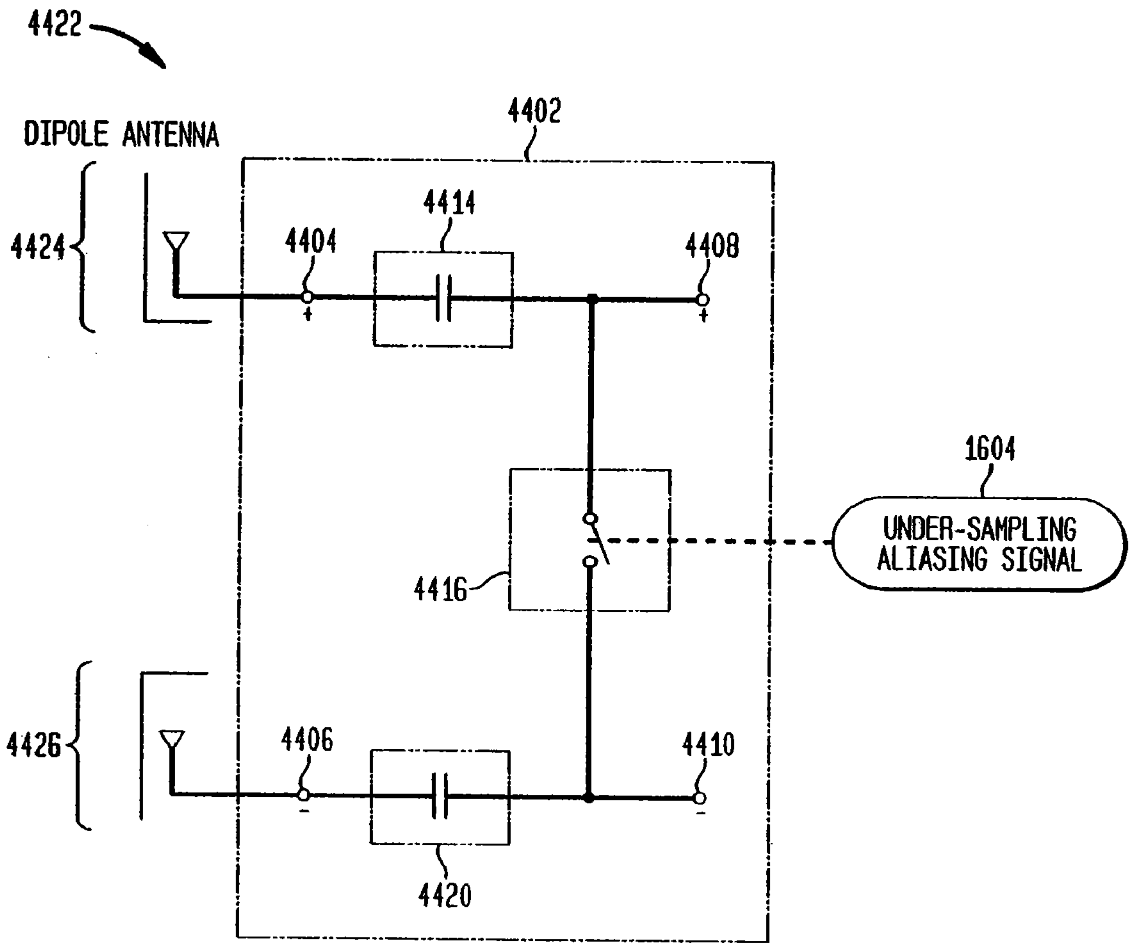
FIG. 44B illustrates a structural block diagram of a differential system with a differential input and a differential output according to embodiments of the invention.

FIG. 44B illustrates the differential system 4402 wherein the inputs 4404 and 4406 are coupled to equal and opposite EM signal sources, illustrated here as dipole antennas 4424 and 4426. In this embodiment, when one of the outputs 4408 or 4410 is inverted and added to the other output, the common mode noise due to the switching module 4416 and other common mode noise present at the input terminals 4404 and 4406 tend to substantially cancel out.

5.2.2 Single Input-to-Differential Output

Figure 44C:
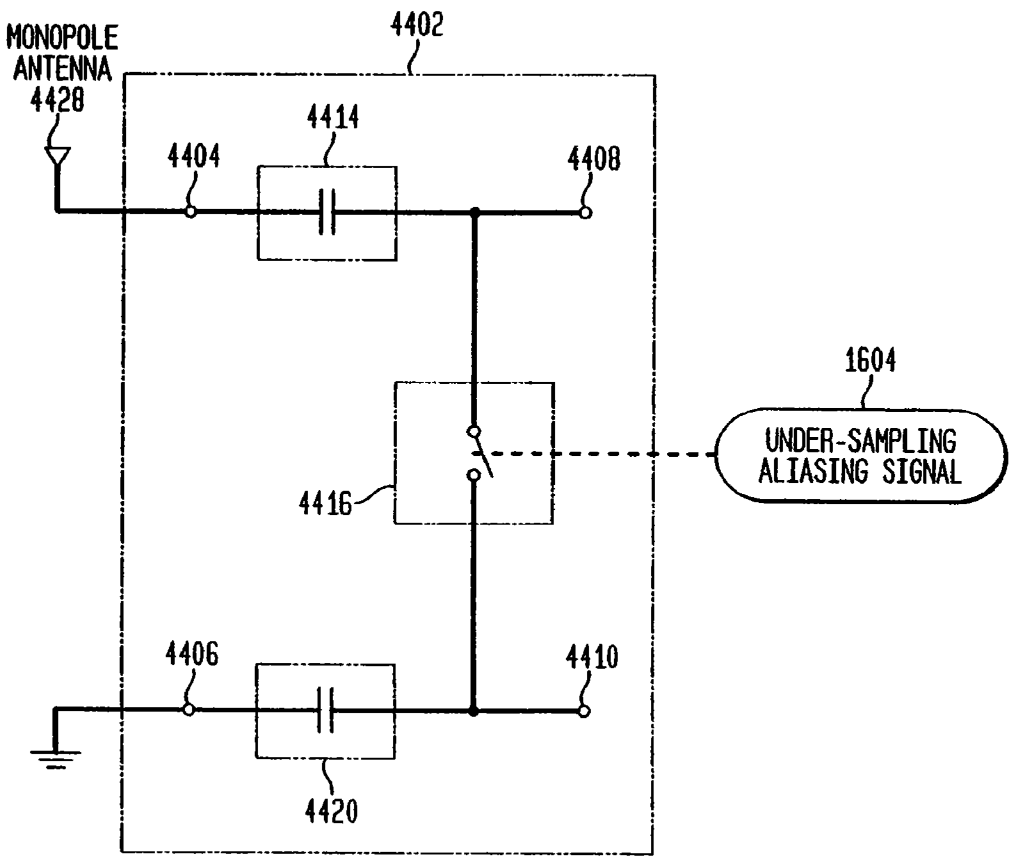
FIG. 44C illustrates a structural block diagram of a differential system with a single input and a differential output according to embodiments of the invention.

FIG. 44C illustrates the differential system 4402 wherein the input 4404 is coupled to an EM signal source such as a monopole antenna 4428 and the input 4406 is coupled to ground.

Figure 44D:
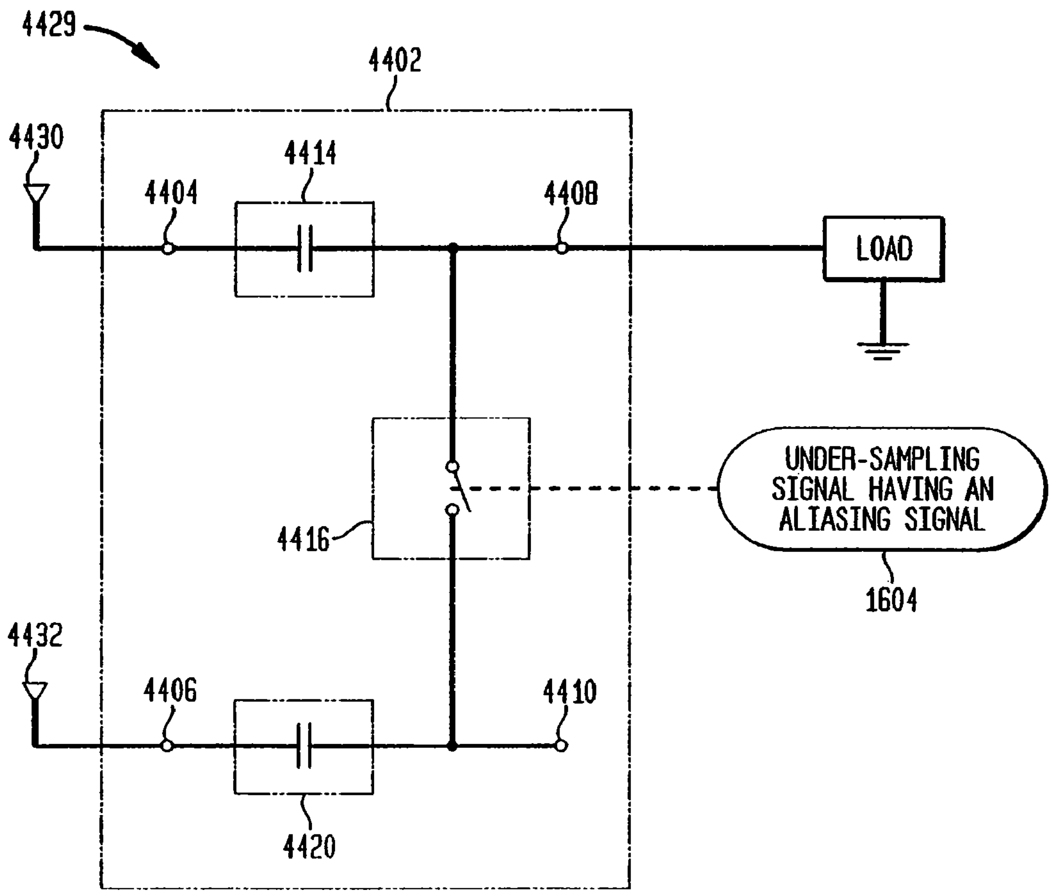
FIG. 44D illustrates a differential input with a single output according to embodiments of the invention.
Figure 44E:
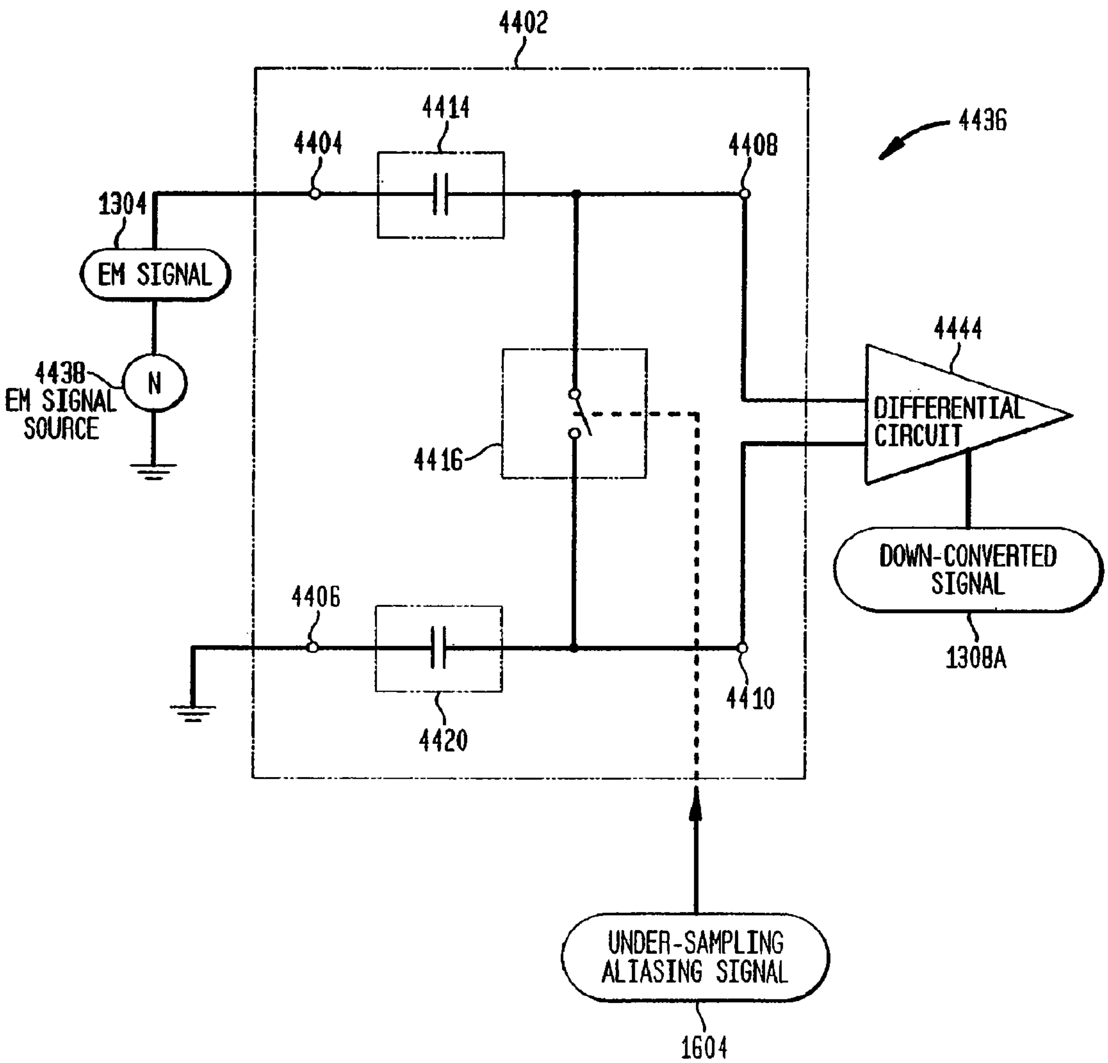
FIG. 44E illustrates an example differential input to single output system according to embodiments of the invention.

FIG. 44E illustrates an example single input to differential output receiver/down-converter system 4436. The system 4436 includes the differential system 4402 wherein the input 4406 is coupled to ground. The input 4404 is coupled to an EM signal source 4438.

The outputs 4408 and 4410 are coupled to a differential circuit 4444 such as a filter, which preferably inverts one of the outputs 4408 or 4410 and adds it to the other output 4408 or 4410. This substantially cancels common mode noise generated by the switch module 4416. The differential circuit 4444 preferably filters the higher frequency components of the EM signal 1304 that pass through the holding modules 4414 and 4420. The resultant filtered signal is output as the down-converted signal 1308A.

5.2.3 Differential Input-to-Single Output

FIG. 44D illustrates the differential system 4402 wherein the inputs 4404 and 4406 are coupled to equal and opposite EM signal sources illustrated here as dipole antennas 4430 and 4432. The output is taken from terminal 4408.

5.3 Smoothing the Down-Converted Signal

The down-converted signal 1308A may be smoothed by filtering as desired. The differential circuit 4444 implemented as a filter in FIG. 44E illustrates but one example. Filtering may be accomplished in any of the described embodiments by hardware, firmware and software implementation as is well known by those skilled in the arts.

5.4 Load Impedance and Input/Output Buffering

Some of the characteristics of the down-converted signal 1308A depend upon characteristics of a load placed on the down-converted signal 1308A. For example, in an embodiment, when the down-converted signal 1308A is coupled to a high impedance load, the charge that is applied to a holding module such as holding module 2706 in FIG. 27 or 2416 in FIG. 24A during a pulse generally remains held by the holding module until the next pulse. This results in a substantially stair-step-like representation of the down-converted signal 1308A as illustrated in FIG. 15C, for example. A high impedance load enables the under-sampling system 1606 to accurately represent the voltage of the original unaffected input signal.

The down-converted signal 1308A can be buffered with a high impedance amplifier, if desired.

Alternatively, or in addition to buffering the down-converted signal 1308A, the input EM signal may be buffered or amplified by a low noise amplifier.

5.5 Modifying the Under-Sampling Signal Utilizing Feedback

FIG. 30 shows an embodiment of a system 3001 which uses down-converted signal 1308A as feedback 3006 to control various characteristics of the under-sampling module 1606 to modify the down-converted signal 1308A.

Generally, the amplitude of the down-converted signal 1308A varies as a function of the frequency and phase differences between the EM signal 1304 and the under-sampling signal 1604. In an embodiment, the down-converted signal 1308A is used as the feedback 3006 to control the frequency and phase relationship between the EM signal 1304 and the under-sampling signal 1604. This can be accomplished using the example block diagram shown in FIG. 32A. The example circuit illustrated in FIG. 32A can be included in the under-sampling signal module 3002. Alternate implementations will be apparent to persons skilled in the relevant art(s) based on the teachings contained herein. Alternate implementations fall within the scope and spirit of the present invention. In this embodiment a state-machine is used for clarity, and is not limiting.

Figure 32A:
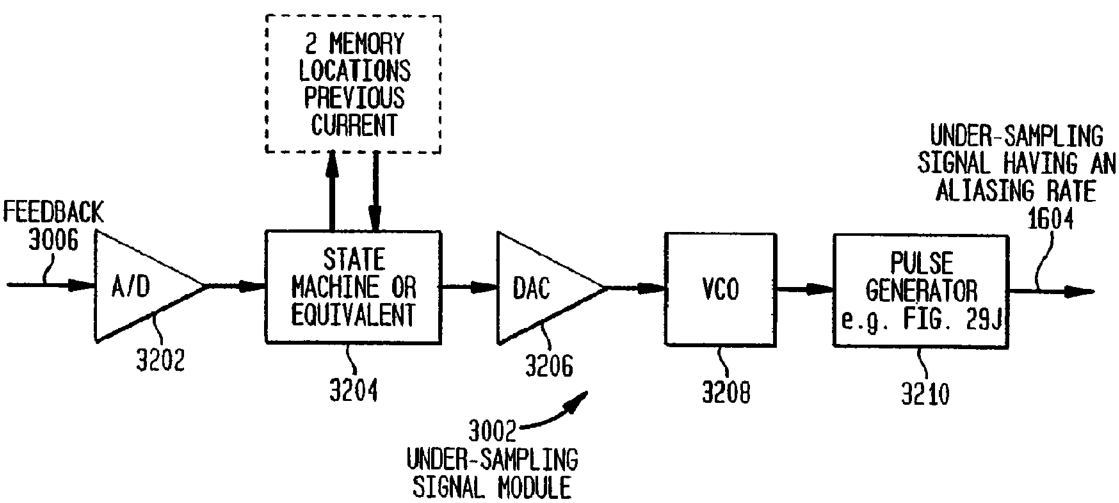
FIG. 32A illustrates an example of an under-sampling signal module according to an embodiment of the invention.

In the example of FIG. 32A, a state machine 3204 reads an analog to digital converter, A/D 3202, and controls a digital to analog converter (DAC) 3206. In an embodiment, the state machine 3204 includes 2 memory locations, Previous and Current, to store and recall the results of reading A/D 3202. In an embodiment, the state machine 3204 utilizes at least one memory flag.

DAC 3206 controls an input to a voltage controlled oscillator, VCO 3208. VCO 3208 controls a frequency input of a pulse generator 3210, which, in an embodiment, is substantially similar to the pulse generator shown in FIG. 29J. The pulse generator 3210 generates the under-sampling signal 1604.

Figure 32B:
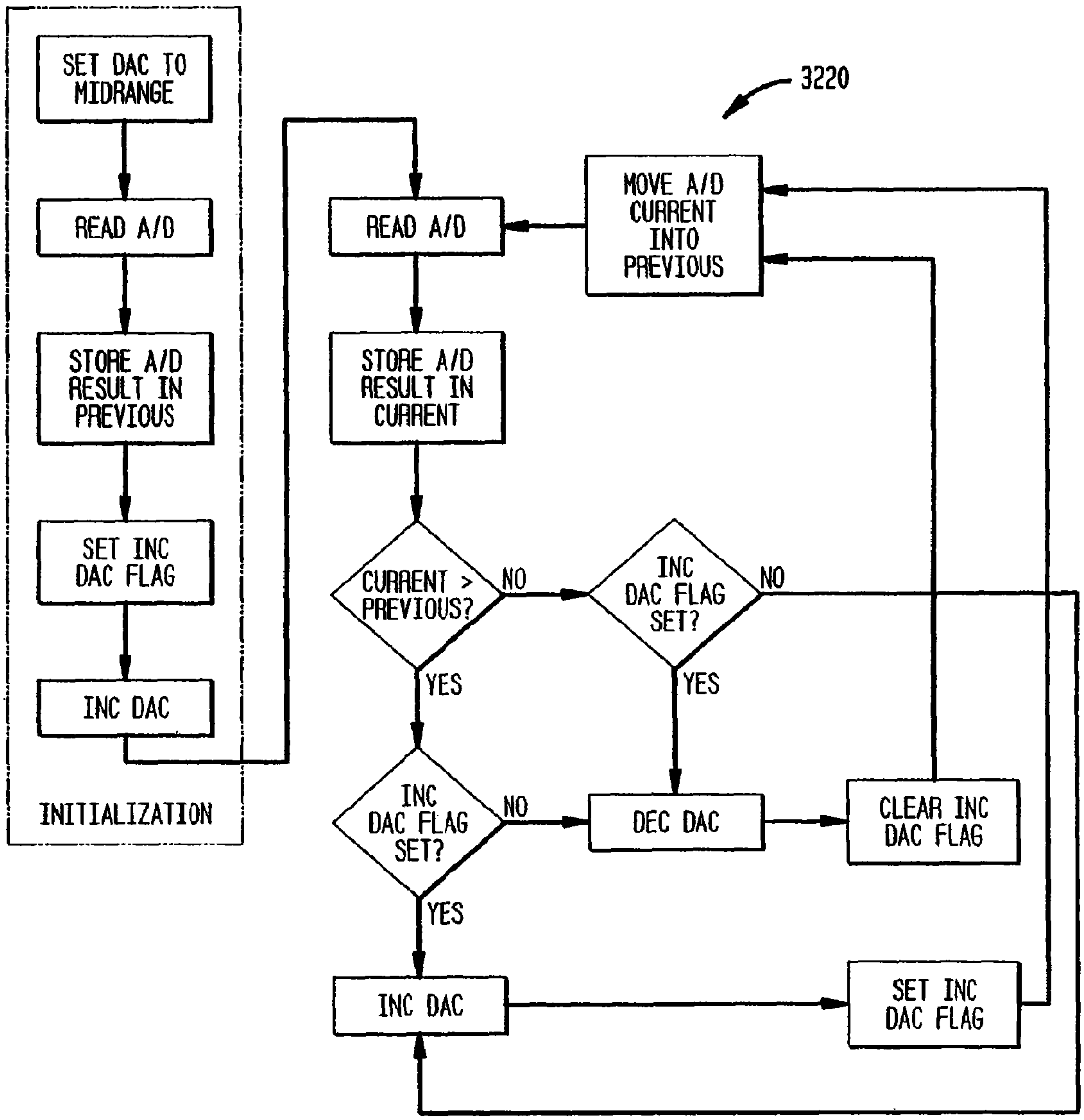
FIG. 32B illustrates a flowchart of a state machine operation associated with an under-sampling module according to embodiments of the invention.

In an embodiment, the state machine 3204 operates in accordance with the state machine flowchart 3220 in FIG. 32B. The result of this operation is to modify the frequency and phase relationship between the under-sampling signal 1604 and the EM signal 1304, to substantially maintain the amplitude of the down-converted signal 1308A at an optimum level.

Figure 32C:
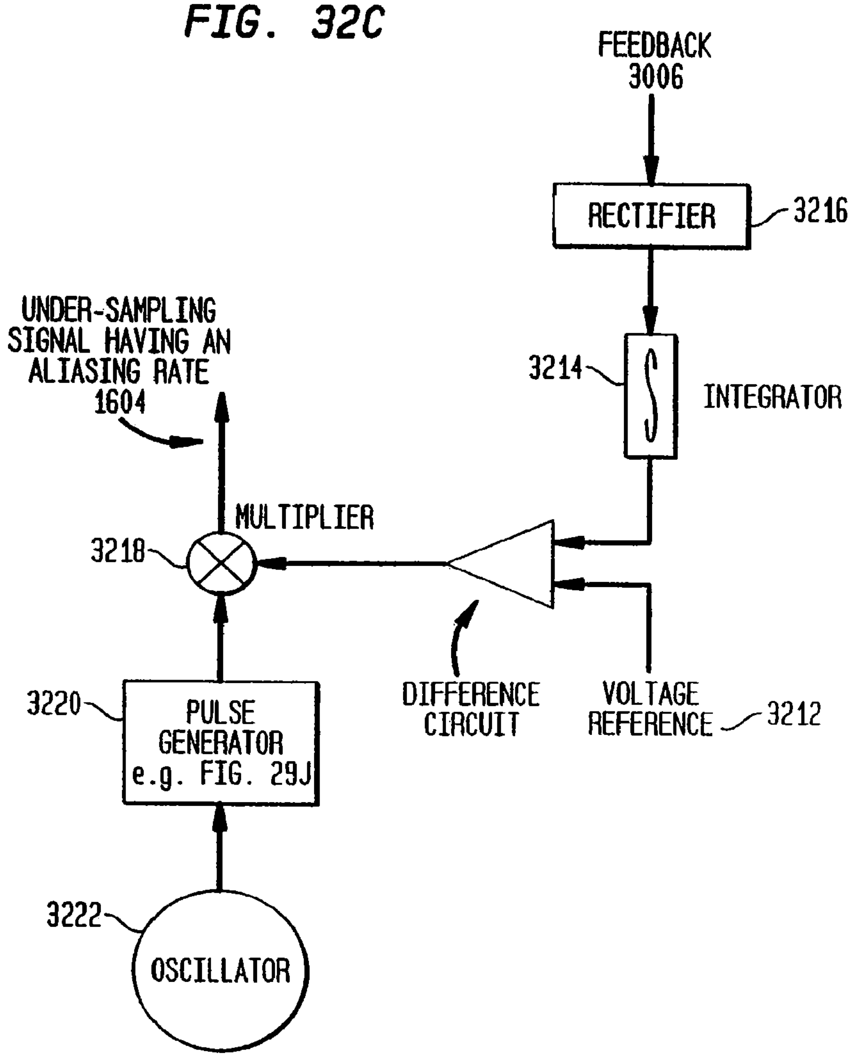
FIG. 32C illustrates an example under-sampling module that includes an analog circuit with automatic gain control according to embodiments of the invention.

The amplitude of the down-converted signal 1308A can be made to vary with the amplitude of the under-sampling signal 1604. In an embodiment where Switch Module 2702 is a FET as shown in FIG. 28A, wherein the gate 2804 receives the under-sampling signal 1604, the amplitude of the under-sampling signal 1604 can determine the "on" resistance of the FET, which affects the amplitude of down-converted signal 1308A. Under-sampling signal module 3002, as shown in FIG. 32C, can be an analog circuit that enables an automatic gain control function. Alternate implementations will be apparent to persons skilled in the relevant art(s) based on the teachings contained herein. Alternate implementations fall within the scope and spirit of the present invention.

III. Down-Converting by Transferring Energy

The energy transfer embodiments of the invention provide enhanced signal to noise ratios and sensitivity to very small signals, as well as permitting the down-converted signal to drive lower impedance loads unassisted. The energy transfer aspects of the invention are represented generally by 4506 in FIGS. 45A and 45B. Fundamental descriptions of how this is accomplished is presented step by step beginning with a comparison with an under-sampling system.

1. Energy Transfer Compared to Under-Sampling

Section II above disclosed methods and systems for down-converting an EM signal by under-sampling. The under-sampling systems utilize a sample and hold system controlled by an under-sampling signal. The under-sampling signal includes a train of pulses having negligible apertures that tend towards zero time in duration. The negligible aperture pulses minimize the amount of energy transferred from the EM signal. This protects the under-sampled EM signal from distortion or destruction. The negligible aperture pulses also make the sample and hold system a high impedance system. An advantage of under-sampling is that the high impedance input allows accurate voltage reproduction of the under-sampled EM signal. The methods and systems disclosed in Section II are thus useful for many situations including, but not limited to, monitoring EM signals without distorting or destroying them.

Because the under-sampling systems disclosed in Section II transfer only negligible amounts of energy, they are not suitable for all situations. For example, in radio communications, received radio frequency (RF) signals are typically very weak and must be amplified in order to distinguish them over noise. The negligible amounts of energy transferred by the under-sampling systems disclosed in Section R may not be sufficient to distinguish received RF signals over noise.

In accordance with an aspect of the invention, methods and systems are disclosed below for down-converting EM signals by transferring non-negligible amounts of energy from the EM signals. The resultant down-converted signals have sufficient energy to allow the down-converted signals to be distinguishable from noise. The resultant down-converted signals also have sufficient energy to drive lower impedance circuits without buffering.

Down-converting by transferring energy is introduced below in an incremental fashion to distinguish it from under-sampling. The introduction begins with further descriptions of under-sampling.

1.1 Review of Under-Sampling

Figure 78A:
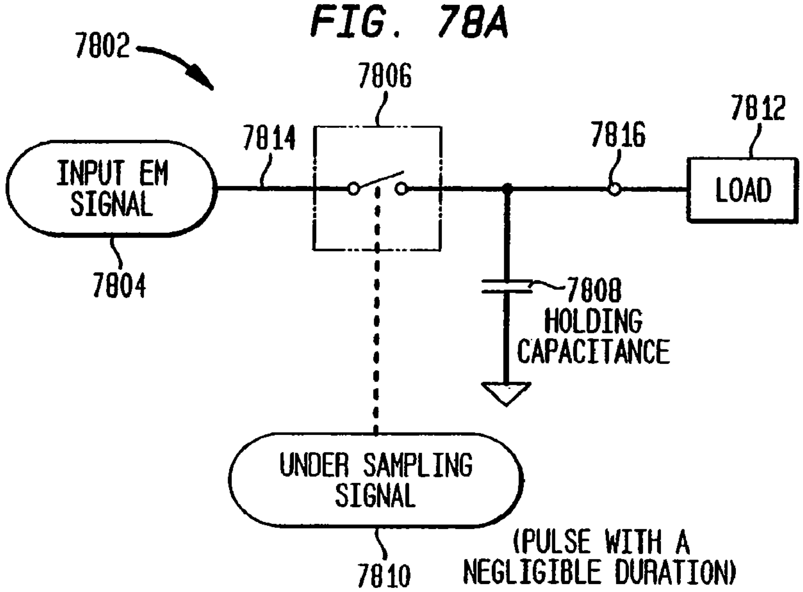
FIGS. 78A-B illustrate example under-sampling systems according to embodiments of the invention.

FIG. 78A illustrates an exemplary under-sampling system 7802 for down-converting an input EM signal 7804. The under-sampling system 7802 includes a switching module 7806 and a holding module shown as a holding capacitance 7808. An under-sampling signal 7810 controls the switch module 7806. The under-sampling signal 7810 includes a train of pulses having negligible pulse widths that tend toward zero time. An example of a negligible pulse width or duration can be in the range of 1-10 psec for under-sampling a 900 MHZ signal. Any other suitable negligible pulse duration can be used as well, where accurate reproduction of the original unaffected input signal voltage is desired without substantially affecting the original input signal voltage.

Figure 78B:
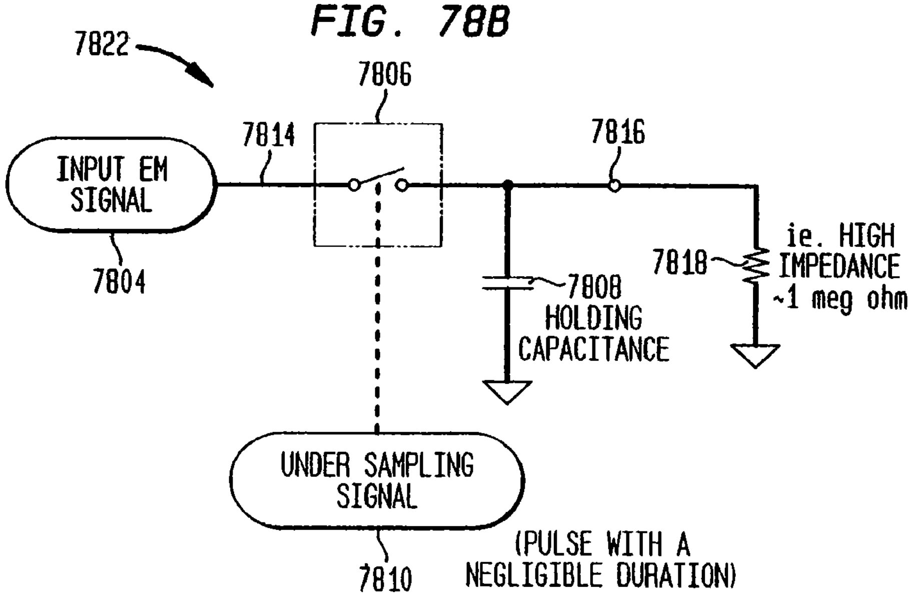

In an under-sampling environment, the holding capacitance 7808 preferably has a small capacitance value. This allows the holding capacitance 7808 to substantially charge to the voltage of the input EM signal 7804 during the negligible apertures of the under-sampling signal pulses. For example, in an embodiment, the holding capacitance 7808 has a value in the range of 1 pF. Other suitable capacitance values can be used to achieve substantially the voltage of the original unaffected input signal. Various capacitances can be employed for certain effects, which are described below. The under-sampling system is coupled to a load 7812. In FIG. 78B, the load 7812 of FIG. 78A is illustrated as a high impedance load 7818. A high impedance load is one that is relatively insignificant to an output drive impedance of the system for a given output frequency. The high impedance load 7818 allows the holding capacitance 7808 to substantially maintain the charge accumulated during the under-sampling pulses.

FIGS. 79A-F illustrate example timing diagrams for the under-sampling system 7802. FIG. 79A illustrates an example input EM signal 7804.

FIG. 79C illustrates an example under-sampling signal 7810, including pulses 7904 having negligible apertures that tend towards zero time in duration.

FIG. 79B illustrates the negligible effects to the input EM signal 7804 when under-sampled, as measured at a terminal 7814 of the under-sampling system 7802. In FIG. 79B, negligible distortions 7902 correlate with the pulses of the under-sampling signal 7810. In this embodiment, the negligible distortions 7902 occur at different locations of subsequent cycles of the input EM signal 7804. As a result, the input EM signal will be down-converted. The negligible distortions 7902 represent negligible amounts of energy, in the form of charge that is transferred to the holding capacitance 7808.

When the load 7812 is a high impedance load, the holding capacitance 7808 does not significantly discharge between pulses 7904. As a result, charge that is transferred to the holding capacitance 7808 during a pulse 7904 tends to "hold" the voltage value sampled constant at the terminal 7816 until the next pulse 7904. When voltage of the input EM signal 7804 changes between pulses 7904, the holding capacitance 7808 substantially attains the new voltage and the resultant voltage at the terminal 7816 forms a stair step pattern, as illustrated in FIG. 79D.

FIG. 79E illustrates the stair step voltage of FIG. 79D on a compressed time scale. The stair step voltage illustrated in FIG. 79E can be filtered to produce the signal illustrated in FIG. 79F. The signals illustrated in FIGS. 79D, E, and F have substantially all of the baseband characteristics of the input EM signal 7804 in FIG. 79A, except that the signals illustrated in FIGS. 79D, E, and F have been successfully down-converted.

Note that the voltage level of the down-converted signals illustrated in FIGS. 79E and 79F are substantially close to the voltage level of the input EM signal 7804. The under-sampling system 7802 thus down-converts the input EM signal 7804 with reasonable voltage reproduction, without substantially affecting the input EM signal 7804. But also note that the power available at the output is relatively negligible (e.g.: $V^2/R$; ~5 mV and 1 MOhm), given the input EM signal 7804 would typically have a driving impedance, in an RF environment, of 50 Ohms (e.g.: $V^2/R$; ~5 mV and 50 Ohms).

1.1.1 Effects of Lowering the Impedance of the Load

Effects of lowering the impedance of the load 7812 are now described. FIGS. 80A-E illustrate example timing diagrams for the under-sampling system 7802 when the load 7812 is a relatively low impedance load, one that is significant relative to the output drive impedance of the system for a given output frequency.

Figures 80A, 80B, 80C, 80D, 80E, 80F:
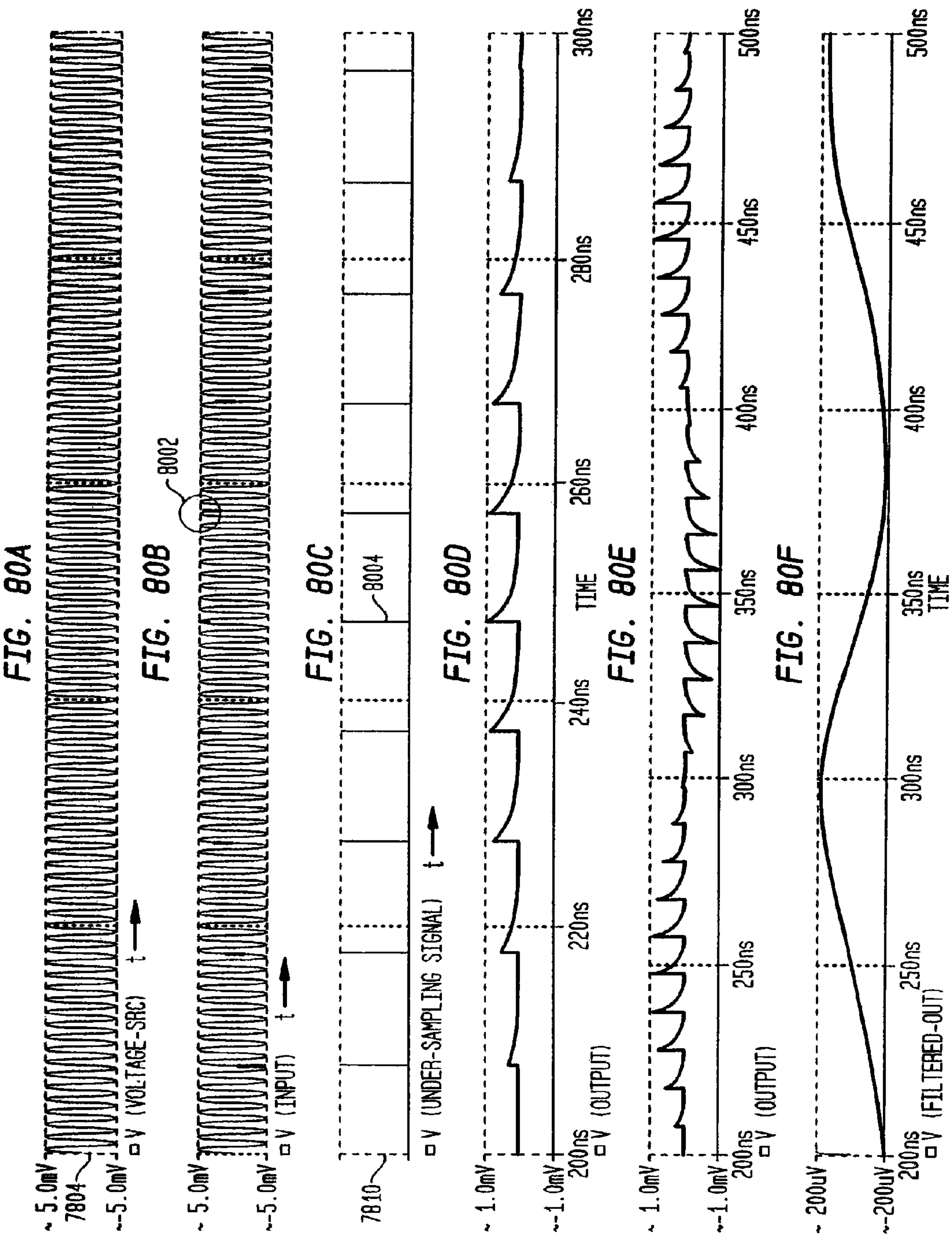
FIGS. 80A-F illustrate example timing diagrams for an under-sampling system when the load is a relatively low impedance load according to embodiments of the invention.

FIG. 80A illustrates an example input EM signal 7804, which is substantially similar to that illustrated in FIG. 79A.

FIG. 80C illustrates an example under-sampling signal 7810, including pulses 8004 having negligible apertures that tend towards zero time in duration. The example under-sampling signal 7810 illustrated in FIG. 80C is substantially similar to that illustrated in FIG. 79C.

FIG. 80B illustrates the negligible effects to the input EM signal 7804 when under-sampled, as measured at a terminal 7814 of the under-sampling system 7802. In FIG. 80B, negligible distortions 8002 correlate with the pulses 8004 of the under-sampling signal 7810 in FIG. 80C. In this example, the negligible distortions 8002 occur at different locations of subsequent cycles of the input EM signal 7804. As a result, the input EM signal 7804 will be down-converted. The negligible distortions 8002 represent negligible amounts of energy, in the form of charge that is transferred to the holding capacitance 7808.

When the load 7812 is a low impedance load, the holding capacitance 7808 is significantly discharged by the load between pulses 8004 (FIG. 80C). As a result, the holding capacitance 7808 cannot reasonably attain or "hold" the voltage of the original EM input signal 7804, as was seen in the case of FIG. 79D. Instead, the charge appears as the output illustrated in FIG. 80D.

FIG. 80E illustrates the output from FIG. 80D on a compressed time scale. The output in FIG. 80E can be filtered to produce the signal illustrated in FIG. 80F. The down-converted signal illustrated in FIG. 80F is substantially similar to the down-converted signal illustrated in FIG. 79F, except that the signal illustrated in FIG. 80F is substantially smaller in magnitude than the amplitude of the down-converted signal illustrated in FIG. 79F. This is because the low impedance of the load 7812 prevents the holding capacitance 7808 from reasonably attaining or "holding" the voltage of the original EM input signal 7804. As a result, the down-converted signal illustrated in FIG. 80F cannot provide optimal voltage reproduction, and has relatively negligible power available at the output (e.g.: $V^2/R$; ~200 μV and 2 KOhms), given the input EM signal 7804 would typically have a driving impedance, in an RF environment, of 50 Ohms (e.g.: $V^2/R$; ~5 mV and 50 Ohms).

1.1.2 Effects of Increasing the Value of the Holding Capacitance

Effects of increasing the value of the holding capacitance 7808, while having to drive a low impedance load 7812, is now described. FIGS. 81A-F illustrate example timing diagrams for the under-sampling system 7802 when the holding capacitance 7808 has a larger value, in the range of 18 pF for example.

Figures 81A, 81B, 81C, 81D, 81E, 81F:
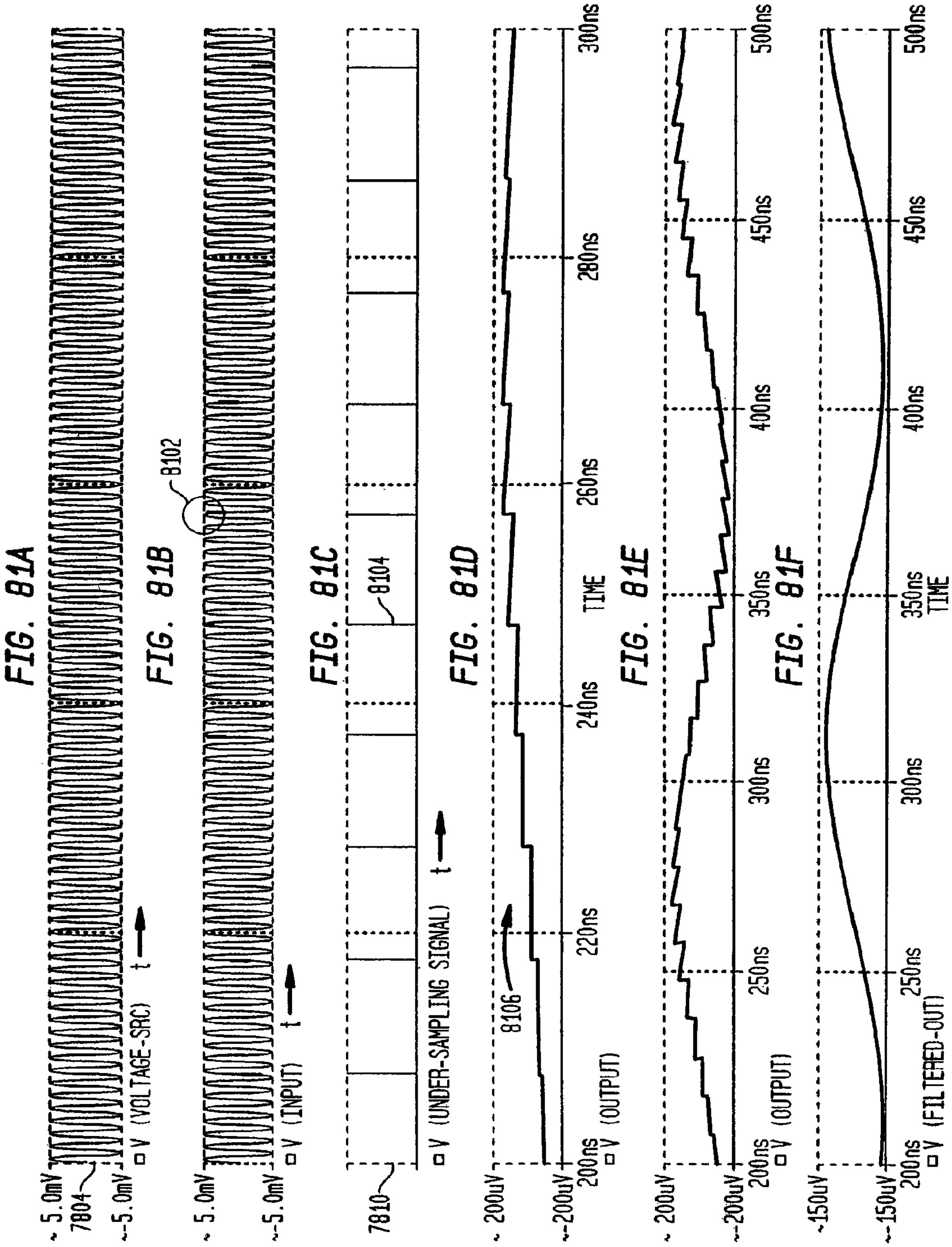
FIGS. 81A-F illustrate example timing diagrams for an under-sampling system when the holding capacitance has a larger value according to embodiments of the invention.

FIG. 81A illustrates an example input EM signal 7804, which is substantially similar to that illustrated in FIGS. 79A and 80A.

FIG. 81C illustrates an example under-sampling signal 7810, including pulses 8104 having negligible apertures that tend towards zero time in duration. The example under-sampling signal 7810 illustrated in FIG. 81C is substantially similar to that illustrated in FIGS. 79C and 80C.

FIG. 81B illustrates the negligible effects to the input EM signal 7804 when under-sampled, as measured at a terminal 7814 of the under-sampling system 7802. In FIG. 81B, negligible distortions 8102 correlate with the pulses 8104 of the under-sampling signal 7810 in FIG. 81C. Upon close inspection, the negligible distortions 8102 occur at different locations of subsequent cycles of the input EM signal 7804. As a result, the input EM signal 7804 will be down-converted. The negligible distortions 8102 represent negligible amounts of energy, in the form of charge that is transferred to the holding capacitance 7808.

FIG. 81D illustrates the voltage measured at the terminal 7816, which is a result of the holding capacitance 7808 attempting to attain and "hold" the original input EM signal voltage, but failing to do so, during the negligible apertures of the pulses 8104 illustrated in FIG. 81C.

Recall that when the load 7812 is a low impedance load, the holding capacitance 7808 is significantly discharged by the load between pulses 8104 (FIG. 81C), this again is seen in FIGS. 81D and E. As a result, the holding capacitance 7808 cannot reasonably attain or "hold" the voltage of the original EM input signal 7804, as was seen in the case of FIG. 79D. Instead, the charge appears as the output illustrated in FIG. 81D.

FIG. 81E illustrates the down-converted signal 8106 on a compressed time scale. Note that the amplitude of the down-converted signal 8106 is significantly less than the amplitude of the down-converted signal illustrated in FIGS. 80D and 80E. This is due to the higher capacitive value of the holding capacitance 7808. Generally, as the capacitive value increases, it requires more charge to increase the voltage for a given aperture. Because of the negligible aperture of the pulses 8104 in FIG. 81C, there is insufficient time to transfer significant amounts of energy or charge from the input EM signal 7804 to the holding capacitance 7808. As a result, the amplitudes attained by the holding capacitance 7808 are significantly less than the amplitudes of the down-converted signal illustrated in FIGS. 80D and 80E.

In FIGS. 80E and 80F, the output signal, non-filtered or filtered, cannot provide optimal voltage reproduction, and has relatively negligible power available at the output (e.g.: $V^2R$; ~150 μV and 2 KOhms), given the input EM signal 7804 would typically have a driving impedance, in an RF environment, of 50 Ohms (e.g.: $V^2/R$; ~5 mV and 50 Ohms).

In summary, under-sampling systems, such as the under-sampling system 7802 illustrated in FIG. 78, are well suited for down-converting EM signals with relatively accurate voltage reproduction. Also, they have a negligible effect on the original input EM signal. As illustrated above, however, the under-sampling systems, such as the under-sampling system 7802 illustrated in FIG. 78, are not well suited for transferring energy or for driving lower impedance loads.

1.2 Introduction to Energy Transfer

In an embodiment, the present invention transfers energy from an EM signal by utilizing an energy transfer signal instead of an under-sampling signal. Unlike under-sampling signals that have negligible aperture pulses, the energy transfer signal includes a train of pulses having non-negligible apertures that tend away from zero. This provides more time to transfer energy from an EM input signal. One direct benefit is that the input impedance of the system is reduced so that practical impedance matching circuits can be implemented to further improve energy transfer and thus overall efficiency. The non-negligible transferred energy significantly improves the signal to noise ratio and sensitivity to very small signals, as well as permitting the down-converted signal to drive lower impedance loads unassisted. Signals that especially benefit include low power ones typified by RF signals. One benefit of a non-negligible aperture is that phase noise within the energy transfer signal does not have as drastic of an effect on the down-converted output signal as under-sampling signal phase noise or conventional sampling signal phase noise does on their respective outputs.

Figure 82A:
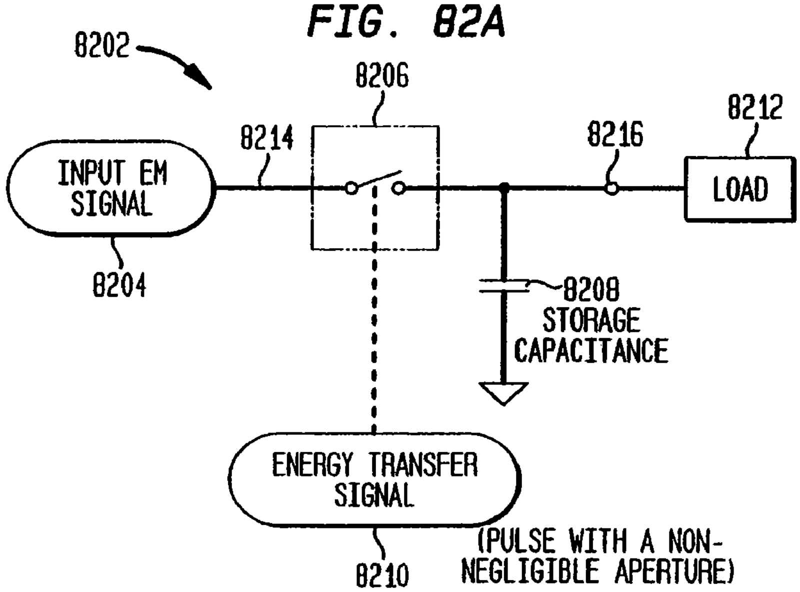
FIGS. 82A-B illustrate example energy transfer systems according to embodiments of the invention.

FIG. 82A illustrates an exemplary energy transfer system 8202 for down-converting an input EM signal 8204. The energy transfer system 8202 includes a switching module 8206 and a storage module illustrated as a storage capacitance 8208. The terms storage module and storage capacitance, as used herein, are distinguishable from the terms holding module and holding capacitance, respectively. Holding modules and holding capacitances, as used above, identify systems that store negligible amounts of energy from an under-sampled input EM signal with the intent of "holding" a voltage value. Storage modules and storage capacitances, on the other hand, refer to systems that store non-negligible amounts of energy from an input EM signal.

The energy transfer system 8202 receives an energy transfer signal 8210, which controls the switch module 8206. The energy transfer signal 8210 includes a train of energy transfer pulses having non-negligible pulse widths that tend away from zero time in duration. The non-negligible pulse widths can be any non-negligible amount. For example, the non-negligible pulse widths can be ½ of a period of the input EM signal. Alternatively, the non-negligible pulse widths can be any other fraction of a period of the input EM signal, or a multiple of a period plus a fraction. In an example embodiment, the input EM signal is approximately 900 MHZ and the non-negligible pulse width is approximately 550 pico seconds. Any other suitable non-negligible pulse duration can be used.

Figure 82B:
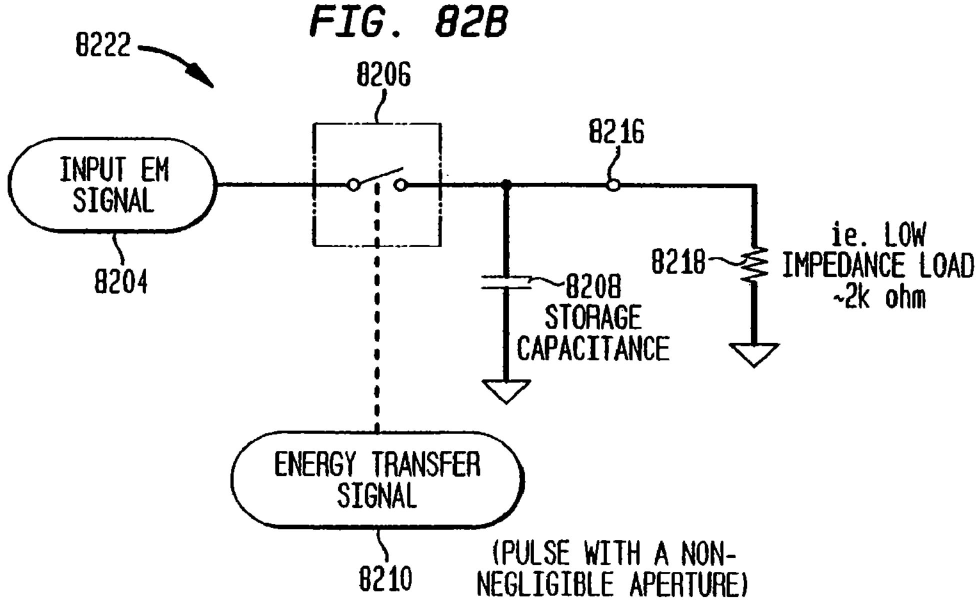

In an energy transfer environment, the storage module, illustrated in FIG. 82 as a storage capacitance 8208, preferably has the capacity to handle the power being transferred, and to allow it to accept a non-negligible amount of power during a non-negligible aperture period. This allows the storage capacitance 8208 to store energy transferred from the input EM signal 8204, without substantial concern for accurately reproducing the original, unaffected voltage level of the input EM signal 8204. For example, in an embodiment, the storage capacitance 8208 has a value in the range of 18 pF. Other suitable capacitance values and storage modules can be used.

One benefit of the energy transfer system 8202 is that, even when the input EM signal 8204 is a very small signal, the energy transfer system 8202 transfers enough energy from the input EM signal 8204 that the input EM signal can be efficiently down-converted.

The energy transfer system 8202 is coupled to a load 8212. Recall from the overview of under-sampling that loads can be classified as high impedance loads or low impedance loads. A high impedance load is one that is relatively insignificant to an output drive impedance of the system for a given output frequency. A low impedance load is one that is relatively significant. Another benefit of the energy transfer system 8202 is that the non-negligible amounts of transferred energy permit the energy transfer system 8202 to effectively drive loads that would otherwise be classified as low impedance loads in under-sampling systems and conventional sampling systems. In other words, the non-negligible amounts of transferred energy ensure that, even for lower impedance loads, the storage capacitance 8208 accepts and maintains sufficient energy or charge to drive the load 8202. This is illustrated below in the timing diagrams of FIGS. 83A-F.

Figures 83A, 83B, 83C, 83D, 83E, 83F:
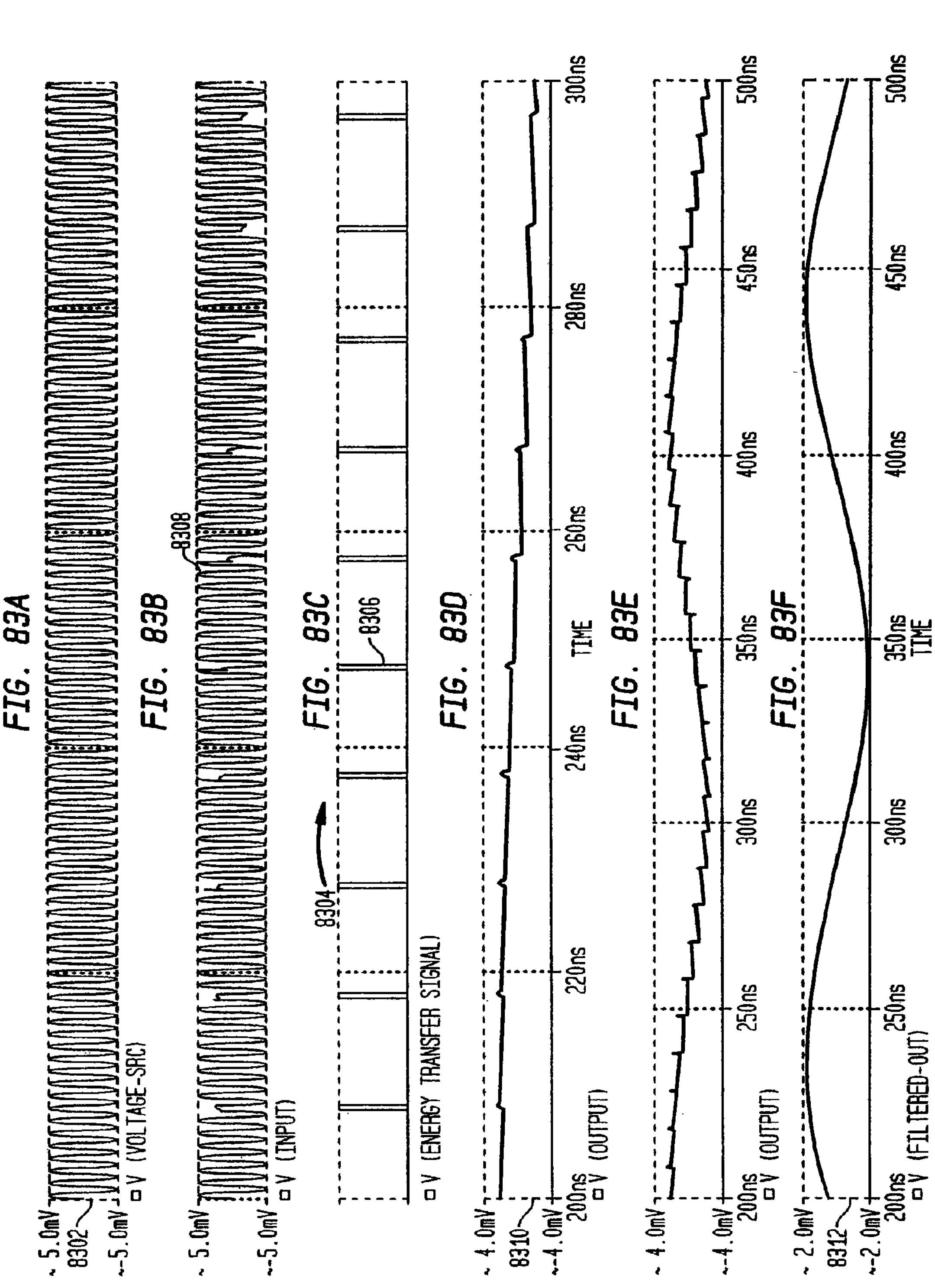
FIGS. 83A-F illustrate example timing diagrams for energy transfer systems according to embodiments of the present invention.

FIGS. 83A-F illustrate example timing diagrams for the energy transfer system 8202 in FIG. 82. FIG. 83A illustrates an example input EM signal 8302.

FIG. 83C illustrates an example under-sampling signal 8304, including energy transfer pulses 8306 having non-negligible apertures that tend away from zero time in duration.

FIG. 83B illustrates the effects to the input EM signal 8302, as measured at a terminal 8214 in FIG. 82A, when non-negligible amounts of energy are transfer from it. In FIG. 83B, non-negligible distortions 8308 correlate with the energy transfer pulses 8306 in FIG. 83C. In this example, the non-negligible distortions 8308 occur at different locations of subsequent cycles of the input EM signal 8302. The non-negligible distortions 8308 represent non-negligible amounts of transferred energy, in the form of charge that is transferred to the storage capacitance 8208 in FIG. 82.

FIG. 83D illustrates a down-converted signal 8310 that is formed by energy transferred from the input EM signal 8302.

FIG. 83E illustrates the down-converted signal 8310 on a compressed time scale. The down-converted signal 8310 can be filtered to produce the down-converted signal 8312 illustrated in FIG. 83F. The down-converted signal 8312 is similar to the down-converted signal illustrated in FIG. 79F, except that the down-converted signal 8312 has substantially more power (e.g.: $V^2/R$; approximately (~) 2 mV and 2K Ohms) than the down-converted signal illustrated in FIG. 79F (e.g.: $V^2/R$; ~5 mV and 1M Ohms). As a result, the down-converted signals 8310 and 8312 can efficiently drive lower impedance loads, given the input EM signal 8204 would typically have a driving impedance, in an RF environment, of 50 Ohms ($V^2/R$; ~5 mV and 50 Ohms).

The energy transfer aspects of the invention are represented generally by 4506 in FIGS. 45A and 45B.

2. Down-Converting an EM Signal to an IF EM Signal by Transferring Energy from the EM Signal at an Aliasing Rate In an embodiment, the invention down-converts an EM signal to an IF signal by transferring energy from the EM signal at an aliasing rate. This embodiment is illustrated by 4514 in FIG. 45B.

This embodiment can be implemented with any type of EM signal, including, but not limited to, modulated carrier signals and unmodulated carrier signals. This embodiment is described herein using the modulated carrier signal $F_{MC}$ in FIG. 1 as an example. In the example, the modulated carrier signal $F_{MC}$ is down-converted to an intermediate frequency (IF) signal $F_{IF}$. The intermediate frequency signal $F_{IF}$ can be demodulated to a baseband signal $F_{DMB}$ using conventional demodulation techniques. Upon reading the disclosure and examples therein, one skilled in the relevant art(s) will understand that the invention can be implemented to down-convert any EM signal, including, but not limited to, modulated carrier signals and unmodulated carrier signals.

The following sections describe methods for down-converting an EM signal to an IF signal $F_{IF}$ by transferring energy from the EM signal at an aliasing rate. Exemplary structural embodiments for implementing the methods are also described. It should be understood that the invention is not limited to the particular embodiments described below. Equivalents, extensions, variations, deviations, etc., of the following will be apparent to persons skilled in the relevant art(s) based on the teachings contained herein. Such equivalents, extensions, variations, deviations, etc., are within the scope and spirit of the present invention.

The following sections include a high level discussion, example embodiments, and implementation examples.

2.1 High Level Description

This section (including its subsections) provides a high-level description of down-converting an EM signal to an IF signal $F_{IF}$ by transferring energy, according to the invention. In particular, an operational process of down-converting the modulated carrier signal $F_{MC}$ to the IF modulated carrier signal $F_{IF}$, by transferring energy, is described at a high-level. Also, a structural implementation for implementing this process is described at a high-level. This structural implementation is described herein for illustrative purposes, and is not limiting. In particular, the process described in this section can be achieved using any number of structural implementations, one of which is described in this section. The details of such structural implementations will be apparent to persons skilled in the relevant art(s) based on the teachings contained herein.

2.1.1 Operational Description

FIG. 46B depicts a flowchart 4607 that illustrates an exemplary method for down-converting an EM signal to an intermediate signal $F_{IF}$, by transferring energy from the EM signal at an aliasing rate. The exemplary method illustrated in the flowchart 4607 is an embodiment of the flowchart 4601 in FIG. 46A.

Any and all combinations of modulation techniques are valid for this invention. For ease of discussion, the digital AM carrier signal 616 is used to illustrate a high level operational description of the invention. Subsequent sections provide detailed flowcharts and descriptions for AM, FM and PM example embodiments. Upon reading the disclosure and examples therein, one skilled in the relevant art(s) will understand that the invention can be implemented to down-convert any type of EM signal, including any form of modulated carrier signal and unmodulated carrier signals.

The method illustrated in the flowchart 4607 is now described at a high level using the digital AM carrier signal 616 of FIG. 6C. Subsequent sections provide detailed flowcharts and descriptions for AM, FM and PM example embodiments. Upon reading the disclosure and examples therein, one skilled in the relevant art(s) will understand that the invention can be implemented to down-convert any type of EM signal, including any form of modulated carrier signal and unmodulated carrier signals.

Figure 47E:
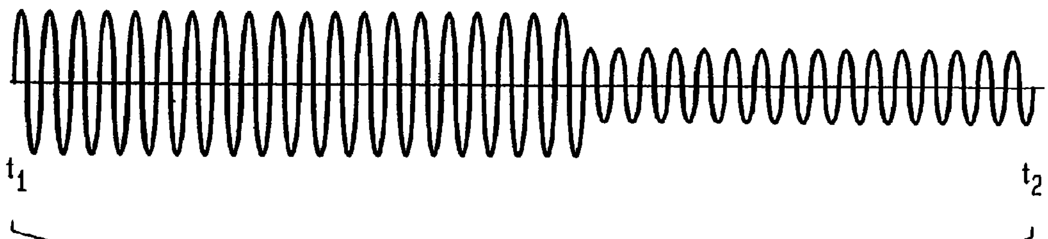
FIGS. 47A-E illustrate example signal diagrams associated with the flowcharts in FIGS. 46A-D according to embodiments of the invention.
Figure 47A:
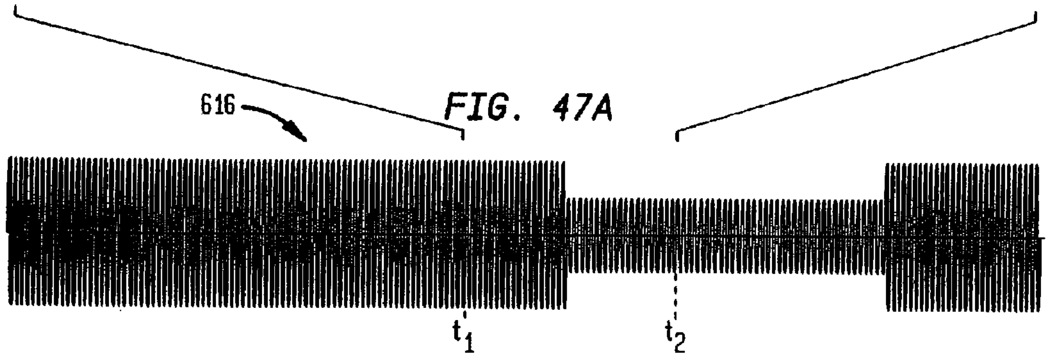

The process begins at step 4608, which includes receiving an EM signal. Step 4608 is illustrated by the digital AM carrier signal 616. The digital AM carrier signal 616 of FIG. 6C is re-illustrated in FIG. 47A for convenience. FIG. 47E illustrates a portion of the digital AM carrier signal 616 on an expanded time scale.

Figure 47B:
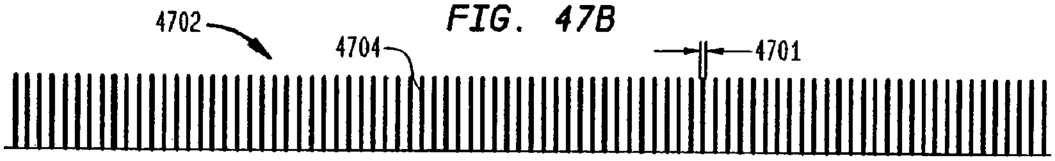

Step 4610 includes receiving an energy transfer signal having an aliasing rate $F_{AR}$. FIG. 47B illustrates an example energy transfer signal 4702. The energy transfer signal 4702 includes a train of energy transfer pulses 4704 having non-negligible apertures 4701 that tend away from zero time duration. Generally, the apertures 4701 can be any time duration other than the period of the EM signal. For example, the apertures 4701 can be greater or less than a period of the EM signal. Thus, the apertures 4701 can be approximately 1/10, 1/4, 1/2, 3/4, etc., or any other fraction of the period of the EM signal. Alternatively, the apertures 4701 can be approximately equal to one or more periods of the EM signal plus 1/10, 1/4, 1/2, 3/4, etc., or any other fraction of a period of the EM signal. The apertures 4701 can be optimized based on one or more of a variety of criteria, as described in sections below.

The energy transfer pulses 4704 repeat at the aliasing rate. A suitable aliasing rate can be determined or selected as described below. Generally, when down-converting an EM signal to an intermediate signal, the aliasing rate is substantially equal to a difference frequency, which is described below, or substantially equal to a harmonic or, more typically, a sub-harmonic of the difference frequency.

Figure 47C:
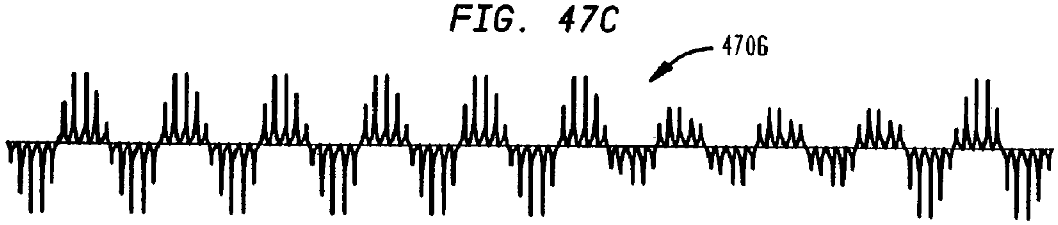

Step 4612 includes transferring energy from the EM signal at the aliasing rate to down-convert the EM signal to the intermediate signal $F_{IF}$. FIG. 47C illustrates transferred energy 4706, which is transferred from the EM signal during the energy transfer pulses 4704. Because a harmonic of the aliasing rate occurs at an off-set of the frequency of the AM signal 616, the pulses 4704 "walk through" the AM signal 616 at the off-set frequency. By "walking through" the AM signal 616, the transferred energy 4706 forms an AM intermediate signal 4706 that is similar to the AM carrier signal 616, except that the AM intermediate signal has a lower frequency than the AM carrier signal 616. The AM carrier signal 616 can be down-converted to any frequency below the AM carrier signal 616 by adjusting the aliasing rate $F_{AR}$, as described below.

Figure 47D:
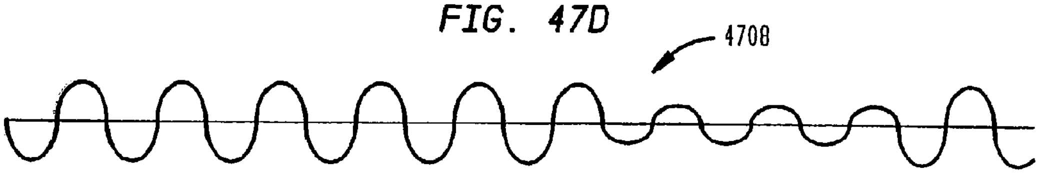

FIG. 47D depicts the AM intermediate signal 4706 as a filtered output signal 4708. In an alternative embodiment, the invention outputs a stair step, or non-filtered output signal. The choice between filtered, partially filtered and non-filtered output signals is generally a design choice that depends upon the application of the invention.

The intermediate frequency of the down-converted signal $F_{IF}$, which, in this example, is the intermediate, signal 4706 and 4708, can be determined from EQ. (2), which is reproduced below for convenience.

$$F_C=n*F_{AR}\pm F_{IF} \quad \text{EQ. (2)}$$

A suitable aliasing rate $F_{AR}$ can be determined in a variety of ways. An example method for determining the aliasing rate $F_{AR}$, is provided below. After reading the description herein, one skilled in the relevant art(s) will understand how to determine appropriate aliasing rates for EM signals, including ones in addition to the modulated carrier signals specifically illustrated herein.

Figure 48:
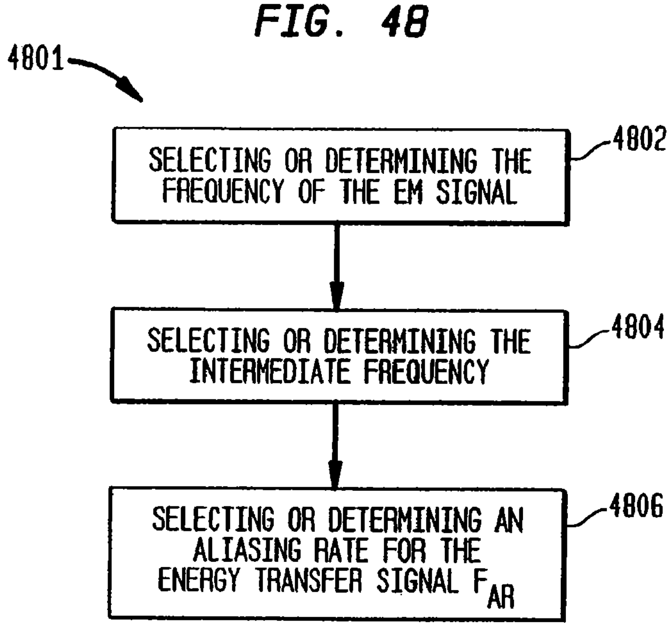
FIG. 48 is a flowchart that illustrates an example process for determining an aliasing rate associated with an aliasing signal according to an embodiment of the invention.
Figure 49A:
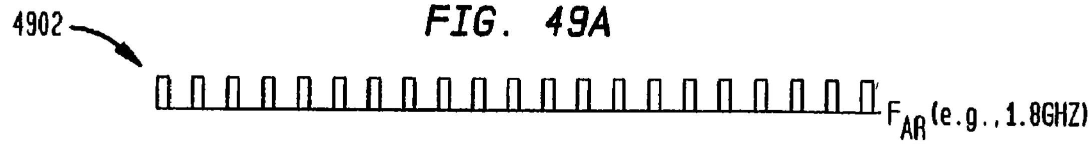
FIG. 49A-H illustrate example energy transfer signals according to embodiments of the invention.
Figure 49B:
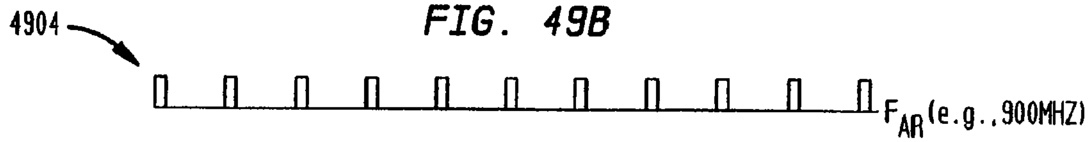
Figure 49C:
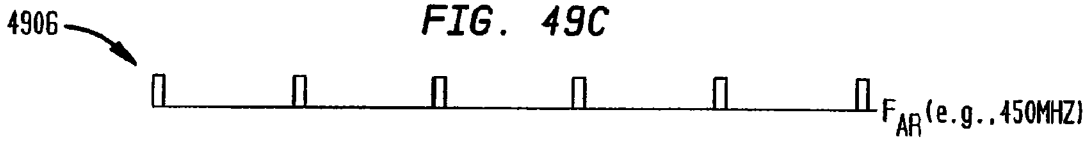
Figure 49D:
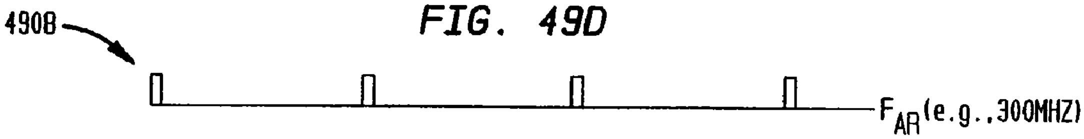
Figure 49E:
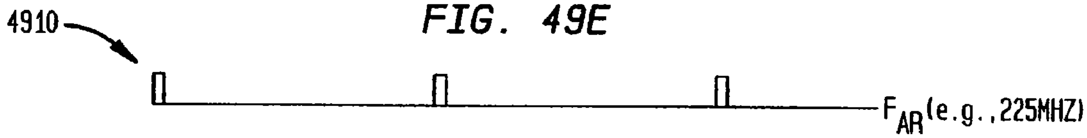
Figure 49F:
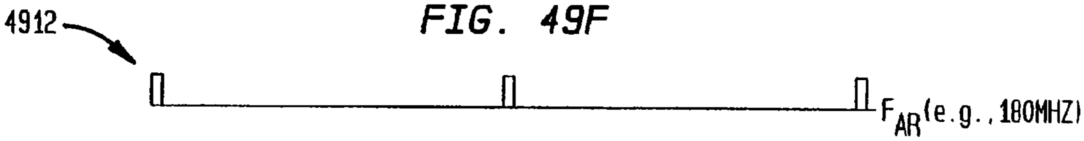
Figure 49G:
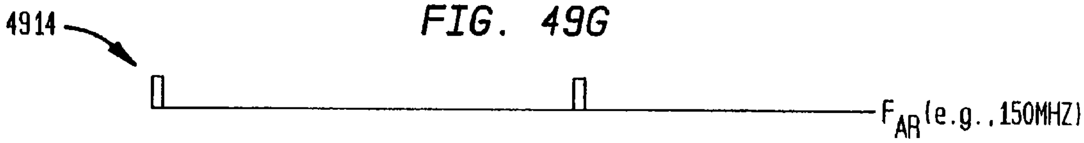
Figure 49H:
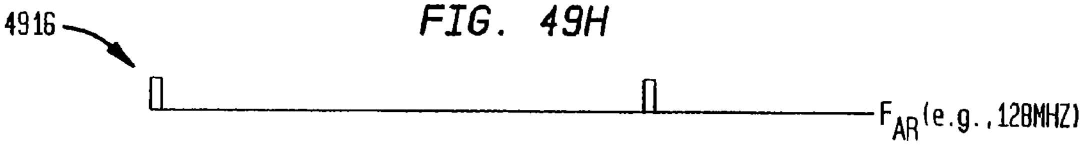

In FIG. 48, a flowchart 4801 illustrates an example process for determining an aliasing rate $F_{AR}$. But a designer may choose, or an application, may dictate, that the values be determined in an order that is different than the illustrated order. The process begins at step 4802, which includes determining, or selecting, the frequency of the EM signal. The frequency of the AM carrier signal 616 can be, for example, 901 MHZ.

Step 4804 includes determining, or selecting, the intermediate frequency. This is the frequency to which the EM signal will be down-converted. The intermediate frequency can be determined, or selected, to match a frequency requirement of a down-stream demodulator. The intermediate frequency can be, for example, 1 MHZ.

Step 4806 includes determining the aliasing rate or rates that will down-convert the EM signal to the IF specified in step 4804.

EQ. (2) can be rewritten as EQ. (3):

$$n*F_{AR}=F_C\pm F_{IF} \quad \text{EQ. (3)}$$

Which can be rewritten as EQ. (4):

$$n=(F_C\pm F_{IF})/F_{AR} \quad \text{EQ. (4)}$$

or as EQ. (5):

$$F_{AR}=(F_C\pm F_{IF}n \quad \text{EQ. (5)}$$

$(F_C\pm F_{IF})$ can be defined as a difference value $F_{DIFF}$, as illustrated in EQ. (6):

$$(F_C\pm F_{IF})=F_{DIFF} \quad \text{EQ. (6)}$$

EQ. (4) can be rewritten as EQ. (7):

$$n=F_{DIFF}/F_{AR} \quad \text{EQ. (7)}$$

From EQ. (7), it can be seen that, for a given n and a constant $F_{AR}$, $F_{DIFF}$ is constant. For the case of $F_{DIFF}=F_C-F_{IF}$ and for a constant $F_{DIFF}$, as $F_C$ increases, $F_{IF}$ necessarily increases. For the case of $F_{DIFF}=F_C+F_{IF}$, and for a constant $F_{DIFF}$, as $F_C$ increases, $F_{IF}$ necessarily decreases. In the latter case of $F_{DIFF}=F_C+F_{IF}$, any phase or frequency changes on $F_C$ correspond to reversed or inverted phase or frequency changes on $F_{IF}$. This is mentioned to teach the reader that if $F_{DIFF}=F_C+F_{IF}$ is used, the above effect will occur to the phase and frequency response of the modulated intermediate signal $F_{IF}$.

EQs. (2) through (7) can be solved for any valid n. A suitable n can be determined for any given difference frequency $F_{DIFF}$ and for any desired aliasing rate $F_{AR(Desired)}$. EQs. (2) through (7) can be utilized to identify a specific harmonic closest to a desired aliasing rate $F_{AR(Desired)}$ that will generate the desired intermediate signal $F_{IF}$.

An example is now provided for determining a suitable n for a given difference frequency $F_{DIFF}$ and for a desired aliasing rate $F_{AR(Desired)}$. For ease of illustration, only the case of $(F_C-F_{IF})$ is illustrated in the example below.

$$n=(F_C-F_{IF})/F_{AR(Desired)}=F_{DIFF}/F_{AR(Desired)}$$

The desired aliasing rate $F_{AR(Desired)}$ can be, for example, 140 MHZ. Using the previous examples, where the carrier frequency is 901 MHz and the IF is 1 MHZ, an initial value of n is determined as:

$$n=(901\text{ MHZ}-1\text{ MHZ})/140\text{ MHZ}=900/140=6.4$$

The initial value 6.4 can be rounded up or down to the valid nearest n, which was defined above as including (0.5, 1, 2, 3, . . . ). In this example, 6.4 is rounded down to 6.0, which is inserted into EQ. (5) for the case of $(F_C-F_{IF})=F_{DIFF}$:

$$F_{AR}=(F_C-F_{IF})/n$$

$$F_{AR}=(901\text{ MHZ}-1\text{ MHZ})/6=900\text{MHZ}/6=150\text{ MHZ}$$

In other words, transferring energy from a 901 MHZ EM carrier signal at 150 MHZ generates an intermediate signal at 1 MHZ. When the EM carrier signal is a modulated carrier signal, the intermediate signal will also substantially include the modulation. The modulated intermediate signal can be demodulated through any conventional demodulation technique.

Alternatively, instead of starting from a desired aliasing rate, a list of suitable aliasing rates can be determined from the modified form of EQ. (5), by solving for various values of n. Example solutions are listed below.

$$F_{AR}=(F_C-F_{IF})/n=F_{DIFF}/n=(901\text{ MHZ}-1\text{ MHZ})/n=900\text{MHZ}/n$$

Solving for n=0.5, 1, 2, 3, 4, 5 and 6:

900 MHZ/0.5=1.8 GHZ (i.e., second harmonic);
900 MHZ/1=900 MHZ (i.e., fundamental frequency);
900 MHZ/2=450 MHZ (i.e., second sub-harmonic);
900 MHZ/13=300 MHZ (i.e., third sub-harmonic);
900 MHZ/4=225 MHZ (i.e., fourth sub-harmonic);
900 MHZ/5=180 MHZ (i.e., fifth sub-harmonic); and
900 MHZ/6=150 MHZ (i.e., sixth sub-harmonic).

The steps described above can be performed for the case of $(F_C+F_{IF})$ in a similar fashion. The results can be compared to the results obtained from the case of $(F_C-F_{IF})$ to determine which provides better result for an application.

In an embodiment, the invention down-converts an EM signal to a relatively standard IF in the range of, for example, 100 KHZ to 200 MHZ. In another embodiment, referred to herein as a small off-set implementation, the invention down-converts an EM signal to a relatively low frequency of, for example, less than 100 KHZ. In another embodiment, referred to herein as a large off-set implementation, the invention down-converts an EM signal to a relatively higher IF signal, such as, for example, above 200 MHZ.

The various off-set implementations provide selectivity for different applications. Generally, lower data rate applications can operate at lower intermediate frequencies. But higher intermediate frequencies can allow more information to be supported for a given modulation technique.

In accordance with the invention, a designer picks an optimum information bandwidth for an application and an optimum intermediate frequency to support the baseband signal. The intermediate frequency should be high enough to support the bandwidth of the modulating baseband signal $F_{MB}$.

Generally, as the aliasing rate approaches a harmonic or sub-harmonic frequency of the EM signal, the frequency of the down-converted IF signal decreases. Similarly, as the aliasing rate moves away from a harmonic or sub-harmonic frequency of the EM signal, the IF increases.

Aliased frequencies occur above and below every harmonic of the aliasing frequency. In order to avoid mapping other aliasing frequencies in the band of the aliasing frequency (IF) of interest, the IF of interest should not be near one half the aliasing rate.

As described in example implementations below, an aliasing module, including a universal frequency translator (UFT) module built in accordance with the invention provides a wide range of flexibility in frequency selection and can thus be implemented in a wide range of applications. Conventional systems cannot easily offer, or do not allow, this level of flexibility in frequency selection.

2.1.2 Structural Description

Figure 63:
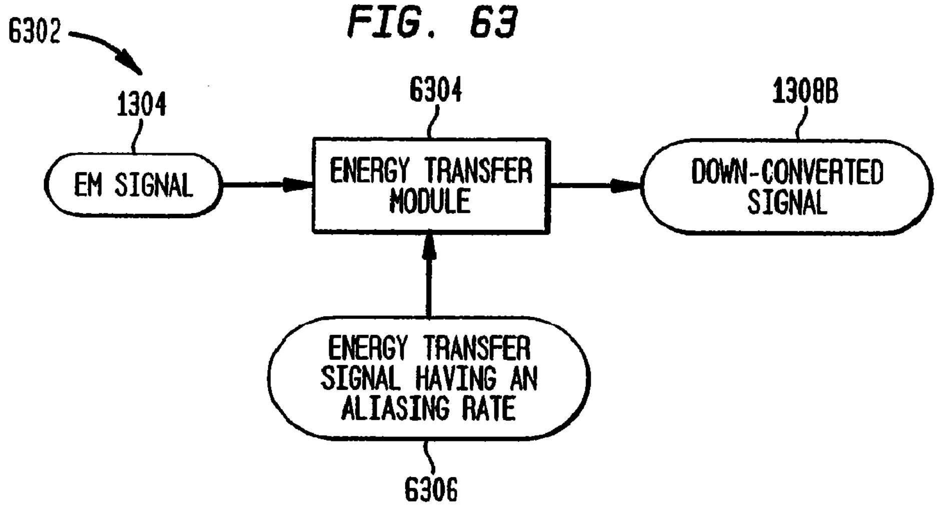
FIG. 63 illustrates a block diagram of an energy transfer system according to an embodiment of the invention.

FIG. 63 illustrates a block diagram of an energy transfer system 6302 according to an embodiment of the invention. The energy transfer system 6302 is an example embodiment of the generic aliasing system 1302 in FIG. 13. The energy transfer system 6302 includes an energy transfer module 6304. The energy transfer module 6304 receives the EM signal 1304 and an energy transfer signal 6306, which includes a train of energy transfer pulses having non-negligible apertures that tend away from zero time in duration, occurring at a frequency equal to the aliasing rate $F_{AR}$. The energy transfer signal 6306 is an example embodiment of the aliasing signal 1310 in FIG. 13. The energy transfer module 6304 transfers energy from the EM signal 1304 at the aliasing rate $F_{AR}$ of the energy transfer signal 6306.

Preferably, the energy transfer module 6304 transfers energy from the EM signal 1304 to down-convert it to the intermediate signal $F_{IF}$ in the manner shown in the operational flowchart 4607 of FIG. 46B. But it should be understood that the scope and spirit of the invention includes other structural embodiments for performing the steps of the flowchart 4607. The specifics of the other structural embodiments will be apparent to persons skilled in the relevant art(s) based on the discussion contained herein.

The operation of the energy transfer system 6302 is now described in detail with reference to the flowchart 4607 and to the timing diagrams illustrated in FIGS. 47A-E. In step 4608, the energy transfer module 6304 receives the AM carrier signal 616. In step 4610, the energy transfer module 6304 receives the energy transfer signal 4702. In step 4612, the energy transfer module 6304 transfers energy from the AM carrier signal 616 at the aliasing rate to down-convert the AM carrier signal 616 to the intermediate signal 4706 or 4708.

Example implementations of the energy transfer system 6302 are provided in Sections 4 and 5 below.

2.2 Example Embodiments

Various embodiments related to the method(s) and structure(s) described above are presented in this section (and its subsections). These embodiments are described herein for purposes of illustration, and not limitation. The invention is not limited to these embodiments. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

The method for down-converting the EM signal 1304 by transferring energy can be implemented with any type of EM signal, including modulated carrier signals and unmodulated carrier signals. For example, the method of the flowchart 4601 can be implemented to down-convert AM signals, FM signals, PM signals, etc., or any combination thereof. Operation of the flowchart 4601 of FIG. 46A is described below for down-converting AM, FM and PM. The down-conversion descriptions include down-converting to intermediate signals, directly down-converting to demodulated baseband signals, and down-converting FM signals to non-FM signals. The exemplary descriptions below are intended to facilitate an understanding of the present invention. The present invention is not limited to or by the exemplary embodiments below.

2.2.1 First Example Embodiment Amplitude Modulation 2.2.1.1 Operational Description Operation of the exemplary process of the flowchart 4607 in FIG. 46B is described below for the analog AM carrier signal 516, illustrated in FIG. 5C, and for the digital AM carrier signal 616, illustrated in FIG. 6C.

2.2.1.1.1 Analog AM Carrier Signal

Figure 50A:
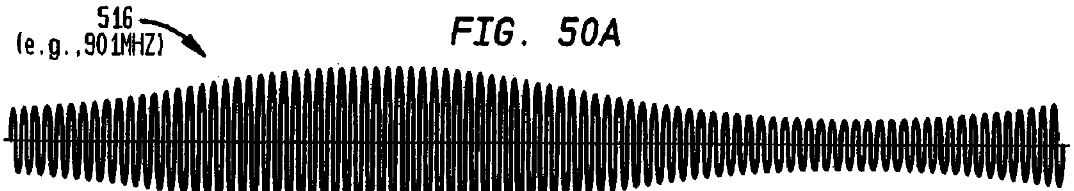
FIGS. 50A-G illustrate example signal diagrams associated with down-converting an analog AM signal to an intermediate frequency by transferring energy at an aliasing rate according to embodiments of the invention.
Figure 50B:
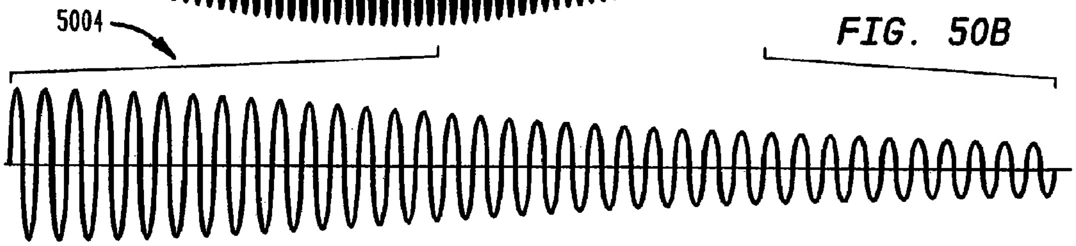

A process for down-converting the analog AM carrier signal 516 in FIG. 5C to an analog AM intermediate signal is now described for the flowchart 4607 in FIG. 46B. The analog AM carrier signal 516 is re-illustrated in FIG. 50A for convenience. For this example, the analog AM carrier signal 516 oscillates at approximately 901 MHZ. In FIG. 50B, an analog AM carrier signal 5004 illustrates a portion of the analog AM carrier signal 516 on an expanded time scale.

The process begins at step 4608, which includes receiving the EM signal. This is represented by the analog AM carrier signal 516.

Figure 50D:
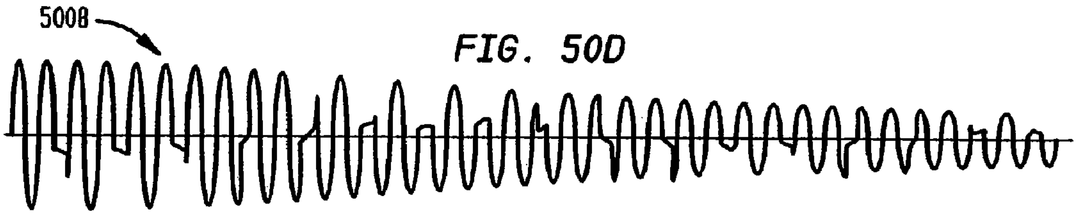
Figure 50C:
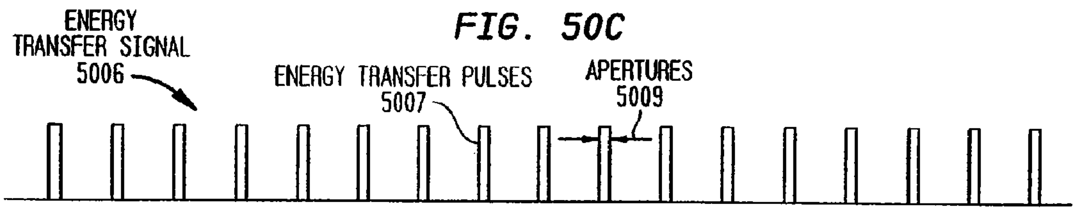

Step 4610 includes receiving an energy transfer signal having an aliasing rate $F_{AR}$. FIG. 50C illustrates an example energy transfer signal 5006 on approximately the same time scale as FIG. 50B. The energy transfer signal 5006 includes a train of energy transfer pulses 5007 having non-negligible apertures 5009 that tend away from zero time in duration. The energy transfer pulses 5007 repeat at the aliasing rate $F_{AR}$, which is determined or selected as previously described. Generally, when down-converting to an intermediate signal, the aliasing rate $F_{AR}$ is substantially equal to a harmonic or, more typically, a sub-harmonic of the difference frequency $F_{DIFF}$.

Step 4612 includes transferring energy from the EM signal at the aliasing rate to down-convert the EM signal to an intermediate signal $F_{IF}$. In FIG. 50D, an affected analog AM carrier signal 5008 illustrates effects of transferring energy from the analog AM carrier signal 516 at the aliasing rate $F_{AR}$. The affected analog AM carrier signal 5008 is illustrated on substantially the same time scale as FIGS. 50B and 50C.

Figure 50E:
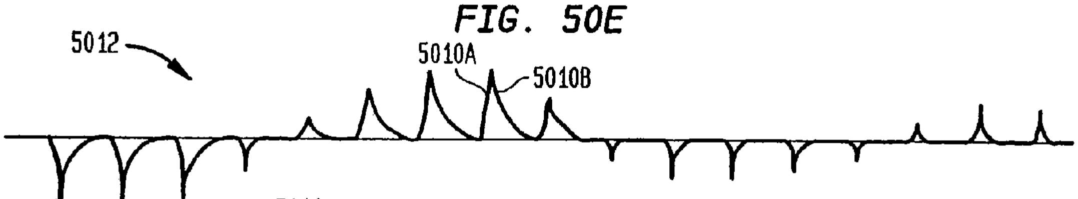

FIG. 50E illustrates a down-converted AM intermediate signal 5012, which is generated by the down-conversion process. The AM intermediate signal 5012 is illustrated with an arbitrary load impedance. Load impedance optimizations are discussed in Section 5 below.

The down-converted signal 5012 includes portions 5010A, which correlate with the energy transfer pulses 5007 in FIG. 50C, and portions 5010B, which are between the energy transfer pulses 5007. Portions 5010A represent energy transferred from the AM analog signal 516 to a storage device, while simultaneously driving an output load. The portions 5010A occur when a switching module is closed by the energy transfer pulses 5007. Portions 5010B represent energy stored in a storage device continuing to drive the load. Portions 5010B occur when the switching module is opened after energy transfer pulses 5007.

Because a harmonic of the aliasing rate is off-set from the analog AM carrier signal 516, the energy transfer pulses 5007 "walk through" the analog AM carrier signal 516 at the difference frequency $F_{DIFF}$. In other words, the energy transfer pulses 5007 occur at different locations of subsequent cycles of the AM carrier signal 516. As a result, the energy transfer pulses 5007 capture varying amounts of energy from the analog AM carrier signal 516, as illustrated by portions 5010A, which provides the AM intermediate signal 5012 with an oscillating frequency $F_{IF}$.

Figure 50F:
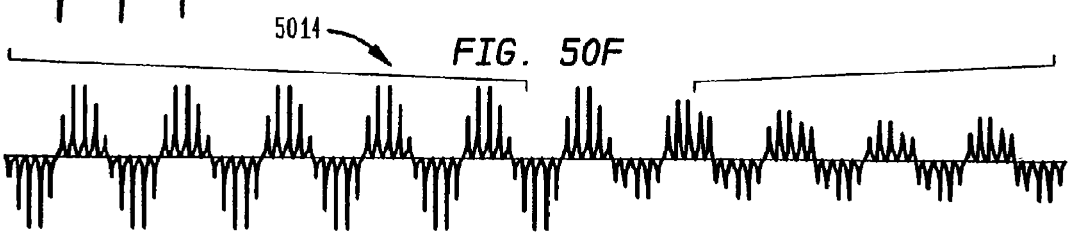
Figure 50G:
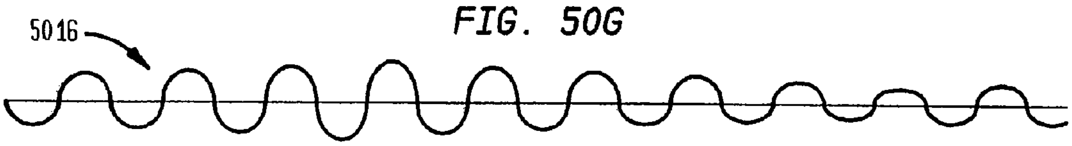

In FIG. 50F, an AM intermediate signal 5014 illustrates the AM intermediate signal 5012 on a compressed time scale. In FIG. 50G, an AM intermediate signal 5016 represents a filtered version of the AM intermediate signal 5014. The AM intermediate signal 5016 is substantially similar to the AM carrier signal 516, except that the AM intermediate signal 5016 is at the intermediate frequency. The AM intermediate signal 5016 can be demodulated through any conventional demodulation technique.

The present invention can output the unfiltered AM intermediate signal 5014, the filtered AM intermediate signal 5016, a partially filtered AM intermediate signal, a stair step output signal, etc. The choice between these embodiments is generally a design choice that depends upon the application of the invention.

The signals referred to herein illustrate frequency down-conversion in accordance with the invention. For example, the AM intermediate signals 5014 in FIG. 50F and 5016 in FIG. 50G illustrate that the AM carrier signal 516 was successfully down-converted to an intermediate signal by retaining enough baseband information for sufficient reconstruction.

2.2.1.2.2 Digital AM Carrier Signal

Figure 51A:
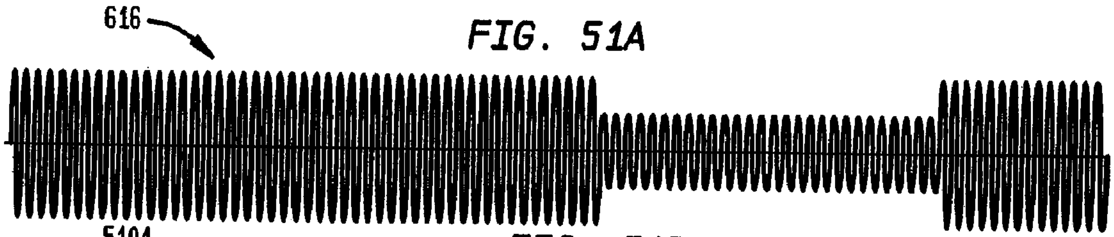
FIGS. 51A-G illustrate example signal diagrams associated with down-converting an digital AM signal to an intermediate frequency by transferring energy at an aliasing rate according to embodiments of the invention.
Figure 51B:
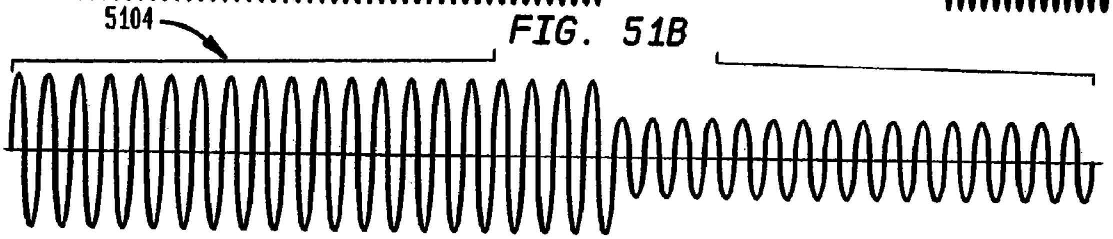

A process for down-converting the digital AM carrier signal 616 to a digital AM intermediate signal is now described for the flowchart 4607 in FIG. 46B. The digital AM carrier signal 616 is re-illustrated in FIG. 51A for convenience. For this example, the digital AM carrier signal 616 oscillates at approximately 901 MHZ. In FIG. 51B, a digital AM carrier signal 5104 illustrates a portion of the digital AM carrier signal 616 on an expanded time scale.

The process begins at step 4608, which includes receiving an EM signal. This is represented by the digital AM carrier signal 616.

Figure 51D:
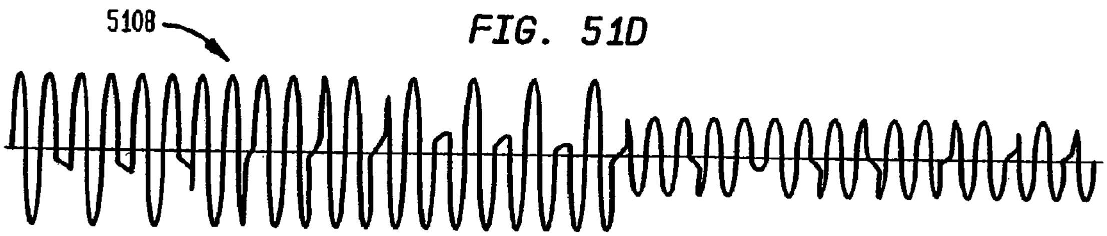
Figure 51C:
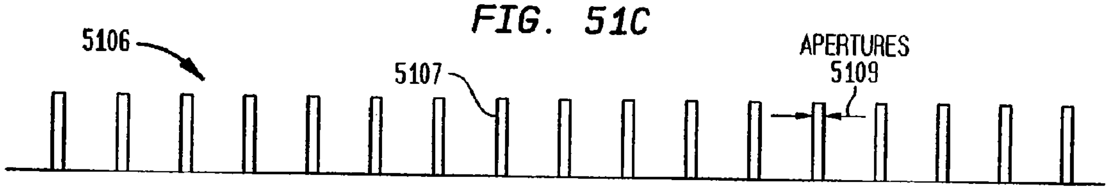

Step 4610 includes receiving an energy transfer signal having an aliasing rate $F_{AR}$. FIG. 51C illustrates an example energy transfer signal 5106 on substantially the same time scale as FIG. 51B. The energy transfer signal 5106 includes a train of energy transfer pulses 5107 having non-negligible apertures 5109 that tend away from zero time in duration. The energy transfer pulses 5107 repeat at the aliasing rate, which is determined or selected as previously described. Generally, when down-converting to an intermediate signal, the aliasing rate is substantially equal to a harmonic or, more typically, a sub-harmonic of the difference frequency $F_{DIFF}$.

Step 4612 includes transferring energy from the EM signal at the aliasing rate to down-convert the EM signal to the intermediate signal $F_{IF}$. In FIG. 51D, an affected digital AM carrier signal 5108 illustrates effects of transferring energy from the digital AM carrier signal 616 at the aliasing rate $F_{AR}$. The affected digital AM carrier signal 5108 is illustrated on substantially the same time scale as FIGS. 51B and 51C.

Figure 51E:
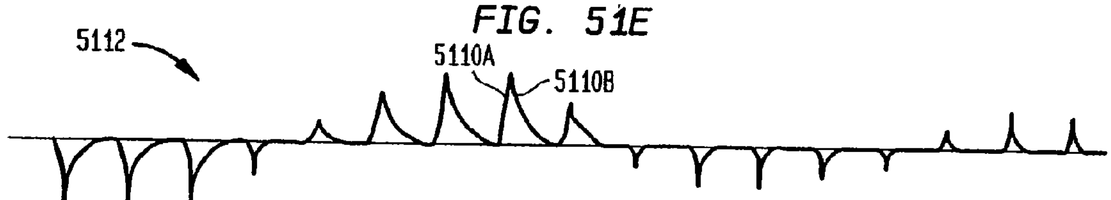

FIG. 51E illustrates a down-converted AM intermediate signal 5112, which is generated by the down-conversion process. The AM intermediate signal 5112 is illustrated with an arbitrary load impedance. Load impedance optimizations are discussed in Section 5 below.

The down-converted signal 5112 includes portions 5110A, which correlate with the energy transfer pulses 5107 in FIG. 51C, and portions 5110B, which are between the energy transfer pulses 5107. Portions 5110A represent energy transferred from the digital AM carrier signal 616 to a storage device, while simultaneously driving an output load. The portions 5110A occur when a switching module is closed by the energy transfer pulses 5107. Portions 5110B represent energy stored in a storage device continuing to drive the load. Portions 5110B occur when the switching module is opened after energy transfer pulses 5107.

Because a harmonic of the aliasing rate is off-set from the frequency of the digital AM carrier signal 616, the energy transfer pulses 5107 "walk through" the digital AM signal 616 at the difference frequency $F_{DIFF}$. In other words, the energy transfer pulse 5107 occur at different locations of subsequent cycles of the digital AM carrier signal 616. As a result, the energy transfer pulses 5107 capture varying amounts of energy from the digital AM carrier signal 616, as illustrated by portions 5110, which provides the AM intermediate signal 5112 with an oscillating frequency $F_{IF}$.

Figure 51F:
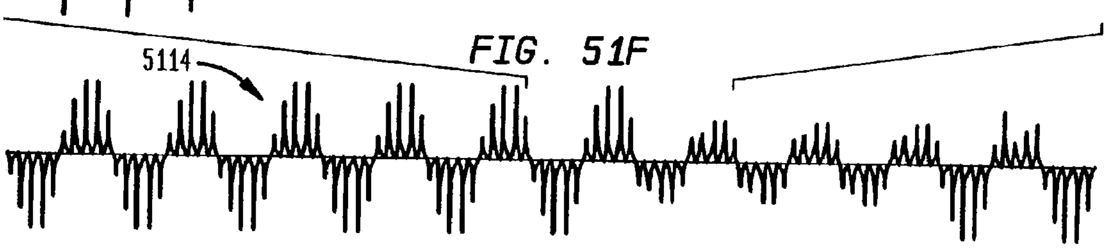
Figure 51G:
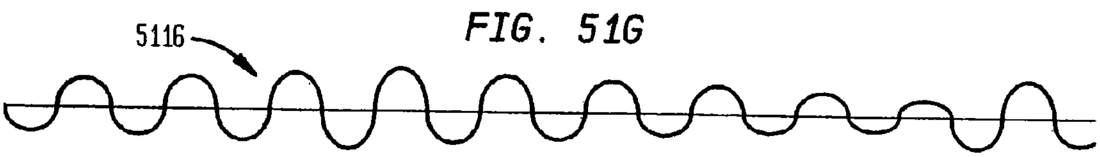

In FIG. 51F, a digital AM intermediate signal 5114 illustrates the AM intermediate signal 5112 on a compressed time scale. In FIG. 51G, an AM intermediate signal 5116 represents a filtered version of the AM intermediate signal 5114. The AM intermediate signal 5116 is substantially similar to the AM carrier signal 616, except that the AM intermediate signal 5116 is at the intermediate frequency. The AM intermediate signal 5116 can be demodulated through any conventional demodulation technique.

The present invention can output the unfiltered AM intermediate signal 5114, the filtered AM intermediate signal 5116, a partially filtered AM intermediate signal, a stair step output signal, etc. The choice between these embodiments is generally a design choice that depends upon the application of the invention.

The signals referred to herein illustrate frequency down-conversion in accordance with the invention. For example, the AM intermediate signals 5114 in FIGS. 51F and 5116 in FIG. 51G illustrate that the AM carrier signal 616 was successfully down-converted to an intermediate signal by retaining enough baseband information for sufficient reconstruction.

2.2.1.2 Structural Description

The operation of the energy transfer system 6302 is now described for the analog AM carrier signal 516, with reference to the flowchart 4607 and to the timing diagrams in FIGS. 50A-G. In step 4608, the energy transfer module 6304 receives the analog AM carrier signal 516. In step 4610, the energy transfer module 6304 receives the energy transfer signal 5006. In step 4612, the energy transfer module 6304 transfers energy from the analog AM carrier signal 516 at the aliasing rate of the energy transfer signal 5006, to down-convert the analog AM carrier signal 516 to the AM intermediate signal 5012.

The operation of the energy transfer system 6302 is now described for the digital AM carrier signal 616, with reference to the flowchart 1401 and the timing diagrams in FIGS. 51A-G. In step 4608, the energy transfer module 6304 receives the digital AM carrier signal 616. In step 4610, the energy transfer module 6304 receives the energy transfer signal 5106. In step 4612, the energy transfer module 6304 transfers energy from the digital AM carrier signal 616 at the aliasing rate of the energy transfer signal 5106, to down-convert the digital AM carrier signal 616 to the AM intermediate signal 5112.

Example embodiments of the energy transfer module 6304 are disclosed in Sections 4 and 5 below.

2.2.2 Second Example Embodiment Frequency Modulation 2.2.2.1 Operational Description Operation of the exemplary process of the flowchart 4607 in FIG. 46B is described below for the analog FM carrier signal 716, illustrated in FIG. 7C, and for the digital FM carrier signal 816, illustrated in FIG. 8C.

2.2.2.1.1 Analog FM Carrier Signal

Figure 52A:
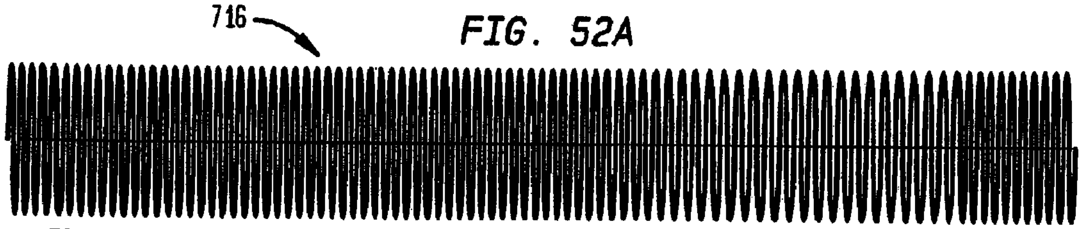
FIGS. 52A-G illustrate example signal diagrams associated with down-converting an analog FM signal to an intermediate frequency by transferring energy at an aliasing rate according to embodiments of the invention.
Figure 52B:
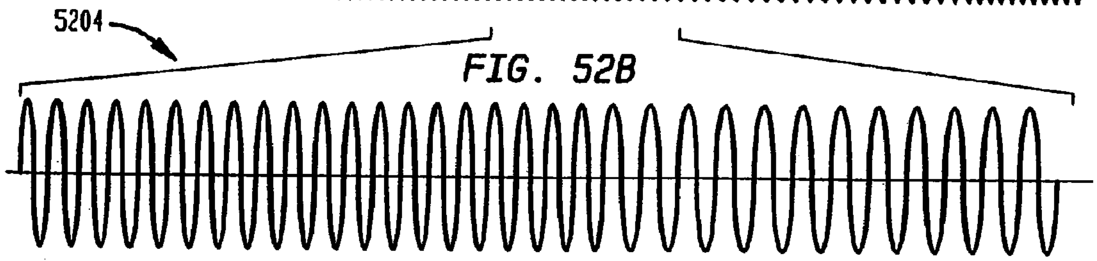

A process for down-converting the analog FM carrier signal 716 in FIG. 7C to an FM intermediate signal is now described for the flowchart 4607 in FIG. 46B. The analog FM carrier signal 716 is re-illustrated in FIG. 52A for convenience. For this example, the analog FM carrier signal 716 oscillates around approximately 901 MHZ. In FIG. 52B, an analog FM carrier signal 5204 illustrates a portion of the analog FM carrier signal 716 on an expanded time scale.

The process begins at step 4608, which includes receiving an EM signal. This is represented by the analog FM carrier signal 716.

Figure 52D:
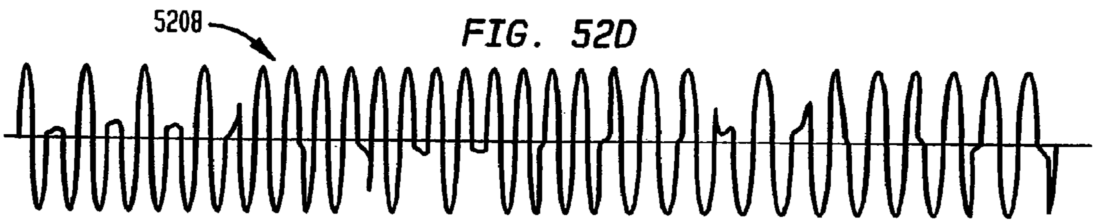
Figure 52C:
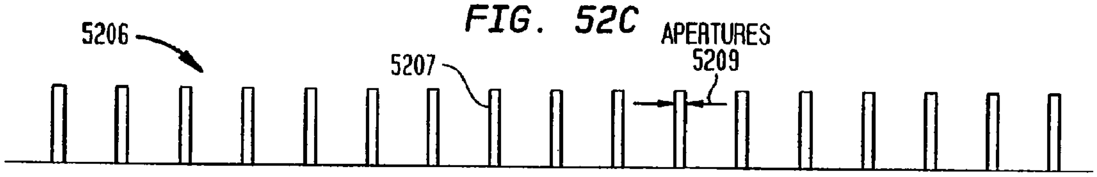

Step 4610 includes receiving an energy transfer signal having an aliasing rate $F_{AR}$. FIG. 52C illustrates an example energy transfer signal 5206 on approximately the same time scale as FIG. 52B. The energy transfer signal 5206 includes a train of energy transfer pulses 5207 having non-negligible apertures that tend away from zero time in duration. The energy transfer pulses 5207 repeat at the aliasing rate $F_{AR}$, which is determined or selected as previously described. Generally, when down-converting to an intermediate signal, the aliasing rate $F_{AR}$ is substantially equal to a harmonic or, more typically, a sub-harmonic of the difference frequency $F_{DIFF}$.

Step 4612 includes transferring energy from the EM signal at the aliasing rate to down-convert the EM signal to an intermediate signal $F_{IF}$. In FIG. 52D, an affected analog FM carrier signal 5208 illustrates effects of transferring energy from the analog FM carrier signal 716 at the aliasing rate $F_{AR}$. The affected analog FM carrier signal 5208 is illustrated on substantially the same time scale as FIGS. 52B and 52C.

Figure 52E:
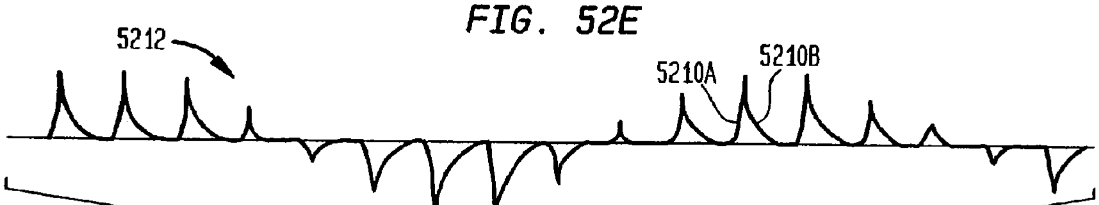

FIG. 52E illustrates a down-converted FM intermediate signal 5212, which is generated by the down-conversion process. The FM intermediate signal 5212 is illustrated with an arbitrary load impedance. Load impedance optimizations are discussed in Section 5 below.

The down-converted signal 5212 includes portions 5210A, which correlate with the energy transfer pulses 5207 in FIG. 52C, and portions 5210B, which are between the energy transfer pulses 5207. Portions 5210A represent energy transferred from the analog FM carrier signal 716 to a storage device, while simultaneously driving an output load. The portions 5210A occur when a switching module is closed by the energy transfer pulses 5207. Portions 5210B represent energy stored in a storage device continuing to drive the load. Portions 5210B occur when the switching module is opened after energy transfer pulses 5207.

Because a harmonic of the aliasing rate is off-set from the frequency of the analog FM carrier signal 716, the energy transfer pulses 5207 "walk through" the analog FM carrier signal 716 at the difference frequency $F_{DIFF}$. In other words, the energy transfer pulse 5207 occur at different locations of subsequent cycles of the analog FM carrier signal 716. As a result, the energy transfer pulses 5207 capture varying amounts of energy from the analog FM carrier signal 716, as illustrated by portions 5210, which provides the FM intermediate signal 5212 with an oscillating frequency $F_{IF}$.

Figure 52F:
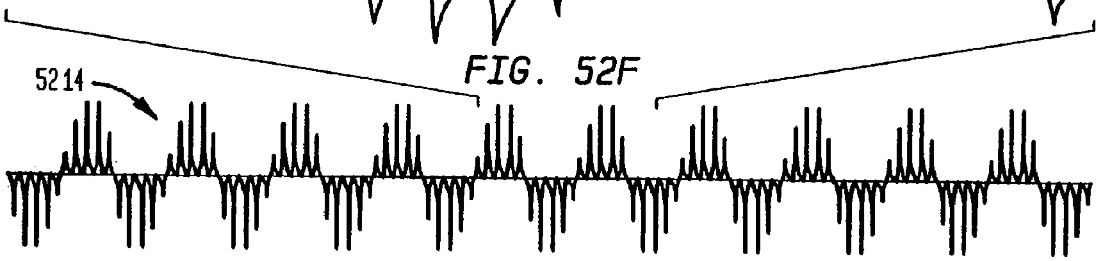
Figure 52G:
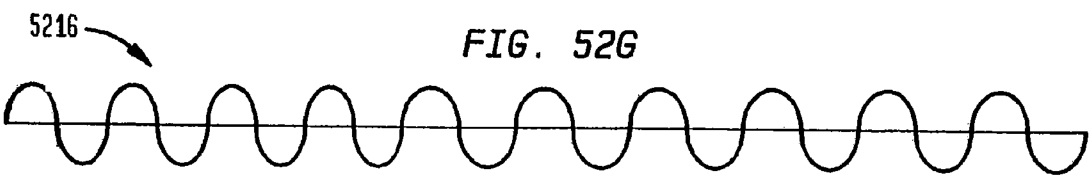

In FIG. 52F, an analog FM intermediate signal 5214 illustrates the FM intermediate signal 5212 on a compressed time scale. In FIG. 52G, an FM intermediate signal 5216 represents a filtered version of the FM intermediate signal 5214. The FM intermediate signal 5216 is substantially similar to the analog FM carrier signal 716, except that the FM intermediate signal 5216 is at the intermediate frequency. The FM intermediate signal 5216 can be demodulated through any conventional demodulation technique.

The present invention can output the unfiltered FM intermediate signal 5214, the filtered FM intermediate signal 5216, a partially filtered FM intermediate signal, a stair step output signal, etc. The choice between these embodiments is generally a design choice that depends upon the application of the invention.

The signals referred to herein illustrate frequency down-conversion in accordance with the invention. For example, the FM intermediate signals 5214 in FIGS. 52F and 5216 in FIG. 52G illustrate that the FM carrier signal 716 was successfully down-converted to an intermediate signal by retaining enough baseband information for sufficient reconstruction.

2.2.2.1.2 Digital FM Carrier Signal

Figures 53A, 53B, 53C, 53D, 53E, 53F, 53G:
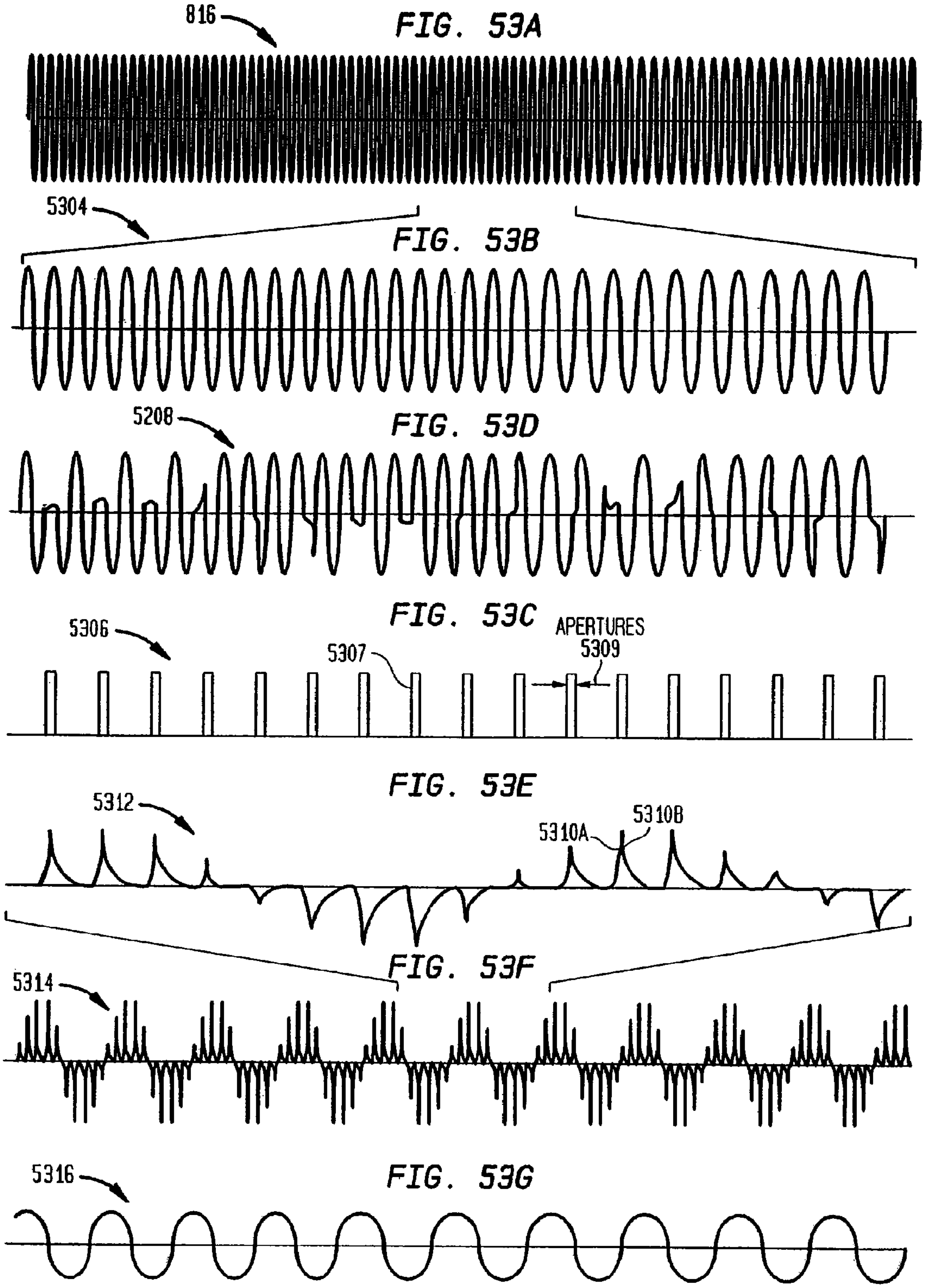
FIGS. 53A-G illustrate example signal diagrams associated with down-converting an digital FM signal to an intermediate frequency by transferring energy at an aliasing rate according to embodiments of the invention.

A process for down-converting the digital FM carrier signal 816 in FIG. 8C is now described for the flowchart 4607 in FIG. 46B. The digital FM carrier signal 816 is re-illustrated in FIG. 53A for convenience. For this example, the digital FM carrier signal 816 oscillates at approximately 901 MHZ. In FIG. 53B, a digital FM carrier signal 5304 illustrates a portion of the digital FM carrier signal 816 on an expanded time scale.

The process begins at step 4608, which includes receiving an EM signal. This is represented by the digital FM carrier signal 816.

Step 4610 includes receiving an energy transfer signal having an aliasing rate $F_{AR}$. FIG. 53C illustrates an example energy transfer signal 5306 on substantially the same time scale as FIG. 53B. The energy transfer signal 5306 includes a train of energy transfer pulses 5307 having non-negligible apertures 5309 that tend away from zero time in duration. The energy transfer pulses 5307 repeat at the aliasing rate, which is determined or selected as previously described. Generally, when down-converting to an intermediate signal, the aliasing rate $F_{AR}$ is substantially equal to a harmonic or, more typically, a sub-harmonic of the difference frequency $F_{DIFF}$.

Step 4612 includes transferring energy from the EM signal at the aliasing rate to down-convert the EM signal to the an intermediate signal $F_{IF}$. In FIG. 53D, an affected digital FM carrier signal 5308 illustrates effects of transferring energy from the digital FM carrier signal 816 at the aliasing rate $F_{AR}$. The affected digital FM carrier signal 5308 is illustrated on substantially the same time scale as FIGS. 53B and 53C.

FIG. 53E illustrates a down-converted FM intermediate signal 5312, which is generated by the down-conversion process. The down-converted signal 5312 includes portions 5310A, which correlate with the energy transfer pulses 5307 in FIG. 53C, and portions 5310B, which are between the energy transfer pulses 5307. Down-converted signal 5312 is illustrated with an arbitrary load impedance. Load impedance optimizations are discussed in Section 5 below.

Portions 5310A represent energy transferred from the digital FM carrier signal 816 to a storage device, while simultaneously driving an output load. The portions 5310A occur when a switching module is closed by the energy transfer pulses 5307.

Portions 5310B represent energy stored in a storage device continuing to drive the load. Portions 5310B occur when the switching module is opened after energy transfer pulses 5307.

Because a harmonic of the aliasing rate is off-set from the frequency of the digital FM carrier signal 816, the energy transfer pulses 5307 "walk through" the digital FM carrier signal 816 at the difference frequency $F_{DIFF}$. In other words, the energy transfer pulse 5307 occur at different locations of subsequent cycles of the digital FM carrier signal 816. As a result, the energy transfer pulses 5307 capture varying amounts of energy from the digital FM carrier signal 816, as illustrated by portions 5310, which provides the FM intermediate signal 5312 with an oscillating frequency $F_{IF}$.

In FIG. 53F, a digital FM intermediate signal 5314 illustrates the FM intermediate signal 5312 on a compressed time scale. In FIG. 53G, an FM intermediate signal 5316 represents a filtered version of the FM intermediate signal 5314. The FM intermediate signal 5316 is substantially similar to the digital FM carrier signal 816, except that the FM intermediate signal 5316 is at the intermediate frequency. The FM intermediate signal 5316 can be demodulated through any conventional demodulation technique.

The present invention can output the unfiltered FM intermediate signal 5314, the filtered FM intermediate signal 5316, a partially filtered FM intermediate signal, a stair step output signal, etc. The choice between these embodiments is generally a design choice that depends upon the application of the invention.

The signals referred to herein illustrate frequency down-conversion in accordance with the invention. For example, the FM intermediate signals 5314 in FIGS. 53F and 5316 in FIG. 53G illustrate that the FM carrier signal 816 was successfully down-converted to an intermediate signal by retaining enough baseband information for sufficient reconstruction.

2.2.2.2 Structural Description

The operation of the energy transfer system 6302 is now described for the analog FM carrier signal 716, with reference to the flowchart 4607 and the timing diagrams in FIGS. 52A-G. In step 4608, the energy transfer module 6304 receives the analog FM carrier signal 716. In step 4610, the energy transfer module 6304 receives the energy transfer signal 5206. In step 4612, the energy transfer module 6304 transfers energy from the analog FM carrier signal 716 at the aliasing rate of the energy transfer signal 5206, to down-convert the analog FM carrier signal 716 to the FM intermediate signal 5212.

The operation of the energy transfer system 6302 is now described for the digital FM carrier signal 816, with reference to the flowchart 4607 and the timing diagrams in FIGS. 53A-G. In step 4608, the energy transfer module 6304 receives the digital FM carrier signal 816. In step 4610, the energy transfer module 6304 receives the energy transfer signal 5306. In step 4612, the energy transfer module 6304 transfers energy from the digital FM carrier signal 816 at the aliasing rate of the energy transfer signal 5306, to down-convert the digital FM carrier signal 816 to the FM intermediate signal 5212.

Example embodiments of the energy transfer module 6304 are disclosed in Sections 4 and 5 below.

2.2.3 Third Example Embodiment Phase Modulation 2.2.3.1 Operational Description

Operation of the exemplary process of the flowchart 4607 in FIG. 46B is described below for the analog PM carrier signal 916, illustrated in FIG. 9C, and for the digital PM carrier signal 1016, illustrated in FIG. 10C.

2.2.3.1.1 Analog PM Carrier Signal

Figure 54A:
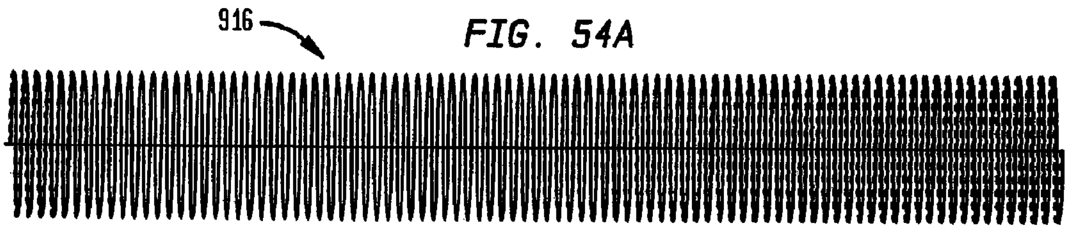
FIGS. 54A-G illustrate example signal diagrams associated with down-converting an analog PM signal to an intermediate frequency by transferring energy at an aliasing rate according to embodiments of the invention.
Figure 54B:
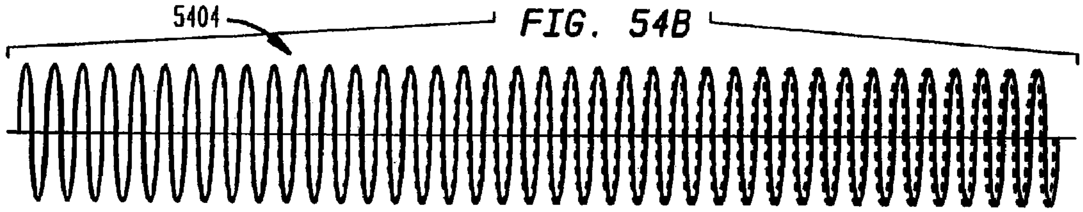

A process for down-converting the analog PM carrier signal 916 in FIG. 9C to an analog PM intermediate signal is now described for the flowchart 4607 in FIG. 46B. The analog PM carrier signal 916 is re-illustrated in FIG. 54A for convenience. For this example, the analog PM carrier signal 916 oscillates at approximately 901 MHZ. In FIG. 54B, an analog PM carrier signal 5404 illustrates a portion of the analog PM carrier signal 916 on an expanded time scale.

The process begins at step 4608, which includes receiving an EM signal. This is represented by the analog PM carrier signal 916.

Figure 54D:
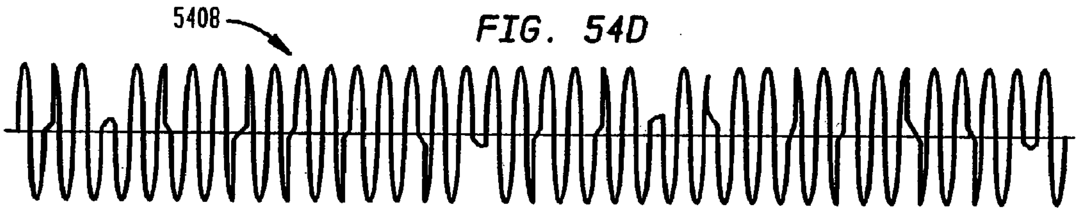
Figure 54C:
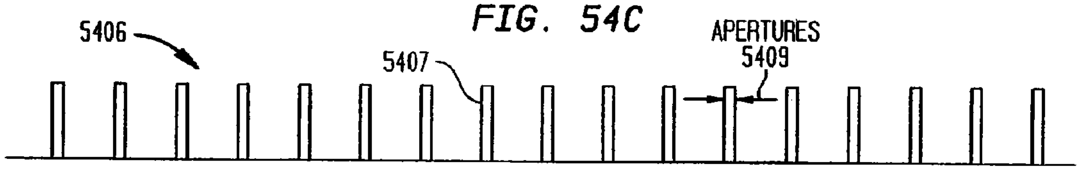

Step 4610 includes receiving an energy transfer signal having an aliasing rate $F_{AR}$. FIG. 54C illustrates an example energy transfer signal 5406 on approximately the same time scale as FIG. 54B. The energy transfer signal 5406 includes a train of energy transfer pulses 5407 having non-negligible apertures that tend away from zero time in duration. The energy transfer pulses 5407 repeat at the aliasing rate, which is determined or selected as previously described. Generally, when down-converting to an intermediate signal, the aliasing rate $F_{AR}$ is substantially equal to a harmonic or, more typically, a sub-harmonic of the difference frequency $F_{DIFF}$.

Step 4612 includes transferring energy from the EM signal at the aliasing rate to down-convert the EM signal to the IF signal $F_{IF}$. In FIG. 54D, an affected analog PM carrier signal 5408 illustrates effects of transferring energy from the analog PM carrier signal 916 at the aliasing rate $F_{AR}$. The affected analog PM carrier signal 5408 is illustrated on substantially the same time scale as FIGS. 54B and 54C.

Figure 54E:
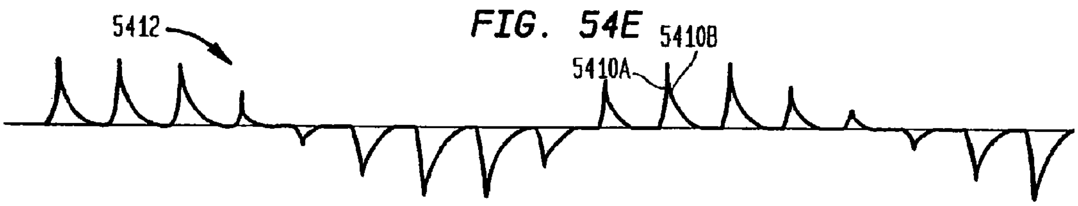

FIG. 54E illustrates a down-converted PM intermediate signal 5412, which is generated by the down-conversion process. The down-converted PM intermediate signal 5412 includes portions 5410A, which correlate with the energy transfer pulses 5407 in FIG. 54C, and portions 5410B, which are between the energy transfer pulses 5407. Down-converted signal 5412 is illustrated with an arbitrary load impedance. Load impedance optimizations are discussed in Section 5 below.

Portions 5410A represent energy transferred from the analog PM carrier signal 916 to a storage device, while simultaneously driving an output load. The portions 5410A occur when a switching module is closed by the energy transfer pulses 5407.

Portions 5410B represent energy stored in a storage device continuing to drive the load. Portions 5410B occur when the switching module is opened after energy transfer pulses 5407.

Because a harmonic of the aliasing rate is off-set from the frequency of the analog PM carrier signal 916, the energy transfer pulses 5407 "walk through" the analog PM carrier signal 916 at the difference frequency $F_{DIFF}$. In other words, the energy transfer pulse 5407 occur at different locations of subsequent cycles of the analog PM carrier signal 916. As a result, the energy transfer pulses 5407 capture varying amounts of energy from the analog PM carrier signal 916, as illustrated by portions 5410, which provides the PM intermediate signal 5412 with an oscillating frequency $F_{IF}$.

Figure 54F:
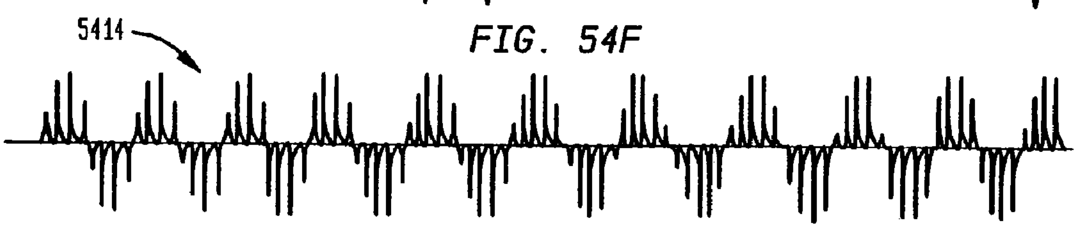
Figure 54G:
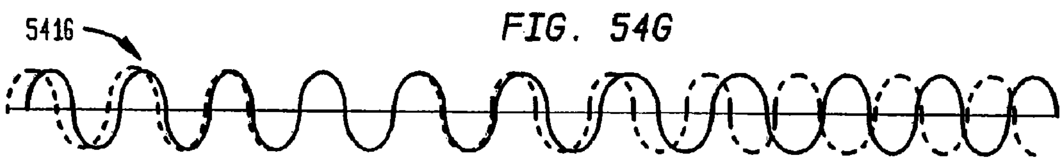

In FIG. 54F, an analog PM intermediate signal 5414 illustrates the PM intermediate signal 5412 on a compressed time scale. In FIG. 54G, an PM intermediate signal 5416 represents a filtered version of the PM intermediate signal 5414. The PM intermediate signal 5416 is substantially similar to the analog PM carrier signal 916, except that the PM intermediate signal 5416 is at the intermediate frequency. The PM intermediate signal 5416 can be demodulated through any conventional demodulation technique.

The present invention can output the unfiltered PM intermediate signal 5414, the filtered PM intermediate signal 5416, a partially filtered PM intermediate signal, a stair step output signal, etc. The choice between these embodiments is generally a design choice that depends upon the application of the invention.

The signals referred to herein illustrate frequency down-conversion in accordance with the invention. For example, the PM intermediate signals 5414 in FIGS. 54F and 5416 in FIG. 54G illustrate that the PM carrier signal 916 was successfully down-converted to an intermediate signal by retaining enough baseband information for sufficient reconstruction.

2.2.3.1.2 Digital PM Carrier Signal

Figure 55A:
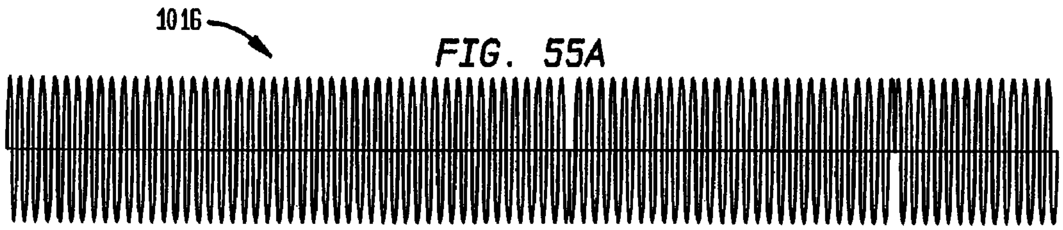
FIGS. 55A-G illustrate example signal diagrams associated with down-converting an digital PM signal to an intermediate frequency by transferring energy at an aliasing rate according to embodiments of the invention.
Figure 55B:
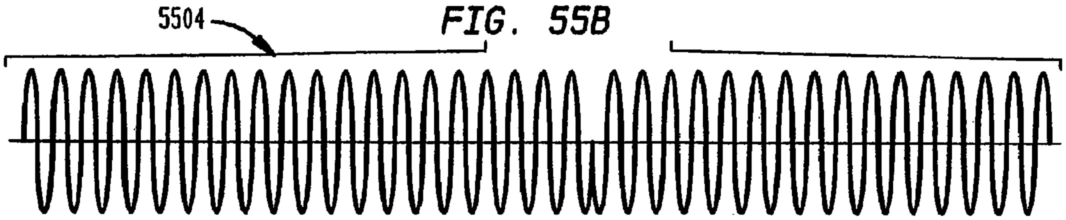

A process for down-converting the digital PM carrier signal 1016 in FIG. 10C to a digital PM signal is now described for the flowchart 4607 in FIG. 46B. The digital PM carrier signal 1016 is re-illustrated in FIG. 55A for convenience. For this example, the digital PM carrier signal 1016 oscillates at approximately 901 MHZ. In FIG. 55B, a digital PM carrier signal 5504 illustrates a portion of the digital PM carrier signal 1016 on an expanded time scale.

The process begins at step 4608, which includes receiving an EM signal. This is represented by the digital PM carrier signal 1016.

Figure 55D:
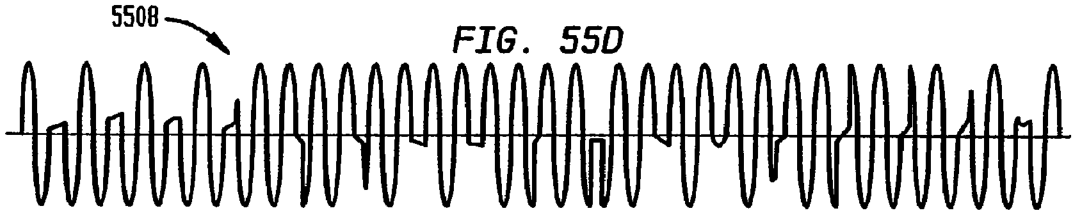
Figure 55C:
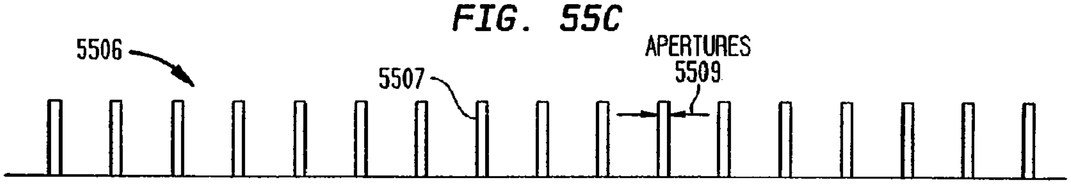

Step 4610 includes receiving an energy transfer signal having an aliasing rate $F_{AR}$. FIG. 55C illustrates an example energy transfer signal 5506 on substantially the same time scale as FIG. 55B. The energy transfer signal 5506 includes a train of energy transfer pulses 5507 having non-negligible apertures 5509 that tend away from zero time in duration. The energy transfer pulses 5507 repeat at an aliasing rate, which is determined or selected as previously described. Generally, when down-converting to an intermediate signal, the aliasing rate $F_{AR}$ is substantially equal to a harmonic or, more typically, a sub-harmonic of the difference frequency $F_{DIFF}$.

Step 4612 includes transferring energy from the EM signal at the aliasing rate to down-convert the EM signal to an intermediate signal $F_{IF}$. In FIG. 55D, an affected digital PM carrier signal 5508 illustrates effects of transferring energy from the digital PM carrier signal 1016 at the aliasing rate $F_{AR}$. The affected digital PM carrier signal 5508 is illustrated on substantially the same time scale as FIGS. 55B and 55C.

Figure 55E:
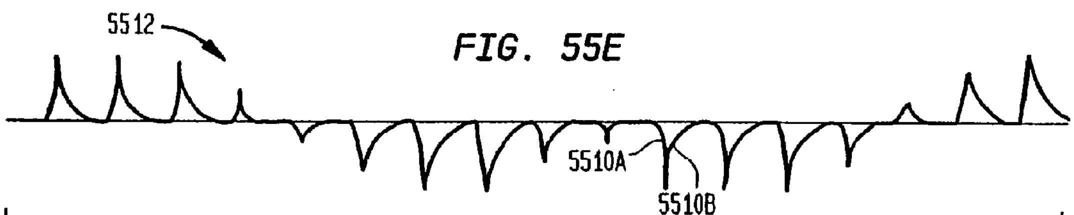

FIG. 55E illustrates a down-converted PM intermediate signal 5512, which is generated by the down-conversion process. The down-converted PM intermediate signal 5512 includes portions 5510A, which correlate with the energy transfer pulses 5507 in FIG. 55C, and portions 5510B, which are between the energy transfer pulses 5507. Down-converted signal 5512 is illustrated with an arbitrary load impedance. Load impedance optimizations are discussed in Section 5 below.

Portions 5510A represent energy transferred from the digital PM carrier signal 1016 to a storage device, while simultaneously driving an output load. The portions 5510A occur when a switching module is closed by the energy transfer pulses 5507.

Portions 5510B represent energy stored in a storage device continuing to drive the load. Portions 5510B occur when the switching module is opened after energy transfer pulses 5507.

Because a harmonic of the aliasing rate is off-set from the frequency of the digital PM carrier signal 716, the energy transfer pulses 5507 "walk through" the digital PM carrier signal 1016 at the difference frequency $F_{DIFF}$. In other words, the energy transfer pulse 5507 occur at different locations of subsequent cycles of the digital PM carrier signal 1016. As a result, the energy transfer pulses 5507 capture varying amounts of energy from the digital PM carrier signal 1016, as illustrated by portions 5510, which provides the PM intermediate signal 5512 with an oscillating frequency $F_{IF}$.

Figure 55F:
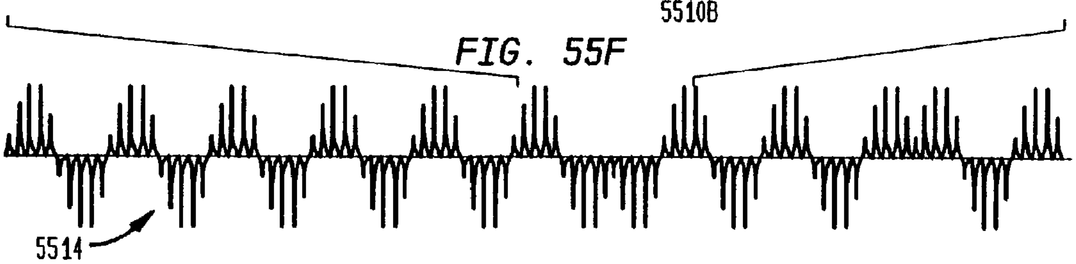
Figure 55G:
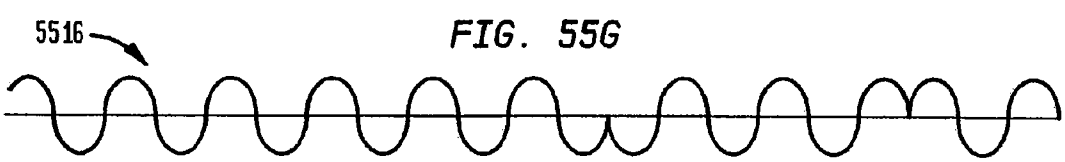

In FIG. 55F, a digital PM intermediate signal 5514 illustrates the PM intermediate signal 5512 on a compressed time scale. In FIG. 55G, an PM intermediate signal 5516 represents a filtered version of the PM intermediate signal 5514. The PM intermediate signal 5516 is substantially similar to the digital PM carrier signal 1016, except that the PM intermediate signal 5516 is at the intermediate frequency. The PM intermediate signal 5516 can be demodulated through any conventional demodulation technique.

The present invention can output the unfiltered PM intermediate signal 5514, the filtered PM intermediate signal 5516, a partially filtered PM intermediate signal, a stair step output signal, etc. The choice between these embodiments is generally a design choice that depends upon the application of the invention.

The signals referred to herein illustrate frequency down-conversion in accordance with the invention. For example, the PM intermediate signals 5514 in FIGS. 55F and 5516 in FIG. 55G illustrate that the PM carrier signal 1016 was successfully down-converted to an intermediate signal by retaining enough baseband information for sufficient reconstruction.

2.2.3.2 Structural Description

Operation of the energy transfer system 6302 is now described for the analog PM carrier signal 916, with reference to the flowchart 4607 and the timing diagrams in FIGS. 54A-G. In step 4608, the energy transfer module 6304 receives the analog PM carrier signal 916. In step 4610, the energy transfer module 6304 receives the energy transfer signal 5406. In step 4612, the energy transfer module 6304 transfers energy from the analog PM carrier signal 916 at the aliasing rate of the energy transfer signal 5406, to down-convert the analog PM carrier signal 916 to the PM intermediate signal 5412.

Operation of the energy transfer system 6302 is now described for the digital PM carrier signal 1016, with reference to the flowchart 4607 and the timing diagrams in FIGS. 55A-G. In step 4608, the energy transfer module 6304 receives the digital PM carrier signal 1016. In step 4610, the energy transfer module 6304 receives the energy transfer signal 5506. In step 4612, the energy transfer module 6304 transfers energy from the digital PM carrier signal 1016 at the aliasing rate of the energy transfer signal 5506, to down-convert the digital PM carrier signal 1016 to the PM intermediate signal 5512.

Example embodiments of the energy transfer module 6304 are disclosed in Sections 4 and 5 below.

2.2.4 Other Embodiments

The embodiments described above are provided for purposes of illustration. These embodiments are not intended to limit the invention. Alternate embodiments, differing slightly or substantially from those described herein, will be apparent to persons skilled in the relevant art(s) based on the teachings contained herein. Such alternate embodiments fall within the scope and spirit of the present invention. Example implementations of the energy transfer module 6304 are disclosed in Sections 4 and 5 below.

2.3 Implementation Examples

Exemplary operational and/or structural implementations related to the method(s), structure(s), and/or embodiments described above are presented in Sections 4 and 5 below. These implementations are presented for purposes of illustration, and not limitation. The invention is not limited to the particular implementation examples described therein. Alternate implementations (including equivalents, extensions, variations, deviations, etc., of those described herein) will be apparent to persons skilled in the relevant art(s) based on the teachings contained herein. Such alternate implementations fall within the scope and spirit of the present invention.

3. Directly Down-Converting an EM Signal to an Demodulated Baseband Signal by Transferring Energy from the EM Signal In an embodiment, the invention directly down-converts an EM signal to a baseband signal, by transferring energy from the EM signal. This embodiment is referred to herein as direct-to-data down-conversion and is illustrated by 4516 in FIG. 45B.

This embodiment can be implemented with modulated and unmodulated EM signals. This embodiment is described herein using the modulated carrier signal $F_{MC}$ in FIG. 1, as an example. In the example, the modulated carrier signal $F_{MC}$ is directly down-converted to the demodulated baseband signal $F_{DMB}$. Upon reading the disclosure and examples therein, one skilled in the relevant art(s) will understand that the invention can be implemented to down-convert any EM signal, including but not limited to, modulated carrier signals and unmodulated carrier signals.

The following sections describe methods for directly down-converting the modulated carrier signal $F_{MC}$ to the demodulated baseband signal $F_{DMB}$. Exemplary structural embodiments for implementing the methods are also described. It should be understood that the invention is not limited to the particular embodiments described below. Equivalents, extensions, variations, deviations, etc., of the following will be apparent to persons skilled in the relevant art(s) based on the teachings contained herein. Such equivalents, extensions, variations, deviations, etc., are within the scope and spirit of the present invention.

The following sections include a high level discussion, example embodiments, and implementation examples.

3.1 High level Description

This section (including its subsections) provides a high-level description of transferring energy from the modulated carrier signal $F_{MC}$ to directly down-convert the modulated carrier signal $F_{MC}$ to the demodulated baseband signal $F_{DMB}$, according to the invention. In particular, an operational process of directly down-converting the modulated carrier signal $F_{MC}$ to the demodulated baseband signal $F_{DMB}$ is described at a high-level. Also, a structural implementation for implementing this process is described at a high-level. The structural implementation is described herein for illustrative purposes, and is not limiting. In particular, the process described in this section can be achieved using any number of structural implementations, one of which is described in this section. The details of such structural implementations will be apparent to persons skilled in the relevant art(s) based on the teachings contained herein.

3.1.1 Operational Description

FIG. 46C depicts a flowchart 4613 that illustrates an exemplary method for transferring energy from the modulated carrier signal $F_{MC}$ to directly down-convert the modulated carrier signal $F_{MC}$ to the demodulated baseband signal $F_{DMB}$. The exemplary method illustrated in the flowchart 4613 is an embodiment of the flowchart 4601 in FIG. 46A.

Any and all combinations of modulation techniques are valid for this invention. For ease of discussion, the digital AM carrier signal 616 is used to illustrate a high level operational description of the invention. Subsequent sections provide detailed flowcharts and descriptions for AM and PM example embodiments. FM presents special considerations that are dealt with separately in Section III.3. Upon reading the disclosure and examples therein, one skilled in the relevant art(s) will understand that the invention can be implemented to down-convert any type of EM signal, including any form of modulated carrier signal and unmodulated carrier signals.

Figure 56A:
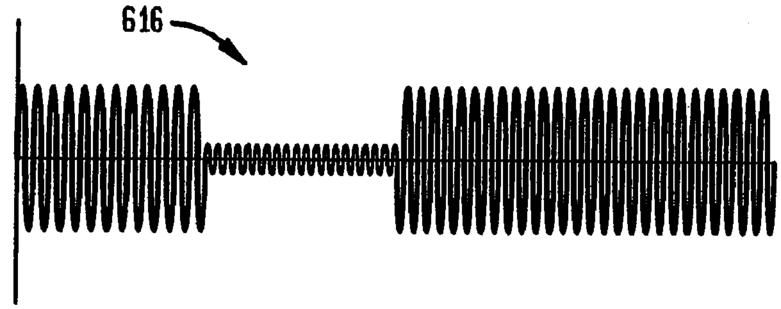
FIGS. 56A-D illustrate an example signal diagram associated with direct down-conversion according to embodiments of the invention.

The high-level process illustrated in the flowchart 4613 is now described at a high level using the digital AM carrier signal 616, from FIG. 6C. The digital AM carrier signal 616 is re-illustrated in FIG. 56A for convenience.

The process of the flowchart 4613 begins at step 4614, which includes receiving an EM signal. Step 4613 is represented by the digital AM carrier signal 616.

Figure 56B:
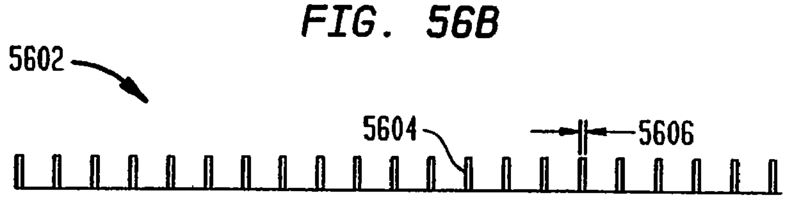

Step 4616 includes receiving an energy transfer signal having an aliasing rate $F_{AR}$. FIG. 56B illustrates an example energy transfer signal 5602, which includes a train of energy transfer pulses 5604 having apertures 5606 that are optimized for energy transfer. The optimized apertures 5606 are non-negligible and tend away from zero.

The non-negligible apertures 5606 can be any width other than the period of the EM signal, or a multiple thereof. For example, the non-negligible apertures 5606 can be less than the period of the signal 616 such as, ⅛, ¼, ½, ¾, etc., of the period of the signal 616. Alternatively, the non-negligible apertures 5606 can be greater than the period of the signal 616. The width and amplitude of the apertures 5606 can be optimized based on one or more of a variety of criteria, as described in sections below.

The energy transfer pulses 5604 repeat at the aliasing rate or pulse repetition rate. The aliasing rate is determined in accordance with EQ. (2), reproduced below for convenience.

$$F_C=n*F_{AR}\pm F_{IF} \quad \text{EQ. (2)}$$

When directly down-converting an EM signal to baseband (i.e., zero IF), EQ. (2) becomes:

$$F_C=n*F_{AR} \quad \text{EQ. (8)}$$

Thus, to directly down-convert the AM signal 616 to a demodulated baseband signal, the aliasing rate is substantially equal to the frequency of the AM signal 616 or to a harmonic or sub-harmonic thereof. Although the aliasing rate is too low to permit reconstruction of higher frequency components of the AM signal 616 (i.e., the carrier frequency), it is high enough to permit substantial reconstruction of the lower frequency modulating baseband signal 310.

Figure 56C:
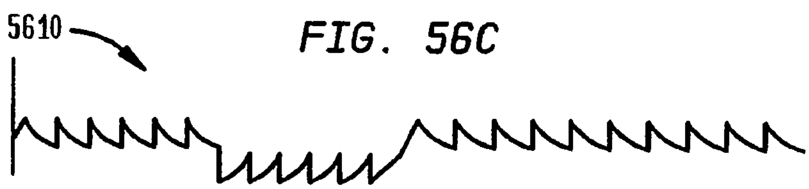

Step 4618 includes transferring energy from the EM signal at the aliasing rate to directly down-convert the EM signal to a demodulated baseband signal $F_{DMB}$. FIG. 56C illustrates a demodulated baseband signal 5610 that is generated by the direct down-conversion process. The demodulated baseband signal 5610 is similar to the digital modulating baseband signal 310 in FIG. 3.

Figure 56D:
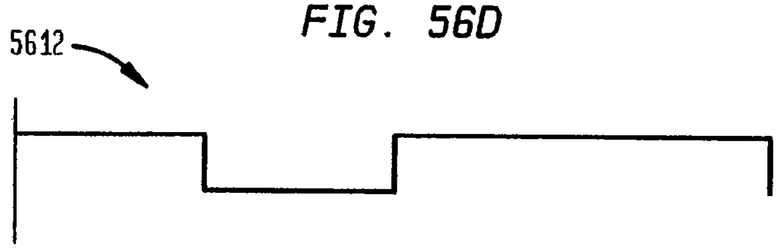

FIG. 56D depicts a filtered demodulated baseband signal 5612, which can be generated from the demodulated baseband signal 5610. The invention can thus generate a filtered output signal, a partially filtered output signal, or a relatively unfiltered output signal. The choice between filtered, partially filtered and non-filtered output signals is generally a design choice that depends upon the application of the invention.

3.1.2 Structural Description

In an embodiment, the energy transfer system 6302 transfers energy from any type of EM signal, including modulated carrier signals and unmodulated carrier signal, to directly down-convert the EM signal to a demodulated baseband signal. Preferably, the energy transfer system 6302 transfers energy from the EM signal 1304 to down-convert it to demodulated baseband signal in the manner shown in the operational flowchart 4613. However, it should be understood that the scope and spirit of the invention includes other structural embodiments for performing the steps of the flowchart 4613. The specifics of the other structural embodiments will be apparent to persons skilled in the relevant art(s) based on the discussion contained herein.

Operation of the energy transfer system 6302 is now described in at a high level for the digital AM carrier signal 616, with reference to the flowchart 4613 and the timing diagrams illustrated in FIGS. 56A-D. In step 4614, the energy transfer module 6304 receives the digital AM carrier signal 616. In step 4616, the energy transfer module 6304 receives the energy transfer signal 5602. In step 4618, the energy transfer module 6304 transfers energy from the digital AM carrier signal 616 at the aliasing rate to directly down-convert it to the demodulated baseband signal 5610.

Example implementations of the energy transfer module 6302 are disclosed in Sections 4 and 5 below.

3.2 Example Embodiments

Various embodiments related to the method(s) and structure(s) described above are presented in this section (and its subsections). These embodiments are described herein for purposes of illustration, and not limitation. The invention is not limited to these embodiments. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

The method for down-converting the EM signal to the demodulated baseband signal $F_{DMB}$, illustrated in the flowchart 4613 of FIG. 46C, can be implemented with various types of modulated carrier signals including, but not limited to, AM, PM, etc., or any combination thereof. The flowchart 4613 of FIG. 46C is described below for AM and PM. The exemplary descriptions below are intended to facilitate an understanding of the present invention. The present invention is not limited to or by the exemplary embodiments below.

3.2.1 First Example Embodiment Amplitude Modulation 3.2.1.1 Operational Description Operation of the exemplary process of the flowchart 4613 in FIG. 46C is described below for the analog AM carrier signal 516, illustrated in FIG. 5C, and for the digital AM carrier signal 616, illustrated in FIG. 6C.

3.2.1.1.1 Analog AM Carrier Signal

Figure 57A:
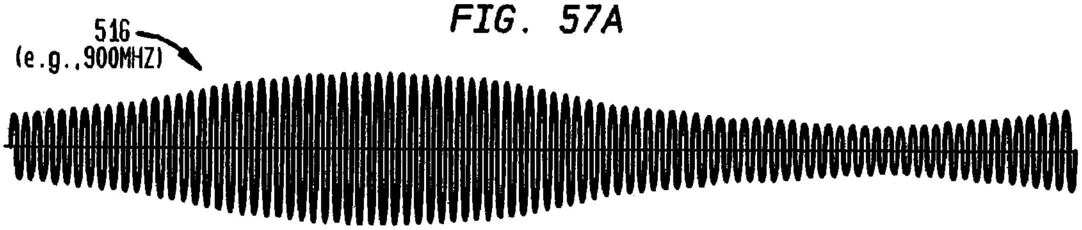
FIGS. 57A-F illustrate directly down-converting an analog AM signal to a demodulated baseband signal according to embodiments of the invention.
Figure 57B:
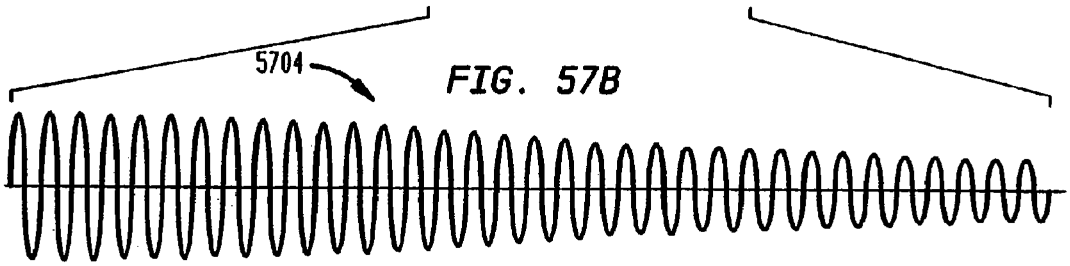

A process for directly down-converting the analog AM carrier signal 516 in FIG. 5C to a demodulated baseband signal is now described with reference to the flowchart 4613 in FIG. 46C. The analog AM carrier signal 516 is re-illustrated in 57A for convenience. For this example, the analog AM carrier signal 516 oscillates at approximately 900 MHZ. In FIG. 57B, an analog AM carrier signal portion 5704 illustrates a portion of the analog AM carrier signal 516 on an expanded time scale.

The process begins at step 4614, which includes receiving an EM signal. This is represented by the analog AM carrier signal 516.

Figure 57D:
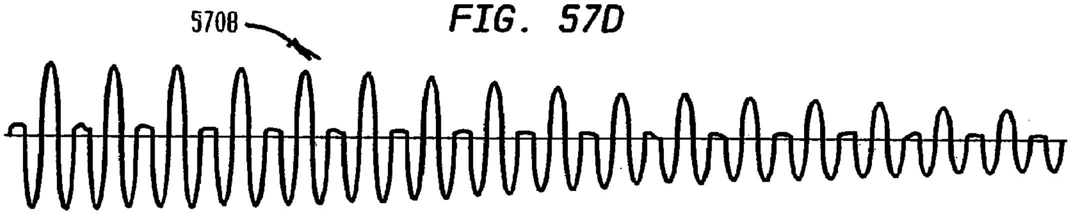
Figure 57C:
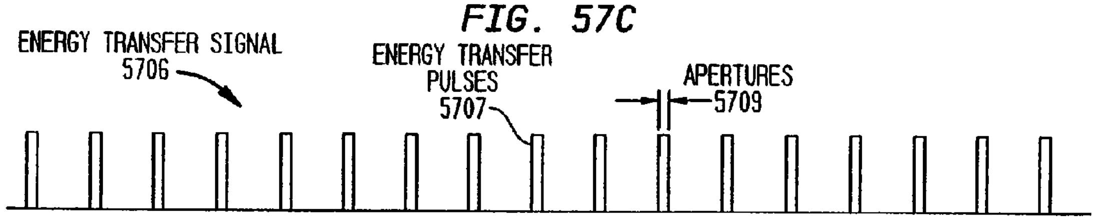

Step 4616 includes receiving an energy transfer signal having an aliasing rate $F_{AR}$. In FIG. 57C, an example energy transfer signal 5706 is illustrated on approximately the same time scale as FIG. 57B. The energy transfer signal 5706 includes a train of energy transfer pulses 5707 having non-negligible apertures that tend away from zero time in duration. The energy transfer pulses 5707 repeat at the aliasing rate, which is determined or selected as previously described. Generally, when down-converting an EM signal to a demodulated baseband signal, the aliasing rate $F_{AR}$ is substantially equal to a harmonic or, more typically, a sub-harmonic of the EM signal.

Step 4618 includes transferring energy from the EM signal at the aliasing rate to directly down-convert the EM signal to the demodulated baseband signal $F_{DMB}$. In FIG. 57D, an affected analog AM carrier signal 5708 illustrates effects of transferring energy from the analog AM carrier signal 516 at the aliasing rate $F_{AR}$. The affected analog AM carrier signal 5708 is illustrated on substantially the same time scale as FIGS. 57B and 57C.

Figure 57E:
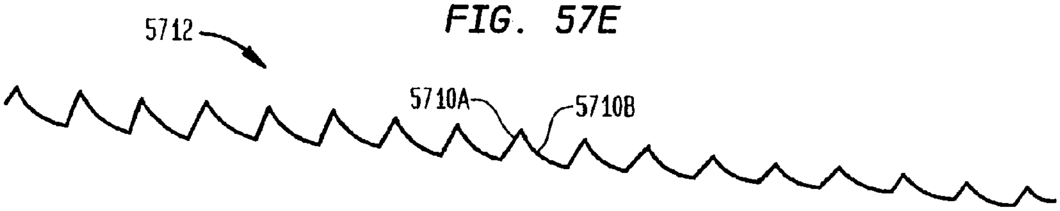

FIG. 57E illustrates a demodulated baseband signal 5712, which is generated by the down-conversion process. Because a harmonic of the aliasing rate is substantially equal to the frequency of the signal 516, essentially no IF is produced. The only substantial aliased component is the baseband signal. The demodulated baseband signal 5712 is illustrated with an arbitrary load impedance. Load impedance optimizations are discussed in Section 5 below.

The demodulated baseband signal 5712 includes portions 5710A, which correlate with the energy transfer pulses 5707 in FIG. 57C, and portions 5710B, which are between the energy transfer pulses 5707. Portions 5710A represent energy transferred from the analog AM carrier signal 516 to a storage device, while simultaneously driving an output load. The portions 5710A occur when a switching module is closed by the energy transfer pulses 5707. Portions 5710B represent energy stored in a storage device continuing to drive the load. Portions 5710B occur when the switching module is opened after energy transfer pulses 5707.

Figure 57F:
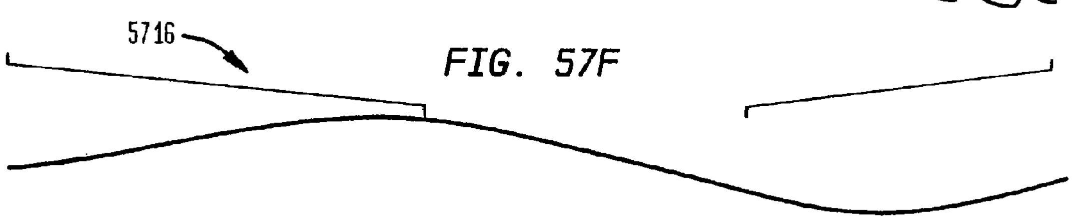

In FIG. 57F, a demodulated baseband signal 5716 represents a filtered version of the demodulated baseband signal 5712, on a compressed time scale. The demodulated baseband signal 5716 is substantially similar to the modulating baseband signal 210 and can be further processed using any signal processing technique(s) without further down-conversion or demodulation.

The present invention can output the unfiltered demodulated baseband signal 5712, the filtered demodulated baseband signal 5716, a partially filtered demodulated baseband signal, a stair step output signal, etc. The choice between these embodiments is generally a design choice that depends upon the application of the invention.

The aliasing rate of the energy transfer signal is preferably controlled to optimize the demodulated baseband signal for amplitude output and polarity, as desired.

The drawings referred to herein illustrate direct down-conversion in accordance with the invention. For example, the demodulated baseband signals 5712 in FIGS. 57E and 5716 in FIG. 57F illustrate that the analog AM carrier signal 516 was directly down-converted to a demodulated baseband signal by retaining enough baseband information for sufficient reconstruction.

3.2.1.1.2 Digital AM Carrier Signal

Figure 58A:
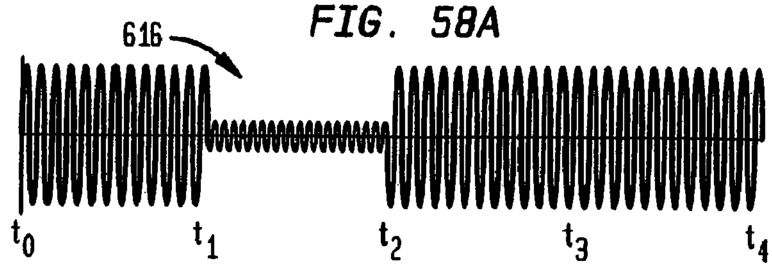
FIGS. 58A-F illustrate directly down-converting an digital AM signal to a demodulated baseband signal according to embodiments of the invention.
Figure 58B:
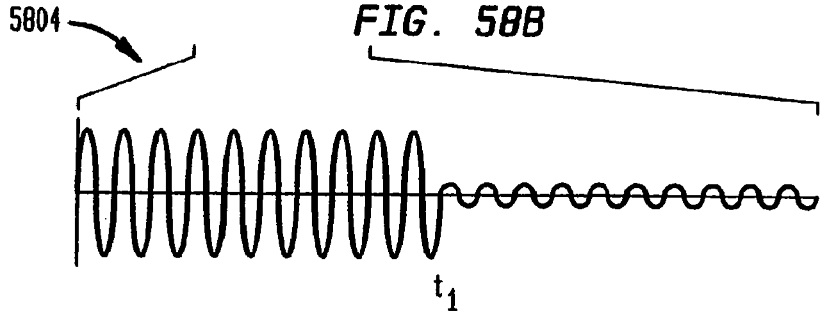

A process for directly down-converting the digital AM carrier signal 616 in FIG. 6C to a demodulated baseband signal is now described for the flowchart 4613 in FIG. 46C. The digital AM carrier signal 616 is re-illustrated in 58A for convenience. For this example, the digital AM carrier signal 616 oscillates at approximately 900 MHZ. In FIG. 58B, a digital AM carrier signal portion 5804 illustrates a portion of the digital AM carrier signal 616 on an expanded time scale.

The process begins at step 4614, which includes receiving an EM signal. This is represented by the digital AM carrier signal 616.

Figure 58D:
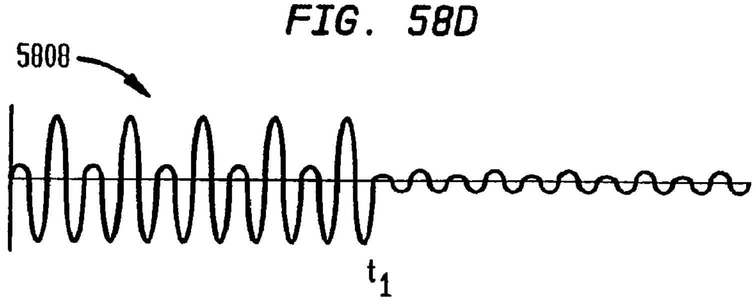
Figure 58C:
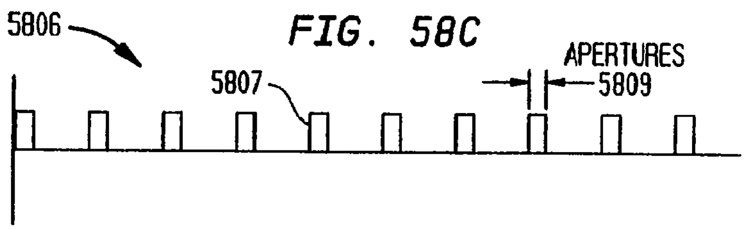

Step 4616 includes receiving an energy transfer signal having an aliasing rate $F_{AR}$. In FIG. 58C, an example energy transfer signal 5806 is illustrated on approximately the same time scale as FIG. 58B. The energy transfer signal 5806 includes a train of energy transfer pulses 5807 having non-negligible apertures that tend away from zero time in duration. The energy transfer pulses 5807 repeat at the aliasing rate, which is determined or selected as previously described. Generally, when directly down-converting an EM signal to a demodulated baseband signal, the aliasing rate $F_{AR}$ is substantially equal to a harmonic or, more typically, a sub-harmonic of the EM signal.

Step 4618 includes transferring energy from the EM signal at the aliasing rate to directly down-convert the EM signal to the demodulated baseband signal $F_{DMB}$. In FIG. 58D, an affected digital AM carrier signal 5808 illustrates effects of transferring energy from the digital AM carrier signal 616 at the aliasing rate $F_{AR}$. The affected digital AM carrier signal 5808 is illustrated on substantially the same time scale as FIGS. 58B and 58C.

Figure 58E:
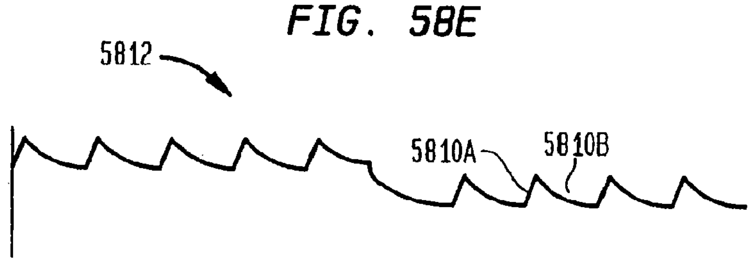

FIG. 58E illustrates a demodulated baseband signal 5812, which is generated by the down-conversion process. Because a harmonic of the aliasing rate is substantially equal to the frequency of the signal 616, essentially no IF is produced. The only substantial aliased component is the baseband signal. The demodulated baseband signal 5812 is illustrated with an arbitrary load impedance. Load impedance optimizations are discussed in Section 5 below.

The demodulated baseband signal 5812 includes portions 5810A, which correlate with the energy transfer pulses 5807 in FIG. 58C, and portions 5810B, which are between the energy transfer pulses 5807. Portions 5810A represent energy transferred from the digital AM carrier signal 616 to a storage device, while simultaneously driving an output load. The portions 5810A occur when a switching module is closed by the energy transfer pulses 5807. Portions 5810B represent energy stored in a storage device continuing to drive the load. Portions 5810B occur when the switching module is opened after energy transfer pulses 5807.

Figure 58F:
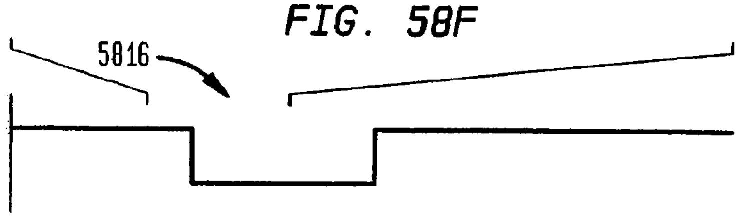

In FIG. 58F, a demodulated baseband signal 5816 represents a filtered version of the demodulated baseband signal 5812, on a compressed time scale. The demodulated baseband signal 5816 is substantially similar to the modulating baseband signal 310 and can be further processed using any signal processing technique(s) without further down-conversion or demodulation.

The present invention can output the unfiltered demodulated baseband signal 5812, the filtered demodulated baseband signal 5816, a partially filtered demodulated baseband signal, a stair step output signal, etc. The choice between these embodiments is generally a design choice that depends upon the application of the invention.

The aliasing rate of the energy transfer signal is preferably controlled to optimize the down-converted signal for amplitude output and polarity, as desired.

The drawings referred to herein illustrate direct down-conversion in accordance with the invention. For example, the demodulated baseband signals 5812 in FIGS. 58E and 5816 in FIG. 58F illustrate that the digital AM carrier signal 616 was directly down-converted to a demodulated baseband signal by retaining enough baseband information for sufficient reconstruction.

3.2.1.2 Structural Description

In an embodiment, the energy transfer module 6304 preferably transfers energy from the EM signal to directly down-convert it to a demodulated baseband signal in the manner shown in the operational flowchart 4613. But it should be understood that the scope and spirit of the invention includes other structural embodiments for performing the steps of the flowchart 1413. The specifics of the other structural embodiments will be apparent to persons skilled in the relevant art(s) based on the discussion contained herein.

Operation of the energy transfer system 6302 is now described for the digital AM carrier signal 516, with reference to the flowchart 4613 and the timing diagrams in FIGS. 57A-F. In step 4612, the energy transfer module 6404 receives the analog AM carrier signal 516. In step 4614, the energy transfer module 6404 receives the energy transfer signal 5706. In step 4618, the energy transfer module 6404 transfers energy from the analog AM carrier signal 516 at the aliasing rate of the energy transfer signal 5706, to directly down-convert the digital AM carrier signal 516 to the demodulated baseband signals 5712 or 5716.

The operation of the energy transfer system 6402 is now described for the digital AM carrier signal 616, with reference to the flowchart 4613 and the timing diagrams in FIGS. 58A-F. In step 4614, the energy transfer module 6404 receives the digital AM carrier signal 616. In step 4616, the energy transfer module 6404 receives the energy transfer signal 5806. In step 4618, the energy transfer module 6404 transfers energy from the digital AM carrier signal 616 at the aliasing rate of the energy transfer signal 5806, to directly down-convert the digital AM carrier signal 616 to the demodulated baseband signals 5812 or 5816.

Example implementations of the energy transfer module 6302 are disclosed in Sections 4 and 5 below.

3.2.2 Second Example Embodiment Phase Modulation 3.2.2.1 Operational Description Operation of the exemplary process of flowchart 4613 in FIG. 46C is described below for the analog PM carrier signal 916, illustrated in FIG. 9C and for the digital PM carrier signal 1016, illustrated in FIG. 10C.

3.2.2.1.1 Analog PM Carrier Signal

Figure 59A:
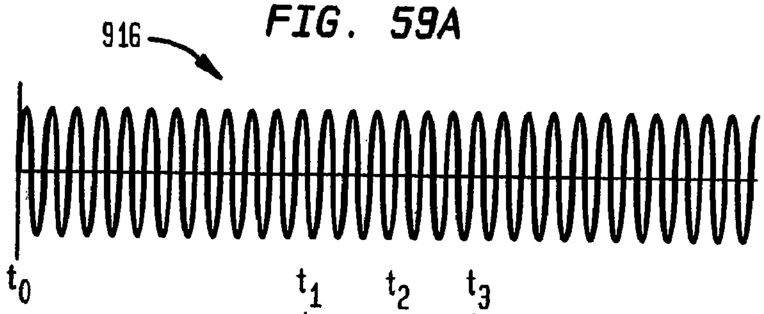
FIGS. 59A-F illustrate directly down-converting an analog PM signal to a demodulated baseband signal according to embodiments of the invention.
Figure 59B:
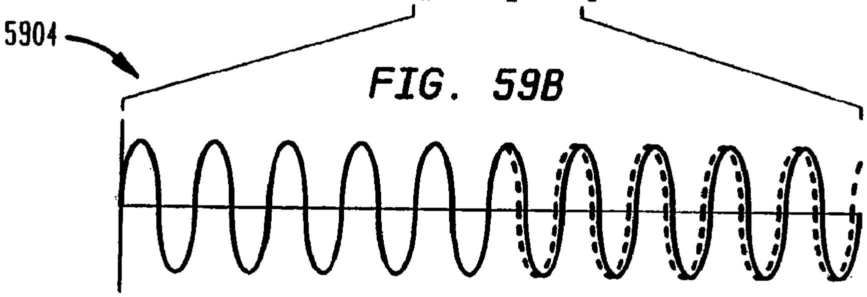

A process for directly down-converting the analog PM carrier signal 916 to a demodulated baseband signal is now described for the flowchart 4613 in FIG. 46C. The analog PM carrier signal 916 is re-illustrated in 59A for convenience. For this example, the analog PM carrier signal 916 oscillates at approximately 900 MHZ. In FIG. 59B, an analog PM carrier signal portion 5904 illustrates a portion of the analog PM carrier signal 916 on an expanded time scale.

The process begins at step 4614, which includes receiving an EM signal. This is represented by the analog PM carrier signal 916.

Figure 59D:
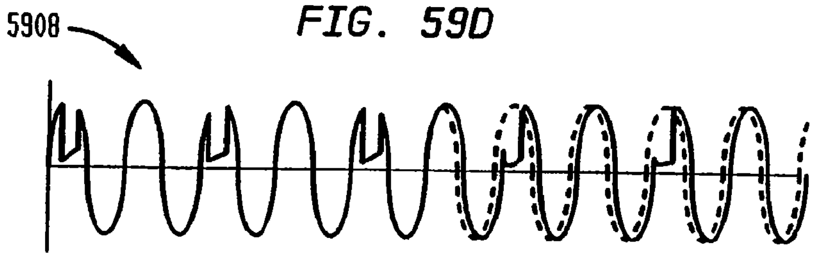
Figure 59C:
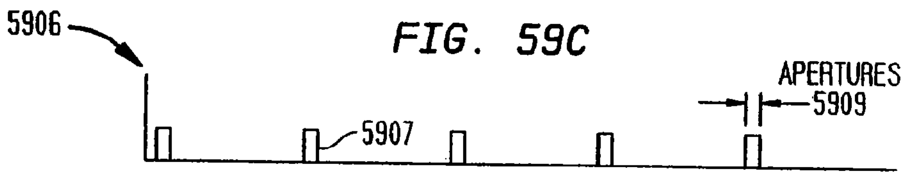

Step 4616 includes receiving an energy transfer signal having an aliasing rate $F_{AR}$. In FIG. 59C, an example energy transfer signal 5906 is illustrated on approximately the same time scale as FIG. 59B. The energy transfer signal 5906 includes a train of energy transfer pulses 5907 having non-negligible apertures that tend away from zero time in duration. The energy transfer pulses 5907 repeat at the aliasing rate, which is determined or selected as previously described. Generally, when directly down-converting an EM signal to a demodulated baseband signal, the aliasing rate $F_{AR}$ is substantially equal to a harmonic or, more typically, a sub-harmonic of the EM signal.

Step 4618 includes transferring energy from the EM signal at the aliasing rate to directly down-convert the EM signal to the demodulated baseband signal $F_{DMB}$. In FIG. 59D, an affected analog PM carrier signal 5908 illustrates effects of transferring energy from the analog PM carrier signal 916 at the aliasing rate $F_{AR}$. The affected analog PM carrier signal 5908 is illustrated on substantially the same time scale as FIGS. 59B and 59C.

Figure 59E:
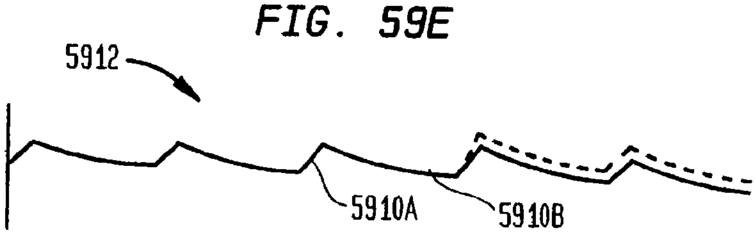

FIG. 59E illustrates a demodulated baseband signal 5912, which is generated by the down-conversion process. Because a harmonic of the aliasing rate is substantially equal to the frequency of the signal 516, essentially no IF is produced. The only substantial aliased component is the baseband signal. The demodulated baseband signal 5912 is illustrated with an arbitrary load impedance. Load impedance optimizations are discussed in Section 5 below.

The demodulated baseband signal 5912 includes portions 5910A, which correlate with the energy transfer pulses 5907 in FIG. 59C, and portions 5910B, which are between the energy transfer pulses 5907. Portions 5910A represent energy transferred from the analog PM carrier signal 916 to a storage device, while simultaneously driving an output load. The portions 5910A occur when a switching module is closed by the energy transfer pulses 5907. Portions 5910B represent energy stored in a storage device continuing to drive the load. Portions 5910B occur when the switching module is opened after energy transfer pulses 5907.

Figure 59F:
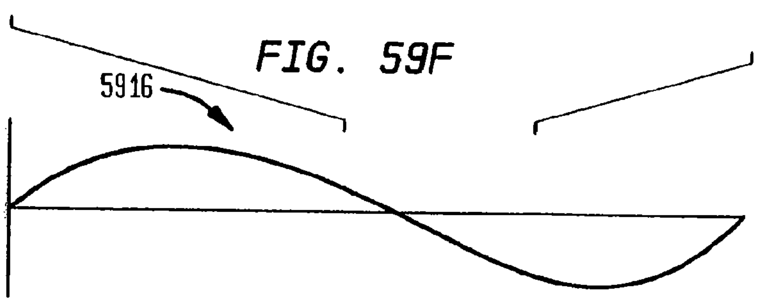

In FIG. 59F, a demodulated baseband signal 5916 represents a filtered version of the demodulated baseband signal 5912, on a compressed time scale. The demodulated baseband signal 5916 is substantially similar to the modulating baseband signal 210 and can be further processed using any signal processing technique(s) without further down-conversion or demodulation.

The present invention can output the unfiltered demodulated baseband 5912, the filtered demodulated baseband signal 5916, a partially filtered demodulated baseband signal, a stair step output signal, etc. The choice between these embodiments is generally a design choice that depends upon the application of the invention.

The aliasing rate of the energy transfer signal is preferably controlled to optimize the down-converted signal for amplitude output and polarity, as desired.

The drawings referred to herein illustrate direct down-conversion in accordance with the invention. For example, the demodulated baseband signals 5912 in FIGS. 59E and 5916 in FIG. 59F illustrate that the analog PM carrier signal 916 was successfully down-converted to a demodulated baseband signal by retaining enough baseband information for sufficient reconstruction.

3.2.2.1.2 Digital PM Carrier Signal

Figure 60A:
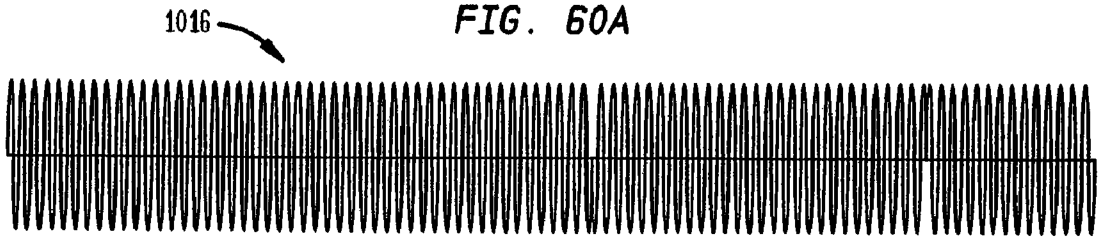
FIGS. 60A-F illustrate directly down-converting an digital PM signal to a demodulated baseband signal according to embodiments of the invention.
Figure 60B:
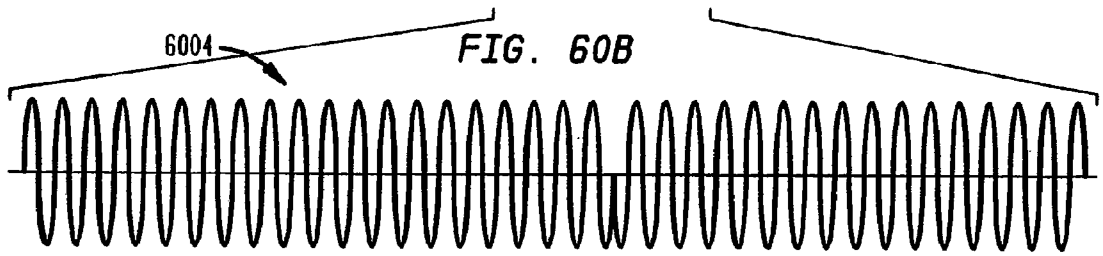

A process for directly down-converting the digital PM carrier signal 1016 in FIG. 6C to a demodulated baseband signal is now described for the flowchart 4613 in FIG. 46C. The digital PM carrier signal 1016 is re-illustrated in 60A for convenience. For this example, the digital PM carrier signal 1016 oscillates at approximately 900 MHZ. In FIG. 60B, a digital PM carrier signal portion 6004 illustrates a portion of the digital PM carrier signal 1016 on an expanded time scale. The process begins at step 4614, which includes receiving an EM signal. This is represented by the digital PM carrier signal 1016.

Figure 60D:
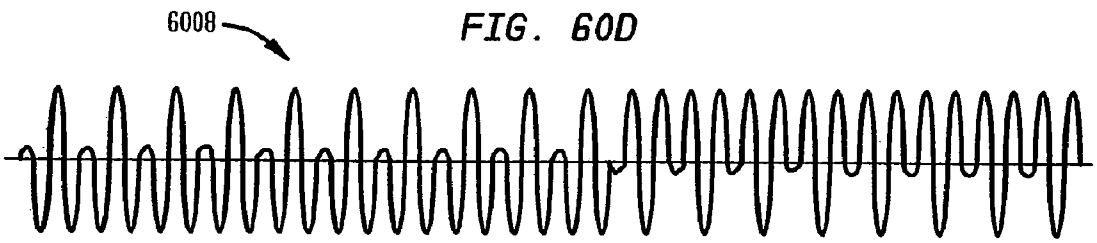
Figure 60C:
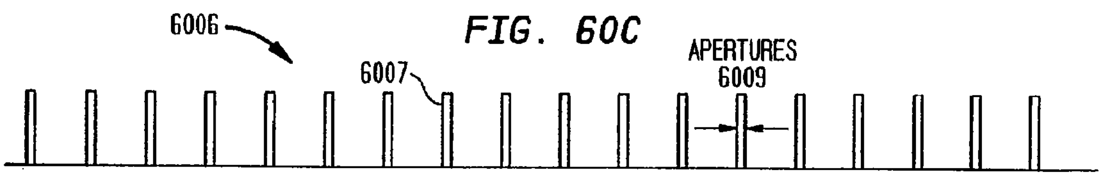

Step 4616 includes receiving an energy transfer signal $F_{AR}$. In FIG. 60C, an example energy transfer signal 6006 is illustrated on approximately the same time scale as FIG. 60B. The energy transfer signal 6006 includes a train of energy transfer pulses 6007 having non-negligible apertures that tend away from zero time in duration. The energy transfer pulses 6007 repeat at the aliasing rate, which is determined or selected as previously described. Generally, when directly down-converting an EM signal to a demodulated baseband signal, the aliasing rate $F_{AR}$ is substantially equal to a harmonic or, more typically, a sub-harmonic of the EM signal.

Step 4618 includes transferring energy from the EM signal at the aliasing rate to directly down-convert the EM signal to the demodulated baseband signal $F_{DMB}$. In FIG. 60D, an affected digital PM carrier signal 6008 illustrates effects of transferring energy from the digital PM carrier signal 1016 at the aliasing rate $F_{AR}$. The affected digital PM carrier signal 6008 is illustrated on substantially the same time scale as FIGS. 60B and 60C.

Figure 60E:

FIG. 60E illustrates a demodulated baseband signal 6012, which is generated by the down-conversion process. Because a harmonic of the aliasing rate is substantially equal to the frequency of the signal 1016, essentially no IF is produced. The only substantial aliased component is the baseband signal. The demodulated baseband signal 6012 is illustrated with an arbitrary load impedance. Load impedance optimizations are discussed in Section 5 below.

The demodulated baseband signal 6012 includes portions 6010A, which correlate with the energy transfer pulses 6007 in FIG. 60C, and portions 6010B, which are between the energy transfer pulses 6007. Portions 6010A represent energy transferred from the digital PM carrier signal 1016 to a storage device, while simultaneously driving an output load. The portions 6010A occur when a switching module is closed by the energy transfer pulses 6007. Portions 6010B represent energy stored in a storage device continuing to drive the load. Portions 6010B occur when the switching module is opened after energy transfer pulses 6007.

Figure 60F:
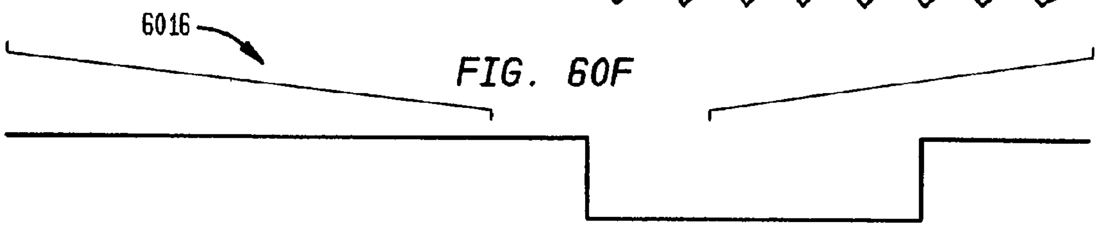

In FIG. 60F, a demodulated baseband signal 6016 represents a filtered version of the demodulated baseband signal 6012, on a compressed time scale. The demodulated baseband signal 6016 is substantially similar to the modulating baseband signal 310 and can be further processed using any signal processing technique(s) without further down-conversion or demodulation.

The present invention can output the unfiltered demodulated baseband signal 6012, the filtered demodulated baseband signal 6016, a partially filtered demodulated baseband signal, a stair step output signal, etc. The choice between these embodiments is generally a design choice that depends upon the application of the invention.

The aliasing rate of the energy transfer signal is preferably controlled to optimize the down-converted signal for amplitude output and polarity, as desired.

The drawings referred to herein illustrate direct down-conversion in accordance with the invention. For example, the demodulated baseband signals 6012 in FIGS. 60E and 6016 in FIG. 60F illustrate that the digital PM carrier signal 1016 was successfully down-converted to a demodulated baseband signal by retaining enough baseband information for sufficient reconstruction.

3.2.2.2 Structural Description

In an embodiment, the energy transfer system 6302 preferably transfers energy from an EM signal to directly down-convert it to a demodulated baseband signal in the manner shown in the operational flowchart 4613. But it should be understood that the scope and spirit of the invention includes other structural embodiments for performing the steps of the flowchart 1413. The specifics of the other structural embodiments will be apparent to persons skilled in the relevant art(s) based on the discussion contained herein.

Operation of the energy transfer system 6302 is now described for the analog PM carrier signal 916, with reference to the flowchart 4613 and the timing diagrams in FIGS. 59A-F. In step 4614, the energy transfer module 6304 receives the analog PM carrier signal 916. In step 4616, the energy transfer module 6304 receives the energy transfer signal 5906. In step 4618, the energy transfer module 6304 transfers energy from the analog PM carrier signal 916 at the aliasing rate of the energy transfer signal 5906, to directly down-convert the analog PM carrier signal 916 to the demodulated baseband signals 5912 or 5916.

Operation of the energy transfer system 6302 is now described for the digital PM carrier signal 1016, with reference to the flowchart 4613 and to the timing diagrams in FIGS. 60A-F. In step 4614, the energy transfer module 6404 receives the digital PM carrier signal 1016. In step 4616, the energy transfer module 6404 receives the energy transfer signal 6006. In step 4618, the energy transfer module 6404 transfers energy from the digital PM carrier signal 1016 at the aliasing rate of the energy transfer signal 6006, to directly down-convert the digital PM carrier signal 1016 to the demodulated baseband signal 6012 or 6016.

Example implementations of the energy transfer module 6302 are disclosed in Sections 4 and 5 below.

3.2.3 Other Embodiments

The embodiments described above are provided for purposes of illustration. These embodiments are not intended to limit the invention. Alternate embodiments, differing slightly or substantially from those described herein, will be apparent to persons skilled in the relevant art(s) based on the teachings contained herein. Such alternate embodiments fall within the scope and spirit of the present invention. Example implementations of the energy transfer module 6302 are disclosed in Sections 4 and 5 below.

3.3 Implementation Examples

Exemplary operational and/or structural implementations related to the method(s), structure(s), and/or embodiments described above are presented in Sections 4 and 5 below. These implementations are presented for purposes of illustration, and not limitation. The invention is not limited to the particular implementation examples described therein. Alternate implementations (including equivalents, extensions, variations, deviations, etc., of those described herein) will be apparent to persons skilled in the relevant art(s) based on the teachings contained herein. Such alternate implementations fall within the scope and spirit of the present invention.

4. Modulation Conversion

In an embodiment, the invention down-converts an FM carrier signal $F_{FMC}$ to a non-FM signal $F_{(NON-FM)}$, by transferring energy from the FM carrier signal $F_{FMC}$ at an aliasing rate. This embodiment is illustrated in FIG. 45B as 4518.

In an example embodiment, the FM carrier signal $F_{FMC}$ is down-converted to a phase modulated (PM) signal $F_{PM}$. In another example embodiment, the FM carrier signal $F_{FMC}$ is down-converted to an amplitude modulated (AM) signal $F_{AM}$. The down-converted signal can be demodulated with any conventional demodulation technique to obtain a demodulated baseband signal $F_{DMB}$.

The invention can be implemented with any type of FM signal. Exemplary embodiments are provided below for down-converting a frequency shift keying (FSK) signal to a non-FSK signal. FSK is a sub-set of FM, wherein an FM signal shifts or switches between two or more frequencies. FSK is typically used for digital modulating baseband signals, such as the digital modulating baseband signal 310 in FIG. 3. For example, in FIG. 8, the digital FM signal 816 is an FSK signal that shifts between an upper frequency and a lower frequency, corresponding to amplitude shifts in the digital modulating baseband signal 310. The FSK signal 816 is used in example embodiments below.

In a first example embodiment, energy is transferred from the FSK signal 816 at an aliasing rate that is based on a mid-point between the upper and lower frequencies of the FSK signal 816. When the aliasing rate is based on the mid-point, the FSK signal 816 is down-converted to a phase shift keying (PSK) signal. PSK is a sub-set of phase modulation, wherein a PM signal shifts or switches between two or more phases. PSK is typically used for digital modulating baseband signals. For example, in FIG. 10, the digital PM signal 1016 is a PSK signal that shifts between two phases. The PSK signal 1016 can be demodulated by any conventional PSK demodulation technique(s).

In a second example embodiment, energy is transferred from the FSK signal 816 at an aliasing rate that is based upon either the upper frequency or the lower frequency of the FSK signal 816. When the aliasing rate is based upon the upper frequency or the lower frequency of the FSK signal 816, the FSK signal 816 is down-converted to an amplitude shift keying (ASK) signal. ASK is a sub-set of amplitude modulation, wherein an AM signal shifts or switches between two or more amplitudes. ASK is typically used for digital modulating baseband signals. For example, in FIG. 6, the digital AM signal 616 is an ASK signal that shifts between the first amplitude and the second amplitude. The ASK signal 616 can be demodulated by any conventional ASK demodulation technique(s).

The following sections describe methods for transferring energy from an FM carrier signal $F_{MC}$ to down-convert it to the non-FM signal $F_{(NON-FM)}$. Exemplary structural embodiments for implementing the methods are also described. It should be understood that the invention is not limited to the particular embodiments described below. Equivalents, extensions, variations, deviations, etc., of the following will be apparent to persons skilled in the relevant art(s) based on the teachings contained herein. Such equivalents, extensions, variations, deviations, etc., are within the scope and spirit of the present invention.

The following sections include a high level discussion, example embodiments, and implementation examples.

4.1 High Level Description

This section (including its subsections) provides a high-level description of transferring energy from the FM carrier signal $F_{FM}$ to down-convert it to the non-FM signal $F_{(NON-FM)}$, according to the invention. In particular, an operational process for down-converting the FM carrier signal $F_{FM}$ to the non-FM signal $F_{(NON-FM)}$ is described at a high-level. Also, a structural implementation for implementing this process is described at a high-level. The structural implementation is described herein for illustrative purposes, and is not limiting. In particular, the process described in this section can be achieved using any number of structural implementations, one of which is described in this section.

The details of such structural implementations will be apparent to persons skilled in the relevant art(s) based on the teachings contained herein.

4.1.1 Operational Description

FIG. 46D depicts a flowchart 4619 that illustrates an exemplary method for down-converting the FM carrier signal $F_{FMC}$ to the non-FM signal $F_{(NON\text{-}FM)}$. The exemplary method illustrated in the flowchart 4619 is an embodiment of the flowchart 4601 in FIG. 46A.

Any and all forms of frequency modulation techniques are valid for this invention. For ease of discussion, the digital FM carrier (FSK) signal 816 is used to illustrate a high level operational description of the invention. Subsequent sections provide detailed flowcharts and descriptions for the FSK signal 816. Upon reading the disclosure and examples therein, one skilled in the relevant art(s) will understand that the invention can be implemented to down-convert any type of FM signal.

Figure 84A:
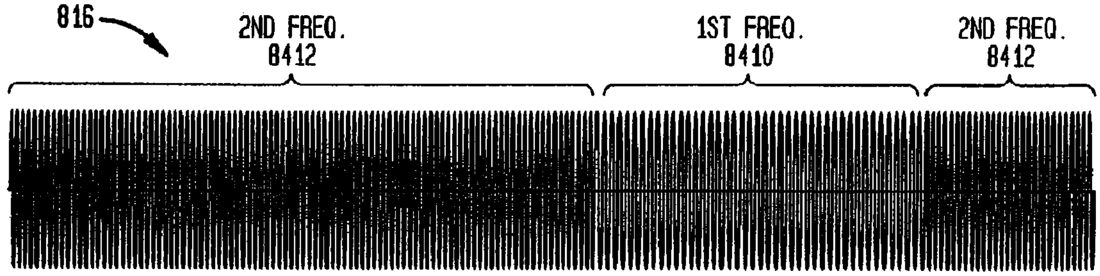
FIGS. 84A-D illustrate down-converting an FSK signal to a PSK signal according to embodiments of the present invention.

The method illustrated in the flowchart 4619 is described below at a high level for down-converting the FSK signal 816 in FIG. 8C to a PSK signal. The FSK signal 816 is re-illustrated in FIG. 84A for convenience.

The process of the flowchart 4619 begins at step 4620, which includes receiving an FM signal. This is represented by the FSK signal 816. The FSK signal 816 shifts between a first frequency 8410 and a second frequency 8412. The first frequency 8410 can be higher or lower than the second frequency 8412. In an exemplary embodiment, the first frequency 8410 is approximately 899 MHZ and the second frequency 8412 is approximately 901 MHZ.

Figure 84B:
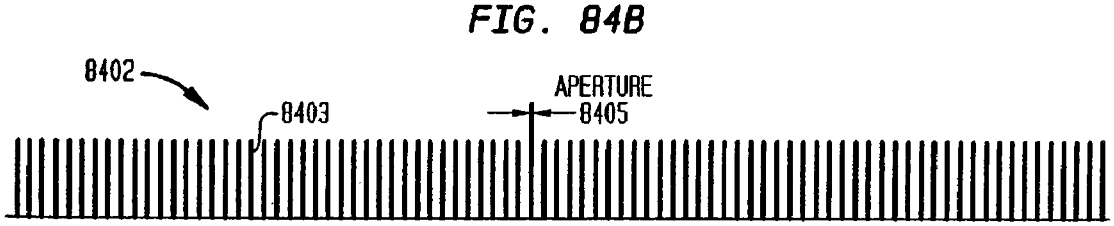

Step 4622 includes receiving an energy transfer signal having an aliasing rate $F_{AR}$. FIG. 84B illustrates an example energy transfer signal 8402 which includes a train of energy transfer pulses 8403 having non-negligible apertures 8405 that tend away from zero time in duration.

The energy transfer pulses 8403 repeat at the aliasing rate $F_{AR}$, which is determined or selected as previously described. Generally, when down-converting an FM carrier signal $F_{FMC}$ to a non-FM signal $F_{(NON\text{-}FM)}$, the aliasing rate is substantially equal to a harmonic or, more typically, a sub-harmonic of a frequency within the FM signal. In this example overview embodiment, where the FSK signal 816 is to be down-converted to a PSK signal, the aliasing rate is substantially equal to a harmonic or, more typically, a sub-harmonic of the mid-point between the first frequency 8410 and the second frequency 8412. For the present example, the mid-point is approximately 900 MHZ.

Figure 84C:
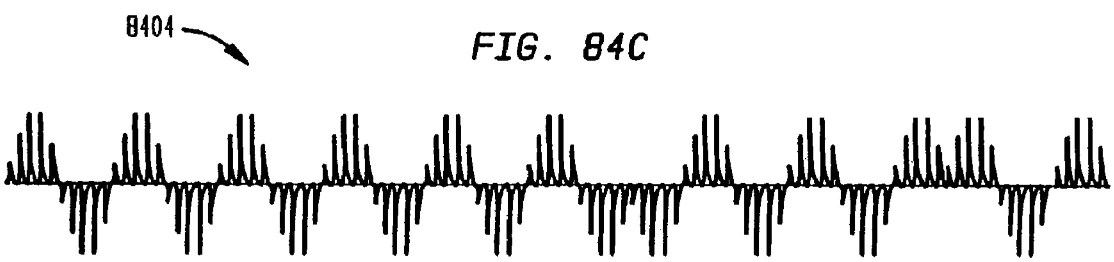

Step 4624 includes transferring energy from the FM carrier signal F MC at the aliasing rate to down-convert the FM carrier signal $F_{FMC}$ to the non-FM signal $F_{(NON\text{-}FM)}$. FIG. 84C illustrates a PSK signal 8404, which is generated by the modulation conversion process.

When the second frequency 8412 is under-sampled, the PSK signal 8404 has a frequency of approximately 1 MHZ and is used as a phase reference. When the first frequency 8410 is under-sampled, the PSK signal 8404 has a frequency of 1 MHZ and is phase shifted 180 degrees from the phase reference.

Figure 84D:
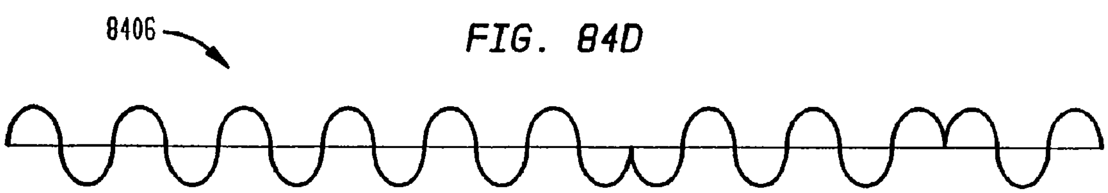

FIG. 84D depicts a PSK signal 8406, which is a filtered version of the PSK signal 8404. The invention can thus generate a filtered output signal, a partially filtered output signal, or a relatively unfiltered stair step output signal. The choice between filtered, partially filtered and non-filtered output signals is generally a design choice that depends upon the application of the invention.

The aliasing rate of the energy transfer signal is preferably controlled to optimize the down-converted signal for amplitude output and polarity, as desired.

Detailed exemplary embodiments for down-converting an FSK signal to a PSK signal and for down-converting an FSK signal to an ASK signal are provided below.

4.1.2 Structural Description

FIG. 63 illustrates the energy transfer system 6302 according to an embodiment of the invention. The energy transfer system 6302 includes the energy transfer module 6304. The energy transfer system 6302 is an example embodiment of the generic aliasing system 1302 in FIG. 13.

In a modulation conversion embodiment, the EM signal 1304 is an FM carrier signal $F_{FMC}$ and the energy transfer module 6304 transfers energy from FM carrier signal at a harmonic or, more typically, a sub-harmonic of a frequency within the FM frequency band. Preferably, the energy transfer module 6304 transfers energy from the FM carrier signal $F_{FMC}$ to down-convert it to a non-FM signal $F_{(NON\text{-}FM)}$ in the manner shown in the operational flowchart 4619. But it should be understood that the scope and spirit of the invention includes other structural embodiments for performing the steps of the flowchart 4619. The specifics of the other structural embodiments will be apparent to persons skilled in the relevant art(s) based on the discussion contained herein.

The operation of the energy transfer system 6302 shall now be described with reference to the flowchart 4619 and the timing diagrams of FIGS. 84A-84D. In step 4620, the energy transfer module 6304 receives the FSK signal 816. In step 4622, the energy transfer module 6304 receives the energy transfer signal 8402. In step 4624, the energy transfer module 6304 transfers energy from the FSK signal 816 at the aliasing rate of the energy transfer signal 8402 to down-convert the FSK signal 816 to the PSK signal 8404 or 8406.

Example implementations of the energy transfer module 6302 are provided in Section 4 below.

4.2 Example Embodiments

Various embodiments related to the method(s) and structure(s) described above are presented in this section (and its subsections). These embodiments are described herein for purposes of illustration, and not limitation. The invention is not limited to these embodiments. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

The method for down-converting an FM carrier signal $F_{FMC}$ to a non-FM signal, $F_{(NON\text{-}FM)}$, illustrated in the flowchart 4619 of FIG. 46D, can be implemented with any type of FM carrier signal including, but not limited to, FSK signals. The flowchart 4619 is described in detail below for down-converting an FSK signal to a PSK signal and for down-converting a FSK signal to an ASK signal. The exemplary descriptions below are intended to facilitate an understanding of the present invention. The present invention is not limited to or by the exemplary embodiments below.

4.2.1 First Example Embodiment Down-Converting an FM Signal to a PM Signal 4.2.1.1 Operational Description A process for down-converting the FSK signal 816 in FIG. 8C to a PSK signal is now described for the flowchart 4619 in FIG. 46D.

Figure 61A:
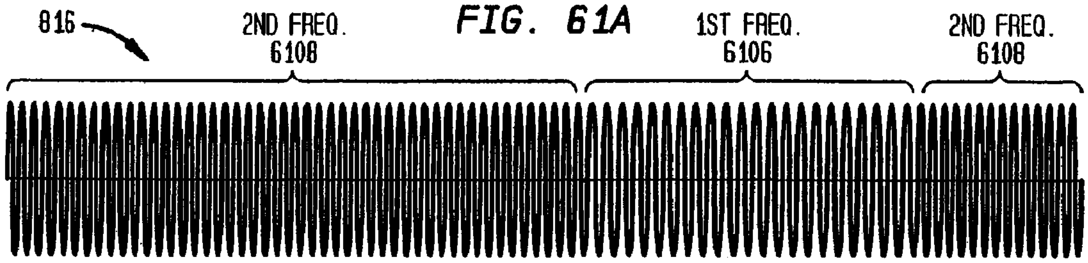
FIGS. 61A-F illustrate down-converting an FM signal to a PM signal according to embodiments of the invention.

The FSK signal 816 is re-illustrated in FIG. 61A for convenience. The FSK signal 816 shifts between a first frequency 6106 and a second frequency 6108. In the exemplary embodiment, the first frequency 6106 is lower than the second frequency 6108. In an alternative embodiment, the first frequency 6106 is higher than the second frequency 6108. For this example, the first frequency 6106 is approximately 899 MHZ and the second frequency 6108 is approximately 901 MHZ.

Figure 61B:
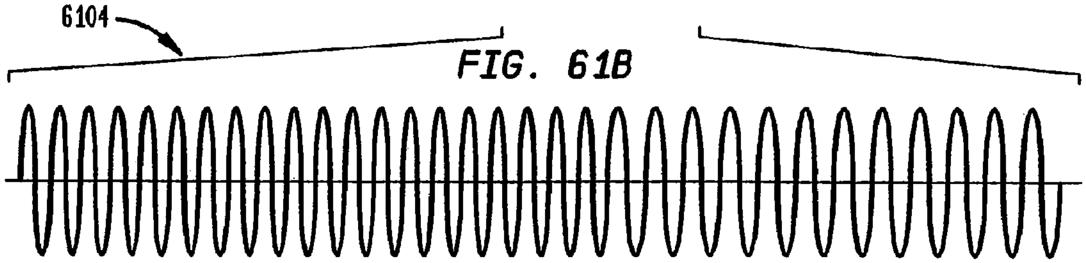

FIG. 61B illustrates an FSK signal portion 6104 that represents a portion of the FSK signal 816 on an expanded time scale.

The process begins at step 4620, which includes receiving an FM signal. This is represented by the FSK signal 816.

Figure 61D:
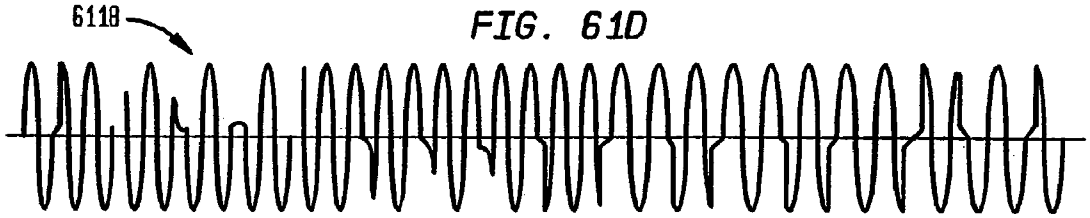
Figure 61C:
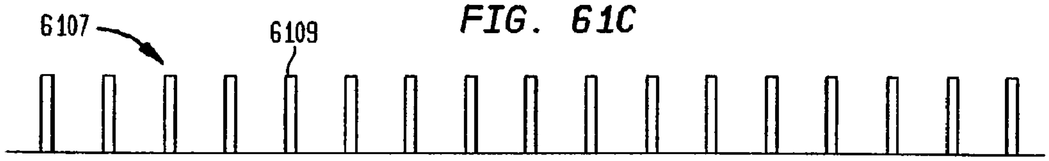

Step 4622 includes receiving an energy transfer signal having an aliasing rate $F_{AR}$. FIG. 61C illustrates an example energy transfer signal 6107 on approximately the same time scale as FIG. 61B. The energy transfer signal 6107 includes a train of energy transfer pulses 6109 having non-negligible apertures that tend away from zero time in duration. The energy transfer pulses 6109 repeat at the aliasing rate $F_{AR}$, which is determined or selected as described above. Generally, when down-converting an FM signal to a non-FM signal, the aliasing rate is substantially equal to a harmonic or, more typically, a sub-harmonic of a frequency within the FM signal.

In this example, where an FSK signal is being down-converted to a PSK signal, the aliasing rate is substantially equal to a harmonic or, more typically, a sub-harmonic, of the mid-point between the frequencies 6106 and 6108. In this example, where the first frequency 6106 is 899 MHZ and second frequency 6108 is 901 MHZ, the mid-point is approximately 900 MHZ. Suitable aliasing rates thus include 1.8 GHZ, 900 MHZ, 450 MHZ, etc.

Step 4624 includes transferring energy from the FM signal at the aliasing rate to down-convert it to the non-FM signal $F_{(NON-FM)}$. In FIG. 61D, an affected FSK signal 6118 illustrates effects of transferring energy from the FSK signal 816 at the aliasing rate $F_{AR}$. The affected FSK signal 6118 is illustrated on substantially the same time scale as FIGS. 61B and 61C.

Figure 61E:
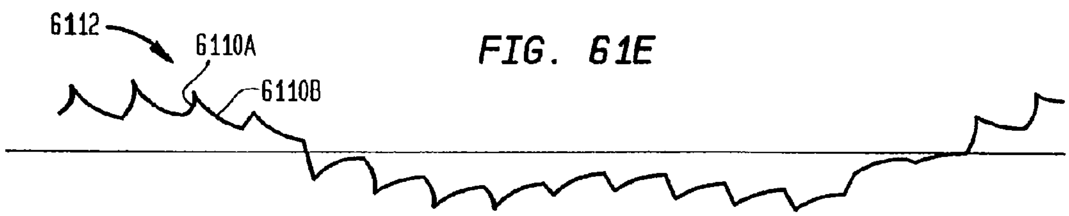

FIG. 61E illustrates a PSK signal 6112, which is generated by the modulation conversion process. PSK signal 6112 is illustrated with an arbitrary load impedance. Load impedance optimizations are discussed in Section 5 below.

The PSK signal 6112 includes portions 6110A, which correlate with the energy transfer pulses 6107 in FIG. 61C. The PSK signal 6112 also includes portions 6110B, which are between the energy transfer pulses 6109. Portions 6110A represent energy transferred from the FSK 816 to a storage device, while simultaneously driving an output load. The portions 6110A occur when a switching module is closed by the energy transfer pulses 6109. Portions 6110B represent energy stored in a storage device continuing to drive the load. Portions 6110B occur when the switching module is opened after energy transfer pulses 6107.

Figure 61F:
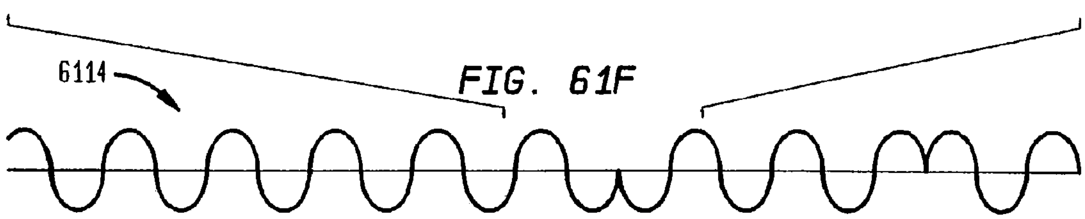

In FIG. 61F, a PSK signal 6114 represents a filtered version of the PSK signal 6112, on a compressed time scale. The present invention can output the unfiltered demodulated baseband signal 6112, the filtered demodulated baseband signal 6114, a partially filtered demodulated baseband signal, a stair step output signal, etc. The choice between these embodiments is generally a design choice that depends upon the application of the invention. The PSK signals 6112 and 6114 can be demodulated with a conventional demodulation technique(s).

The aliasing rate of the energy transfer signal is preferably controlled to optimize the down-converted signal for amplitude output and polarity, as desired.

The drawings referred to herein illustrate modulation conversion in accordance with the invention. For example, the PSK signals 6112 in FIGS. 61E and 6114 in FIG. 61F illustrate that the FSK signal 816 was successfully down-converted to a PSK signal by retaining enough baseband information for sufficient reconstruction.

4.2.1.2 Structural Description

The operation of the energy transfer system 1602 is now described for down-converting the FSK signal 816 to a PSK signal, with reference to the flowchart 4619 and to the timing diagrams of FIGS. 61A-E. In step 4620, the energy transfer module 1606 receives the FSK signal 816 (FIG. 61A). In step 4622, the energy transfer module 1606 receives the energy transfer signal 6107 FIG. 61C). In step 4624, the energy transfer module 1606 transfers energy from the FSK signal 816 at the aliasing rate of the energy transfer signal 6107 to down-convert the FSK signal 816 to the PSK signal 6112 in FIG. 61E or the PSK signal 6114 in FIG. 61F.

4.2.2 Second Example Embodiment Down-Converting an FM Signal to an AM Signal 4.2.2.1 Operational Description A process for down-converting the FSK signal 816 in FIG. 8C to an ASK signal is now described for the flowchart 4619 in FIG. 46D.

Figure 62A:
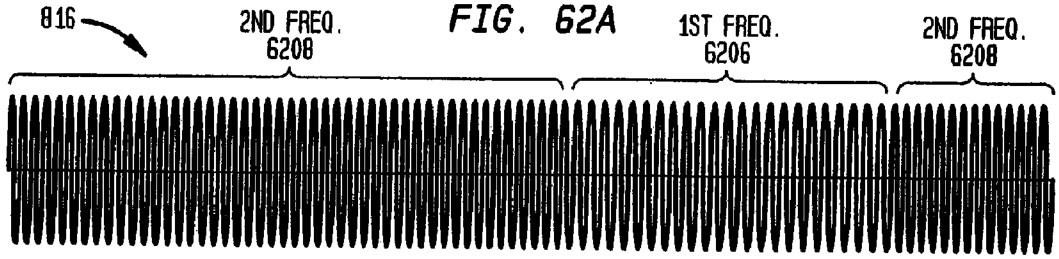
FIGS. 62A-F illustrate down-converting an FM signal to a AM signal according to embodiments of the invention.

The FSK signal 816 is re-illustrated in FIG. 62A for convenience. The FSK signal 816 shifts between a first frequency 6206 and a second frequency 6208. In the exemplary embodiment, the first frequency 6206 is lower than the second frequency 6208. In an alternative embodiment, the first frequency 6206 is higher than the second frequency 6208. For this example, the first frequency 6206 is approximately 899 MHZ and the second frequency 6208 is approximately 901 MHZ.

Figure 62B:
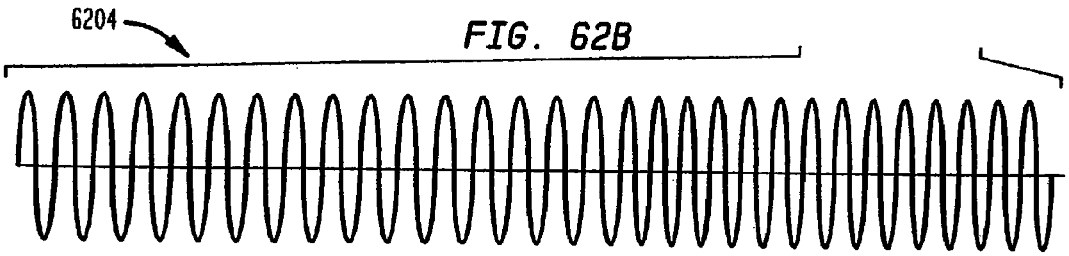

FIG. 62B illustrates an FSK signal portion 6204 that represents a portion of the FSK signal 816 on an expanded time scale.

The process begins at step 4620, which includes receiving an FM signal. This is represented by the FSK signal 816.

Figure 62D:
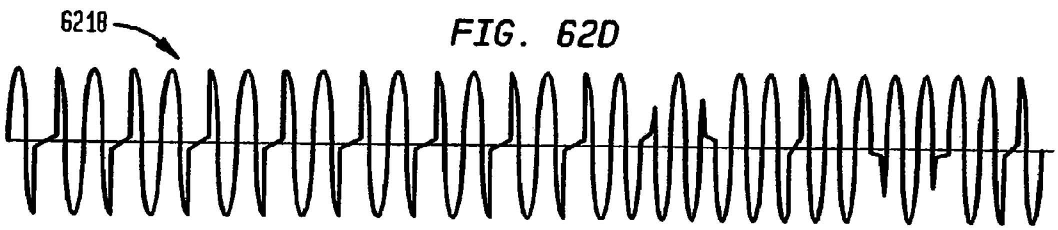
Figure 62C:
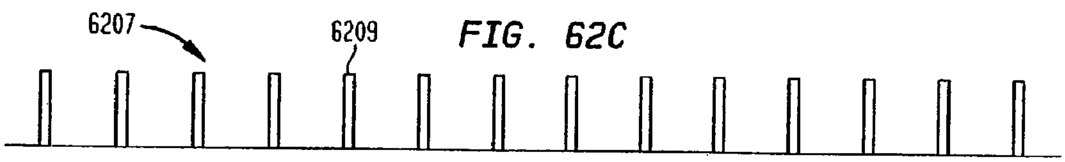

Step 4622 includes receiving an energy transfer signal having an aliasing rate $F_{AR}$. FIG. 62C illustrates an example energy transfer signal 6207 on approximately the same time scale as FIG. 62B. The energy transfer signal 6207 includes a train of energy transfer pulses 6209 having non-negligible apertures that tend away from zero time in duration. The energy transfer pulses 6209 repeat at the aliasing rate $F_{AR}$, which is determined or selected as described above. Generally, when down-converting an FM signal to a non-FM signal, the aliasing rate is substantially equal to a harmonic or, more typically, a sub-harmonic of a frequency within the FM signal.

In this example, where an FSK signal is being down-converted to an ASK signal, the aliasing rate is substantially equal to a harmonic or, more typically, a sub-harmonic, of either the first frequency 6206 or the second frequency 6208. In this example, where the first frequency 6206 is 899 MHZ and the second frequency 6208 is 901 MHZ, the aliasing rate can be substantially equal to a harmonic or sub-harmonic of 899 MHZ or 901 MHZ.

Step 4624 includes transferring energy from the FM signal at the aliasing rate to down-convert it to the non-FM signal $F_{(NON-FM)}$. In FIG. 62D, an affected FSK signal 6218 illustrates effects of transferring energy from the FSK signal 816 at the aliasing rate $F_{AR}$. The affected FSK signal 6218 is illustrated on substantially the same time scale as FIGS. 62B and 62C.

Figure 62E:
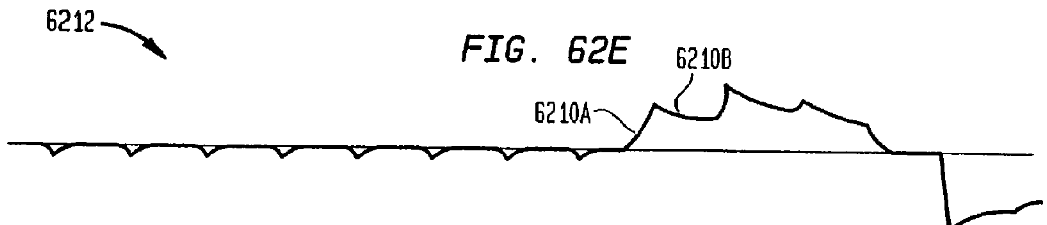

FIG. 62E illustrates an ASK signal 6212, which is generated by the modulation conversion process. ASK signal 6212 is illustrated with an arbitrary load impedance. Load impedance optimizations are discussed in Section 5 below.

The ASK signal 6212 includes portions 6210A, which correlate with the energy transfer pulses 6209 in FIG. 62C. The ASK signal 6212 also includes portions 6210B, which are between the energy transfer pulses 6209. Portions 6210A represent energy transferred from the FSK 816 to a storage device, while simultaneously driving an output load. Portions 6210A occur when a switching module is closed by the energy transfer pulses 6207. Portions 6210B represent energy stored in a storage device continuing to drive the load. Portions 6210B occur when the switching module is opened after energy transfer pulses 6207.

Figure 62F:
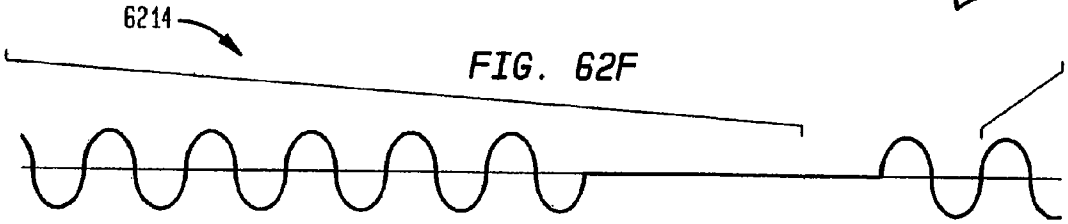

In FIG. 62F, an ASK signal 6214 represents a filtered version of the ASK signal 6212, on a compressed time scale. The present invention can output the unfiltered demodulated baseband signal 6212, the filtered demodulated baseband signal 6214, a partially filtered demodulated baseband signal, a stair step output signal, etc. The choice between these embodiments is generally a design choice that depends upon the application of the invention. The ASK signals 6212 and 6214 can be demodulated with a conventional demodulation technique(s).

The aliasing rate of the energy transfer signal is preferably controlled to optimize the down-converted signal for amplitude output and/or polarity, as desired.

The drawings referred to herein illustrate modulation conversion in accordance with the invention. For example, the ASK signals 6212 in FIGS. 62E and 6214 in FIG. 62F illustrate that the FSK signal 816 was successfully down-converted to an ASK signal by retaining enough baseband information for sufficient reconstruction.

4.2.2.2 Structural Description

The operation of the energy transfer system 1602 is now described for down-converting the FSK signal 816 to an ASK signal, with reference to the flowchart 4619 and to the timing diagrams of FIGS. 62A-F. In step 4620, the energy transfer module 6304 receives the FSK signal 816 (FIG. 62A). In step 4622, the energy transfer module 6304 receives the energy transfer signal 6207 (FIG. 62C). In step 4624, the energy transfer module 6304 transfers energy from the FSK signal 818 at the aliasing rate of the energy transfer signal 6207 to down-convert the FSK signal 816 to the ASK signal 6212 in FIG. 62E or the ASK signal 6214 in FIG. 62F.

4.2.3 Other Example Embodiments

The embodiments described above are provided for purposes of illustration. These embodiments are not intended to limit the invention. Alternate embodiments, differing slightly or substantially from those described herein, will be apparent to persons skilled in the relevant art(s) based on the teachings contained herein. Such alternate embodiments fall within the scope and spirit of the present invention.

Example implementations of the energy transfer module 6302 are disclosed in Sections 4 and 5 below.

4.3 Implementation Examples

Exemplary operational and/or structural implementations related to the method(s), structure(s), and/or embodiments described above are presented in Sections 4 and 5 below. These implementations are presented for purposes of illustration, and not limitation. The invention is not limited to the particular implementation examples described therein. Alternate implementations (including equivalents, extensions, variations, deviations, etc., of those described herein) will be apparent to persons skilled in the relevant art(s) based on the teachings contained herein. Such alternate implementations fall within the scope and spirit of the present invention.

5. Implementation Examples

Exemplary operational and/or structural implementations related to the method(s), structure(s), and/or embodiments described above are presented in this section (and its sub-sections). These implementations are presented herein for purposes of illustration, and not limitation. The invention is not limited to the particular implementation examples described herein. Alternate implementations (including equivalents, extensions, variations, deviations, etc., of those described herein) will be apparent to persons skilled in the relevant art(s) based on the teachings contained herein. Such alternate implementations fall within the scope and spirit of the present invention.

FIG. 63 illustrates an energy transfer system 6302, which is an exemplary embodiment of the generic aliasing system 1302 in FIG. 13. The energy transfer system 6302 includes an energy transfer module 6304, which receives the EM signal 1304 and an energy transfer signal 6306. The energy transfer signal 6306 includes a train of energy transfer pulses having non-negligible apertures that tend away from zero time in duration. The energy transfer pulses repeat at an aliasing rate $F_{AR}$.

The energy transfer module 6304 transfers energy from the EM signal 1304 at the aliasing rate of the energy transfer signal 6306, as described in the sections above with respect to the flowcharts 4601 in FIG. 46A, 4607 in FIG. 46B, 4613 in FIGS. 46C and 4619 in FIG. 46D. The energy transfer module 6304 outputs a down-converted signal 1308B, which includes non-negligible amounts of energy transferred from the EM signal 1304.

Figure 64A:
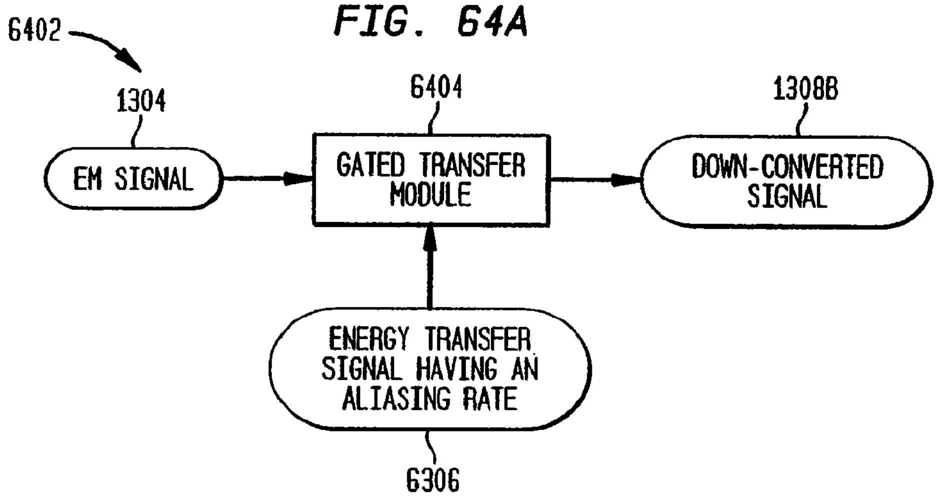
FIG. 64A illustrates an exemplary gated transfer system according to an embodiment of the invention.

FIG. 64A illustrates an exemplary gated transfer system 6402, which is an example of the energy transfer system 6302. The gated transfer system 6402 includes a gated transfer module 6404, which is described below.

Figure 64B:
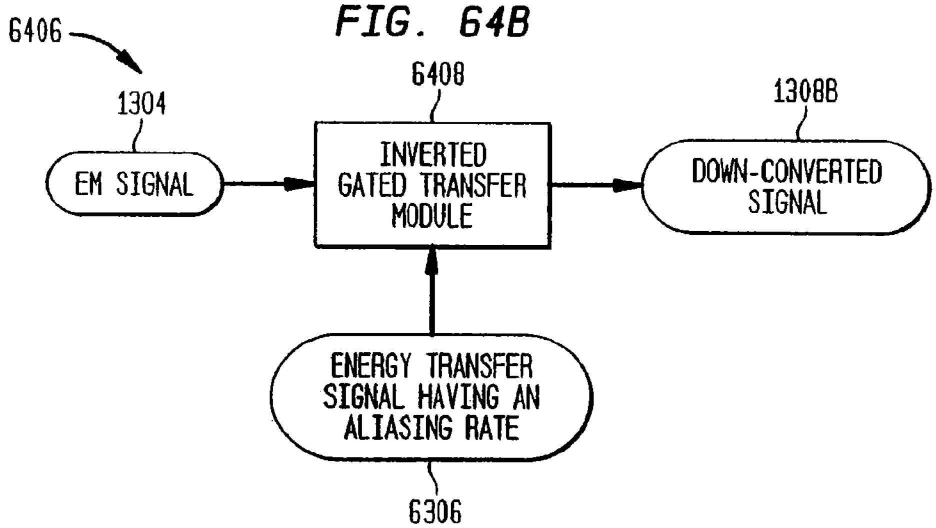
FIG. 64B illustrates an exemplary inverted gated transfer system according to an embodiment of the invention.

FIG. 64B illustrates an exemplary inverted gated transfer system 6406, which is an alternative example of the energy transfer system 6302. The inverted gated transfer system 6406 includes an inverted gated transfer module 6408, which is described below.

5.1 The Energy Transfer System as a Gated Transfer System

FIG. 64A illustrates the exemplary gated transfer system 6402, which is an exemplary implementation of the energy transfer system 6302. The gated transfer system 6402 includes the gated transfer module 6404, which receives the EM signal 1304 and the energy transfer signal 6306. The energy transfer signal 6306 includes a train of energy transfer pulses having non-negligible apertures that tend away from zero time in duration. The energy transfer pulses repeat at an aliasing rate $F_{AR}$.

The gated transfer module 6404 transfers energy from the EM signal 1304 at the aliasing rate of the energy transfer signal 6306, as described in the sections above with respect to the flowcharts 4601 in FIG. 46A, 4607 in FIG. 46B, 4613 in FIGS. 46C and 4619 in FIG. 46D. The gated transfer module 6404 outputs the down-converted signal 1308B, which includes non-negligible amounts of energy transferred from the EM signal 1304.

5.1.1 The Gated Transfer System as a Switch Module and a Storage Module

Figure 65:
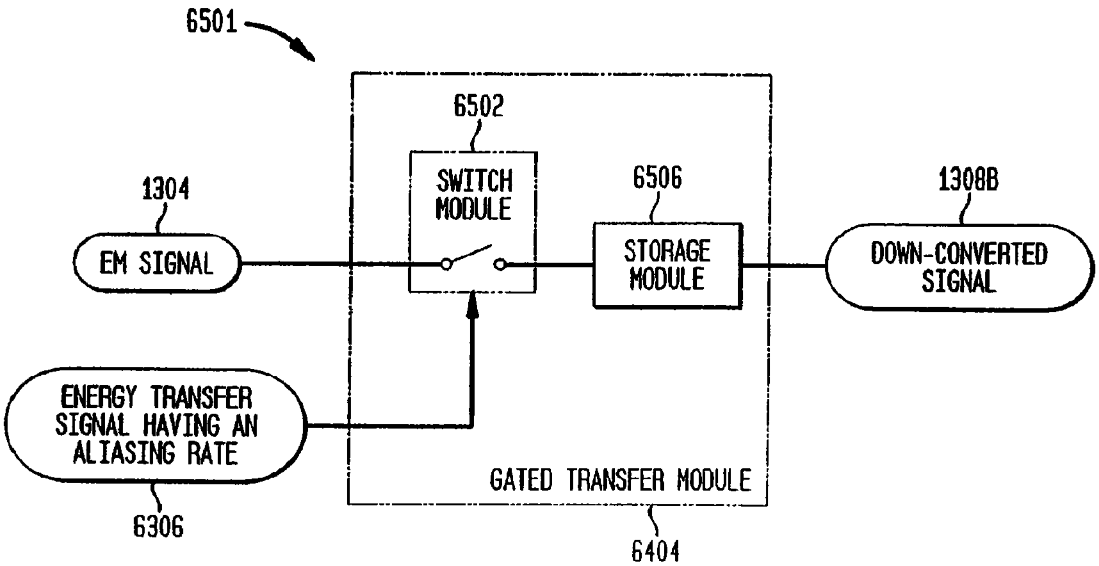
FIG. 65 illustrates an example embodiment of the gated transfer module according to an embodiment of the invention.

FIG. 65 illustrates an example embodiment of the gated transfer module 6404 as including a switch module 6502 and a storage module 6506. Preferably, the switch module 6502 and the storage module 6506 transfer energy from the EM signal 1304 to down-convert it in any of the manners shown in the operational flowcharts 4601 in FIG. 46A, 4607 in FIG. 46B, 4613 in FIGS. 46C and 4619 in FIG. 46D.

For example, operation of the switch module 6502 and the storage module 6506 is now described for down-converting the EM signal 1304 to an intermediate signal, with reference to the flowchart 4607 and the example timing diagrams in FIG. 83A-F.

In step 4608, the switch module 6502 receives the EM signal 1304 (FIG. 83A). In step 4610, the switch module 6502 receives the energy transfer signal 6306 (FIG. 83C). In step 4612, the switch module 6502 and the storage module 6506 cooperate to transfer energy from the EM signal 1304 and down-convert it to an intermediate signal. More specifically, during step 4612, the switch module 6502 closes during each energy transfer pulse to couple the EM signal 1304 to the storage module 6506. In an embodiment, the switch module 6502 closes on rising edges of the energy transfer pulses. In an alternative embodiment, the switch module 6502 closes on falling edges of the energy transfer pulses. While the EM signal 1304 is coupled to the storage module 6506, non-negligible amounts of energy are transferred from the EM signal 1304 to the storage module 6506. FIG. 83B illustrates the EM signal 1304 after the energy is transferred from it. FIG. 83D illustrates the transferred energy stored in the storage module 6506. The storage module 6506 outputs the transferred energy as the down-converted signal 1308B. The storage module 6506 can output the down-converted signal 1308B as an unfiltered signal such as signal shown in FIG. 83E, or as a filtered down-converted signal (FIG. 83F).

5.1.2 The Gated Transfer System as Break-Before-Make Module

Figure 67A:
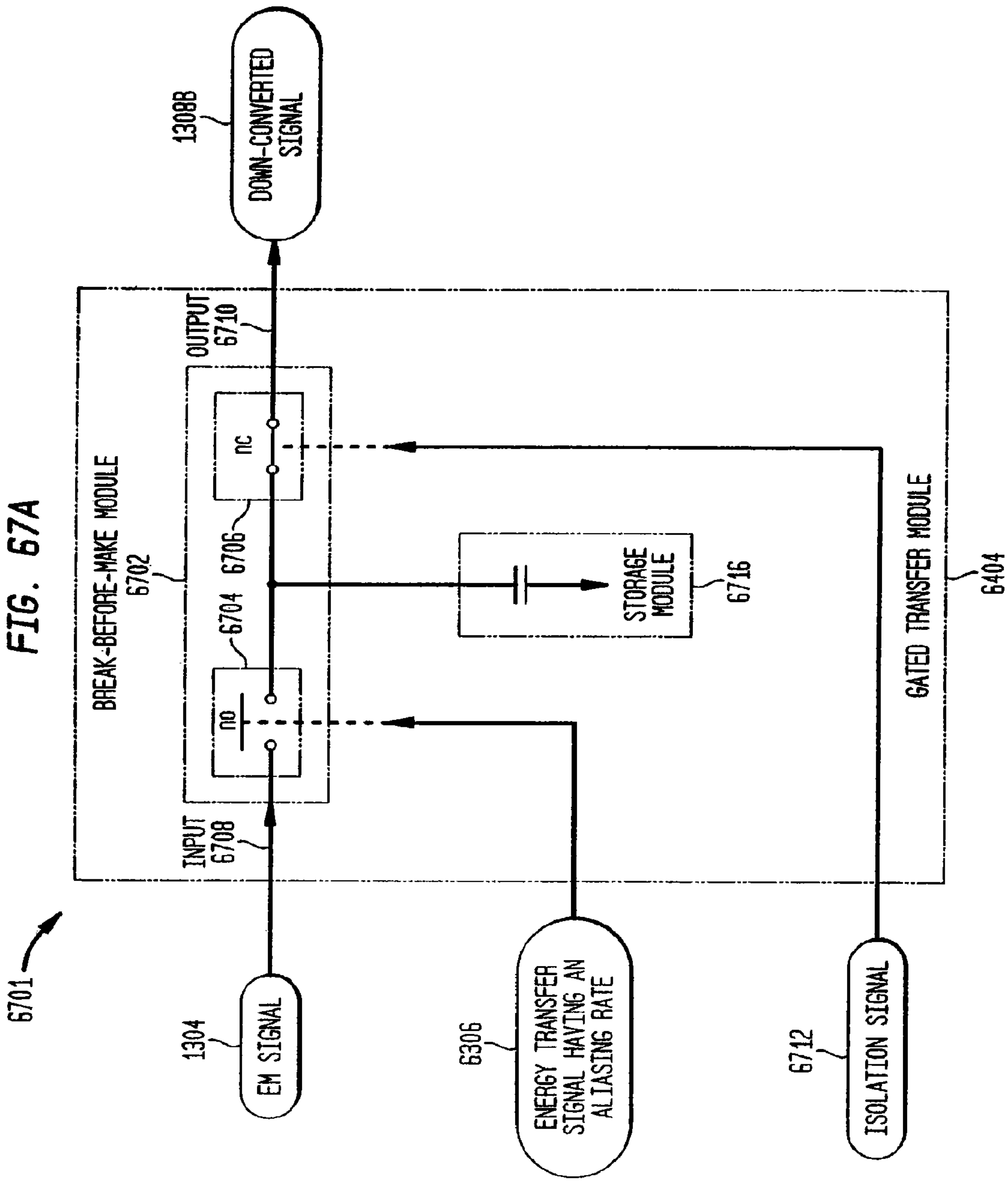
FIG. 67A illustrates an example embodiment of the gated transfer module as including a break-before-make module according to an embodiment of the invention.

FIG. 67A illustrates an example embodiment of the gated transfer module 6404 as including a break-before-make module 6702 and a storage module 6716. Preferably, the break before make module 6702 and the storage module 6716 transfer energy from the EM signal 1304 to down-convert it in any of the manners shown in the operational flowcharts 4601 in FIG. 46A, 4607 in FIG. 46B, 4613 in FIGS. 46C and 4619 in FIG. 46D.

In FIG. 67A, the break-before-make module 6702 includes a includes a normally open switch 6704 and a normally closed switch 6706. The normally open switch 6704 is controlled by the energy transfer signal 6306. The normally closed switch 6706 is controlled by an isolation signal 6712. In an embodiment, the isolation signal 6712 is generated from the energy transfer signal 6306. Alternatively, the energy transfer signal 6306 is generated from the isolation signal 6712. Alternatively, the isolation signal 6712 is generated independently from the energy transfer signal 6306. The break-before-make module 6702 substantially isolates an input 6708 from an output 6710.

Figure 67B:
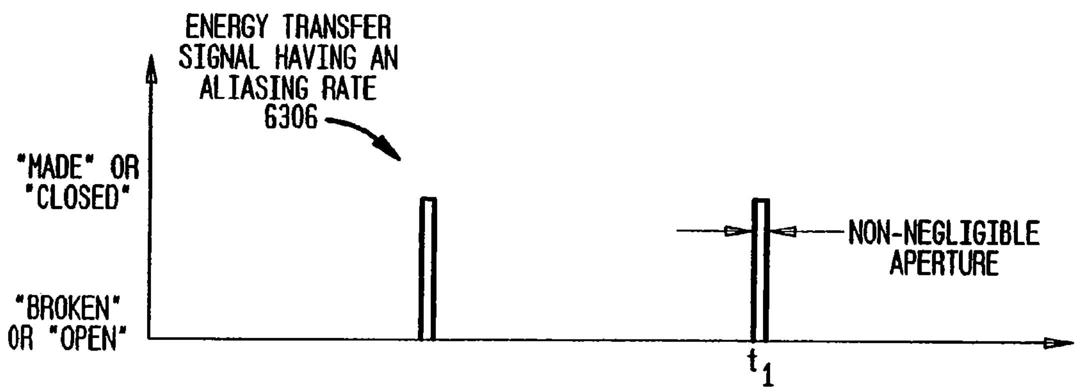
FIG. 67B illustrates an example timing diagram for an energy transfer signal according to an embodiment of the invention.
Figure 67C:
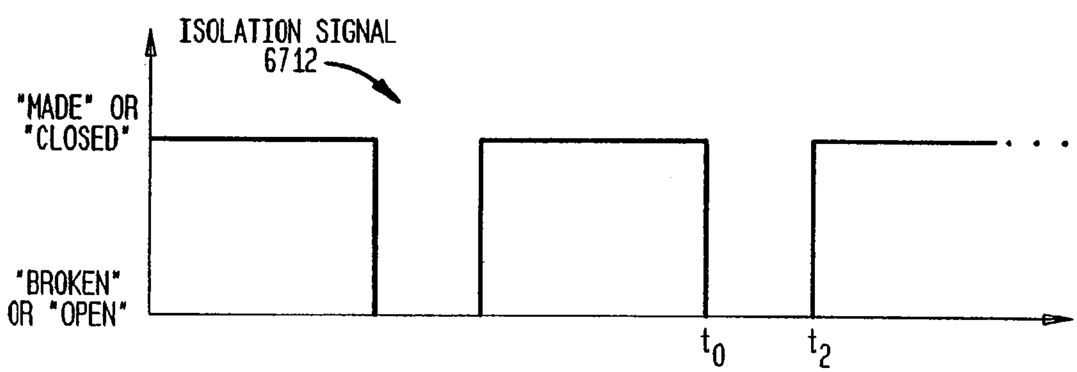
FIG. 67C illustrates an example timing diagram for an isolation signal according to an embodiment of the invention.

FIG. 67B illustrates an example timing diagram of the energy transfer signal 6306, which controls the normally open switch 6704. FIG. 67C illustrates an example timing diagram of the isolation signal 6712, which controls the normally closed switch 6706. Operation of the break-before-make module 6702 is now described with reference to the example timing diagrams in FIGS. 67B and 67C.

Prior to time t0, the normally open switch 6704 and the normally closed switch 6706 are at their normal states.

At time t0, the isolation signal 6712 in FIG. 67C opens the normally closed switch 6706. Thus, just after time t0, the normally open switch 6704 and the normally closed switch 6706 are open and the input 6708 is isolated from the output 6710.

At time t1, the energy transfer signal 6306 in FIG. 67B closes the normally open switch 6704 for the non-negligible duration of a pulse. This couples the EM signal 1304 to the storage module 6716.

Prior to t2, the energy transfer signal 6306 in FIG. 67B opens the normally open switch 6704. This de-couples the EM signal 1304 from the storage module 6716.

At time t2, the isolation signal 6712 in FIG. 67C closes the normally closed switch 6706. This couples the storage module 6716 to the output 6710.

The storage module 6716, is similar to the storage module 6506 FIG. 65. The break-before-make gated transfer system 6701 down-converts the EM signal 1304 in a manner similar to that described with reference to the gated transfer system 6501 in FIG. 65.

5.1.3 Example Implementations of the Switch Module

The switch module 6502 in FIG. 65 and the switch modules 6704 and 6706 in FIG. 67A can be any type of switch device that preferably has a relatively low impedance when closed and a relatively high impedance when open. The switch modules 6502, 6704 and 6706 can be implemented with normally open or normally closed switches. The switch modules need not be ideal switch modules.

Figure 66A:
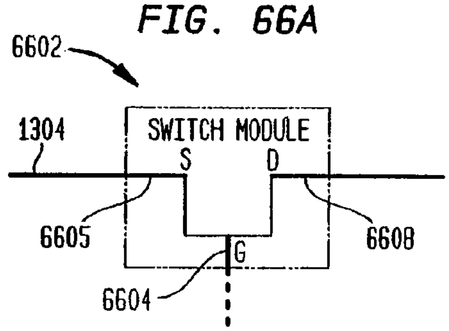
FIGS. 66A-D illustrate example implementations of a switch module according to embodiments of the invention.
Figure 66B:
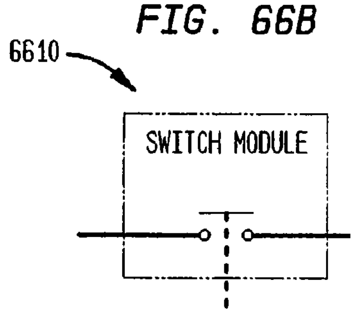

FIG. 66B illustrates the switch modules 6502, 6704 and 6706 as a switch module 6610. Switch module 6610 can be implemented in either normally open or normally closed architecture. The switch module 6610 (e.g., switch modules 6502, 6704 and 6706) can be implemented with any type of suitable switch device, including, but not limited, to mechanical switch devices and electrical switch devices, optical switch devices, etc., and combinations thereof. Such devices include, but are not limited to transistor switch devices, diode switch devices, relay switch devices, optical switch devices, micro-machine switch devices, etc., or combinations thereof.

In an embodiment, the switch module 6610 can be implemented as a transistor, such as, for example, a field effect transistor (FET), a bi-polar transistor, or any other suitable circuit switching device.

In FIG. 66A, the switch module 6610 is illustrated as a FET 6602. The FET 6602 can be any type of FET, including, but not limited to, a MOSFET, a JFET, a GaAsFET, etc. The FET 6602 includes a gate 6604, a source 6606 and a drain 6608. The gate 6604 receives the energy transfer signal 6306 to control the switching action between the source 6606 and the drain 6608. In an embodiment, the source 6606 and the drain 6608 are interchangeable.

It should be understood that the illustration of the switch module 6610 as a FET 6602 in FIG. 66A is for example purposes only. Any device having switching capabilities could be used to implement the switch module 6610 (i.e., switch modules 6502, 6704 and 6706), as will be apparent to persons skilled in the relevant art(s) based on the discussion contained herein.

Figure 66C:
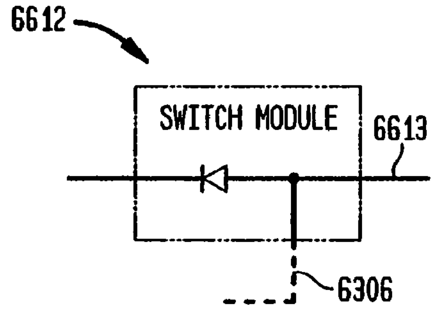

In FIG. 66C, the switch module 6610 is illustrated as a diode switch 6612, which operates as a two lead device when the energy transfer signal 6306 is coupled to the output 6613.

Figure 66D:
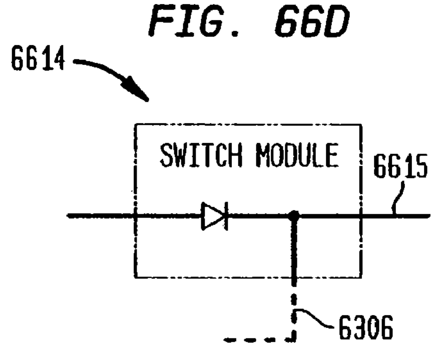

In FIG. 66D, the switch module 6610 is illustrated as a diode switch 6614, which operates as a two lead device when the energy transfer signal 6306 is coupled to the output 6615.

5.1.4 Example Implementations of the Storage Module

Figure 68A:
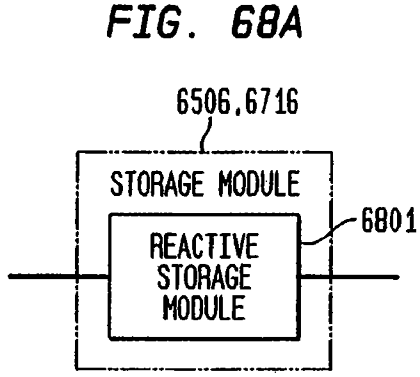
FIGS. 68A-F illustrate example storage modules according to embodiments of the invention.

The storage modules 6506 and 6716 store non-negligible amounts of energy from the EM signal 1304. In an exemplary embodiment, the storage modules 6506 and 6716 are implemented as a reactive storage module 6801 in FIG. 68A, although the invention is not limited to this embodiment. A reactive storage module is a storage module that employs one or more reactive electrical components to store energy transferred from the EM signal 1304. Reactive electrical components include, but are not limited to, capacitors and inductors.

Figure 68B:
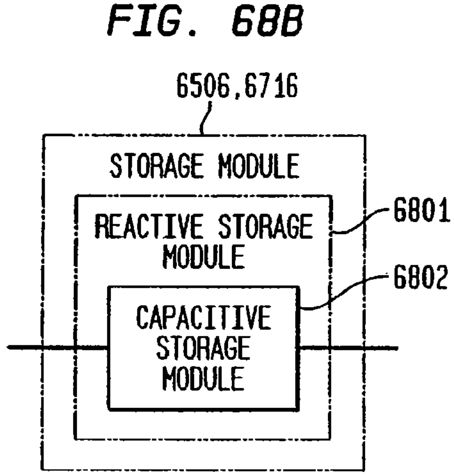
Figure 68C:
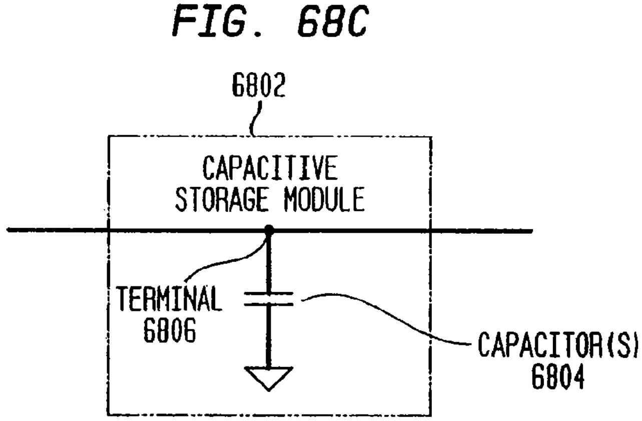

In an embodiment, the storage modules 6506 and 6716 include one or more capacitive storage elements, illustrated in FIG. 68B as a capacitive storage module 6802. In FIG. 68C, the capacitive storage module 6802 is illustrated as one or more capacitors illustrated generally as capacitor(s) 6804.

The goal of the storage modules 6506 and 6716 is to store non-negligible amounts of energy transferred from the EM signal 1304. Amplitude reproduction of the original, unaffected EM input signal is not necessarily important. In an energy transfer environment, the storage module preferably has the capacity to handle the power being transferred, and to allow it to accept a non-negligible amount of power during a non-negligible aperture period.

A terminal 6806 serves as an output of the capacitive storage module 6802. The capacitive storage module 6802 provides the stored energy at the terminal 6806. FIG. 68F illustrates the capacitive storage module 6802 as including a series capacitor 6812, which can be utilized in an inverted gated transfer system described below.

Figure 68D:
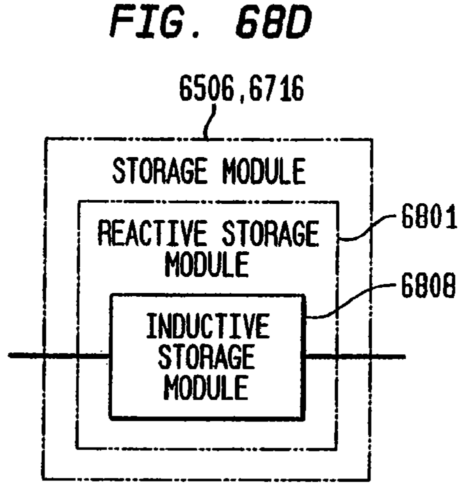

In an alternative embodiment, the storage modules 6506 and 6716 include one or more inductive storage elements, illustrated in FIG. 68D as an inductive storage module 6808.

Figure 68E:
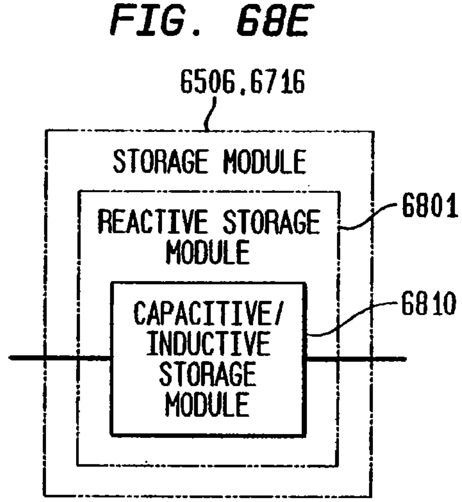
Figure 68F:
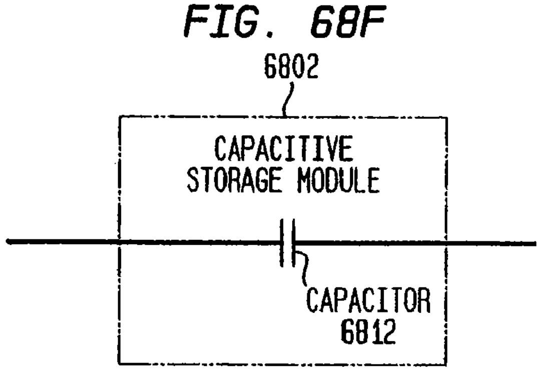

In an alternative embodiment, the storage modules 6506 and 6716 include a combination of one or more capacitive storage elements and one or more inductive storage elements, illustrated in FIG. 68E as a capacitive/inductive storage module 6810.

Figure 68G:
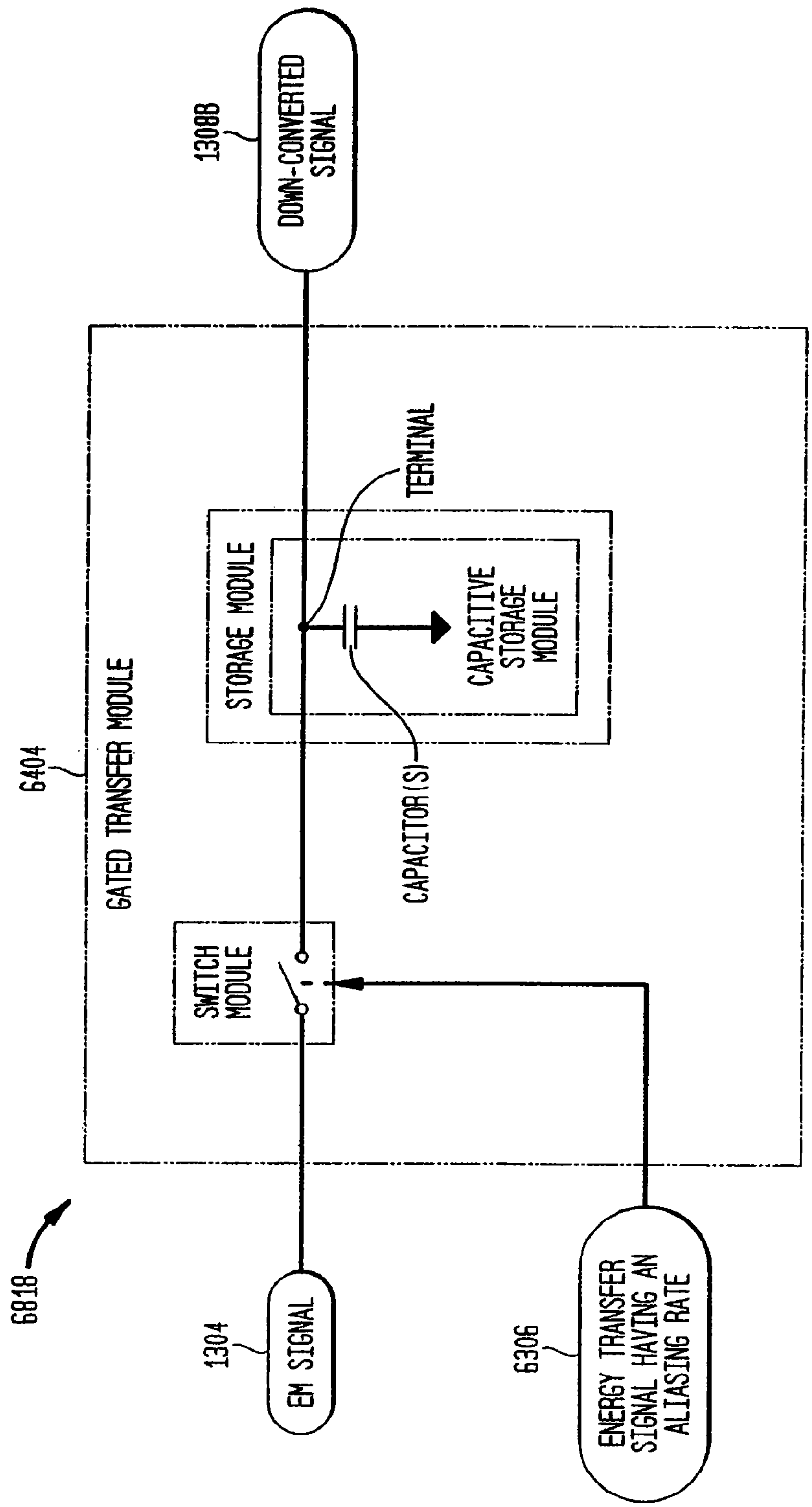
FIG. 68G illustrates an integrated gated transfer system according to an embodiment of the invention.

FIG. 68G illustrates an integrated gated transfer system 6818 that can be implemented to down-convert the EM signal 1304 as illustrated in, and described with reference to, FIGS. 83A-F.

5.1.5 Optional Energy Transfer Signal Module

Figure 69:
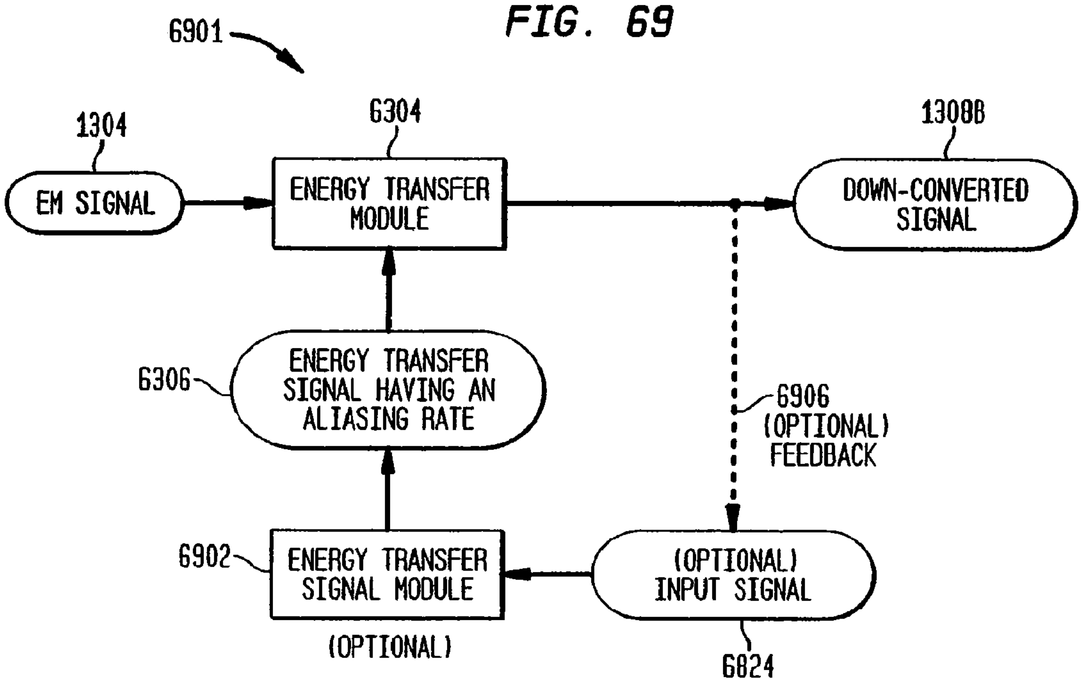
FIG. 69 illustrates an energy transfer system with an optional energy transfer signal module according to an embodiment of the invention.

FIG. 69 illustrates an energy transfer system 6901, which is an example embodiment of the energy transfer system 6302. The energy transfer system 6901 includes an optional energy transfer signal module 6902, which can perform any of a variety of functions or combinations of functions including, but not limited to, generating the energy transfer signal 6306.

Figure 68H:
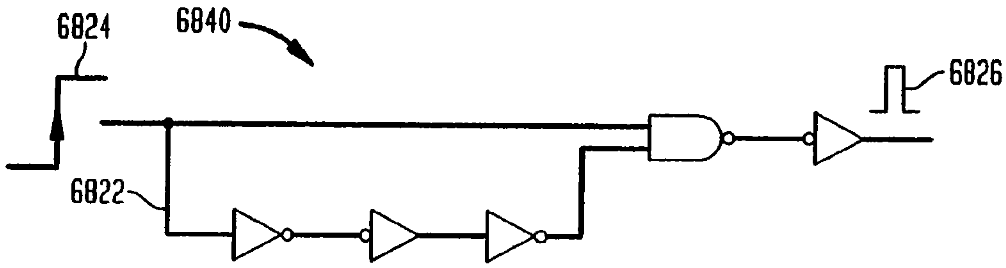
FIGS. 68H-K illustrate example aperture generators.
Figure 68I:
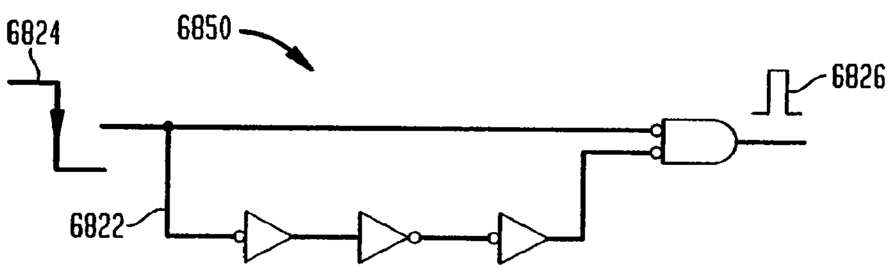
Figure 68J:
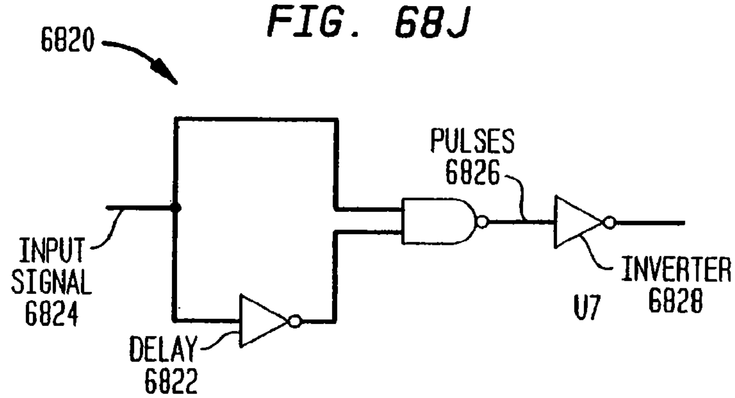

In an embodiment, the optional energy transfer signal module 6902 includes an aperture generator, an example of which is illustrated in FIG. 68J as an aperture generator 6820. The aperture generator 6820 generates non-negligible aperture pulses 6826 from an input signal 6824. The input signal 6824 can be any type of periodic signal, including, but not limited to, a sinusoid, a square wave, a saw-tooth wave, etc. Systems for generating the input signal 6824 are described below.

The width or aperture of the pulses 6826 is determined by delay through the branch 6822 of the aperture generator 6820. Generally, as the desired pulse width increases, the difficulty in meeting the requirements of the aperture generator 6820 decrease. In other words, to generate non-negligible aperture pulses for a given EM input frequency, the components utilized in the example aperture generator 6820 do not require as fast reaction times as those that are required in an under-sampling system operating with the same EM input frequency.

The example logic and implementation shown in the aperture generator 6820 are provided for illustrative purposes only, and are not limiting. The actual logic employed can take many forms. The example aperture generator 6820 includes an optional inverter 6828, which is shown for polarity consistency with other examples provided herein.

Figure 68K:
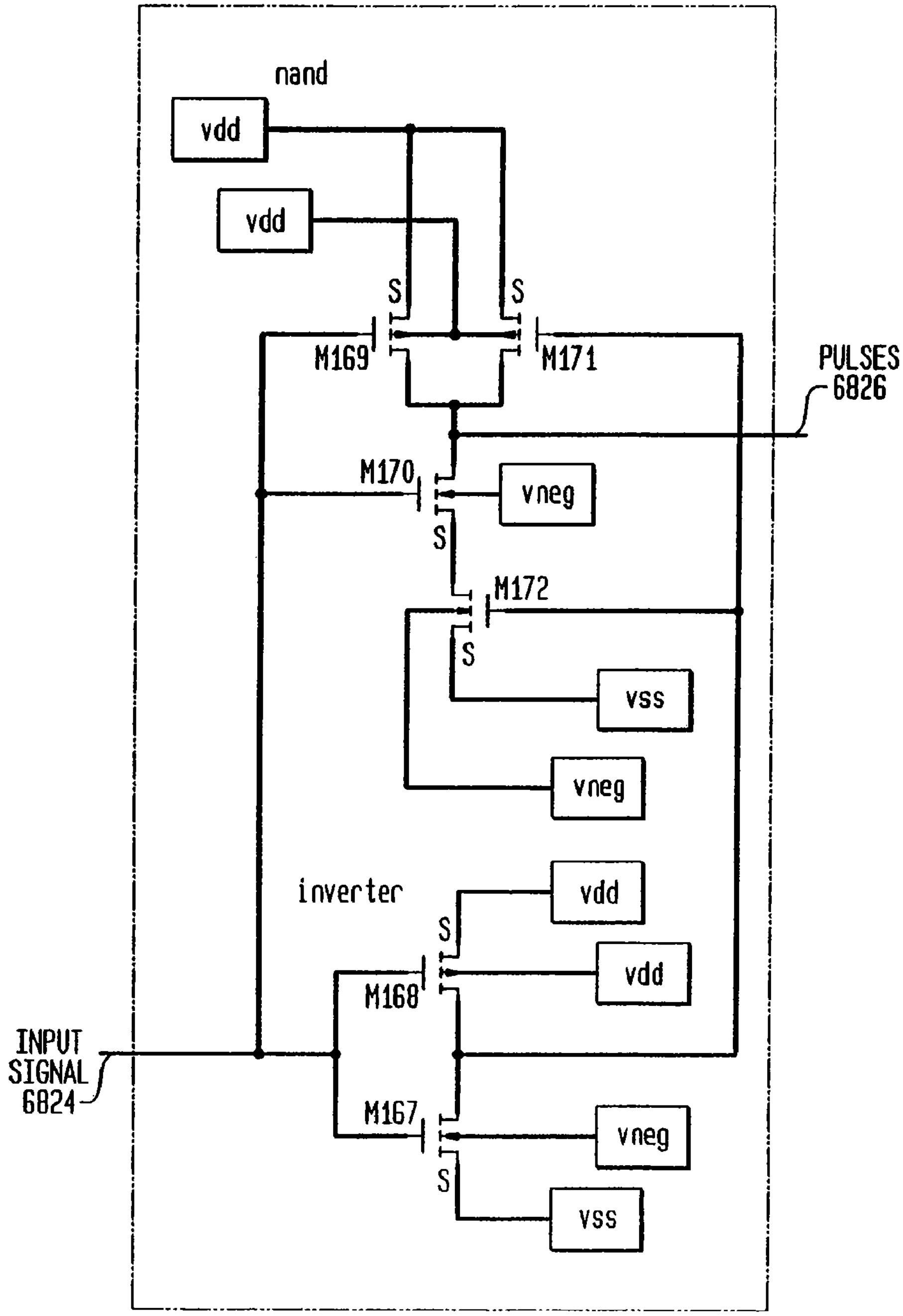

An example implementation of the aperture generator 6820 is illustrated in FIG. 68K. Additional examples of aperture generation logic are provided in FIGS. 68H and 681. FIG. 68H illustrates a rising edge pulse generator 6840, which generates pulses 6826 on rising edges of the input signal 6824. FIG. 68I illustrates a falling edge pulse generator 6850, which generates pulses 6826 on falling edges of the input signal 6824.

Figure 68L:
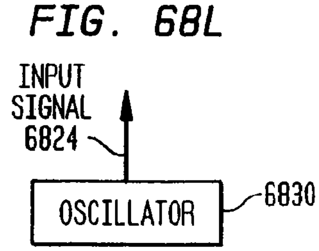
FIG. 68L illustrates an oscillator according to an embodiment of the present invention.

In an embodiment, the input signal 6824 is generated externally of the energy transfer signal module 6902, as illustrated in FIG. 69. Alternatively, the input signal 6924 is generated internally by the energy transfer signal module 6902. The input signal 6824 can be generated by an oscillator, as illustrated in FIG. 68L by an oscillator 6830. The oscillator 6830 can be internal to the energy transfer signal module 6902 or external to the energy transfer signal module 6902. The oscillator 6830 can be external to the energy transfer system 6901. The output of the oscillator 6830 may be any periodic waveform.

The type of down-conversion performed by the energy transfer system 6901 depends upon the aliasing rate of the energy transfer signal 6306, which is determined by the frequency of the pulses 6826. The frequency of the pulses 6826 is determined by the frequency of the input signal 6824. For example, when the frequency of the input signal 6824 is substantially equal to a harmonic or a sub-harmonic of the EM signal 1304, the EM signal 1304 is directly down-converted to baseband (e.g. when the EM signal is an AM signal or a PM signal), or converted from FM to a non-FM signal. When the frequency of the input signal 6824 is substantially equal to a harmonic or a sub-harmonic of a difference frequency, the EM signal 1304 is down-converted to an intermediate signal.

The optional energy transfer signal module 6902 can be implemented in hardware, software, firmware, or any combination thereof.

5.2 The Energy Transfer System as an Inverted Gated Transfer System

FIG. 64B illustrates an exemplary inverted gated transfer system 6406, which is an exemplary implementation of the energy transfer system 6302. The inverted gated transfer system 6406 includes an inverted gated transfer module 6408, which receives the EM signal 1304 and the energy transfer signal 6306. The energy transfer signal 6306 includes a train of energy transfer pulses having non-negligible apertures that tend away from zero time in duration. The energy transfer pulses repeat at an aliasing rate $F_{AR}$. The inverted gated transfer module 6408 transfers energy from the EM signal 1304 at the aliasing rate of the energy transfer signal 6306, as described in the sections above with respect to the flowcharts 4601 in FIG. 46A, 4607 in FIG. 46B, 4613 in FIGS. 46C and 4619 in FIG. 46D. The inverted gated transfer module 6408 outputs the down-converted signal 1308B, which includes non-negligible amounts of energy transferred from the EM signal 1304.

Figure 74:
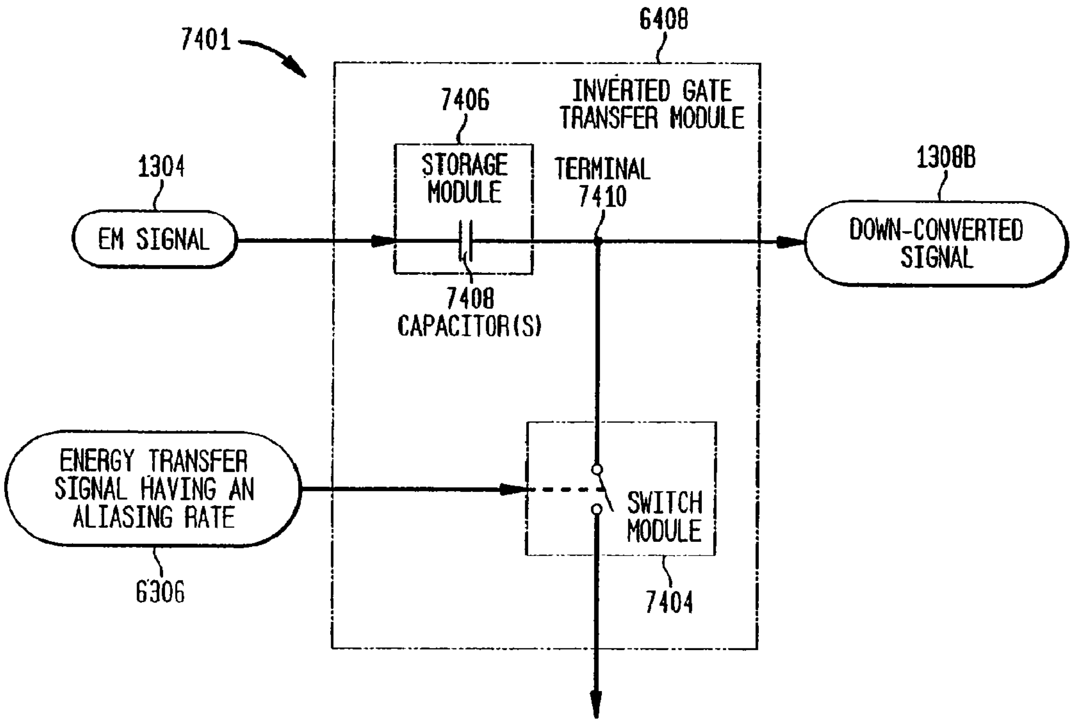
FIG. 74 illustrates an example inverted gated transfer module as including a switch module and a storage module according to an embodiment of the invention.

5.2.1 The Inverted Gated Transfer System as a Switch Module and a Storage Module FIG. 74 illustrates an example embodiment of the inverted gated transfer module 6408 as including a switch module 7404 and a storage module 7406. Preferably, the switch module 7404 and the storage module 7406 transfer energy from the EM signal 1304 to down-convert it in any of the manners shown in the operational flowcharts 4601 in FIG. 46A, 4607 in FIG. 46B, 4613 in FIG. 46C and 4619 in FIG. 46D.

The switch module 7404 can be implemented as described above with reference to FIGS. 66A-D. The storage module 7406 can be implemented as described above with reference to FIGS. 68A-F.

In the illustrated embodiment, the storage module 7206 includes one or more capacitors 7408. The capacitor(s) 7408 are selected to pass higher frequency components of the EM signal 1304 through to a terminal 7410, regardless of the state of the switch module 7404. The capacitor 7408 stores non-negligible amounts of energy from the EM signal 1304. Thereafter, the signal at the terminal 7410 is off-set by an amount related to the energy stored in the capacitor 7408.

Figures 75A, 75B, 75C, 75D, 75E, 75F:
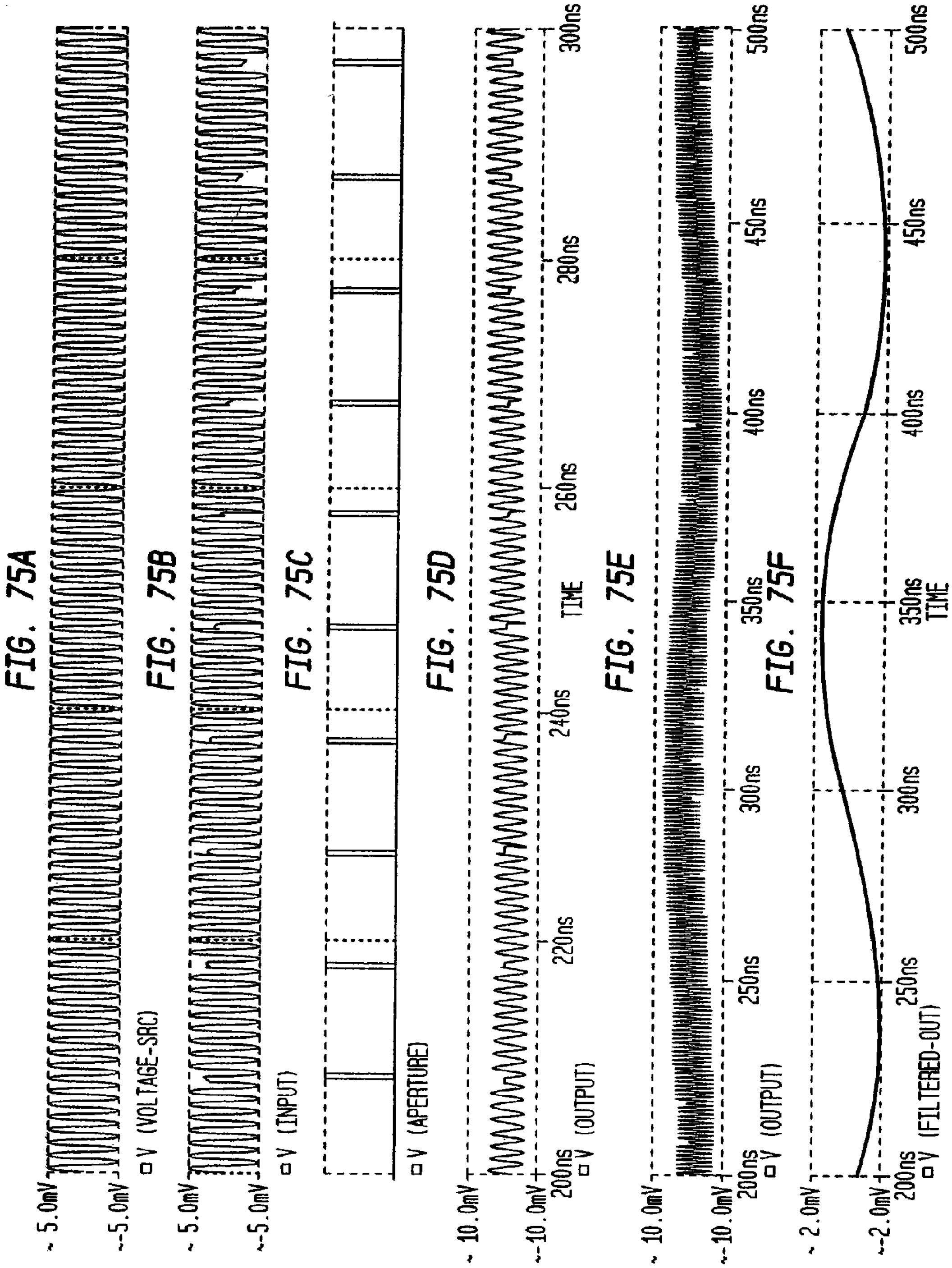
FIGS. 75A-F illustrate an example signal diagrams associated with an inverted gated energy transfer module according to embodiments of the invention.

Operation of the inverted gated transfer system 7401 is illustrated in FIGS. 75A-F. FIG. 75A illustrates the EM signal 1304. FIG. 75B illustrates the EM signal 1304 after transferring energy from it. FIG. 75C illustrates the energy transfer signal 6306, which includes a train of energy transfer pulses having non-negligible apertures.

FIG. 75D illustrates an example down-converted signal 1308B. FIG. 75E illustrates the down-converted signal 1308B on a compressed time scale. Since the storage module 7406 is a series element, the higher frequencies (e.g., RF) of the EM signal 1304 can be seen on the down-converted signal. This can be filtered as illustrated in FIG. 75F.

The inverted gated transfer system 7401 can be used to down-convert any type of EM signal, including modulated carrier signals and unmodulated carrier signals.

5.3 Rail to Rail Operation for Improved Dynamic Range 5.3.1 Introduction

FIG. 110A illustrates aliasing module 11000 that down-converts EM signal 11002 to down-converted signal 11012 using aliasing signal 11014 (sometimes called an energy transfer signal). Aliasing module 11000 is an example of energy transfer module 6304 in FIG. 63. Aliasing module 11000 includes UFT module 11004 and storage module 11008. As shown in FIG. 110A, UFT module 11004 is implemented as a n-channel FET 11006, and storage module 11008 is implemented as a capacitor 11010, although the invention is not limited to this embodiment.

FET 11006 receives the EM signal 11002 and aliasing signal 11014. In one embodiment, aliasing signal 11014 includes a train of pulses having non-negligible apertures that repeat at an aliasing rate. The aliasing rate may be harmonic or sub-harmonic of the EM signal 11002. FET 11006 samples EM signal 11002 at the aliasing rate of aliasing signal 11014 to generate down-converted signal 11012. In one embodiment, aliasing signal 11014 controls the gate of FET 11006 so that FET 11006 conducts (or turns on) when the FET gate-to-source voltage ($V_{GS}$) exceeds a threshold voltage ($V_T$). When the FET 11006 conducts, a channel is created from source to drain of FET 11006 so that charge is transferred from the EM signal 11002 to the capacitor 11010. More specifically, the FET 11006 conductance (I/R) vs $V_{GS}$ is a continuous function that reaches an acceptable level at $V_T$, as illustrated in FIG. 110B. The charge stored by capacitor 11010 during successive samples forms down-converted signal 11012.

As stated above, n-channel FET 11006 conducts when $V_{GS}$ exceeds the threshold voltage $V_T$. As shown in FIG. 110A, the gate voltage of FET 11006 is determined by aliasing signal 11014, and the source voltage is determined by the input EM signal 11002. Aliasing signal 11014 is preferably a plurality of pulses whose amplitude is predictable and set by a system designer. However, the EM signal 11002 is typically received over a communications medium by a coupling device (such as antenna). Therefore, the amplitude of EM signal 11102 may be variable and dependent on a number of factors including the strength of the transmitted signal, and the attenuation of the communications medium. Thus, the source voltage on FET 11006 is not entirely predictable and will affect $V_{GS}$ and the conductance of FET 11006, accordingly.

For example, FIG. 111A illustrates EM signal 11102, which is an example of EM signal 11002 that appears on the source of FET 11006. EM signal 11102 has a section 11104 with a relatively high amplitude as shown. FIG. 111B illustrates the aliasing signal 11106 as an example of aliasing signal 11014 that controls the gate of FET 11006. FIG. 111C illustrates $V_{GS}$ 11108, which is the difference between the gate and source voltages shown in FIGS. 111B and 111A, respectively. FET 11006 has an inherent threshold voltage $V_T$ 11112 shown in FIG. 111C, above which FET 11006 conducts. It is preferred that $V_{GS}>V_T$ during each pulse of aliasing signal 11106, so that FET 11006 conducts and charge is transferred from the EM signal 11102 to the capacitor 11010 during each pulse of aliasing signal 11106. As shown in FIG. 111C, the high amplitude section 11104 of EM signal 11102 causes a $V_{GS}$ pulse 11110 that does exceed the $V_T$ 11112, and therefore FET 11006 will not fully conduct as is desired. Therefore, the resulting sample of EM signal 11102 may be degraded, which potentially negatively affects the down-converted signal 11012.

As stated earlier, the conductance of FET 11006 vs $V_{GS}$ is mathematically continuous and is not a hard cutoff. In other words, FET 11006 will marginally conduct when controlled by pulse 11110, even though pulse 11110 is below $V_T$ 11112. However, the insertion loss of FET 11006 will be increased when compared with a $V_{GS}$ pulse 11111, which is greater than $V_T$ 11112. The performance reduction caused by a large amplitude input signal is often referred to as clipping or compression. Clipping causes distortion in the down-converted signal 11012, which adversely affects the faithful down-conversion of input EM signal 11102. Dynamic range is a figure of merit associated with the range of input signals that can be faithfully down-converted without introducing distortion in the down-converted signal. The higher the dynamic range of a down-conversion circuit, the larger the input signals that can down-converted without introducing distortion in the down-converted signal.

5.3.2 Complementary UFT Structure for Improved Dynamic Range

FIG. 112 illustrates aliasing module 11200, according to an embodiment of the invention, that down-converts EM signal 11208 to generate down-converted signal 11214 using aliasing signal 11220. Aliasing module 11200 is able to down-convert input signals over a larger amplitude range as compared to aliasing module 11000, and therefore aliasing module 11200 has an improved dynamic range when compared with aliasing module 11000. The dynamic range improvement occurs because aliasing module 11200 includes two UFT modules that are implemented with complementary FET devices. In other words, one FET is n-channel, and the other FET is p-channel, so that at least one FET is always conducting during an aliasing signal pulse, assuming the input signal does not exceed the power supply constraints. Aliasing module 11200 includes: delay 11202; UFT modules 11206, 11216; nodes 11210, 11212; and inverter 11222. Inverter 11222 is tied to voltage supplies $V_+$ 11232 and $V_-$ 11234. UFT module 11206 comprises n-channel FET 11204, and UFT module 11216 comprises p-channel FET 11218.

As stated, aliasing module 11200 operates two complementary FETs to extend the dynamic range and reduce any distortion effects. This requires that two complementary aliasing signals 11224, 11226 be generated from aliasing signal 11220 to control the sampling by PETs 11218, 11204, respectively. To do so, inverter 11222 receives and inverts aliasing signal 11220 to generate aliasing signal 11224 that controls p-channel FET 11218. Delay 11202 delays aliasing signal 11220 to generate aliasing signal 11226, where the amount of time delay is approximately equivalent to that associated with inverter 11222. As such, aliasing signals 11224 and 11226 are approximately complementary in amplitude.

Node 11210 receives EM signal 11208, and couples EM signals 11227, 11228 to the sources of n-channel FET 11204 and p-channel PET 11218, respectively, where EM signals 11227, 11228 are substantially replicas of EM signal 11208. N-channel PET 11204 samples EM signal 11227 as controlled by aliasing signal 11226, and produces samples 11236 at the drain of FET 11204. Likewise, p-channel FET 11218 samples EM signal 11228 as controlled by aliasing signal 11224, and produces samples 11238 at the drain of FET 11218. Node 11212 combines the resulting charge samples into charge samples 11240, which are stored by capacitor 11230. The charge stored by capacitor 11230 during successive samples forms down-converted signal 11214. Aliasing module 11200 offers improved dynamic range over aliasing module 11000 because n-channel FET 11204 and p-channel FET 11214 are complementary devices. Therefore, if one device is cutoff because of a large input EM signal 11208, the other device will conduct and sample the input signal, as long as the input signal is between the power supply voltages $V_+$ 11232 and $V_-$ 11234. This is often referred to as rail-to-rail operation as will be understood by those skilled in the arts.

Figure 113A:
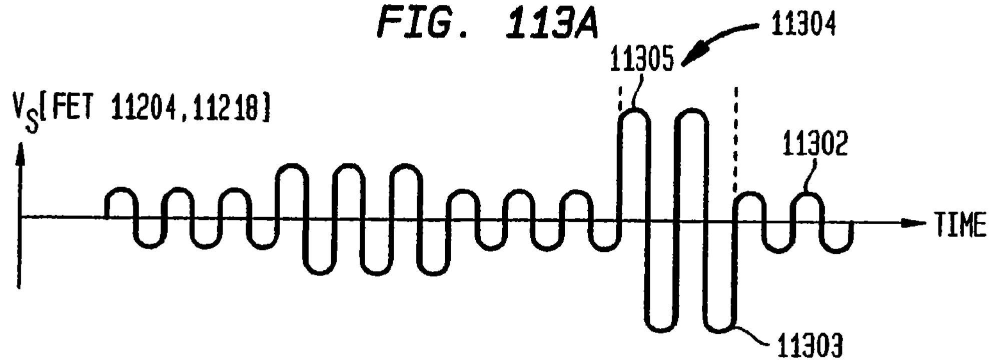
Figure 113B:
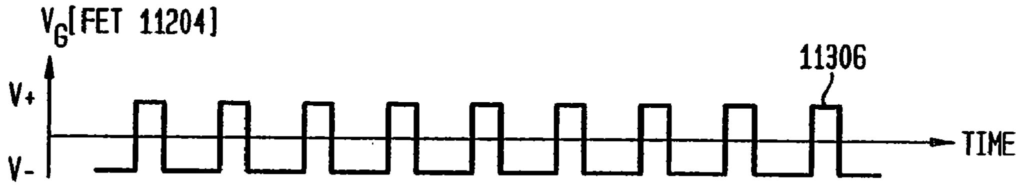

For example, FIG. 113A illustrates EM signal 11302 which is an example of EM signals 11227, 11228 that are coupled to the sources of n-channel FET 11204 and p-channel FET 11218, respectively. As shown, EM signal 11302 has a section 11304 with a relatively high amplitude including pulses 11303, 11305. FIG. 113B illustrates the aliasing signal 11306 as an example of aliasing signal 11226 that controls the gate of n-channel FET 11204. Likewise for the p-channel FET, FIG. 113D illustrates the aliasing signal 11314 as an example of aliasing signal 11224 that controls the gate of p-channel FET 11218. Aliasing signal 11314 is the amplitude complement of aliasing signal 11306.

Figure 113C:
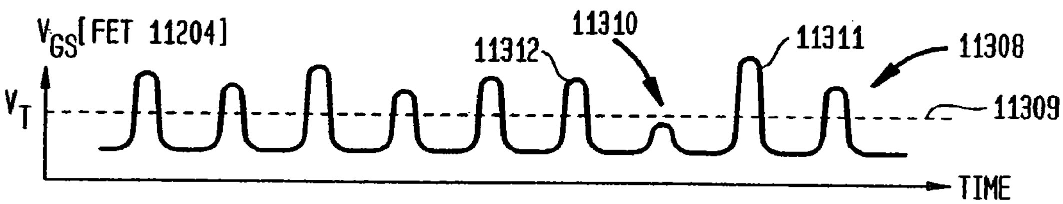
Figure 113D:
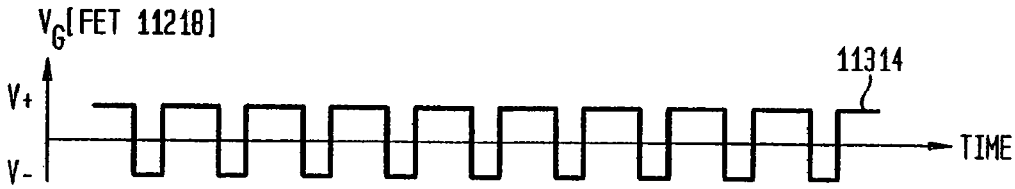
Figure 113E:
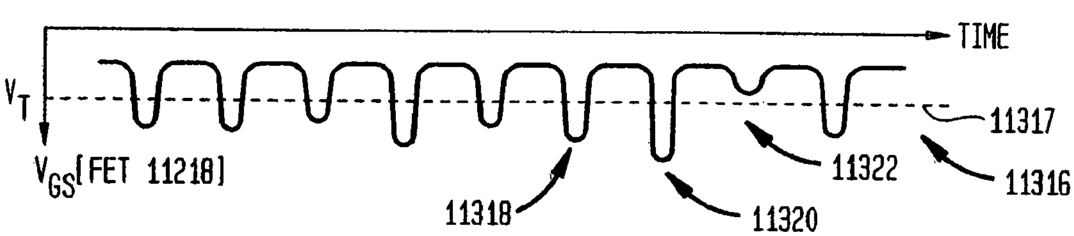

FIG. 113C illustrates $V_{GS}$ 11308, which is the difference between the gate and source voltages on n-channel FET 11204 that are depicted in FIGS. 113B and 113A, respectively. FIG. 13C also illustrates the inherent threshold voltage $V_T$ 11309 for FET 11204, above which FET 11204 conducts. Likewise for the p-channel FET, FIG. 113E illustrates $V_{GS}$ 11316, which is the difference between the gate and source voltages for p-channel FET 11218 that are depicted in FIGS. 113D and 113A, respectively. FIG. 113E also illustrates the inherent threshold voltage $V_T$ 11317 for FET 11218, below which FET 11218 conducts.

As stated, n-channel FET 11204 conducts when $V_{GS}$ 11308 exceeds $V_T$ 11309, and p-channel FET 11218 conducts when $V_{GS}$ 11316 drops below $V_T$ 11317. As illustrated by FIG. 113C, n-channel FET 11204 conducts over the range of EM signal 11302 depicted in FIG. 113A, except for the EM signal pulse 11305 that results in a corresponding $V_{GS}$ pulse 11310 (FIG. 113C) that does not exceed $V_T$ 11309. However, p-channel FET 11218 does conduct because the same EM signal pulse 11305 causes a $V_{GS}$ pulse 11320 (FIG. 113E) that drops well below that of $V_T$ 11317 for the p-channel FET. Therefore, the sample of the EM signal 11302 is properly taken by p-channel FET 11218, and no distortion is introduced in down-converted signal 11214. Similarly, EM signal pulse 11303 results in $V_{GS}$ pulse 11322 (FIG. 113E) that is inadequate for the p-channel FET 11218 to fully conduct. However, n-channel FET 11204 does fully conduct because the same EM signal pulse 11303 results in a $V_{GS}$ 11311 (FIG. 113C) that greatly exceeds $V_T$ 11309.

As illustrated above, aliasing module 11200 offers an improvement in dynamic range over aliasing module 11000 because of the complimentary FET structure. Any input signal that is within the power supply voltages $V_+$ 11232 and $V_-$ 11234 will cause either FET 11204 or FET 11218 to conduct, or cause both FETs to conduct, as is demonstrated by FIGS. 113A-113E. This occurs because any input signal that produces a $V_{GS}$ that cuts-off the n-channel FET 11204 will push the p-channel FET 11218 into conduction. Likewise, any input signal that cuts-off the p-channel FET 11218 will push the n-channel FET 11204 into conduction, and therefore prevent any distortion of the down-converted output signal.

5.3.3 Biased Configurations

FIG. 114 illustrates aliasing module 11400, which is an alternate embodiment of aliasing module 11200. Aliasing module 11400 includes positive voltage supply ($V_+$) 11402, resistors 11404, 11406, and the elements in aliasing module 11200. $V_+$ 11402 and resistors 11404, 11406 produce a positive DC voltage at node 11405. This allows node 11405 to drive a coupled circuit that requires a positive voltage supply, and enables unipolar supply operation of aliasing module 11400. The positive supply voltage also has the effect of raising the DC level of the input EM signal 11208. As such, any input signal that is within the power supply voltages $V_+$ 11402 and ground will cause either FET 11204 or FET 11218 to conduct, or cause both FETs to conduct, as will be understood by those skilled in the arts based on the discussion herein.

FIG. 115 illustrates aliasing module 11500, which is an alternate biased configuration of aliasing module 11200. Aliasing module 11500 includes positive voltage supply 11502, negative voltage supply 11508, resistors 11504, 11506, and the elements in aliasing module 11200. The use of both a positive and negative voltage supply allows for node 11505 to be biased anywhere between $V_+$ 11502 and $V_-$ 11508. This allows node 11505 to drive a coupled circuit that requires either a positive or negative supply voltage. Furthermore, any input signal that is within the power supply voltages $V_+$ 11502 and $V_-$ 11508 will cause either FET 11204 or FET 11218 to conduct, or cause both FETs to conduct, as will be understood by those skilled in the arts based on the discussion herein.

5.3.4 Simulation Examples

As stated, an aliasing module with a complementary FET structure offers improved dynamic range when compared with a single (or unipolar) FET configuration. This is further illustrated by comparing the signal waveforms associated aliasing module 11602 (of FIG. 116) which has a complementary FET structure, with that of aliasing module 11702 (of FIG. 117) which has a single (or unipolar) FET structure.

Aliasing module 11602 (FIG. 116) down-converts EM signal 11608 using aliasing signal 11612 to generate down-converted signal 11610. Aliasing module 11602 has a complementary FET structure and includes n-channel FET 11604, p-channel FET 11606, inverter 11614, and aliasing signal generator 11608. Aliasing module 11602 is biased by supply circuit 11616 as is shown. Aliasing module 11702

(FIG. 117) down-converts EM signal 11704 using aliasing signal 11708 to generate down-converted signal 11706. Aliasing module 11702 is a single FET structure comprising n-channel FET 11712 and aliasing signal generator 11714, and is biased using voltage supply circuit 11710.

FIGS. 118-120 are signal waveforms that correspond to aliasing module 11602, and FIGS. 121-123 are signal waveforms that correspond to aliasing module 11702. FIGS. 118 and 121 are down-converted signals 11610, 11706, respectively. FIGS. 119 and 122 are the sampled EM signal 11608, 11704, respectively. FIGS. 120 and 123 are the aliasing signals 11612, 11708, respectively. Aliasing signal 11612 is identical to aliasing signal 11708 in order that a proper comparison between modules 11602 and 11702 can be made.

EM signals 11608, 11704 are relatively large input signals that approach the power supply voltages of ±1.65 volts, as is shown in FIGS. 119 and 122, respectively. In FIG. 119, sections 11802 and 11804 of signal 11608 depict energy transfer from EM signal 11608 to down-converted signal 11610 during by aliasing module 11602. More specifically, section 11802 depicts energy transfer near the −1.65 v supply, and section 11804 depicts energy transfer near the +1.65 v supply. The symmetrical quality of the energy transfer near the voltage supply rails indicates that at least one of complementary FETs 11604, 11606 are appropriately sampling the EM signal during each of the aliasing pulses 11612. This results in a down-converted signal 11610 that has minimal high frequency noise, and is centered between −1.0 v and 1.0 v (i.e. has negligible DC voltage component).

Similarly in FIG. 122, sections 11902 and 11904 illustrate the energy transfer from EM signal 11704 to down-converted signal 11706 by aliasing module 11702 (single FET configuration). More specifically, section 11902 depicts energy transfer near the −1.65 v supply, and section 11904 depicts energy transfer near the +1.65 v supply. By comparing sections 11902, 11904 with sections 11802, 11804 of FIG. 119, it is clear that the energy transfer in sections 11902, 11904 is not as symmetrical near the power supply rails as that of sections 11802, 11804. This is evidence that the EM signal 11704 is partially pinching off single FET 11712 over part of the signal 11704 trace. This results in a down-converted signal 11706 that has more high frequency noise when compared to down-converted signal 11610, and has a substantial negative DC voltage component.

In summary, down-converted signal 11706 reflects distortion introduced by a relatively large EM signal that is pinching-off the single FET 11712 in aliasing module 11702. Down-converted signal 11610 that is produced by aliasing module 11602 is relatively distortion free. This occurs because the complementary FET configuration in aliasing module 11602 is able to handle input signals with large amplitudes without introducing distortion in the down-converted signal 11610. Therefore, the complementary FET configuration in the aliasing module 11602 offers improved dynamic range when compared with the single FET configuration of the aliasing module 11702.

5.4 Optimized Switch Structures 5.4.1 Splitter in CMOS

FIG. 124A illustrates an embodiment of a splitter circuit 12400 implemented in CMOS. This embodiment is provided for illustrative purposes, and is not limiting. In an embodiment, splitter circuit 12400 is used to split a local oscillator (LO) signal into two oscillating signals that are approximately 90.degree. out of phase. The first oscillating signal is called the I-channel oscillating signal. The second oscillating signal is called the Q-channel oscillating signal. The Q-channel oscillating signal lags the phase of the I-channel oscillating signal by approximately 900. Splitter circuit 12400 includes a first I-channel inverter 12402, a second I-channel inverter 12404, a third I-channel inverter 12406, a first Q-channel inverter 12408, a second Q-channel inverter 12410, an I-channel flip-flop 12412, and a Q-channel flip-flop 12414.

Figure 124F:
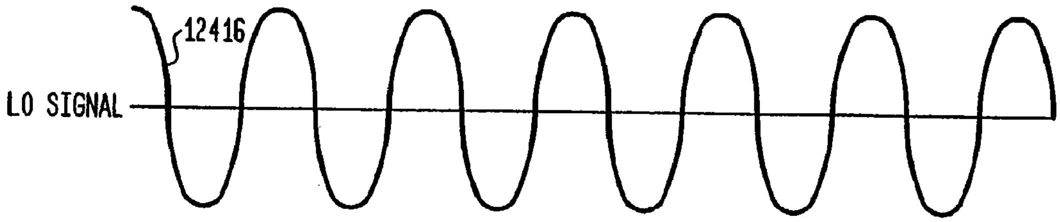
Figure 124G:
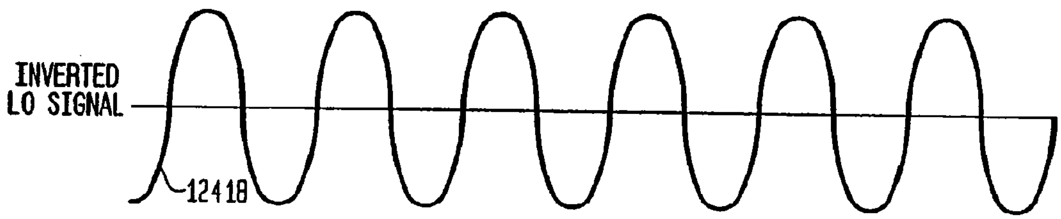
Figure 124H:
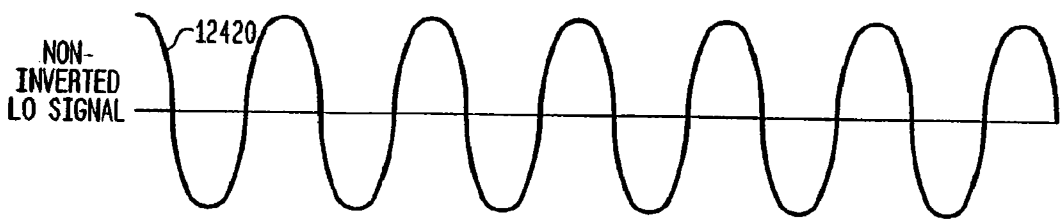

FIGS. 124F-J are example waveforms used to illustrate signal relationships of splitter circuit 12400. The waveforms shown in FIGS. 124F-J reflect ideal delay times through splitter circuit 12400 components. LO signal 12416 is shown in FIG. 124F. First, second, and third I-channel inverters 12402, 12404, and 12406 invert LO signal 12416 three times, outputting inverted LO signal 12418, as shown in FIG. 124G. First and second Q-channel inverters 12408 and 12410 invert LO signal 12416 twice, outputting non-inverted LO signal 12420, as shown in FIG. 124H. The delay through first, second, and third I-channel inverters 12402, 12404, and 12406 is substantially equal to that through first and second Q-channel inverters 12408 and 12410, so that inverted LO signal 12418 and non-inverted LO signal 12420 are approximately 180.degree. out of phase. The operating characteristics of the inverters may be tailored to achieve the proper delay amounts, as would be understood by persons skilled in the relevant art(s).

Figure 124I:
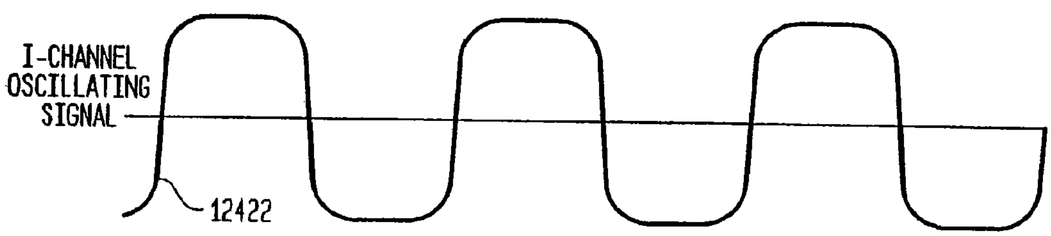
Figure 124J:
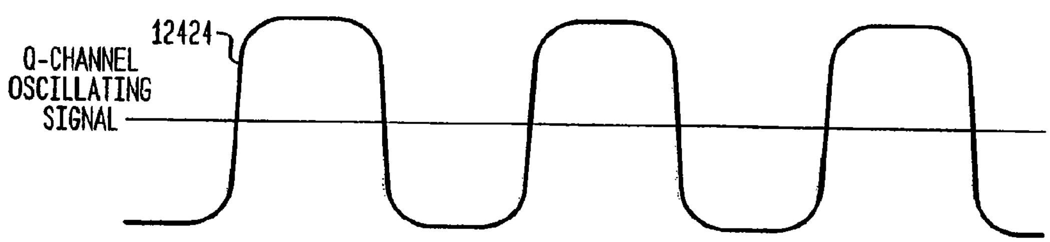

I-channel flip-flop 12412 inputs inverted LO signal 12418. Q-channel flip-flop 12414 inputs non-inverted LO signal 12420. In the current embodiment, I-channel flip-flop 12412 and Q-channel flip-flop 12414 are edge-triggered flip-flops. When either flip-flop receives a rising edge on its input, the flip-flop output changes state. Hence, I-channel flip-flop 12412 and Q-channel flip-flop 12414 each output signals that are approximately half of the input signal frequency. Additionally, as would be recognized by persons skilled in the relevant art(s), because the inputs to I-channel flip-flop 12412 and Q-channel flip-flop 12414 are approximately 180.degree. out of phase, their resulting outputs are signals that are approximately 90.degree. out of phase. I-channel flip-flop 12412 outputs I-channel oscillating signal 12422, as shown in FIG. 124I. Q-channel flip-flop 12414 outputs Q-channel oscillating signal 12424, as shown in FIG. 124J. Q-channel oscillating signal 12424 lags the phase of I-channel oscillating signal 12422 by 90.degree., also as shown in a comparison of FIGS. 124I and 124J.

FIG. 124B illustrates a more detailed circuit embodiment of the splitter circuit 12400 of FIG. 124. The circuit blocks of FIG. 124B that are similar to those of FIG. 124A are indicated by corresponding reference numbers. FIGS. 124C-D show example output waveforms relating to the splitter circuit 12400 of FIG. 124B. FIG. 124C shows I-channel oscillating signal 12422. FIG. 124D shows Q-channel oscillating signal 12424. As is indicated by a comparison of FIGS. 124C and 124D, the waveform of Q-channel oscillating signal 12424 of FIG. 124D lags the waveform of I-channel oscillating signal 12422 of FIG. 124C by approximately 90.degree.

It should be understood that the illustration of the splitter circuit 12400 in FIGS. 124A and 124B is for example purposes only. Splitter circuit 12400 may be comprised of an assortment of logic and semiconductor devices of a variety of types, as will be apparent to persons skilled in the relevant art(s) based on the discussion contained herein.

5.4.2 I/Q Circuit

FIG. 124E illustrates an example embodiment of a complete I/Q circuit 12426 in CMOS. I/Q circuit 12426 includes a splitter circuit 12400 as described in detail above. Further description regarding I/Q circuit implementations are provided herein, including the applications referenced above.

5.5 Example I and Q Implementations 5.5.1 Switches of Different Sizes

In an embodiment, the switch modules discussed herein can be implemented as a series of switches operating in parallel as a single switch. The series of switches can be transistors, such as, for example, field effect transistors (FET), bi-polar transistors, or any other suitable circuit switching devices. The series of switches can be comprised of one type of switching device, or a combination of different switching devices.

For example, FIG. 125 illustrates a switch module 12500. In FIG. 125, the switch module is illustrated as a series of FETs 12502*a-n*. The FETs 12502*a-n* can be any type of FET, including, but not limited to, a MOSFET, a JFET, a GaAsFET, etc. Each of FETs 12502*a-n* includes a gate 12504*a-n*, a source 12506*a-n*, and a drain 12508*a-n*, similarly to that of FET 2802 of FIG. 28A. The series of FETs 12502*a-n* operate in parallel. Gates 12504*a-n* are coupled together, sources 12506*a-n* are coupled together, and drains 12508*a-n* are coupled together. Each of gates 12504*a-n* receives the control signal 1604, 8210 to control the switching action between corresponding sources 12506*a-n* and drains 12508*a-n*. Generally, the corresponding sources 12506*a-n* and drains 12508*a-n* of each of FETs 12502*a-n* are interchangeable. There is no numerical limit to the number of FETs. Any limitation would depend on the particular application, and the "a-n" designation is not meant to suggest a limit in any way.

In an embodiment, FETs 12502*a-n* have similar characteristics. In another embodiment, one or more of FETs 12502*a-n* have different characteristics than the other FETs. For example, FETs 12502*a-n* may be of different sizes. In CMOS, generally, the larger size a switch is (meaning the larger the area under the gate between the source and drain regions), the longer it takes for the switch to turn on. The longer turn on time is due in part to a higher gate to channel capacitance that exists in larger switches. Smaller CMOS switches turn on in less time, but have a higher channel resistance. Larger CMOS switches have lower channel resistance relative to smaller CMOS switches. Different turn on characteristics for different size switches provides flexibility in designing an overall switch module structure. By combining smaller switches with larger switches, the channel conductance of the overall switch structure can be tailored to satisfy given requirements.

In an embodiment, FETs 12502*a-n* are CMOS switches of different relative sizes. For example, FET 12502*a* may be a switch with a smaller size relative to FETs 12502*b-n*. FET 12502*b* may be a switch with a larger size relative to FET 12502*a*, but smaller size relative to FETs 12502*c-n*. The sizes of FETs 12502*c-n* also may be varied relative to each other. For instance, progressively larger switch sizes may be used. By varying the sizes of FETs 12502*a-n* relative to each other, the turn on characteristic curve of the switch module can be correspondingly varied. For instance, the turn on characteristic of the switch module can be tailored such that it more closely approaches that of an ideal switch. Alternately, the switch module could be tailored to produce a shaped conductive curve.

By configuring FETs 12502*a-n* such that one or more of them are of a relatively smaller size, their faster turn on characteristic can improve the overall switch module turn on characteristic curve. Because smaller switches have a lower gate to channel capacitance, they can turn on more rapidly than larger switches.

By configuring FETs 12502*a-n* such that one or more of them are of a relatively larger size, their lower channel resistance also can improve the overall switch module turn on characteristics. Because larger switches have a lower channel resistance, they can provide the overall switch structure with a lower channel resistance, even when combined with smaller switches. This improves the overall switch structure's ability to drive a wider range of loads. Accordingly, the ability to tailor switch sizes relative to each other in the overall switch structure allows for overall switch structure operation to more nearly approach ideal, or to achieve application specific requirements, or to balance trade-offs to achieve specific goals, as will be understood by persons skilled in the relevant arts(s) from the teachings herein.

It should be understood that the illustration of the switch module as a series of FETs 12502*a-n* in FIG. 125 is for example purposes only. Any device having switching capabilities could be used to implement the switch module (e.g., switch modules 2802, 2702, 2404 and 2406), as will be apparent to persons skilled in the relevant art(s) based on the discussion contained herein.

5.5.2 Reducing Overall Switch Area

Circuit performance also can be improved by reducing overall switch area. As discussed above, smaller switches (i.e., smaller area under the gate between the source and drain regions) have a lower gate to channel capacitance relative to larger switches. The lower gate to channel capacitance allows for lower circuit sensitivity to noise spikes. FIG. 126A illustrates an embodiment of a switch module, with a large overall switch area. The switch module of FIG. 126A includes twenty FETs 12602-12640. As shown, FETs 12602-12640 are the same size ("Wd" and "lng" parameters are equal). Input source 12646 produces the input EM signal. Pulse generator 12648 produces the energy transfer signal for FETs 12602-12640. Capacitor C1 is the storage element for the input signal being sampled by FETs 12602-12640. FIGS. 126B-126Q illustrate example waveforms related to the switch module of FIG. 126A. FIG. 126B shows a received 1.01 GHz EM signal to be sampled and downconverted to a 10 MHZ intermediate frequency signal. FIG. 126C shows an energy transfer signal having an aliasing rate of 200 MHZ, which is applied to the gate of each of the twenty FETs 12602-12640. The energy transfer signal includes a train of energy transfer pulses having non-negligible apertures that tend away from zero time in duration. The energy transfer pulses repeat at the aliasing rate. FIG. 126D illustrates the affected received EM signal, showing effects of transferring energy at the aliasing rate, at point 12642 of FIG. 126A. FIG. 126E illustrates a down-converted signal at point 12644 of FIG. 126A, which is generated by the down-conversion process.

FIG. 126F illustrates the frequency spectrum of the received 1.01 GHz EM signal. FIG. 126G illustrates the frequency spectrum of the received energy transfer signal. FIG. 126H illustrates the frequency spectrum of the affected received EM signal at point 12642 of FIG. 126A. FIG. 126I illustrates the frequency spectrum of the down-converted signal at point 12644 of FIG. 126A.

FIGS. 126J-126M respectively further illustrate the frequency spectrums of the received 1.01 GHz EM signal, the received energy transfer signal, the affected received EM signal at point 12642 of FIG. 126A, and the down-converted signal at point 12644 of FIG. 126A, focusing on a narrower frequency range centered on 1.00 GHz. As shown in FIG. 126L, a noise spike exists at approximately 1.0 GHz on the affected received EM signal at point 12642 of FIG. 126A.

This noise spike may be radiated by the circuit, causing interference at 1.0 GHz to nearby receivers.

FIGS. 126N-126Q respectively illustrate the frequency spectrums of the received 1.01 GHz EM signal, the received energy transfer signal, the affected received EM signal at point 12642 of FIG. 126A, and the down-converted signal at point 12644 of FIG. 126A, focusing on a narrow frequency range centered near 10.0 MHZ. In particular, FIG. 126Q shows that an approximately 5 mV signal was downconverted at approximately 10 MHZ.

FIG. 127A illustrates an alternative embodiment of the switch module, this time with fourteen FETs 12702-12728 shown, rather than twenty FETs 12602-12640 as shown in FIG. 126A. Additionally, the FETs are of various sizes (some "Wd" and "lng" parameters are different between FETs).

FIGS. 127B-127Q, which are example waveforms related to the switch module of FIG. 127A, correspond to the similarly designated figures of FIGS. 126B-126Q. As FIG. 127L shows, a lower level noise spike exists at 1.0 GHz than at the same frequency of FIG. 126L. This correlates to lower levels of circuit radiation. Additionally, as FIG. 127Q shows, the lower level noise spike at 1.0 GHz was achieved with no loss in conversion efficiency. This is represented in FIG. 127Q by the approximately 5 mV signal downconverted at approximately 10 MHZ. This voltage is substantially equal to the level downconverted by the circuit of FIG. 126A. In effect, by decreasing the number of switches, which decreases overall switch area, and by reducing switch area on a switch-by-switch basis, circuit parasitic capacitance can be reduced, as would be understood by persons skilled in the relevant art(s) from the teachings herein. In particular this may reduce overall gate to channel capacitance, leading to lower amplitude noise spikes and reduced unwanted circuit radiation.

It should be understood that the illustration of the switches above as FETs in FIGS. 126A-126Q and 127A-127Q is for example purposes only. Any device having switching capabilities could be used to implement the switch module, as will be apparent to persons skilled in the relevant art(s) based on the discussion contained herein.

5.5.3 Charge Injection Cancellation

In embodiments wherein the switch modules discussed herein are comprised of a series of switches in parallel, in some instances it may be desirable to minimize the effects of charge injection. Minimizing charge injection is generally desirable in order to reduce the unwanted circuit radiation resulting therefrom. In an embodiment, unwanted charge injection effects can be reduced through the use of complementary re-channel MOSFETs and p-channel MOSFETs. N-channel MOSFETs and p-channel MOSFETs both suffer from charge injection. However, because signals of opposite polarity are applied to their respective gates to turn the switches on and off, the resulting charge injection is of opposite polarity. Resultingly, n-channel MOSFETs and p-channel MOSFETs may be paired to cancel their corresponding charge injection. Hence, in an embodiment, the switch module may be comprised of n-channel MOSFETs and p-channel MOSFETS, wherein the members of each are sized to minimize the undesired effects of charge injection.

FIG. 129A illustrates an alternative embodiment of the switch module, this time with fourteen n-channel FETs 12902-12928 and twelve p-channel FETs 12930-12952 shown, rather than twenty FETs 12602-12640 as shown in FIG. 126A. The re-channel and p-channel FETs are arranged in a complementary configuration. Additionally, the FETs are of various sizes (some "Wd" and "lng" parameters are different between FETs).

FIGS. 129B-129Q, which are example waveforms related to the switch module of FIG. 129A, correspond to the similarly designated figures of FIGS. 126B-126Q. As FIG. 129L shows, a lower level noise spike exists at 1.0 GHz than at the same frequency of FIG. 126L. This correlates to lower levels of circuit radiation. Additionally, as FIG. 129Q shows, the lower level noise spike at 1.0 GHz was achieved with no loss in conversion efficiency. This is represented in FIG. 129Q by the approximately 5 mV signal downconverted at approximately 10 MHZ. This voltage is substantially equal to the level downconverted by the circuit of FIG. 126A. In effect, by arranging the switches in a complementary configuration, which assists in reducing charge injection, and by tailoring switch area on a switch-by-switch basis, the effects of charge injection can be reduced, as would be understood by persons skilled in the relevant art(s) from the teachings herein. In particular this leads to lower amplitude noise spikes and reduced unwanted circuit radiation.

It should be understood that the use of FETs in FIGS. 129A-129Q in the above description is for example purposes only. From the teachings herein, it would be apparent to persons of skill in the relevant art(s) to manage charge injection in various transistor technologies using transistor pairs.

5.5.4 Overlapped Capacitance

The processes involved in fabricating semiconductor circuits, such as MOSFETs, have limitations. In some instances, these process limitations may lead to circuits that do not function as ideally as desired. For instance, a non-ideally fabricated MOSFET may suffer from parasitic capacitances, which in some cases may cause the surrounding circuit to radiate noise. By fabricating circuits with structure layouts as close to ideal as possible, problems of non-ideal circuit operation can be minimized.

FIG. 128A illustrates a cross-section of an example n-channel enhancement-mode MOSFET 12800, with ideally shaped n+ regions. MOSFET 12800 includes a gate 12802, a channel region 12804, a source contact 12806, a source region 12808, a drain contact 12810, a drain region 12812, and an insulator 12814. Source region 12808 and drain region 12812 are separated by p-type material of channel region 12804. Source region 12808 and drain region 12812 are shown to be n+ material. The n+ material is typically implanted in the p-type material of channel region 12804 by an ion implantation/diffusion process. Ion implantation/diffusion processes are well known by persons skilled in the relevant art(s). Insulator 12814 insulates gate 12802 which bridges over the p-type material. Insulator 12814 generally comprises a metal-oxide insulator. The channel current between source region 12808 and drain region 12812 for MOSFET 12800 is controlled by a voltage at gate 12802.

Operation of MOSFET 12800 shall now be described. When a positive voltage is applied to gate 12802, electrons in the p-type material of channel region 12804 are attracted to the surface below insulator 12814, forming a connecting near-surface region of n-type material between the source and the drain, called a channel. The larger or more positive the voltage between the gate contact 12806 and source region 12808, the lower the resistance across the region between.

In FIG. 128A, source region 12808 and drain region 12812 are illustrated as having n+ regions that were formed into idealized rectangular regions by the ion implantation process. FIG. 128B illustrates a cross-section of an example n-channel enhancement-mode MOSFET 12816 with non-ideally shaped n+ regions. Source region 12820 and drain region 12822 are illustrated as being formed into irregularly shaped regions by the ion implantation process. Due to uncertainties in the ion implantation/diffusion process, in practical applications, source region 12820 and drain region 12822 do not form rectangular regions as shown in FIG. 128A. FIG. 128B shows source region 12820 and drain region 12822 forming exemplary irregular regions. Due to these process uncertainties, the n+ regions of source region 12820 and drain region 12822 also may diffuse further than desired into the p-type region of channel region 12818, extending underneath gate 12802 The extension of the source region 12820 and drain region 12822 underneath gate 12802 is shown as source overlap 12824 and drain overlap 12826. Source overlap 12824 and drain overlap 12826 are further illustrated in FIG. 128C. FIG. 128C illustrates a top-level view of an example layout configuration for MOSFET 12816. Source overlap 12824 and drain overlap 12826 may lead to unwanted parasitic capacitances between source region 12820 and gate 12802, and between drain region 12822 and gate 12802. These unwanted parasitic capacitances may interfere with circuit function. For instance, the resulting parasitic capacitances may produce noise spikes that are radiated by the circuit, causing unwanted electromagnetic interference.

As shown in FIG. 128C, an example MOSFET 12816 may include a gate pad 12828. Gate 12802 may include a gate extension 12830, and a gate pad extension 12832. Gate extension 12830 is an unused portion of gate 12802 required due to metal implantation process tolerance limitations. Gate pad extension 12832 is a portion of gate 12802 used to couple gate 12802 to gate pad 12828. The contact required for gate pad 12828 requires gate pad extension 12832 to be of non-zero length to separate the resulting contact from the area between source region 12820 and drain region 12822. This prevents gate 12802 from shorting to the channel between source region 12820 and drain region 12822 (insulator 12814 of FIG. 128B is very thin in this region). Unwanted parasitic capacitances may form between gate extension 12830 and the substrate (FET 12816 is fabricated on a substrate), and between gate pad extension 12832 and the substrate. By reducing the respective areas of gate extension 12830 and gate pad extension 12832, the parasitic capacitances resulting therefrom can be reduced. Accordingly, embodiments address the issues of uncertainty in the ion implantation/diffusion process it will be obvious to persons skilled in the relevant art(s) how to decrease the areas of gate extension 12830 and gate pad extension 12832 in order to reduce the resulting parasitic capacitances.

It should be understood that the illustration of the n-channel enhancement-mode MOSFET is for example purposes only. The present invention is applicable to depletion mode MOSFETs, and other transistor types, as will be apparent to persons skilled in the relevant art(s) based on the discussion contained herein.

5.6 Other Implementations

The implementations described above are provided for purposes of illustration. These implementations are not intended to limit the invention. Alternate implementations, differing slightly or substantially from those described herein, will be apparent to persons skilled in the relevant art(s) based on the teachings contained herein. Such alternate implementations fall within the scope and spirit of the present invention.

6. Optional Optimizations of Energy Transfer at an Aliasing Rate

The methods and systems described in sections above can be optimized with one or more of the optimization methods or systems described below.

6.1 Doubling the Aliasing Rate ($F_{AR}$) of the Energy Transfer Signal

In an embodiment, the optional energy transfer signal module 6902 in FIG. 69 includes a pulse generator module that generates aliasing pulses at twice the frequency of the oscillating source. The input signal 6828 may be any suitable oscillating source.

Figure 71:
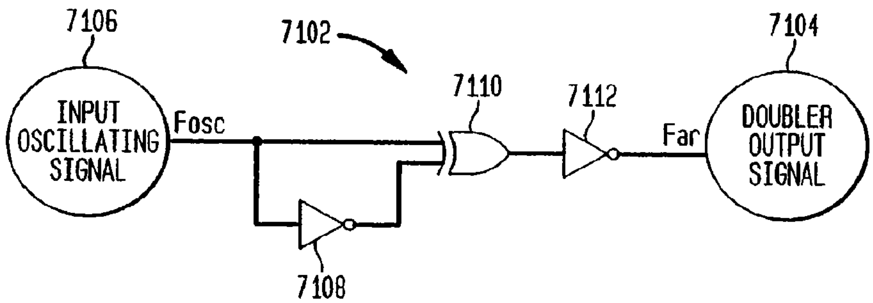
FIG. 71 illustrates an example pulse generator.
Figure 72A:
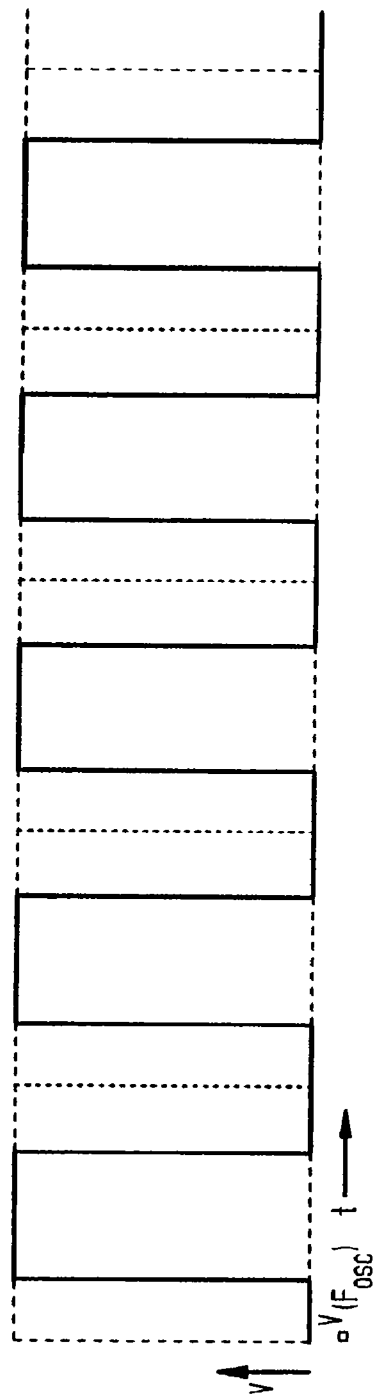
FIGS. 72A and 72B illustrate example waveforms related to the pulse generator of FIG. 71.
Figure 72B:
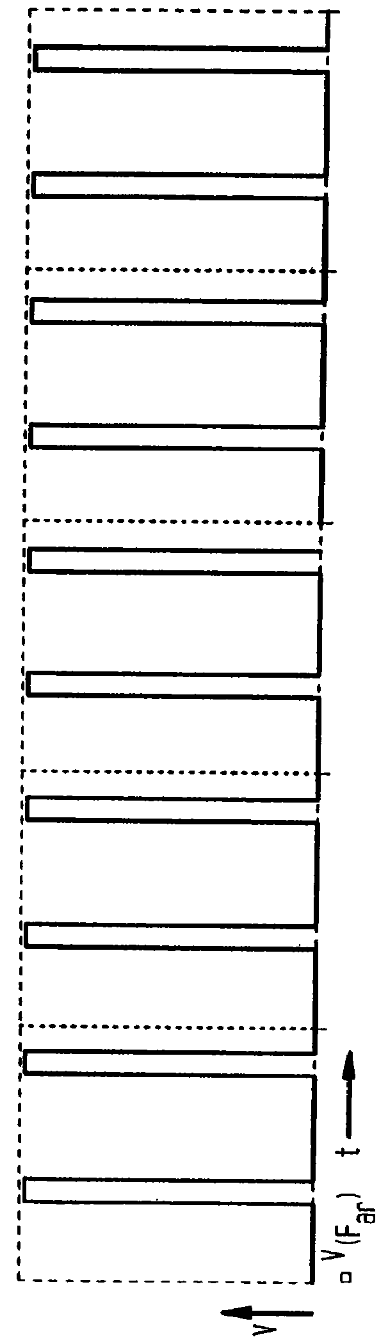

FIG. 71 illustrates a circuit 7102 that generates a doubler output signal 7104 (FIG. 72B) that may be used as an energy transfer signal 6306. The circuit 7102 generates pulses on both rising and falling edges of the input oscillating signal 7106 of FIG. 72A. The circuit 7102 can be implemented as a pulse generator and aliasing rate ($F_{AR}$) doubler. The doubler output signal 7104 can be used as the energy transfer signal 6306.

In the example of FIG. 71, the aliasing rate is twice the frequency of the input oscillating signal $F_{OSC}$ 7106, as shown by EQ. (9) below.

$$F_{AR}=2*F_{OSC} \qquad \text{EQ. (9)}$$

The aperture width of the aliasing pulses is determined by the delay through a first inverter 7108 of FIG. 71. As the delay is increased, the aperture is increased. A second inverter 7112 is shown to maintain polarity consistency with examples described elsewhere. In an alternate embodiment inverter 7112 is omitted. Preferably, the pulses have non-negligible aperture widths that tend away from zero time. The doubler output signal 7104 may be further conditioned as appropriate to drive the switch module with non-negligible aperture pulses. The circuit 7102 may be implemented with integrated circuitry, discretely, with equivalent logic circuitry, or with any valid fabrication technology.

6.2 Differential Implementations

The invention can be implemented in a variety of differential configurations. Differential configurations are useful for reducing common mode noise. This can be very useful in receiver systems where common mode interference can be caused by intentional or unintentional radiators such as cellular phones, CB radios, electrical appliances etc. Differential configurations are also useful in reducing any common mode noise due to charge injection of the switch in the switch module or due to the design and layout of the system in which the invention is used. Any spurious signal that is induced in equal magnitude and equal phase in both input leads of the invention will be substantially reduced or eliminated. Some differential configurations, including some of the configurations below, are also useful for increasing the voltage and/or for increasing the power of the down-converted signal 1308B.

Differential systems are most effective when used with a differential front end (inputs) and a differential back end (outputs). They can also be utilized in the following configurations, for example:

a) A single-input front end and a differential back end; and b) A differential front end and a single-output back end.

Examples of these system are provided below, with a first example illustrating a specific method by which energy is transferred from the input to the output differentially.

While an example of a differential energy transfer module is shown below, the example is shown for the purpose of illustration, not limitation. Alternate embodiments (including equivalents, extensions, variations, deviations etc.) of the embodiment described herein will be apparent to those skilled in the relevant art based on the teachings contained herein. The invention is intended and adapted to include such alternate embodiments.

6.2.1 An Example Illustrating Energy Transfer Differentially

Figure 76A:
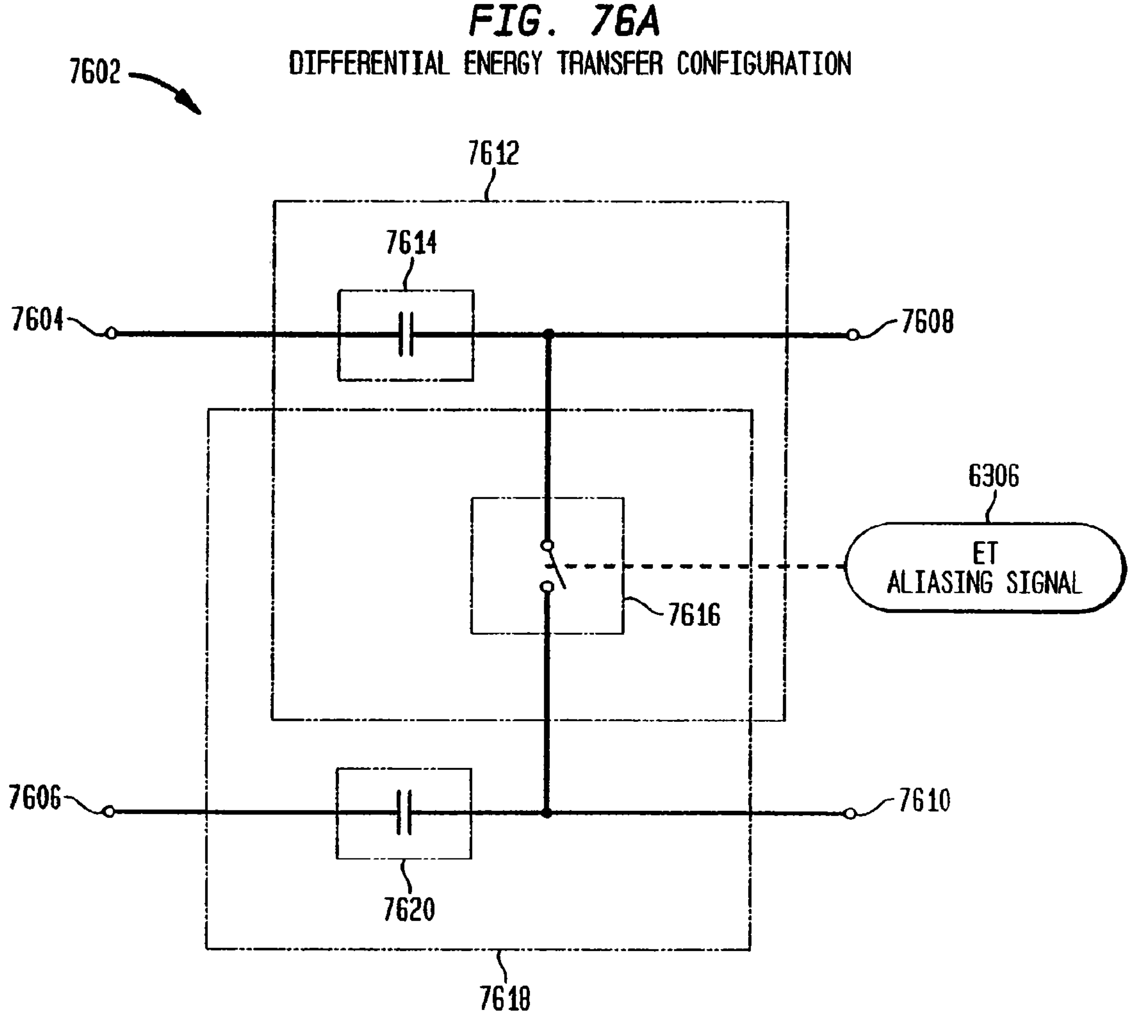
FIGS. 76A-E illustrate energy transfer modules in configured in various differential configurations according to embodiments of the invention.

FIG. 76A illustrates a differential system 7602 that can be included in the energy transfer module 6304. The differential system 7602 includes an inverted gated transfer design similar to that described with reference to FIG. 74. The differential system 7602 includes inputs 7604 and 7606 and outputs 7608 and 7610. The differential system 7602 includes a first inverted gated transfer module 7612, which includes a storage module 7614 and a switch module 7616. The differential system 7602 also includes a second inverted gated transfer module 7618, which includes a storage module 7620 and a switch module 7616, which it shares in common with inverted gated transfer module 7612.

One or both of the inputs 7604 and 7606 are coupled to an EM signal source. For example, the inputs can be coupled to an EM signal source, wherein the input voltages at the inputs 7604 and 7606 are substantially equal in amplitude but 180 degrees out of phase with one another. Alternatively, where dual inputs are unavailable, one of the inputs 7604 and 7606 can be coupled to ground.

In operation, when the switch module 7616 is closed, the storage modules 7614 and 7620 are in series and, provided they have similar capacitive values, accumulate charge of equal magnitude but opposite polarities. When the switch module 7616 is open, the voltage at the output 7608 is relative to the input 7604, and the voltage at the output 7610 is relative to the voltage at the input 7606.

Portions of the signals at the outputs 7608 and 7610 include signals resulting from energy stored in the storage modules 7614 and 7620, respectively, when the switch module 7616 was closed. The portions of the signals at the outputs 7608 and 7610 resulting from the stored charge are generally equal in amplitude to one another but 180 degrees out of phase.

Portions of the signals at the outputs 7608 and 7610 also include ripple voltage or noise resulting from the switching action of the switch module 7616. But because the switch module is positioned between the two outputs 7608 and 7610, the noise introduced by the switch module appears at the outputs as substantially equal and in-phase with one another. As a result, the ripple voltage can be substantially canceled out by inverting the signal at one of the outputs 7608 or 7610 and adding it to the other remaining output. Additionally, any noise that is impressed with equal amplitude and equal phase onto the input terminals 7604 and 7606 by any other noise sources will tend to be canceled in the same way.

6.2.1.1 Differential Input-to-Differential Output

Figure 76B:
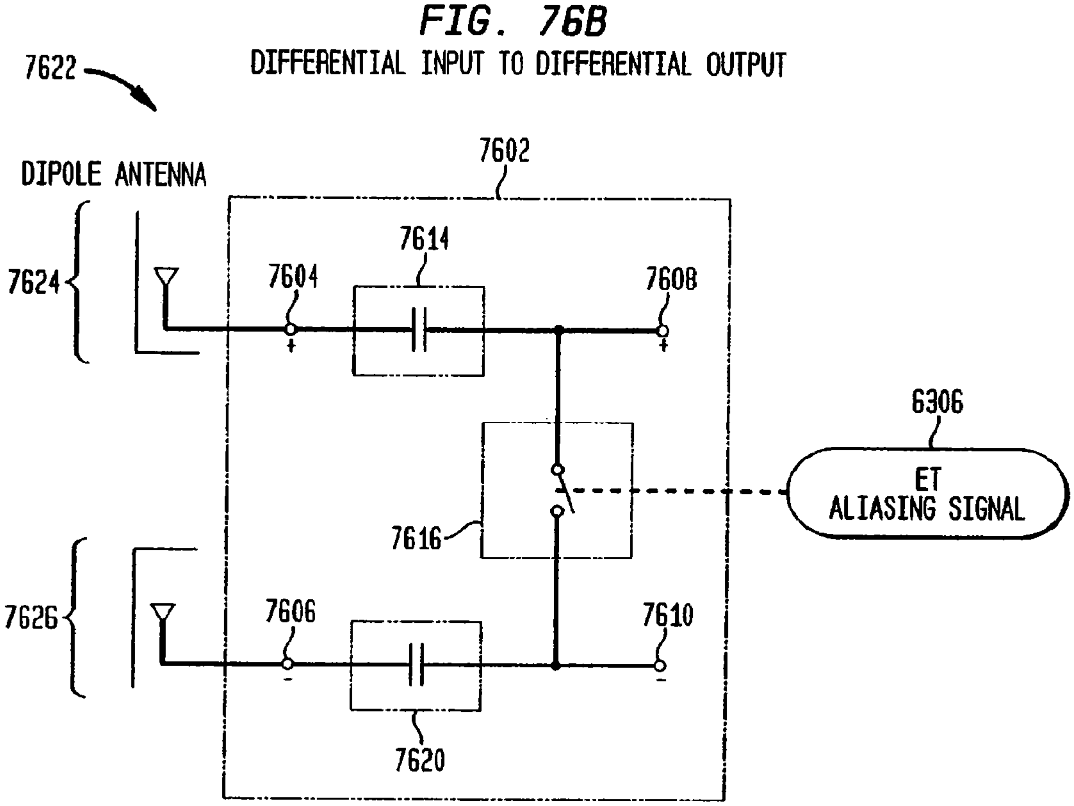

FIG. 76B illustrates the differential system 7602 wherein the inputs 7604 and 7606 are coupled to equal and opposite EM signal sources, illustrated here as dipole antennas 7624 and 7626. In this embodiment, when one of the outputs 7608 or 7610 is inverted and added to the other output, the common mode noise due to the switching module 7616 and other common mode noise present at the input terminals 7604 and 7606 tend to substantially cancel out.

6.2.1.2 Single Input-to-Differential Output

Figure 76C:
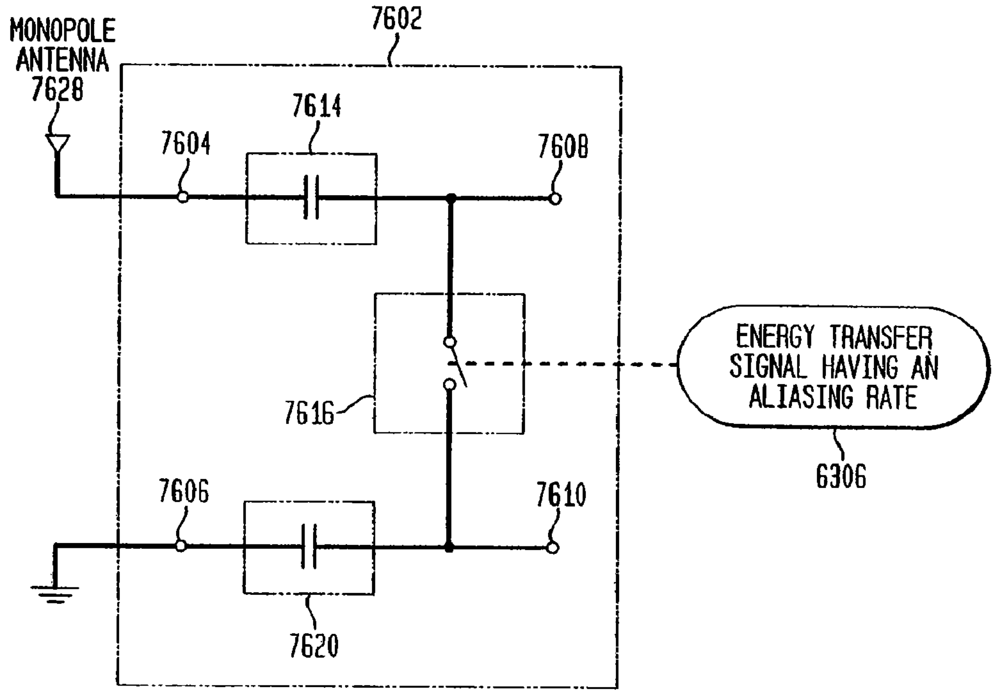

FIG. 76C illustrates the differential system 7602 wherein the input 7604 is coupled to an EM signal source such as a monopole antenna 7628 and the input 7606 is coupled to ground. In this configuration, the voltages at the outputs 7608 and 7610 are approximately one half the value of the voltages at the outputs in the implementation illustrated in FIG. 76B, given all other parameters are equal.

Figure 76D:
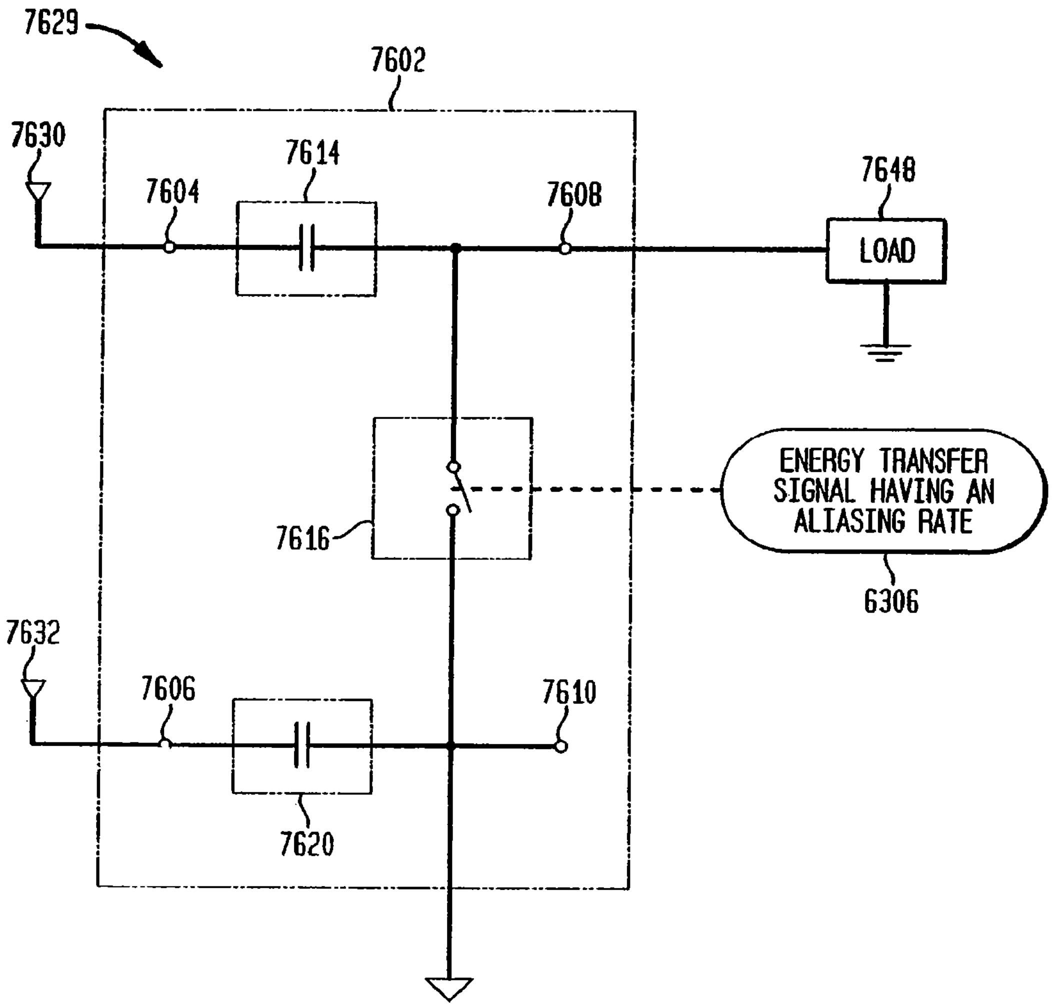
Figure 76E:
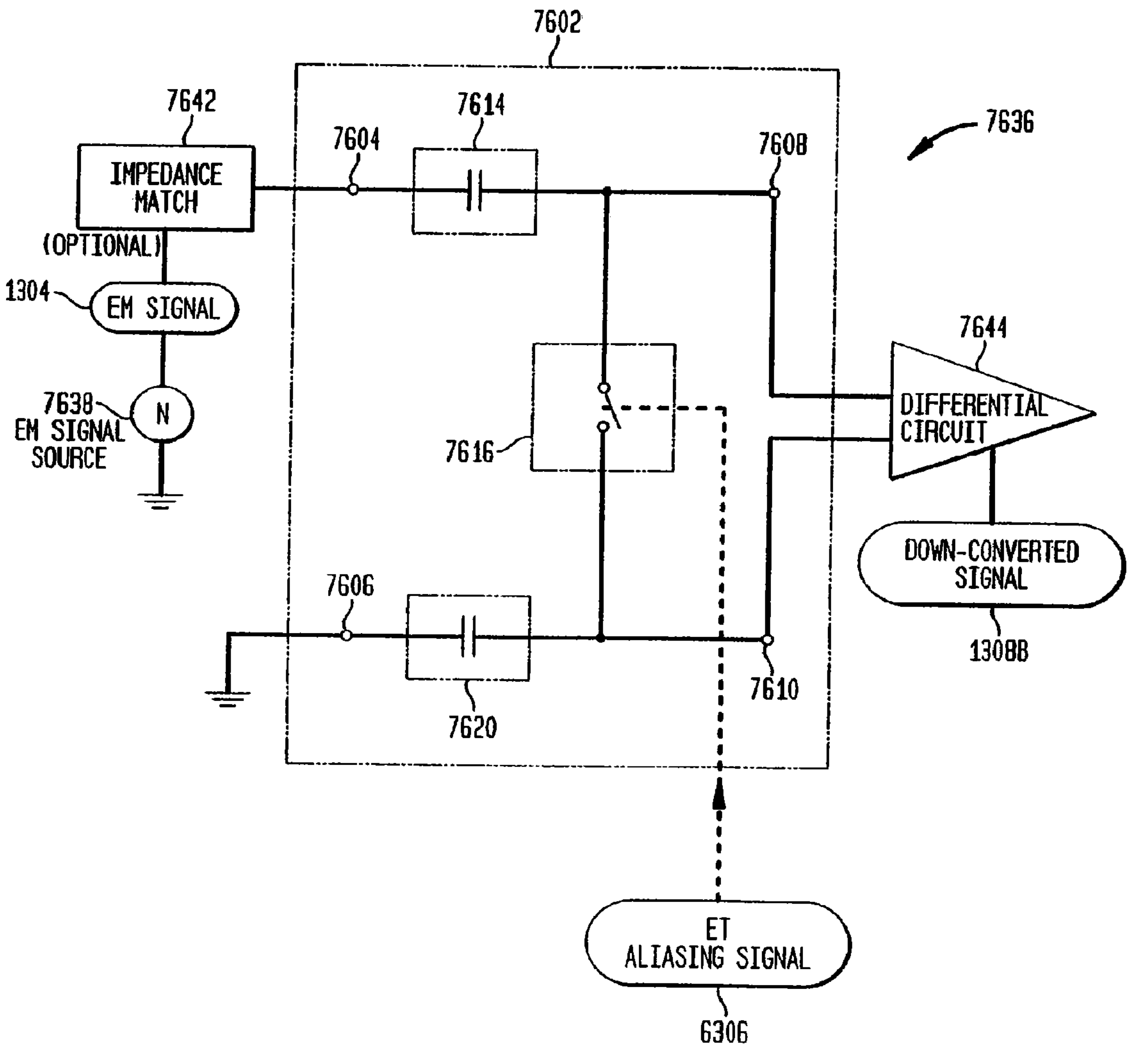
Figure 77A:
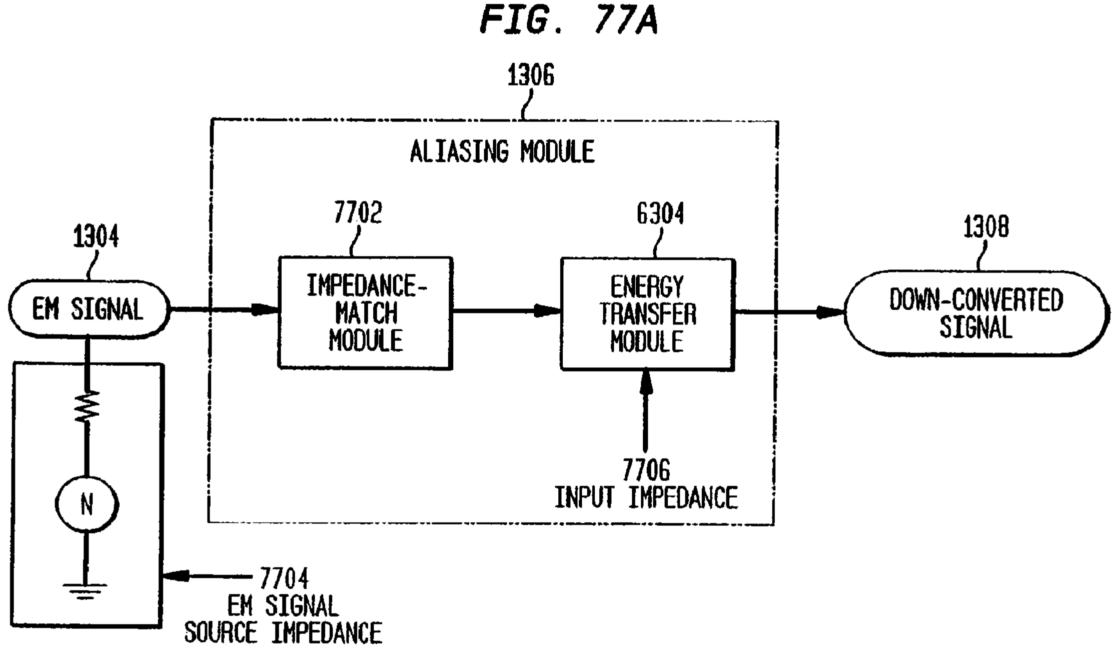
FIGS. 77A-C illustrate example impedance matching circuits according to embodiments of the invention.
Figure 77B:
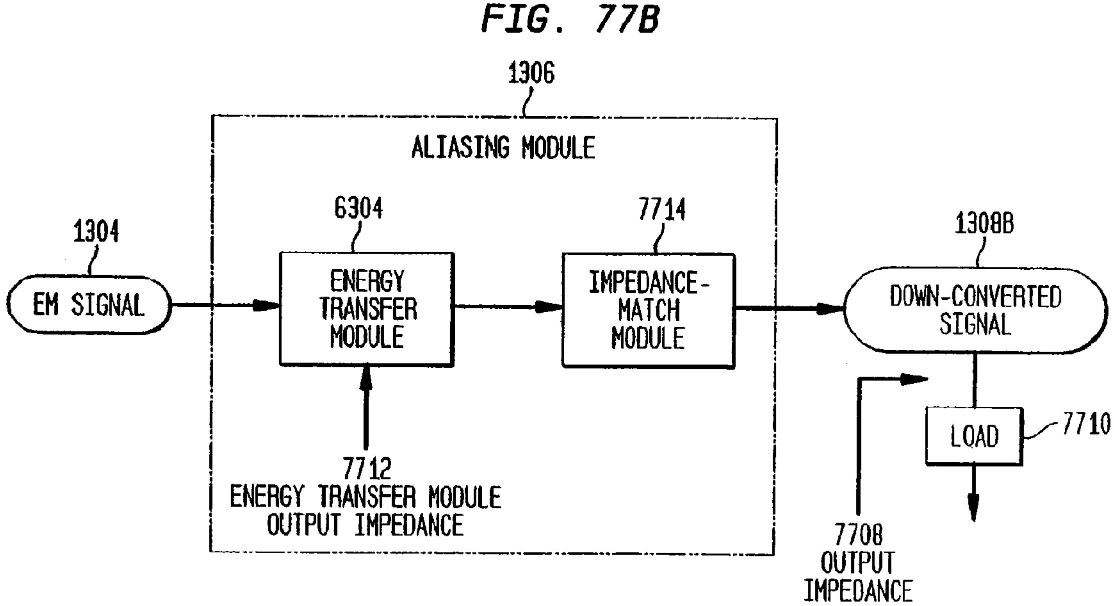
Figure 77C:
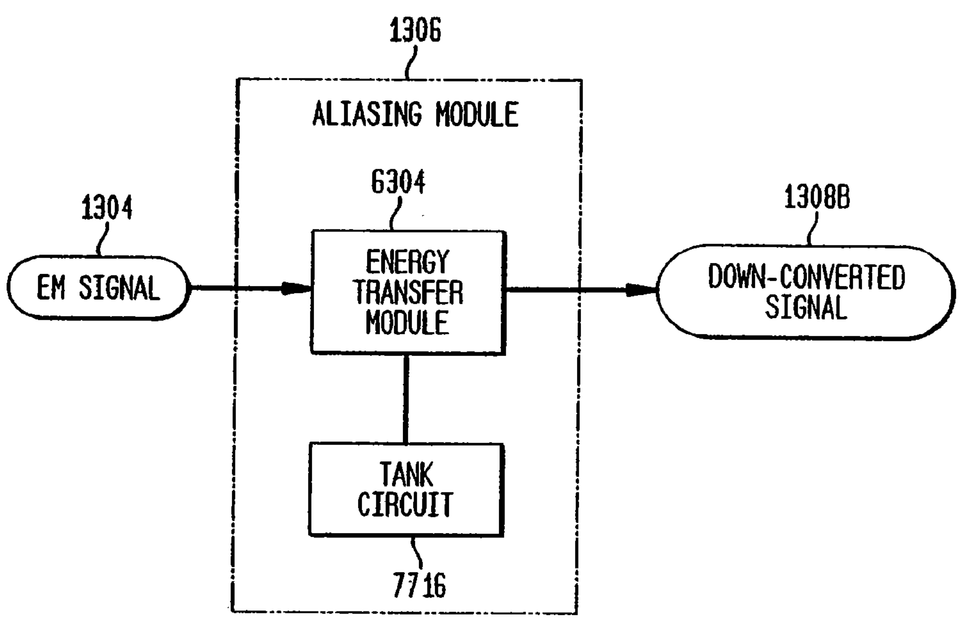

FIG. 76E illustrates an example single input to differential output receiver/down-converter system 7636. The system 7636 includes the differential system 7602 wherein the input 7606 is coupled to ground as in FIG. 76C. The input 7604 is coupled to an EM signal source 7638 through an optional input impedance match 7642. The EM signal source impedance can be matched with an impedance match system 7642 as described in section 5 below.

The outputs 7608 and 7610 are coupled to a differential circuit 7644 such as a filter, which preferably inverts one of the outputs 7608 or 7610 and adds it to the other output 7608 or 7610. This substantially cancels common mode noise generated by the switch module 7616. The differential circuit 7644 preferably filters the higher frequency components of the EM signal 1304 that pass through the storage modules 7614 and 7620. The resultant filtered signal is output as the down-converted signal 1308B.

6.2.1.3 Differential Input-to-Single Output

FIG. 76D illustrates the differential input to single output system 7629 wherein the inputs 7604 and 7606 of the differential system 7602 are coupled to equal and opposite EM signal dipole antennas 7630 and 7632. In system 7629, the common mode noise voltages are not canceled as in systems shown above. The output is coupled from terminal 7608 to a load 7648.

6.2.2 Specific Alternative Embodiments

Figure 99:
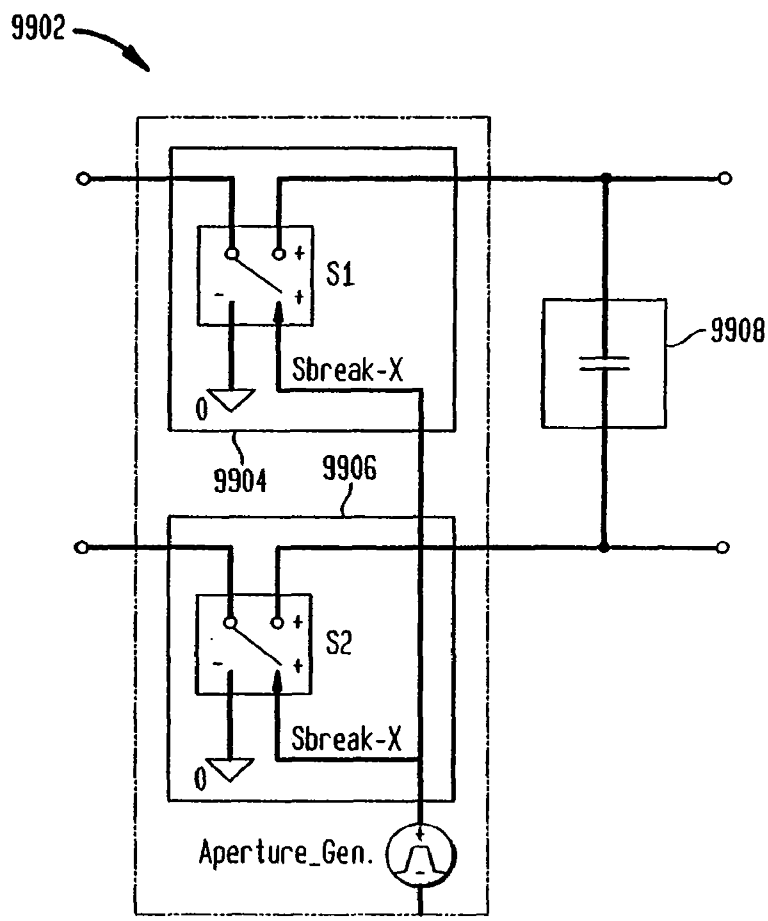

In specific alternative embodiments, the present invention is implemented using a plurality of gated transfer modules controlled by a common energy transfer signal with a storage module coupled between the outputs of the plurality of gated transfer modules. For example, FIG. 99 illustrates a differential system 9902 that includes first and second gated transfer modules 9904 and 9906, and a storage module 9908 coupled between. Operation of the differential system 9902 will be apparent to one skilled in the relevant art(s), based on the description herein.

Figure 100:
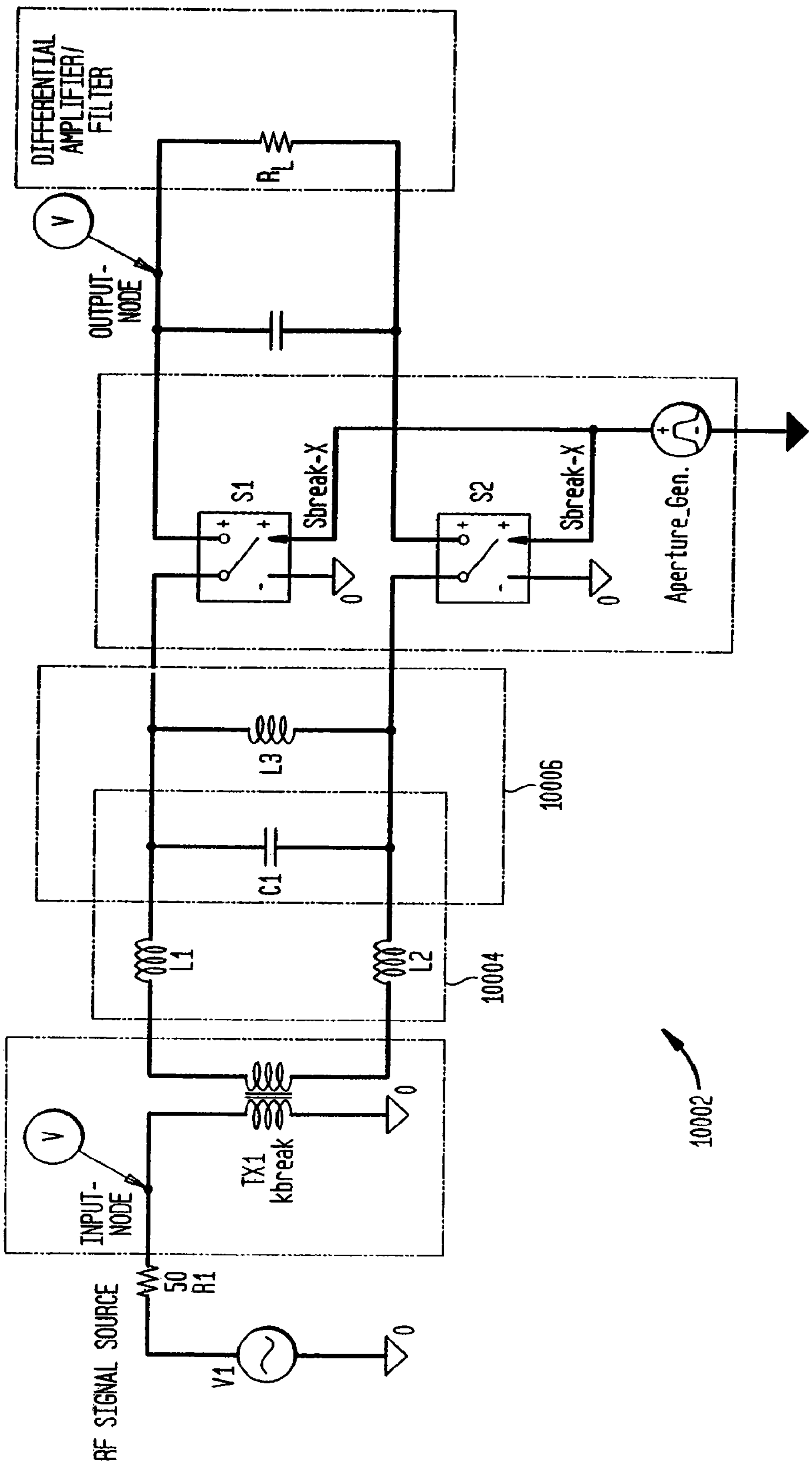
Figure 102:
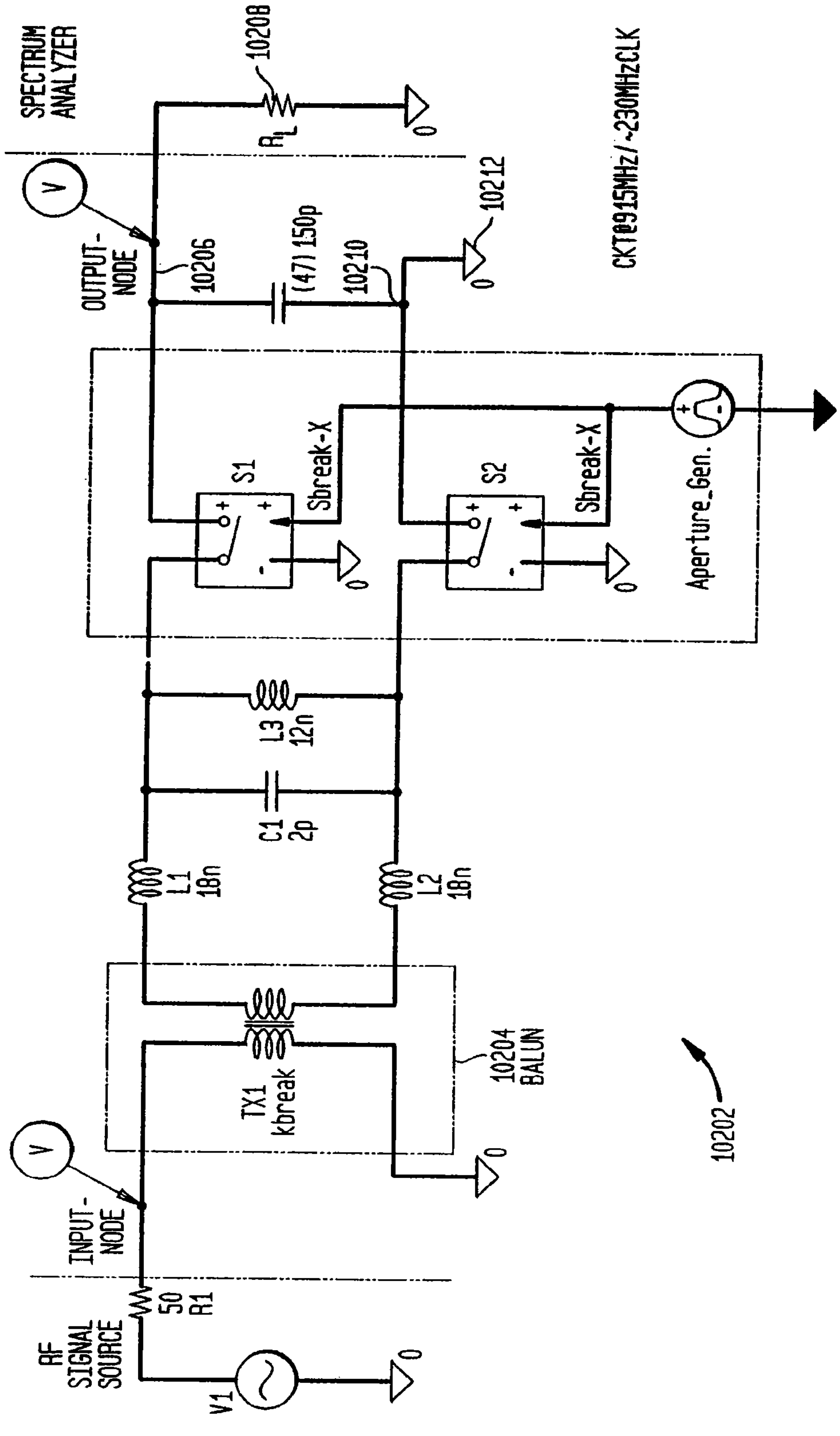

As with the first implementation described above in section 5.5.1 and its sub-sections, the gated transfer differential system 9902 can be implemented with a single input, differential inputs, a single output, differential outputs, and combinations thereof. For example, FIG. 100 illustrates an example single input-to-differential output system 10002.

Where common-mode rejection is desired to protect the input from various common-mode effects, and where common mode rejection to protect the output is not necessary, a differential input-to-single output implementation can be utilized. FIG. 102 illustrates an example differential-to-single ended system 10202, where a balance/unbalance (balun) circuit 10204 is utilized to generate the differential input. Other input configurations are contemplated. A first output 10206 is coupled to a load 10208. A second output 10210 is coupled to ground point 10212.

Typically, in a balanced-to-unbalanced system, where a single output is taken from a differential system without the use of a balun, (i.e., where one of the output signals is grounded), a loss of about 6 db is observed. In the configuration of FIG. 102, however, the ground point 10212 simply serves as a DC voltage reference for the circuit. The system 10202 transfers charge from the input in the same manner as if it were full differential, with its conversion efficiency generally affected only by the parasitics of the circuit components used, such as the Rds(on) on FET switches if used in the switch module. In other words, the charge transfer still continues in the same manner of a single ended implementation, providing the necessary single-ended ground to the input circuitry when the aperture is active, yet configured to allow the input to be differential for specific common-mode rejection capability and/or interface between a differential input and a single ended output system.

Figure 101:
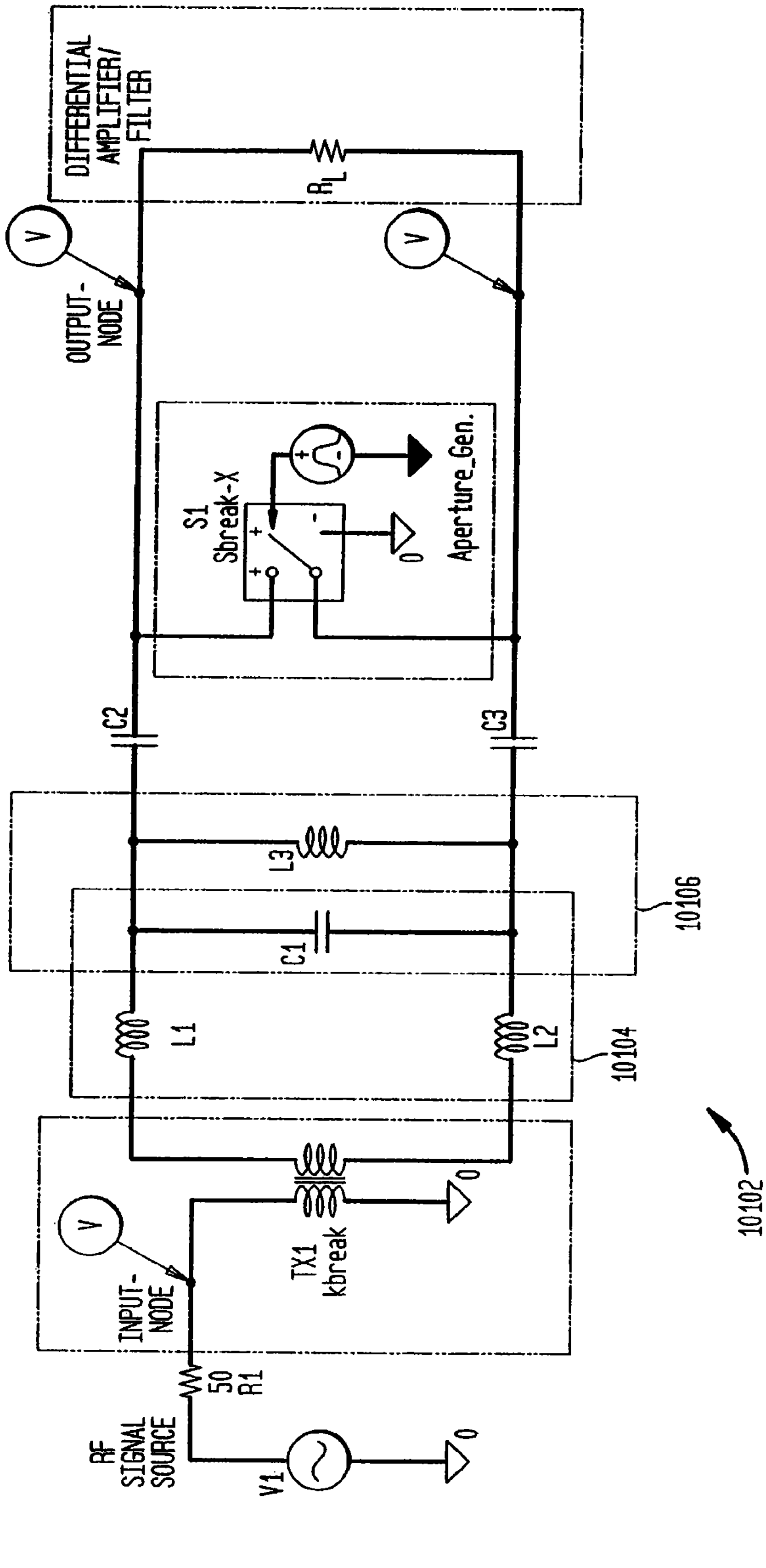

6.2.3 Specific Examples of Optimizations and Configurations for Inverted and Non-Inverted Differential Designs Gated transfer systems and inverted gated transfer systems can be implemented with any of the various optimizations and configurations disclosed through the specification, such as, for example, impedance matching, tanks and resonant structures, bypass networks, etc. For example, the differential system 10002 in FIG. 100, which utilizes gated transfer modules with an input impedance matching system 10004 and a tank circuit 10006, which share a common capacitor. Similarly, differential system 10102 in FIG. 101, utilizes an inverted gated transfer module with an input impedance matching system 10104 and a tank circuit 10106, which share a common capacitor.

6.3 Smoothing the Down-Converted Signal

The down-converted signal 1308B may be smoothed by filtering as desired. The differential circuit 7644 implemented as a filter in FIG. 76E illustrates but one example. This may be accomplished in any of the described embodiments by hardware, firmware and software implementation as is well known by those skilled in the arts.

6.4 Impedance Matching

The energy transfer module has input and output impedances generally defined by (1) the duty cycle of the switch module, and (2) the impedance of the storage module, at the frequencies of interest (e.g. at the EM input, and intermediate/baseband frequencies).

Starting with an aperture width of approximately ½ the period of the EM signal being down-converted as a preferred embodiment, this aperture width (e.g. the "closed time") can be decreased. As the aperture width is decreased, the characteristic impedance at the input and the output of the energy transfer module increases. Alternatively, as the aperture width increases from ½ the period of the EM signal being down-converted, the impedance of the energy transfer module decreases.

One of the steps in determining the characteristic input impedance of the energy transfer module could be to measure its value. In an embodiment, the energy transfer module's characteristic input impedance is 300 ohms. An impedance matching circuit can be utilized to efficiently couple an input EM signal that has a source impedance of, for example, 50 ohms, with the energy transfer module's impedance of, for example, 300 ohms. Matching these impedances can be accomplished in various manners, including providing the necessary impedance directly or the use of an impedance match circuit as described below.

Figure 70:
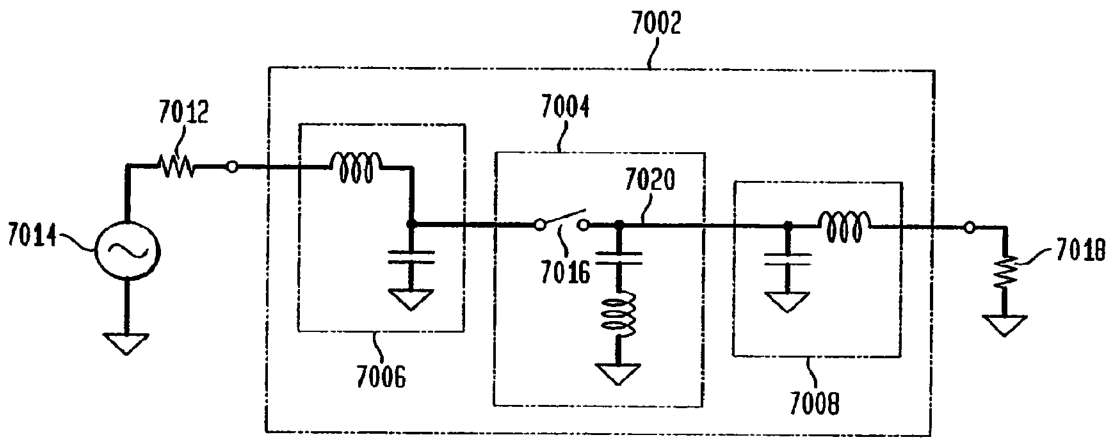
FIG. 70 illustrates an aliasing module with input and output impedance match according to an embodiment of the invention.
Figure 73:
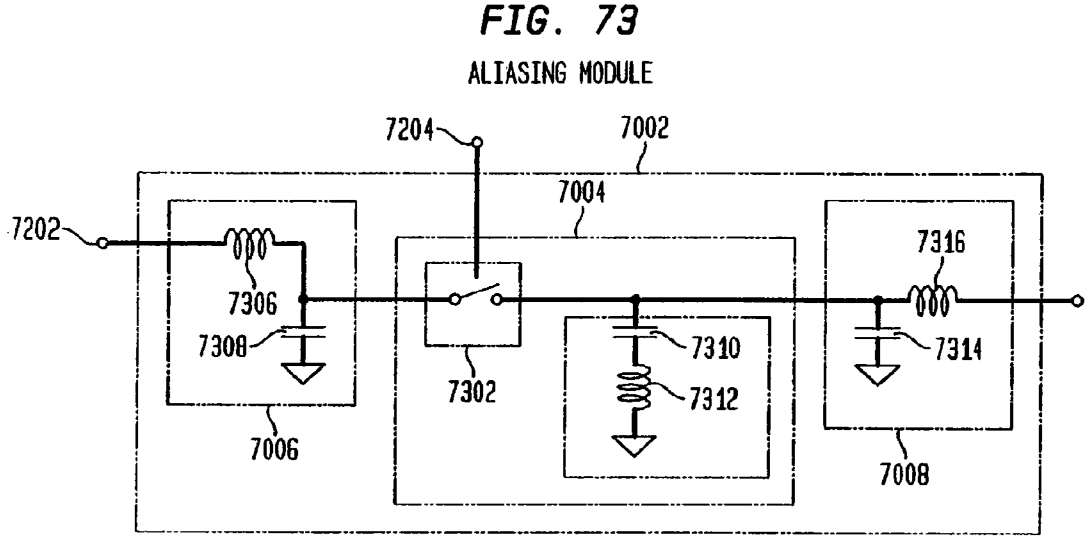
FIG. 73 illustrates an example energy transfer module with a switch module and a reactive storage module according to an embodiment of the invention.

Referring to FIG. 70, a specific embodiment using an RF signal as an input, assuming that the impedance 7012 is a relatively low impedance of approximately 50 Ohms, for example, and the input impedance 7016 is approximately 300 Ohms, an initial configuration for the input impedance match module 7006 can include an inductor 7306 and a capacitor 7308, configured as shown in FIG. 73. The configuration of the inductor 7306 and the capacitor 7308 is a possible configuration when going from a low impedance to a high impedance. Inductor 7306 and the capacitor 7308 constitute an L match, the calculation of the values which is well known to those skilled in the relevant arts.

The output characteristic impedance can be impedance matched to take into consideration the desired output frequencies. One of the steps in determining the characteristic output impedance of the energy transfer module could be to measure its value. Balancing the very low impedance of the storage module at the input EM frequency, the storage module should have an impedance at the desired output frequencies that is preferably greater than or equal to the load that is intended to be driven (for example, in an embodiment, storage module impedance at a desired 1 MHZ output frequency is 2K ohm and the desired load to be driven is 50 ohms). An additional benefit of impedance matching is that filtering of unwanted signals can also be accomplished with the same components.

In an embodiment, the energy transfer module's characteristic output impedance is 2K ohms. An impedance matching circuit can be utilized to efficiently couple the down-converted signal with an output impedance of, for example, 2K ohms, to a load of, for example, 50 ohms. Matching these impedances can be accomplished in various manners, including providing the necessary load impedance directly or the use of an impedance match circuit as described below.

When matching from a high impedance to a low impedance, a capacitor 7314 and an inductor 7316 can be configured as shown in FIG. 73. The capacitor 7314 and the inductor 7316 constitute an L match, the calculation of the component values being well known to those skilled in the relevant arts.

The configuration of the input impedance match module 7006 and the output impedance match module 7008 are considered to be initial starting points for impedance matching, in accordance with the present invention. In some situations, the initial designs may be suitable without further optimization. In other situations, the initial designs can be optimized in accordance with other various design criteria and considerations.

As other optional optimizing structures and/or components are utilized, their affect on the characteristic impedance of the energy transfer module should be taken into account in the match along with their own original criteria.

6.5 Tanks and Resonant Structures

Resonant tank and other resonant structures can be used to further optimize the energy transfer characteristics of the invention. For example, resonant structures, resonant about the input frequency, can be used to store energy from the input signal when the switch is open, a period during which one may conclude that the architecture would otherwise be limited in its maximum possible efficiency. Resonant tank and other resonant structures can include, but are not limited to, surface acoustic wave (SAW) filters, dielectric resonators, diplexers, capacitors, inductors, etc.

Figure 88:
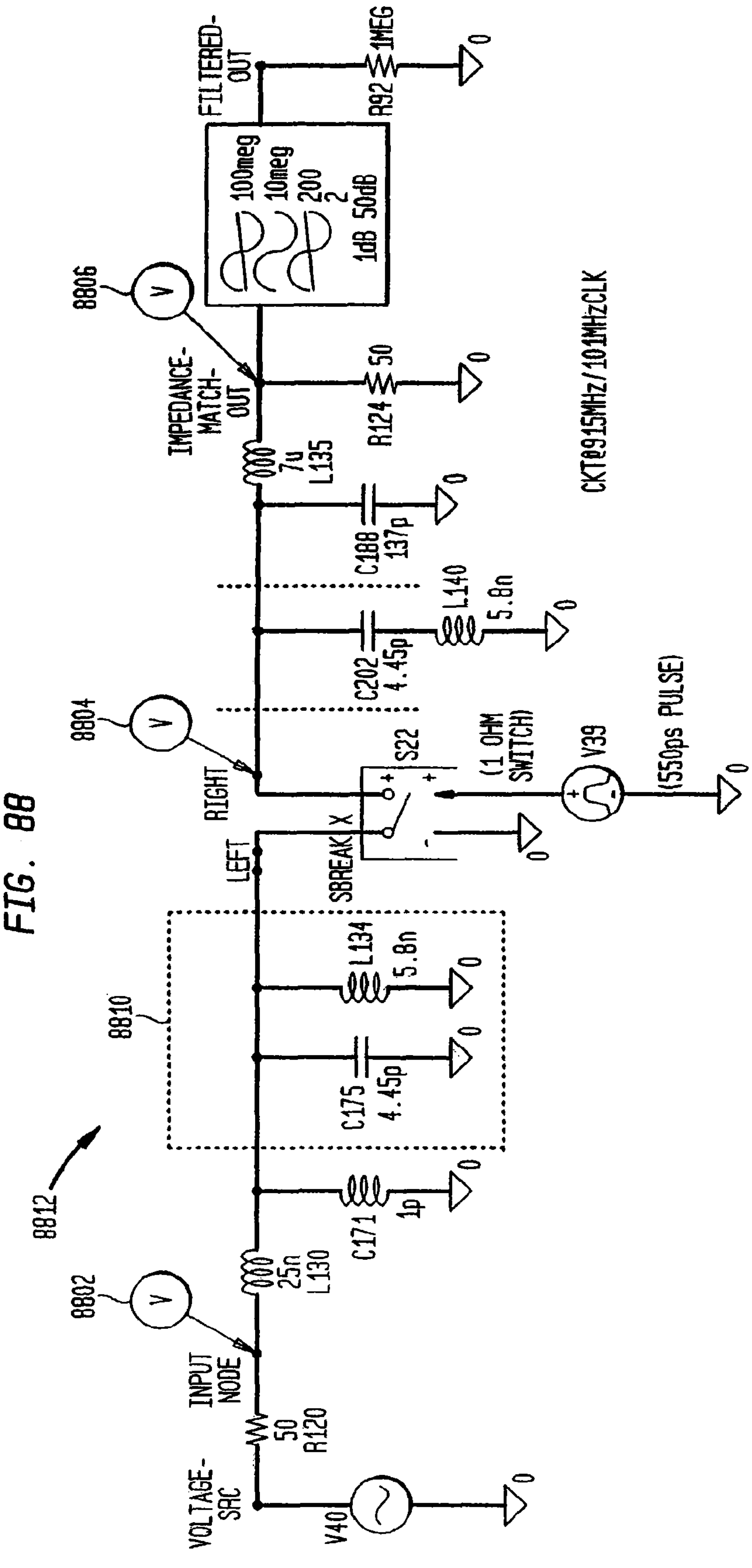
FIG. 88 is a schematic diagram of a circuit to down-convert a 915 MHZ signal to a 5 MHz signal using a 101 MHZ clock according to an embodiment of the present invention.
Figure 94A:
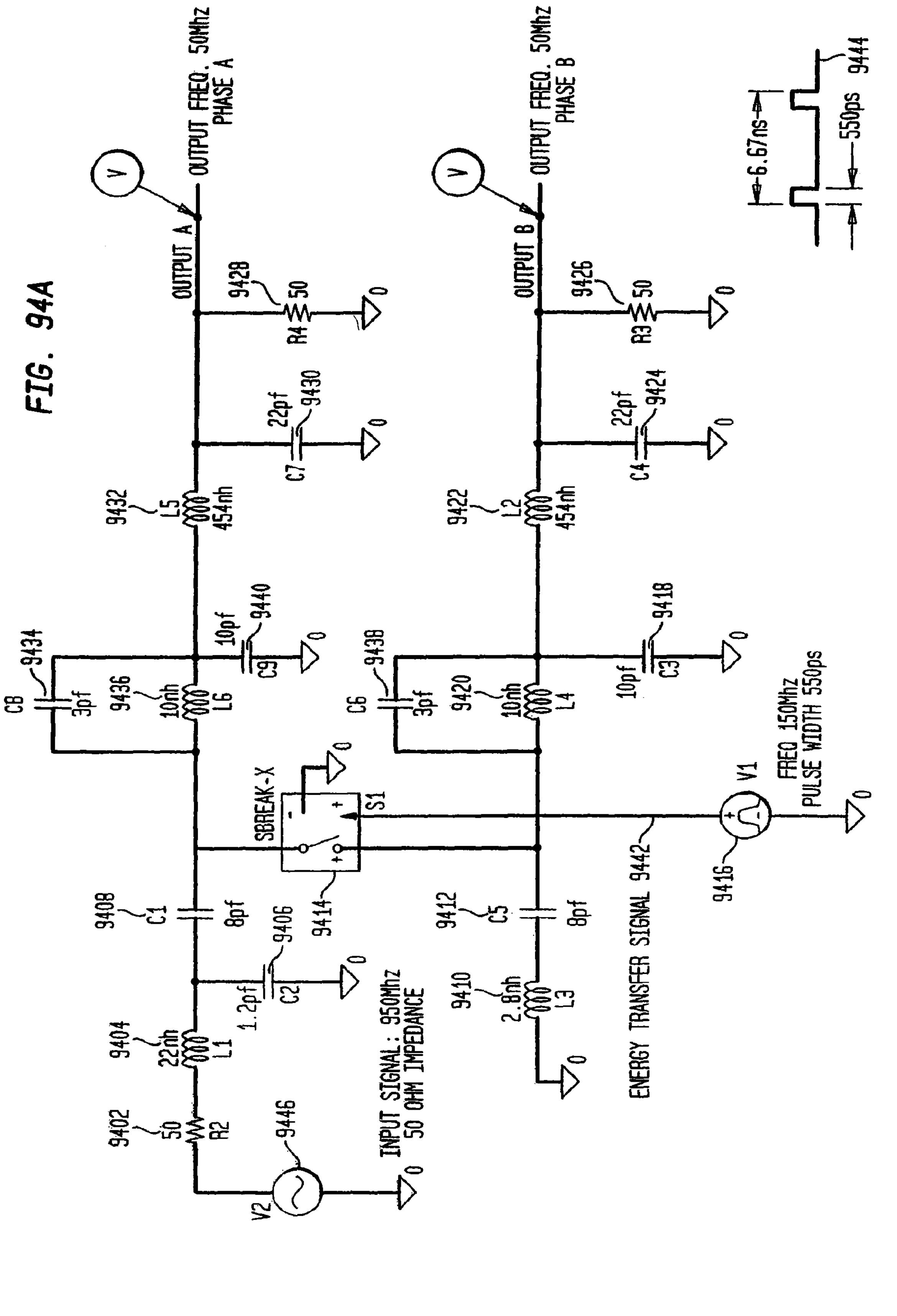
FIG. 94A illustrates an example energy transfer system according to an embodiment of the invention.
Figure 97:
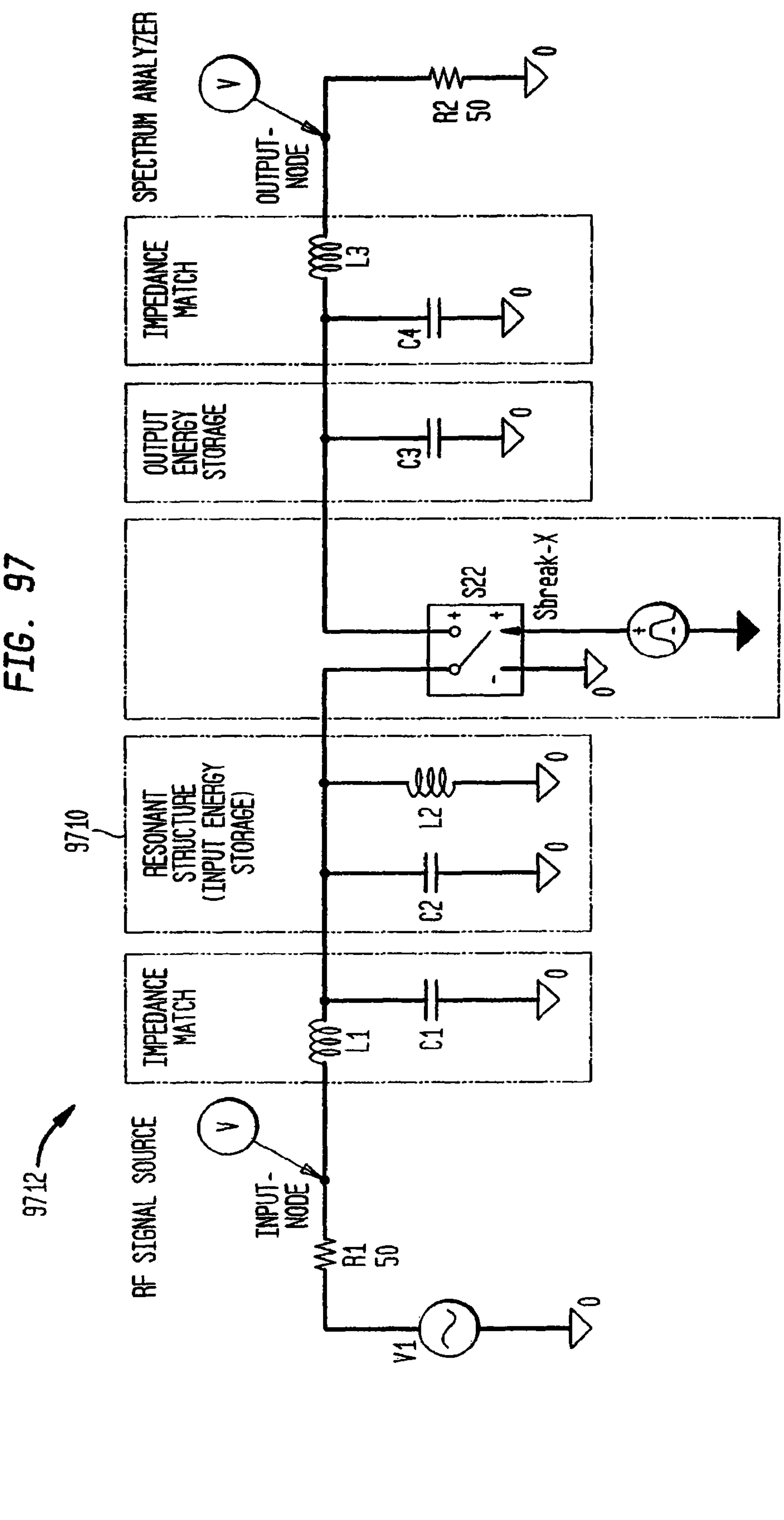
FIG. 97 illustrates an example embodiment of the invention.

An example embodiment is shown in FIG. 94A. Two additional embodiments are shown in FIG. 88 and FIG. 97. Alternate implementations will be apparent to persons skilled in the relevant art(s) based on the teachings contained herein. Alternate implementations fall within the scope and spirit of the present invention. These implementations take advantage of properties of series and parallel (tank) resonant circuits.

FIG. 94A illustrates parallel tank circuits in a differential implementation. A first parallel resonant or tank circuit consists of a capacitor 9438 and an inductor 9420 (tank1). A second tank circuit consists of a capacitor 9434 and an inductor 9436 (tank2)

As is apparent to one skilled in the relevant art(s), parallel tank circuits provide:

low impedance to frequencies below resonance;

low impedance to frequencies above resonance; and high impedance to frequencies at and near resonance.

In the illustrated example of FIG. 94A, the first and second tank circuits resonate at approximately 920 Mhz. At and near resonance, the impedance of these circuits is relatively high. Therefore, in the circuit configuration shown in FIG. 94A, both tank circuits appear as relatively high impedance to the input frequency of 950 Mhz, while simultaneously appearing as relatively low impedance to frequencies in the desired output range of 50 Mhz.

An energy transfer signal 9442 controls a switch 9414. When the energy transfer signal 9442 controls the switch 9414 to open and close, high frequency signal components are not allowed to pass through tank1 or tank2 However, the lower signal components (50 Mhz in this embodiment) generated by the system are allowed to pass through tank1 and tank2 with little attenuation. The effect of tank1 and tank2 is to further separate the input and output signals from the same node thereby producing a more stable input and output impedance. Capacitors 9418 and 9440 act to store the 50 Mhz output signal energy between energy transfer pulses.

Figure 94B:
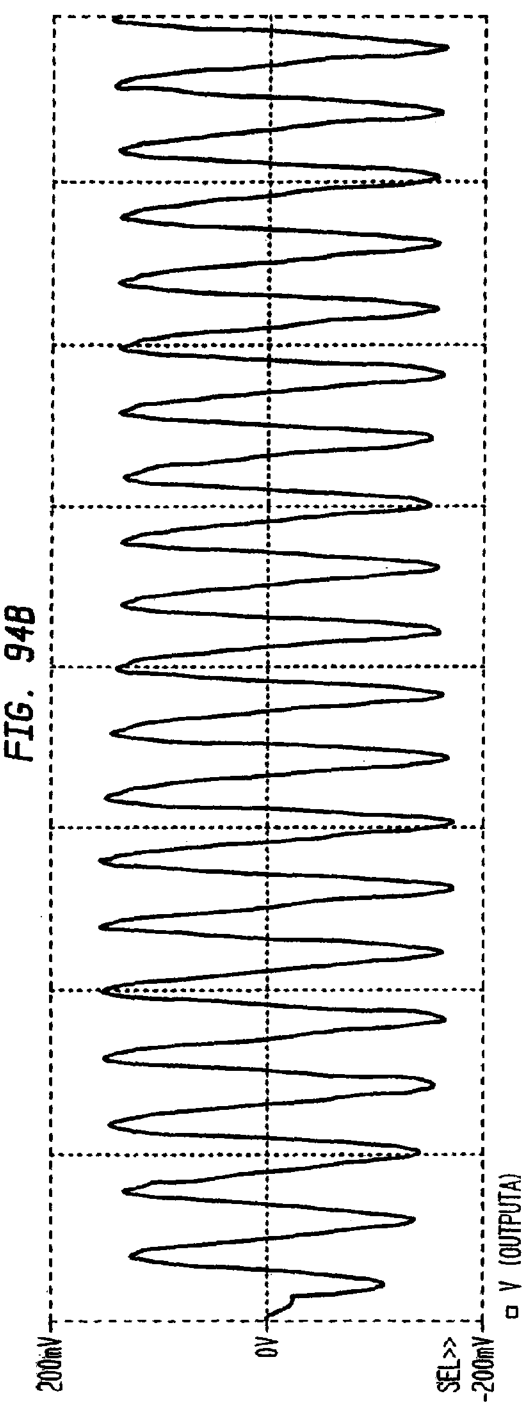
FIGS. 94B-C illustrate example timing diagrams for the example system of FIG. 94A.
Figure 94C:
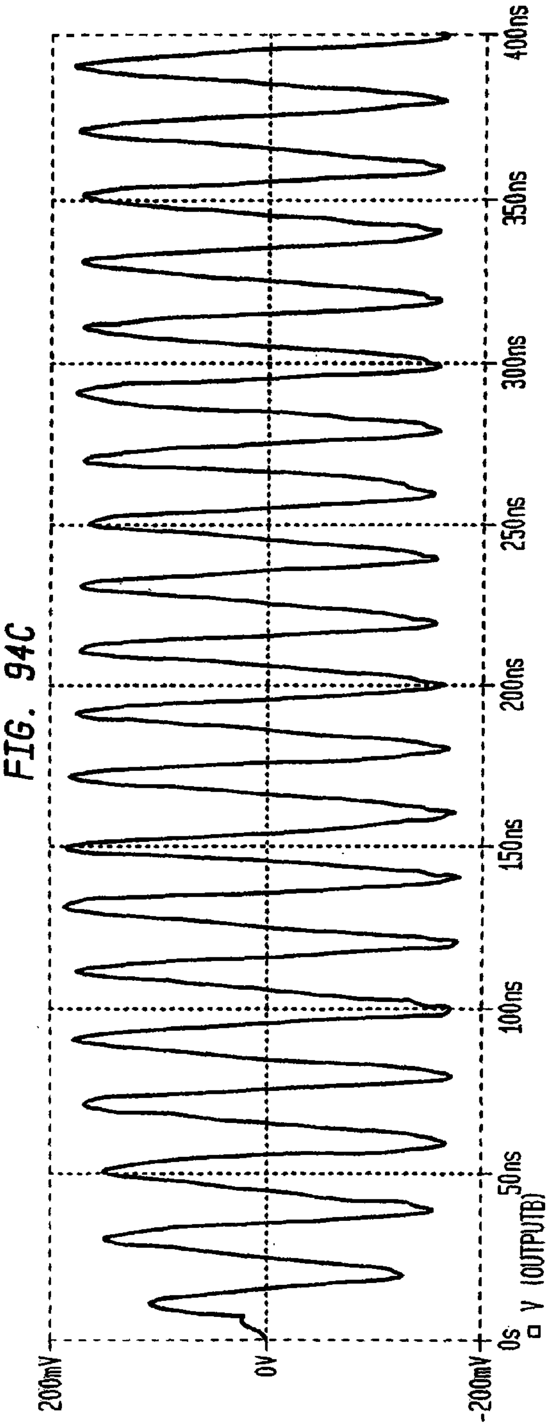

Further energy transfer optimization is provided by placing an inductor 9410 in series with a storage capacitor 9412 as shown. In the illustrated example, the series resonant frequency of this circuit arrangement is approximately 1 GHz. This circuit increases the energy transfer characteristic of the system. The ratio of the impedance of inductor 9410 and the impedance of the storage capacitor 9412 is preferably kept relatively small so that the majority of the energy available will be transferred to storage capacitor 9412 during operation. Exemplary output signals A and B are illustrated in FIGS. 94B and 94C, respectively.

In FIG. 94A, circuit components 9404 and 9406 form an input impedance match. Circuit components 9432 and 9430 form an output impedance match into a 50 ohm resistor 9428. Circuit components 9422 and 9424 form a second output impedance match into a 50 ohm resistor 9426. Capacitors 9408 and 9412 act as storage capacitors for the embodiment. Voltage source 9446 and resistor 9402 generate a 950 Mhz signal with a 50 ohm output impedance, which are used as the input to the circuit. Circuit element 9416 includes a 150 Mhz oscillator and a pulse generator, which are used to generate the energy transfer signal 9442.

FIG. 88 illustrates a shunt tank circuit 8810 in a single-ended to-single-ended system 8812. Similarly, FIG. 97 illustrates a shunt tank circuit 9710 in a system 9712. The tank circuits 8810 and 9710 lower driving source impedance, which improves transient response. The tank circuits 8810 and 9710 are able store the energy from the input signal and provide a low driving source impedance to transfer that energy throughout the aperture of the closed switch. The transient nature of the switch aperture can be viewed as having a response that, in addition to including the input frequency, has large component frequencies above the input frequency, (i.e. higher frequencies than the input frequency are also able to effectively pass through the aperture). Resonant circuits or structures, for example resonant tanks 8810 or 9710, can take advantage of this by being able to transfer energy throughout the switch's transient frequency response (i.e. the capacitor in the resonant tank appears as a low driving source impedance during the transient period of the aperture).

The example tank and resonant structures described above are for illustrative purposes and are not limiting. Alternate configurations can be utilized. The various resonant tanks and structures discussed can be combined or utilized independently as is now apparent.

6.6 Charge and Power Transfer Concepts

Concepts of charge transfer are now described with reference to FIGS. 109A-F. FIG. 109A illustrates a circuit 10902, including a switch S and a capacitor 10906 having a capacitance C. The switch S is controlled by a control signal 10908, which includes pulses 19010 having apertures T.

In FIG. 109B, Equation 10 illustrates that the charge q on a capacitor having a capacitance C, such as the capacitor 10906, is proportional to the voltage V across the capacitor, where:

q=Charge in Coulombs

C=Capacitance in Farads

V=Voltage in Volts

A=Input Signal Amplitude

Where the voltage V is represented by Equation 11, Equation 10 can be rewritten as Equation 12. The change in charge Δq over time t is illustrated as in Equation 13 as Δ(t), which can be rewritten as Equation 14. Using the sum-to-product trigonometric identity of Equation 15, Equation 14 can be rewritten as Equation 16, which can be rewritten as equation 17.

Note that the sin term in Equation 11 is a function of the aperture T only. Thus, Δ(t) is at a maximum when T is equal to an odd multiple of it (i.e., π, 3π, 5π, . . . ). Therefore, the capacitor 10906 experiences the greatest change in charge when the aperture T has a value of it or a time interval representative of 180 degrees of the input sinusoid. Conversely, when T is equal to 2π, 4π, 6π, . . . , minimal charge is transferred.

Equations 18, 19, and 20 solve for q(t) by integrating Equation 10, allowing the charge on the capacitor 10906 with respect to time to be graphed on the same axis as the input sinusoid sin(t), as illustrated in the graph of FIG. 109C. As the aperture T decreases in value or tends toward an impulse, the phase between the charge on the capacitor C or q(t) and sin(t) tend toward zero. This is illustrated in the graph of FIG. 109D, which indicates that the maximum impulse charge transfer occurs near the input voltage maxima. As this graph indicates, considerably less charge is transferred as the value of T decreases.

Power/charge relationships are illustrated in Equations 21-26 of FIG. 109E, where it is shown that power is proportional to charge, and transferred charge is inversely proportional to insertion loss.

Concepts of insertion loss are illustrated in FIG. 109F. Generally, the noise figure of a lossy passive device is numerically equal to the device insertion loss. Alternatively, the noise figure for any device cannot be less that its insertion loss. Insertion loss can be expressed by Equation 27 or 28.

From the above discussion, it is observed that as the aperture T increases, more charge is transferred from the input to the capacitor 10906, which increases power transfer from the input to the output. It has been observed that it is not necessary to accurately reproduce the input voltage at the output because relative modulated amplitude and phase information is retained in the transferred power.

6.7 Optimizing and Adjusting the Non-Negligible Aperture Width/Duration 6.7.1 Varying Input and Output Impedances In an embodiment of the invention, the energy transfer signal 6306 of FIG. 63 is used to vary the input impedance seen by the EM Signal 1304 and to vary the output impedance driving a load. An example of this embodiment is described below using the gated transfer module 6404 shown in FIG. 68G, and in FIG. 82A. The method described below is not limited to the gated transfer module 6404, as it can be applied to all of the embodiments of energy transfer module 6304.

In FIG. 82A, when switch 8206 is closed, the impedance looking into circuit 8202 is substantially the impedance of storage module illustrated as the storage capacitance 8208, in parallel with the impedance of the load 8212. When the switch 8206 is open, the impedance at point 8214 approaches infinity. It follows that the average impedance at point 8214 can be varied from the impedance of the storage module illustrated as the storage capacitance 8208, in parallel with the load 8212, to the highest obtainable impedance when switch 8206 is open, by varying the ratio of the time that switch 8206 is open to the time switch 8206 is closed. Since the switch 8206 is controlled by the energy transfer signal 8210, the impedance at point 8214 can be varied by controlling the aperture width of the energy transfer signal, in conjunction with the aliasing rate.

An example method of altering the energy transfer signal 6306 of FIG. 63 is now described with reference to FIG. 71, where the circuit 7102 receives the input oscillating signal 7106 and outputs a pulse train shown as doubler output signal 7104. The circuit 7102 can be used to generate the energy transfer signal 6306. Example waveforms of 7104 are shown on FIG. 72B.

It can be shown that by varying the delay of the signal propagated by the inverter 7108, the width of the pulses in the doubler output signal 7104 can be varied. Increasing the delay of the signal propagated by inverter 7108, increases the width of the pulses. The signal propagated by inverter 7108 can be delayed by introducing a R/C low pass network in the output of inverter 7108. Other means of altering the delay of the signal propagated by inverter 7108 will be well known to those skilled in the art.

6.7.2 Real Time Aperture Control

In an embodiment, the aperture width/duration is adjusted in real time. For example, referring to the timing diagrams in FIGS. 98B-F, a clock signal 9814 (FIG. 98B) is utilized to generate an energy transfer signal 9816 (FIG. 98F), which includes energy transfer pluses 9818, having variable apertures 9820. In an embodiment, the clock signal 9814 is inverted as illustrated by inverted clock signal 9822 (FIG. 98D). The clock signal 9814 is also delayed, as illustrated by delayed clock signal 9824 (FIG. 98E). The inverted clock signal 9814 and the delayed clock signal 9824 are then ANDed together, generating an energy transfer signal 9816, which is active—energy transfer pulses 9818—when the delayed clock signal 9824 and the inverted clock signal 9822 are both active. The amount of delay imparted to the delayed clock signal 9824 substantially determines the width or duration of the apertures 9820. By varying the delay in real time, the apertures are adjusted in real time.

In an alternative implementation, the inverted clock signal 9822 is delayed relative to the original clock signal 9814, and then ANDed with the original clock signal 9814. Alternatively, the original clock signal 9814 is delayed then inverted, and the result ANDed with the original clock signal 9814.

Figure 98A:
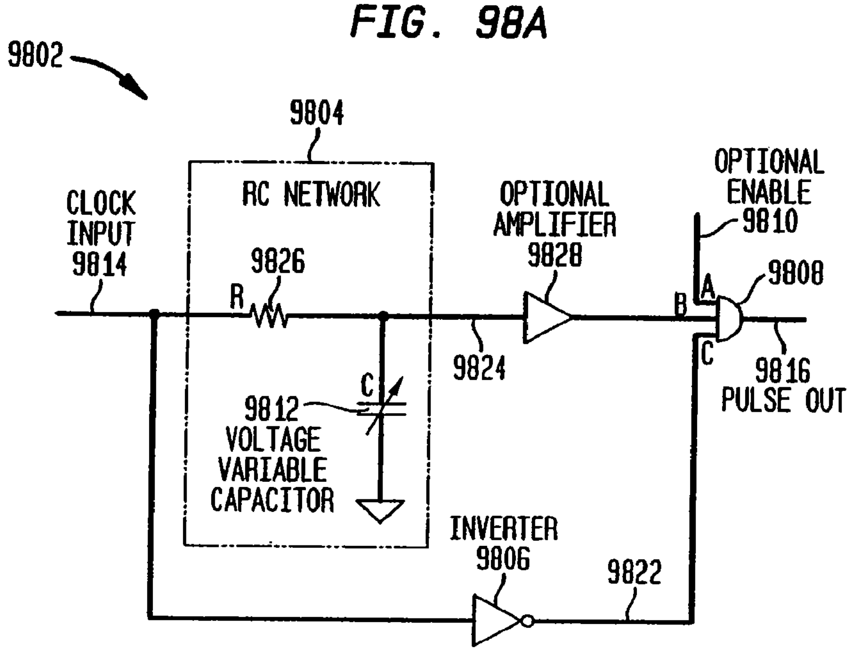
Figures 98B, 98C, 98D, 98E, 98F:
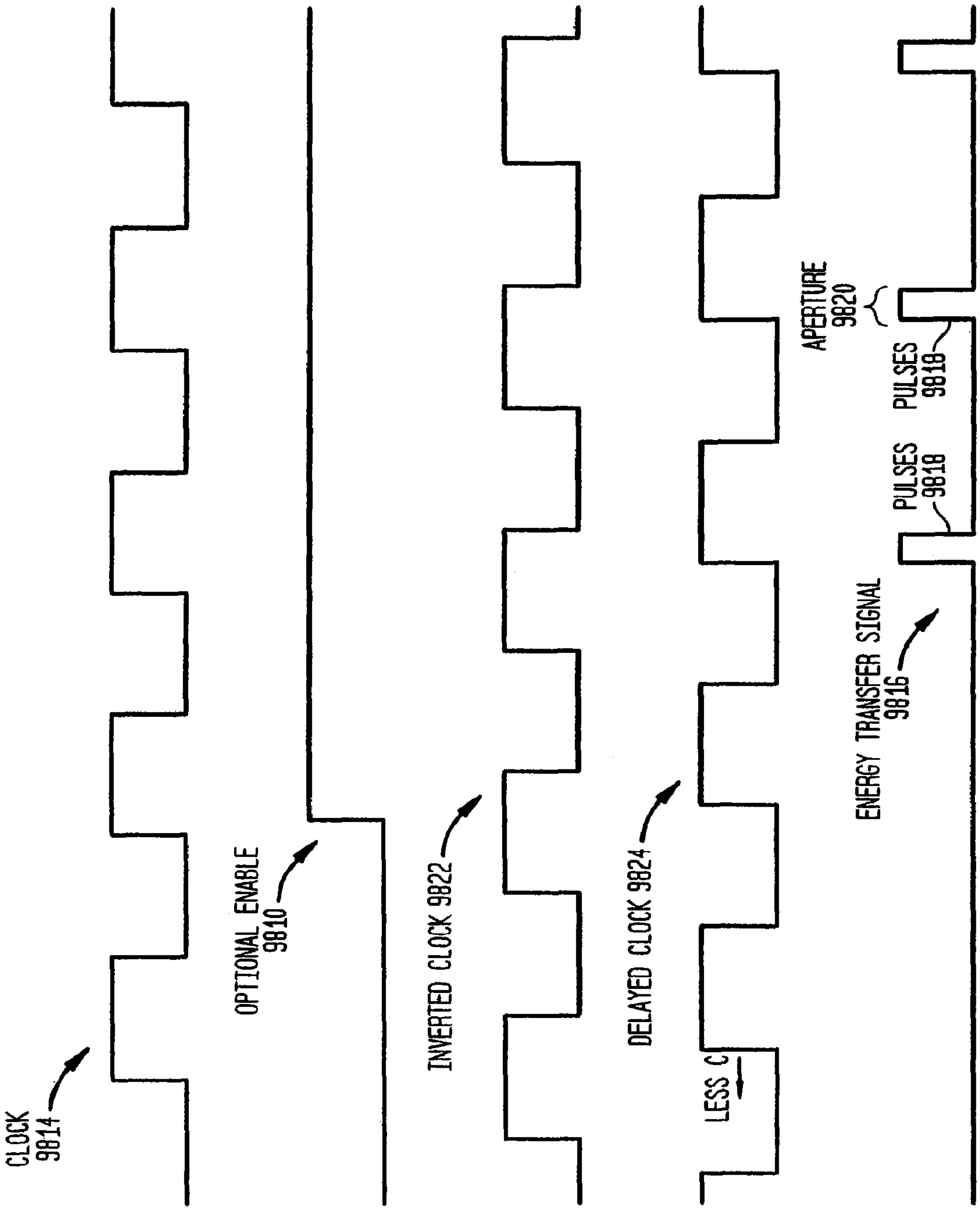

FIG. 98A illustrates an exemplary real time aperture control system 9802 that can be utilized to adjust apertures in real time. The example real time aperture control system 9802 includes an RC circuit 9804, which includes a voltage variable capacitor 9812 and a resistor 9826. The real time aperture control system 9802 also includes an inverter 9806 and an AND gate 9808. The AND gate 9808 optionally includes an enable input 9810 for enabling/disabling the AND gate 9808. The RC circuit 9804. The real time aperture control system 9802 optionally includes an amplifier 9828.

Operation of the real time aperture control circuit is described with reference to the timing diagrams of FIGS. 98B-F. The real time control system 9802 receives the input clock signal 9814, which is provided to both the inverter 9806 and to the RC circuit 9804. The inverter 9806 outputs the inverted clock signal 9822 and presents it to the AND gate 9808. The RC circuit 9804 delays the clock signal 9814 and outputs the delayed clock signal 9824. The delay is determined primarily by the capacitance of the voltage variable capacitor 9812. Generally, as the capacitance decreases, the delay decreases.

The delayed clock signal 9824 is optionally amplified by the optional amplifier 9828, before being presented to the AND gate 9808. Amplification is desired, for example, where the RC constant of the RC circuit 9804 attenuates the signal below the threshold of the AND gate 9808.

The AND gate 9808 ANDs the delayed clock signal 9824, the inverted clock signal 9822, and the optional Enable signal 9810, to generate the energy transfer signal 9816. The apertures 9820 are adjusted in real time by varying the voltage to the voltage variable capacitor 9812.

In an embodiment, the apertures 9820 are controlled to optimize power transfer. For example, in an embodiment, the apertures 9820 are controlled to maximize power transfer. Alternatively, the apertures 9820 are controlled for variable gain control (e.g. automatic gain control—AGC). In this embodiment, power transfer is reduced by reducing the apertures 9820.

As can now be readily seen from this disclosure, many of the aperture circuits presented, and others, can be modified in the manner described above (e.g. circuits in FIGS. 68H-K). Modification or selection of the aperture can be done at the design level to remain a fixed value in the circuit, or in an alternative embodiment, may be dynamically adjusted to compensate for, or address, various design goals such as receiving RF signals with enhanced efficiency that are in distinctively different bands of operation, e.g. RF signals at 900 MHz and 1.8 GHz.

6.8 Adding a Bypass Network

In an embodiment of the invention, a bypass network is added to improve the efficiency of the energy transfer module. Such a bypass network can be viewed as a means of synthetic aperture widening. Components for a bypass network are selected so that the bypass network appears substantially lower impedance to transients of the switch module (i.e., frequencies greater than the received EM signal) and appears as a moderate to high impedance to the input EM signal (e.g., greater that 100 Ohms at the RF frequency).

The time that the input signal is now connected to the opposite side of the switch module is lengthened due to the shaping caused by this network, which in simple realizations may be a capacitor or series resonant inductor-capacitor. A network that is series resonant above the input frequency would be a typical implementation. This shaping improves the conversion efficiency of an input signal that would otherwise, if one considered the aperture of the energy transfer signal only, be relatively low in frequency to be optimal.

Figure 90:
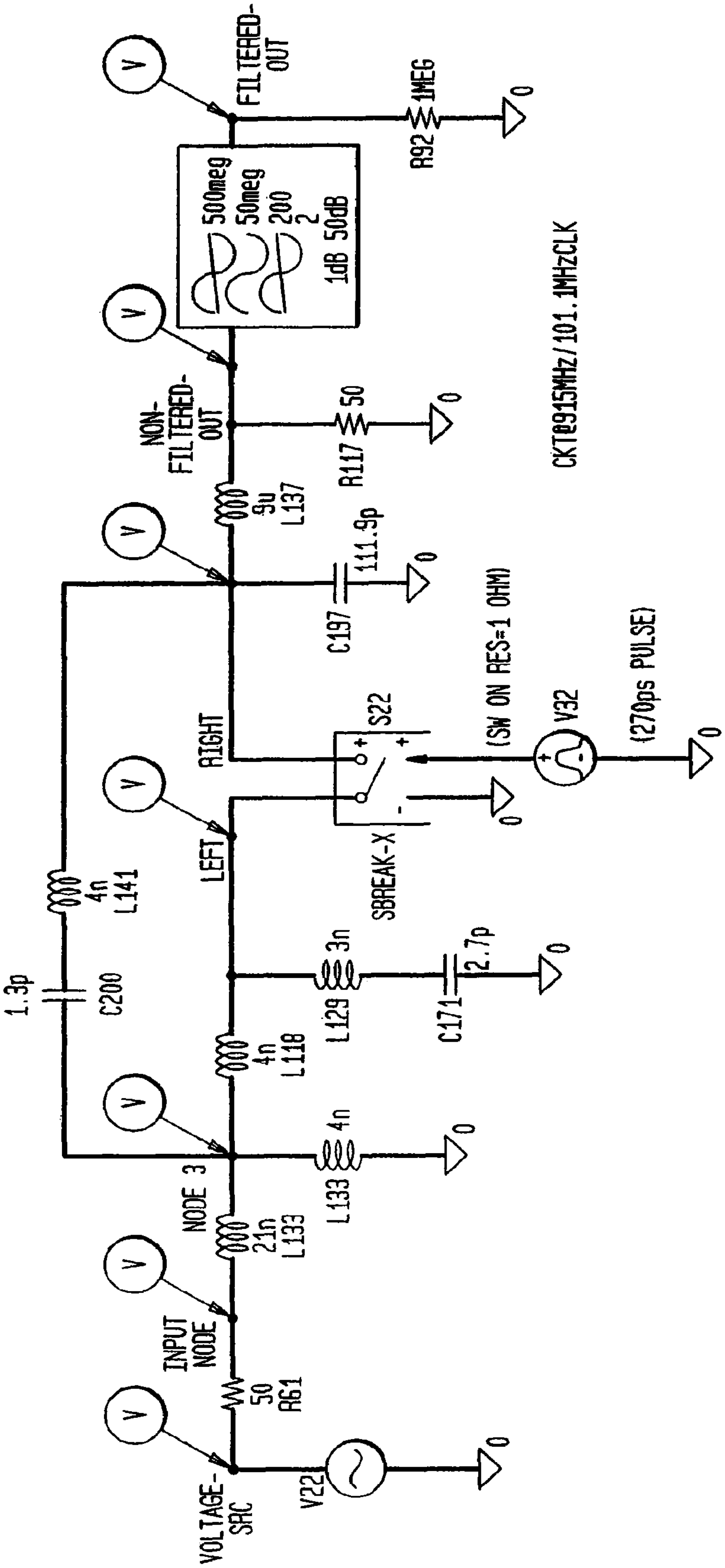
FIG. 90 is a schematic diagram of a circuit to down-convert a 915 MHZ signal to a 5 MHZ signal using a 101.1 MHZ clock according to an embodiment of the present invention.
Figure 95:
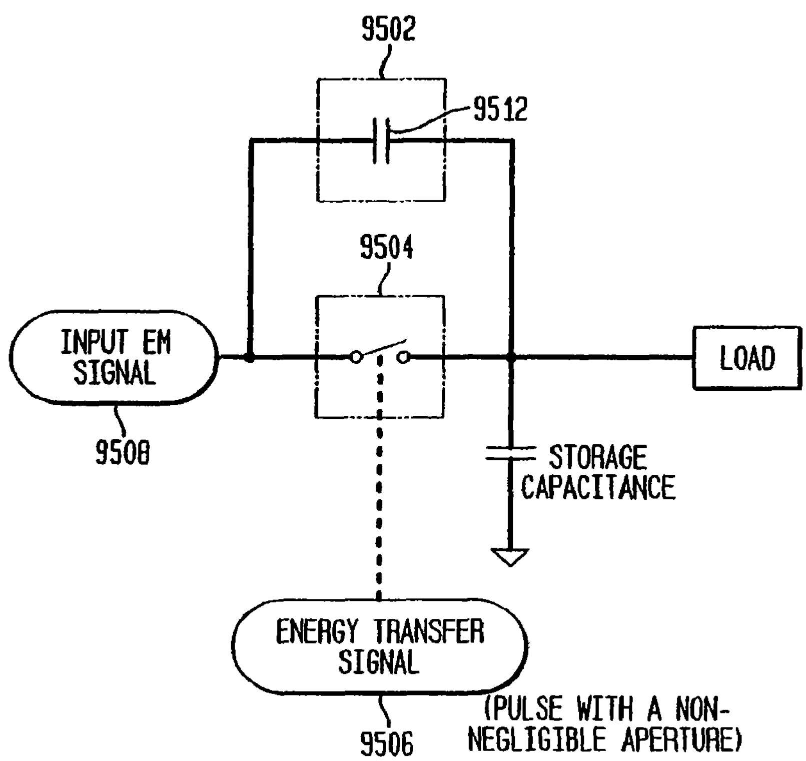
FIG. 95 illustrates an example bypass network according to an embodiment of the invention.
Figure 96:
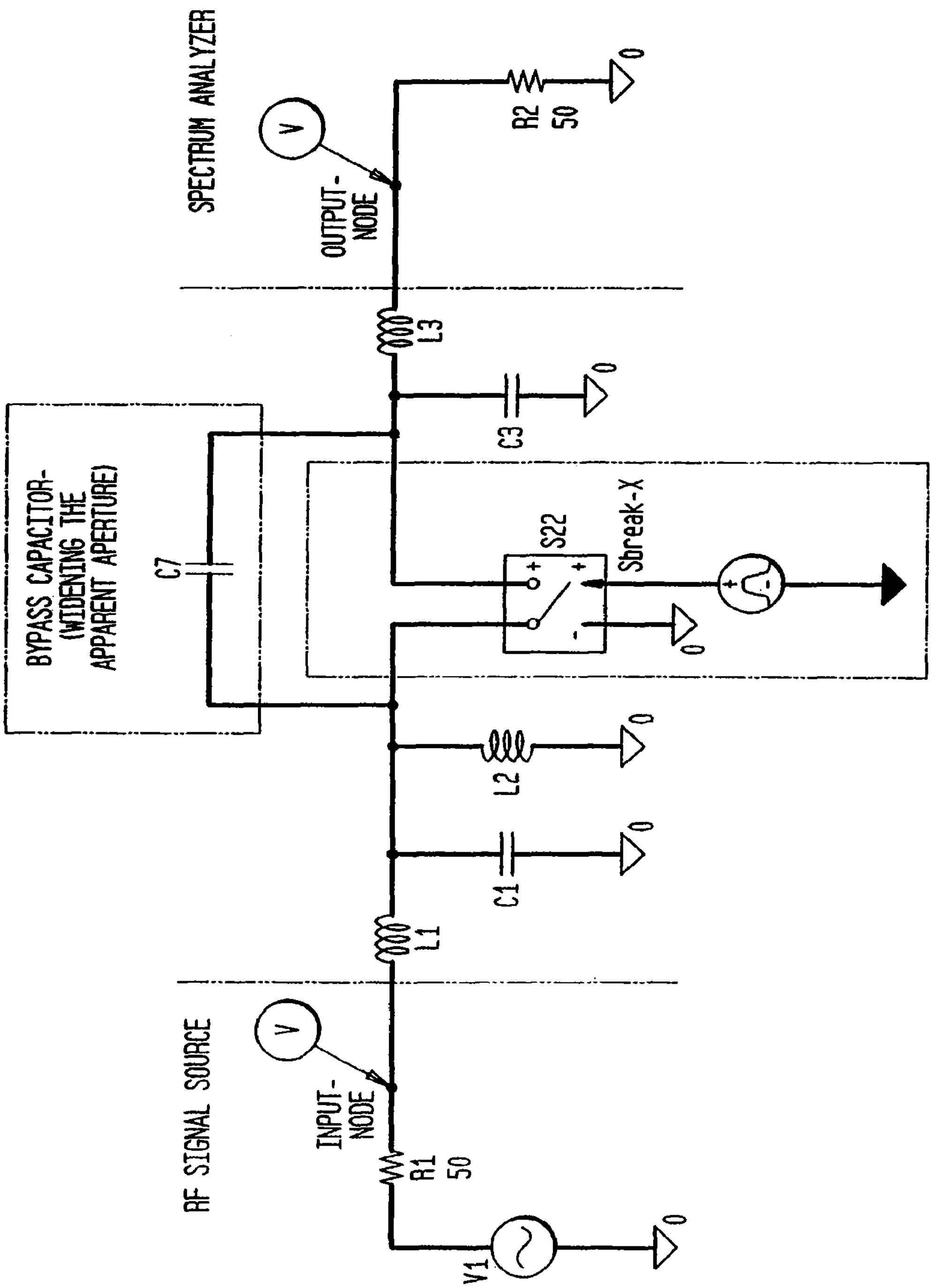
FIG. 96 illustrates an example bypass network according to an embodiment of the invention.

For example, referring to FIG. 95 a bypass network 9502 (shown in this instance as capacitor 9512), is shown bypassing switch module 9504. In this embodiment the bypass network increases the efficiency of the energy transfer module when, for example, less than optimal aperture widths were chosen for a given input frequency on the energy transfer signal 9506. The bypass network 9502 could be of different configurations than shown in FIG. 95. Such an alternate is illustrated in FIG. 90. Similarly, FIG. 96 illustrates another example bypass network 9602, including a capacitor 9604.

The following discussion will demonstrate the effects of a minimized aperture and the benefit provided by a bypassing network. Beginning with an initial circuit having a 550 ps aperture in FIG. 103, its output is seen to be 2.8 mVpp applied to a 50 ohm load in FIG. 107A. Changing the aperture to 270 ps as shown in FIG. 104 results in a diminished output of 2.5 Vpp applied to a 50 ohm load as shown in FIG. 107B. To compensate for this loss, a bypass network may be added, a specific implementation is provided in FIG. 105. The result of this addition is that 3.2 Vpp can now be applied to the 50 ohm load as shown in FIG. 108A. The circuit with the bypass network in FIG. 105 also had three values adjusted in the surrounding circuit to compensate for the impedance changes introduced by the bypass network and narrowed aperture. FIG. 106 verifies that those changes added to the circuit, but without the bypass network, did not themselves bring about the increased efficiency demonstrated by the embodiment in FIG. 105 with the bypass network. FIG. 108B shows the result of using the circuit in FIG. 106 in which only 1.88 Vpp was able to be applied to a 50 ohm load.

6.9 Modifying the Energy Transfer Signal Utilizing Feedback

FIG. 69 shows an embodiment of a system 6901 which uses down-converted Signal 1308B as feedback 6906 to control various characteristics of the energy transfer module 6304 to modify the down-converted signal 1308B.

Generally, the amplitude of the down-converted signal 1308B varies as a function of the frequency and phase differences between the EM signal 1304 and the energy transfer signal 6306. In an embodiment, the down-converted signal 1308B is used as the feedback 6906 to control the frequency and phase relationship between the EM signal 1304 and the energy transfer signal 6306. This can be accomplished using the example logic in FIG. 85A. The example circuit in FIG. 85A can be included in the energy transfer signal module 6902. Alternate implementations will be apparent to persons skilled in the relevant art(s) based on the teachings contained herein. Alternate implementations fall within the scope and spirit of the present invention. In this embodiment a state-machine is used as an example.

Figure 85A:
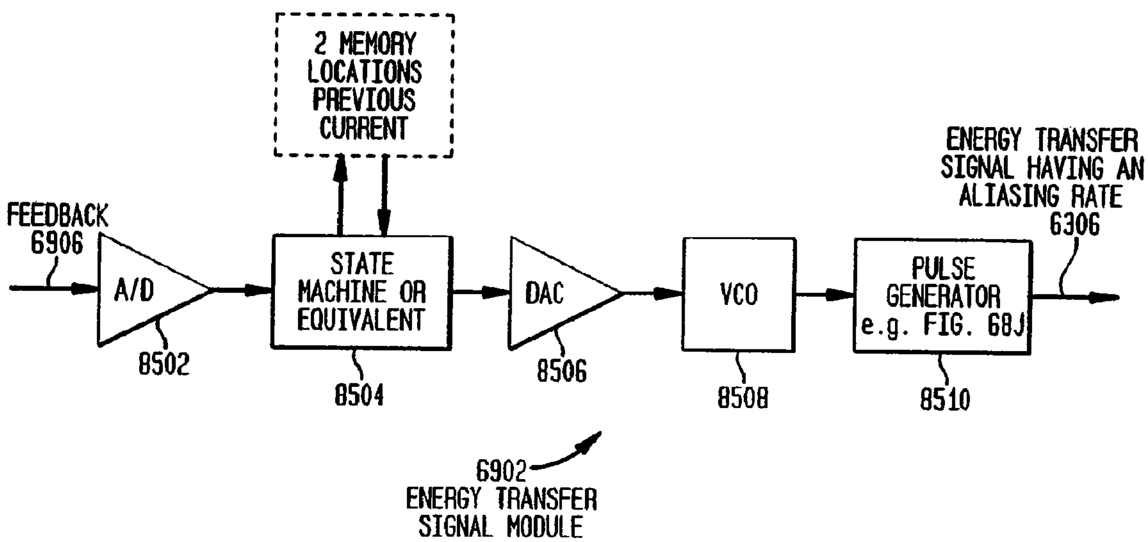
FIG. 85A illustrates an example energy transfer signal module according to an embodiment of the present invention.

In the example of FIG. 85A, a state machine 8504 reads an analog to digital converter, A/D 8502, and controls a digital to analog converter, DAC 8506. In an embodiment, the state machine 8504 includes 2 memory locations, Previous and Current, to store and recall the results of reading A/D 8502. In an embodiment, the state machine 8504 utilizes at least one memory flag.

The DAC 8506 controls an input to a voltage controlled oscillator, VCO 8508. VCO 8508 controls a frequency input of a pulse generator 8510, which, in an embodiment, is substantially similar to the pulse generator shown in FIG. 68J. The pulse generator 8510 generates energy transfer signal 6306.

Figure 85B:
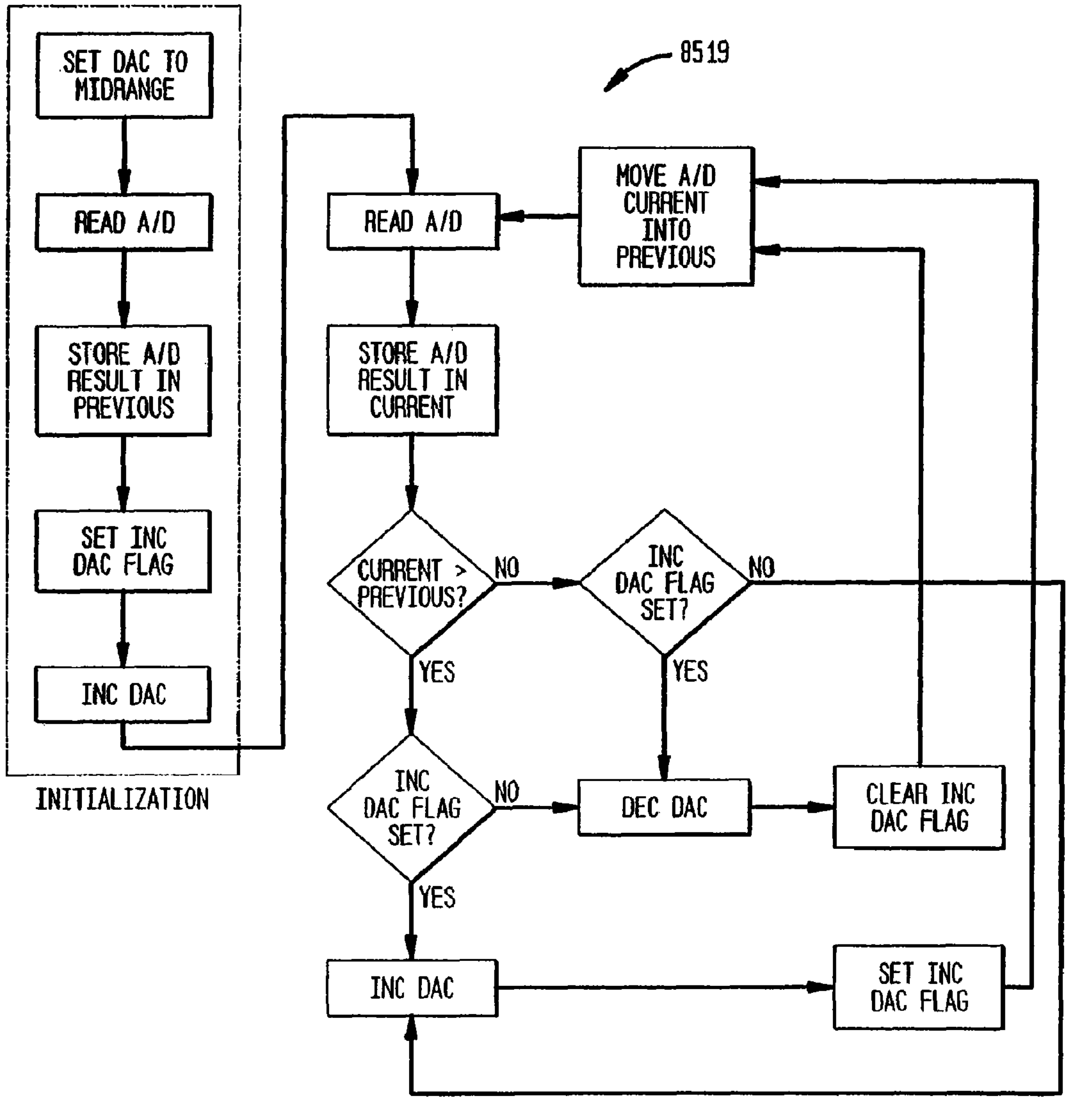
FIG. 85B illustrates a flowchart of state machine operation according to an embodiment of the present invention.

In an embodiment, the state machine 8504 operates in accordance with a state machine flowchart 8519 in FIG. 85B. The result of this operation is to modify the frequency and phase relationship between the energy transfer signal 6306 and the EM signal 1304, to substantially maintain the amplitude of the down-converted signal 1308B at an optimum level.

Figure 85C:
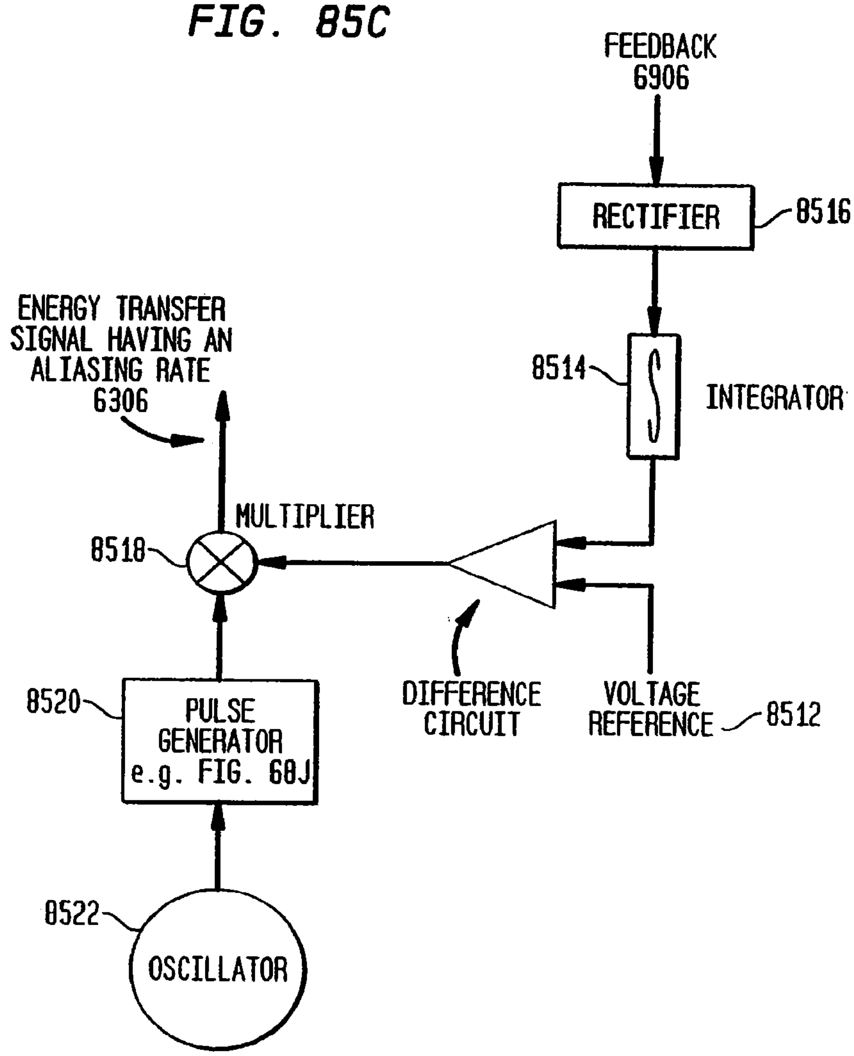
FIG. 85C is an example energy transfer signal module.

The amplitude of the down-converted signal 1308B can be made to vary with the amplitude of the energy transfer signal 6306. In an embodiment where the switch module 6502 is a FET as shown in FIG. 66A, wherein the gate 6604 receives the energy transfer signal 6306, the amplitude of the energy transfer signal 6306 can determine the "on" resistance of the FET, which affects the amplitude of the down-converted signal 1308B. The energy transfer signal module 6902, as shown in FIG. 85C, can be an analog circuit that enables an automatic gain control function. Alternate implementations will be apparent to persons skilled in the relevant art(s) based on the teachings contained herein. Alternate implementations fall within the scope and spirit of the present invention.

6.10 Other Implementations

The implementations described above are provided for purposes of illustration. These implementations are not intended to limit the invention. Alternate implementations, differing slightly or substantially from those described herein, will be apparent to persons skilled in the relevant art(s) based on the teachings contained herein. Such alternate implementations fall within the scope and spirit of the present invention.

7. Example Energy Transfer Downconverters

Example implementations are described below for illustrative purposes. The invention is not limited to these examples.

Figure 86:
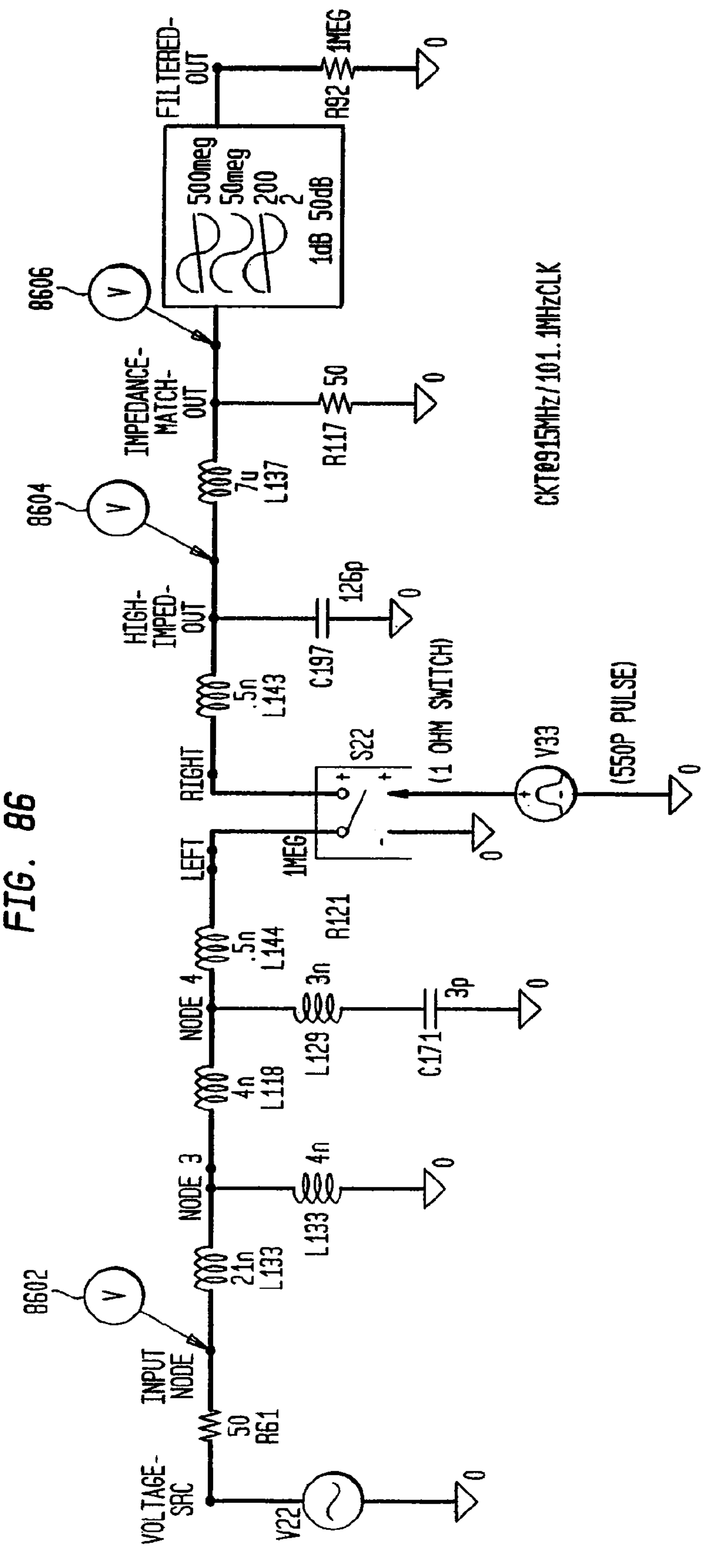
FIG. 86 is a schematic diagram of a circuit to down-convert a 915 MHZ signal to a 5 MHZ signal using a 101.1 MHZ clock according to an embodiment of the present invention.

FIG. 86 is a schematic diagram of an exemplary circuit to down convert a 915 MHz signal to a 5 MHz signal using a 101.1 MHz clock.

Figure 87:
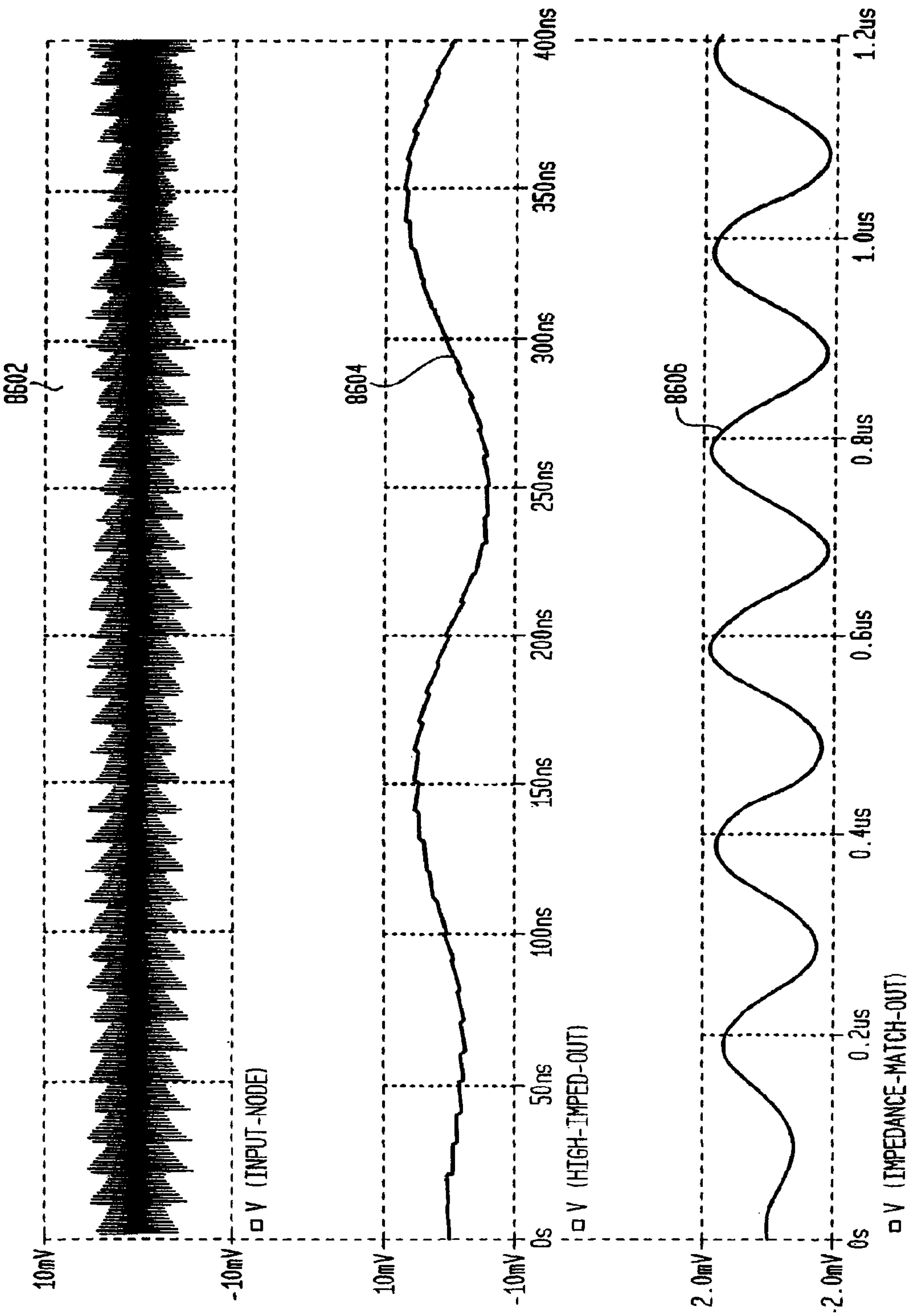
FIG. 87 shows simulation waveforms for the circuit of FIG. 86 according to embodiments of the present invention.

FIG. 87 shows example simulation waveforms for the circuit of FIG. 86. Waveform 8602 is the input to the circuit showing the distortions caused by the switch closure. Waveform 8604 is the unfiltered output at the storage unit. Waveform 8606 is the impedance matched output of the downconverter on a different time scale.

FIG. 88 is a schematic diagram of an exemplary circuit to downconvert a 915 MHz signal to a 5 MHz signal using a 101.1 MHz clock. The circuit has additional tank circuitry to improve conversion efficiency.

Figure 89:
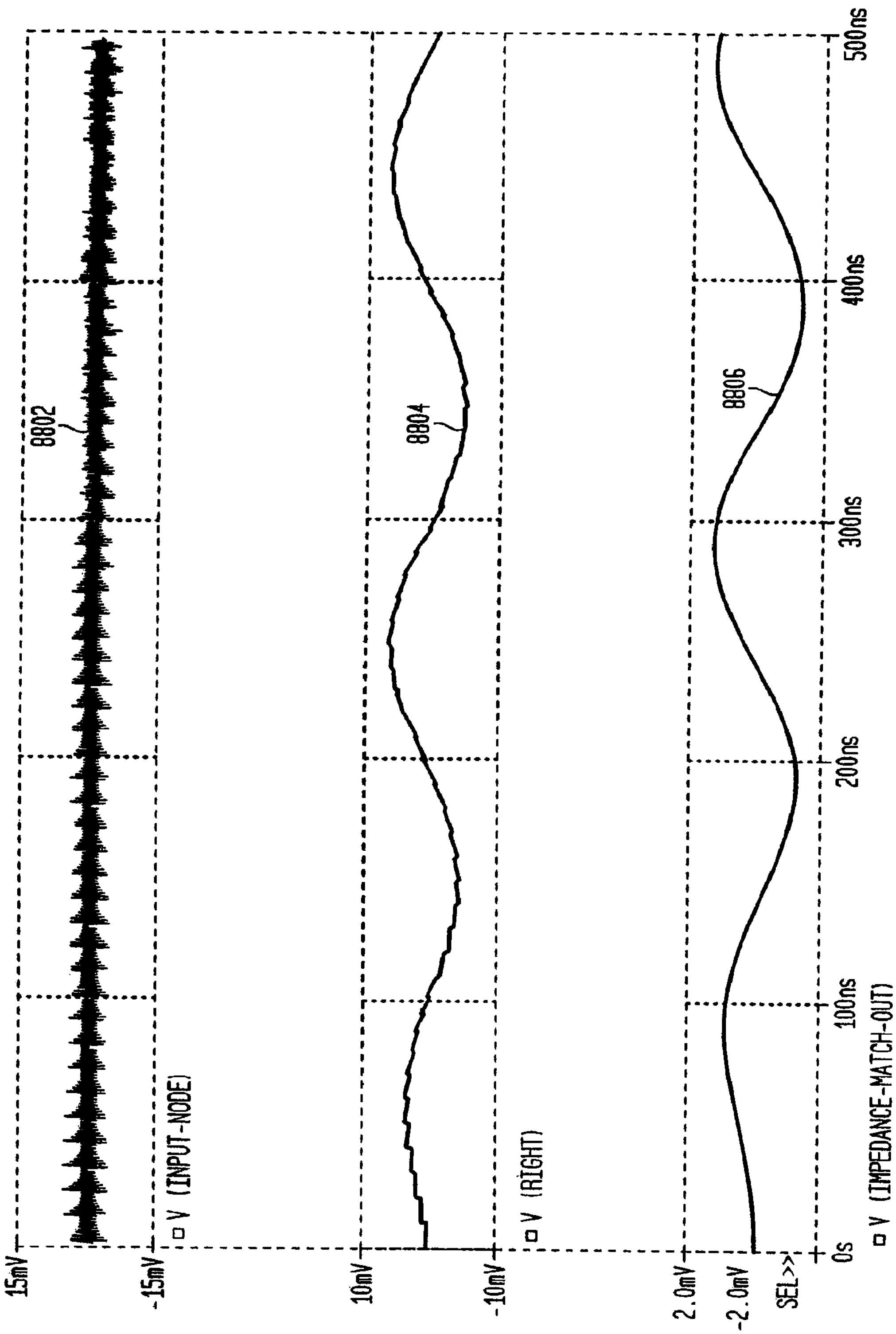
FIG. 89 shows simulation waveforms for the circuit of FIG. 88 according to embodiments of the present invention.

FIG. 89 shows example simulation waveforms for the circuit of FIG. 88. Waveform 8802 is the input to the circuit showing the distortions caused by the switch closure. Waveform 8804 is the unfiltered output at the storage unit. Waveform 8806 is the output of the downconverter after the impedance match circuit.

FIG. 90 is a schematic diagram of an exemplary circuit to downconvert a 915 MHz signal to a 5 MHz signal using a 101.1 MHz clock. The circuit has switch bypass circuitry to improve conversion efficiency.

Figure 91:
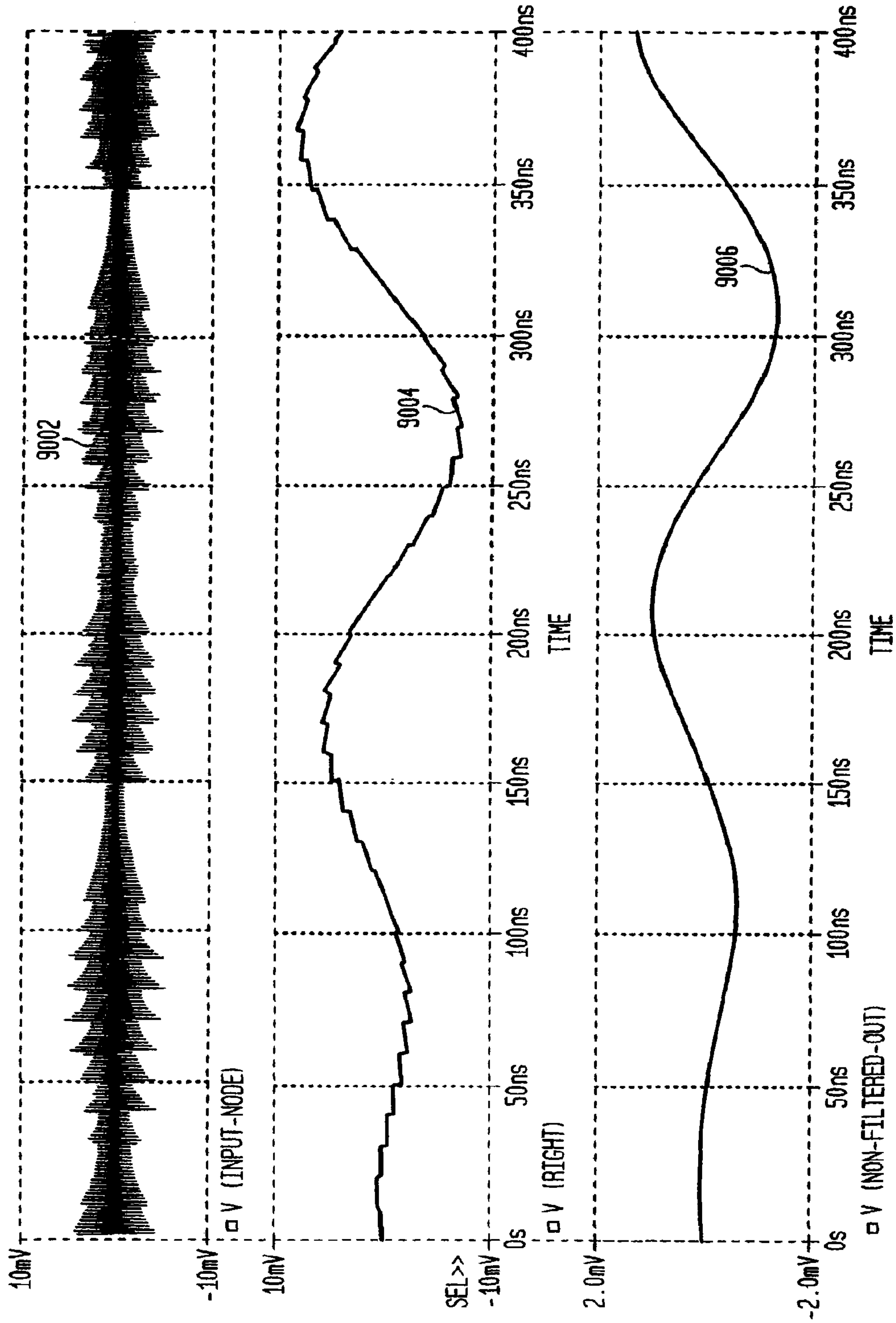
FIG. 91 shows simulation waveforms for the circuit of FIG. 90 according to an embodiment of the present invention.

FIG. 91 shows example simulation waveforms for the circuit of FIG. 90. Waveform 9002 is the input to the circuit showing the distortions caused by the switch closure. Waveform 9004 is the unfiltered output at the storage unit. Waveform 9006 is the output of the downconverter after the impedance match circuit.

Figure 92:
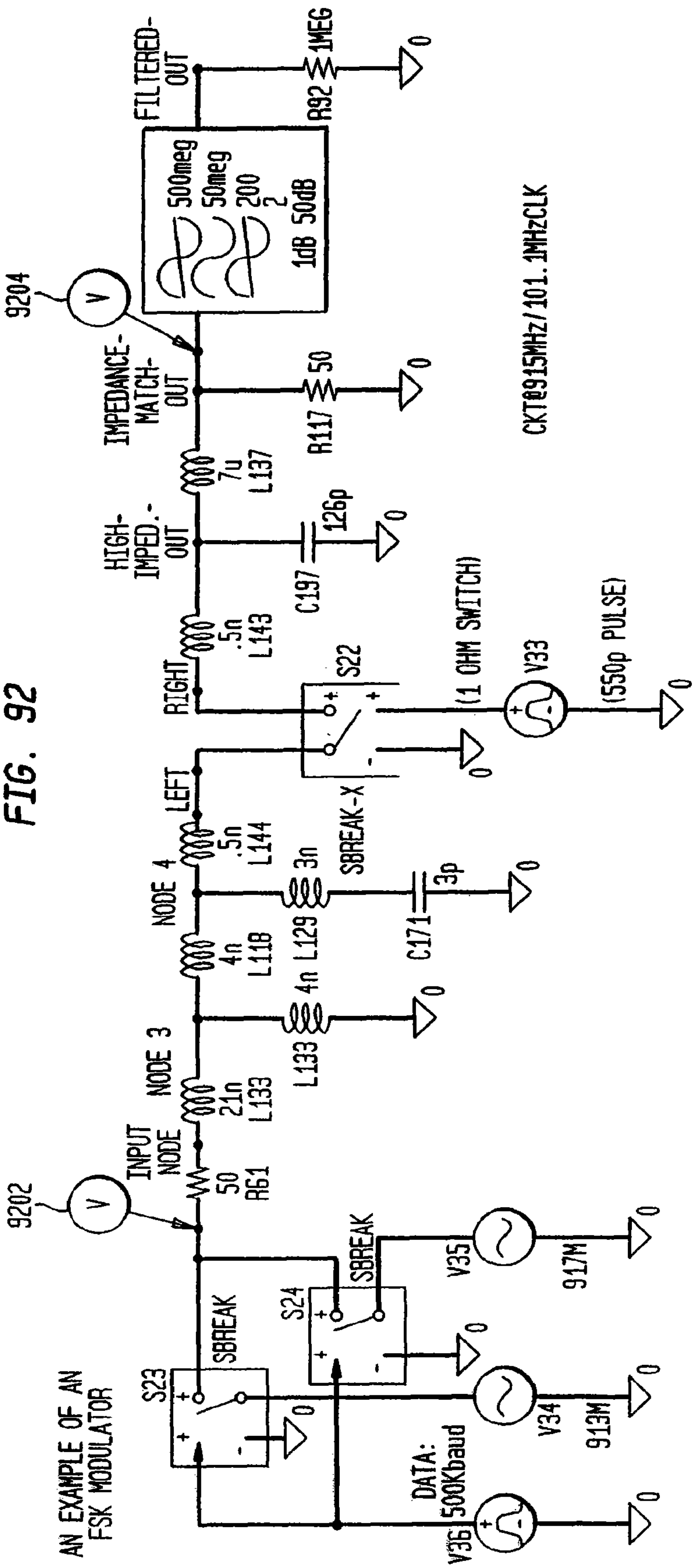
FIG. 92 shows a schematic of the circuit in FIG. 86 connected to an FSK source that alternates between 913 and 917 M at a baud rate of 500 Kbaud according to an embodiment of the present invention.
Figure 93:
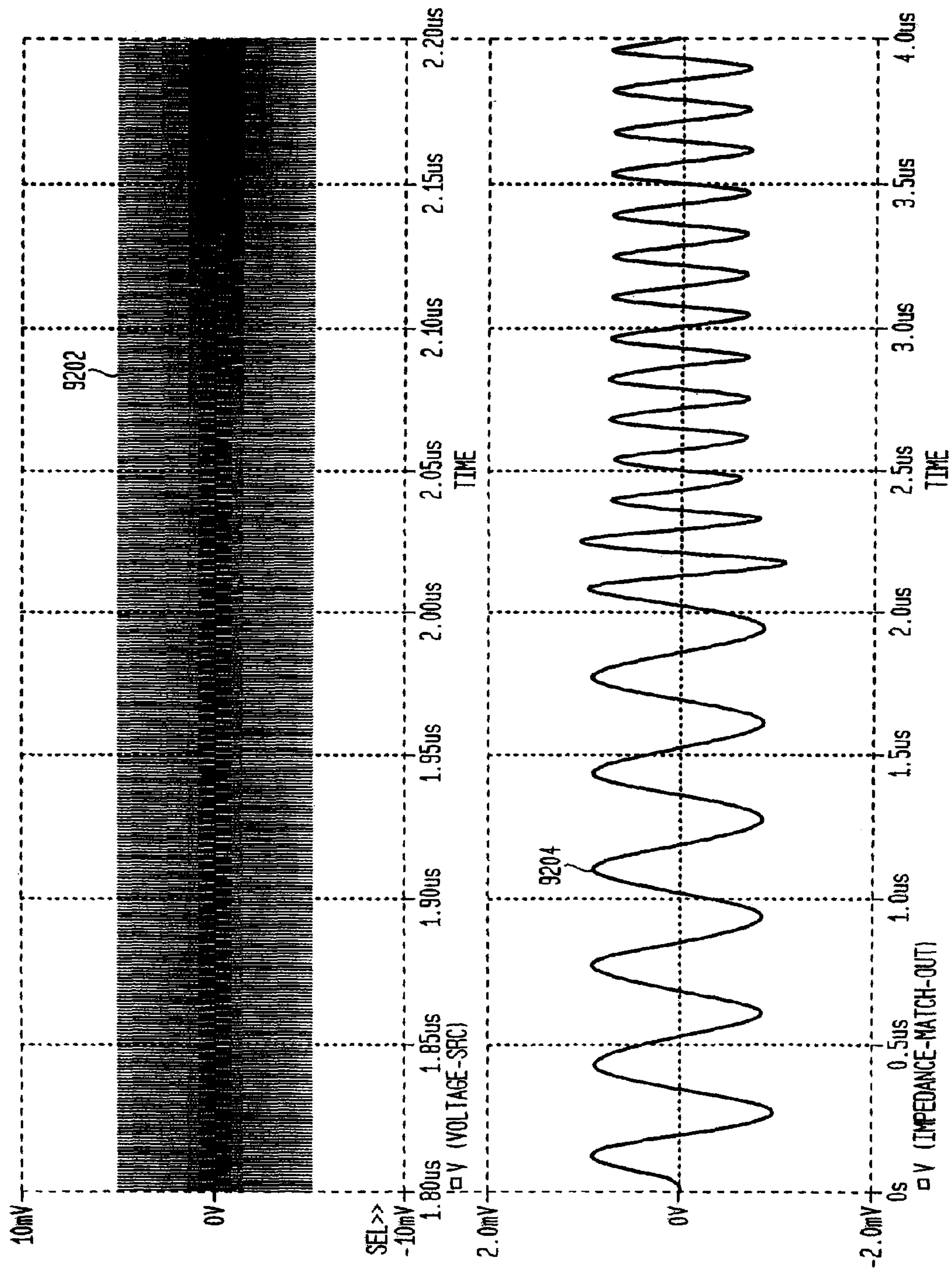
FIG. 93 shows the original FSK waveform 9202 and the down-converted waveform 9204 at the output of the load impedance match circuit according to an embodiment of the present invention.

FIG. 92 shows a schematic of the example circuit in FIG. 86 connected to an FSK source that alternates between 913 and 917 MHz, at a baud rate of 500 Kbaud. FIG. 93 shows the original FSK waveform 9202 and the downconverted waveform 9204 at the output of the load impedance match circuit.

IV. Additional Embodiments

Additional aspects/embodiments of the invention are considered in this section.

In one embodiment of the present invention there is provided a method of transmitting information between a transmitter and a receiver comprising the steps of transmitting a first series of signals each having a known period from the transmitter at a known first repetition rate; sampling by the receiver each signal in the first series of signals a single time and for a known time interval the sampling of the first series of signals being at a second repetition rate that is a rate different from the first repetition rate by a known amount; and generating by the receiver an output signal indicative of the signal levels sampled in step B and having a period longer than the known period of a transmitted signal.

In another embodiment of the invention there is provided a communication system comprising a transmitter means for transmitting a first series of signals of known period at a known first repetition rate, a receiver means for receiving the first series of signals, the receiver means including sampling means for sampling the signal level of each signal first series of signals for a known time interval at a known second repetition rate, the second repetition rate being different from the first repetition rate by a known amount as established by the receiver means. The receiver means includes first circuit means for generating a first receiver output signal indicative of the signal levels sampled and having a period longer than one signal of the first series of signals. The transmitter means includes an oscillator for generating an oscillator output signal at the first repetition rate, switch means for receiving the oscillator output signal and for selectively passing the oscillator output signal, waveform generating means for receiving the oscillator output signal for generating a waveform generator output signal having a time domain and frequency domain established by the waveform generating means.

The embodiment of the invention described herein involves a single or multi-user communications system that utilizes coherent signals to enhance the system performance over conventional radio frequency schemes while reducing cost and complexity. The design allows direct conversion of radio frequencies into baseband components for processing and provides a high level of rejection for signals that are not related to a known or controlled slew rate between the transmitter and receiver timing oscillators. The system can be designed to take advantage of broadband techniques that further increase its reliability and permit a high user density within a given area. The technique employed allows the system to be configured as a separate transmitter-receiver pair or a transceiver.

The basic objectives of the present system is to provide a new communication technique that can be applied to both narrow and wide band systems. In its most robust form, all of the advantages of wide band communications are an inherent part of the system and the invention does not require complicated and costly circuitry as found in conventional wide band designs. The communications system utilizes coherent signals to send and receive information and consists of a transmitter and a receiver in its simplest form. The receiver contains circuitry to turn its radio frequency input on and off in a known relationship in time to the transmitted signal. This is accomplished by allowing the transmitter timing oscillator and the receiver timing oscillator to operate at different but known frequencies to create a known slew rate between the oscillators. If the slew rate is small compared to the timing oscillator frequencies, the transmitted waveform will appear stable in time, i.e., coherent (moving at the known slew rate) to the receiver's switched input. The transmitted waveform is the only waveform that will appear stable in time to the receiver and thus the receiver's input can be averaged to achieve the desired level filtering of unwanted signals. This methodology makes the system extremely selective without complicated filters and complex encoding and decoding schemes and allows the direct conversion of radio frequency energy from an antenna or cable to baseband frequencies with a minimum number of standard components further reducing cost and complexity. The transmitted waveform can be a constant carrier (narrowband), a controlled pulse (wideband and ultra-wideband) or a combination of both such as a dampened sinusoidal wave and or any arbitrary periodic waveform thus the system can be designed to meet virtually any bandwidth requirement. Simple standard modulation and demodulation techniques such as AM and Pulse Width Modulation can be easily applied to the system.

Depending on the system requirements such as the rate of information transfer, the process gain, and the intended use, there are multiple preferred embodiments of the invention. The embodiment discussed herein will be the amplitude and pulse width modulated system. It is one of the simplest implementations of the technology and has many common components with the subsequent systems. A amplitude modulated transmitter consists of a Transmitter Timing Oscillator, a Multiplier, a Waveform Generator, and an Optional Amplifier. The Transmitter Timing Oscillator frequency can be determined by a number of resonate circuits including an inductor and capacitor, a ceramic resonator, a SAW resonator, or a crystal. The output waveform is sinusoidal, although a squarewave oscillator would produce identical system performance.

The Multiplier component multiplies the Transmitter Timing Oscillator output signal by 0 or 1 or other constants, K1 and K2, to switch the oscillator output on and off to the Waveform Generator. In this embodiment, the information input can be digital data or analog data in the form of pulse width modulation. The Multiplier allows the Transmitter Timing Oscillator output to be present at the Waveform Generator input when the information input is above a predetermined value. In this state the transmitter will produce an output waveform. When the information input is below a predetermined value, there is no input to the Waveform Generator and thus there will be no transmitter output waveform. The output of the Waveform Generator determines the system's bandwidth in the frequency domain and consequently the number of users, process gain immunity to interference and overall reliability), the level of emissions on any given frequency, and the antenna or cable requirements. The Waveform Generator in this example creates a one cycle pulse output which produces an ultra-wideband signal in the frequency domain. An optional power Amplifier stage boosts the output of the Waveform Generator to a desired power level.

With reference now to the drawings, the amplitude and pulse width modulated transmitter in accord with the present invention is depicted at numeral 13000 in FIGS. 130 and 131. The Transmitter Timing Oscillator 13002 is a crystal-controlled oscillator operating at a frequency of 25 MHZ. Multiplier 13004 includes a two-input NAND gate 13102 controlling the gating of oscillator 13002 output to Waveform Generator 13006. Waveform Generator 13006 produces a pulse output as depicted at 13208 in FIGS. 132A-132D and 133, which produces a frequency spectrum 13402 in FIG. 134. Amplifier 13008 is optional. The transmitter 13000 output is applied to antenna or cable 13010, which as understood in the art, may be of various designs as appropriate in the circumstances.

FIGS. 132A-132D, 133 and 134 illustrate the various signals present in transmitter 13000. The output of transmitter 13000 in FIG. 132A may be either a sinusoidal or squarewave signal 13202 that is provided as one input into NAND gate 13102. Gate 13102 also receives an information signal 13204 in FIG. 132B which, in the embodiment shown, is digital in form. The output 13206 of Multiplier 13004 can be either sinusoidal or squarewave depending upon the original signal 13202. Waveform Generator 13006 provides an output of a single cycle impulse signal 13208. The single cycle impulse 13210 varies in voltage around a static level 13212 and is created at 40 nanoseconds intervals. In the illustrated embodiment, the frequency of transmitter 13002 is 25 MHZ and accordingly, one cycle pulses of 1.0 GHZ are transmitted every 40 nanoseconds during the total time interval that gate 13102 is "on" and passes the output of transmitter oscillator 13002.

Figure 136A:

FIG. 135 shows the preferred embodiment receiver block diagram to recover the amplitude or pulse width modulated information and consists of a Receiver Timing Oscillator 13510, Waveform Generator 13508, RF Switch Fixed or Variable Integrator 13506, Decode Circuit 13514, two optional Amplifier/Filter stages 13504 and 13512, antenna or cable input 13502, and Information Output 13516. The Receiver Timing Oscillator 13510 frequency can be determined by a number of resonate circuits including an inductor and capacitor, a ceramic resonator, a SAW resonator, or a crystal. As in the case of the transmitter, the oscillator 13510 shown here is a crystal oscillator. The output waveform is a squarewave, although a sinewave oscillator would produce identical system performance. The squarewave timing oscillator output 13602 is shown in FIG. 136A. The Receiver Timing Oscillator 13510 is designed to operate within a range of frequencies that creates a known range of slew rates relative to the Transmitter Timing Oscillator 13002. In this embodiment, the Transmitter Timing Oscillator 13002 frequency is 25 MHZ and the Receiver Timing Oscillator 13510 outputs between 25.0003 MHZ and 25.0012 MHZ which creates a +300 to +1200 Hz slew rate.

Figure 136B:

The Receiver Timing Oscillator 13510 is connected to the Waveform Generator 13508 which shapes the oscillator signal into the appropriate output to control the amount of the time that the RF switch 13506 is on and off. The on-time of the RF switch 13506 should be less than ½ of a cycle (1/10 of a cycle is preferred) or in the case of a single pulse, no wider than the pulse width of the transmitted waveform or the signal gain of the system will be reduced. Examples are illustrated in Table A1. Therefore the output of the Waveform Generator 13508 is a pulse of the appropriate width that occurs once per cycle of the receiver timing oscillator 13510. The output 13604 of the Waveform Generator is shown in FIG. 136B.

TABLE A1

| Transmitted Waveform | Gain Limit on-time | Preferred on-time |
|---|---|---|
| Single 1 nanosecond pulse | 1 nanosecond | 100 picoseconds |
| 1 Gigahertz 1, 2, 3 . . . etc. cycle output | 500 picoseconds | 50 picoseconds |
| 10 Gigahertz 1, 2, 3 . . . etc. cycle output | 50 picoseconds | 5 picoseconds |

Figure 136C:
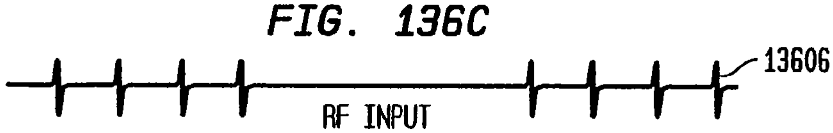
Figure 136D:

The RF Switch/Integrator 13506 samples the RF signal 13606 shown in FIG. 136C when the Waveform Generator output 13604 is below a predetermined value. When the Waveform Generator output 13604 is above a predetermined value, the RF Switch 13506 becomes a high impedance node and allows the Integrator to hold the last RF signal sample 13606 until the next cycle of the Waveform Generator 13508 output. The Integrator section of 13506 is designed to charge the Integrator quickly (fast attack) and discharge the Integrator at a controlled rate (slow decay). This embodiment provides unwanted signal rejection and is a factor in determining the baseband frequency response of the system. The sense of the switch control is arbitrary depending on the actual hardware implementation.

In an embodiment of the present invention, the gating or sampling rate of the receiver 13500 is 300 Hz higher than the 25 MHZ transmission rate from the transmitter 13000. Alternatively, the sampling rate could be less than the transmission rate. The difference in repetition rates between the transmitter 13000 and receiver 13500, the "slew rate," is 300 Hz and results in a controlled drift of the sampling pulses over the transmitted pulse which thus appears "stable" in time to the receiver 13500. With reference now to FIGS. 132A-D and 136A-G, an example is illustrated for a simple case of an output signal 13608 (FIG. 136D) that is constructed of four samples from four RF input pulses 13606 for ease of explanation. As can be clearly seen, by sampling the RF pulses 13606 passed when the transmitter information signal 13204 (FIG. 132B) is above a predetermine threshold the signal 13608 is a replica of a signal 13606 but mapped into a different time base. In the case of this example, the new time base has a period four times longer than real time signal. The use of an optional amplifier/filter 13512 results in a further refinement of the signal 13608 which is present in FIG. 136E as signal 13610.

Figure 136E:
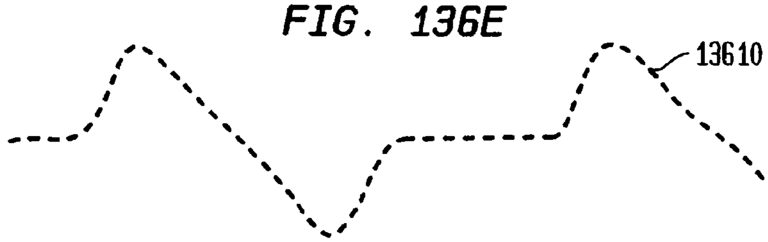
Figure 136G:
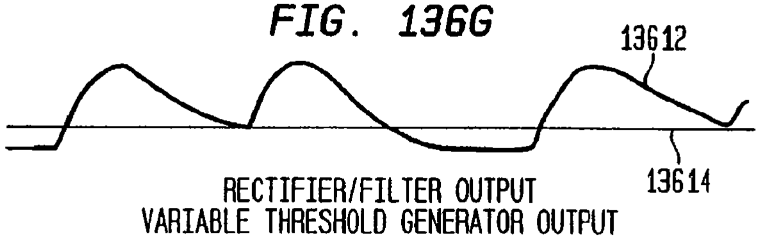
Figure 136F:
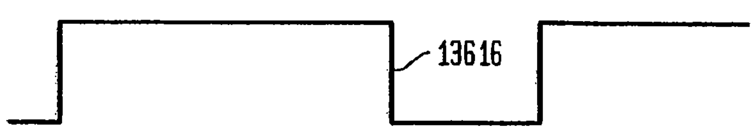

Decode Circuitry 13514 extracts the information contained in the transmitted signal and includes a Rectifier that rectifies signal 13608 or 13610 to provide signal 13612 in FIG. 136G. The Variable Threshold Generator circuitry in circuit 13514 provides a DC threshold signal level 13614 for signal 13610 that is used to determine a high (transmitter output on) or low (transmitter output off) and is shown in FIG. 136G. The final output signal 13616 in FIG. 136F is created by an output voltage comparator in circuit 13514 that combines signals 13612 and 13614 such that when the signal 13612 is a higher voltage than signal 13614, the information output signal goes high. Accordingly, signal 13616 represents, for example, a digital "1" that is now time-based to a 1:4 expansion of the period of an original signal 13606. While this illustration provides a 4:1 reduction in frequency, it is sometimes desired to provide a reduction of more than 50,000:1; in the preferred embodiment, 100,000:1 or greater is achieved. This results in a shift directly from RF input frequency to low frequency baseband without the requirement of expensive intermediate circuitry that would have to be used if only a 4:1 conversion was used as a first stage. Table A2 provides information as to the time base conversion and includes examples.

TABLE A2

| Units |
|---|
| s = 1 ps = 1 * $10^{12}$ ns = 1 * $10^{-9}$ μs = 1 * $10^{-6}$ MHz = 1 * $10^{-6}$ KHZ = 1 * $10^{3}$ |
| Receiver Timing Oscillator Frequency = 25.0003 MHz |
| Transmitter Timing Oscillator Frequency = 25 MHz |
| period = 1/Transmitter Timing Oscillator Frequency |
| period = 40 ns |
| slew rate = 1/(Receiver Timing Oscillator Frequency − Transmitter Timing Oscillator Frequency) |
| slew rate = 0.003 s |
| time base multiplier = (slew rate/period) seconds per nanosecond |
| time base multiplier = 8.333 $10^{4}$ |
| Example 1: |
| 1 nanosecond translates into 83.33 microseconds |
| time base = (1 ns) time base multiplier |
| time base = 83.333 us |

TABLE A2-continued

| Example 2: |
|---|
| 2 Gigahertz translates into 24 Kilohertz<br>2 Gigahertz = 500 picosecond period<br>time base = (500 ps) time base multiplier<br>time base = 41.667 us<br>frequency = 1 time base<br>frequency = 24 KHz |

In the illustrated preferred embodiment, the signal 13616 in FIG. 136F has a period of 83.33 usec, a frequency of 12 KHz and it is produced once every 3.3 msec for a 300 Hz slew rate. Stated another way, the system is converting a 1 gigahertz transmitted signal into an 83.33 microsecond signal.

Accordingly, the series of RF pulses 13210 that are transmitted during the presence of an "on" signal at the information input gate 13102 are used to reconstruct the information input signal 13204 by sampling the series of pulses at the receiver 13500. The system is designed to provide an adequate number of RF inputs 13606 to allow for signal reconstruction.

An optional Amplifier/Filter stage or stages 13504 and 13512 may be included to provide additional receiver sensitivity, bandwidth control or signal conditioning for the Decode Circuitry 13514. Choosing an appropriate time base multiplier will result in a signal at the output of the Integrator 13506 that can be amplified and filtered with operational amplifiers rather than RF amplifiers with a resultant simplification of the design process. The signal 13610 in FIG. 136E illustrates the use of Amplifier/Filter 13512 (FIG. 137). The optional RF amplifier 13504 shown as the first stage of the receiver should be included in the design when increased sensitivity and/or additional filtering is required. Example receiver schematics are shown in FIGS. 137-139.

FIGS. 140-143 illustrate different pulse output signals 14002 and 14202 and their respective frequency domain at 14102 and 14302. As can be seen from FIGS. 140 and 141, the half-cycle signal 14002 generates a spectrum less subject to interference than the single cycle of FIG. 133 and the 10-cycle pulse of FIG. 142. The various outputs determine the system's immunity to interference, the number of users in a given area, and the cable and antenna requirements. FIGS. 133 and 134 illustrate example pulse outputs.

FIGS. 144 and 145 show example differential receiver designs. The theory of operation is similar to the non-differential receiver of FIG. 135 except that the differential technique provides an increased signal to noise ratio by means of common mode rejection. Any signal impressed in phase at both inputs on the differential receiver will attenuated by the differential amplifier shown in FIGS. 144 and 145 and conversely any signal that produces a phase difference between the receiver inputs will be amplified.

FIGS. 146 and 147 illustrate the time and frequency domains of a narrow band/constant carrier signal in contrast to the ultra-wide band signals used in the illustrated embodiment.

V. Conclusions

Example embodiments of the methods, systems, and components of the present invention have been described herein. As noted elsewhere, these example embodiments have been described for illustrative purposes only, and are not limiting. Other embodiments are possible and are covered by the invention. Such other embodiments include but are not limited to hardware, software, and software/hardware implementations of the methods, systems, and components of the invention. Such other embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed is:

1. An apparatus for down-converting an input modulated carrier signal to a demodulated baseband signal, wherein the modulated carrier signal has an amplitude variation, a phase variation, a frequency variation, or a combination thereof, the apparatus comprising:

a frequency down-conversion module comprising:

a switch, a capacitor coupled to said switch, and a pulse generator coupled to said switch;

said pulse generator outputting pulses to said switch at a rate that is a function of a frequency of the modulated carrier signal and a frequency of the demodulated baseband signal determined according to: (the frequency of the modulated carrier signal +/− a frequency of the demodulated baseband signal) divided by N, where N is any integer including 1;

wherein said pulses have apertures and said pulses cause said switch to open outside of said apertures and cause said switch to close and sample the modulated carrier signal during said apertures by transferring energy from the modulated carrier signal and accumulating the transferred energy in said capacitor each time said switch is closed; and wherein some of the previously accumulated energy is discharged from said capacitor into load circuitry each time said switch is open; and wherein the demodulated baseband signal is generated from (i) the accumulating of the energy transferred to the capacitor each time the switch is closed and (ii) the discharging of said some of the previously accumulated energy into the load circuitry each time the switch is opened.

2. An apparatus as defined in claim 1, wherein voltage of the input modulated carrier signal is not reproduced or approximated at the capacitor during the apertures or outside of the apertures.

3. An apparatus as defined in claim 1, wherein said capacitor is not designed to substantially hold a voltage at the capacitor during the apertures or outside of the apertures.

4. An apparatus as defined in claim 1, wherein said capacitor is not designed to substantially hold or reproduce an approximate voltage of the input modulated carrier signal during the apertures or outside of the apertures.

5. An apparatus as defined in claim 1, wherein said load circuitry comprises a low impedance load, and wherein said enemy discharged from said capacitor provides sufficient power to drive the low impedance load.

6. The apparatus of claim 1, wherein said pulse generator, said switch, and said capacitor are implemented in an integrated circuit.

7. The apparatus of claim 1, wherein the switch is on for at least one-tenth of a cycle of the modulated carrier signal and no more than one-half of the cycle of the modulated carrier signal.

8. The apparatus of claim 1, wherein the switch is on for approximately one-tenth of a cycle of the modulated carrier signal.

9. The apparatus of claim 1, wherein the apertures of the pulses are defined by a windowing function $u(t)-u(t-T_A)$, where a length of the windowing function aperture is $T_A$, which is at least one-tenth of a cycle of the modulated carrier signal and no more than one-half of a cycle of the modulated carrier signal.

10. The apparatus of claim 1, wherein said pulses operate at a rate selected so that energy of the modulated carrier signal is transferred to the capacitor at the frequency of the pulses.

11. The apparatus of claim 1, wherein the size of said capacitor is selected so that when the switch is closed, at the baseband signal's frequency the baseband signal is mostly used to charge the capacitor, and at the modulated carrier signal's frequency, the modulated carrier signal, other than the baseband signal, is mostly removed and not used to charge the capacitor.

12. The apparatus of claim 11, wherein the modulated carrier signal, other than the baseband signal, that is mostly removed and not used to charge the capacitor also results in removing noise contained in the modulated carrier that is mostly removed, so that the removed noise is not stored in the capacitor.

13. An apparatus for down-converting a modulated carrier signal to a demodulated baseband signal, comprising:

a controller coupled to a switch, the controller providing a control signal with a specified frequency that controls when the switch is on and when the switch is off, the controller controlling the switch so that the switch is on during a first sampling aperture, so that the switch is on during a second sampling aperture, and so that the switch is off between the first sampling aperture and the second sampling aperture;

wherein the switch receives a first sample of energy from the modulated carrier signal during the first sampling aperture when the switch is on and receives a second sample of energy from the modulated carrier signal during the second sampling aperture when the switch is on;

an energy storage device comprising a capacitor coupled to the switch which (a) when the switch is on during the first sampling aperture, charges to store the first sample of energy, the energy storage having previously accumulated energy from the carrier signal as a first accumulation of energy, the first sample of energy being added to the first accumulation of energy, (b) when the switch is off between the first sampling aperture and the second sampling aperture, discharges some of the first accumulation of energy so as to leave a second accumulation of energy in the energy storage device, and (c) when the switch is on during the second sampling aperture, charges to add the second sample of energy to the second accumulation of energy to result in a third accumulation of energy in the energy storage device; and wherein, for any given time, the demodulated baseband signal is generated from the energy accumulated in the energy storage device at that given time, and wherein the demodulated baseband signal is generated both while the energy storage device is charging and discharging.

14. The apparatus of claim 13, wherein the energy accumulated at the energy storage device is based on one or more of aperture width of the first sampling aperture and the second sampling aperture, the value of the capacitor, an input impedance, and an output impedance.

15. The apparatus of claim 13, wherein the control signal comprises a train of substantially non-sinusoidal pulses to control when the switch is on and off.

16. The apparatus of claim 13, wherein the discharging of said some of the first accumulation of energy comprises inputting the discharged energy into a differential amplifier.

17. The apparatus of claim 13, wherein when the switch is off between the first sampling aperture and the second sampling aperture, the energy storage device discharges energy to a low impedance load.

18. The apparatus of claim 13, wherein said controller, said switch, and said energy storage device are implemented in an integrated circuit.

19. The apparatus of claim 13, wherein the first sampling aperture and the second sampling aperture are at least one-tenth of the period of the modulated carrier signal but no more than one-half of the period of the modulated carrier signal.

20. The apparatus of claim 13, wherein the first sampling aperture and the second sampling aperture are approximately one-tenth of a cycle of the modulated carrier signal.

21. The apparatus of claim 13, wherein the first sampling aperture and the second sampling aperture are defined by a windowing function $u(t)-u(t-T,_A)$, where a length of the windowing function aperture is $T_A$, which is at least one-tenth of a cycle of the received modulated carrier signal and no more than one-half of a cycle of the received modulated carrier.

22. The apparatus of claim 15, wherein the specified frequency is substantially equal to the frequency of the modulated carrier signal or to a subharmonic thereof.

23. The apparatus of claim 13, wherein the specified frequency is such that the switch is opened at a rate that is substantially equal to the frequency of the modulated carrier signal or to a subharmonic thereof.

24. The apparatus of claim 13, wherein the size of said capacitor is selected so that when the switch is closed, at the baseband signal's frequency the baseband signal is mostly used to charge the capacitor, and at the modulated carrier signal's frequency, the modulated carrier signal, other than the baseband signal, is mostly removed and not used to charge the capacitor.

25. The apparatus of claim 24, wherein said discharging said some of the first accumulation of energy comprises discharging into a low impedance load.

26. The apparatus of claim 24, wherein the modulated carrier signal, other than the baseband signal, that is mostly removed and not used to charge the capacitor also results in removing noise contained in the modulated carrier that is mostly removed, so that the removed noise is not stored in the capacitor.

27. The apparatus of claim 13, wherein said energy storage device is not designed to substantially hold a voltage during said first sampling aperture, during said second sampling aperture, or between said first sampling aperture and said second sampling aperture.

28. The apparatus of claim 13, wherein said energy storage device is not designed to substantially hold or reproduce an approximate voltage of the modulated carrier signal during said first sampling aperture, during said second sampling aperture, or between said first sampling aperture and said second sampling aperture.

* * * * *